United States Patent
Norman et al.

(10) Patent No.: US 9,995,507 B2
(45) Date of Patent: Jun. 12, 2018

(54) SYSTEMS FOR COST-EFFECTIVE CONCENTRATION AND UTILIZATION OF SOLAR ENERGY

(75) Inventors: Richard Norman, Sutton (CA); Philippe Dauphin, Montreal (CA); Frederick de St. Croix, Black Creek (CA)

(73) Assignee: Richard Norman, Sutton, QC (CA)

( * ) Notice: Subject to any disclaimer, the term of this patent is extended or adjusted under 35 U.S.C. 154(b) by 1013 days.

(21) Appl. No.: 12/424,393

(22) Filed: Apr. 15, 2009

(65) Prior Publication Data

US 2010/0263709 A1 Oct. 21, 2010

(51) Int. Cl.
*F24J 2/54* (2006.01)
*F24J 2/07* (2006.01)
(Continued)

(52) U.S. Cl.
CPC .............. *F24J 2/542* (2013.01); *F24J 2/07* (2013.01); *F24J 2/12* (2013.01); *F24J 2/145* (2013.01);
(Continued)

(58) Field of Classification Search
CPC .. F24J 2/07; F24J 2/5232; F24J 2/5233; F24J 2/542; F24J 2/5239; F24J 2/145;
(Continued)

(56) References Cited

U.S. PATENT DOCUMENTS

| 514,669 A | 2/1894 | Allingham |
| 811,274 A | 1/1906 | Carter |

(Continued)

FOREIGN PATENT DOCUMENTS

| GB | 2467197 A | 7/2010 |
| WO | 02097341 | 12/2002 |

(Continued)

OTHER PUBLICATIONS

Duane C. Johnson, Update on Heliostats Arrays from Red Rock Energy, Red Rock Energy, Dec. 1, 1998, http://replay.web.archive.org/19981201064840/http://www.redrok.com/up970331.htm.

(Continued)

*Primary Examiner* — Alexander Kollias
(74) *Attorney, Agent, or Firm* — Anglehart et al.

(57) ABSTRACT

The present invention is primarily directed to cost-effective systems for using large reflective elements that track the sun on two axes to concentrate solar energy onto a receiver that can convert the sun's optical energy to a form usable for extensive displacement of combustion of fossil fuels. The structures of the tracker frame, tracking mechanism and tracker supports are co-optimized with the optical elements and the receiver for high efficiency, low cost, and ease of assembly, making moderate and large-scale implementations cost-competitive with fossil fuels for peak power, and, with suitable storage, for base-load power and dispatchable peaking power in sunny locations. Improvement to small-tracker two-axis systems and one-axis tracking systems that focus in two dimensions are also included, as are improvements in systems for space-based solar power.

18 Claims, 108 Drawing Sheets

(51) Int. Cl.
| | |
|---|---|
| *F24J 2/12* | (2006.01) |
| *F24J 2/52* | (2006.01) |
| *H01L 31/054* | (2014.01) |
| *F24J 2/14* | (2006.01) |
| *F24J 2/04* | (2006.01) |

(52) U.S. Cl.
CPC ........... *F24J 2/5232* (2013.01); *F24J 2/5233* (2013.01); *F24J 2/5239* (2013.01); *F24J 2/5417* (2013.01); *H01L 31/0547* (2014.12); *F24J 2002/0405* (2013.01); *Y02B 10/20* (2013.01); *Y02B 10/70* (2013.01); *Y02E 10/41* (2013.01); *Y02E 10/42* (2013.01); *Y02E 10/45* (2013.01); *Y02E 10/47* (2013.01); *Y02E 10/52* (2013.01); *Y10T 307/469* (2015.04)

(58) Field of Classification Search
CPC ........ F24J 2/5417; F24J 2/12; H01L 31/0547; Y02E 10/45; Y02E 10/52; Y02E 10/47; Y02E 10/42; Y02E 10/41; Y10T 307/469; Y02B 10/70
USPC .................................. 136/246, 259; 126/684
See application file for complete search history.

(56) References Cited

U.S. PATENT DOCUMENTS

| | | | |
|---|---|---|---|
| 2,760,920 | A | 8/1956 | Olsen |
| 2,987,961 | A | 6/1961 | Cotton |
| 4,011,854 | A | 3/1977 | Brantley et al. |
| 4,065,053 | A | 12/1977 | Fletcher et al. |
| 4,141,626 | A | 2/1979 | Treytl |
| 4,281,640 | A | 8/1981 | Wells |
| 4,317,031 | A | 2/1982 | Findell |
| 4,372,772 | A | 2/1983 | Wood |
| 4,395,581 | A | 7/1983 | Girard |
| 4,678,292 | A * | 7/1987 | Miyatani et al. ............ 359/848 |
| 5,592,932 | A | 1/1997 | Yeomans |
| 5,956,191 | A | 9/1999 | Blackmon et al. |
| 6,485,152 | B2 | 11/2002 | Wood |
| 7,190,531 | B2 | 3/2007 | Dyson et al. |
| 7,834,303 | B2 | 11/2010 | Fatehi et al. |
| 2004/0118395 | A1* | 6/2004 | Rubbia et al. ................ 126/694 |
| 2005/0225885 | A1* | 10/2005 | Wright .......................... 359/871 |
| 2007/0034207 | A1 | 2/2007 | Niedermeyer |
| 2007/0289622 | A1 | 12/2007 | Hecht |
| 2008/0100258 | A1 | 5/2008 | Ward |
| 2009/0277498 | A1 | 11/2009 | Angel |

FOREIGN PATENT DOCUMENTS

| | | |
|---|---|---|
| WO | WO2007036199 A2 | 4/2007 |
| WO | WO 2007108861 | 9/2007 |
| WO | WO2009/000071 | 12/2008 |
| WO | WO 2009026383 | 2/2009 |
| WO | WO2010033859 A2 | 3/2010 |

OTHER PUBLICATIONS

International Preliminary Report on Patentability PCT/CA2010/000500.
PCT Demand and Article 34 amendment.
Mills et al., "Multi Tower Solar Array Project", Proc. Solar HArvest conference 40th annual ANZSES conference, Nov. 27-29, 2002, Newcastle, Australia, Accessed on the internet Aug. 5, 2010 (URL http://www.solar1.mech.unsw.edu.au/glm/papers/Mills_multitower_newcastle.pdf).
International Search Report.
Sandia's Sunshine to Petrol project seeks fuel from thin air—Sandia Labs Dec. 5, 2007.
Archimedes Palimpsest—Wikipedia Nov. 18, 2008.
John Tzetzes—Encyclopedia Britannica Nov. 17, 2008.
Archimedes Death Ray Testing with Myth Busters—MIT Jan. 25, 2006.
Solar Energy Generating Systems—Wikipedia Nov. 24, 2008.
CDO-100 Concentrator Photovoltaic Cell—Boeing Spectrolab Apr. 24, 2008.
Triple-Junction Terrestrial Concentrator Solar Cells—Boeing Spectrolab Dec. 9, 2000.
CTJ Photovoltaic Triple-Junction Solar Cell for Terrestrial Applications—Emcore Nov. 17, 2008.
M. Yamaguchi et al. Japanese Activities of R&D on III-V Concentrator Solar Cells and Modules—19th EUPVSEC Nov. 19, 2008.
Ida Kubiszewski et al., Solar Furnace Odeillo Font-Romeu, France—Encyclopedia of Earth Jun. 14, 2007.
Solar Power Tower—Solar Paces Nov. 18, 2008.
The History of Solar—U.S. Department of Energy Nov. 18, 2008.
BrightSource Solar Power Complex—Meta Efficient Nov. 19, 2008.
A Primer of CPV Technology—Sol Focus Mar. 2008.
Deger Tracker 7000NT Nov. 18, 2008.
Titan Tracker finishes a CPV project for the ISFOC—Titan Trackers S.L. Jan. 22, 2009.
Theodore G. Van Kessel et al. Extending Photovoltaic Operation Beyond 2000 Suns Using Liquid Metal Thermal Interface With Passive Cooling—IBMYorktown Heights, N.Y. Nov. 18, 2008.
R.Woehl et al. Analysis of the Optical Properties of Screen-Printed and Aerosol-Printed and Plated Fingers of Silicon Solar Cells—Fraunhofer, Germany Jul. 31, 2008.
Luz II Solar Energy Development Center Solar Thermal Power Plant Image—Luz II Jun. 11, 2008.
Abengoa Solucar Plant Nov. 18, 2008.
Multi Tower Solar Array—Research @ the Solar Energy Group Mar. 10, 2009.
The Practical Solar Heliostat System—Practical Solar Mar. 10, 2009.
C.E. Kennedy et al. Further Analysis of Accelerated Exposure Testing of Thin-Glass Mirror—National Renewable Energy Laboratory USA 2007.
International Preliminary Report on Patentability for PCT/CA2010/000500 dated Jun. 22, 2011.
International Search report for PCT/CA2011/050501 dated Jan. 5, 2012.
Written Opinion for PCT/CA2010/000500 dated Aug. 10, 2010.
Written Opinion for PCT/CA2011/050501 dated Jan. 5, 2012.
Office action of Australian application 2010237550 dated May 19, 2014 with related claims.
PCT/CA2011/050501 International preliminary report dated Feb. 19, 2013 with related claims.

\* cited by examiner

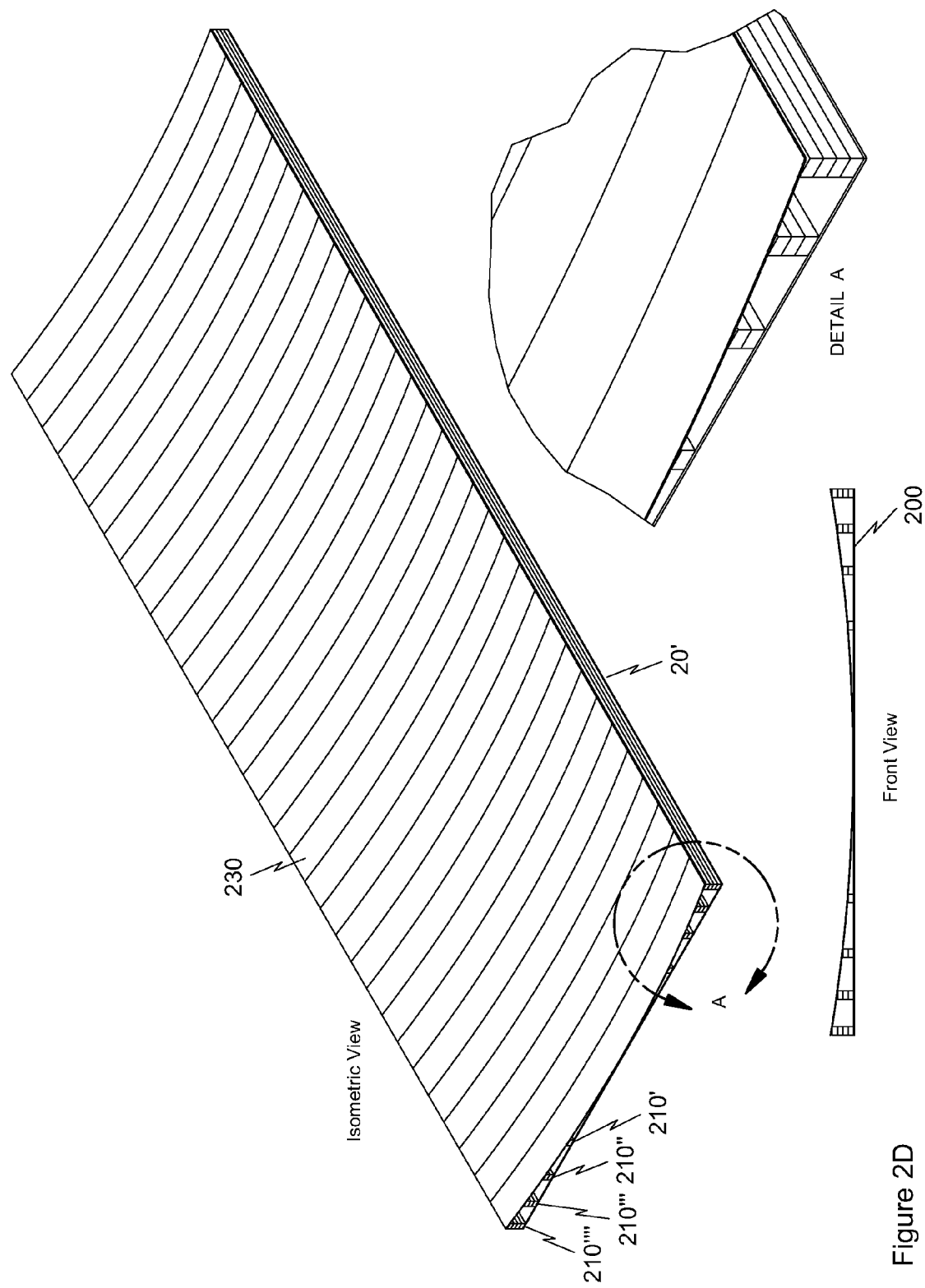

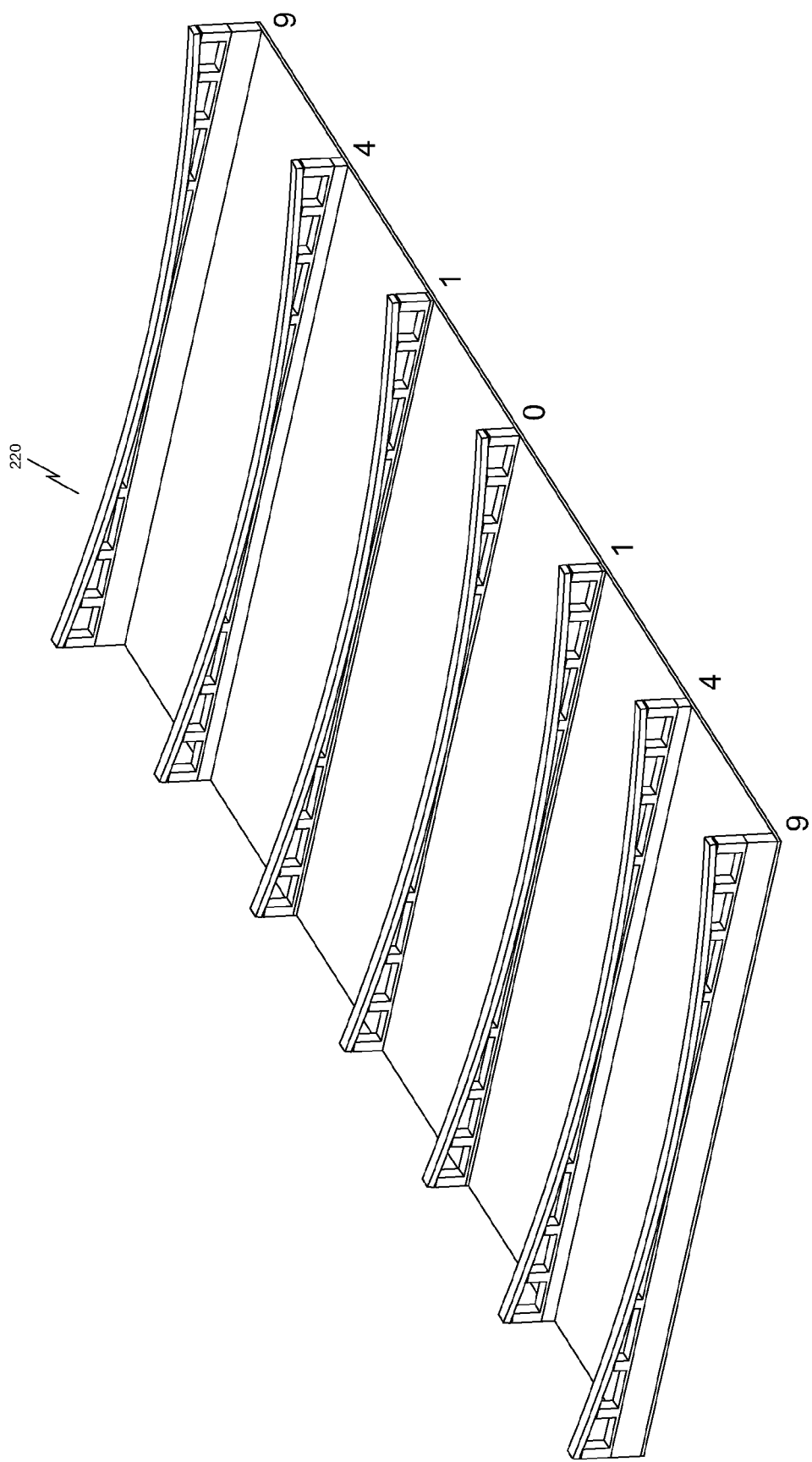
Figure 2D1

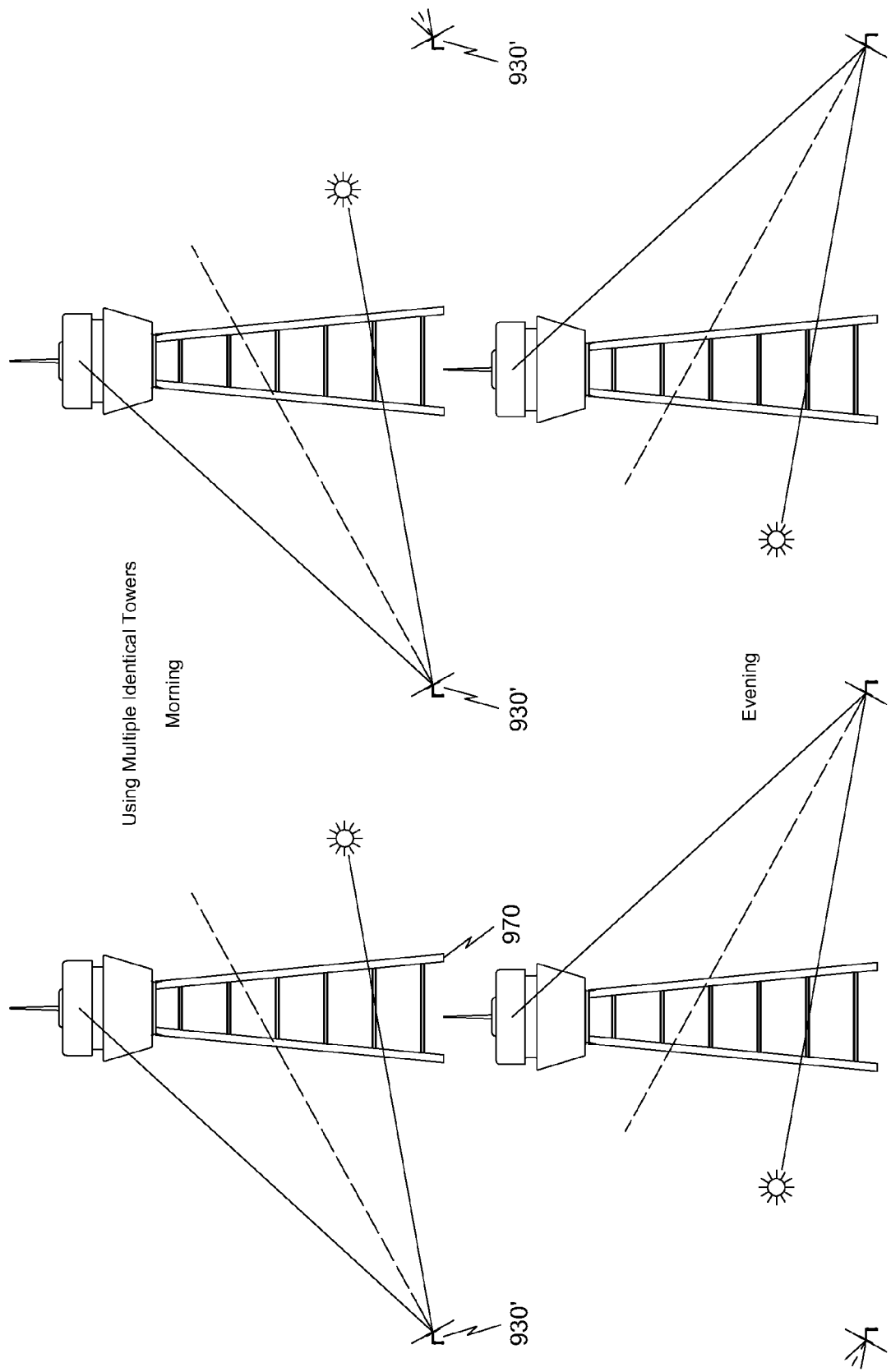

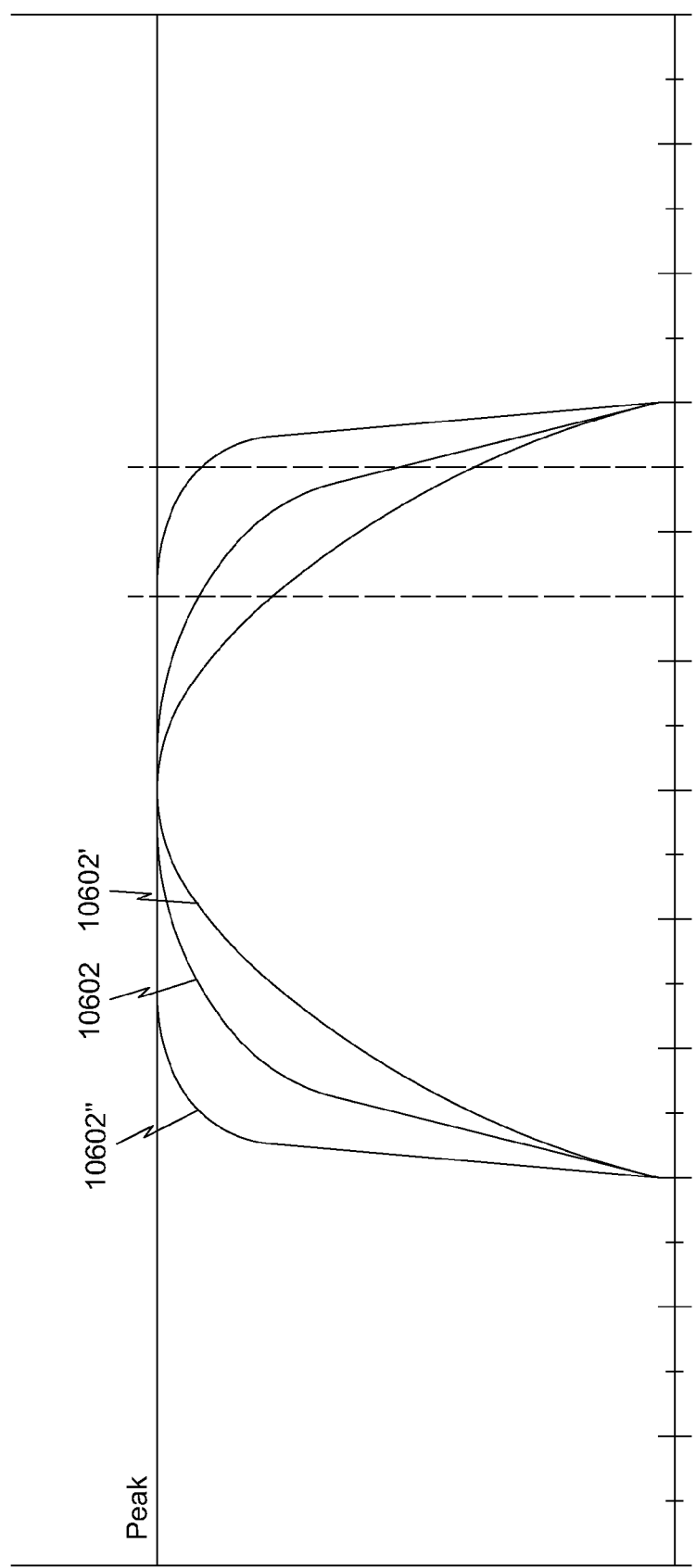
Figure 10E1

SYSTEMS FOR COST-EFFECTIVE CONCENTRATION AND UTILIZATION OF SOLAR ENERGY

STATEMENT REGARDING COLLABORATIVE RESEARCH

The subject matter described herein was developed in accordance with a joint research agreement between Richard Norman and Gestion TechnoCap Inc. executed on May 9, 2006.

FIELD OF THE INVENTION

This invention relates to the field of solar energy, including solar thermal and photovoltaics.

SUMMARY OF THE PRIOR ART

Humans have been harnessing solar energy since the dawn of our species. In fact the oldest forms of solar energy used by humans have roots that far predate humans themselves; photosynthesis was mastered by nature billions of years ago, and animals have been eating plants, and have been basking in the sun for warmth, for hundreds of millions of years. But humanity has grown addicted to more concentrated and controllable forms of energy, first with wood fires for cooking and oil lamps for light, then fossil fuels for machines, and finally electricity, which delivers clean, controllable power at the flick of a switch.

With most electricity today generated from burning fossil fuels, and almost all transport run by burning fossil fuels, humanity's rapidly increasing use of energy is both exhausting the easily recoverable fossil fuels and is endangering our accustomed climate through the carbon dioxide released in burning these fuels. Clearly there is a need to replace fossil fuels with a more sustainable and less destructive source of energy.

In spite of the tremendous increase in humanity's consumption of energy, the earth still receives many orders of magnitude more energy from the sun than all of humanity's current energy use, so solar energy is a logical candidate. But the expense and inefficiency of current methods of capturing that energy limit its ability to replace fossil fuels.

The simplest way to use solar energy to replace fossil fuels is the oldest way; let plants do the work of capturing solar energy, and harvest the plants. But the amount of biomass harvested to feed humanity already puts a strain on our ecosystems, and increasing that harvest to provide fuel for our machines as well as for our bodies would be an environmental disaster. A quick calculation shows that even if every single scrap of plant matter growing each year in the U.S. were to be converted to bio-fuel, it would provide less than half of the country's current annual energy use. While converting waste biomass into bio-fuel can certainly play a part in reducing our fossil fuel use, it can be only a modest part, and even if we learn to farm the oceans themselves for bio-fuel, it will not provide enough energy to satisfy continued growth in humanity's energy demand.

But natural photosynthesis is not the only way to put the sun's energy to use. Direct space heating from natural sunlight undoubtedly goes back as far as choosing south-facing caves, and Greek and Roman structures show that even millennia ago, people knew how to orient a house to capture the low winter sun for heating, while blocking the higher summer sun with a reflective white roof to avoid summer overheating. But while these simple measures for using passive solar to eliminate the need to burn wood or fossil fuels for heat are very cost effective, they cannot address the far larger issue of the rest of our energy use.

In particular, the generation of electricity is the most important task to accomplish through renewable energy because the generation of electricity depends largely on coal, which being nearly pure carbon has the highest carbon dioxide output per unit of energy of any fossil fuel. Electricity is also the most rapidly growing form of energy use for humanity. It produces essentially no pollution at its point of use, and, with an exergy as high as its energy, it is relatively easily converted into other forms of useable energy. The chief drawback of electricity is that it is hard to store, which can be important when it is generated by an intermittent energy source like sunlight. Fortunately the peak time of electricity use is already a good match for solar energy, so until solar exceeds the amount that this peak demand is above base-load demand, even photovoltaic sources do not need storage. When photovoltaic solar electricity does exceed this peak, the modulation of flow in hydroelectric power generation can effectively store quite large amounts of solar energy, and this storage can be increased by pumping water uphill in times of excess energy and then releasing it in times of excess demand.

That the energy of sunlight can be converted directly into electricity through photovoltaics has been known since Charles Fritts developed the first selenium-based solar cell in 1880. For photovoltaics using un-concentrated sunlight, however, the cost is still far higher than fossil fuels. New technologies such as thin-film semiconductors and organic cells are designed to reduce the cost per watt of the photovoltaic material itself, but their low efficiency takes more area. When the area needs to be covered anyway (such as roof shingles) the low incremental cost of adding a thin-film photovoltaic layer makes this a potential contributor toward displacing fossil fuels. But even if all commercial and residential rooftops in the U.S. were covered with thin-film cells, it would supply only roughly 10% of the U.S. electric demand—significant, but far from a total solution. Covering additional area is inefficient because the low efficiency of the cells requires large areas of glass and supporting structures, which by themselves are comparable (at today's low thin-film efficiency) to the current cost of fossil-fuel electricity.

One new thin-film photovoltaic technology, Copper Indium Gallium di-Selenide, or CIGS, has the potential to approach crystalline silicon cells in efficiency. But even if mass-production efficiency reaches that of laboratory samples, indium, gallium and selenium are all rare enough that wide-spread adoption of thin-film CIGS would exhaust supplies long before CIGS could make a significant dent in fossil fuel use. Another thin-film solar cell material is Cadmium Telluride (CdTe), but while this currently has the lowest cost per watt of any flat-panel material in production, cadmium is roughly as toxic as mercury, and tellurium is five times rarer in the earth's crust than either gold or platinum. Thus cadmium telluride flat panels cannot fulfill a significant percentage of humanity's energy demands, and it would be courting environmental disaster if they did.

With silicon photovoltaic cells, at least the basic elemental supply is not an issue: the entire crust of our planet is mostly silica. But while silicon cells can approach an efficiency of 25%, silicon is an indirect band-gap material so it takes a thick layer of specially-doped high-purity silicon to approach this efficiency, and such silicon is expensive to produce. Silicon cells are also fragile, and require large areas of glass to protect them.

It is also possible to convert the sun's energy into electricity indirectly through first converting the sunlight to heat and using that heat to run a thermal engine such as a steam turbine or a Stirling engine. For a thermal engine, the maximum possible efficiency depends on the ratio of temperature difference between a heat source and a heat sink to the temperature of the heat source above absolute zero (−273° C., or 0° K). With a typical heat sink temperature of roughly 300° K (roughly room temperature), it takes a heat source several hundred degrees hotter than this to obtain reasonable efficiency, and this is hard to obtain with un-concentrated sunlight because the large receiver surface area loses so much heat. The large area makes it expensive to use a vacuum to eliminate conduction and convection losses, and even if this is done, radiant losses from a large area become significant as the temperature of the hot source increases, making high temperatures and large temperature differentials from un-concentrated sunlight impractical.

Solar thermal energy can also be used to drive energy-intensive thermal transformations, such as the melting of steel or the preparation of calcium oxide from limestone in the making of cement, thus displacing energy that would have been provided either directly or indirectly by fossil fuels. Solar thermal energy can even effect chemical reactions that generate gaseous or liquid fuels ("*Sandia's Sunshine to Petrol project seeks fuel from thin air*", Sandia Labs Press Release), allowing solar energy to displace fossil fuels even where gaseous or liquid fuels are required. However, most such energy-intensive transformations require far higher temperatures than can be readily achieved with un-concentrated sunlight.

High temperatures also enable more efficient storing of solar energy as heat to produce electricity when the sun is not shining. While energy storage for solar thermal systems could be accomplished by generating electricity and using that electricity to pump water from a lower reservoir to an upper reservoir (and then releasing it through a turbine when electricity is needed), that requires a generator large enough to handle the maximum output of the solar collectors, plus pumping and additional generating capacity at the storage site. High receiver temperatures, on the other hand, allow storing the thermal energy (usually as molten salt or hot rocks) before conversion to electricity, and this lets a smaller generator convert the thermal energy to electricity over time.

The receiver area of a solar collector is thus a significant limiting factor for using solar energy, both for thermal generators and thermal transformation where it limits the achievable temperature, and for solar cells due to the cost of the cells and/or the scarcity of their materials and due to the lower efficiency materials increasing the cost of supporting structures.

A promising solution is therefore to concentrate the sunlight using either mirrors or lenses, allowing a small receiver to receive the sunlight from a large area. The concentration of sunlight with both lenses and mirrors dates back at least as far as classical Greek times. Although many technology historians dispute that lenses were used by humans thousands of years ago, a Greek play by Aristophanes (420 BC) has a line where a person whose debts are recorded on a wax tablet speaks of erasing it from a distance with a crystal lens. Since the playwright did not think it necessary add an explanation of this, it can be assumed that the audience was expected to be familiar with the principle (and in fact the play indicates that one can buy such a lens at the local druggist). But before the invention of the Fresnel lens, lenses were far too small and expensive to be practical to concentrate sunlight to replace fossil fuels.

Concentrating sunlight with mirrors also appears to date back to Greek times. As a child I was told that one of the greatest inventors of all time, Archimedes, had used soldiers' shields as mirrors to concentrate the sun to set an attacking Roman fleet on fire at a bowshot distance. This feat has been widely questioned due to no known references to it in literature from Archimedes' time. The earliest known references are also sketchy; Lucian of Samosata, who lived over three centuries later, mentions Archimedes using a "burning glass", while a variety of accounts from the $12^{th}$ century refer to mirrors and give few details (and those details are conflicting). However the recent discovery of a palimpsest where a monk in the $13^{th}$ century washed the ink off a description of some of Archimedes' other work in order to reuse the parchment for a prayer book ("*Archimedes Palimpsest*", Wikipedia) shows that detailed copies of writings of Archimedes did indeed exist in the medieval world, proving that the time gap to the $12^{th}$ century cannot be taken as evidence against the veracity of those descriptions of the accomplishments of Archimedes. If it is indeed possible to achieve that legendary feat of Archimedes with materials available to him, this applicant finds it far more likely that one of the greatest inventors of all time, who was an expert in conic sections including parabolas, figured out how to accomplish this, than that others over a thousand years later made the whole thing up and attributed it to Archimedes (especially since the most detailed description is by John Tzetzes, a $12^{th}$-century Byzantine scholar whose specialty was not optics or conic sections, but rather was preserving ancient Greek literature and scholarship ("*John Tzetzes*", Encyclopedia Britannica).

But even the possibility of accomplishing the alleged feat with materials available to Archimedes has itself been widely disputed. In some of the most publicized recent experiments to confirm or refute this, an M.I.T. professor and students were able to set dry targets on fire at a lesser distance using modern glass mirrors, but an attempt by the TV show Myth Busters failed to replicate this using bronze mirrors to focus light on a ship that had been continuously in water ("*Archimedes Death Ray Testing with Myth Busters*", Massachusetts Institute of Technology).

After watching the Myth Busters episode, the applicant explored ways of designing parabolic mirrors that would have been practical to build in Archimedes' time, and found several such designs that would easily have provided a sufficient amount of sufficiently concentrated solar power to set a ship ablaze at a bowshot distance. Thus this applicant holds that Archimedes almost certainly represents actual prior art, although the details of the means by which Archimedes accomplished this have been lost to history to the extent that they do not inform modern efforts at concentrating sunlight. However, in designing ways of building concentrating mirrors that could be manufactured with ancient technologies, the applicant found that some of these designs would be very cost-effective if implemented using modern materials. Thus while no descriptions of designs of Archimedes have been sufficiently detailed to inform modern efforts, the search for designs that Archimedes could have used has lead to significant advances in high-concentration mirrors.

High concentration of the sun's light requires tracking the sun to keep the focus on the receiver, and this adds complexity, and hence cost, to high-concentration systems. Because of this, some concentrating systems use low concentration (less than 10×), which can be done in some cases without tracking. However this still trades some increase in complexity and cost for the non-cell materials against a moderate decrease in the cost of the cells, making it a marginal improvement.

Moderate concentration (10×-100×) can be achieved with high focus in one dimension, reducing the tracking requirements to one dimension as well. The largest solar power plants currently in operation are of this type, using long troughs tracked daily in one dimension (the east/west direction) to focus sunlight onto a tube for the generation of steam ("*Solar Energy Generating System*", Wikipedia). This reduces the receiver area enough to achieve a high enough temperature for moderate efficiency using steam turbines.

A parabolic trough can also be used with photovoltaics, reducing the cell area enough to make the cost of even the best crystalline silicon cells negligible. However the highest efficiency cells currently available are extremely expensive, currently about 200 times more expensive per area than silicon cells. Even with an efficiency heading toward twice that of silicon, these cells are thus too expensive to be cost effective at moderate focus.

Numerous high-focus systems are also known in the art; these concentrate sunlight in two dimensions, achieving high concentration (100×-1000×) and even extremely high concentration (1000× to approaching 10,000×). Multi-junction cells increase in efficiency up to a concentration of several hundred fold, and are currently rated up to roughly 1500-suns concentration depending on the manufacturer ("CDO-100 Concentrator Photovoltaic Cell", SpectroLab; "*Triple-Junction Terrestrial Concentrator Solar Cells*", SpectroLab; "*CTJ Photovoltaic Cell*", Emcore). Going up toward 1000 suns saves significantly on the cell cost, even given the slight drop in the cells' photovoltaic efficiency, but requires accurate tracking and accurate mirrors (solid lenses are too expensive) or accepting significant light loss (Fresnel lenses lose efficiency beyond a few-hundred-fold concentration, and although complex domed Fresnel lenses lose less than flat or cylindrical Fresnel lenses, even they do not approach mirrors in efficiency at concentrating light) ("*Japanese Activities of R&D on III-V Concentrator Solar Cells and Modules*", 19$^{th}$ EUPVSEC).

Multi-junction cells are also thermally fairly tough, being able to operate continuously up to 100° C., but even so require careful cooling at high concentrations. Photovoltaic cells also lose efficiency at high temperatures, and although multi-junction cells are less sensitive than silicon cells, cooling to well below 100° C. in normal circumstances is worthwhile if one has to have cooling anyway.

In addition to temperature reducing the raw efficiency of a cell, high temperatures also increase the resistance of the cell contact network. Since concentration increases the current per area proportionately, contact network resistance is especially important in cells used with high concentration. Larger "wires" in the contact network would reduce the resistance, but conductive traces on the cell surface block the light from reaching part of the cell, so larger wires have had to be balanced against this light loss. Several alternatives have thus been pursued, such as more complicated cell manufacturing that deposits metal "wires" through holes in the cell to allow putting both the positive and negative contact networks on the back of the cell, but this is more expensive. Transparent conductors such as Indium-Tin-Oxide (ITO) have been used for the front contact network, but these still block some light and also are less conductive than pure metals.

With a solar thermal receiver for running a thermal engine, exceeding 1000 suns concentration does not have the same drawbacks as it does with photovoltaic cells. Even at this concentration, a circulating heat-transfer fluid ensures that the temperatures involved are no higher than the flame in a coal-fired boiler (which is hot enough to melt steel). Since the technology to handle those temperatures in a thermal engine is well established it has been largely a simple cost balance whether to use moderate concentration and efficiency from one-axis focusing and tracking or to use more complex two-axis focusing and tracking to achieve higher temperatures and efficiency. With two-axis trackers, the degree of focusing is also driven by the complexity of accurate mirrors and tracking versus the temperature and thus efficiency increase of higher temperatures. Since the cost of a thermal engine for a given amount of thermal energy is relatively insensitive to temperature, reducing the cost of two-axis focusing can thus strongly slant the balance toward higher efficiency from thermal engines.

The bulk of this application is directed toward improvements in two-axis focusing and tracking systems using large trackers, high concentration, and in general reflective surfaces rather than lenses, but even within this seemingly narrow category there are several important varieties of systems. The prior art for each of these varieties, along with deficiencies of the prior art, is summarized here.

The oldest variety of two-axis tracking and focusing is the heliostat, where multiple moving mirrors all direct reflected light toward the same stationary target. In addition to the prior art legend of Archimedes and the soldiers' shields, which appears to describe using multiple mirrors to focus sunlight onto a ship, "solar tower" heliostats have been built in modern times as least as far back as the 1960s ("*Odeillo Font-Romeu, France*", Encyclopedia of Earth; "*Solar Power Tower*", Solar Paces; "*The History of Solar*", U.S. Department of Energy). Heliostat fields where multiple heliostats share power generation facilities have also been proposed by BrightSource ("*BrightSource Solar Power Complex*", Meta Efficient).

But current heliostat designs require tall towers to keep the mirrors closer to normal to the sun's rays at low sun angles, increasing expense and limiting the maximum concentration; heliostats are generally less efficient users of real-estate than other concentrating designs; and the significantly changing angle of the sun relative to the tower, even with tall towers, changes the effective focal length of curved mirrors which makes curved mirrors less effective at focusing, thus requiring additional curved mirrors (or much larger numbers of flat mirrors) to achieve the desired degree of concentration. Since the areal (per unit area) cost of a tracker rises with small trackers, heliostats either sacrifice concentration or use huge numbers of very large flat mirrors and correspondingly tall towers. In addition to taller towers being more difficult to build, the large area per heliostat prevents heliostats from being cost-effectively used for small-scale electricity generation from small areas.

A second variety of two-axis systems using large trackers puts only one or a few foci on a tracker. This achieves a constant mirror-to-sun angle and makes curved mirrors essential, and fixed focal-length curved mirrors ideal. With only a few foci per large tracker, mechanical cooling is practical. However, such concentrators have traditionally used expensive, fragile glass mirrors; to achieve a tight focus, these larger mirrors are slumped-molded, in many cases to specific shapes for specific positions on the tracker, adding to cost and complexity. Even with high concentration the focus is also large, so if a single cell or multiple cells in parallel are used, the current produced by the cell or the cells in aggregate is very large, requiring huge conductors; if multiple cells in series are used instead, cell balancing becomes critical to match the cell currents because even a single cell receiving insufficient light has a large impact on the performance of the entire series of cells.

A third variety of two-axis systems also uses a large tracker, but incorporates a large number of small mirrors each with its own focal point. This has the advantage that both the mirrors and their focal points move together, which is critical for using a curved mirror for each focus because it keeps all angles and distances constant (at least to the accuracy of the tracker), and each focus can consist of a single cell, eliminating cell balancing issues within each receiver. Again there are examples in the prior art ("*A PRIMER ON CPV TECHNOLOGY*", SolFocus Inc.). However, the prior art has typically relied on expensive, fragile, molded glass mirrors for this; and if mechanical cooling is used, bringing coolant to numerous cells blocks a significant portion of the light, whereas if passive cooling is used, by the time the cells are small enough for passive cooling to be effective, the expense of wiring the numerous cells together is appreciable, and the passive cooling elements themselves also block light in many such systems.

Ensuring balanced cell photocurrents by evening out the light across the cells of a multi-cell focus has been accomplished with homogenizers, but these typically have had an average of at least one reflection or refraction per photon in the light path, which costs efficiency since reflections and refraction are not perfect, and can even lead to homogenizer heating when very high concentration is used. Overcoming unbalanced cells with bypass diodes has also been accomplished, but when the light on a cell is insufficient for the cell's short-circuit current to equal the optimal current of the other cells in the series, the cell's bypass diode bypasses the cell entirely, leading to no usable output from the cell. Since a "cell string", or series of cells, typically contains dozens to hundreds of cells, completely losing one cell is better than significantly impacting an entire cell string; however if the light at a large focus is significantly uneven, enough cells may be under-illuminated to significantly reduce power output. Having a large number of bypass diodes also adds to the cost and complexity of a system.

High-focus systems require accurate tracking in two dimensions to keep a relatively narrow focus aligned on a receiver. While small two-axis trackers on sites with stable soils have been able to use a simple pole set into the ground, the enormous wind load on a large tracker has generally been handled by anchoring a massive tracker pole in a multi-ton concrete cylinder. An alternative is to have the whole tracker mounted on multiple wheels on a circular rail so that tracking on a first axis can be accomplished by "driving" the tracker around the rail; while this provides an exceptionally stable base, it is more expensive and it does not leave the land under the tracker available for other purposes.

While one-axis trackers have been ganged together so that multiple tracking platforms can be aligned using a single set of sensors and a single motor, the mountings of large two axis trackers have heretofore made this impractical. For high-concentration systems, the alignment accuracy required has also precluded driving multiple platforms from a single motor; while the initial alignment accuracy can be achieved, even slight stretching, shrinking or twisting of the linkages between the motor and the farthest tracker, whether through simple stress or temperature related expansion and contraction, accumulates with distance. Thus each tracker has required its own accurate, and thus expensive, alignment sensors and tracking motors, preventing significant economies of scale in multi-tracker installations.

There are places, such as residential rooftops, where large two-axis trackers are not practical. Heliostats with small two-axis trackers ganged together have been pioneered by Findell in U.S. Pat. No. 4,317,031, but have not been able to cost-effectively achieve sufficient concentration to make high-efficiency photovoltaic cells practical.

One-axis trackers have a long history in solar thermal systems, and have also been used for low and moderate concentration onto silicon cells. However while one-axis tracking is simpler than two-axis tracking, one-axis tracking has not previously supported the very high concentration needed to make either high-efficiency cells practical or to efficiently generate the very high temperature steam needed to make solar thermal electrical generation efficient.

Solar energy has often been criticized for being intermittent and non-dispatchable. While solar thermal systems with heat storage can take care of the intermittency, making solar thermal with storage dispatchable power rather than baseload power requires oversized turbines and generators, dramatically raising costs. Photovoltaic systems have been neither dispatchable nor non-intermittent, reducing their value for supplying power beyond intermittent peaking power.

Space-based solar energy collection would also eliminate intermittency, but space-based solar collection systems have been too heavy to launch on a scale that would be useful for transmitting energy back to earth. While gossamer mirrors could reduce the weight by concentrating sunlight, these have required struts under compressive forces to maintain their shape, again making large mirrors impractically massive, and cooling systems suitable for high-concentration cells have also been too massive to be practical to launch in sufficient quantity.

While in the First World manual labor is expensive and cooking is generally performed on electric or gas stoves, much of the Third World has significantly different needs. Automated tracking systems are generally too expensive for Third World needs, so the choice is usually between expensive small diesel generators or doing without electricity. Wood or dung are often used for fuel, and in sunny areas of the third world these are often in scarce supply, so gathering them consumes an inordinate amount of time. Dung is also better used as fertilizer, and wood gathering often worsens deforestation, and both, when burned for cooking, lead to air pollution (and create a serious health hazard when burned indoors). While solar energy has made some progress in the Third World, it has been limited to a few solar cookers and inefficient flat panel photovoltaic systems that are too expensive to provide enough electricity to meet basic needs.

Because harnessing solar energy at a cost that allows it to replace fossil fuels is so important to humanity's future, there is a critical need to overcome the drawbacks of the current art, as discussed above, by providing more cost-effective ways to focus the sun's energy to high concentration and to use that high concentration for photovoltaics, thermal engines, and a wide variety of energy-intensive thermal transformations.

SUMMARY OF THE INVENTION

It is therefore one object of the present invention to provide high-concentration solar energy systems that can be built entirely with materials available in the time of Archimedes.

It is a further object of the present invention to provide high-concentration solar energy systems that can not only be built entirely with materials available in the time of Archimedes, but that can also be designed entirely with mathematics known to have been known to Archimedes.

It is an even further object of the present invention to provide such Archimedes-era-material, Archimedes-era-mathematics systems with sufficient light-gathering area and high enough concentration to be able to rapidly set a ship on fire at a bowshot distance.

It is a still further object of the present invention to provide such ship-ignition-capable high-concentration system in a form that can shield its operators from arrows without significantly impairing its operation.

It is a yet further object of the present invention to provide such ship-ignition-capable system with a practical suspension system for multiple large mirrors that allows the mirrors to be easily steered.

It is an exemplary object of the present invention to provide operator-shielding, suspended, ship-ignition-capable systems with rapid targeting means for determining how to steer them to directing their focused light onto a target.

It is a further object of the present invention to provide a more material-efficient ship-ignition-capable high-concentration solar system buildable with materials available in the time of Archimedes.

It is a further object of the present invention to provide a ship-ignition-capable high-concentration solar system with an easily adjustable focal length, and buildable with materials available in the time of Archimedes.

It is a further object of the present invention to provide a ship-ignition-capable high-concentration solar system with independently adjustable focal lengths in horizontal and vertical directions, and buildable with materials available in the time of Archimedes.

It is a further object of the present invention to provide a high-concentration solar system easily buildable with materials available in a Third World village today.

It is another object of the present invention to provide a way that is cost-effective in the First World to build high-concentration solar energy systems using two-axis trackers where the systems have one or a few foci per large tracker.

It is a further object of the present invention to accomplish this with a frame that efficiently supports substantially parabolic ribs for a high-concentration large-aperture mirror while balancing the center of gravity and approximately balancing the center of wind loading of the mirror at the center of the frame.

It is an even further object of the present invention to accomplish this with a frame that provides sufficient support for segment-bent ribs of simple steel tubing in sufficient number to support segment-bent rails of simple steel tubing sufficiently that mirrors affixed to the rails will not deflect too much under moderate wind to maintain a high-concentration focus on a receiver attached to the frame.

It is a still further object of the present invention to provide this with a planar frame that directly supports four equally spaced, parallel, substantially parabolic identical ribs, two at their middles and two each at two symmetric points near their ends, wherein the frame is enough narrower in one direction that in a cross-section through the middles of the ribs, the top inside edges of all four ribs lie on a parabola of similar focal length to the focal length of the ribs.

It is an even further object of the present invention to accomplish this with a frame that provides sufficient support for straight-lattice parabolic-support steel ribs in sufficient number to support straight-lattice parabolic-support steel rails sufficiently that mirrors affixed to the rails will not deflect too much under moderate wind to maintain a high-concentration focus on a receiver attached to the frame.

It is an even further object of the present invention to provide a planar frame for a row of an even number of large-aperture substantially parabolic mirrors that balances the center of gravity and approximately balances the center of wind loading of the mirrors at the center of the frame, wherein the center of the frame is between the two mirrors closest to the middle of the row of mirrors.

It is a still further object of the present invention to provide a planar frame for an array of an even number of rows each containing an even number of large-aperture substantially parabolic mirrors, where the array frame balances the center of gravity and approximately balances the center of wind loading of the mirrors at the center of the frame, wherein the center of the frame is between the four mirrors closest to the middle of the array of mirrors.

It is a further object of the present invention to provide a bracket for a set of identical segment-bent approximately parabolic ribs crossed at right angles by a set of identical segment-bent approximately parabolic rails, where each rail is attached by a bracket to each rib that it crosses, and where all such brackets are identical.

It is a further object of the present invention to accomplish this with multiple identical ribs attached on opposite sides of a single, symmetrical centerline truss.

It is an even further object of the present invention to accomplish this with multiple identical ribs that have parabolic rails integrated into the individual ribs.

It is a still further object of the present invention to accomplish this with multiple identical ribs that have parabolic rails integrated into the individual ribs, where the ribs are light-weight lattice ribs and the supports for the parabolic rails also serve as cross-braces for the lattice ribs.

It is another object of the present invention to provide a large, high-concentration mirror buildable from identical mirror segments that are made from flat sheets of mirrored glass that are pre-shaped into parabolic curves in their long direction before installation as segments of the large mirror.

It is a further object of the present invention to provide a shaping means for such mirrors that minimizes the effects of differential thermal expansion between the mirror glass and the shaping means.

It is an even further object of the present invention to provide a mirror-shaping means that allows one mirror on one segment of a segment-bent parabolic rail to ride over the neighboring segments of the segment-bent rail.

It is a still further object of the present invention to provide a mirror-shaping means that allows one mirror on one segment of a segment-bent parabolic rail to ride over an identical mirror on a neighboring segment of the rail.

It is a still further object of the present invention to provide mirror-shaping means that allow one mirror on one segment of a segment-bent parabolic rail to ride over a non-identical mirror on a neighboring segment of the rail.

It is an even further object of the present invention to provide a shaping means for such mirrors that comprises sleeves that can be placed on each side of a mirror as it is bent on a parabolic mandrel.

It is an even further object of the present invention to provide a shaping means for such mirrors that protects the mirror finish from moisture through a seal that includes means to prevent changing atmospheric pressure from stressing or changing the shape of the mirror, where the seal is at least substantially hermetic so that an inexpensive moisture absorption means (such as a packet of silica gel)

inside the mirror shaping means is sufficient to prevent moisture from corroding the mirror finish.

It is a further object of the present invention to provide multiple types of a mirror-shaping means that allow a minimum number of different types of mirror-shaping means to shape mirror segments that allow several mirror segments end-to-end to span an aperture, allowing the use of straight-sided glass in the mirror segments without significant gaps between segments and without significant rotation of the direction of the width of the mirror segments at optimal rim angles, without hyperbolic mirror corners that would create significant effective mirror area losses.

It is an even further object of the present invention to prove such mirror shaping means that are rigid enough to allow the mirror shaping means for an optimum-length mirror to be supported at only two points on each side of the mirror, while not deflecting too much under moderate wind to maintain a high-concentration focus on a receiver attached to the frame to which the mirror-shaping means are affixed.

It is a still further object of the present invention to provide such mirror shaping means that be easily supported by straight-lattice parabolic-support rails that are in turn supported by straight-lattice parabolic-support ribs that are in turn supported by a balancing frame.

It is another object of the present invention to provide a mirror-shaping means that allows a flat mirror to be bent into a parabolic arc by a simple rotational motion of one or more flat shaping means.

It is a further object of the present invention to provide such a mirror shaping means that is formed from the same flat sheet of material from which the mirror is formed.

It is a further object of the present invention to provide such a mirror shaping means that is attached to the mirror material, allowing a glass mirror to be bent.

It is an even further object of the present invention to provide such attached mirror shaping means that allow adjusting the focal length of the parabolic arc to be adjusted by adjusting the degree to which the mirror shaping means is rotated.

It is another object of the present invention to provide a simple receiver support mechanism for a large-aperture mirror that allows the position of the receiver relative to the mirror frame to be easily and accurately adjusted using mechanisms at the level of the frame rather than at the level of the mirror.

It is another object of the present invention to provide such a receiver support mechanism for a large-aperture mirror that allows the receiver to be raised from the level of the frame and secured with a single subsequent attachment, and lowered to the level of the frame by releasing a single attachment.

It is another object of the present invention to provide a receiver support that can automatically be rapidly adjusted to switch between different types of receivers.

It is another object of the present invention to provide a photovoltaic receiver for a large aperture high-concentration mirror made of constant-width parabolic segments, where the receiver uses rows of photovoltaic cells in parallel (or a row consisting of a single long photovoltaic cell if thermal expansion effects permit it) in a direction parallel to the curved direction of the mirror segments, so that uneven illumination in this direction in inconsequential in balancing cell currents, with these rows of cells in series along a longer receiver axis substantially parallel to the unbent width of the mirror segments, so that for much of the length of the receiver the concentration of light on the rows of cells is essentially constant.

It is a further object of the present invention to provide such a photovoltaic receiver with coolant flow through a coolant tube per row of cells, where the cells are soldered directly to the tube but extend slightly beyond the tube in one direction, allowing the tube to be oriented so that the cells are 'shingled' from one tube to the next, placing the rows of cells in series with no cell area blocked by bus-bars, while minimizing the resistance between rows.

It is an even further object of the present invention to provide such cooling tubes that are substantially rectangular in cross-section, and that are rotated a few degrees with respect to the plane of the receiver surface so that a plane touching the edges of the shingled rows of cells will be in the same plane as the receiver surface as a whole.

It is a further object of the present invention to provide such a photovoltaic receiver with bypass diodes only for rows of cells near the ends of the receiver where the concentration is less constant.

It is a further object of the present invention to provide a receiver for a large-aperture mirror made using length-bent parabolic segments, where the segments farther from the center of the mirror, and thus at higher angles, are narrower than those nearer the center, minimizing the size of the lower-concentration regions at the ends of the focus.

It is a further object of the present invention to provide a receiver for a large-aperture mirror made using constant-width parabolic-segments, where the receiver uses flat non-imaging secondary reflectors to provide an extremely even concentration across substantially the entire length of the focus, and thus across the length of the receiver that receives substantially all of the light reflected from the primary mirror.

It is an even further object of the present invention to provide a receiver for a large aperture mirror made using length-bent constant-width parabolic segments, where the receiver uses flat non-imaging secondary reflectors to provide an extremely even concentration across substantially the entire length of the focus, and where the focal length of the primary mirror in the direction of the length of the mirror segments is longer than the focal length of the primary mirror in the direction of the width of the segments of the primary mirror, where the difference in focal lengths causes the minimum width of the focus as obtained by the non-imaging secondary reflector parallel to the width of the main mirror segments to occur at substantially the same distance and direction from the center of the primary mirror as the minimum length of the focus as obtained by the non-imaging secondary reflector parallel to the length of the main mirror segments.

It is a further object of the present invention to provide a high-concentration mirror and secondary reflector that reaches the maximum practical focus in a high-concentration direction together with a receiver that has rows of photovoltaic cells in parallel in this direction, where the focus in the orthogonal direction is relaxed to reach the ideal cost-effective concentration for the cells, and the cells are cooled by coolant flowing through a coolant tube for each row and parallel to the rows, allowing as many rows of cells in series as possible to reach a high integral divisor of the ideal input voltage of a DC-to-AC inverter to which the receiver is attached, and allowing the coolant tubes to be as wide as possible to minimize their resistance to coolant flow.

It is a further object of the present invention to provide a high-concentration mirror whose tracker alignment sensitivity is significantly less in one direction than in an orthogonal direction, allowing it to be efficiently used on a tracker whose accuracy is less in one direction than in an orthogonal direction.

It is also a further object of the present invention to provide a high-concentration mirror with fine tracking through lateral movement of the receiver relative to the mirror frame, allowing it to be efficiently used on a tracker whose accuracy would otherwise not be sufficiently accurate.

It is another object of the present invention to provide improved cells for high-concentration solar energy systems using two-axis trackers, where the cells are made less temperature sensitive so that a receiver can efficiently provide both photovoltaic power and high-temperature heat transfer fluid.

It is a further object of the present invention to provide such less temperature-sensitive cells for high-concentration solar energy systems using two-axis trackers, where the cells are multi-junction cells made less expensive through replacing the germanium substrate with crystalline silicon cut at an angle relative to its crystal lattice such that the average spacing of atoms on its surface matches the lattice constant of the materials of the neighboring junctions in the multi-junction cells.

It is also an object of the present invention to provide improved cells for high-concentration solar energy systems using two-axis trackers, where the cells are made more efficient by using top contacts angled so that light impinging on them is largely reflected onto receptive regions of the cell surface.

It is also an object of the present invention to provide a solar thermal system for extracting carbon dioxide from an amine solution that has captured that carbon dioxide from a fossil-fuel-based power plant.

It is also an object of the present invention to provide photovoltaic cells that operate efficiently at the temperatures required for extracting carbon dioxide from an amine solution.

It is another object of the present invention to provide a more cost-effective way to build high-concentration heliostat systems that use two-axis trackers, through minimizing the change in the cosine of the angle of the sun to the mirror at different times, and/or minimizing the impact of such changes in the cosine of that angle.

It is a further object of the present invention to accomplish this while using cylindrically-curved mirrors to maximize the concentration achievable from a given number of trackers.

It is a further object of the present invention to accomplish this through a more efficient way to arrange heliostat receiver area on a heliostat tower.

It is further object of the present invention to accomplish this through the use mirrors that direct light to heliostat receivers on different heliostat towers at different times.

It is a further object of the present invention to provide a more cost-effective way to build heliostat systems by accomplishing this while achieving very-high concentration and while simultaneously achieving a high mean-to-peak power ratio.

It is an even further object of the present invention to accomplish this with identical mirrors on identical trackers.

It is another object of the present invention to provide a cost-effective way to build an extremely high-concentration heliostat system that use two-axis trackers, through using large, robust, adjustable-focal-length segmented mirrors.

It is another object of the present invention to provide more efficient and cost-effective high-concentration solar energy systems using two-axis trackers, where each tracker contain numerous mirrors that each focus on one or a few small photovoltaic cells.

It is a further object of the present invention to accomplish this through providing an arrangement of cell aspect ratios and aperture aspect ratios and alignments between them that minimize the length of coolant tubing required to connect the cells.

It is a further object of the present invention to accomplish this through providing coolant tubing that maximizes coolant flow relative to the light that the coolant tubing blocks or misdirects.

It is an even further objective of the present invention to provide increased efficiency and simplified maintenance in high-concentration systems with small foci and mechanical cooling by providing cooling fluid delivery systems that minimize light blockage while allowing major system components to be protected from the elements.

It is a further object of the present invention to provide increased efficiency and reduced cost in high-concentration systems with small foci through co-optimization of cell shape and secondary reflector shape by using a round secondary reflector and a hexagonal cell.

It is an even further object of the present invention to trade concentration and/or alignment insensitivity for focus shape relative to mirror shape to achieve a substantially round focus from substantially square mirrors or lenses to match a round secondary reflector and a hexagonal cell.

It is a further object of the present invention to accomplish this through secondary reflectors and heat pipes that also serve as robust, low-resistance electrical contacts to the cell, without having the heat pipes become an electrical shock hazard.

It is a further object of the present invention to accomplish this with passive thermal protection for cells for when passive cooling proves inadequate.

It is a further object of the present invention to provide increased efficiency in high-concentration systems that use mechanical cooling by capturing and utilizing light that would be blocked by the cooling system.

It is an even further object of the present invention to accomplish this with a separate photovoltaic circuit that operates at lower voltage than the main photovoltaic circuit, and using this lower-voltage circuit to provide power for the cooling system itself and/or the tracking system, thus easing maintenance and increasing safety.

It is a still further object of the present invention to use this to provide power for corona discharge cooling to supplement natural wind cooling, thus providing supplemental cooling without using moving parts.

It is a further object of the present invention to provide a receiver that provides translational secondary alignment means to allow high concentration to be achieved with a tracker less accurate than normally required for high concentration.

It is an even further object of the present invention to provide a simple adaptor for turning translational-shift fine tracking adjustments into rotation of an arm, where the rotation of the arm is such that a normal angular alignment sensor affixed it will produce signals appropriate for accurate fine tracking.

It is another object of the present invention to reduce the cost of supports for large two-axis trackers in a large field of such trackers by providing a tracker support arrangement that allows multiple trackers to share supporting structures.

It is a further object of the present invention to accomplish this in a manner that approaches one concrete pad or other anchor point per tracker, while allowing reducing the leverage of wind loading on the pads or anchors to far below that of a central-post tracker.

It is also an object of the present invention to reduce the cost of large two-axis trackers for high-concentration solar energy systems through allowing two motors to cooperatively drive the movement of a tracker in both daily and seasonal directions.

It is also an object of the present invention to provide a low-cost means of supporting a very dense array of large concentrators for photovoltaic systems to provide shade, with sufficient ground clearance for use on a parking lot.

It is also a further of the present invention to provide a low-cost means of supporting a very dense array of large parabolic concentrators on two-axis trackers to provide shade, with sufficient ground clearance for use on a parking lot.

It is also an object of the present invention to provide a business model for cost-effectively increasing customer flow to a business by providing environmentally friendly recharging for electric and hybrid vehicles from solar panels that shade a parking lot to keep customers' cars cool.

It is also an object of the present invention to provide a means for generating both base-load power and dispatchable peaking power from solar energy without over-sized turbines and generators.

It is a further object of the present invention to provide a means for generating both base-load power and peaking power through a concentrator that can switch between a receiver for a solar thermal system with heat storage and a photovoltaic receiver.

It is an even further object of the present invention to accomplish such means with using a shared heat rejection system for cooling both a photovoltaic receiver and a re-condenser for a solar thermal system.

It is also an object of the present invention to provide means for obtaining sufficient cooling for a photovoltaic receiver or a solar thermal re-condenser using a smaller heat rejection system that cools a heat-transfer fluid when the sun is not shining and accumulates that cooled fluid for use in cooling when the sun is shining.

It is another object of the present invention to provide means for obtaining sufficient cooling for a photovoltaic receiver or a solar thermal re-condenser using a smaller heat rejection system that cools a heat-transfer fluid when the sun is not shining and accumulates that cooled fluid for use in cooling when the sun is shining, where the mass of stored coolant serves as a substantial portion of the anchor mass required to ballast a mass-anchored tower against wind loading.

It is also an object of the present invention to provide means for obtaining sufficient cooling for a photovoltaic receiver or a solar thermal re-condenser using a smaller heat rejection system that cools a heat-transfer fluid when the sun is not shining and accumulates that cooled fluid for use in cooling when the sun is shining.

It a further object of the present invention to provide means for obtaining sufficient cooling for a photovoltaic receiver or a solar thermal re-condenser using a smaller heat rejection system that cools a heat-transfer fluid when the sun is not shining and accumulates that cooled fluid for use in cooling when the sun is shining, in which said heat rejection system capitalizes on cooler night-time temperatures and lower night-time electricity rates to increase the effectiveness and reduce the cost of operating its heat rejection system.

It is also an object of the present invention to provide easily-adjustable-focal-length parabolic troughs for heliostat trackers and linear Fresnel concentrators.

It is a further object of the present invention to provide easily-adjustable-focal-length parabolic troughs for heliostat trackers and linear Fresnel concentrators where the adjustments of the focal length can be coupled to the rotation of the trough through passive means.

It is a further object of the present invention to provide easily-adjustable-focal-length parabolic troughs for heliostat trackers and linear Fresnel concentrators where multiple focal length adjustments can be driven by a single active means.

It is also an object of the present invention to provide a system for achieving very high concentration in which a large primary concentrator only tracks in one dimension.

It is a further object of the present invention to provide a system for achieving very high concentration in which large a primary concentrator only tracks in one dimension, and only curves in one dimension at any given point.

It is a further object of the present invention to provide a system for achieving very high concentration in which a large primary concentrator only tracks in one dimension, and in which concentration in a second dimension is provided by multiple secondary concentrators that are in aggregate smaller then the primary concentrator.

It is also an object of the present invention to provide a cooling system with extremely low mass per cooling surface area that is capable of sufficiently cooling photovoltaic cells under high or very high concentration in a micro-gravity environment.

It is also an object of the present invention to provide a very low mass system for producing tensile forces in three dimensions over very large distances in a micro-gravity environment.

It is also an object of the present invention to provide very-high-concentration solar energy focusing system that has extremely low mass per effective aperture area, that is capable of operating in a micro-gravity environment.

It is also an object of the present invention to provide a very large focusing mirror of sufficient shape accuracy and stability to serve as a primary mirror for a space-based telescope.

It is also an object of the present invention to means for building a very high accuracy gossamer mirror for a space-based telescope.

It is a further object of the present invention to means for building a very high accuracy gossamer mirror for a space-based telescope, where the shape of the mirror can be fine-tuned in a micro-gravity environment.

It is also an object of the present invention to provide many examples of especially preferred and exemplary combinations of means for the above objectives that are capable of making solar energy cost effective with fossil fuels for the generation of electric power.

In accordance with the present invention, there is provided a device for concentrating substantially parallel rays of radiant energy using a close approximation of a paraboloid of rotation, the device comprising multiple discrete reflectors for the radiant energy attached to a membrane that is deformed through the pressure of a fluid into a substantially paraboloidal shape that is a close approximation of a paraboloid of revolution. The radiant energy exploited can be solar energy and the device can be constructed entirely using materials known in the time of Archimedes.

In some embodiments of the present invention, the membrane is hardened after deformation so that it maintains a substantially paraboloidal shape when the fluid pressure is removed.

In some embodiments of the present invention, the pressure is supplied by a difference in air pressure between the two faces of the membrane, and where the membrane remains flexible so that the focal length of the paraboloid can be controlled by changing the air pressure on one side of the membrane.

In some embodiments of the present invention, the discrete reflectors are substantially flat mirrors or flexible strips significantly longer than they are wide, and where the strip are held in close proximity to the membrane at multiple points along their lengths.

In accordance with the present invention, there is provided a method for concentrating substantially parallel rays of radiant energy using a close approximation of a paraboloid of rotation, wherein the method comprises attaching multiple discrete reflectors for the radiant energy to a membrane that is then deformed through the pressure of a fluid into a substantially paraboloidal shape that is a close approximation of a paraboloid of revolution.

In accordance with the present invention, there is provided a frame for supporting a substantially paraboloidal surface wherein a substantially parabolic curvature of the frame in a first direction is established by a structure comprising a set of at least three supports substantially parallel to each other in their longest dimensions, where each of the supports is a substantially constant height along its length, and where the supports are positioned in a third direction, perpendicular to their lengths and their heights, such that at their positions in the third dimension their heights lie on a curve that is substantially parabolic.

In some embodiments of the present invention, a substantially parabolic curve is established in a second direction, substantially orthogonal to the first direction, through a structure comprising a set of substantially identical members placed on top of the supports, where the members are substantially parallel in their longest dimensions to the longest dimensions of the supports, and where each member has a substantially flat bottom and a substantially parabolic top or through a set of members placed on top of the supports, where each of the members is substantially constant in height along its length, where the members are substantially orthogonal in their longest dimensions to the longest dimensions of the supports, and where the members are positioned along the supports such that at their positions along the supports their heights relative to the supports lie on a curve that is substantially parabolic.

In accordance with the present invention, there is provided a substantially paraboloidal reflector for concentrating substantially parallel rays of radiant energy, where the reflective device of the reflector is supported by a frame as embodied above. The radiant energy exploited can be solar energy and the device can be constructed entirely using materials known in the time of Archimedes In some embodiments of the present invention, the reflective device comprises narrow strips of reflective material whose length runs substantially orthogonal to the length of the members.

In accordance with the present invention, there is provided a method for concentrating substantially parallel rays of radiant energy using a close approximation of a paraboloid of rotation, wherein the method comprises building a frame wherein a substantially parabolic curvature of the frame in one direction is established by a structure comprising a set of at least three supports substantially parallel to each other in their longest dimensions, where each of the supports is a substantially constant height along its length, and where the supports are positioned in the third direction, perpendicular to their lengths and their heights, such that at their positions in the third dimension their heights lie on a curve that is substantially parabolic, and wherein a substantially parabolic curvature of the frame is established in a second direction, substantially orthogonal to the one direction, through structures comprising a set of members placed on top of the supports, where each of the members is substantially constant in height along its length, where the members are substantially orthogonal in their longest dimensions to the longest dimensions of the supports, and where the members are positioned along the supports such that at their positions along the supports their heights relative to the supports lie on a curve that is substantially parabolic, and wherein multiple discrete reflectors for the radiant energy are then attached to the frame.

In accordance with the present invention, there is provided an apparatus with a reflective surface for concentrating radiant energy wherein the reflective surface is supported by structures that are substantially a paraboloid of translation in a first direction that support a set of members placed on top of the structures that are each substantially a paraboloid of translation, wherein each of the members is substantially constant in height along its length, where the members are substantially orthogonal in their longest dimensions to the direction of translation of the structures that are substantially a paraboloid of translation, and where the members are positioned along the direction of translation such that at their positions along the direction of translation their heights relative to the structures that are substantially a paraboloid of translation are substantially proportional to their distance from a reference line on the structures to the direction of translation of the structures. The radiant energy exploited can be solar energy and the device can be constructed entirely using materials known in the time of Archimedes In accordance with the present invention, there is provided a method for concentrating substantially parallel rays of radiant energy wherein a frame is built with structures that are substantially a paraboloid of translation in a first direction, and where the structures support a set of members placed on top of the structures, wherein each of the members is substantially constant in height along its length, where the members are substantially orthogonal in their longest dimensions to the direction of translation of the structures, and where the members are positioned along the direction of translation such that at their positions along the direction of translation their heights relative to the structures that are substantially a paraboloid of translation are substantially proportional to their distance from a reference line on the structures to the direction of translation of the structures, and wherein multiple discrete reflectors for the radiant energy are then attached to the frame.

In accordance with the present invention, there is provided a frame for supporting a substantially paraboloidal surface wherein a substantially parabolic curvature of the frame in one direction is established by structures comprising a set of substantially identical rails that are substantially parallel to each other in their longest dimensions, where the top of each of the rails is substantially parabolically curved in the direction of its length, and where a truss intersects each of the rails at substantially the same distance along each of the rails, with of each of the rails being positioned by being affixed to the truss at a height relative to the others of the rails such that at their positions along the truss their intersections with the truss lie on a curve that is substantially parabolic.

In some embodiments of the present invention, the intersections of the rails and the truss lie substantially on a plane orthogonal to the rails, where there are an even number of the rails on at least one side of the truss, where pairs of rails on the side of the truss each support one or more reflective segments, and where the aggregate surface of all of the reflective segments approximates a section of a parabolic dish.

In some embodiments of the present invention, each reflective segment is substantially a section of a cylinder or substantially a section of a paraboloid of translation wherein the reflective segments can be shaped substantially into paraboloids of translation before installation by shaping devices from a substantially rigid material, and where the shaping devices are attached to the rails during the installation of the reflective segments on the frame and wherein the paraboloid of translation of each reflective segment can have the substantially same focal length at the substantially parabolic curve that the intersections of the truss with the rails lie upon.

In some embodiments of the present invention, such a frame comprises substantially identical rails for supporting a reflective surface that approximates a section of a parabolic dish, and wherein the rails are also supported near their ends that are farthest from the truss and wherein the height at which the substantially identical rails are also supported near their ends that are farthest from the truss is within 10% of the depth of the parabolic dish from the height of the center of gravity of the dish.

In some embodiments of the present invention, such a frame comprises substantially parabolic curved top of each of the substantially identical rails comprises a number of substantially equal-length substantially straight segments with bends in between the segments that cause the middles of the segments to lie substantially upon a parabolic curve and can outline a substantially parabolic dish that is substantially symmetrical around the truss.

In accordance with the present invention, there is provided a device for supporting a substantially paraboloidal surface, wherein a substantially parabolic curvature in one direction is established by a structure comprising a set of three substantially identical ribs or rails substantially parallel to each other in their longest dimensions, where the top of each of the ribs or rails is substantially parabolically curved in the direction of its length, and where the overall substantially parabolic curvature in the other direction is established by supporting the middles of the outer ones of the ribs or rails directly on a substantially planar square frame, and supporting the central rib or rail near its ends directly on the frame.

In accordance with the present invention, there is provided a device for supporting a substantially paraboloidal surface wherein a substantially parabolic curvature in one direction is established by a structure comprising a set of four substantially identical ribs or rails substantially parallel to each other in their longest dimensions, where the top of each of the ribs or rails is substantially parabolically curved in the direction of its length, and where the overall parabolic curvature in the other direction is established by supporting the middles of the outer ones of the ribs or rails directly on a substantially planar rectangular frame, and supporting each of the central ribs or rails near their ends directly on the frame.

In accordance with the present invention, there is provided a frame for supporting a substantially paraboloidal surface wherein a substantially parabolic curvature of said frame in one direction is established by a structure comprising a set of substantially identical rails that are substantially parallel to each other in their longest dimensions, where the top of each of said rails is substantially parabolically curved in the direction of its length, and where a substantially straight truss intersects each of said rails at substantially the same distance along each of said rails, with of each of said rails being positioned by being affixed to said substantially straight truss at a height relative to the others of said rails such that at their positions along said truss their intersections with said truss lie on a curve that is substantially parabolic.

In some embodiments of the present invention, the intersections of the ribs and the truss lie substantially on a plane orthogonal to the ribs, where there are an even number of the ribs on at least one side of the truss, where a pair of ribs on the side of the truss supports one or more pairs of the rails, where each of the pairs of rails supports one or more reflective segments, where the aggregate surface of all of the reflective segments approximates a section of a parabolic dish. The ribs are also supported near their ends that are farthest from the truss.

In some embodiments of the present invention, each reflective segment is substantially a section of a cylinder or a paraboloid of translation and wherein the parabola of translation of each reflective segment has substantially the same focal length as the substantially parabolic curve of the top of each rib and wherein the reflective segments are shaped substantially into paraboloids of translation before installation by shaping devices comprising a substantially rigid material, and where the shaping devices are attached to the rails during installation of the reflective segments on the frame.

In yet other embodiments of the present invention, the frame supports a reflective surface that approximates a section of a parabolic dish, wherein the height at which the ribs are also supported near their ends that are farthest from the truss is within 10% of the depth of the dish from the height of the center of gravity of the dish.

In some embodiments of the present invention, the substantially parabolic curved top of each of the substantially identical ribs comprises a number of substantially equal-length substantially straight segments with bends in between the segments that causes the middles of the segments to lie substantially upon a parabolic curve.

In some embodiments of the present invention, the substantially parabolic curved top of each of the substantially identical rails also comprises a number of substantially equal-length substantially straight segments with bends in between the segments that causes the middles of the segments to lie substantially upon a parabolic curve.

In some embodiments of the present invention, the substantially parabolic curved tops of the substantially identical ribs outline a substantially parabolic dish that is substantially symmetrical around the truss.

In accordance with the present invention, there is provided a curved mirror for use in a system for concentrating solar energy, wherein a substantially flat, substantially rigid but slightly bendable mirror is held bent into a curved shape by a structure comprising a curved groove in a sleeve of substantially rigid material on each side of the slightly bendable mirror.

In some embodiments of the present invention, the appropriately-curved grooves are curved substantially on parabolic arcs, and the curved mirror is thereby shaped substantially into a paraboloid of translation.

In some embodiments of the present invention, a single sleeve has a curved groove on each side of the curved mirror, and wherein the sleeve can have multiple substantially flat segments on its face that is opposite the curved mirror, wherein the sleeve is enough narrower than the mirror to accommodate the curve of the curved mirror across the segments of substantially identical segment-bent substantially parabolically-curved rails.

In some embodiments of the present invention, the sleeve further comprises a support for the curved mirror between the grooves that is substantially parallel to the grooves and is curved comparably to the grooves and can provide a substantially water-tight seal that protects the back of the curved mirror. The sleeve can include a flexible bladder that substantially prevents changes in atmospheric pressure from distorting the mirror or the sleeve.

In some embodiments of the present invention, the curved mirror when held curved by the grooves in a sleeve of substantially rigid material and the sleeve are together rigid enough to maintain the curvature to the degree required to concentrate the bulk of the sunlight striking the mirror onto its intended target under the wind loads that the system is intended to operate under while being supported by only two rails substantially perpendicular to the direction of curvature of the curved mirror.

In some embodiments of the present invention, the curved mirror is held against a curved mandrel to maintain its desired shaped to very high accuracy while a sealant or adhesive in the curved grooves sets.

In some embodiments of the present invention, the curved groove in a sleeve of substantially rigid material on each side of the slightly bendable mirror is in a separate sleeve, and where the sleeves on each side are held relative to each other by cross-bracing between them. The cross-bracing can also provide support for the curved mirror to reinforce it against the impact of hail.

In accordance with the present invention, there is provided a method for curving a mirror for use in a system for concentrating solar energy, wherein a substantially flat, substantially rigid but slightly bendable mirror is bent into a curved shape, and is then held in that shape by structures comprising a curved groove in a sleeve of substantially rigid material on each side of the slightly bendable mirror.

In accordance with the present invention, there is provided a curved mirror for use in a system for two-axis concentration of solar energy wherein multiple initially substantially flat, substantially rigid but slightly bendable mirrors are each held bent into a curved shape before being installed on a frame that supports them.

In some embodiments of the present invention, the mirror is held bent into shape by structures comprising substantially straight members that run substantially perpendicular to the curvature of the mirror and also comprising tabs folded from support members that run substantially parallel to the curvature of the mirror.

In some embodiments of the present invention, the material of the initially substantially flat mirror is not brittle and the mirror is shaped by folding the mirror material on an each on arch side of the resulting focusing surface of the mirror.

In some embodiments of the present invention, the mirror material along the arc on each side of the resulting focusing surface is made less stiff before folding the mirror material along the arc on each side of the resulting focusing surface. Making the material less stiff can comprise drilling holes in the material along the arc, and, if the material of the initially substantially flat mirror is thermoplastic, heating the material along the arc and pressing the material along the arc to make the material thinner along the arc.

In some embodiments of the present invention, the aggregate surface of the multiple mirrors approximates a surface that focuses in two dimensions and the aggregate surface of the multiple mirrors can approximate a parabolic dish.

In accordance with the present invention, there is provided a method for building a system for two-axis concentration of solar energy wherein multiple initially substantially flat, substantially rigid but slightly bendable mirrors are each held bent into a curved shape, and are then installed on a frame that supports them to form a surface that concentrates solar energy in two dimensions.

In accordance with the present invention, there is provided a curved mirror for a system for focusing radiant energy, the mirror comprising a substantially rigid but slightly bendable rotatable member attached to a substantially rigid but bendable sheet of material capable of reflecting the radiant energy, wherein the attachment between the rotatable member and the slightly bendable sheet follows an arc that substantially follows one edge of the substantially rigid member. The arc can be substantially parabolic.

In accordance with the present invention, there is provided a method for forming a curved mirror for a system for focusing radiant energy, the method comprising attaching a substantially rigid but slightly bendable rotatable member to a substantially rigid but slightly bendable sheet of material capable of reflecting the radiant energy, wherein the attachment between the rotatable member and the slightly bendable sheet follows an arc that substantially follows one edge of the rotatable member, where the attachment is made while the plane of the rotatable member is substantially parallel to the slightly bendable sheet and the slightly bendable sheet is substantially flat, and where the rotatable member is then rotated relative to the slightly bendable sheet to bend the slightly bendable sheet.

In some embodiments of the present invention, the focal length of the substantially parabolic curve can be adjusted by adjusting the angle at which the rotatable member is rotated relative to the slightly bendable sheet.

In accordance with the present invention, there is provided a method for curving an initially substantially flat sheet of material for a system for focusing radiant energy, the method comprising attaching to or forming from the substantially flat sheet of material a substantially rigid but slightly bendable rotatable member, wherein the attachment between the rotatable member and the initially substantially flat material follows a substantially parabolic arc, and then rotating the slightly bendable rotatable member.

In accordance with the present invention, there is provided a system for two-axis concentration of solar energy using multiple curved mirrors, wherein a plurality of mirrors are used to span the aperture of the approximated parabolic dish in the direction in which the curved mirrors are curved.

In some embodiments of the present invention, four such mirrors are used to span the aperture of the approximated parabolic dish in the direction in which the curved mirrors are curved. In other embodiments, a plurality of mirrors is used to span the aperture of the approximated parabolic dish in a direction substantially orthogonal to the direction in which the curved mirrors are curved.

In some embodiments of the present invention, the focus of the mirrors in aggregate achieves higher concentration in one direction than in the other direction, and wherein the plane of curvature of a each mirror is rotated so that the narrower dimension of its contribution to the focal spot is substantially aligned with the direction in which the focus achieves the highest concentration.

In some embodiments of the present invention, the plurality of mirrors used to span the aperture of the approximated parabolic dish in the direction in which the curved mirrors are curved comprise a row of mirrors, and wherein the planes of curvature of all mirrors in the row of mirrors are rotated by substantially the same angle relative to their nearest-neighbor mirrors in the row of mirrors, or wherein the plane of curvature of all mirrors in the row of mirrors are rotated by amounts relative to their nearest-neighbor mirrors in the row of mirrors that leave substantially equal-width gaps between the mirrors at their ends that are closest to the axis of symmetry of the approximated parabolic dish, or wherein each mirror is substantially a trapezoid that is wider at its end that is closest to the axis of symmetry of the approximated parabolic dish than it is at its other end by an amount substantially equal to the length of the mirror in the direction of curvature times the sine of the angle subtended by the width of the mirror when viewed from the focus of the mirror times the sine of the angle, measured relative to a plane perpendicular to the axis of symmetry of the approximated parabolic dish and in the direction of the length of the mirror segment, of the middle of the middle mirror segment of the row of mirror segments.

In some embodiments of the present invention, each mirror is held against two substantially parabolic substantially continuously curved rails.

In accordance with the present invention, there is provided a device for supporting a receiver for concentrated solar energy comprising three legs attached to the receiver, where two of the three legs are bottom-pivoting legs that are attached to the receiver opposite each other, and where the third of the three legs is a top-pivoting leg attached to the receiver at 90 degrees to the two the bottom-pivoting legs by mechanisms that allow it to pivot in a direction substantially parallel to the direction that the two the bottom-pivoting legs can pivot in, thereby allowing the third top-pivoting leg to be used to raise and lower the receiver during installation and for maintenance.

In some embodiments of the present invention, the third leg is substantially on the side of the concentrating device that will be lowest at dawn and at dusk and each of the three legs can be attached at its bottom to a frame that moves with the concentrating device, and where each of the legs has length-adjustment mechanism at its bottom to allow adjustment of the position of the receiver relative to the concentrating device in all three dimensions.

In accordance with the present invention, there is provided a structure for supporting multiple receivers for concentrated solar energy, wherein the structure can hold a first receiver substantially in the path of the concentrated solar energy, and the structure can be adjusted to hold a second receiver substantially in the path of the concentrated solar energy.

In some embodiments of the present invention, the adjustment is automated and can be substantially completed in less than one minute. In other embodiments of the present invention, the adjustment can be substantially completed in less than ten seconds.

In some embodiments of the present invention, the first receiver is a solar thermal receiver and the second receiver is a photovoltaic receiver and wherein the concentrated solar energy is concentrated by a substantially parabolic dish concentrator or trough concentrator.

In some embodiments of the present invention, the adjustment is made substantially with or substantially without reorienting the primary receiver for concentrating the concentrated solar energy.

In some embodiments of the present invention, the first receiver is a solar thermal receiver and the second receiver is a photovoltaic receiver and wherein the concentration achievable on the first receiver can be lower than the concentration achievable on the second receiver and where the second receiver can use multi-junction solar cells or silicon-based solar cells.

In accordance with the present invention, there is provided a system for producing electricity from solar energy using a solar thermal collector with heat storage and a heat engine and a photovoltaic receiver, where the heat rejection system for the photovoltaic receiver can also be used as part of the cooling system for the heat engine.

In accordance with the present invention, there is provided a system for producing electricity from solar energy wherein the receiver for the solar energy is substantially cooled by coolant that itself was cooled substantially when the suns is not shining.

In some embodiments of the present invention, the weight of the coolant forms a substantial part of the anchoring system for a concentrating device that directs solar energy to the receiver and the cooling of the coolant can comprise fans that run faster at cooler temperatures than at higher temperatures.

In accordance with the present invention, there is provided a method for supplying both base-load power and peaking power from a solar energy system, where the base-load power is supplied by solar thermal apparatuses with heat-storage capability, and peaking power is supplied by photovoltaic devices, wherein a light gathering apparatus for supplying heat for heat storage is a concentrating light gathering apparatus that can be switched from supplying light to the solar thermal receiver to supplying light to the photovoltaic device.

In some embodiments of the present invention, the light gathering apparatus for supplying heat for heat-storage is a concentrating light gathering apparatus that can automatically be switched from supplying light to the solar thermal receiver to supplying light to the photovoltaic device.

In accordance with the present invention, there is provided a receiver for solar energy concentrated in two axes, the receiver comprising a set of closely-spaced, substantially parallel, substantially identical cooling tubes on which photovoltaic cells are affixed through highly thermally conductive material, wherein the cells on each cooling tubes extend slightly beyond the width of the cooling tube, and where the bottoms of the cells on each cooling tube slightly overlap the tops of the cells on an adjacent cooling tube, thereby connecting the cells in series from cooling tube to cooling tube.

In some embodiments of the present invention, each of the cooling tubes is rotated from the plane of highest concentration of the solar energy concentrated in two axes by an angle substantially equal to the inverse sine of the thickness of the photovoltaic cells divided by the width of the cooling tubes.

In some embodiments of the present invention, the photovoltaic cells have a top bus bar contact only on the side of the cells that is overlapped by the bottoms of the cells on an adjacent cooling tube.

In some embodiments of the present invention, each of the cooling tubes is substantially rectangular in cross section, and is taller perpendicular to the width of the photovoltaic cells than the width of the photovoltaic cells and wherein each of the cooling tubes can be electrically insulated on one side and the tubes can be packed so that the insulation on one tube can touch the side of the adjacent tube.

In some embodiments of the present invention, the cooling tubes are affixed, on their sides opposite the cells, to a substantially rigid material that has a thermal coefficient of expansion substantially equal to that of the cells.

In some embodiments of the present invention, each of the cooling tubes is substantially straight for the aggregate length of the photovoltaic cells affixed to it, and is bent on one side of that length. The cooling tubes can be arranged in the receiver so that they alternate having their bends to the left and their bends to the right and the cooling tubes can be connected to intake and output manifolds through insulating sections.

In some embodiments of the present invention, the cooling tubes are electrically conductive and the photovoltaic cells are affixed to their cooling tube through electrically conductive material, thereby connecting the cells on any given cooling tube in parallel, and wherein the focus of the concentrated solar energy can be at least twice as long on one of the axes as on the other of the axes.

In some embodiments of the present invention, the photovoltaic cells on the cooling tubes are connected in parallel in the direction of the axis where the focus is narrower, and wherein the cells are electrically connected in series in the direction of the axis where the focus is longer, and In some embodiments of the present invention, such as when the photovoltaic cells are electrically connected in series, the cooling tubes on each end of the receiver have bypass diodes between adjacent cooling tubes while the cooling tubes in the middle of the receiver do not have bypass diodes between adjacent cooling tubes. Fewer than 10% of the cooling tubes in the receiver can be connected to adjacent cooling tubes through bypass diodes.

In some embodiments of the present invention, the receiver further comprises non-imaging secondary concentrators on at least one axis of concentration to each axis of concentration, and wherein the non-imaging secondary concentrators on each axis of concentration can be of different heights, and where the primary device for concentrating the solar energy on one of the axes can have a focal length that differs from the focal length of the primary device for concentrating the solar energy on the other of the axes by a distance substantially equal to the difference in the heights of the non-imaging secondary concentrators on those respective axes.

In some embodiments of the present invention, a cover glass to protect the photovoltaic cells from moisture and/or ultraviolet radiation is installed at the mouth of the shorter of the non-imaging secondary concentrators.

In some embodiments of the present invention, a concentration of at least 1000 suns is achieved, where the concentrating device comprise substantially paraboloid of translation mirrors of at least 500 millimeters (20 inches) in width, and where the aperture of the primary concentration device is at most 7.2 meters (24 feet) on a side, and wherein the rim angle of the aperture of the primary concentration device can be at least 20 degrees.

In another embodiment of the present invention, the aperture of the primary concentration device is at most 3.6 meters (12 feet) on a side, and wherein a concentration of at least 2000 suns can be reached, and wherein the rim angle of the aperture of the primary concentration device can be at least 10 degrees.

In accordance with the present invention, there is provided a multi-junction cell produced on a silicon wafer using junction materials that are lattice-matched to each other but not to silicon, in which a wafer is sliced from a silicon ingot at an angle such that the lattice constant of the silicon ingot divided by the cosine of the angle is substantially equal to the lattice constants of the materials of the non-silicon junctions of the multi-junction cell.

In some embodiments of the present invention, a silicon-based junction is the lowest band-gap junction in the multi-junction cell, and the thermal energy from cooling the cells is also used, such as to generate electricity.

In some embodiments of the present invention, the multi-junction cell has four junctions, and the second lowest band-gap junction is a silicon-based or germanium-based junction.

In accordance with the present invention, there is provided a method for making a multi-junction in which a thin layer is transferred from a silicon wafer that is cut at an angle substantially off from an angle that would produce an atomically smooth surface is transferred to a silicon wafer that is cut substantially on an angle that produces a substantially atomically smooth surface, and the transferred layer is substantially lattice-matched to photovoltaic junctions that are grown on top of the transferred layer.

In accordance with the present invention, there is provided a photovoltaic cell in which the top contacts on the photoreceptive face of the cell are substantially smooth sided and substantially triangular in cross section.

In some embodiments of the present invention, a conductive footer supports a tall core of a higher melting-point material that is surrounded by a reflective material of a lower melting point, and where the amount of the lower melting material is such that when liquid its surface tension will pull it into a substantially triangular cross section bounded by the footer and the core, and wherein the core and the reflective material can be electrical conductors.

In some embodiments of the present invention, the shape and reflectivity of the outer surface of the contacts are such that over ⅔ of the light impinging on them are reflected onto the photovoltaic surface of the cell, and wherein the shape and reflectivity of the outer surface of the contacts are such that over 90% of the light impinging on them can be reflected onto the photovoltaic surface of the cell.

In accordance with the present invention, there is provided a method for decreasing the amount of light blocked by the top contacts of a photovoltaic cells, comprising forming contacts that are substantially smooth sided and substantially triangular in cross section.

In accordance with the present invention, there is provided a heliostat receiver for receiving concentrated solar energy from a set of heliostat mirrors, where the energy-absorbing surface of the receiver is bordered by movable insulation so that when the sun's position allows the mirrors to collectively focus to a smaller spot on the receiver, the insulation panels can be moved so as to insulate the unused portion of the energy-absorbing surface.

In some embodiments of the present invention, the energy-absorbing surface of the receiver is also bordered by movable secondary concentrators so that when the sun's position allows the mirrors to collectively focus to a smaller spot on the receiver, the secondary concentrators can be moved so that their widest part in each direction is substantially equal to the width of the spot to which the heliostat mirrors can then focus.

In accordance with the present invention, there is provided a system for concentrating solar energy using multiple heliostat receivers and multiple heliostat mirrors wherein at least one of the heliostat mirrors reflects sunlight onto different heliostat receivers when the sun is in different positions.

In some embodiments of the present invention, all of the heliostat mirrors reflects sunlight onto different heliostat receivers when the sun is in different positions, and wherein heliostat mirrors can be curved mirrors.

In some embodiments of the present invention, multiple paraboloids of translation or cylindrical mirrors are mounted on each of a plurality of tracking devices.

In some embodiments of the present invention, the mirrors nearest a tower always reflect light onto that tower while mirrors farther from any tower reflect light onto different towers at different times.

In yet other embodiments of the present invention, the mirrors within one tower height of a tower always reflect light onto that tower while mirrors farther than one tower height from any tower direct light onto different towers at different times, and wherein the mirrors within two tower heights of a tower can always reflect light onto that tower while mirrors farther than two tower heights from any tower can direct light onto different towers at different times.

In some embodiments of the present invention, the mirrors that always reflect light onto a given tower are arranged substantially in concentric rings around that tower, while the mirrors that reflect light onto different towers at different times are arranged substantially in a hexagonal grid.

In yet other embodiments of the present invention, some of the mirrors that always reflect their light onto a given tower reflect their light to a different receiver area on that tower than the mirrors that reflect light onto different towers at different times reflect their light onto when they reflect their light onto that given tower.

In some embodiments of the present invention, a heat transfer fluid passes though all receiver areas and passes last through the receiver area with the highest concentration.

In some embodiments of the present invention, all of the heliostat mirrors are made from substantially identical components and where the focal lengths of the curved heliostat mirrors can be easily adjusted during installation, and wherein the curve of each of the curved heliostat mirrors can be a spline of at least five points, and wherein the focal length can be adjusted by positioning a single adjustment mechanism.

In some embodiments of the present invention, all of the heliostat mirrors that always direct their light onto the same heliostat tower have substantially identical focal lengths to each other, and where all of the heliostat mirrors that reflect their light onto different heliostat towers at different times have substantially identical focal lengths to each other.

In yet another embodiment of the present invention, the mirrors nearest a tower at times reflect their light onto a tower beyond that tower.

In some embodiments of the present invention, the heliostat arrangement can achieve a concentration of at least 1000 suns while using identical mirrors that are curved in only one direction at any given point and/or during the entire time that the sun is more than 10 degrees above the horizon.

In some embodiments of the present invention, the worst-case horizontal angle, for some mirrors, between their normal line and a tower that the direct light to is at most 60 degrees, or alternatively at most 45 degrees.

In some embodiments of the present invention, more than half of the energy received by a given tower is directed to that tower by mirrors within a horizontal angle of 60 degrees of opposite the sun.

In accordance with the present invention, there is provided a method of providing a heliostat system for concentrating solar energy with an increased average effective mirror area, the method comprising allowing a heliostat mirror to direct its light to different towers at different times.

In accordance with the present invention, there is provided a method of providing a heliostat system for concentrating solar energy with an increased mean-to-peak concentration ratio, the method comprising allowing heliostat mirrors to direct their light to towers beyond the nearest tower in the direction opposite the sun.

In some embodiments of the present invention, the heliostat system maintains a concentration of 1000 suns during substantially all of the time that the sun is at least 5.7 degree above the horizon, the method comprising allowing heliostat mirrors to direct their light to towers beyond the nearest tower in the direction opposite the sun.

In accordance with the present invention, there is provided a Fresnel mirror comprising multiple mirror segments, wherein the mirror segments of the Fresnel mirror are arranged substantially in a row, and where the focal length of the Fresnel mirror in the direction of the row can be adjusted by moving one end of a lever whose position is fixed at or near one end of the row of mirror segments.

In some embodiments of the present invention, and for each of the mirror segments, the side of that mirror segment that is closest to the fixed end of the lever is fixed in position relative to the fixed end of the lever and can be fixed in position by a mechanism such as a hinge whose axis of rotation is substantially perpendicular to the lever, and the side of that segment opposite the side fixed by a hinge is attached by a substantially fixed-length structure to the lever so that all of the mirror segments pivot when the non-fixed end of the lever is moved.

In accordance with the present invention, there is provided a Fresnel mirror that focuses in two substantially orthogonal directions, whose focal length is adjustable in each of those two substantially orthogonal directions.

In some embodiments of the present invention, the mirror segments of the Fresnel mirror are arranged substantially in rows and columns, and where the focal length in the direction of the rows can be adjusted by moving one end of each of a set of row levers, where for each row of mirror segments there is one row lever in the set of row levers, where the row levers can be substantially identical to each other and the non-fixed ends of each lever in the set of levers can be moved by substantially the same amount when adjusting the focal length in the one of the substantially orthogonal directions, and where the non-fixed ends of the levers can be affixed to a beam in such a manner that moving the beam can move the ends of all of the levers by substantially the same amount.

In some embodiments of the present invention, the row lever for that row is to one side of that row, and the corner of that mirror segment that is closest to the fixed end of the row lever is fixed in position relative to the comparable corner of each of the other mirror segments in the array of mirror segments, and where the mechanism that fixes that corner of a mirror segment allows each of the adjacent corners of that mirror segment to be independently raised or lowered, and where the row lever for a row of mirror segments is attached by fixed-length device to the mirror segment corner adjacent, in the direction of the row, to the fixed corner of that mirror segment.

In some embodiments of the present invention, the focal length can be adjusted in the second one of the substantially orthogonal directions by moving one end of each of a second set of levers, where for each column of mirror segments there is one lever in the second set of levers.

In accordance with the present invention, there is provided an adjustable focal-length Fresnel mirror comprising multiple mirror segments, where the mirror segments of the Fresnel mirror are arranged substantially in concentric rings.

In some embodiments of the present invention, the inner edges of all mirror of the mirror segments are substantially fixed in position relative to each other and the edges can be fixed in position by hinges so that each of the mirror segments can be rotated about its inner edge, and where the outer edges of the mirror segments in each concentric ring of mirror segments can be fixed by hinges to a moveable concentric circular member.

In some embodiments of the present invention, the circular members for all concentric rings of mirrors are affixed to at least three substantially identical levers whose ends are moved by substantially the same amount when adjusting the adjustable focal length.

In accordance with the present invention, there is provided a system for concentrating solar energy in two dimensions onto a heliostat tower using a number of heliostat mirrors, wherein each of the heliostat mirrors has an adjustable focal length that is adjusted by controlling the pressure of air within the heliostat mirror.

In accordance with the present invention, there is provided a system for concentrating solar energy in two dimensions onto a number of foci that are fixed in position relative to each other and are oriented by the same tracking mechanism, wherein after concentration by a primary concentrator, concentration in a high-concentration direction is increased by a linear non-imaging secondary concentrator that increases the concentration of the light, in the high-concentration direction, for more than one of the foci.

In some embodiments of the present invention, the primary concentrator is a flat Fresnel lens that concentrates in two dimensions or a substantially parabolic mirror, and where the concentration from the primary concentrator can be higher in the high concentration direction.

In accordance with the present invention, there is provided a system for concentrating solar energy onto a number of foci that are fixed in position relative to each other, are oriented by the same tracking device, and are cooled by the same cooling tube, wherein cooling is through forced convection of a substantially transparent fluid through the cooling tube, and wherein the cooling tube is substantially transparent and can be substantially rectangular in cross-section, and can be oriented so that its sides are substantially parallel to the incoming light.

In some embodiments of the present invention, mirrors are used to focus the sunlight in two dimensions, and some mirrors are raised relative to adjacent mirrors so that cooling tubes can pass between the mirrors without requiring cut-outs in the mirrors.

In accordance with the present invention, there is provided a receiver assembly for a system for concentrating solar energy in two dimensions onto a number of foci that are fixed in position relative to each other and are oriented by the same tracking mechanism, wherein mirrors are used to focus the sunlight in at least one of the dimensions, where the receiver assembly comprises a fin tube that surrounds a heat pipe with a photovoltaic cell on a heat-conductive plug at its bottom, where the receiver assembly further comprises a secondary reflector that is used either to further concentrate light onto the photovoltaic cell or to homogenize the intensity or the wavelengths of light on the photovoltaic cell, and wherein the heat pipe includes an insulating section that is larger in diameter than the cell, the plug, or the secondary concentrator or homogenizer.

In some embodiments of the present invention, the photovoltaic cell is on one side of a transparent sheet and the fin tube is on the other side of the transparent sheet, and where the thermally conductive plug can serve as one terminal for the photovoltaic cell and the secondary concentrator or homogenizer can serve as the second terminal for the photovoltaic cell.

In accordance with the present invention, there is provided a receiver assembly for a system for concentrating solar energy in two dimensions onto a receiver that comprises a photovoltaic cell and a fin tube that surrounds a heat pipe that carries heat away from the photovoltaic cell, where in times where there is insufficient wind across the fin tube to sufficiently cool the photovoltaic cell, some portion of the amount of electricity produced by the cell is used to create a corona discharge and a corresponding electron wind that increases air flow over the fins of the fin tube.

In accordance with the present invention, there is provided a system for concentrating solar energy in two dimensions, in which regions where components of the system would shade the concentrating device are provided with photovoltaic cells that are used to power cooling or tracking functions of the system.

In some embodiments of the present invention, a photovoltaic cell on top of the fin tube is used to power a corona discharge and a corresponding electron wind that increases air flow over the fins of the fin tube.

In accordance with the present invention, there is provided a system for concentrating solar energy in two dimensions onto a single photovoltaic cell, wherein the photovoltaic cell is hexagonal and the system comprises a substantially round secondary non-imaging concentrator centered on the photovoltaic cell.

In some embodiments of the present invention, the substantially round secondary non-imaging concentrator also serves as an electrical contact for the front side of the photovoltaic cell.

In accordance with the present invention, there is provided an adaptor for converting the shift of a receiver relative to a misaligned focusing mechanism into a rotation of a sensor on that receiver in such a manner that the sensor will point substantially straight at the sun when the receiver has been shifted by substantially the distance that best counteracts the misalignment of the focusing mechanism.

In accordance with the present invention, there is provided a system for orienting a large two-axis tracker for tracking the position of the sun, comprising two motors that are each connected to the tracker by an arm, where the sum of the lengths of the arms is at least equal to the sine of the slant of the earth's polar axis relative to the earth's orbit times the distance between the points where the arms are connected to the tracker, where for daily tracking the arms are both rotated at a rate substantially equal to the rate of the earth's rotation around its axis, and where for seasonal tracking one arm is rotated faster than the other at a rate averaging at most the angular rate of the earth in its orbit around the sun.

In some embodiments of the present invention, the sum of the lengths of the arms is longer than the sine of the slant of the earth's polar axis relative to the earth's orbit times the distance between the points where the arms are connected to the tracker, and where for seasonal tracking one arm is rotated faster than the other at an average rate correspondingly slower than the angular rate of the earth in its orbit around the sun.

In accordance with the present invention, there is provided a system for supporting a plurality of trackers for tracking the sun, where the trackers are arranged substantially in a north-south line row, wherein a pad substantially to the north of one tracker and providing support for the northern end of that tracker also provides support for the southern end of a tracker to the north of the pad.

In some embodiments of the present invention, the pad supports a post or tower that in turn supports the northern end of the tracker to the south and the southern end of the tracker to the north, and wherein multiple such substantially north-south rows of trackers can be located in proximity to each other, and where guy wires can be attached at one end to the posts or towers of one such substantially north-south row of trackers and can be attached at the other end to either the pads or the posts or towers of an adjacent substantially north-south row of trackers.

In some embodiments of the present invention, the trackers are two-axis trackers and where they each can have an outer frame that is supported by the posts or towers by mechanisms that allow rotation around a first axis, and an inner frame supported by the outer frame by devices that allow rotation around a second axis that is substantially orthogonal to the first axis.

In accordance with the present invention, there is provided a system for supporting densely-packed two-axis trackers, comprising a substantially rectilinear array of poles or lattice towers, with the poles or lattice towers interconnected by trusses substantially parallel to the rows and columns of the substantially rectilinear array, where each of the two-axis trackers is supported at one end by a first one of the trusses, and at its other end by a second one of the trusses that is substantially parallel to and adjacent to the first one of the trusses, by devices that allow the tracker to rotate relative to the first and second trusses.

In some embodiments of the present invention, wherein at each point that one of the trusses supports one end of one of the trackers, it also supports, on its opposite side, one end of another of the trackers, and wherein each truss that supports any of the trackers can support two of the trackers on each side of the truss between each pair of poles or towers that support the truss.

In accordance with the present invention, there is provided a system for supporting a row of an even number of mirrors, that each focus sunlight in two dimensions, on top of a single pole or lattice tower, at a height that is within 2% of the width of the aperture of the mirrors from the height of the center of gravity of the mirrors, without requiring a gap in or between the mirrors for the pole or lattice tower to pass through when tracking the sun to low altitudes.

In some embodiments of the present invention, the shape of the surface of each mirror is substantially a paraboloid of revolution and the row of an even number of mirrors can be one of an even number of such rows that are supported by the single pole or lattice tower, and wherein the mirrors can be supported by an axle that runs through or near the mutual center of gravity of the mirrors, and wherein the axle can substantially aligned with the earth's polar axis.

In some embodiments of the present invention, the axle has a central section that is substantially aligned with the earth's polar axis, a section on each side of the central section that is at an angle to the central section that is approximately equal to the latitude at which the system is installed, and an end section on each side that is at an angle, relative to the central section, of at least the slant of the earth's daily rotation relative to its orbit around the sun.

In some embodiments of the present invention, the axle is substantially horizontal and the pole or lattice tower is a lattice tower, and the azimuth tracking is accomplished through rotating the mirrors around a substantially horizontal track on the top of the tower or through rotating the tower along with the mirrors it supports.

In some embodiments of the present invention, the mirrors are supported by a horizontal axle that runs through or near the mutual center of gravity of the mirrors, where each of the mirrors is supported by members whose longest dimensions are substantially orthogonal to the axle and that are substantially equally spaced in the direction of the axle, wherein the axle is supported by the lattice tower at two points that are farther apart than the distance between adjacent ones of the members, and where in tracking the sun to low altitudes at least part of at least one of the members passes directly beneath the axle.

In accordance with the present invention, there is provided a business model for increasing business to a commercial location, wherein free charging is provided for electric and/or hybrid vehicles parked in one or more parking spaces for the commercial location.

In some embodiments of the present invention, at least some of the one or more parking spaces for the commercial location are shaded by devices for generating electricity from sunlight and the free charging can be provided for electric and/or hybrid vehicles parked in the one or more parking spaces when the sun is shining.

In accordance with the present invention, there is provided a method for increasing business to a commercial location, wherein one or more parking spaces for the commercial location are shaded by devices for generating electricity from sunlight, ns wherein free charging is provided for electric and/or hybrid vehicles parked in the one or more parking spaces for the business.

In accordance with the present invention, there is provided a system for concentrating solar energy in two dimensions onto a receiver using a closely packed array of mirrors, where each of the mirrors is substantially a paraboloid of translation, and where in each of the two dimensions multiple ones of the mirrors are rotated about individual axes by a shared tracking devices.

In some embodiments of the present invention, light focused by multiple ones of the mirrors passes through a single sheet of substantially transparent material between the mirrors and the receiver.

In some embodiments of the present invention, the mirrors are curved on their long axes and are aligned with their long axes substantially in a north-south direction and wherein the length of each of the mirrors can be approximately equal to its width divided by the sine of the slant of the earth's polar axis relative to the earth's orbit around the suns.

In some embodiments of the present invention, each of the mirrors is curved by folding rigid member that is attached to a reflective sheet along a parabolic arc.

In some embodiments of the present invention, multiple secondary concentrators further concentrate substantially at the region of maximum concentration from the array of mirrors, the solar energy onto individual sets of photovoltaic cells where the sets of photovoltaic cells are not contiguous with each other and wherein the sets of photovoltaic cells can be electrically in series with each other, and wherein each of the sets of photovoltaic cells can contain one cell.

In accordance with the present invention, there is provided a system for concentrating solar energy in two dimensions onto a receiver, where the system comprises a primary concentrator that concentrates the energy in one dimension and is rotated in that dimension to track the sun in that dimension, where the primary concentrator also concentrates the solar energy in the second dimension but is not rotated in the second dimension, and where the receiver is moved substantially laterally in the second dimension to track the region of highest concentration of the concentrated solar energy.

In some embodiments of the present invention, the receiver also rotates in the second dimension and comprises a secondary concentrator that further concentrates the solar energy in the second dimension.

In accordance with the present invention, there is provided a system for concentrating solar energy in two dimensions onto a receiver, where the system comprises a primary concentrator that concentrates the solar energy substantially only in one dimension and is rotated substantially only in that dimension to track the sun in that dimension, where the receiver rotates in the second dimension and comprises a secondary concentrator that concentrates the solar energy in the second dimension.

In some embodiments of the present invention, the system further comprises multiple ones of the receivers, where a common control mechanism rotates the multiple ones of the receivers by substantially the same angle, and wherein the multiple ones of the receivers can be connected to a shared cooling tube by flexible heat pipes.

In some embodiments of the present invention, the secondary concentrators of the multiple ones of the receivers are reflective non-imaging concentrators separated by gaps that do not cause substantial amounts of the solar energy concentrated by the primary concentrator to miss the non-imaging secondary concentrators.

In some embodiments of the present invention, the primary concentrator can be at least one of a linear Fresnel lens or a reflective paraboloid of translation or a non-imaging concentrator.

In some embodiments of the present invention, the secondary concentrator is a lens or a linear Fresnel lens and a tertiary concentrator can be used to reduce or remove chromatic aberration.

In some embodiments of the present invention, the receiver is a solar thermal receiver and can use a flexible heat pipe to transfer the thermal energy to a heat transfer pipe shared by the multiple ones of the receivers.

In accordance with the present invention, there is provided a method for concentrating solar energy in two dimensions, the method comprising concentrating the solar energy with a primary concentrator that concentrates in a first dimension and is tracked substantially only in that dimension, the method further comprising concentrating in a second dimension substantially orthogonal to the first dimension the solar energy that was concentrated by the primary concentrator, wherein the concentration in the second dimension comprises multiple secondary concentrators that rotate to track the angle of the sun in the second dimension.

In accordance with the present invention, there is provided a method for cooling multiple cells in a receiver for concentrated solar energy wherein each cell is attached to a flexible heat pipe that conveys heat from the cell to a heat transfer fluid or a heat rejection device.

In accordance with the present invention, there is provided a system for concentrating solar energy in one dimension comprising a set of parabolic trough mirror that all focus onto a common substantially linear focus, wherein each of the parabolic troughs has an adjustable focal length.

In some embodiments of the present invention, the focal length of each trough is controlled by structures that are passively coupled to the rotation device for the trough, and wherein a common device controls the rotation of multiple troughs.

In accordance with the present invention, there is provided a system for concentrating solar energy in one dimension, comprising at least two substantially linear foci that each have multiple substantially linear mirrors directing light onto them, wherein some of the linear mirrors at times direct light to one of the substantially linear foci and at other times direct light to another of the substantially linear foci.

In some embodiments of the present invention, sets of the linear mirrors comprise flat or parabolic trough linear Fresnel concentrators.

In accordance with the present invention, there is provided a space-based system for concentrating radiant energy in two dimensions, wherein the system uses a substantially annular primary concentrating devices to concentrate the radiant energy onto an annular receiver that uses multiple secondary concentrating devices disposed around the annular receiver to further concentrate the radiant energy into multiple discrete regions around the annular receiver.

In some embodiments of the present invention, each of the multiple secondary concentrating devices further concentrate the radiant energy onto one or more photovoltaic cells at each of the multiple discrete regions around the annular receiver.

In some embodiments of the present invention, the substantially annular primary concentrating devices can be a rotation-stabilized Fresnel lens or a rotation-stabilized mirror.

In accordance with the present invention, there is provided a system for returning condensed cooling fluid to an object to be cooled wherein the object is place at the outer edge or the outer corner of a substantially-fluid-tight pouch that serves as a condensing surface for the fluid, where the object and the pouch are rotated such that centrifugal force provides a force to return cooling fluid that has condensed on the condensing to the object so be cooled.

In some embodiments of the present invention, the object is a photovoltaic cell, and wherein the pouch can comprise multiple substantially-fluid-tight sub-pouches.

In accordance with the present invention, there is provided a method for returning condensed heat transfer fluid in a heat pipe to a heat source in a micro-gravity environment, comprising using centrifugal force to return the fluid to the heat source.

In accordance with the present invention, there is provided a system for applying tension to an object in space wherein a rotating ring of material around the object is coupled to mechanisms that pulls on opposite ends of the object.

In some embodiments of the present invention, the object comprises any one of a system for concentrating radiant energy, a substantially parabolic dish, an antenna or a telescope mirror and wherein the telescope mirror focuses on a secondary mirror through a corrective lens.

In some embodiments of the present invention, the rotating ring uses electromagnetic or electrostatic mechanisms to exert the pull on the object.

In accordance with the present invention, there is provided a method for applying tension to an object in space wherein three rotating rings of material around the object are each coupled to mechanisms that pull on opposite ends of the object.

In some embodiments of the present invention, the three rotating rings are substantially mutually orthogonal.

In accordance with the present invention, there is provided an annular mirror for a space-based telescope, the mirror being narrow enough across the width of the annulus to be held against collapsing by low-mass stays, wherein the annular mirror is stabilized in the plane of the annulus by centrifugal force.

In some embodiments of the present invention, the mirror comprises multiple individually-stayed reflective segments.

In accordance with the present invention, there is provided a reflective concentrating device for a space-based telescope that comprises a thin, flexible reflective sheet produced in a substantially parabolically shaped mold.

In some embodiments of the present invention, the mold is spun at a rate where centrifugal force would pull a liquid into a parabola of substantially the same curvature as the mold.

In accordance with the present invention, there is provided a reflective concentrating device for a space-based telescope that comprises a thin, flexible reflective sheet, wherein the mold comprises a liquid layer against which the thin, flexible, reflective sheet is shaped.

In some embodiments of the present invention, the thin, flexible reflective sheet is continuously formed as it is pulled across the surface of the mold.

In accordance with the present invention, there is provided a method of ensuring substantially constant intensity of solar energy on a photovoltaic receiver for a spacecraft that operates at various distances from the sun, the method comprising moving the receiver into a region farther from the tightest focus when the spacecraft is closer to the sun, and into a region closer to the tightest focus when the spacecraft is farther from the sun.

In accordance with the present invention, there is provided a method of ensuring substantially constant intensity of solar energy on a photovoltaic receiver for a spacecraft that operates at various distances from the sun, the method comprising moving the receiver into a region farther from the tightest focus when the spacecraft is closer to the sun, and into a region closer to the tightest focus when the spacecraft is farther from the sun.

In accordance with the present invention, there is provided a system for concentrating solar energy in two dimensions onto a receiver, where the system comprises a primary concentrator that concentrates the solar energy substantially only in one dimension and is rotated substantially only in that dimension to track the sun in that dimension, the system further comprising multiple reflective secondary concentrators that each further concentrate the solar energy by the primary concentrator, the further concentration being substantially in a direction orthogonal to the direction of concentration of the primary concentrator, wherein each of the secondary reflectors reflects the solar energy substantially towards the primary concentrator, and wherein each secondary reflector rotates to track the sun in a direction substantially orthogonal to the rotation of the primary concentrator.

In some embodiments of the present invention, each secondary reflector comprises a single continuous paraboloid.

In some embodiments of the present invention, several secondary reflectors together form a linear Fresnel reflector to concentrate onto a receiver common to the several secondary reflectors.

Definitions

"Acceptance Angle" as used herein means the angular range over which light entering the tracker aperture or mirror aperture will generally be reflected, refracted and/or diffracted so that it reaches a receiver, and is thus 'accepted' by that receiver. When more specificity is needed, the "Acceptance Angle" of a solar concentrator is defined as the angular range for incoming light for which 90% of the light entering the aperture, that is not absorbed on its way to the receiver, reaches the surface of the receiver. In general a system with a higher acceptance angle is more tolerant of errors in design, manufacturing, assembly and tracking.

"Active Cooling" as used herein means a system that uses applied power to remove heat, including thermo-electric chillers and plasma wind generators without moving parts, as well as mechanical cooling such as pumps or fans. See also "Passive Cooling" and "Mechanical Cooling".

"Adjustable-Focal-Length Mirror" as used herein means a focusing mirror whose focal length can be readily adjusted while retaining the mirror's overall focusing capability.

"Aligned Multiple-Cylindric-Paraboloid" as used herein means a mirror composed of multiple segments, each of which is bent in one direction only to focus in that direction only, where the mirror segments are aligned relative to each other so that the foci from the segments substantially overlap.

"Alignment Insensitivity" as used herein means the degree to which a system can be misaligned before its effectiveness is decreased significantly.

"Altitude" as used herein means vertical angle above the horizon (e.g., the altitude of the sun is the angle that the sun is above the horizon).

"Altitude Tracking" as used herein means motion in the vertical direction to track the height of the sun. See also "Daily Tracking", "Altitude Tracking, "Azimuth Tracking", and "X/Y Tracking".

"Altitude/Azimuth Tracker" as used herein means a tracker that follows the movement of the sun by means of two independent movements, one in the horizontal (azimuth) direction, and one in the vertical (altitude) direction.

"Angular Diameter" as used herein means the angle subtended by an object (the angular size of the object) from a given point of view. While technically intended for circular objects, Angular Diameter can also be applied to other shapes, although then the "angular diameter" can vary from direction to direction.

"Aperture" as used herein means the profile of the light-collecting area as seen from a direction that maximizes its apparent (effective) size.

"Aspect Ratio" as used herein means the ratio of the length to the width of a shape, especially a rectangle or an elliptical shape.

"Astigmatism" as used herein means imperfection of focus caused by the shape or the orientation of the focusing material.

"Atmospheric Pressure" as used herein means the ambient pressure of the air, which at any given location can vary due to the weather by up to roughly 10% from its nominal value, thereby applying a significant force to sealed, rigid, air-filled objects.

"Axis of Symmetry" as used herein means an axis about which an object has either rotational or reflectional symmetry. For a parabola this is in the direction of the focus for light at a 'normal' angle (at right angles to the surface at the axis of symmetry), and for a paraboloid of rotation it is also the axis about which the starting parabola is rotated.

"Azimuth" as used herein means angle along the horizon (e.g., compass heading).

"Azimuth Tracking" as used herein means motion in the horizontal direction to track the compass direction of the sun. Azimuth tracking comprises motion in the horizontal plane (e.g., like a turn-table). See also "Daily Tracking", "Altitude Tracking, "Seasonal Tracking", and "X/Y Tracking".

"Balance Height" as used herein means the height of the center of mass of an object, and thus the height at which the object will balance on an axis through it.

"Band-gap" as used herein means the gap between the energy level of the filled states of electrons in a semiconductor and the conduction band, and thus the minimum energy that must be supplied by a photon to liberate an electron in a photovoltaic cell and also the maximum voltage that can be obtained from such a liberated electron.

"Band-gap Engineering" as used herein means a process of adjusting the band-gap of a semiconductor by changing the relative concentrations of either its main ingredients (for compound semiconductors) or its dopants.

"Base-load Power" as used herein means the power consumed by a system at its lowest normal consumption state. Base-load power is typically produced by plants that have low fuel costs (e.g., coal), but may have high capital costs that are amortized over the near-continuous production of power. See also "Dispatchable Power" and Peaking Power".

"Bead Roller" as used herein means a device that uses a mating pair of rollers to roll a 'bead' of a specific curvature (defined by the contour of the rollers) into a sheet of metal.

"Bio-fuels" as used herein means fuels that are obtained from recently living plants, fungi, bacteria, archaea or animals or other life-forms yet to be discovered, as opposed to fossil fuels, which are from long-dead life forms.

"Bowshot distance" as used herein means approximately 50 meters, or 150 feet, or 100 cubits, all being roughly the distance at which a typical well-practiced archer can reliably hit a vital area on a human target.

"Bus Bar" as used herein means a large conductor that receives electrical current from, or delivers electrical current to, a number of smaller conductors.

"Bypass Diode" as used herein means a one-way device for electrical current, which will let current substantially freely flow across it in one direction if the voltage on a first side of the diode is higher than the voltage on a second side, but will substantially block the flow of current in the reverse direction if the voltage on the first side is lower than the voltage on the second side.

"Catenary" as used herein means a curve such as that taken by a chain suspended at each end (from the Latin "catena", meaning "chain"). Although a catenary is an exponential curve rather than a parabola, for small edge angles a catenary curve is a good approximation of a parabola.

"Cell String" as used herein means a string of photovoltaic cells that are connected in series.

"Center of Gravity (also Center of Mass)" as used herein means the point at which an object will balance around any axis through that point. See also "Balance Height".

"Center of Wind Loading" as used herein means the point at which constant-speed wind from any direction will produce no net rotational force about that point.

"Coarse Tracking" as used herein means tracking that points a solar focusing system roughly in the direction necessary to focus sunlight on a receiver, but not accurately enough for the receiver to receive substantially all of the light entering the system's aperture. See also "Fine Tracking".

"Cogeneration" as used herein means a system that uses heat that is a byproduct of photovoltaic electrical power generation for another purpose, such as heating a greenhouse, boiling water, or, if the temperature is high enough, running a thermal engine.

"Co-located Trackers" as used herein means trackers for orienting solar energy systems that are located within several tracker diameters (or lengths) of each other.

"Coma Aberration" as used herein means a spreading of the focus of a parabolic mirror when the incoming light is from a direction not parallel to the axis of symmetry of the parabola (or paraboloid). See also "Off-axis".

"Compound Curve" as used herein means a surface that at some points has curvature in two orthogonal directions.

"Compound Mirror" as used herein means a mirror composed of multiple discrete segments of mirror material.

"Concave" as used herein means a curve that bends toward the observer.

"Concentration" as used herein can be either geometric concentration, which is the ratio of the aperture size to the focal spot size (this ignores imperfections in mirrors and minor shadows but is useful for calculating acceptance angles and focal spot sizes), or illumination concentration, which is the ratio of the intensity of focused sunlight to the intensity of direct sunlight, and which thus includes the losses from such imperfections. Geometric concentration is symbolized with an 'x' (e.g., 100×), whereas illumination concentration is measured in 'suns' (e.g., 1000 suns).

"Conduction Losses" as used herein means a loss of voltage, and thus power and energy, through the resistance of a conductor to the flow of electrons (electrical current) through it.

"Conic Sections" as used herein means the curved sections that can be obtained by planar cuts through a straight-sided cone. These are the circle, ellipse, parabola and hyperbola, depending on the angle of the plane to the angle of the cone.

"Convection Losses" as used herein means a loss of heat from moving air.

"Convex" as used herein means a curve that bends away from the observer.

"Coolant Tube" as used herein means a tube that carries a fluid to cool a photovoltaic or solar thermal receiver.

"Cooperative Motors" as used herein means two motors that share the load of moving an object in a given direction.

"Coplanar" as used herein means things that all lie on the same plane.

"Corona Discharge" as used herein means a discharge of electrons that can then be accelerated by an electric field.

"Cos(a)" (also "Cosine(a)") as used herein means the cosine of the angle 'a'; and unless otherwise specified, 'a' is measured in degrees. Cosine is a standard trigonometric function. The cosine of a small angle is very close to unity, and it changes with the square of the angle so that an angle ½ as big has a cosine roughly ¼ as big. The cosine gets smaller and changes more and more rapidly as the angle gets bigger, until the cosine reaches zero at an angle of 90 degrees. See also "Sine", "Cosine Factor" and "Radians".

"Cosine Factor" as used herein means a factor that changes with the cosine of an angle. A cosine factor of a small angle is insignificant because the cosine of a small angle is so close to unity; but cosine factors become very significant at bigger angles because the cosine drops toward zero, which dramatically affects the effective area of surfaces such as mirrors, lenses and receivers, and the effective focal length of curved mirrors. See also "Cosine", "Effective Area", and "Effective Focal Length".

"Crystalline Silicon" as used herein means silicon in which almost every atom is in a perfectly regular arrangement of silicon atoms known as a crystal lattice. Crystalline Silicon is generally extremely pure except when dopant atoms with fewer or more valance (outer-shell) electrons than silicon have been deliberately added.

"Crystal Lattice" as used herein means an arrangement of atoms in which almost all atoms are in their expected places at almost perfectly regular spacings and orientations. See also "Lattice Constant".

"Cubit" as used herein means an ancient unit of measure approximately equal to 1½ feet or about 10% less than ½ meter. While the length of a cubit has varied from civilization to civilization or even city to city, this value is thought to be the most common Greek value at the time of Archimedes and hence round numbers of such cubits would probably have been used by Archimedes in establishing dimensions. However, since the value is not known for certain, it is used only as an approximate measure and is translated into round numbers of feet or meters. When a more precise measure of length is needed, meters are used instead for clarity.

"Cylindrically Curved" as used herein means a surface that at every point bends in at most one direction, with the directions of curvature at all points substantially parallel to each other (like a section of a cylinder).

"Daily Tracking" as used herein means east-west tracking, especially if as rotation about a north-south axis slanted 'at latitude' (and hence parallel to earth's polar axis).

"Daily/Seasonal Tracker" as used herein means a tracker that follows the movement of the sun by means of two independent movements, one a daily rotation around an axle substantially aligned with the earth's polar axis, and one sinusoidal motion perpendicular to this to compensate for the earth's yearly orbit about the sun not being aligned with the earth's daily rotation about its polar axis.

"Dispatchable Power" as used herein means electrical power storage capacity or generating capacity that can be quickly brought on line to meet increases in demand (or to compensate for losses of other generating capacity). See also "Peaking Power".

"Dopant" as used herein means a small amount of an impurity deliberately added to a semiconductor to create an excess of electrons or shortages of electrons in that semiconductor.

"Dynamic Lobe" as used herein means a lobe of heliostat mirrors to one side of a heliostat tower that focus on that heliostat tower, where mirrors join the lobe on one side of the lobe and leave the lobe on the other side of the lobe as the sun moves, so that the lobe remains substantially on the opposite side of the tower from the sun. See also "Polar Lobe".

"Effective Area" as used herein means the cross-sectional area of an object when viewed from the angle of incident light. For example, a mirror at a 45-degree slant to the incoming light has an effective area of only cos(45 degrees) times its actual area, or approximately 0.71 times its actual area; in other words, it reflects the same amount of light as a mirror 0.71 times the size that is perpendicular to the incoming light. See also "Cosine Factor".

"Energy" as used herein means the ability to do work. The efficiency of actually converting energy to work depends on the quality of the energy and the quality of the cold sink into which the energy eventually flows; mechanical potential energy and electrical energy are both very high quality, as are high-energy-density chemicals such as fossil fuels. For thermal energy, the energy quality depends on the temperature, with higher temperatures being higher quality energy as well as generally containing more heat. See also "Exergy".

"Exergy" as used herein means the ability to do useful work relative to a given cold-sink temperature. Exergy thus takes the quality of the energy and of the cold-sink into account as well as the quantity of energy.

"Extremely High Concentration" as used herein means greater than 1000× or greater than 1000 suns. Extremely high concentration is good for solar thermal systems because it reduces receiver area and thus heat loss, and is good for some thermo-chemical reactions. See also "Low Concentration", "Moderate Concentration", "High Concentration" and "Very High Concentration".

"Fill Factor" as used herein means the ratio of the area of a desired surface to the total surface area of a region that contains multiple desired surface areas within it. For example, the fill factor of black squares on a checkerboard is ½ because ½ of the area is covered by black squares. Correspondingly the fill factor for a mirror aperture for a compound mirror would be the ratio of the effective mirror area to the effective aperture area. Fill factors are also useful measures for mirror area on individual mirror segments, for cells on a multi-cell receiver, and even for receptive area (not blocked by top-surface contacts) to total area on an individual photovoltaic cell.

"Fin Tube" as used herein means a tube of thermally conductive material that has its outer surface area enlarged by fins of thermally conductive material that extend, typically at right angles, from its typically cylindrical outer surface. Fin tubes are typically used in heat-exchange mechanisms such as cooling systems. See also "Heat Pipe".

"Fine Tracking" as used herein means supplemental tracking that compensates for the inaccuracy of coarse tracking to achieve increased accuracy. See also "Coarse Tracking".

"Fresnel Lens" as used herein means a lens that instead of using a continuously curved surface (which results in a standard lens whose thickness, for given focal length, grows approximately with the square of its diameter), uses discontinuous segments of comparable curvature and angle to the standard lens surface, but arranged so that the segments form a thin sheet whose thickness is relatively independent of the lens diameter. This emulates the focusing of a standard lens, but requires much less material for even a moderate-aperture lens.

"Fresnel Mirror" as used herein means a mirror that instead of using a continuously curved surface (which for a given focal length results in a mirror whose depth is proportional to the square of its diameter), uses discontinuous segments of comparable angle, and sometimes of comparable curvature, to the standard mirror surface, but arranged so that the segments form a thin sheet or layer whose depth is only linearly proportional to the aperture diameter divided by the segment width.

"Focus" when used as a verb herein is meant multiple surface regions redirecting incident light so that the light from the multiple regions converges into a region smaller than their combined effective area.

"Focus" when used as a noun herein is meant a region that multiple surface regions redirect incident light into, with the 'focus' region being smaller than the combined effective area of the multiple surface regions.

"Focal Length" as used herein means the distance from focusing a mirror or a lens at which the focus and the focal spot are smallest.

"Focal Spot" as used herein means the area of a surface into which substantially all of the light focused by a lens or a mirror is concentrated.

"Fossil Fuels" as used herein means fuels that are obtained from long-dead plants, fungi, bacteria, archaea and/or animals or other life-forms yet to be discovered. See also "Bio-fuels".

"Germanium Substrate" as used herein means a thin wafer of crystalline germanium. Germanium currently serves as the substrate for the highest-efficiency solar cells, and accounts for roughly half of their cost.

"Glass Mirror" as used herein means a thin sheet of glass, whether flat, bent, or molded, that has a metallic layer that reflects incident light. Most mirrors have the reflective layer on the back surface of the glass; this is called a 'second-surface glass mirror' because the light first passes through the front surface of the glass and is then reflected at the back surface of the glass by the interface to the metallic layer. While first-surface mirrors can have higher reflectivity, a second-surface mirror facilitates weather-proofing, and is thus typically more durable for outdoor use.

"Heat Pipe" as used herein means a sealed tube, or pipe, that transfers heat from a hot region to colder regions of the heat pipe. By starting with just a liquid (such as water) and its vapor in the pipe, the liquid is rapidly evaporated at the hot region and there is little resistance to the vapor travelling to all colder surfaces of the pipe, where it condenses and whence it is returned either by gravity or by capillary action to the hot end of the pipe to complete the cycle. Since evaporating a liquid takes a lot of energy and the vapor can move at up to the speed of sound, a heat pipe can provide thermal conductivity over a hundred times higher than solid copper. See also "Fin Tube".

"Heliostat" as used herein means a system that keeps the sun's image reflected onto a constant point even as the sun moves across the sky.

"Heliostat Mirror" as used herein means a mirror that keeps the sun's image reflected onto a constant point even as the sun moves across the sky, as part of a heliostat system.

"Heliostat Tower" as used herein means a tower on which one or more heliostat mirrors keep the sun's reflected image as the sun moves across the sky.

"Heliostat Receiver" as used herein means a solar energy receiver on which one or more heliostat mirrors keep the sun's reflected image as the sun moves across the sky. Unless otherwise specified, a heliostat receiver sits atop a heliostat tower and receives sunlight reflected by a field of heliostat mirrors.

"Hermetic" as used herein means a seal that is substantially air-tight and water-tight.

"High Concentration" as used herein means 100× to 1000× or 100 suns to 1000 suns. This concentration range is readily achievable with two-axis focusing. See also "Low Concentration", "Moderate Concentration", "Very High Concentration" and "Extremely High Concentration".

"Homogenizer" as used herein means a reflective, refractive or diffractive means for scrambling the path of focused light to make its intensity more constant over the area of a focal spot. Homogenizers also mix and thus even out the colors of light that has been focused with refractive or diffractive means, which is important for keeping the photocurrents from the junctions of a multi-junction cell balanced to prevent loss of efficiency.

"Hybrid Receiver" as used herein means a receiver for solar energy that uses photovoltaics to generate electricity and captures much of the remaining energy as heat of high enough quality to be useful, such as for domestic hot water (for small-scale systems, green-houses, thermo-chemical reactions, or the immediate or future (through thermal storage) further generation of electric power. See also "Co-generation", "Exergy" and "Thermal Engine".

"Hydroelectric Power" as used herein means power that is generated by flowing water turning a generator. Although gravitational storage of energy has a very low energy density even with an elevation difference of hundreds of feet (tens to hundreds of meters), large dams can store immense volumes of water and hence huge amounts of energy. Hydroelectric power can also be brought on line quickly and shut down quickly and efficiently, making it the most "dispatchable" of all significant power sources today. This makes hydroelectric power an excellent complement for intermittent energy sources such as photovoltaics, direct solar thermal generation, and wind power. See also "Pumped Hydroelectric Storage".

"Hyperbolic" as used herein means shape like a hyperbolic conic section. A hyperbola decreases in curvature faster than a parabola when moving away from the axis of symmetry, and hence does not focus light as sharply when used in an imaging concentrator. See also "Conic Sections".

"Imaging Concentrator" (also "Imaging Secondary") as used herein means a concentrator that focuses light without scrambling it, so that a sheet of paper held at the focus would show an approximate image of the object from which the light originates. See also "Non-imaging Concentrator".

"In Parallel" as used herein means photovoltaic cells that are connected so that their ends are at the same voltages and their photocurrents add together. See also "In Series".

"In Series" as used herein means photovoltaic cells that are connected together so that the higher-voltage contact of one cell is connected to the lower-voltage contact of the next cell. In this way the voltages of the cells add together, while the current from the cells is not increased. See also "In Parallel".

"Inverter" as used herein means a device that converts direct current (the output of essentially all photovoltaic systems) into alternating current (the type of current carried by essentially all power lines (with a few very long transmission lines being exceptions).

"Large-Aperture Mirror" as used herein means a mirror whose aperture is at least a meter in radius.

"Lateral Movement" as used herein means sideways movement in which the orientation of the moving object is not changed. See also "Translational" and "Rotational".

"Lateral-Shift Fine-Tracking" as used herein means moving a receiver a small distance laterally relative to an aperture to compensate for inaccuracy in the rotational alignment of a tracker. See also "Rotational".

"Lattice" as used herein means a regular arrangement of atoms, such as in a crystal, or a crisscrossing arrangement of rows and columns of boards, or of steel members in a truss or tower.

"Lattice Constant" as used herein means the spacing between atoms in a crystal lattice.

"Lattice-Matched" as used herein means two materials that have the same spacing between their atoms at an interface between their atoms. A crystalline material can be grown with minimal internal stress on top of a lattice-matched material.

"Lattice Tower" as used herein means a tower, usually of steel, where multiple legs of the tower are connected by crisscrossing braces. This produces a strong yet comparatively light-weight tower.

"Lattice Truss" as used herein means a truss, usually of steel, where multiple thin members are connected by crisscrossing braces. This produces a strong yet comparatively light-weight truss that uses much less material than a solid beam or truss of the same strength.

"Linear Focus Mirror" as used herein means a mirror, typically a paraboloid of displacement (also called a "Parabolic Trough" or a "Paraboloid of Translation") that focuses onto a narrow line (rather than focusing to a point). Linear focus mirrors are easy to build and need tracking in only one dimension, but are limited to low or moderate concentration.

A "Lobe" as used herein means a rounded region to one side of something, generally a rounded region of mirrors to one side of a heliostat tower. See also "Dynamic Lobe" and "Polar Lobe".

"Low Concentration" as used herein means less than 10× or less than 10 suns. In some cases this can be achieved without trackers. See also "Moderate Concentration", "High Concentration", "Very High Concentration" and "Extremely High Concentration".

"Low-grade Heat" as used herein means heat that is at less than 100 degrees Celsius (373 degrees Kelvin). Low-grade heat has too little exergy relative to most cold sinks to be very efficient in a thermal engine, but is fine for domestic hot water, heating buildings, green houses, etc.

A "Mandrel" as used herein means a form that something can be pressed against to be bent into a precise shape.

"Maximum Practical Concentration" as used herein means the maximum concentration achievable with a given design before the point of diminishing returns where achieving slightly higher concentration requires dramatically higher complexity and/or costs.

"Mean-to-peak power ratio" as used herein means the ratio of the average (mean) power generated by a system to its maximum power output. A high mean-to-peak ratio is beneficial because it means more total power output for a given peak power, and infrastructure costs are generally proportional to the peak power rather than the total power.

"Mechanical Cooling" as used herein means a system that uses moving parts, such as pumps or fans, to move coolant fluid to where it is needed. See also "Passive Cooling" and "Active Cooling".

"Milliradian" as used herein means 1/1000 of the angle subtended by an arc whose circumference is equal to its radius of curvature, or about 0.057 degrees. See also "Radians".

"Mirror Frame" as used herein means a rigid frame, typically of steel, to which multiple mirror segments are attached, either directly or indirectly through ribs and or rails, to be held in fixed positions relative to each other.

"Mirror Finish" as used herein means a surface that has high specular reflectivity. For polished metal, this requires a very high degree of polish to ensure a surface that is substantially planar down to a scale of roughly the wavelength of light.

"Mirror Segment" as used herein means a mirror that is aligned with other mirrors to focus on substantially the same region as those other mirrors.

"Mirror Segment Length" as used herein means the length of the long axis of a mirror segment.

"Mirror Segment Width" as used herein means the length of the short axis of a mirror segment.

"Misdirects" as used herein means that a region of a focusing means does not direct light incident on it to substantially the same focal region that the rest of the focusing means directs light to.

"Moderate Concentration" as used herein means 10× to 100× or 10 suns to 100 suns. This concentration range is achievable with single-axis focusing. See also "Low Concentration", "High Concentration", "Very High Concentration" and "Extremely High Concentration".

"Multi-junction cell" as used herein means a photovoltaic cell that has multiple photovoltaic junctions (electron-liberating regions) stacked on top of one another. Because most semiconductors are transparent to photons of lower energy than their band gap, high band-gap layers capture the most energetic photons (e.g. ultraviolet, blue) to generate power, while letting lower-energy photons pass on to the next junction (photovoltaic region), etc. This raises the overall efficiency because the photons absorbed by each layer have only a little excess energy above that needed to liberate an electron over the band gap. However, the photocurrents (number of electrons liberated per unit time) of the junctions must typically be matched because the layers are typically in series (which adds the voltages of the layers, reducing resistive losses).

"Non-contributing" as used herein means regions of a mirror (or lens) that misdirect light incident upon them so that it does not reach a receiver.

"Non-Imaging Concentrator" as used herein means a concentrator that focuses light without the focus maintaining an image of the object emitting the light. While for a telescope the image of an object is essential, an image is not essential for a solar energy receiver, and not having to maintain an image creates more freedom in concentrator design and allows for significantly higher concentration (over 80,000 suns has been achieved with a refractive non-imaging concentrator, and over 40,000 suns could be achieved with a perfect reflective non-imaging concentrator, versus a maximum of just over 10,000 suns for a perfect reflective imaging concentrator).

"Non-Imaging Secondary Reflector" (also "Non-imaging Secondary Concentrator" or "Non-Imaging Secondary") as used herein means a non-imaging concentrator that increases the concentration of light already focused by a primary (typically imaging) mirror or lens.

"Normal angle" as used herein means the angle between a mirror's normal line and the direction of the sun, which is also the angle from the mirror's normal line to the sun's reflection from the mirror.

"Normal line" as used herein means a line normal (perpendicular) to a surface.

"A mirror's normal line" (also "The normal line of a mirror") as used herein means a line normal (perpendicular) to the mirror's surface; at the center of the mirror if the mirror has a curved surface.

"Off-axis Aberration" (also "Coma Aberration") as used herein means a spreading of the focus of a parabolic mirror when the incoming light is from a direction not parallel to the axis of symmetry of the parabola (or paraboloid).

"Off-axis Concentrator" as used herein means a reflective concentrator that focuses light most intensely to a point or a line that is beside the concentrator's aperture, rather than between the aperture and the sun, so that a receiver and/or a secondary at that point or line does not shade the primary concentrator. While for high enough primary concentration the receiver or secondary concentrator is small enough that it does not block much light, receivers for low-to-moderate concentration, large secondary concentrators, and multiple receivers can all be big enough to block an appreciable amount of light. Even in an off-axis concentrator, the maximum concentration is generally achieved when light is substantially parallel to the axis of symmetry of the original paraboloid, although for small enough rim angles and a concentrator enough off-axis, cosine factors can slant the direction of light for maximum concentration appreciably.

"Off-axis Wafer" as used herein means a planar slice of a crystal that is cut at an angle to the axis of symmetry of the crystal's atomic lattice. The average spacing of the atoms on the surface of an off-axis wafer will be equal to the crystal's lattice constant divided by the cosine of the angle at which the wafer is cut; this can be used to match the lattice constant of a different material allowing that material to be grown on the wafer surface without building up internal stress.

"Open-Circuit Voltage" as used herein means the voltage that a photovoltaic cell produces at zero current.

"Optical Efficiency" as used herein means the percentage of light entering the aperture of a concentrator that reaches a receiver that that concentrator is focusing on.

"Orthogonal" as used herein means "at a right angle" (90 degrees).

"Over-focusing" as used herein means focusing at a distance closer than a receiver so that the light spreads out again by the time it reaches the receiver.

"Packing Efficiency" as used herein means the efficiency with which objects (typically curved or irregular) are packed together to cover a surface. See also "Fill Factor".

"Parabola" as used herein means a conic section cut parallel to the side of a cone. A parabola is the ideal shape for an imaging concentrator for light parallel to the parabola's axis of symmetry. See "Conic Sections".

"Parabolic Dish" as used herein means a shape whose cross-section on any plane parallel to an axis of symmetry is a parabola. A parabolic dish includes a "Paraboloid of Rotation", in which a parabola is rotated around its axis of symmetry so that all cross sections containing the axis of symmetry are parabolas of equal focal length, as well as an "Elliptical Paraboloid", where different cross sections containing the axis of symmetry have different focal lengths (called "elliptical" because a cross section perpendicular to the axis of symmetry is an ellipse).

"Parabolic Trough" (also "Paraboloid of Displacement" and "Paraboloid of Translation") as used herein means a long straight trough whose cross-section perpendicular to the length of the trough is a parabola.

"Paraboloid" as used herein means a surface curved in two dimensions, where the cross section in each of those dimensions is a parabola.

"Paraboloid of Rotation" as used herein means a surface whose shape matches a parabola rotated about its axis of symmetry. A paraboloid of rotation is thus a paraboloid whose focal length is the same in both parabolic dimensions.

"Partial-Vacuum Parabolic Mirror" as used herein means an approximately parabolic mirror formed by stretching a substantially circular sheet with a mirrored surface over a substantially air-tight frame and withdrawing some air from within the frame, creating a partial vacuum that pulls the sheet into a good approximation of a paraboloid of revolution.

"Passive Solar" as used herein means the use of solar energy to directly heat a space such as a building, without involving any significant moving parts.

"Passive Cooling" as used herein means a system that uses no applied power other than the heat itself to move heat from a hot region (such as a solar cell) to a cold sink (such as the atmosphere). See "Heat Pipe", "Fin Tube", "Active Cooling" and "Mechanical Cooling".

"Passive Tracking" as used herein means a system that uses the sun's heat to move water to shift the balance of a tracker so that it pivots its normal line toward the sun to rebalance itself.

"Peak Power Demand" as used herein means the power demand at the time of day when the power demand is highest. In high-sun areas this is typically in the mid- to late-afternoon when factories are still operating and the air conditioning load is high.

"Peaking Power" as used herein means electrical power storage release capacity or generating capacity that is typically brought on line only at times of peak demand. It is typically provided by "peaking power plants" that burn expensive fuel but have relatively low fixed costs. The most valuable power is peaking power that is also quickly dispatchable; such power can command many times the price of base-load power. See also "Base-load power" and "Dispatchable Power".

"Photochemistry" as used herein means chemical reactions that are directly driven by the energy of photons (without that energy first being converted to heat).

"Photocurrent" as used herein means the current generated by a photovoltaic cell (which comes from the rate at which electrons liberated at a photovoltaic junction are collected and delivered to a photovoltaic cell contact).

"Photosynthesis" as used herein means the natural photochemical reactions used by most plants and some bacteria to dissociate carbon dioxide and water, liberate oxygen, and recombine their remaining constituents into energy-rich molecules such as carbohydrates.

"Photovoltaic" as used herein means using the energy of individual photons of light to liberate electrons from a semiconductor, and collecting those electrons to deliver them as electrical current.

"Photovoltaic Receiver" as used herein means a receiver for solar energy that uses photovoltaics as its primary means of producing electricity. See also "Co-generation", "Hybrid Receiver", and "Thermal Receiver".

"Polar Lobe" as used herein means a lobe of heliostat mirrors on the polar side of a heliostat tower that always focus on a receiver on that heliostat tower. See also "Dynamic Lobe".

"Polar Side" as used herein means the side of a heliostat tower closer to the closest of the earth's poles, e.g., the north side for a tower in the northern hemisphere. The expression is meaningless at the equator and right at the poles.

"Pole-top Tracker" as used herein means a tracker that is mounted on top of a single central pole.

"Pre-shaped" as used herein in is meant an object whose shape does not change substantially when installed. For example, metal ribs and rails bent into substantially their installed shape before installation, and mirror segments bent into substantially their installed shape before installation, are referred to as pre-shaped.

"Press-formed" as used herein means a metal strut such as a rib or a rail that has been bent to a particular shape by being pressed at each point that a bend is desired. Typically the metal is slightly over-bent during pressing so that it springs back to the desired shape.

"Primary Mirror" (also "Main Mirror") as used herein means the first focusing mirror that incident sunlight is reflected by in a system with multiple focusing elements in its light path. See also "Secondary Concentrator".

"Pumped-Hydroelectric Storage" as used herein means the storage of energy by pumping water from a lower reservoir to a higher reservoir when more electricity is being produced than is needed at that time, and then having that water later return to the lower reservoir through a turbine to recover much of the stored energy when more electricity is required than other sources are producing. This has been used for decades because coal-fired power plants take a long time to reach full efficiency, and also repeated heating and cooling shortens the life of many materials. So once a thermal power plant is running, it is often best to keep it running even if it is producing more electricity than is then needed. With an intermittent source of electricity such as photovoltaics, pumped-hydro storage can relatively cost-effectively transform at least some of the intermittent (and thus least dispatchable) energy into hydroelectric (and thus the most dispatchable) energy.

"Pythagorean theorem" as used herein means the principle, as elucidated by Pythagoras, that the square of the length of the hypotenuse of a right triangle is equal to the sum of the squares of the lengths of the two shorter sides.

"Radian" as used herein means the angle subtended by an arc whose circumference is equal to is radius of curvature. This is 180/Pi degrees, or approximately 57 degrees. When working with sine and cosine functions angles are often measured in radians; this is convenient because when angles are measured in radians, the sine of a small angle R is very close to R, and the cosine of a small angle R is very close to $1-R^2/2$.

"Radiant Losses" as used herein means the loss of heat from a hot object through radiation of energy, typically infrared energy for the temperatures involved in solar energy systems.

"Rail" as used herein means a strut or tube, typically of steel, to which mirror segments are attached. When a frame comprises a lattice of crisscrossing struts, the struts to which the mirrors are attached are referred to as rails. See also "Mirror Frame" and "Rib".

"Recombination Losses" as used herein means losses in photovoltaic cell efficiency from when liberated electrons recombine with the holes from where they or other electrons have been liberated before the electrons can be collected to contribute to the cell's photo current.

"Receiver" as used herein means a device with an energy-absorbing receiver surface onto which solar energy is focused, such as a densely packed array of photovoltaic cells, a single photovoltaic cell for a small-aperture mirror, or a maximally absorptive, minimally radiant surface for a solar thermal system. A receiver generally includes ancillary functions such as cooling for the receiver surface for photovoltaic receivers, the transfer of heat from the receiver surface to a working fluid for solar thermal receivers, or transport of reactants to and products from the focus for photochemical systems.

"Receiver Angle" as used herein means the angle of the receiver surface to the focused light impinging upon it.

"Receiver Area" as used herein means the area of a receiver that is available to receive incoming focused light and productively use the energy therein.

"Receiver Support" as used herein means a means for supporting a receiver at or near the focus of a mirror. Receiver supports are generally engineered to block a minimal amount of light while holding the receiver firmly in position.

"Receiver Surface" as used herein means an energy absorber onto which solar energy is focused, such as a densely packed array of photovoltaic cells, a single photovoltaic cell for a small-aperture mirror, or a maximally absorptive, minimally radiant surface for a solar thermal system.

"Receptive Regions" as used herein are meant one or more receiver surfaces on a receiver.

"Resistance" as used herein is generally meant the resistance to the flow of electrical current. When resistance to the flow of coolant is meant, this is explicitly stated; and when it refers to the flow of heat through a thermal conductor, this is explicitly referred to as thermal resistance to distinguish it from electrical resistance.

"Resistive Losses" as used herein means the loss of power through the voltage drop caused by electrical resistance. These losses are proportional to the resistance times the square of the electrical current.

"Rib" as used herein means a strut or tube, typically of steel, to which rails are attached (with the rails in turn holding mirror segments). See also "Mirror Frame" and "Rail".

"Rim Angle" as used herein means the angle of a mirror's surface at the rim of a mirror relative to the angle of the mirror's surface at the mirror's axis of symmetry. For a rectangular paraboloid mirror, the rim angle is measured in the middle of a side of the mirror, rather than at a corner, because the effects of curvature in each dimension are largely independent of each other.

"Rotational" as used herein means pertaining to rotation about an axis. When used in reference to tracking mechanisms, rotational refers to the aligning of the focal spot on the receiver being accomplished by rotating the tracker, and thus the mirror and the receiver, to change the angle of the mirror's normal line relative to the direction of the sun. When used in reference to receivers, it means that the receiver rotates to accommodate changes in the angle of incoming light. See also "Translational" and "lateral-shift fine tracking".

"Scaling" as used herein refers to how one property of an object changes when another property of the object is increased or decreased. For example, a second property scaling with the square of a first property would quadruple if the first property is doubled.

"Seasonal Tracking" as used herein means tracking to compensate for the seasonal variation in the sun's position in the sky, especially if this is performed by a separate means from daily tracking. See also "Daily Tracking", "Altitude Tracking, "Azimuth Tracking", and "X/Y Tracking".

"Secondary Reflector" as used herein means a reflective surface that redirects light focused by a primary mirror or lens.

"Segment-bent" as used herein means a structural element consisting of multiple bends separated by straight segments, as opposed to being substantially continuously curved. Segment-bent structural members are easier to manufacture from rigid materials than continuously-curved members because they can be press-formed with a limited number of pressed bends.

"Shaped In-Situ" as used herein means that something (e.g., a mirror segment) is not substantially fixed in shape in the factory it is manufactured in, but whose shape is substantially altered as it is installed (e.g., as it is placed on or attached to the rails of a mirror frame).

"Shared-Support Trackers" as used herein means multiple co-located trackers that each rotates about its own axes, but that share tracker support mechanisms such as support towers.

"Shingled" as used herein means an arrangement of photovoltaic cells such that a bottom edge of one cell overlies a top edge of an adjacent cell, somewhat similar to the way shingles on a roof overlap.

"Short Circuit Current" as used herein means the photo-current that a photovoltaic cell produces if its lower-voltage and higher-voltage contacts are 'shorted' together through a conductor of negligible resistance.

"Silica Gel" as used herein means an inexpensive, non-toxic, non-corrosive moisture-absorbing compound composed mainly of silica.

"Slope Error" as used herein means a deviation at any given point in the slope (angle) of a mirror segment from that desired (typically a perfect paraboloid for an imaging concentrator). Slope errors are twice as effective at misdirecting light as other angular errors (such as tracker alignment) because a mirror reflects light at an equal but opposite angle to its normal line as the incoming light, so a one-degree slope error, for example, will misdirect the reflected light by two degrees.

"Solar Glass" as used herein means a very clear (low absorption, low dispersion) glass. Solar glass is very low in iron content, and is typically thinner than standard glass, usually between one and three millimeters thick.

"Solar Glass Mirror" as used herein means a second-surface mirror made with solar glass. Because solar glass is very clear and very smooth, a solar glass mirror has very high specular reflectivity.

"Solar Thermal" as used herein means a system that captures the sun's energy as heat, which is then typically put to productive use to generate steam to run a turbine to turn a generator to produce electricity.

"Specular Reflectivity" as used herein means the percentage of incident light on a mirror that is reflected to within a fraction of a degree of an equal but opposite angle about the mirror's normal line. Specular reflectivity is usually measured out to 7 milliradians (about 0.4 degrees) from the equal-but-opposite angle. "Specular" is from the Latin word for mirror (speculum). Glass mirrors have very high specular reflectivity, but while snow has a very high reflectivity, that reflectivity is diffuse rather than specular and so one cannot see one's mirror image in snow.

"Spline" as used herein means the shape taken by a long, semi-rigid object when it is subject to bending force at discrete points. This is a polynomial function that is strongly dominated by a second-order curve, and it thus closely approximates a parabola where more than a few points on a parabola are used.

"SQRT(x)" as used herein means the square-root of the number x.

"Straight-lattice parabolic-support" as used herein means a support that comprises a straight lattice truss with extensions whose lengths cause them to termination approximately on a parabolic arc. These extensions imbue light, low cost and readily available straight lattice trusses with the ability to support mirrors in a parabolic configuration.

"Stepper Motor" as used herein means a motor that moves in discrete steps rather than turning continuously. Stepper motors can be used to very accurately rotate or move an object to a desired orientation or position.

"Stirling Engine" as used herein means a thermal engine substantially similar in operating principle to that devised by the Reverend Robert Stirling in the early 1800s. Stirling engines are efficient, closed-cycle heat engines well suited to moderate-scale (tens of kilowatts per focus) solar thermal systems such as some of the embodiments described herein.

"String of Cells" (also "Cell String") as used herein means a set of photovoltaic cells connected in series. While a string of cells adds cell voltages (rather than cell currents) and thus minimizes conductor sizes and resistive losses, the cells must either be evenly illuminated or have bypass diodes to prevent a less-illuminated cell from reducing the efficiency of the entire cell string.

"Substantially Parabolic" as used herein to describe shapes of supports for mirrors is to be understood to take into account that it is the reflective surface of a mirror that is to be most closely parabolically curved, and that a "substantially parabolic" rail or rib that supports such mirrors will be a curve that is an offset from a true parabola, with the amount of offset being substantially equal to the distance from the mirror surface to the relevant part of the rail or rib. When applied to a series of points, "substantially parabolic" means that the points all lie close to the same parabolic curve, and when applied to segments "substantially parabolic" means that a single parabolic curve can cross all segments at substantially the same location on each segment.

"Substrate" as used herein means a substance used as the foundation for building up one or more layers of other materials.

Sun Movement: Expressions referring to the 'Movement of the Sun' as used herein are meant as referring to the apparent angular motion of the sun across the sky due to the daily rotation of the earth about its own polar axis and the yearly rotation of the earth around the sun.

"Suns" as used herein means the ratio of the intensity of focused sunlight to the intensity of direct sunlight, which is similar to geometric concentration but also includes losses such as shadows from supporting structures and mirrors not being perfectly reflective. See also "Concentration".

"Targeting Mirror" as used herein means a small mirror used to aid in aligning a primary mirror.

"Thermo-chemical" as used herein means a chemical reaction driven by heat. Examples of relevant reactions driven by various temperatures (and thus qualities of heat energy) are: the driving off of carbon dioxide from an amine solution (as used to capture carbon dioxide from coal-fired power plants), which can utilize even fairly low-grade heat; the driving off of chemically-combined water and carbon dioxide in the manufacturing of cement, which requires high-grade heat; and the dissociation of carbon dioxide in the production of fuel from captured carbon dioxide, which requires very high grade heat. See also "exergy".

"Thermal Coefficient of Expansion" (also "TCE") as used herein means the rate at which the size of an object changes due to changes in the object's temperature, usually measured in parts-per-million per degree Celsius (ppm/° C.). Differences in thermal expansion can cause thermal stress in materials especially when large regions of rigid materials with substantially different TCEs are bonded together at one temperature and then heated or cooled to a significantly different temperature.

"Thermal Engine" as used herein means an engine that extracts mechanical energy from the movement of heat from a hot source to a cold sink. That mechanical energy is often then converted to electrical energy.

"Thermal Expansion" as used herein means the change in size of an object due to changes in the object's temperature. See also "Thermal Coefficient of Expansion".

"Thermo-chromic" as used herein means changing optical properties with changes in temperature. For example, vanadium dioxide changes from transparent to reflective at 68 degrees Celsius.

"Thin-film Photovoltaics" as used herein means photovoltaics employing films of less than 25 microns thick of semiconductor materials. These are generally less expensive per square meter than crystalline or polycrystalline solar cells, but are also generally less efficient at converting light to electricity.

"Top Contact" as used herein means an electrical contact on the top (receptive) surface of a photovoltaic cell that is connected to a bus-bar that serves as one of the cell's electrical contacts.

"Tracker" as used herein means a device that changes angle as the sun 'moves' so as to keep one or more mirrors or lenses on the tracker focused on one or more receivers.

"Tracker Payload" as used herein is the mirror frame, ribs, rails, mirrors (or lenses) and/or receivers that are moved by a tracker's movement.

"Translational" as used herein means a movement of an object or a shape that changes its position but not its orientation. See also "Rotational".

"Triple-junction Cell" as used herein means a photovoltaic cell that has three different junctions with three different band-gaps stacked on one another so that each can absorb photons of an energy that it can convert efficiently to electricity. Triple-junction cells currently have a maximum efficiency of around 40%, which is much higher than that of silicon cells or thin film photovoltaics. On the other hand, triple-junction cells currently cost 200 times more per area than silicon cells, and so require concentrated light to be economical.

"Two-Axis Tracker" as used herein means a tracker that tracks in two dimensions to compensate for the changing position of the sun. Two-axis trackers are generally azimuth/altitude trackers, where one tracking dimension corresponds to the compass direction of the sun and the other dimension corresponds to its height above the horizon. Daily/seasonal trackers and X/Y trackers also exist but are less common.

"Under-focusing" as used herein means focusing at a distance farther than a receiver so that the light has not converged to its maximum concentration by the time it reaches the receiver.

"Very High Concentration" as used herein means 500× to 1200×, ideal for high-efficiency triple-junction cells. This border area between high-concentration and extremely high concentration is ideal for today's high-efficiency triple-junction cells, and hence rates its own concentration terminology. See also "Low Concentration", "Moderate Concentration", "High Concentration" and "Extremely High Concentration".

"Waste Biomass" as used herein means biomass that currently is not useable as food for people or animals that people keep. Nature, of course, does not see such biomass as waste, because something, even if only microscopic organisms, will see almost any biomass as food.

"Watts Peak" as used herein means the power output under full sun and with proper cooling. This typically is the power output under standard test conditions of 1000 watts per square meter of a spectrum matching air-mass 1.5 (the sun at a bit less than a 45-degree angle at sea-level) and a cell temperature of 25 degrees Celsius.

"Wind Loading" as used herein means the forces applied to a structure by moderate to high winds.

BRIEF DESCRIPTION OF THE DRAWINGS

FIG. 2D is a depiction of a wood and brass sheet linear paraboloid (parabolic trough) as could have been built using information and materials known to have been available in the time of Archimedes;

FIG. 2D1 is a depiction of parabolic trusses added to a frame for a linear paraboloid to produce the frame for a parabolic dish;

FIG. 9C is a simplified one-dimensional illustration of the improvement gained from allowing heliostat mirrors to associate with different receivers at different times at the equator;

FIG. 10E1 is an illustration of the higher mean-to-peak concentration ratio, wherein a dynamic lobe can deliver to a heliostat receiver.

Figure 1A:
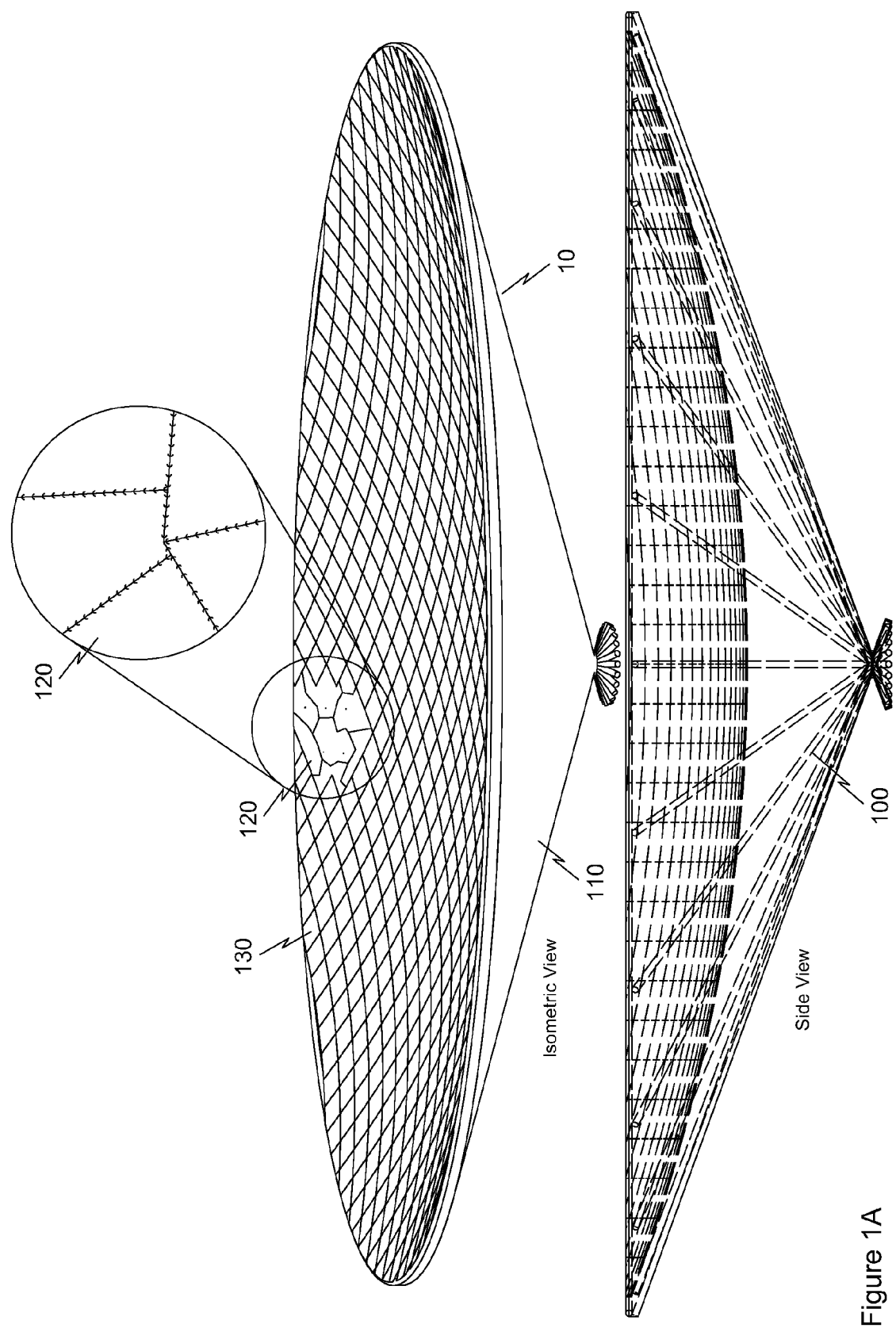
FIG. 1A is a depiction of a leather and brass sheet partial-vacuum parabolic mirror as could have been built using information and materials known to have been available in the time of Archimedes.

These figures are presented by way of example, and not by way of limitation, and unless otherwise specified in the accompanying text, the provision of a given number of items, or a given style of an item, is merely illustrative.

DESCRIPTION OF THE PREFERRED EMBODIMENTS

First Family of Preferred Embodiments: Methods for Making High-Concentration Parabolic Mirrors Using Materials and Technologies Readily Available to Archimedes and Using Materials and Technologies Currently Cost-Effective in Third-World Countries High-concentration mirrors used in solar power today are complex, generally being either carefully molded glass mirrors or hundreds to thousands of exceptionally flat mirrors acting in concert, and complexity leads to high cost. There is thus a need for materials and manufacturing techniques simple enough to have been readily available in Archimedes' time and which would be cost-effective today.

In looking at how Archimedes could produce mirrors that could set ships on fire at a bowshot distance, the critical component is the mirrored surface. In Archimedes' time, mirrors were made from bronze, and since soldiers' shields were made from bronze sheet over wooden frames, Archimedes had access to large quantities of bronze sheet that could be polished to a mirror finish. In fact one of the legends (of which the earliest known recording is from over a thousand years after Archimedes' time) is that Archimedes told the king's soldiers to polish their shields to a mirror finish, and that the soldiers then used sunlight reflecting from their shields to set the Roman fleet on fire. But shields are usually convex for strength, and even if the backs were polished the concave surface would be far too curved to concentrate the sun's light at a bowshot distance.

Archimedes was a very practical person with the resources of an entire city-state at his disposal. Archimedes was also an expert in conic sections, including parabolas, so he would have known that a paraboloid was the right shape to focus the sun's light (this had been figured out several generations before Archimedes). But while a paraboloid of revolution is an efficient shape for focusing light, its surface curves everywhere in two dimensions at once and brass sheet will only curve smoothly in one dimension at a time. To be sure, brass sheet can be beaten into a compound curve, but this is time-consuming and a curved surface is harder to polish than a flat surface is. And at a bowshot distance, every degree of slope error in any region will throw that region's light off from its target by roughly two meters, so the brass would need to be very accurately shaped and smoothly curved.

Since the minimum possible focal spot from a true paraboloid, as limited by the sun's angular diameter, is almost half-meter in diameter at 50 meters (approximately a bowshot distance of 100 cubits), Archimedes would have needed a minimum of almost 100 square meters of perfect mirrors, and roughly 150 square meters of mirror with the roughly 65% specular reflectivity of polished bronze, to achieve the several hundred suns concentration needed to rapidly ignite a ship. It would therefore be more practical to polish flat brass sheets and to then find a way to persuade nature to curve them appropriately.

Archimedes was known for approximations. As a youth he solved a long standing puzzle, the ratio of the volumes of a cylinder, a sphere and a cone with the same diameter and height. Rather than using mathematics, Archimedes carved the three shapes out of wood on a lathe and weighed them, showing that the ratio of their volumes was 3:2:1. For having stooped to so base a method as actually making the objects, Archimedes was expelled from the prestigious academy. Later in life Archimedes was known for being able to solve the area bounded by a complex curve, using what he called "the method" (from which our word algorithm comes, being a corruption of the Arabic words for "the method"). When Archimedes revealed his method, it was to first very accurately graph the curve on parchment, and then to cut out the region area and weigh it to calculate the area. "For" he explained, "when one knows the answer it is much easier to prove that it is the answer than it is to find a proof for an answer that one does not know." How, then, could one approximate a mirrored paraboloid of revolution with the materials readily available to Archimedes?

One of the simplest ways to make a very good approximation of a paraboloid of revolution is to stretch a membrane across the mouth of a circular drum, and evacuate some air from the drum to pull the membrane inward. In college in the 1970s I made such a partial-vacuum mirror from a 52-inch (1.3-meter) kid's wading pool and a Mylar 'emergency space blanket'; the best focus was at 13 feet (4 meters) where almost all of the light fell within an oval roughly 1.5" (4 cm) by 2.5" (6.25 cm), which, given the angle of the sun above the horizon, is almost as tight as from a perfect parabola at that distance. And a lightly crumpled paper towel simply dropped through the focus would burst into flames as it fell, demonstrating the near-instant inflammatory power of the intensely concentrated sunlight (a concentration of almost 400 suns). While Archimedes would not have had a large enough plastic wading pool handy, a conical leather-backed frame as shown in FIG. 1A could easily be made air-tight enough; I built several smaller such frames myself in the 1980s in a spoked design similar to a wagon wheel, although I used plastic sheet rather than leather for the back covering 110 that covers the spokes 100. Such a frame could easily be made 15 meters (33 cubits, or 50 feet) in diameter, and simple scaling shows that this would provide sufficient area for igniting ships at a bowshot distance (the 70% reflectivity of thin Mylar being roughly comparable to the 65% reflectivity of highly polished bronze mirror).

Although today it may be hard to envision people over 2000 years ago building such 'large' structures, a 15-meter frame is actually quite small compared to the warships of Archimedes' day. Even the most common ships were several tens of meters long, and the largest troop-carrier ships described are over 100 meters long. And Archimedes is known to have devised a clawed lever capable of lifting an entire warship tens of meters long out of the water. So a mirror frame such as that for mirror 10 of FIG. 1A that was 15 meters or even 20 meters in diameter would certainly have been well within the capability of Archimedes to construct, as would means to suspend such a mirror.

Archimedes didn't have Mylar available, or any stretchy mirrored membrane. However the membrane 120 could be made from leather, and if small flat mirror segment 130 were attached to this surface, then their combined surface would together approximate the desired shape. This would even produce an adjustable focal length overall mirror 10, as more or less air could be pulled out to change the focal length, moving the front membrane 120 and with it the mirror segments 130. But this embodiment of such a mirror 10 would have a tremendous disadvantage in a time of war, as arrows shot through it would rapidly ruin its air-tightness and thus its utility. Similarly in spite of the ease of constructing membrane/vacuum mirrors, they are not practical in cases where durability is important such as at a modern solar farm.

But by giving up the adjustability of the focal length, one can use a vacuum to deform a flexible membrane to the right shape and then harden the membrane. While today this is best done by heating plastic, deforming it and then cooling it to harden it, plastic was not known in Archimedes' day. On the other hand rawhide was well known, and rawhide is soft and stretchy while wet and hardens as it dries. A frame for vacuum-stretching the moist rawhide to the right shape could be made simply by driving stakes into the ground in a large circle and then connecting them with a bent-sapling rim, as the amount of vacuum needed is quite small (and can easily be supplied by lung power).

An alternative to a slight vacuum is to spread an even-thickness layer of sand on the surface so that the weight of the sand will pull the rawhide into an approximate parabolic shape. An even thickness of sand produces a more accurate approximation of a paraboloid than a partial vacuum does, and it would even be possible to have the sand be slightly less deep toward the edges to produce a near-perfect paraboloid. Because of the rotational symmetry of the rawhide shape, the thickness of the sand could be controlled with a parabolically-curved spreader across the frame, with a person on each end walking around the frame to rotate the spreader. With sand, thongs for attaching mirrors could be passed through hole in the rawhide before stretching, as this would be easier than drilling numerous holes after the rawhide hardened.

Figure 1B:
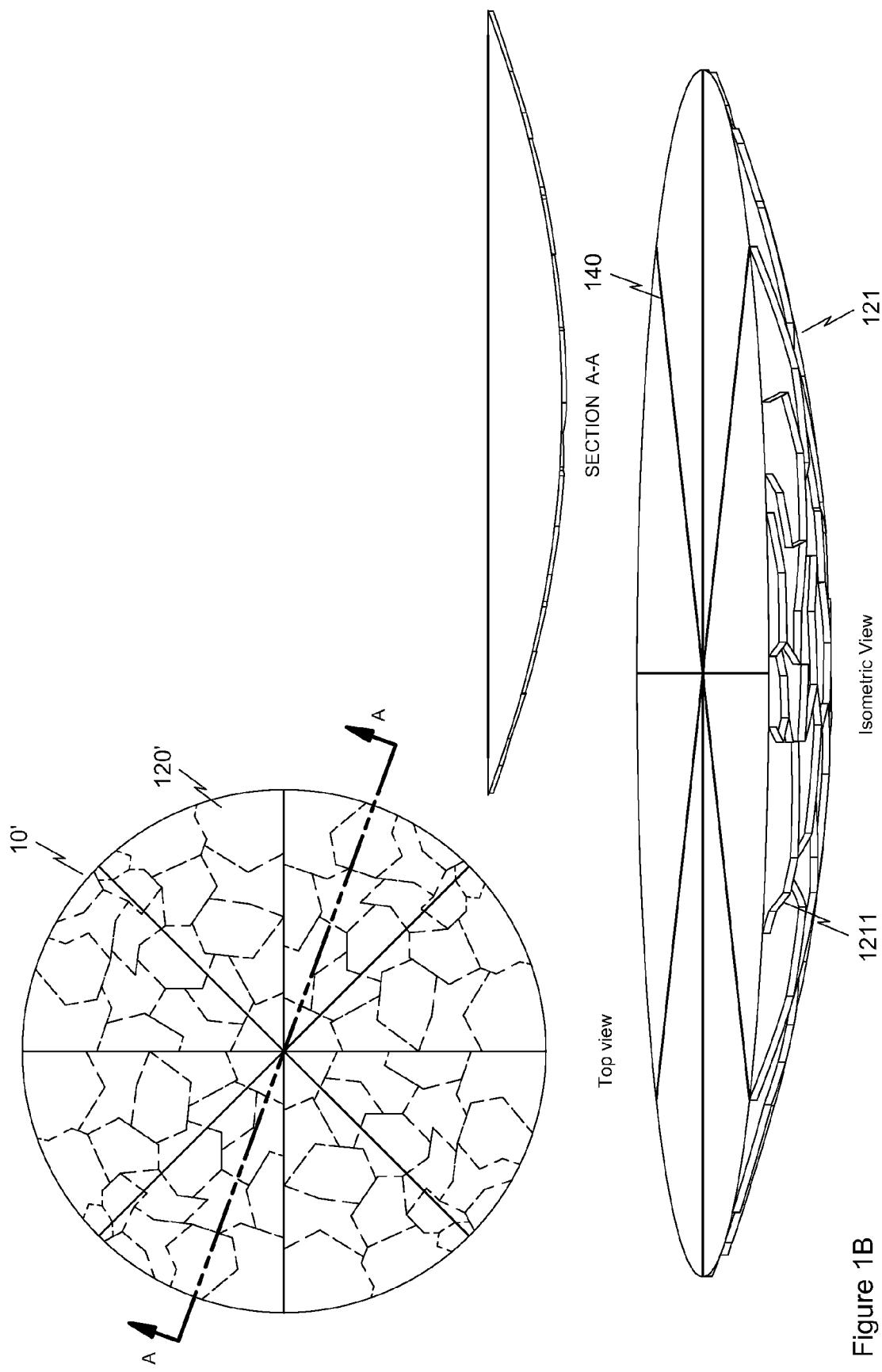
FIG. 1B is a depiction of a rawhide and brass sheet rigid parabolic mirror as could have been built using information and materials known to have been available in the time of Archimedes.

As shown in FIG. 1B, by sewing together a number of hides 120' and leaving considerable excess 1211 on each, this excess 1211 could be sewn together so that it would produce a reinforcing honeycomb 121 of excess 1211 when dry. Just as a glass honeycomb is used for large telescope mirrors today, such a honeycomb 121 would provide very favorable strength-to-weight and stiffness-to-weight ratios. Rawhide shrinks as it dries, so slight over-shaping would be needed for the initial stretching. This would allow eliminating the leather back covering 110 of FIG. 1A, and the spokes 100 could be eliminated, or they could be retained and have the raw-hide attached to them after drying for additional rigidity. Additional stiffness to simplify the mounting of paraboloid 10' of FIG. 1B while maintaining its shape could be provided by optional thin ropes 140 across the aperture, which would block only a small amount of light.

There are numerous related processes that would produce equivalent results. For example, the hardening of cloth soaked in plaster, resin or cement could be used instead of the drying of rawhide, and mirrors could be attached as part of this hardening. Multiple mirrored segments could also be transferred on a sheet, as parquet or mosaic tile flooring is typically laid today).

The mirror segments in these embodiments do not have to be flat. A curvature with a focal length of half the distance to the target would over-focus by the same amount that a flat mirror under-focuses, and any intermediate curvature would be an improvement. However flat mirrors are easy to fabricate, and as long as the individual mirrors are very small compared to the distance to the target, the effect on the focal spot size, and thus the concentration, is small.

Figure 1C:
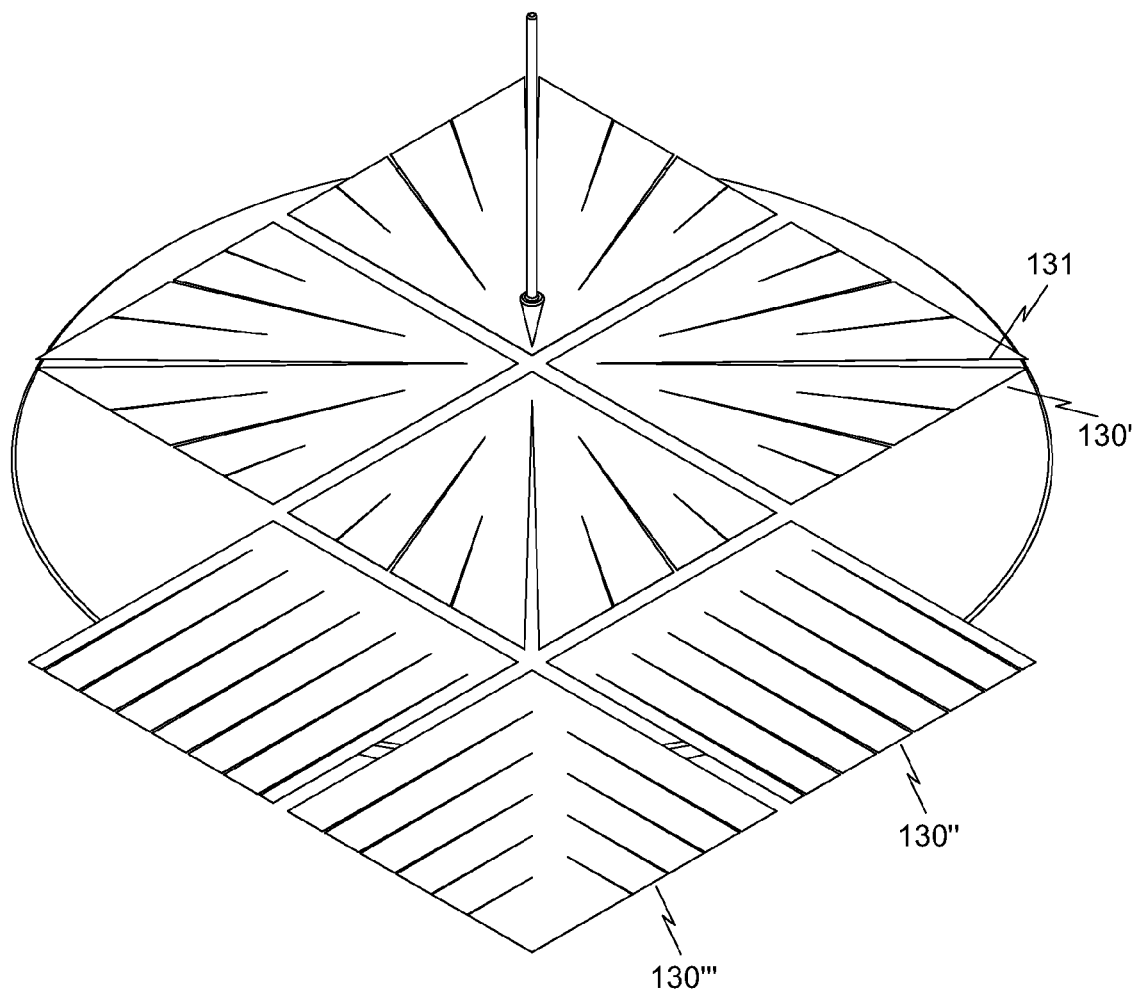
FIG. 1C is a depiction of notched brass-sheet mirrors suitable for being pressed into a paraboloid of rotation to produce a high-concentration mirror as could have been produced in the time of Archimedes.

As shown in FIG. 1C, rather than sew in large numbers of small individual mirror segments 130, larger sheets such as 130', 130" and 130''' with cutouts 131 could be used. The ideal cut-outs just close when the sheets are pressed onto the surface so that the edges of the cut-outs conform to surface. If the distances between cuts are relatively equal, such larger mirror segments will conform reasonably well to the surface at the edges of the cuts even if only pulled toward the surface at their centers. Additional attachment points will increase the accuracy of the conformation at the cost of additional labor. The amount of cutting can be halved with only a slight loss of accuracy by using simple cuts instead of cutouts, and letting the brass sheet overlap as it conforms (approximately) to the rawhide surface. But this is less preferred because maintaining accuracy requires ensuring that each segment either goes over both of its neighbors, or under both of its neighbors, adding complexity.

The more cuts or cut-outs there are for a given sized sheet, the more accurately the mirror segments will match the rawhide surface (which itself would be a very close approximation of a true paraboloid of revolution). In general, to hold the increase in the diameter of the focal spot to a given width over that of a perfect parabola, an additional cut-out will be required every time the width of the uncut section itself grows to that width, as illustrated by the spacing of the cut-outs 131 in the example mirror segments 130'. Narrow strips of brass mirror of any length could also be sewn in, as it is only the width of material between cuts that enlarges the focus.

As an approximation, if the focal length of the rawhide parabola were 100 cubits (roughly 50 meters), which is a good approximation of a bowshot distance, the focus from a perfect paraboloid would be very nearly 1 cubit (roughly ½ meter or 18 inches across); a ⅓-cubit (roughly 15 cm or 6-inch) spacing on cuts would increase the focal spot diameter by ⅓ and thus its area to 4/3 squared or 16/9, or 1.78 times the area (and thus just over half the concentration) of a perfect parabola focusing at that distance. Narrower spaces between cuts could reduce this increase; but diminishing returns are quickly reached as the number of cuts to reduce the focal area by a given amount rises asymptotically.

If the cuts or cutouts are made so that the maximum distance between them is around 15 centimeters (6 inches or ⅓ of a cubit), then the focal spot is increased only by this amount in each dimension, increasing the light-gathering area required to roughly 250 square meters, or an 18-meter diameter for paraboloid mirror 10' of FIG. 1B. This thus represents a preferred embodiment manufacturable with materials readily available to Archimedes, and it would be workable for setting ships afire at a bowshot distance unless there were significant wind (which would complicate steering and possibly distort the shape).

On the other hand, this design does not match any of the most detailed of the oldest known recorded fragments of descriptions of Archimedes feat. I therefore sought other ways to build mirrors that more closely matched one or the other of the description fragments.

Figure 2A:
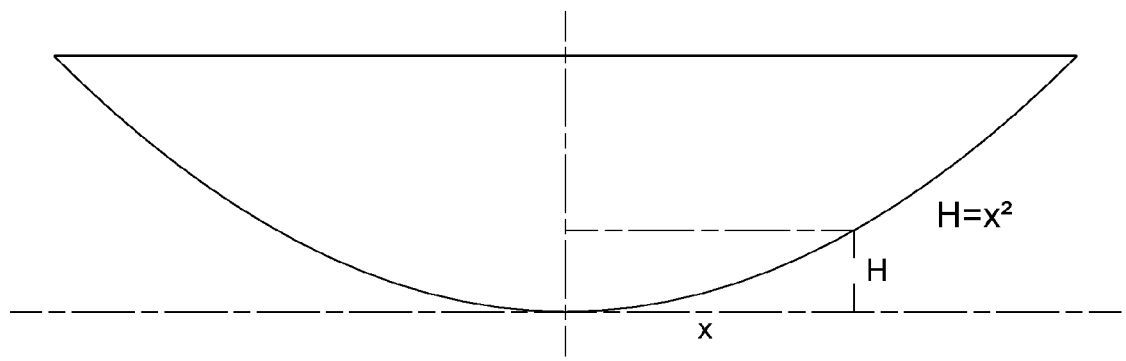
FIG. 2A is an illustration of a parabola and a paraboloid of rotation and their mathematical descriptions, showing that the height of the surface of a paraboloid of rotation is the sum of independent values for the X-axis and the Y-axis.

As shown in FIG. 2A, with a parabola the height of any point is the square of the distance from the origin along the X axis. In understanding a parabola there are a few things to note. First, for any value of X less than 1, $X^2$, or X times X, is less than X. Second, the slope of the parabola at any point is 2X (i.e., the derivate of $X^2$ is 2X). Third, the focus of the parabola will be at the height where a ray from the sun, which will be parallel to the axis of symmetry of the parabola, will be reflected parallel to the X axis. Since this requires the sun's ray to be reflected at a right angle to its original path, this occurs at a height where the slop of the parabola is ½ of a right angle, or 45 degrees. A 45 degree angle has a slope of 1, so this will occur where X=½, and the height of the focus is $(½)^2$, or ¼. In general systems for focusing solar energy use angles smaller than 45 degrees; the largest angles commonly seen are 22.5 degrees, which is half of a 45-degreee angle. Slopes (tangents) are not quite linear at significantly angles, so the slope of 22.5 degrees is 0.414 rather than ½. This corresponds to X=0.414/2, or around X=0.21.

Figure 2B:
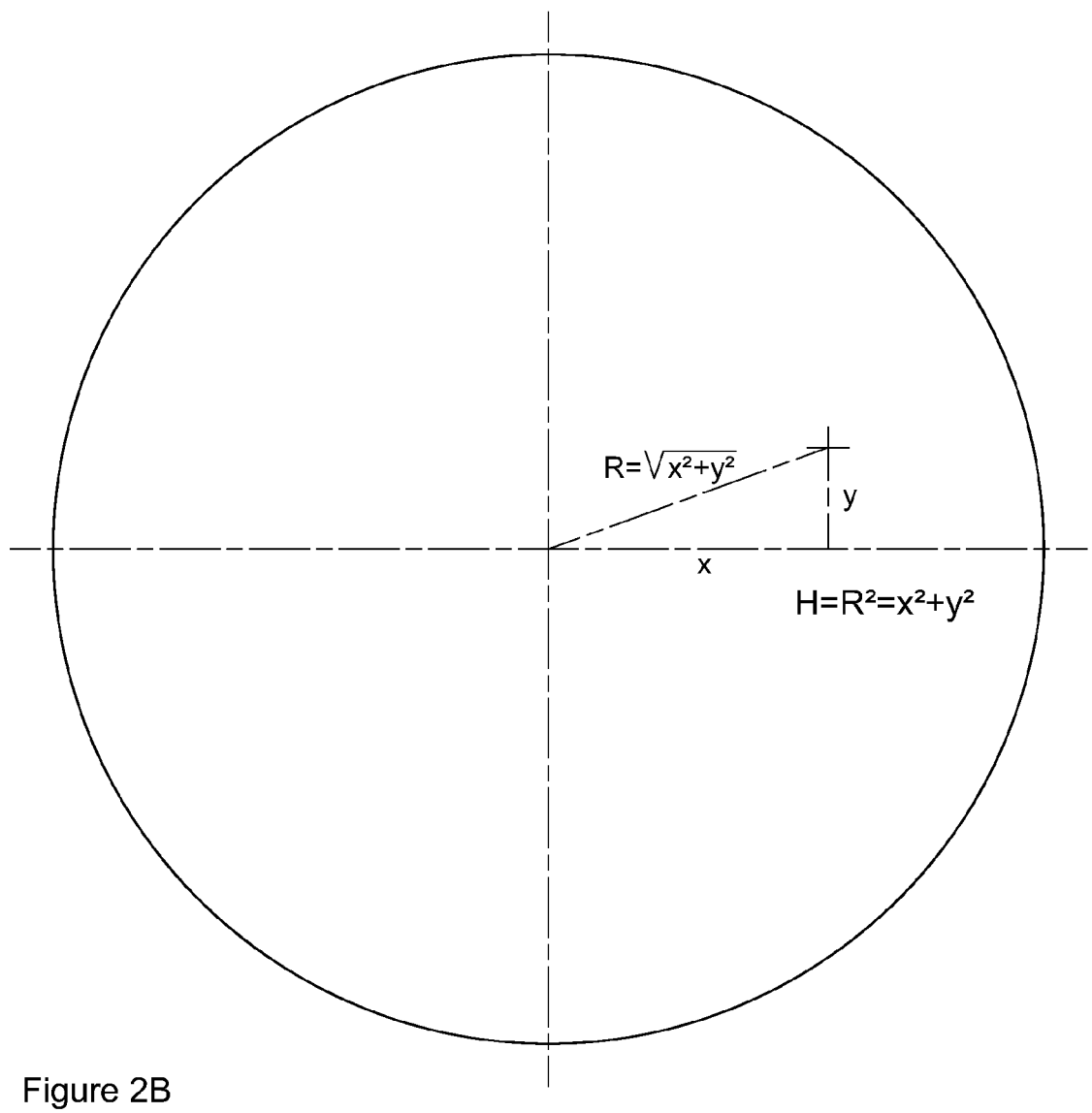
FIG. 2B is an illustration showing that a paraboloid of revolution is equivalent to the addition of two parabolic functions.

A paraboloid of rotation is produced by rotating a parabola around its axis of symmetry. As shown in FIG. 2B, the height of any point is the square of its planar distance from the center of the paraboloid, and by the Pythagorean Theorem the square of this distance is simply the sum of the squares of the distances in two orthogonal (perpendicular) directions. Since the square of the distance in each direction is the height of a point on the paraboloid at that distance on the axis in that direction, the height at any point on the paraboloid of revolution is simply the sum of the heights contributed by the square of the distance in each direction.

Figure 2C:
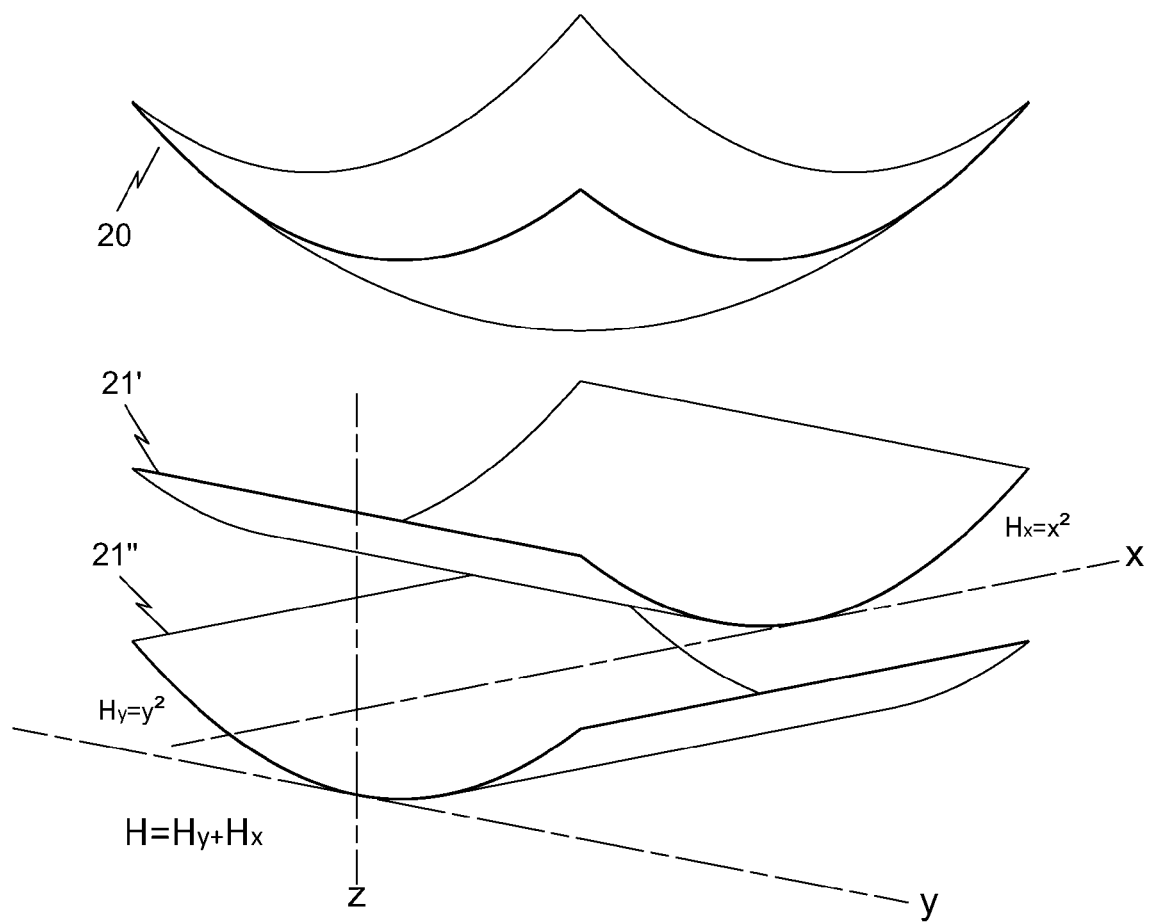
FIG. 2C is an illustration of two linear paraboloids (parabolic troughs) being added to form a paraboloid of revolution (parabolic dish)

Thus while a paraboloid of rotation curves everywhere in both directions at once, a cross section on either axis is a parabola, and the height at any point is simply the sum of the height contributed by the parabola on one axis plus the height contributed by a parabola on the orthogonal axis. Displacing the parabola on each axis perpendicular to that axis produces a linear parabola (or a parabola of displacement), as shown in FIG. 2C, and the height of the paraboloid of rotation at any point is the sum of the heights of the two linear paraboloids at that point. Thus a paraboloid of revolution 20 can be decomposed into contributions from two independent linear paraboloids 21' and 21".

It is easy to shape a sheet of metal into a paraboloid of displacement, or a linear parabola, because a linear parabola bends in only one direction at any point. As shown in FIG. 2D, simply putting boards or stacks of boards 210, 210', 210", 210''', etc. of the appropriate thickness on a flat surface 200 and pressing flat sheets of metal mirror 230 until they contact the boards will produce a near-perfect parabolic trough mirror 20'. The thickness of the boards for any position is simply proportional to the square of the distance of the inner edge of the board from the center of the parabola; alternatively, for each given thickness of a board or a stack of boards, the board or stack can be placed so that its inside edge is away from the paraboloid's center by a distance proportional to the square-root of the board's or stack's thickness. (These are mathematically equivalent statements, but in the former the math is easier while the latter more easily allows for stacks of boards of different thicknesses).

There are several ways to add a contribution of a second linear parabola to the first. As shown in FIG. 2D1, one way is to use a set of identical beams 220 that have flat bottoms and parabolic tops. By placing such a beam 220 on top of each stack of boards, with its parabolic top parallel to the length of the boards, the linear parabola of the identical beams 220 will be added to the orthogonal linear parabola defined by the tops of the stacks of boards, producing a series of parabolas that are cross-sections of a parabolic dish.

Figure 2E:
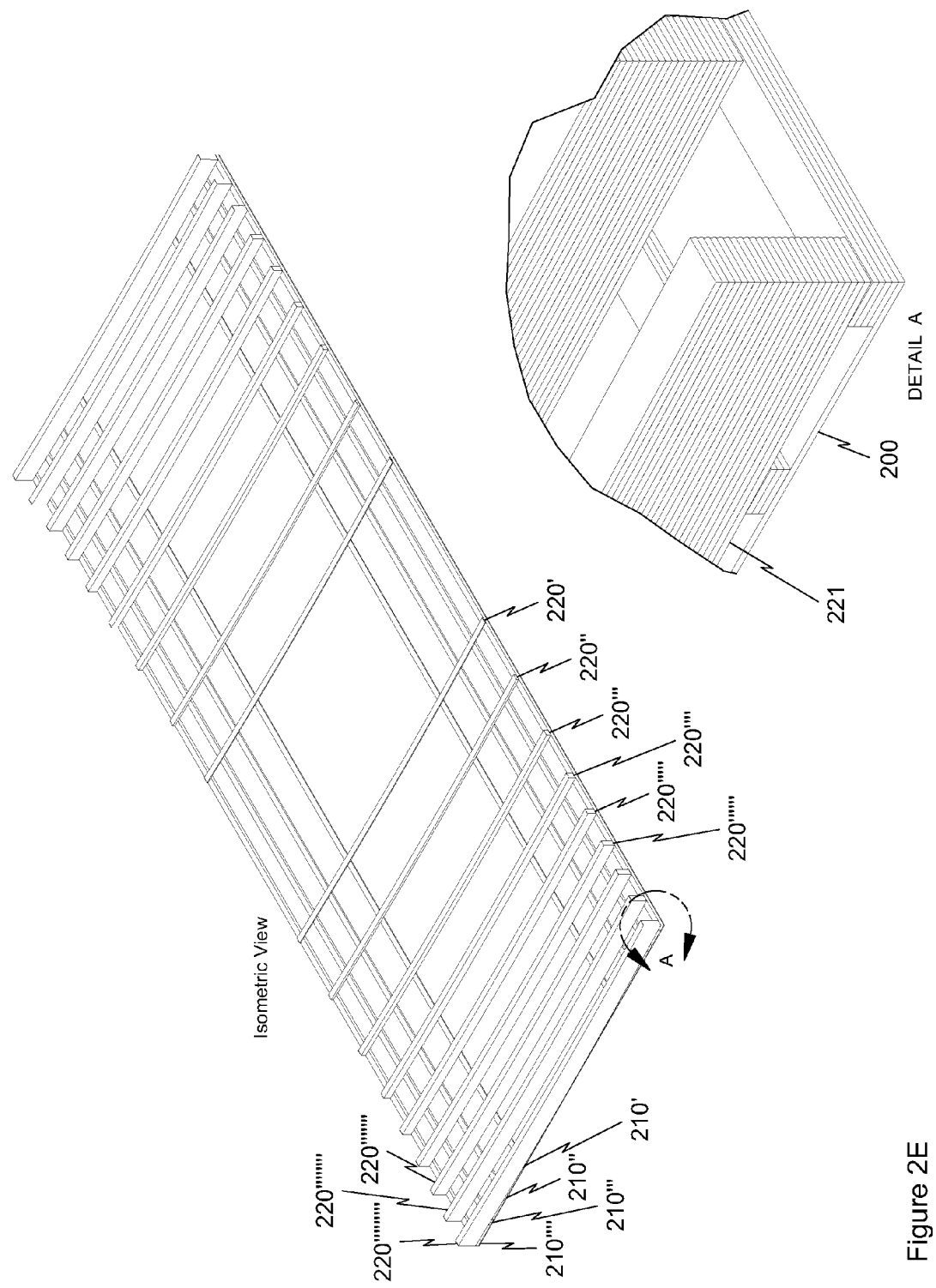
FIG. 2E is a depiction of a wood frame that combines two linear paraboloids into a frame suitable for creating a paraboloid of revolution from brass sheet, as could have been built using information and materials known to have been available in the time of Archimedes.

As shown in FIG. 2E, another way to add the contribution of a second linear parabola is to repeat the process used to define the first linear parabola, again using boards of the appropriate thickness for each distance from the center. For small enough sections of a paraboloid of revolution, full-thickness boards of the second set will be still thin enough to bend. For larger sections, stacks of boards 220', 220", 220''', etc., can be used instead, where each individual board 221 is thin enough to bend, for it is only the total height that matters. By matching the thickness of each stack to the square of the distance from the paraboloid's center to the inside edge of the stack, the top inside edges of the stacks will define the surface of a near-perfect paraboloid of revolution.

Because the boards in the stacks will bend in splines, and a spline through a even a modest number of points on a parabola is an excellent approximation of that parabola (three points produces a hyperbolic approximation, and each additional point adds a parabolic section, decreasing the size and the deviation of the hyperbolic end sections), a modest number of relatively widely space boards 210', 210", etc. of the right height will bend the next sets of boards 220', 220", etc. into an excellent approximation of a parabola.

Figure 2F:
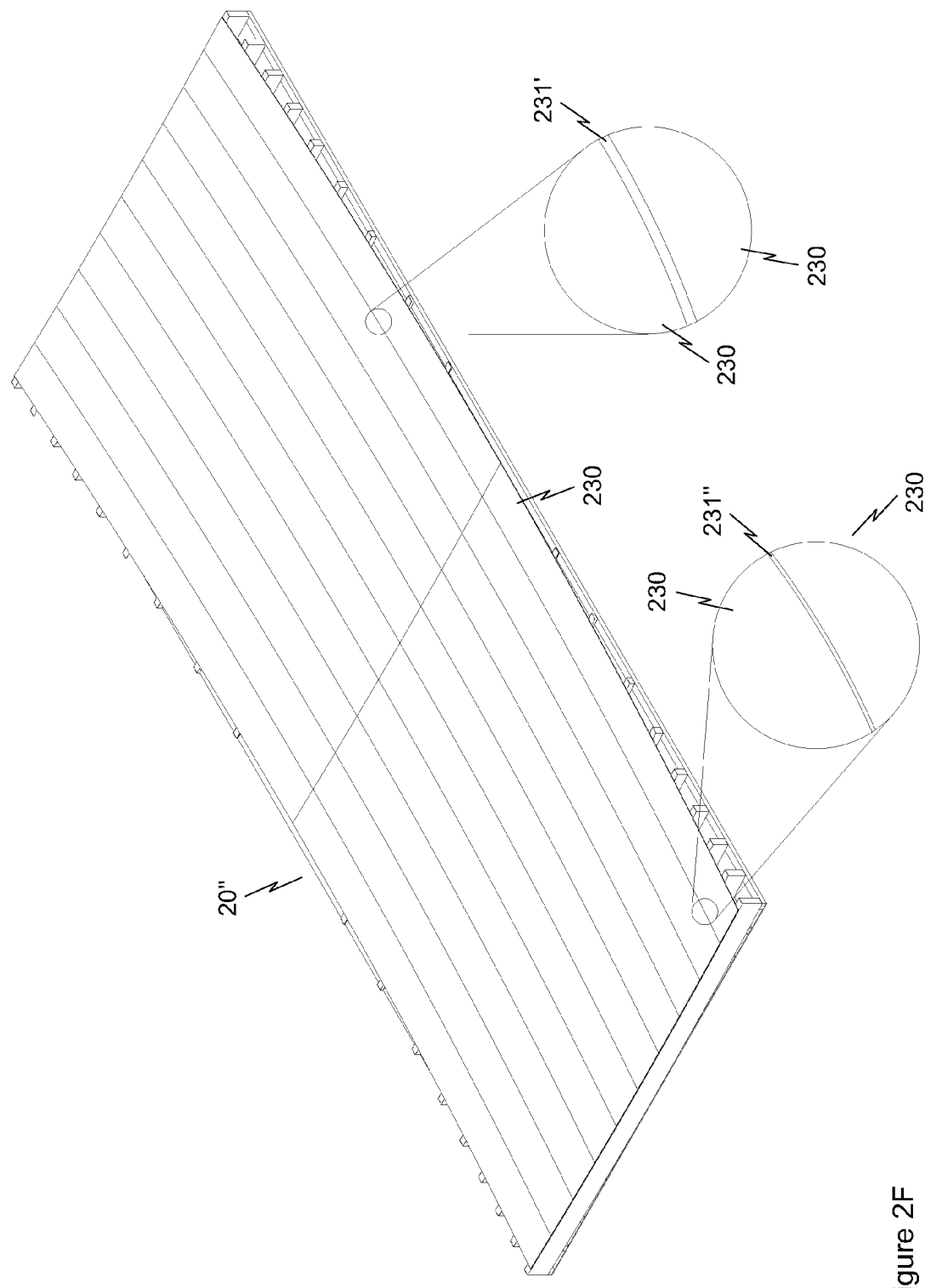
FIG. 2F is a depiction of the wood frame of FIG. 2E, covered with brass sheets, and showing details thereof.

As shown in FIG. 2F, narrow strips 230 of brass mirror parallel to the first layer of boards can be held against these inside edges to form a mirror 20". Unless creased, a sheet of brass 230 will bend in only one direction at once and will also form a spline, and hence only a sparse lattice of stacks of boards in the second direction is necessary for the final mirror surface to form an excellent approximation of a rectangular section of a paraboloid of revolution. For reasonable thicknesses of brass the approximation is near-perfect along the length of the strips of mirror 230, but since each brass strip only bends in that direction, the accuracy of the mirror surface in the other dimension is limited by the width of the mirror strips 230. This extends the size of the focus by the width of the strips, in the direction of the width of the strips.

Because of the curvature of the paraboloid in the strip-width dimension, straight strips 230 perpendicular to this will either have gaps 231' between their middles (that are bigger than any gaps 231" at their ends), or will overlap at their ends. Because overlaps could introduce slope errors, gaps are preferred. Another choice is to use strips that are wider in the middle and tapered toward their ends, but straight cuts are easier to make, and the slight loss of fill factor due to the gaps is insignificant if either dimension of mirror 20" is much shorter than the focal length of mirror 20".

Figure 2G:
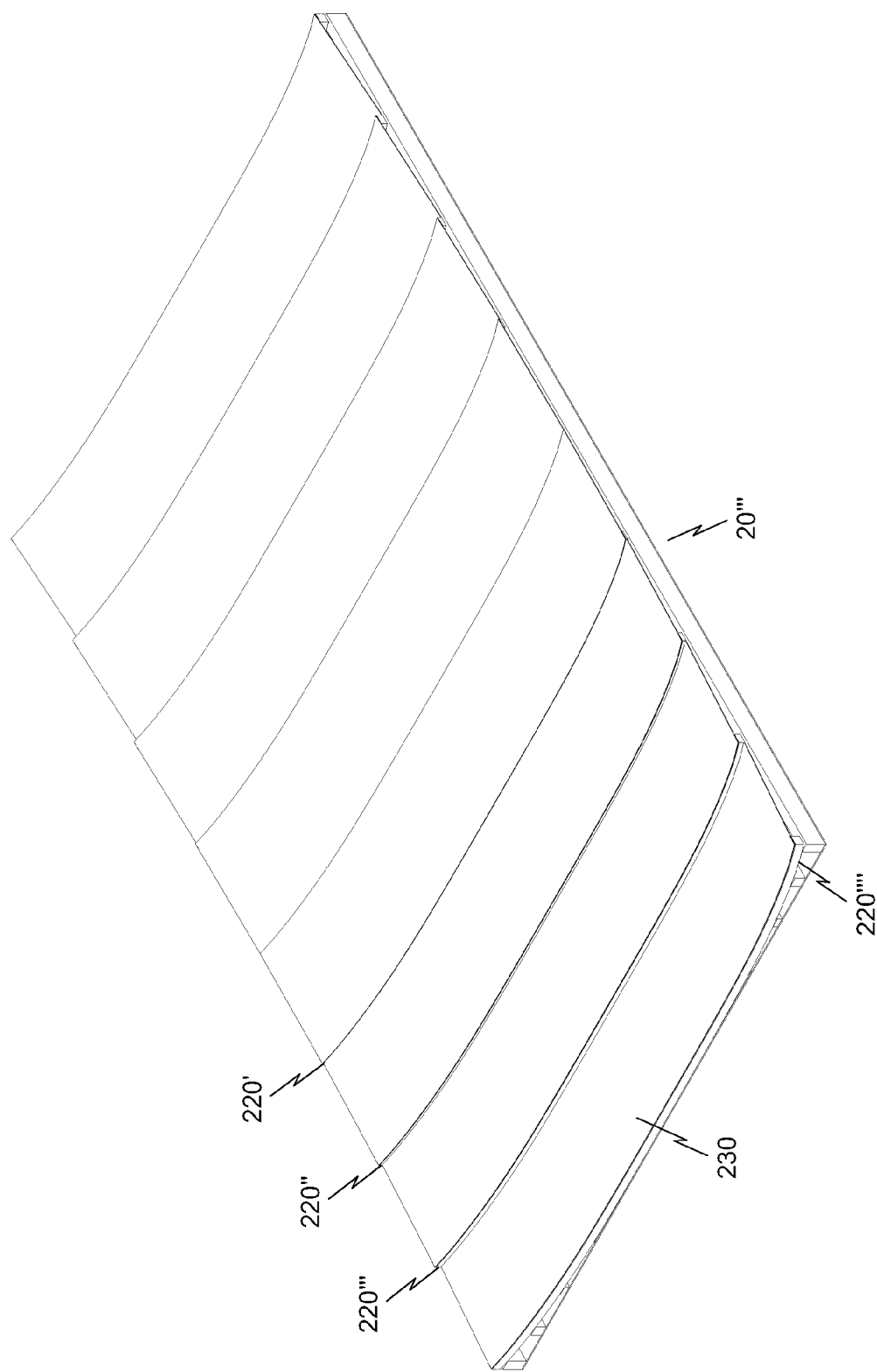
FIG. 2G is a depiction of an alternate wood frame and brass sheet paraboloid of revolution that could have been built using materials known to have been available in the time of Archimedes.

As shown in FIG. 2G, a variation of the mirror-strips-and-identical-boards format is to place the first direction of boards in stacks of heights that match a parabola, as taught above, and then to use a Fresnel-mirror arrangement for the second direction of boards. If stacks 220', 220", 220''', 220'''', etc. are equally spaced in this second direction, they require only 1, 3, 5, 7, 9, etc. boards of thickness instead of 1, 4, 9, 16, 25, etc. boards of thickness respectively. The mirror strips 230 would then run along the length of the second direction of boards rather than across it. This is not quite as efficient as using parabolic stack heights in both directions, due to the wall supporting one mirror strip blocking some light from its outer neighbor, but for relatively long focal lengths this difference is very slight and the frame uses significantly fewer boards. If the overall mirror apertures are long rectangles rather than squares, using the Fresnel pattern along the longer direction greatly reduces the number of boards, as well as the thickness of the resulting mirror 20'''. This semi-Fresnel arrangement represents an even further preferred embodiment of the present invention. This would have been the most efficient arrangement for Archimedes to have used, but it is not known if Archimedes knew of the Fresnel mirror arrangement, whereas a parabola being the proper curve to focus light is documented to have been known to Greek mathematicians even before Archimedes' time.

Figure 3A:
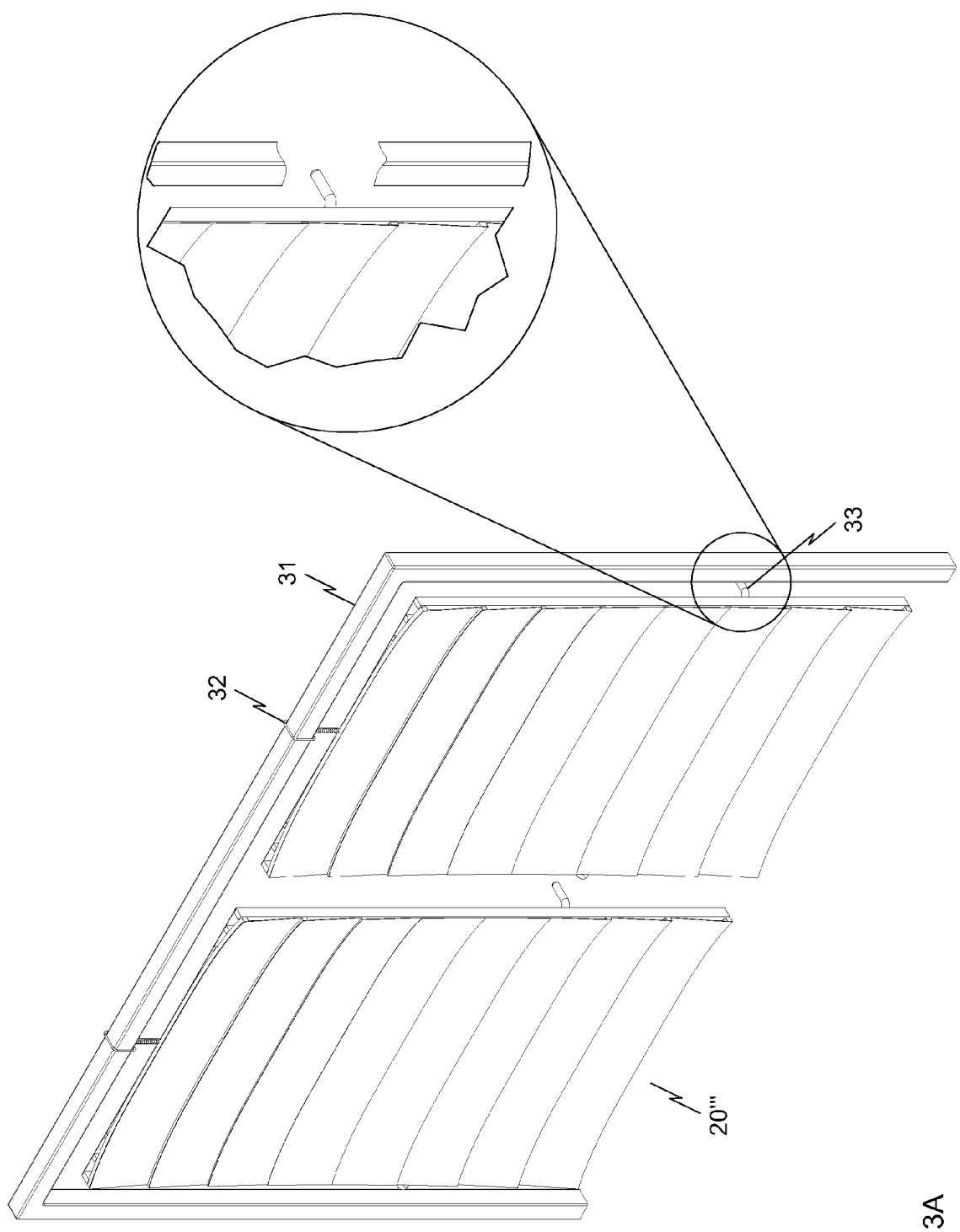
FIG. 3A is a depiction of a mounting system for a mirror that allows easy manual steering of the mirror.

To ignite a ship at a bowshot distance, however, a very large area is needed, and the amount of wood used to shape the parabola grows with the square of the area in such a design. To obtain the large area needed, it is thus better to use numerous moderate-sized sections. Each of these sections could be suspended to allow it to be aimed at a ship, and to maximize the area from a row, each section would ideally be as tall as practicable and of a width convenient for handling. If suspended from a crossbar 31 by a rope 32 and having a handle 33 on each side, as shown in FIG. 3A, two soldiers could easily steer a mirror roughly 5 meters (10 cubits or 16 feet) tall by 2.5 meters (5 cubits or 8 feet) wide. If 15-centimeter brass strips were used for the mirrors, the focal spot at a bowshot would be about 50 cm by 65 cm (1 cubit by 1.3 cubits), and around 150 square meters (about 600 square cubits) of mirror would be needed to achieve a 300-suns concentration at the focus. Since each mirror would be around 12.5 square meters (50 square cubits), this would take around a dozen mirrors all concentrating on the same spot.

Figure 3B:
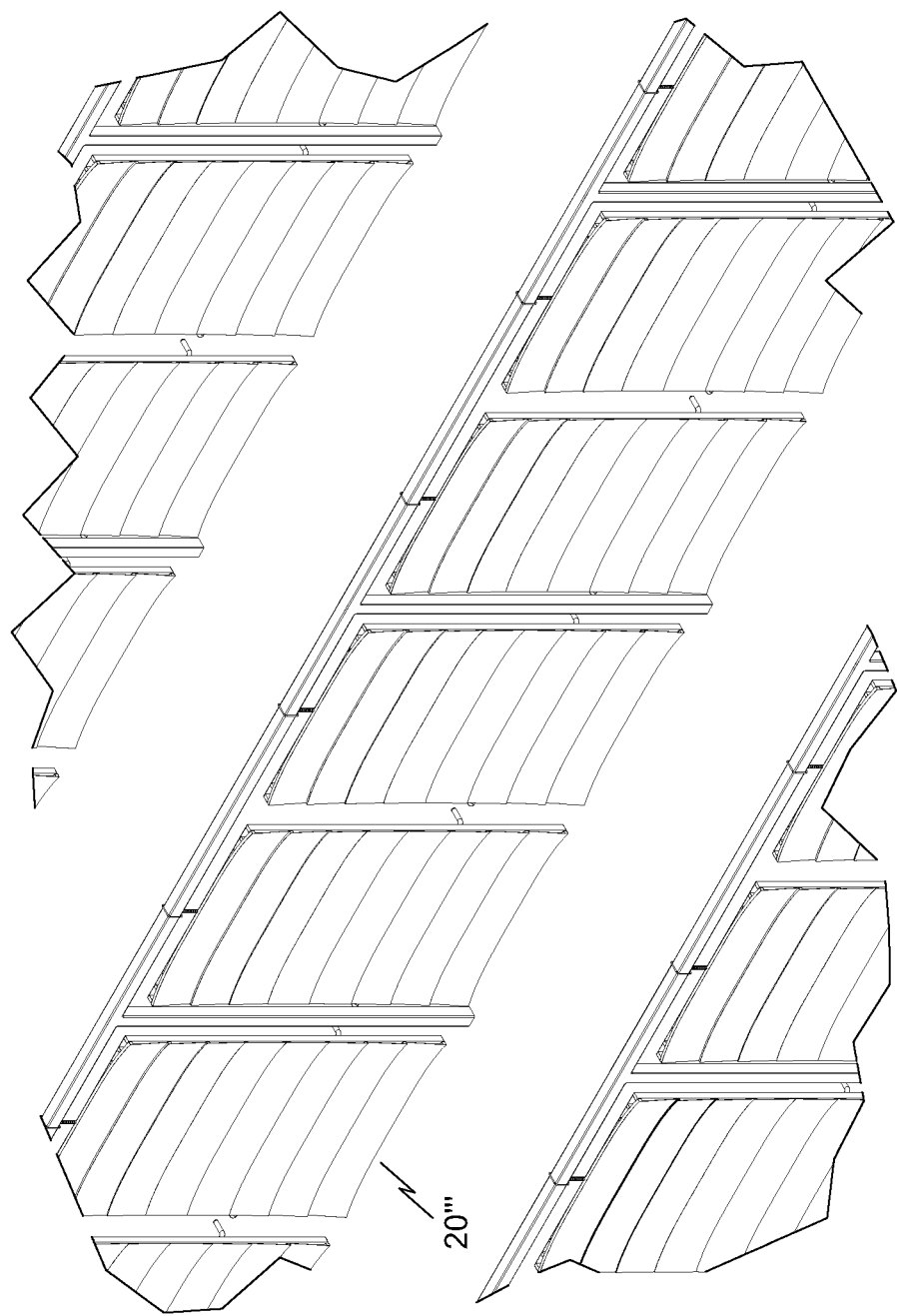
FIG. 3B is a depiction of an array of parabolic mirrors mounted in an easily steerable manner.

While a system of only 300 suns (almost as intense as my partial-vacuum Mylar mirror that lit a paper towel dropped through the focus) could light dry paper in a few seconds, wood is more challenging and so 300 suns might take minutes to set it on fire. A 1000-sun-concentration from about forty large mirrors 20''' acting in concert, such as is shown in FIG. 3B, would be far more effective, igniting a ship in seconds, cooking key personnel like the helmsman, blinding archers and other soldiers, all probably in less than a minute, and then moving on to the next ship. A 1000-suns focus could even melt the bronze off a shield in seconds, ensuring that a wall of Roman shields could be rapidly breached. Although fires would only burn slowly on the sides or deck of a wooden ship, any superstructure would burn readily, and any soldiers putting out the fires would be easy marks for the next pass with the mirrors. Forty 2.5-meter wide mirrors with room to maneuver them would take too much horizontal distance, however, so a 1000-suns mirror array would best be implemented either with even taller mirrors or with three or four rows of mirrors on a steep slope.

A further preferred embodiment of the present invention therefore uses a mirror frame built from boards or other thin strips of material, with the boards or stacks of boards in a first direction having coplanar backs and with the stack height and positions matched so that the front-inside edges of the stacks form a parabolic trough; with stacks of boards or other thin material in a second direction orthogonal to the first direction, where the backs of the stacks of boards in the second direction are bent to conform to the parabola defined by the edges of the first set of stacks and the stack heights also match a parabola so that their inside edges define a paraboloid of rotation; with a set of reflective strips of stiff but bendable material affixed to the second set of stacks, so that the combined reflective surface closely approximates a paraboloid of revolution or a semi-Fresnel paraboloid.

Figure 3C:
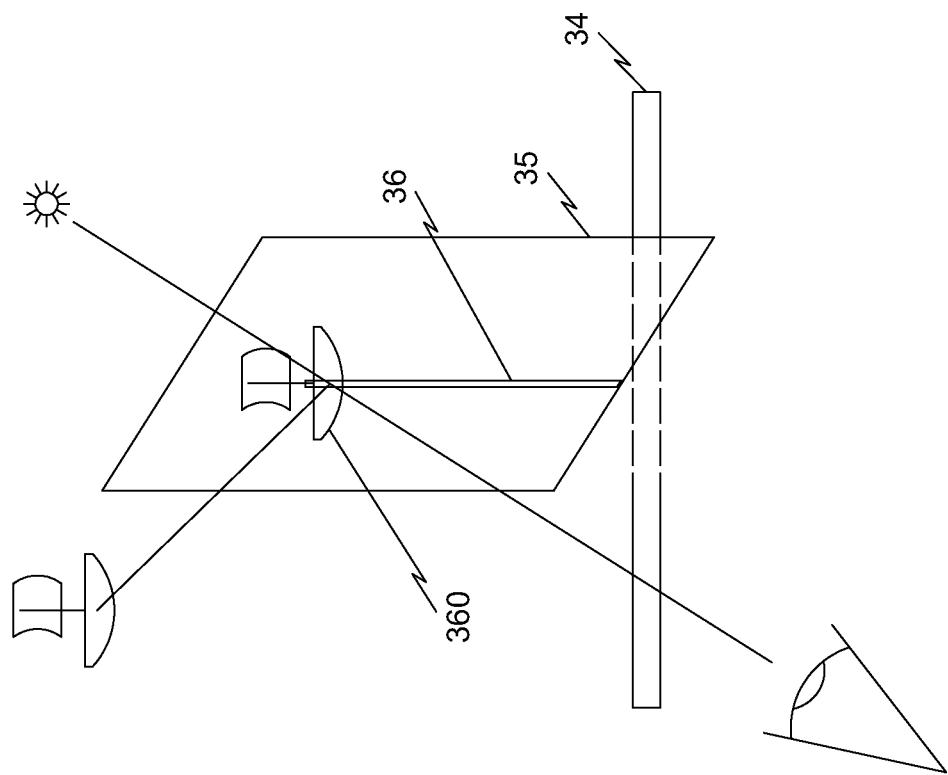
FIG. 3C is a depiction of a targeting means for rapidly aligning the focus of a parabolic mirror of an array of parabolic mirrors onto a moving target.

Concentrating multiple mirrors on the same spot on a moving target means being able to aim those mirrors quickly and easily. To avoid having to expose oneself to arrows, this would best be done through a small hole in each mirror. While this could probably be done simply by turning each mirror and watching its beam sweep onto the target, it is better to have a targeting mechanism to aid alignment. One way to accomplish this, as shown in FIG. 3C, is to cut a perpendicular narrow slit into each main mirror at eye height (or simply leave a space between metal sheets 230 as each mirror is being assembled). For each slit 34, a targeting mirror 35 would be affixed perpendicular to the main mirror at the center of the slit, with the targeting mirror having a very narrow slit 36 in it that is perpendicular to the mirror surface on both axes. By looking through a slit 34 and aligning the reflection of the target in targeting mirror 35 with the sunlight through the very narrow slit 36 in that targeting mirror 35, the main mirror 20" will be oriented to direct its sunlight onto the target. Steering such a mirror 20" would ideally involve three people, with one person on each side of the main mirror holding on to a sturdy handle, and following instructions from the third person, who would be using the targeting mirrors and commanding "left forward" or "right forward" to get the horizontal direction right, and then "both forward" or "both back" to get the elevation right. All three soldiers would be protected behind the mirror, using it as a shield even while steering it, and with the construction being brass on a wood frame somewhat like an over-grown traditional shield, it is easy to see how the purported descriptions such as "the soldiers polished their shields to a mirror surface and then used their shields to reflect the sun to set the Roman ships on fire at a bowshot distance" would arise. An exemplary embodiment of the present invention therefore combines a mirror such as 20" or 20''' as discussed earlier with a targeting device that allows a marksman to line up a reflection of the target in a targeting mirror with sunlight shining through a small hole or slit in the targeting mirror.

In addition to the value of paraboloid mirrors 20" and 20''' that are suitable for setting ships on fire at a bowshot distance in establishing the probable veracity of the legends of Archimedes' feat, and thus informing studies of ancient history, these designs provide a high concentration mirror 20' (as detailed in FIG. 2D) and very high concentration mirrors 20" and 20''' (as detailed in FIGS. 2F and 2G) that can be built from extremely simple materials available today in the Third World. Stacks of identical boards 210', etc., and 220', etc., could be lashed to a sturdy wooden frame, and then strips of any moderately rigid reflective material 230 could be lashed on as well, with each given lashing tightened until the back of the reflective material touches the inside edge of a given stack of boards. It would even be possible to use branches instead of boards, shaving branches to constant thickness and moving them to where their height is correct, instead of simply counting boards. The strips of reflective material could be solar glass mirror (weatherproof mirror on low-iron glass), ordinary mirror glass, mirrorized plastic, or sheet metal (even an old steel drum could be cut into strips and polished); while with some of these materials the collector would have to be protected from rain, with one or a few such collectors for a Third World village and the rarity of rain in many such areas, taking down a collector or covering one with a tarp would be easy to arrange.

A modest 2-meter by 2-meter mirror 20" or 20''' built with polished oil-drum-sheet would take only four steel drums, and even at a relatively poor 50% specular reflectivity, this would focus two kilowatts of energy onto a compact target. Two kilowatts is more than a typical stove burner set on high, so such a mirror would clearly be adequate for cooking, and could be shared among a number of families. One can picture a row of half a dozen pots and a person who sweeps the mirror back and forth from one pot to another (since many people in high-sun areas spend up to a quarter of their waking hours gathering firewood, causing increased desertification in the process, even such a seemingly minor use of solar energy can make a huge difference). Or, aimed on a set of low-cost crystalline silicon photovoltaic cells, such a system would generate 300 to 500 watts. While this is not even enough to run a toaster, in the Third World this plus an old car battery would be enough for perhaps a dozen families to have light for their children to do homework at night after the chores are done.

If smooth boards or other strips are available, another Third World variant that is low cost, although lower in efficiency, is to invert the relative heights of the strips in parabolic stacks so that the tallest stacks are in the middle, with the heights decreasing instead of increasing by the amounts described above. A thin sheet of Mylar or other inexpensive reflective plastic stretched across the stacks then achieves an approximate paraboloid. But while this has comparable cost to a partial-vacuum shaped mirror, it is no more durable and the strips block some of the light, making it less preferred in most cases.

Since cells under high concentration need cooling, if a cooking pot were made with a flat face covered with solar cells the 'waste' heat could be used for cooking. But the cells (or their glass cover) would be liable to be damaged while cleaning a cooking pot, so a much more practical use would be heating water with the waste heat from photovoltaic cells. The hot water could be used for cooking, washing, or to sterilize the water for drinking. While the efficiency of the cells would drop as the water got warmer, this 'co-generation' of electricity plus hot water would be well worthwhile in many high-sun Third World locations. While today's silicon cells can generally only handle temperatures of around 60 degrees Celsius, other solar cell materials can handle higher temperatures.

None of these uses requires the 500 suns to 1000 suns concentration that the design is capable of, this can be used to relax the tolerances for materials and assembly, allowing the use of, for example, wider sheets of less reflective material (such as strips from reclaimed steel drums), or branches instead of identical boards. But the very high concentration is easy enough to obtain, and it may prove useful for such purposes as firing pottery or melting of metals (1000 suns concentration can even melt steel, for example).

Second Family of Preferred Embodiments: Improvements in Frames for Large-Tracker Solar Energy Systems with One or a Few Foci Per Tracker, Using Modern Materials and Manufacturing While the first family of embodiments is most applicable for the Third World, where it provides a very-high-concentration design that can be built from local and reclaimed materials, the First World as well has a need for low-cost high-concentration solar collectors. While in the Third World labor is inexpensive relative to materials, leading to solutions such as wood-and-lashing frames, in the First World labor is expensive and a metal frame producible by automated equipment would be much more suitable.

Most high-concentration systems in the First World use molded lenses or molded mirrors on a frame of trusses that are normal to the mirror surface, rather than parallel to the axis of symmetry as in the Archimedes-inspired design above. There are, however, exceptions in the modern prior art. For example in U.S. Pat. No. 2,987,961 Cotton et al. teach building a compound mirror of substantially square aperture by using a series of identical vertical frame members or ribs of appropriate curvature rigidly anchored to a lattice framework, with horizontal rails of identical curvature anchored to the vertical ribs, and with appropriately curved mirrors of identical construction anchored to the horizontal rails. Cotton discusses paraboloid mirrors being theoretically better than spherical mirrors due to even lower aberration, but Cotton's analysis shows that on a practical level the use of small spherically-curved mirrors on a spherically-curved frame of appropriate curvature caused no appreciable impairment of efficiency, and Cotton thus used spherical curves in the preferred embodiments because they allowed using identical rigid molded glass mirrors rather than rigid molded glass mirrors of non-identical parabolic curvature.

There are a number of disadvantages to Cotton: primarily the use of molded mirrors, the requirement of a complex support and fine-adjustment mechanism for supporting each of a large number of small mirrors, and Cotton requiring a movable second flat mirror (not shown) for re-directing the sunlight to be normal to the aperture of the fixed primary curved mirror. The modern prior art addresses these shortcomings; even earlier work, such as Olsen's U.S. Pat. No. 2,760,920 and Allingham's U.S. Pat. No. 514,669, use parabolic mirrors comprising small square planar facets and moving the faceted mirror to track the sun, and Girard in U.S. Pat. No. 4,395,581 teaches combining Olsen's fixed planar facets with Cotton's square aperture and rectilinear array of facets of a more practical facet size, specifically to achieve concentration sufficient for photovoltaic solar cells (although much lower concentration than Cotton's intense concentration for high-temperature solar thermal experiments), and mounting the whole faceted mirror on a tracking system as Olsen taught instead of using a separate movable mirror as Cotton did.

Other prior art close to the Archimedes-inspired design dates at least as far back as Carter, who in U.S. Pat. No. 811,274 teaches supporting long, narrow mirror segments directly on curved metal rails that are in planes parallel to the axis of symmetry, and that are in turn supported on curved metal ribs that are in orthogonal planes that are also parallel to the axis of symmetry. Although Carter's text describes the overall mirror surface as forming a section of a sphere, that a paraboloid is the ideal shape for focusing parallel rays to a point has been known since even before Archimedes' time, and in Carter's detailed drawings the overall surface is shown to be a paraboloid. The surface has less curvature farther from the center, which is characteristic of a paraboloid, rather than the constant curvature that would be found in a spherical section. Radar dishes used at some airports (such as Glasgow in Scotland) also have frames comprising several ribs whose planes of curvature are substantially parallel to the axis of symmetry of the dish crossed by several rails whose planes of curvature are also substantially parallel to the axis of symmetry of the dish, and the shapes for focusing radio waves, light and even sound are substantially interchangeable.

Continuing in this vein is Doug Wood, who teaches in U.S. Pat. No. 4,372,772 that sufficiently thin flat glass mirrors can be pulled against a metal frame to bend them into a curved shape appropriate for focusing sunlight, and who then in U.S. Pat. No. 6,485,152, teaches that long, narrow strips of sufficiently thin flat glass mirror can be shaped in-situ into a good approximation of parabolas by holding them directly against a parabolically-curved metal frame consisting of orthogonal trusses in planes parallel to the axis of symmetry. This forces the mirrors, except near their ends and corners, to assume an extremely good approximation of the appropriate curvature, allowing identical long thin flat glass mirrors to be used to produce a compound mirror capable of very high concentration.

Wood also includes identical curved ribs and identical curved rails as Cotton teaches, and extends this with a cleverly devised lattice frame that bends the ribs and rails that form the top of the lattice in each direction to the right shape merely by aligning identical webbing and posts with pre-drilled holes. Although the metal lattice frame would not have been practicable in Archimedes' time and would be hard to make accurately entirely from hand-producible and reclaimed materials, this design requires only simple stock materials such as straight metal tubing, and it ingeniously allows a complex lattice of curved parabolic trusses to be formed solely by the accurate fastening of three types of identical parts, and it is thus well within the capability of a Third-World country to produce in mass quantity. Wood's lattice framework is also very economical in its use of metal, and it scales well to solar collector sizes from a few meters to a few tens of meters (whereas the Archimedes-inspired identical wooden boards design for achieving the right curvature reaches limitations above about 16 feet (5 meters).

However, the space frame taught by Wood in U.S. Pat. No. 6,485,152 involves field assembly of a large number of parts, making it labor-intensive. Also, although the use of parabolically curved trusses allows any width mirrors to be used (although wider mirrors relative to the aperture reduce the concentration at the focus, and wider mirrors shaped by curved trusses also increase corner losses), the curved trusses restrict the rim angle of the parabola, which further restricts the maximum concentration for a given number of mirrors when no secondary concentrator is used. Although the supports are aligned in planes parallel to the axis of symmetry, the mirrors are not so aligned because they must lie on the paraboloid surface to be effective. At large angles this causes appreciable lateral displacement as the ends start to wrap around the axis of symmetry, and since the lateral displacement brings the mirror ends onto areas of different slope, this twists the mirror; glass can only bend easily in one direction at any point, so this twist straightens out the needed lengthwise bend of the mirror at the corners. While this twist can be reduced with shorter mirrors as well as a smaller rim angle, shorter mirrors would increase the percentage of the mirror surface near the ends of mirror segments, and without bent mirror beyond its last rail, the end of a mirror adopts a different curvature and thus does not contribute to the focus. Wood explicitly uses very long mirrors to reduce these losses to a still-high 8% of the total mirror area.

Wood's use of exceptionally long glass mirrors to minimize hyperbolic corner and end losses is also problematic in that such long mirrors are hard to come by (a major U.S. solar mirror maker Naugatuck only produces mirrors half as long as Wood's preferred embodiments call for), and such long mirrors break easily. Furthermore, the use of in-situ-flexed glass mirrors sets a floor on how thin the glass mirrors can be (relative to the frame spacing) due to the unsupported spans. The thicker glass mirrors required are more costly, heavier and less reflective. With the back of the mirrors exposed to the elements, the mirrors need special coatings; not only do such coatings add cost, but the high-lead paints that have been field-proven are now becoming environmentally unacceptable. In order to keep the concentration uniform on the whole receiver, Wood also does not utilize the less intense edges of the focal spot, further lowering the optical efficiency.

The above curved-rail shortcoming of Wood also applies to the wood-frame Archimedes-inspired design, and even to Carter's design in U.S. Pat. No. 811,274 as well. But even beyond these drawbacks, Wood's design also suffers from high sensitivity to imperfections from manufacturing or from wear and tear in the field because the position of the rails determines the curvature of the mirror, and this is the most critical factor in achieving a very high concentration. If, for example, a rail is even ½ millimeter too high, the depth of the roughly 1-meter span between its neighbors is reduced by around 5% from its target of around 10 mm. This increases the focal length by 2.5%, or 100 mm, which increases the width of the focus by about 15 mm in the sensitive direction. Since Wood only focuses about 11× in the less sensitive direction, Wood needs to focus 90× in the sensitive direction to reach 1000× focusing, which implies a focus of only 40 mm wide for Wood's 12-foot (3.6 meter) dish. This 15 mm increase in focal width thus causes a loss of around 30% of the light from a region with only a half-millimeter error in the height of a rail. And this sub-millimeter sensitivity to the height of each rail would grow even more sensitive at flatter rim angles, restricting Wood's design to rim angles between where hyperbolic losses are too big and where sensitivity to fractions of a millimeter errors in rail height cause too much loss. In the third world labor costs would allow shimming mirrors by hand to counteract errors in rail heights, and a precious mirror could be moved between protective walls whenever winds threatened to flex the frame enough to skew the alignment or wear the alignment holes. However in the first world where massive numbers of such mirrors would be needed to support our energy-intensive life-style, this would be far from optimal.

Figure 4A:
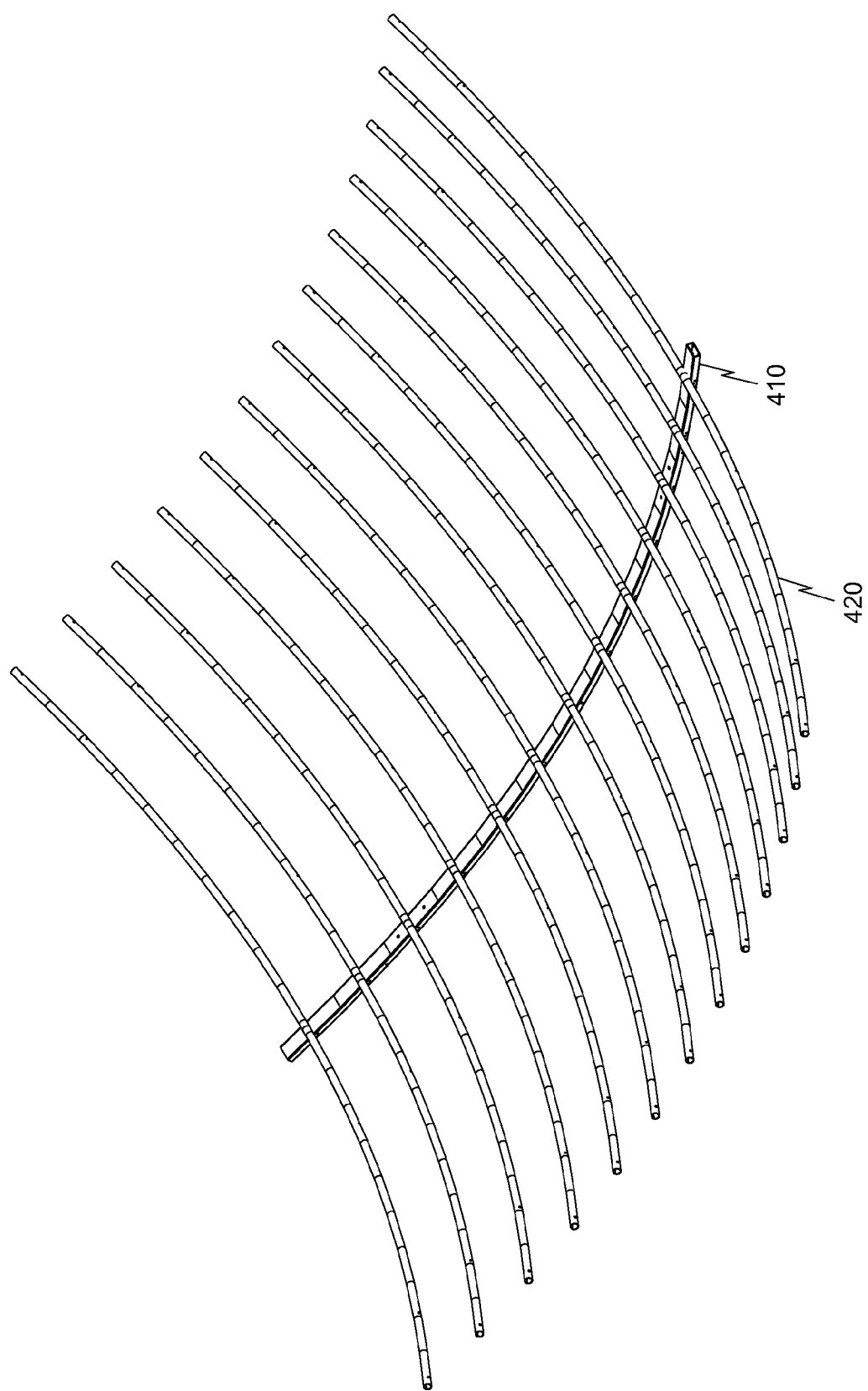
FIG. 4A is a depiction of a one-rib frame for a parabolic mirror, based on the principle of adding parabolic functions but using modern structural steel members.

There is a thus need for a design that capitalizes on modern materials and manufacturing techniques to overcome all of these drawbacks of the above prior art. In the Archimedes-inspired design the inside top edges of the top boards are the equivalent of the rails of Carter, and while Carter supports these on relatively simple curved orthogonal ribs, these ribs in turn need a complex support structure. The board-edges and rails are also equivalent to the tops of Wood's trusses (with all being appropriately curved to hold long narrow mirrors directly on them to produce the final mirror surface), but Wood uses complex and labor-intensive interwoven trusses to support these 'rails' in the correct position. If the rails have closely enough spaced supports, as in Carter and Cotton, then they do not need a lattice truss to keep them bent in the correct shape, and the stiffer the material from which they are made, the farther apart the supports can be. Plain steel tubing provides a very strong and inexpensive material that can be bent accurately in a factory to the desired shape, minimizing the number of supports needed; in fact as shown in FIG. 4A, steel rails 420 sufficiently thick (relative to their length) would need no support at all other than positioning at their middles by a single rib 410.

Figure 4B:
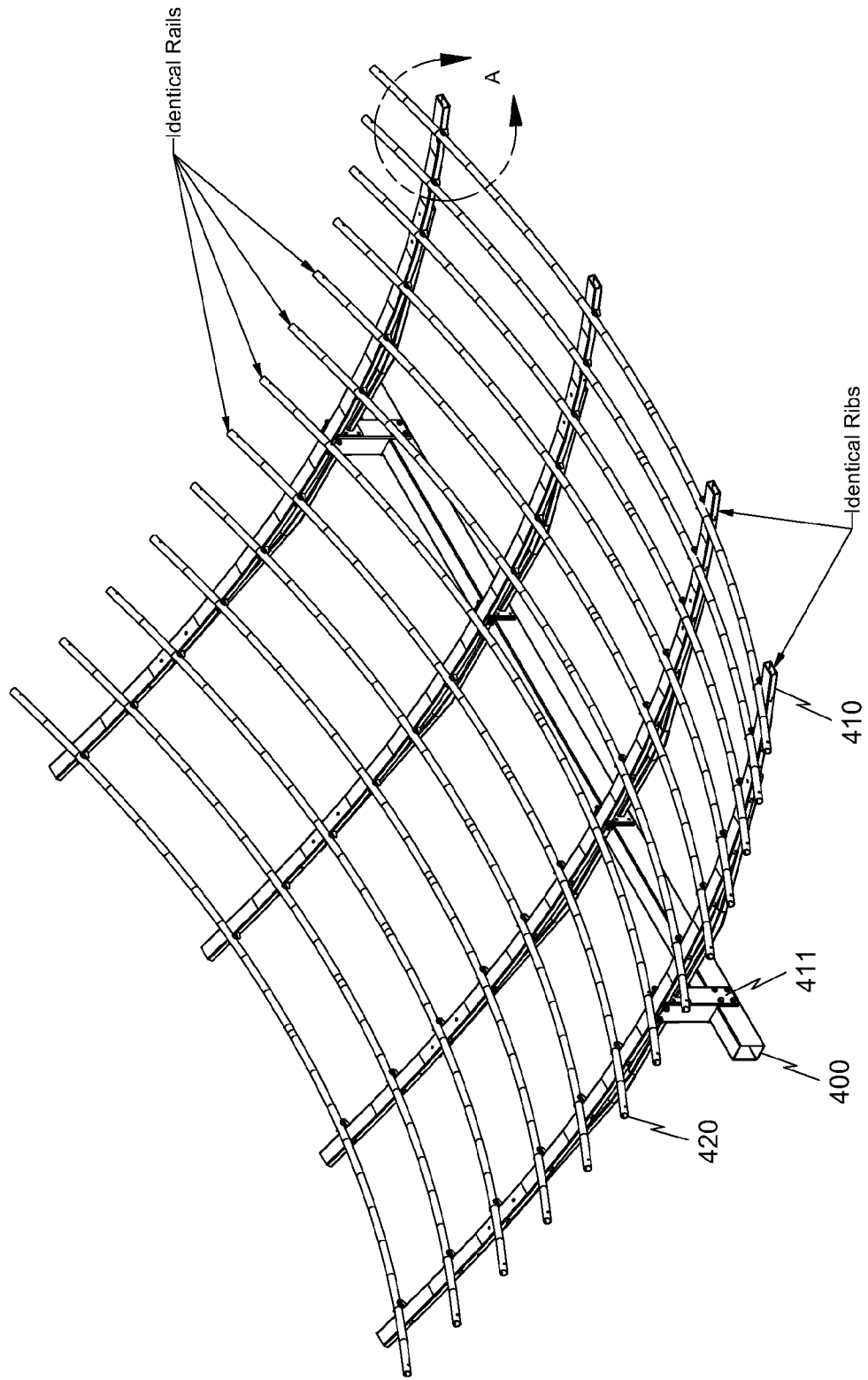
FIG. 4B is a depiction of a four-rib frame for a parabolic mirror, based on the principle of adding parabolic functions but using modern structural steel members.

But even at the low cost of steel, having sufficiently thick rails in sufficient number to support the mirrors without significant deflection on windy days would be too expensive to be optimal. If the rails 420 that support the mirrors are in turn supported by several ribs 410, then the more numerous rails 420 can be of lighter gauge tubing while the less numerous ribs 420 can be of heavier construction. However as shown in FIG. 4B, the ribs 410 themselves then need to be supported in the right positions. Some commercial trackers drive a central beam 400 from which the entire tracker payload is supported; in this case supporting the ribs 410 at the right position can be combined with attaching them to the main beam 400 through posts 411. The attachment of rails to ribs labeled 'Detail A' of FIG. 4B will be shown in FIG. 4H, and will be expounded upon in the discussion of FIG. 4H.

Because of the curvature of the frame and mirrors adding to its height, this results in a payload whose center of gravity and center of wind loading are both significantly above the main beam. While this is not material for ground-level trackers such as taught by Allingham and Carter, for the currently common pole-top trackers, such as the DEGERtracker 7000NT, it adds static and wind-loading stresses on the tracker's driving mechanisms and pivots. When designing a custom mounting for a pole-top tracker that does not come pre-equipped with a single main beam, it is therefore preferred to have mounting means that keep both the center of mass and the center of wind loading balanced on a tracker's pivoting mechanisms. For a circular paraboloid of rotation, the position of the center of mass is easy to approximate because if a circular paraboloid of modest rim angle is sliced by evenly spaced planes perpendicular to its axis of symmetry, each slice has essentially the same area. This is because for a slice N times as far from the axis of symmetry, a slice has twice the circumference but only half the width because the slope of the parabola is twice as great (in a paraboloid the slope is proportional to the distance from the axis of symmetry). For large rim angles the outer slices do gain area because the distance between the planes becomes significant compared to the horizontal width of the slice, but this is a cosine factor and hence even for the maximum-focus rim angle of 22.5 degrees, the outer slice is a mere 1/cos(22.5) times the size, or 6% larger.

Thus for a paraboloid of small rim-angle, the center of mass (assume mirrors and supports of even mass per surface area) is where a plane with an equal number of evenly spaced slices above and below it intersects the axis of symmetry. Because a paraboloid's height grows with the square of the distance from the axis of symmetry, the half-height occurs at SQRT(0.5), or 70.7%, of the distance from the axis to the rim. A 22.5 degree rim angle adds approximately ¼ of 6% to the height needed, which adds ⅛ of 6% to the half-height horizontal distance, bringing the center of mass of a circular paraboloid to where a plane that intersects the paraboloid at approximately 72% of the horizontal distance to the rim intersects the axis of symmetry.

An even bigger correction, however, occurs for a square aperture paraboloid because the corners of the square curve up far beyond the center of the sides, with the corner tips being at twice the height of the middles of the sides. The corners narrow so rapidly, however, that the corner 'slice' nearest the middle of the sides adds the most, with the 'slice' at the very tips adding very little in spite of its height. The total area (corrected for the cosine factor) is just less than 30% of the area already balanced, with the bulk of that added near the edge of the circle already balanced. If it were all right at the edge, this would shift the balance height to 62% of the height of the middle of the edge; the corners' center of balance relative to this 62% height is roughly 20% farther out, pulling the balance height to approximately 65% of the height of the middle of the edge. Thus the horizontal distance to the balance height is approximately SQRT(0.65), or approximately 80 percent of horizontal distance from the axis of symmetry to the middle of the aperture rim.

While integration could work out the balance distance to any accuracy desired, factors such as the thickness of the ribs and rails and the exact placement of the ribs, and the mirror mass relative to the supporting frame mass would need to be accounted for. Also, wind loading is even more important than the structure mass unless exceptionally heavy construction is used, and while the forces of wind loading for wind perpendicular to the axis of symmetry (which is the most important direction for stresses on the tracker's driving mechanisms and pivots) have somewhat similar balancing to the mass, uneven gusts can be significant.

While the tracker could be programmed to simply not move during uneven gusts, ground effects on the wind can produce milder but sustained imbalances, which the tracking mechanism would have to track through to continue to collect sunlight. In particular, in a large field of trackers each track may significantly block the wind onto only part of a down-wind tracker, creating significant and persistent unbalanced wind loading.

Figure 4C:
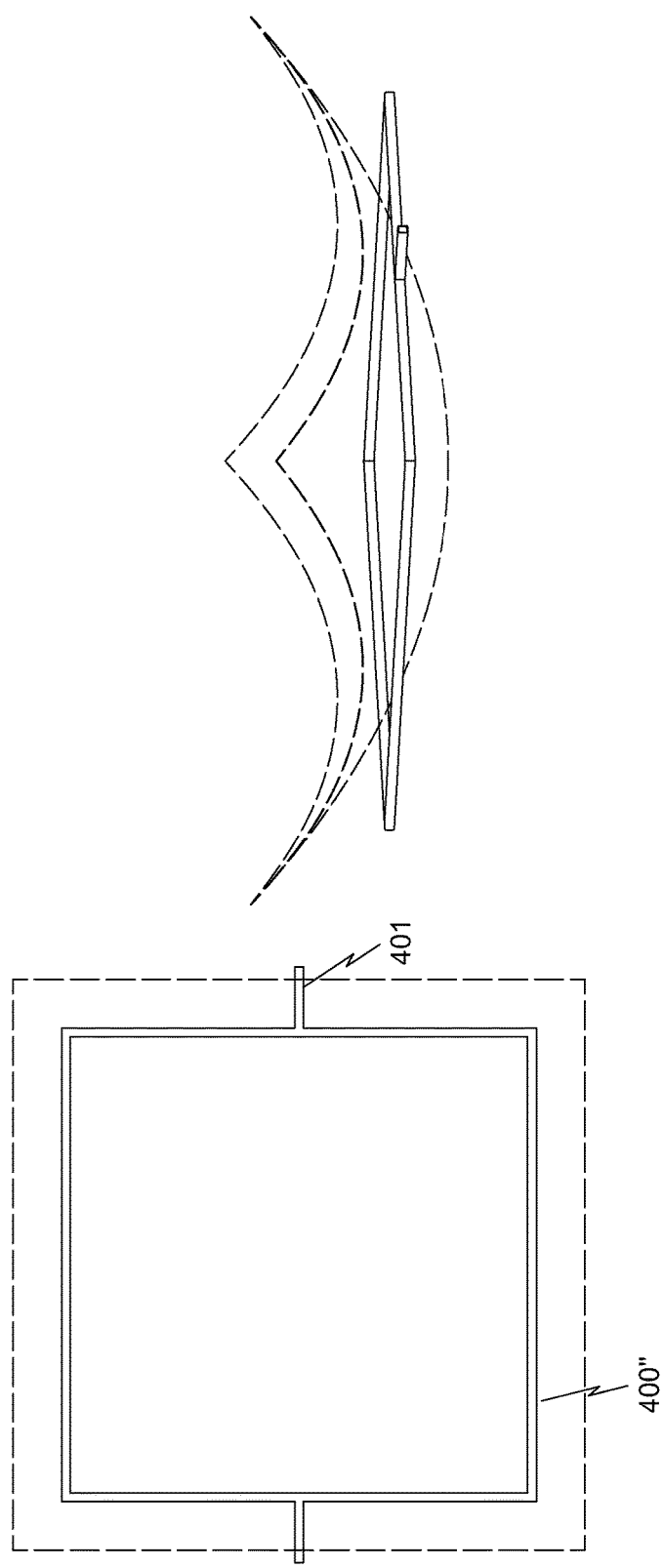
FIG. 4C is an illustration of the balancing point for a paraboloid of revolution in a balancing frame.

Thus the rule of thumb of 80% is as useful as an exact calculation. Applying this rule to a compound mirror five meters square, for example, if this mirror were set into a square frame 400' four meters (80% of 5 meters) on a side, as shown in FIG. 4C, then it would balance well on an axis 401 through opposite sides of the frame.

Figure 4D:
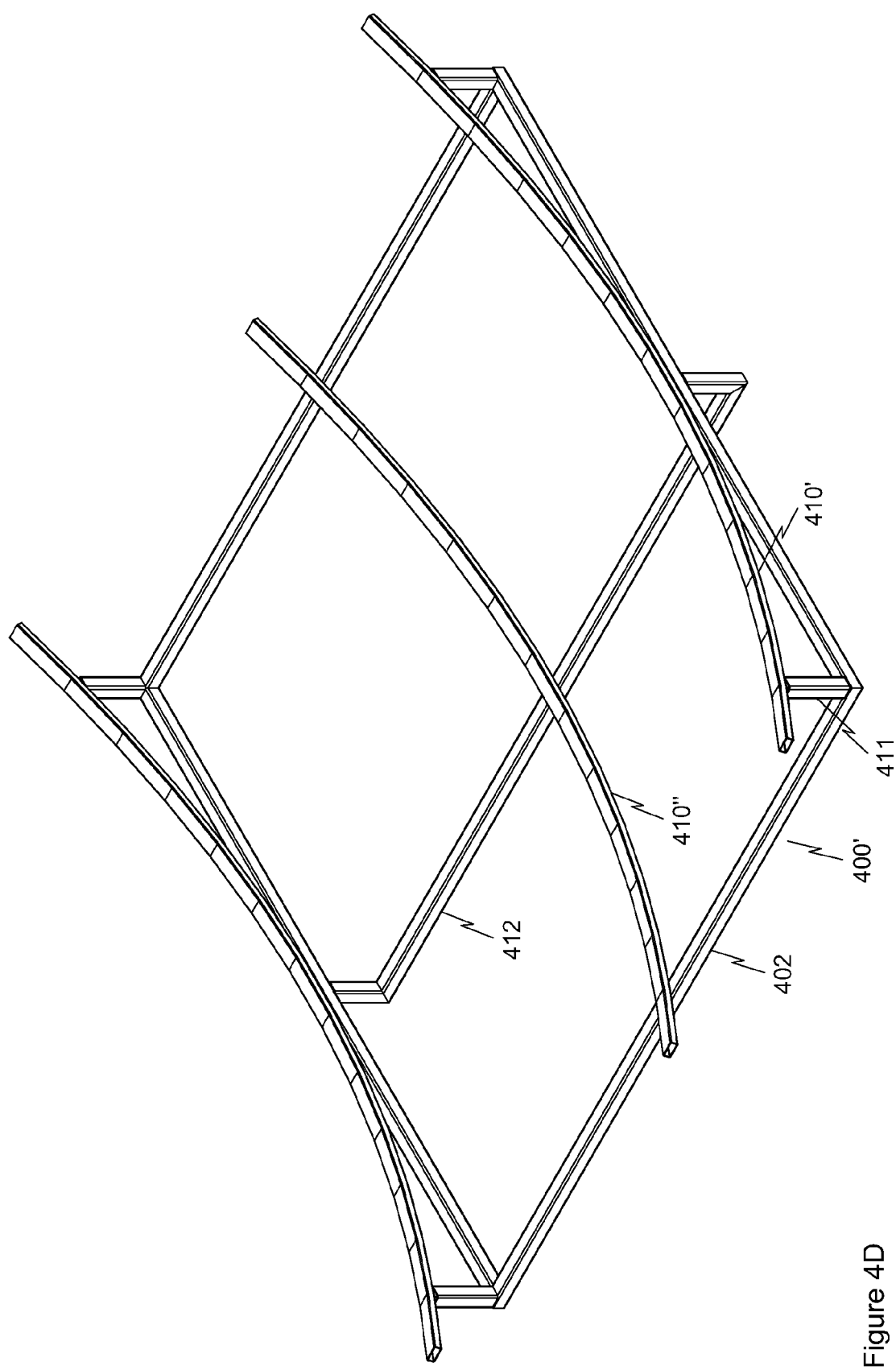
FIG. 4D is a depiction of a three-rib balancing frame for a parabolic mirror, based on the principle of adding parabolic functions but using modern structural steel members.

As shown in FIG. 4D, a suitable rib arrangement in a square frame 400' that is 80% as big on each side as the collector aperture is to use three ribs, one rib 410' above each of the frame beams in one direction, and one rib 410" in the middle of the frame. The ribs 410' above the sides can be supported in their middles by the beams 402 of frame 400' themselves, and near their ends by identical posts 411. Because the middle rib 410" intersects the frame in the middle of a side of the frame 400', it is automatically at the right height if it is attached directly to each of the two beams 402 where it crosses them. With three ribs thus placed, orthogonal rails for holding the mirrors will overhang one rib 410' by ½ meter, have a two-meter span to the next rib 410", and then a two-meter span to the other rib 410''' followed by a ½-meter overhang, which produces a reasonable balance of mechanical stresses. The end ribs 410' themselves are similarly supported at three points with the same spans, and the middle rib 410" can have its middle supported by brace 412 as shown.

Figure 4E:
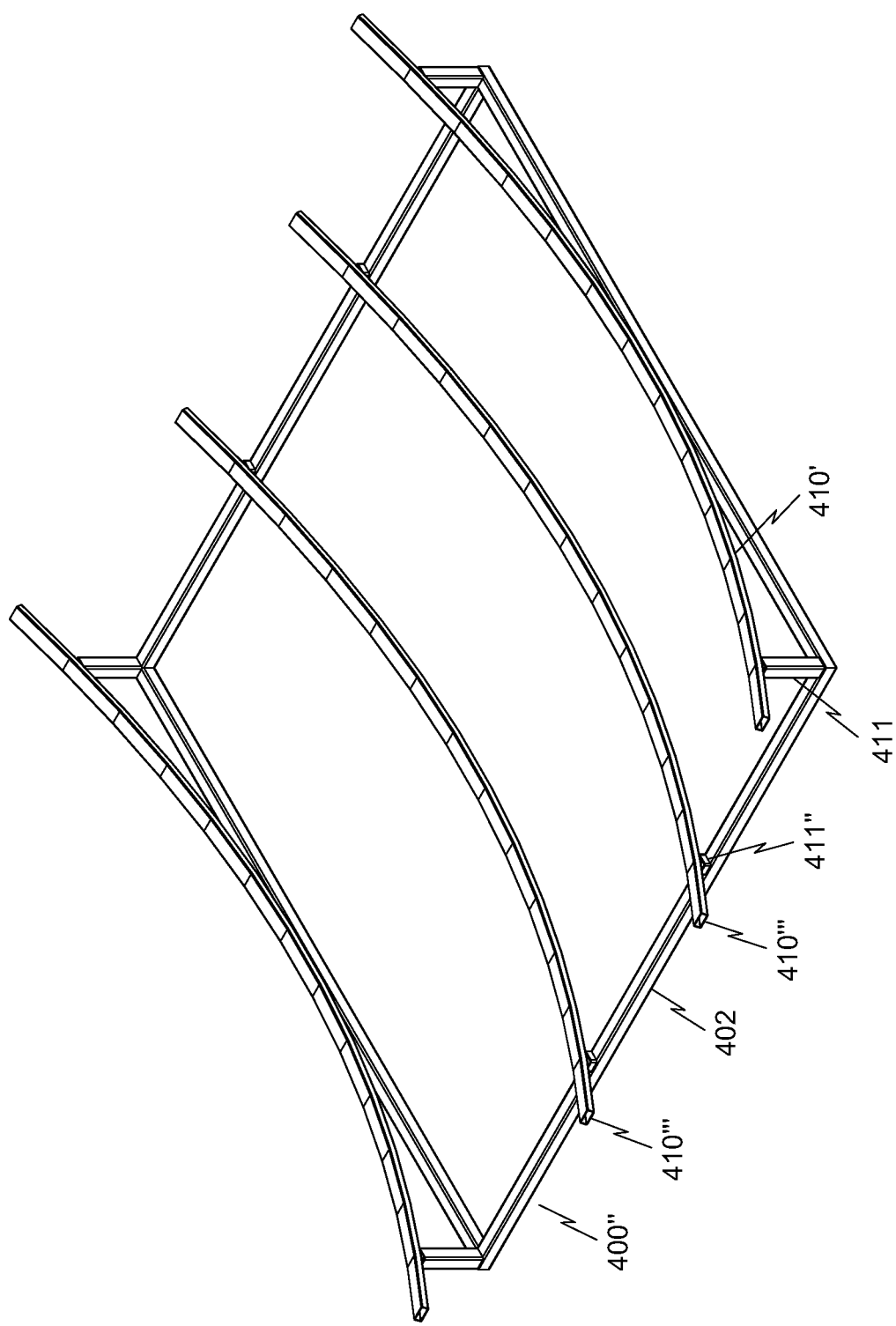
FIG. 4E is a depiction of a four-rib balancing frame for a parabolic mirror, based on the principle of adding parabolic functions but using modern structural steel members.

However to eliminate the need for extremely long and rigid mirrors, significantly more than three rails would be needed, and more rails also provide more attachment points, allowing multiple shorter (and thus easier to manufacture, transport and install) mirrors to be used for each mirror row. This pushes the balance toward more ribs so that the rails are supported more often and can be of lighter construction. A preferred rib arrangement for a square frame 80% as big on each side as the collector aperture is therefore to use four ribs, as shown in FIG. 4E, with one rib 410' above each of the frame beams in one direction, and with two ribs 410''' equally spaced between them. The ribs 410' above the sides can be supported in their middles by the frame beams 402 themselves, and near their ends by identical posts 411, just as with three ribs. The two in-between ribs are now offset from the middle of the side of the frame by one-third of four-fifths of the way to the edge of the aperture, or ⁴⁄₁₅ of the way. Thus the height at which they pass over the frame near their ends must be ⁴⁄₁₅ squared or ¹⁶⁄₂₂₅ or 7.1% of the height of the middle of the edge of the mirror, which for a 5-meter aperture with a 22.5 degree rim angle is roughly half a meter, making the height above the frame roughly 3.5 centimeters. Thus these ribs 410''' can be supported by 3.5-centimeter posts 411'. (It should be noted that ribs 410', 410'' and 410''' of FIGS. 4D and 4E are in general identical, and are distinguished only by their positions and how they are mounted.)

Figure 4F:
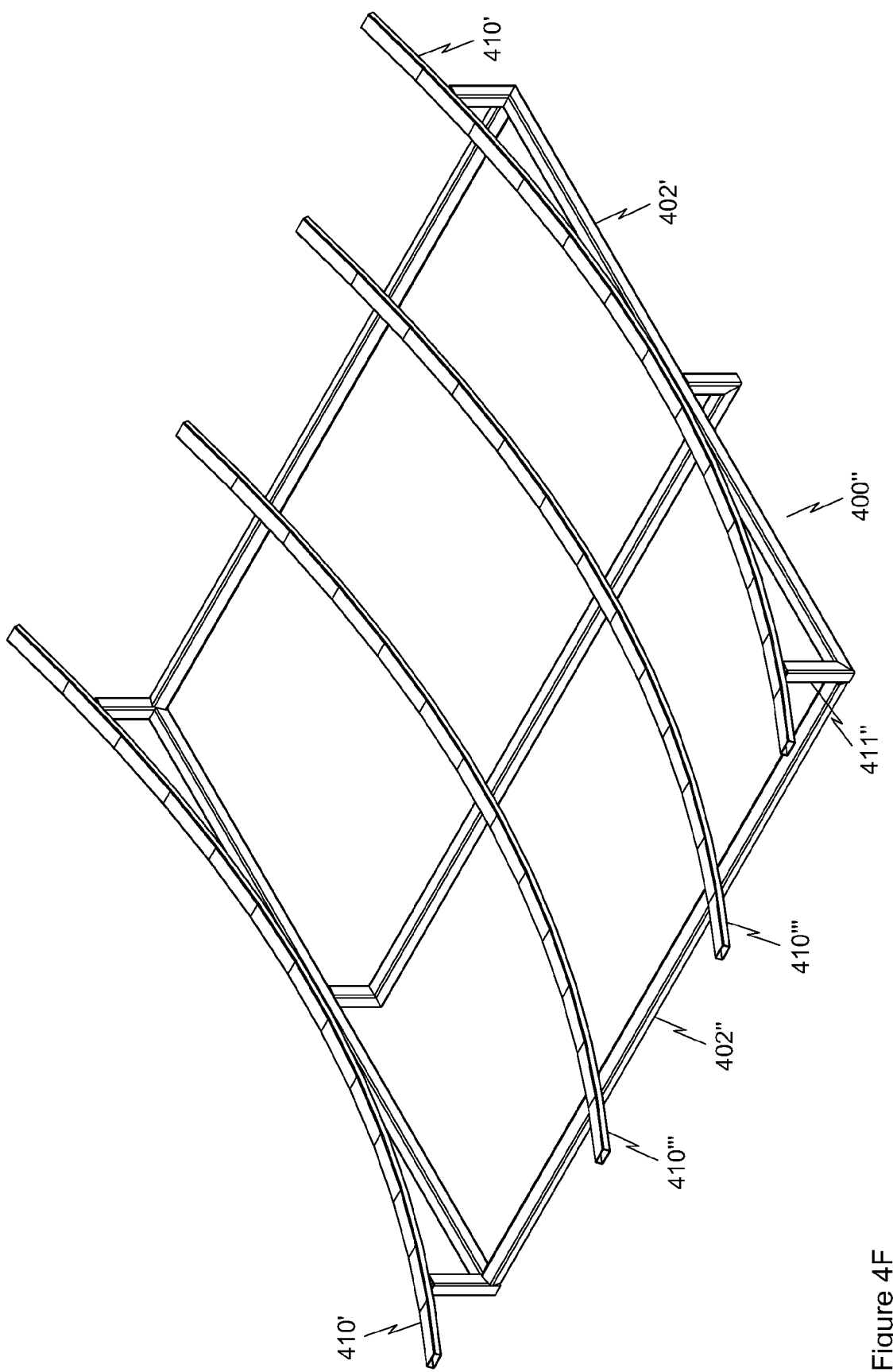
FIG. 4F is a depiction of a simplified four-rib balancing frame for a parabolic mirror, based on the principle of adding parabolic functions but using modern structural steel members.

Rather than use 3.5-centimeter posts, the frame can be made slightly off-square. As shown in FIG. 4F, since the angle of the ribs 410''' where they cross the frame is roughly 18 degrees, pulling each frame beam in that direction by 3.5 cm divided by the sine of 18 degrees, or 12 cm, to produce frame 400'' will eliminate the need for 3.5 centimeter posts 411' entirely (this also shortens the corner post 411 height by the same 3.5 cm). While the end ribs 410' and frame beams 402' can use simple straight bolt holes drilled through them perpendicular to their metal faces, the in-between ribs intersect the frame at roughly 17 degrees (down from 18 degrees due to pulling those frame beams 402'' in to eliminate posts 411'). Drilling through the corner of a steel beam 402'' could be done with a jig (starting with a pilot hole at each entry point). But rotating the frame beams 402'' by 17 degrees will allow bolt holes perpendicular to the metal faces to be used here as well. Alternatively round tubing could be used for these frame beams 402''.

Figure 4G:
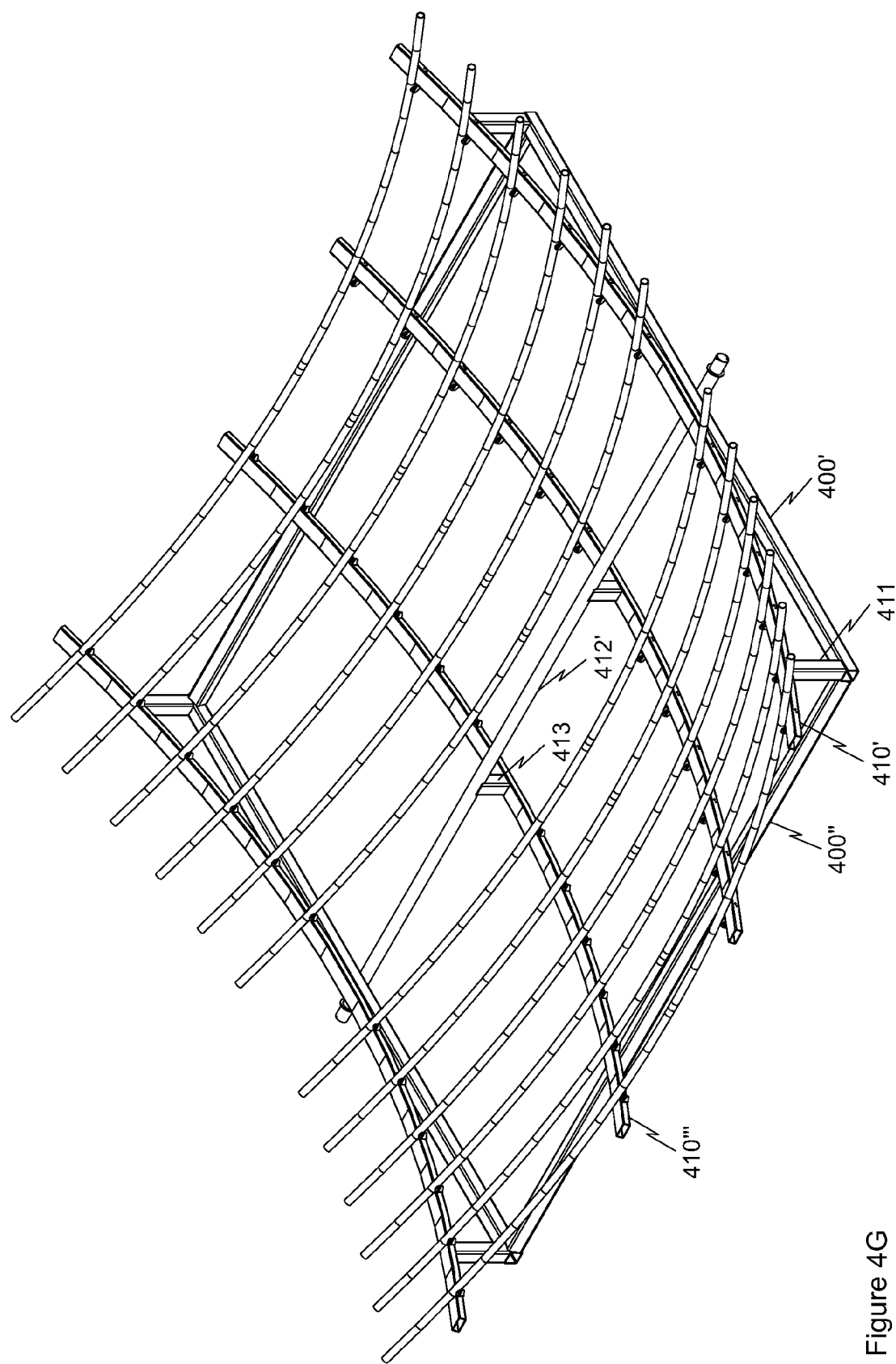
FIG. 4G is a depiction of a braced four-rib balancing frame for a parabolic mirror, based on the principle of adding parabolic functions but using modern structural steel members, with parabolic steel rails added.

The two in-between ribs 410'' can also be supported in their middles from the frame beams 402 of the frame 400'' by a brace similar to that in the three-rib design shown in FIG. 4D; if the thickness of a rail mounted on a rib is less than 3.5 centimeters, a shim between the brace and the ribs 410'' can be used to avoid the mirrors hitting the brace at their lowest point (at the axis of symmetry). As will be detailed later in the embodiments of receiver supports, the preferred embodiments have receiver supports that cast a narrow shadow down the center of the aperture on one axis, (and down half of the center of the aperture on the other axis). In embodiments where receiver supports will shade this centerline perpendicular to the ribs, as shown in FIG. 4G a simpler rib brace 412' can be at the level of the frame 400'' instead of at the lowest level of the ribs 410'', with a brace 412' made of round-tubing being useful for preferred receiver supports.

It should be noted that for aperture sizes in between where a single centerline beam or truss supporting the rails is optimal and the size where several ribs are optimal for supporting the rails, a balance frame such as that shown in FIG. 4F, but supporting rails directly rather than supporting ribs that support rails, is preferable in that it supports each of four rails at three points.

Figure 4H:
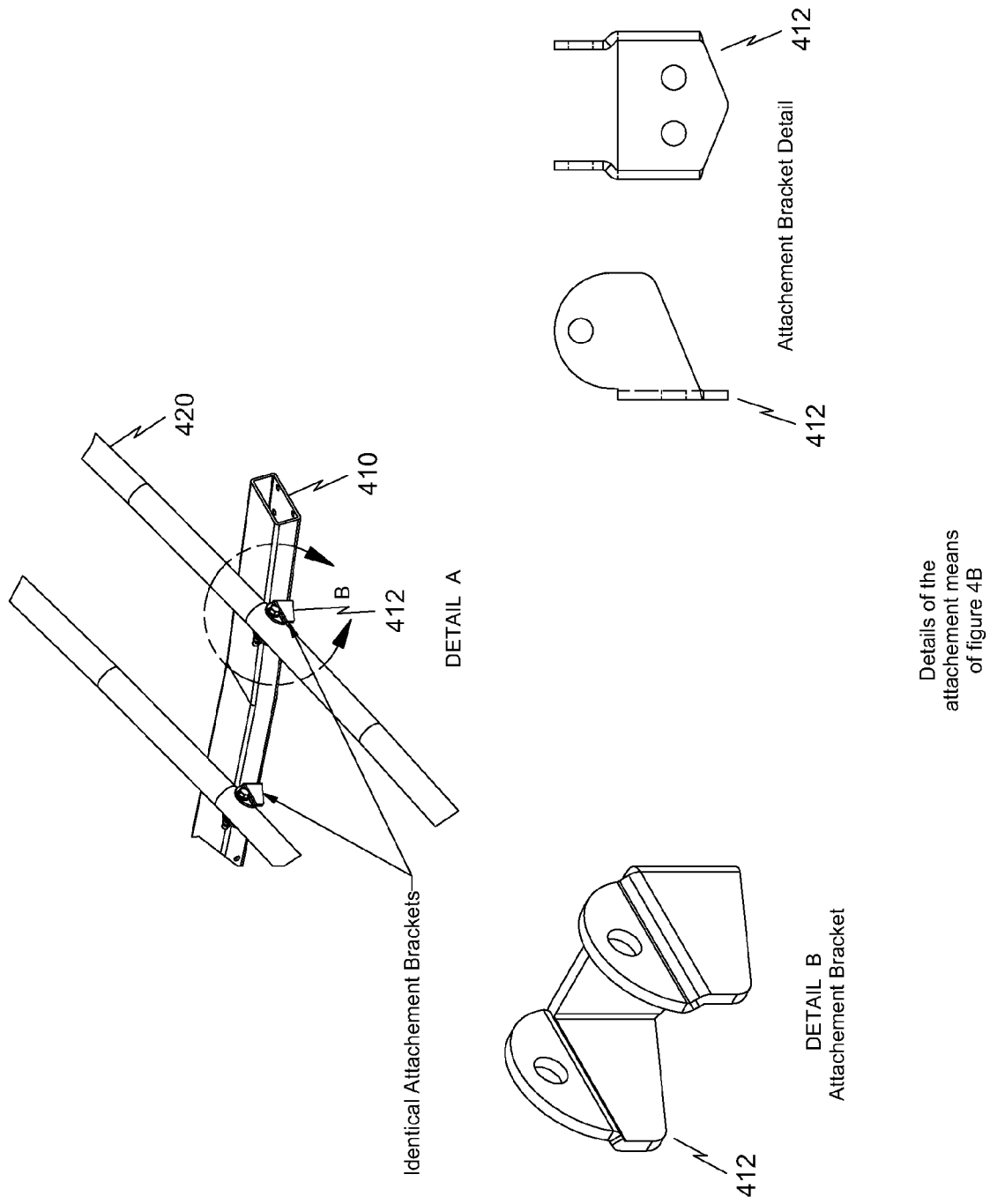
FIG. 4H is a depiction of a bracket for attaching identical rails to identical ribs in a frame for a parabolic mirror, based on the principle of adding parabolic functions but using modern structural steel members.

Instead of trusses with continuously curved top surfaces as taught by Wood in U.S. Pat. No. 6,485,152, or even smoothly parabolic ribs and rails, preferred embodiments use segment-bent ribs 410 and rails 420. The ribs 410 can be segment-bent because it is only the position of the attachment points for the rails 420 that matters, and the shape of the rib 420 in between those points is not relevant (as long as it does not do something like poke up through the mirrors). While the rails 420 may have to support mirrors at almost a continuum of points, it will be seen later during the discussion of mirrors that flat segments help prevent non-contributing hyperbolic corners and allow a mirror to ride over a neighbor on one side and under its neighbor on the other side to maximize mirror packing. Thus although it would seem natural that rails 420 with continuous parabolic curves would produce mirror surfaces that more closely approximate a paraboloid then segment-bent approximations of parabolas would, the converse is true for the simplest preferred mirror embodiments. Thus in preferred embodiments both the ribs 410 and rails 420 are segment-bent rather than continuously curved, simplifying their manufacturing to a small number of discrete bends, with the bends press-formed into the ribs 410 and rails 420. Using round tubing for the rails 420 simplifies the attachments of the mirrors, and using rectangular tubing for the ribs 410 simplifies the attachment of the rails 420 to the ribs 410 and the ribs 410 to the frame 400 of the tracker. As shown in FIG. 4H (which is a detail of the attachment means in FIG. 4B), all attachment of the ribs 420 to the rails 410 can be made using identical brackets 412 by using appropriately-placed pre-drilled holes in both ribs 410 and rails 420. This keeps all of the ribs 410 identical, all of the rails 420 identical, and all of the brackets 412 identical, greatly simplifying on-site assembly.

The interwoven custom lattice trusses of Wood, with their shape created by carefully sized and spaced diagonal braces, are complex to assemble and provide a sub-optimal continuously-curved top surface for long mirrors. Yet the advantageous strength-to-weight ratio of lattice trusses in general are well known, and grow dominant over labor as the structure size increases. Straight lattice trusses are easier to produce accurately than curved trusses, so it is desirable to have a simple way to enhance straight lattice trusses to enable them to provide support to a segmented parabola (as has been shown above to be advantageous for supporting solar mirrors).

Looking again to Carter, one can see that his straight longitudinal sills (10) are extended by bolts 41 and sleeves 43 to support the parabolic ribs and rails 39 and 40. However the ribs and rails are tied to the supports through the same means 41 and 43, requiring complex field assembly, and the sleeves 43 are all custom lengths that depend on their exact location in both the X and Y directions, further complicating both manufacturing and assembly by precluding the use of identical pre-assembled rib trusses and rail trusses. There is therefore a need to have a simpler way to extend straight trusses to support parabolic surfaces than Carter uses.

Further preferred embodiments of the present invention therefore use identical ribs made from prefabricated straight lattice trusses with simple extensions for providing parabolic support to rails, and especially-preferred embodiments use such ribs to support identical rails that themselves are made from prefabricated straight lattice trusses with extensions for providing parabolic support to multiple mirror sections.

Figure 4I:
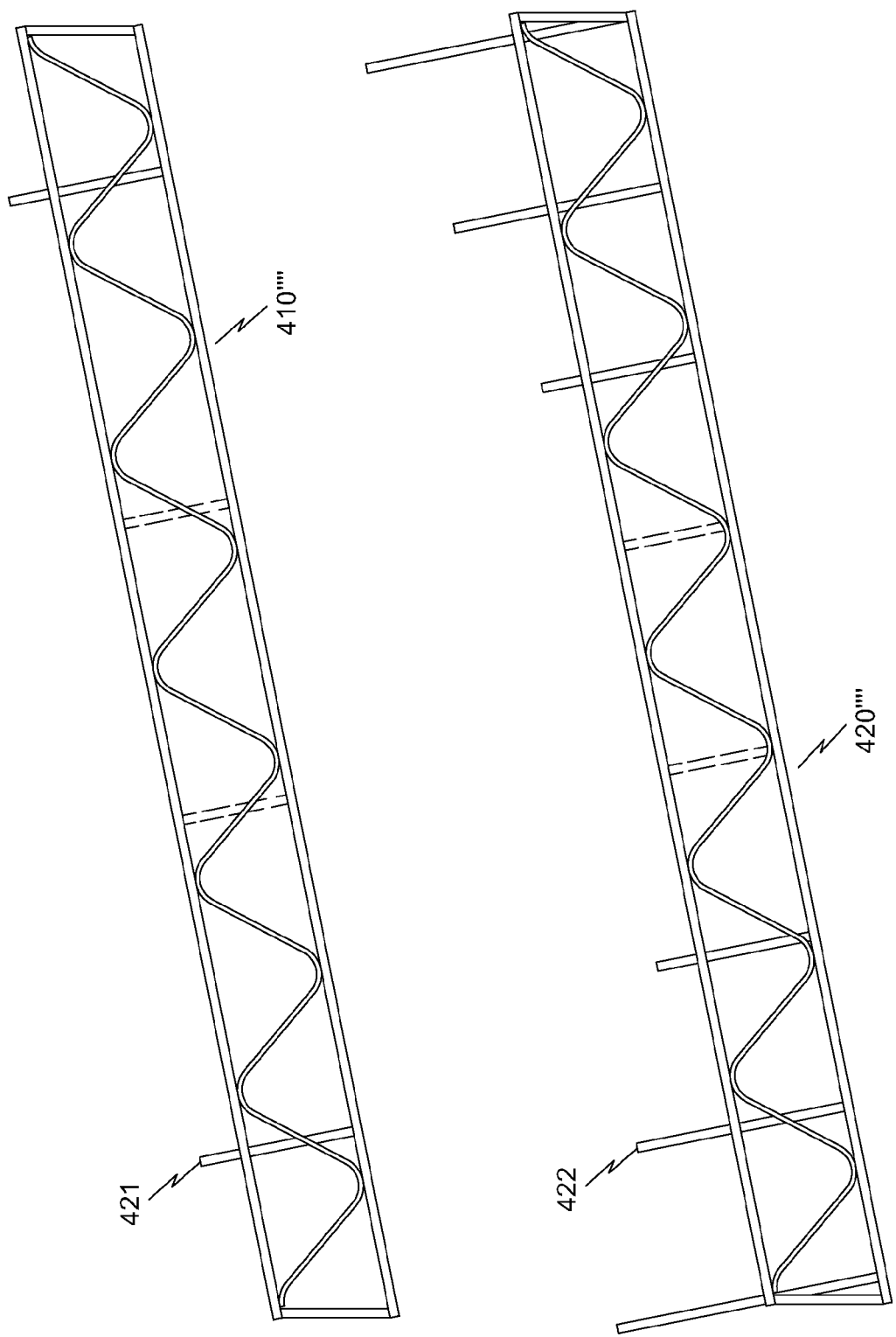
FIG. 4I is a depiction of straight-lattice parabolic-support ribs and rails.

As will be seen in the subsequent discussion of mirror segments, a mirror four segments long by 14 segments wide and two supporting rails per mirror segment proves especially preferred for achieving 1000 suns concentration with current readily-available, cost-effective steel lengths and solar mirror sizes. However a single lattice-truss the width or length of the mirror would require extensions too long to be cost-effective, so with the frame providing three points of support for each rib, it is more optimal to divide each rib truss in half so that the frame still supports each sub-rib in two places (sharing the central support point). As shown in the detail of rib 410'''' in FIG. 4I, if the extensions 421 are of a length such that the centermost extensions become non-existent (as shown in dashed outline), the total number of extensions is reduced by half and the extension lengths are shortened by a factor of four over a single long lattice truss.

Similarly with the four ribs supporting a full-length rail at four points, each rail is optimally divided into two shorter sub-rails which can each be supported by two ribs. If the rails' extensions 422 are of lengths such that the centermost extensions become non-existent, as shown in the detail of rail 420'''', the number of extensions is reduced by a quarter and the extension lengths are shortened by a factor of four over a single long lattice truss.

Four ribs comprising a total of eight identical sub-ribs 410'''' can be mounted on a frame, with the sub-ribs 410'''' in turn supporting eight rails comprising a total of sixteen identical sub-rails. If the mirror segments each need support only at four points, the rail extensions 422 are sufficient to support the mirror segments directly. If the mirror segments need support across their widths, then a simple light-duty notched angle iron running across the rail supports (perpendicular to the rails) will provide sufficient support.

While off-the-shelf lattice trusses are available, replacing fossil fuels with solar power will require such huge numbers of large-aperture mirrors that custom trusses will prove optimal for large-scale production, especially for the more numerous rails which could be lighter than typical standard lattice trusses. A simple optimized truss can be made from inexpensive light-duty angle iron or square tube by understanding the points at which force will be applied and considering how to incorporate convenient mirror supports.

Figure 4J:
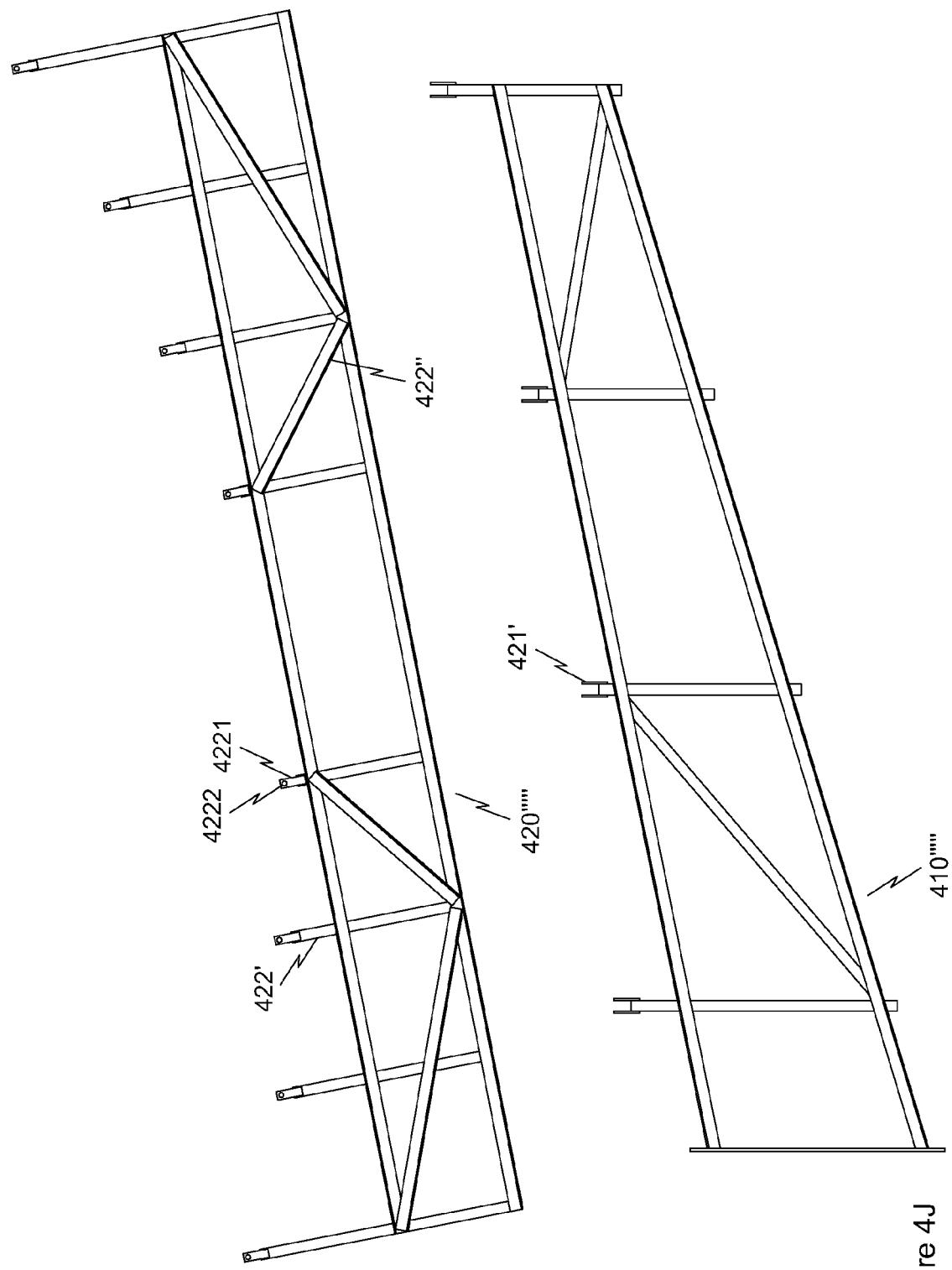
FIG. 4J is a depiction of optimized straight-lattice parabolic-support ribs and rails.

A simple lattice truss comprises two separated members connected by braces that restrict the movement of the members relative to each other. Force will be applied at the mirror segment attachment points by wind load on the mirror segments, so if one or more of the braces support the member that supports the mirror segment near these attachment points, localized stress overloading that member will be avoided. Since not all braces connecting the members need to be diagonals, straight braces can be used at this point allowing them to easily also serve as rail extensions 422', as shown in FIG. 4J. These braces are at a convenient spacing for truss braces, and are at the optimal placement for reinforcing the truss to withstand the wind force on the mirror segments. Each such mirror-supporting brace 422' can terminate in a tab 4221 parallel to the sides of the mirrors it will support. This lets a bolt through a hole 4222 be used to attach two sleeved mirror segments (as will be discussed in a subsequent family of embodiments), one on each side of the tab 4221, through corresponding holes in the mirror sleeves.

The rails in turn transfer the wind's force to the ribs at the point where rails cross the ribs. A lattice truss needs at least one diagonal brace for leverage against lateral relative shift of its members, and this can be provided by diagonal braces 422'' that meet where the rails will cross the ribs. As taught above, in preferred embodiments these points are fewer in number than the mirror support points, and hence each such point receives proportionately more force. The diagonal braces 422'' at such a point divide this force and transfer it to two points on the opposing member, and in preferred embodiments these diagonal braces contact this opposing member near where mirror-supporting braces 422' also contact it, reducing leverage for localized bending of that member. In even more preferred embodiments, the braces 422' which the braces 422'' terminate near are picked to distribute the force broadly along the lattice truss. In FIG. 4J this is shown for a lattice truss half-rail to be supported by two half-ribs and supporting seven mirror segments, which will be shown later to be exemplary with today's most cost-effective mirror and steel frame sizes.

The ribs can similarly be made from custom lattice trusses, but since these support fewer rails than the rails support mirrors, the gains are less than with the more plentiful rails. However by combining the rail-to-rib attachment means with a perpendicular brace for the rib lattice truss (as was done with the mirror-segment attachment and a perpendicular rail truss brace), some savings can be made, and in sufficient quantity this is worthwhile.

For sufficiently large mirrors, it becomes it preferred to replace the balancing frame with custom lattice ribs that are very deep where they meet the centerline truss and taper toward the farthest rail they will support. At recent steel prices, even a 24-foot (7.2-meter) dish is sufficiently large to make this worthwhile. For a 24-foot (7.2-meter) aperture, such ribs should be roughly 30 inches (¾ meter) deep at the wide end so that slight imperfections in their angles do not disturb the focus unduly in the sensitive direction.

Figure 4K:
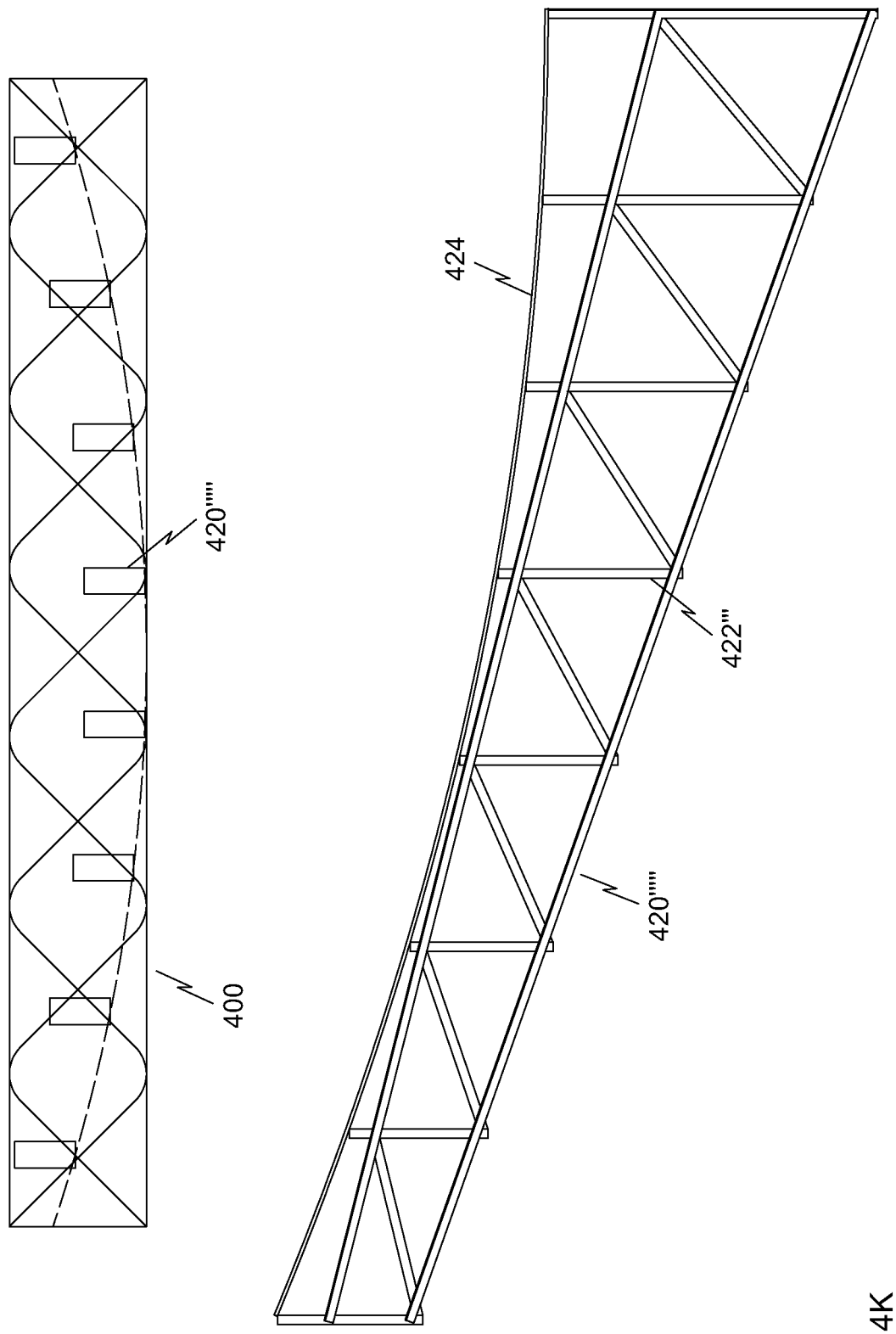
FIG. 4K is a depiction of a hybrid straight-lattice parabolic-support rib with a parabolic rail top.

But 24-foot apertures are only four times the length of the mirrors, and each rail requires the support of at least two ribs, so there are fully half as many ribs as rails. This creates a case where some steel can be saved by using one dimension of a hybrid between ribs and rails rather than separate dimensions of ribs and rails. Because the hybrid elements support the mirror segments, they are called rails, but as shown in FIG. 4K, the preferred overall shape is similar to that of the ribs in the previous embodiment, with the top curved as the rails were. Again an optimized design extends vertical supports 422''' beyond the main rib members to support the mirrors, and uses diagonals to prevent the main members of rail 420'''' from shifting relative to each other. The extensions of vertical supports 422''' can either support attaching mirror segments directly with holes that align with mounting holes (similar to holes 4222 of FIG. 4J) to emulate segment-bent rails, or can support a thin rod 424, as shown in FIG. 4K, to produce a rail 420'''' with a continuously-curved top.

Figure 4L:
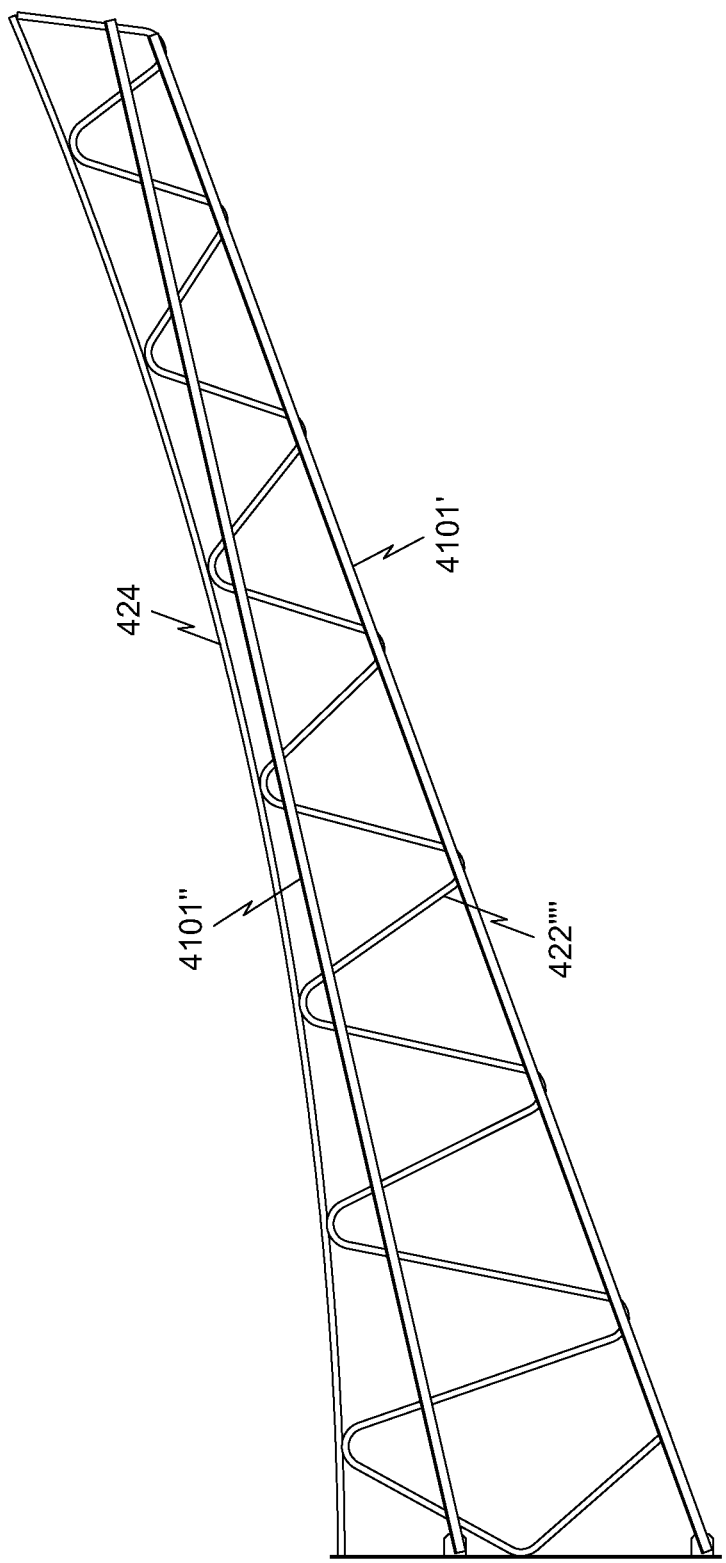
FIG. 4L is a depiction of an optimized hybrid straight-lattice parabolic-support rib with a parabolic rail top and a continuous bent rod for vertical and diagonal bracing.

For mass production a jig can be afforded for accuracy of the critical features, which are the curve of the rail at the top of the hybrid rib/rail, and its position and angle relative to the end of the rib/rail which will later get mounted on the centerline truss. This lets the cost of the rest of the hybrid rib/rail be reduced by using materials and assembly techniques that provide accuracy only where needed. As shown in FIG. 4L, a continuous zig-zag rod 422'''' such as is used in commercial trusses can be bent to the shape needed to provide cross-bracing between the straight rib members 4101' and 4101'', while also providing support for curved rail 424.

The zig-zag rod 422'''' need not be particularly accurately made because even if made with fairly stiff rod roughly 1.5 centimeters (⅝ inch) in diameter, it will flex enough at the bends that it could be pressed against the critical jig-held rail at each bend and welded in place. The straight rib members 4101' and 4101'' do not need accurate placement either, as their job is not to determine the placement of the critical rail 424, but merely to keep it from moving once the straight rib members are welded in place (and they would be welded in place while the rail and mounting means are still in the jig).

One potential disadvantage of these hybrid-rail embodiments is that the tight focus of the receiver is now in the azimuth direction rather than the altitude direction, so for a tracker that is significantly less accurate in the azimuth direction, this embodiment is not preferred. However for trackers that track at least as accurately in azimuth as in altitude, while there are twice as many of these hybrid rails as there were ribs, each takes only half as much weight and wind loading and can be of lighter-duty construction, so eliminating an entire layer of the support system reduces cost without affecting focusing ability. In general further discussions of mirrors and tracking will apply equally to rib-and-rail designs and to hybrid-rail designs unless otherwise specified.

As noted above, with a given mirror segment width a wider aperture can increase concentration, which may become desirable with upcoming cells such as those from Azur which reach their peak efficiency at 1700 suns. Also, changes in the relative costs of materials and labor may make larger dishes more preferable in the future. As has been seen above, the preferred construction of a frame evolves from a single tubular beam supporting rails that support mirror segments for a moderate aperture, to a multiple ribs supporting many rails for a larger aperture, to a frame that supports tubular ribs at two places, to a lattice centerline truss supporting lattice hybrid rails for a large aperture. This last preferred construction has started repeating the tubular construction evolution, but with lattice trusses replacing press-formed tubular members. For even larger apertures, this evolution continues with lattice ribs supporting lattice rails (optimal for apertures of around 10 to 12 meters, or 32 to 48 feet, to match 16-foot and 20-foot steel), and then even to a lattice frame supporting lattice ribs at two places, with those ribs in turn supporting lattice rails.

The rim angles used in the above examples are preferred with current common trackers that typically only track to several tenths of a degree of accuracy, as smaller rim angles produce longer focal lengths, which are more sensitive to tracker alignment errors and slope errors (angular alignment errors of the mirrors). However, once secondary concentrators are used, smaller rim angles allow higher concentration (if the tracker and mirror are sufficiently accurate) by transferring more of the focusing job to the more efficient non-imaging secondary concentrator. Advances in trackers, such as those taught later in the present application, or as are being introduced by new tracker manufacturers such as Titan Trackers S. L. achieve tracking accuracy better than 0.1 degrees (*Titan Tracker finishes a CPV Project for the ISFOC*, Titan Trackers S.L), making a combination of shallower rim angles and more sophisticated non-imaging secondary concentrators preferable for either increasing concentration, relaxing error budgets, or allowing smaller apertures per mirror segment width for a given concentration.

Approximated parabolic dishes are not the only practical mirror shapes, and related shapes may be more preferred under certain circumstances.

As will be seen in the subsequent discussion of mirror segments, an overall mirror spanned by many mirror segments that are each straight in one direction will be exemplary. Also as will be seen in the subsequent discussion on receivers, mirror segments toward the rim of the overall mirror aperture will contribute more to the required receiver length than mirror segments near the center of the aperture do. As will be covered in more detail in the section on receivers, this is partly due to their surfaces being farther from the receiver, which gives the sun's rays more time to spread from the angular diameter of the suns, but mostly due to the light that they reflect impinging upon the receiver at an angle farther from normal.

Having the narrow receiver area needed by light from the inner mirror sections centered on the receiver is inefficient in obtaining maximum concentration. If instead the inner segment were angled slightly less, this light would still impinge upon the receiver, but simply more toward the one edge of the receiver rather than centered. This lessened slant would lower the outer edge of the innermost segment, and thus lower the height of the rail at that point and with it the inner edge of the next segment. Similarly the next segment would be slanted slightly less, and the segment after it as well, significantly lowering the height of mirror at the edge of the aperture.

While a lower height at the edge of an aperture of the same width would slightly increase the distance to the receiver and with it the spread of the light due to the angular diameter of the sun, this is more than made up for by the lower mirror edge subtending less of an angle as viewed from the receiver. This can either be used to allow a wider aperture at the same angle, thus increasing the light-gathering area of the overall mirror, or it can allow a narrower angle for the same overall mirror width, thus allowing a secondary concentrator on the receiver to increase the concentration more.

While compound parabolic curves are slightly more complex than true parabolic curves, to adopt a compound parabolic curve in the segmented direction would only require modifying one curve. For example, in FIG. 4K or FIG. 4L it is only the shape of the jig against which rail 424 is held during construction, and its angle to the end-plate that attaches to the centerline truss, that would have to be modified. And the modification to produce a compound parabolic curve is simple: referring to FIG. 7A, to produce the highest-concentration compound parabolic curve, each mirror segment is simply slanted less until the light that it reflects onto the receiver starts at the closest edge of overall focal spot (the edge of receiver, or the edge of the mouth of the secondary concentrator if one is used).

However instead of a parabola having much less concentrated light at the edge of the focal spot (refer to FIG. 7B for illustration), this compound parabolic curve would place light from every mirror segment on one side of the aperture right at the edge of the focal spot. In a perfect world this would be fine, but any significant errors in manufacturing, assembly or tracking would then cost highly-concentrated light rather than less-concentrated light. Preferred non-imaging-dish primary concentrator embodiments of the present invention therefore allow a centimeter or two of safety margin between the edge of the overall focal spot and the edge of where the compound parabolic curve directs the light from all but the outermost segment to. Since this, as will be seen later, is in the less sensitive direction of the receiver, it reduces the maximum concentration by only a very small amount.

When a secondary concentrator is used, a maximum-concentration compound-parabolic-curve primary concentrator also directs more intense light onto the secondary concentrator. Even when a very thin solar glass secondary concentrator is used, light impinging upon it suffers from around a 2% percent loss, and such light also impinges on the cell surface at a higher angle for an additional roughly 1% loss. Having the above-mentioned safety margin reduces the amount of light that suffers this penalty, with the optimal safety margin size depending upon the need for higher concentration balanced against the need for higher optical efficiency.

As to whether a parabolic primary or a compound-parabolic-curve primary is more preferred, the higher the rim angle, the more a compound parabolic curve increases the concentration, and the smaller the optical efficiency penalty if a secondary concentrator is used. At low rim angles (less than around 11 degrees), the increase in concentration from a compound parabolic curve primary concentrator is too small to be worthwhile. At moderate rim angles (around 11 degrees to around 17 degrees, a compound parabolic curve primary concentrator is only preferred if no secondary concentrator is use in the direction that the compound parabolic curve concentrates in. At higher rim angles (around 17 degrees to 22.5 degrees, a compound parabolic curve becomes preferred if no secondary concentrator is used or if the final concentration will be more than around 1000 suns. And at extremely high rim angles (greater than 22.5 degrees) a compound parabolic curve primary concentrator becomes generally preferred). Other factors, such as having a known distribution of alignment errors so that the lowering of the edge of each segment can be maximized, can also influence the choice of primary concentrator curves.

Approximations of continuous curves are also not the only practical mirror shapes. A hybrid between a parabolic dish and Fresnel mirror can use the same mirror segments as the above-described embodiments can use (such mirror segments will be discussed in detail in the next family of preferred embodiments). However instead of the frame to which the mirrors are attached forming a parabolic dish, dish sections on one axis can all have their inner edges affixed to a centerline truss at the same height. This produces frames and mirrors that correspond to the embodiments already discussed in current family of preferred embodiments the way that FIG. 2G corresponds to FIG. 2F.

Although a Fresnel lens is optically not as efficient at focusing as a parabolic dish is, for modest rim angles is almost as efficient as a parabolic dish, with the distance to the receiver from the edge of the aperture being only slightly father and the mirror packing efficiency being only slightly less dense (with the magnitude of each of these effects depending roughly on the square of the rim angle). And with all inner edges at the same height, this design is easier to use on trackers designed for flat panels because those inner edges can all be supported by the flat-panel supports.

Figure 11A:
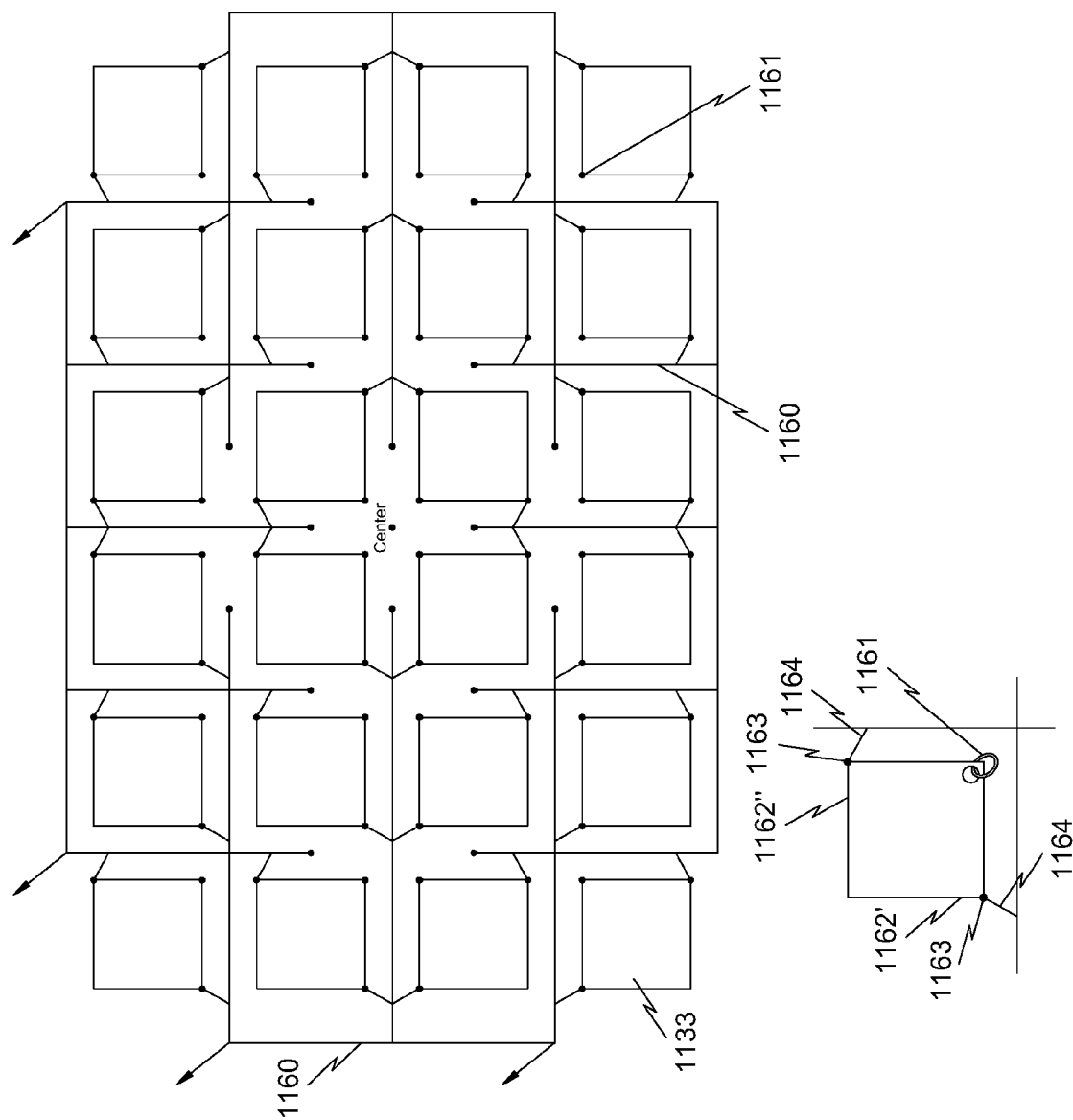
FIG. 11A is a depiction of an adjustable-focal-length Fresnel focusing mirror that can achieve a different focal length on each axis, as could have been built using materials known to have been available in the time of Archimedes.

One can even 'Fresnel' mirror segments in two directions so that each mirror segment will have one corner on a flat frame, with the slants for the Fresnel segments provided by straight beams as taught later in the present application and illustrated in FIG. 11A, but with no need for having the slanting mechanisms adjustable.

These techniques for producing these Fresnel focusing surfaces are not discussed further here because for even modest-scale deployments, the advantages of parabolic dishes outweigh the complexity of mounting of those designs on tracker designed for flat panels, as parabolic dishes can produce higher concentration and have higher optical efficiency.

Figure 5A:
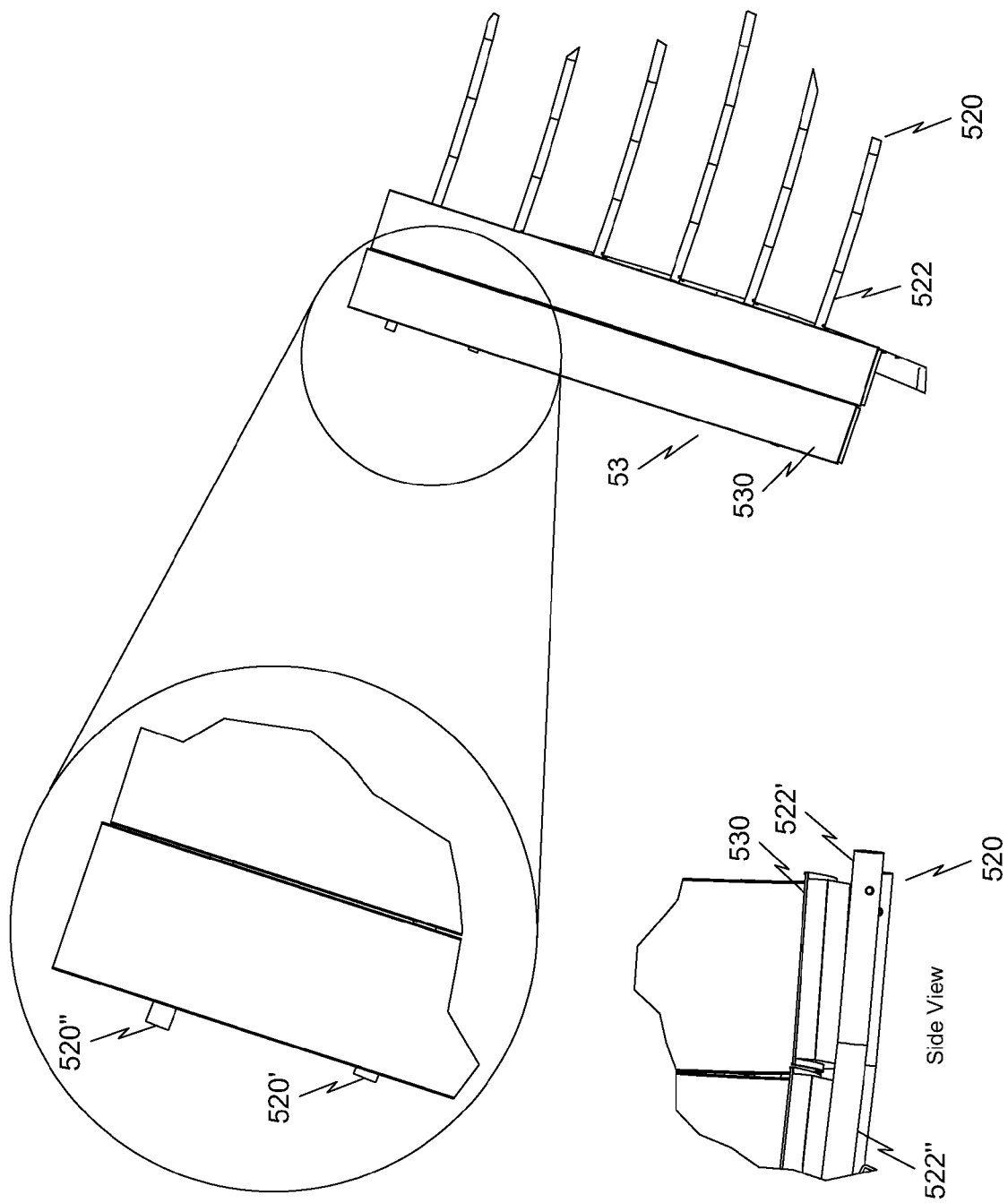
FIG. 5A is a depiction of a long, narrow mirror and its intersection with segmented rails in a parabolic mirror frame.
Figure 5B:
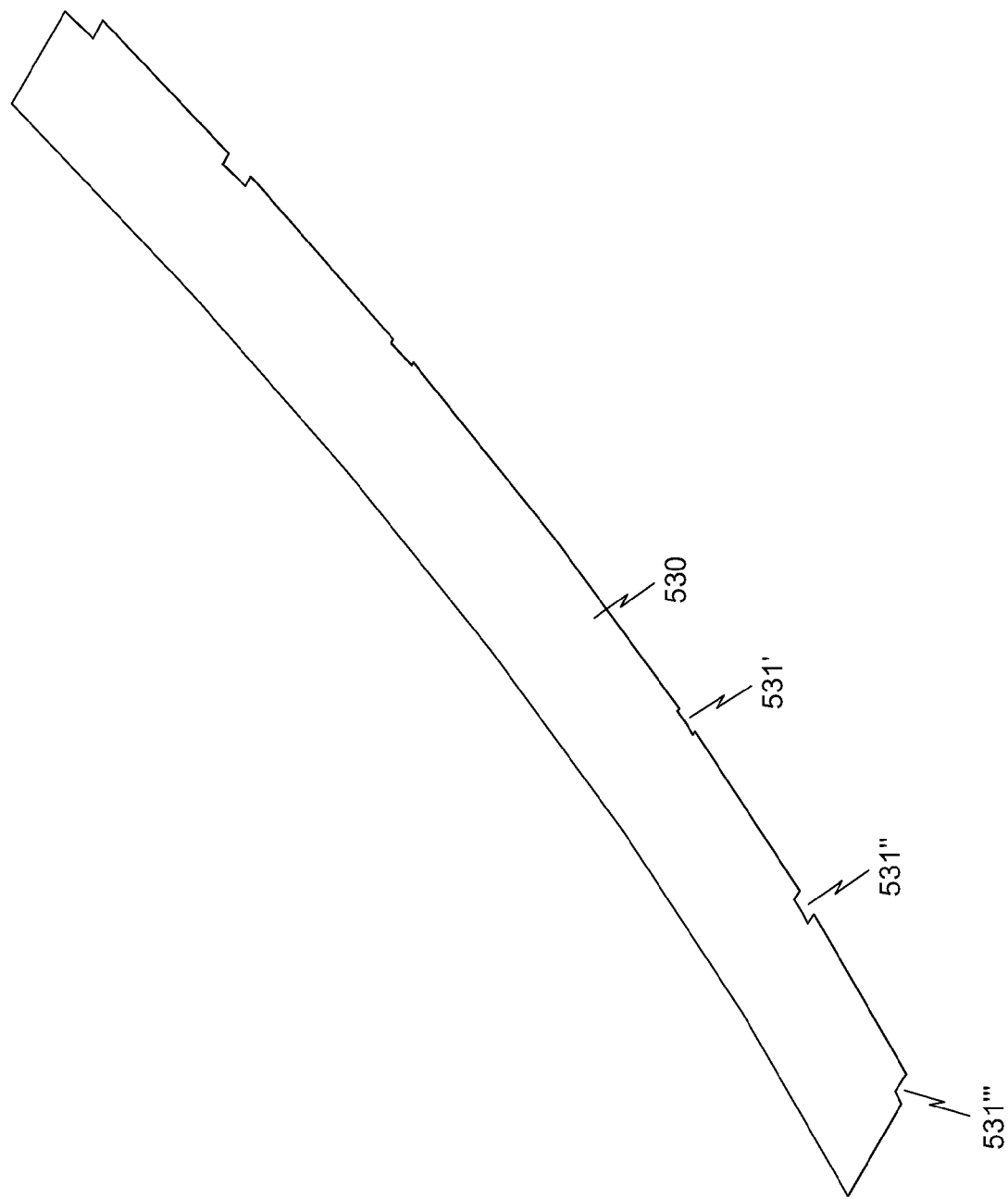
FIG. 5B is a depiction of a long, narrow mirror notched where it would otherwise intersect neighboring rail segments on segmented rails in a parabolic mirror frame.

Third Family of Preferred Embodiments:
Improvements in Mirrors for Large-Tracker Solar Energy Systems with One or a Few Foci Per Tracker, Using Modern Materials and Manufacturing As raised in the analysis of Wood's long narrow flat mirrors held directly against rails, with long mirrors continuously curved rails limit the rim angle to less than optimal because the mirrors start to twist as they wrap around the axis of symmetry, distorting their curvature. If segment-bent rails were used instead, this curvature distortion would be eliminated; however as shown in FIG. 5A, a mirror segment 530 aligned at the edge of rail segments 522' of rails 520 in the middle of the mirror segment would not be aligned with rail segment 522' near the end of the mirror segment, where it crosses rails 520" and 520''' near the end of the segment. Instead the rail segments 522, 522', etc., would either have to be enough longer than the width of the mirror segments 530 to handle this wrap-around-induced shift relative to the rail segments, reducing the mirror packing efficiency, or the mirrors 530 would have to be notched, as shown in FIG. 5B, to avoid a mirror segments 530 hitting the next rail segment 522" due to the wrap-around. Notches 531', 531", etc. would be inconvenient even for metal or plastic mirrors, and would significantly raise the cost of glass mirrors. While holding long, narrow, bent glass mirrors directly against curved rails as taught by Carter and by Wood would eliminate the need for notching the mirrors, with simple bent flat glass mirrors the glass needs to be thick enough for unsupported spans between trusses, requiring either thicker (and thus less reflective) mirrors or the expense of more rails to create shorter spans. Unsupported spans held directly against the rails also expose the glass to the elements, requiring weather-proof mirrors; these are more expensive, and the only thoroughly-validated backside mirror paints currently are lead based, raising environmental issues. Also, unsupported spans curved in-situ into splines by being held against the rails make the mirror curvature, and thus the tightness of the focus, extremely sensitive to even sub-millimeter errors in the height of the rails.

Figure 5C:
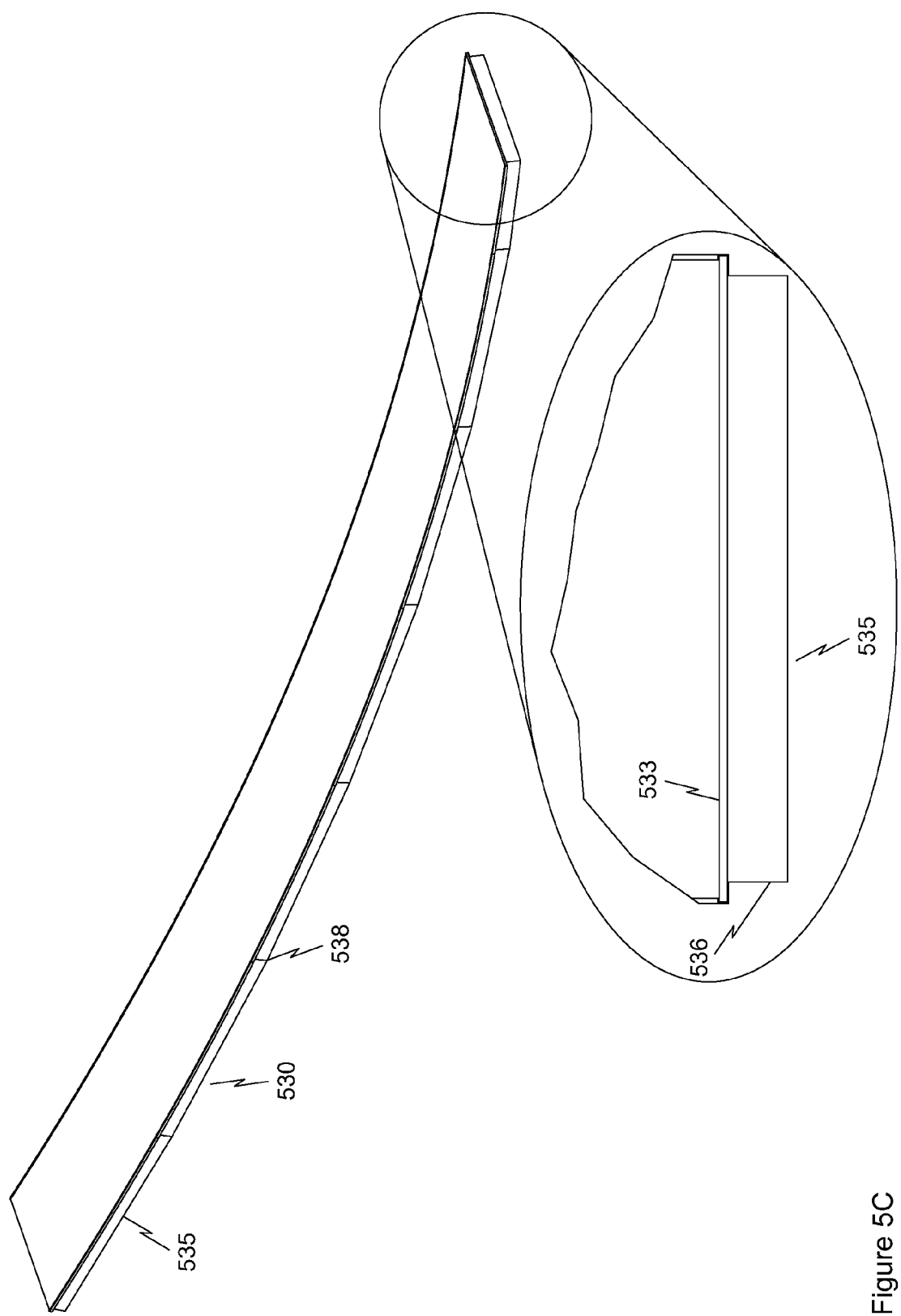
FIG. 5C is a depiction of a steel sleeve for pre-shaping glass mirrors for a segmented-rail parabolic mirror frame.
Figure 5D:
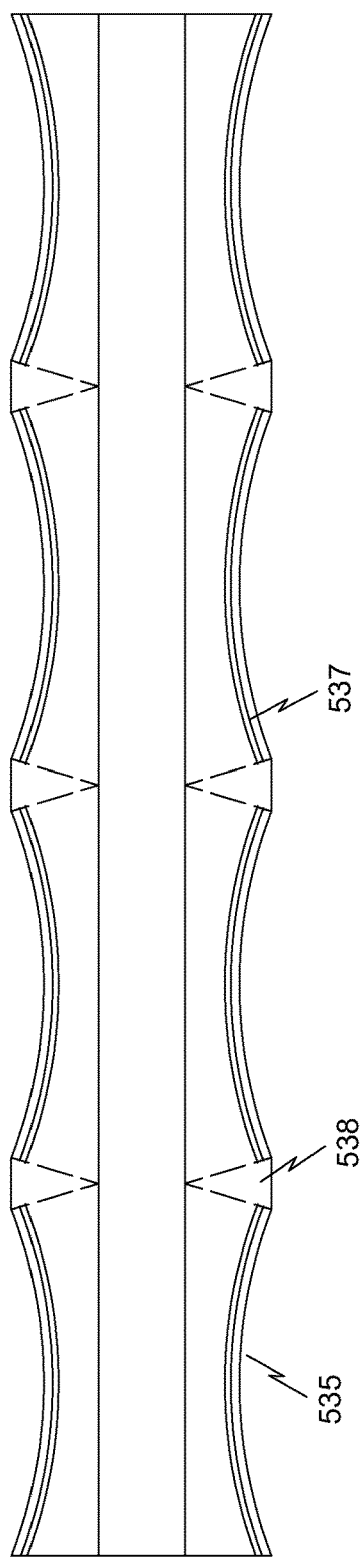
FIG. 5D is a depiction of a flat pattern for a sleeved glass mirror (with exaggerated cut-outs)

All of these drawbacks of holding glass mirrors directly against the rails can be overcome by using pre-shaped mirrors, as shown in FIG. 5C, that use a steel sleeve 535 to hold each mirror glass 533 securely in the right shape while protecting it from the elements. Sheet steel is inexpensive compared to weather-proof mirrors, and the depth 536 of the steel sleeve 535 can be tailored to provide the appropriate rigidity. With each mirror 533 securely supported on both sides and strengthened by its curvature, thinner glass can be used for even lower cost and higher reflectivity, and the mirrors are less likely to break in transport and handling. The steel sleeve 535 can be of steel that fairly closely matches the thermal expansion coefficient of the mirror glass 533, and the effect of a small difference in expansion is minimized by the depth 536 of the sleeve 535. As shown in FIG. 5D, the sleeves 535 can be made by roll-pressing groove 537 into sheet steel on a parabolic arc, and then crimped at the segment joints 538 and automatically glued, soldered or spot-welded to maintain the right shape. Alternatively if a strong adhesive is used to attach the segment of glass mirror (e.g. 533 in FIG. 5C) to the sleeve 535, the bond between them will prevent the sleeve from un-crimping.

Even with the sleeve 535 being of thin steel, the depth 536 provides enough rigidity to substantially reduce the number of rails 520 needed, and thus the critical on-site assembly labor, and this depth 536 can be chosen to produce the stiffness desired. With a rigid enough sleeve, a mirror can even be supported by as few as two rails, whereas a mirror shaped in situ by pressure against the rails would not be curved at all with only two rails supporting it. To help protect the glass mirror 533 from hail damage, the sleeve can have internal supports parallel to the sleeve walls to reduce the width between supports. These can be supported by the ends of the sleeve, with an adhesive filler such as silicone or latex caulking between the internal support and the glass to ensure that millimeter height positioning accuracy is more than sufficient. And the ultra-sensitive mirror curvature can be established by bending the mirror glass on an appropriately-shaped mandrel while the sealant, or at least a fast setting tack such as 5-minute epoxy, sets to precisely determine the height of the mirror in the groove to a few microns accuracy.

With a segmented sleeve, aligning the middles of the sleeve segments 535 to the rails minimizes the effect of misalignment of the mirror segment 530 because the height of the mirror 533 in the sleeve 535 at the middle of the sleeve is almost constant for a considerable portion of the mirror segment length. The angle of the mirror segment 530 to the mirror frame is only a few degrees even at the end of a mirror segment 530, and so slight misalignment makes no significant difference in the focus of the overall mirror surface. This alignment insensitivity is important because the mirror segments 530 will slant as they are placed onto the rail segments 522, and this twists the angle and slightly moves the position of intersection of a segment 530 with a rail 522 from mirror segment to mirror segment. This also very slightly distorts the curvature needed for each mirror segment 530, particularly toward the aperture edge. The sleeve 535 can be made to initially hold the mirror segment 530 to an intermediate curvature, and the rigidity can be tuned simply by picking the appropriate sleeve depth 536, allowing the sleeved mirror 530 to flex slightly to conform to the rails 520.

Figure 5E:
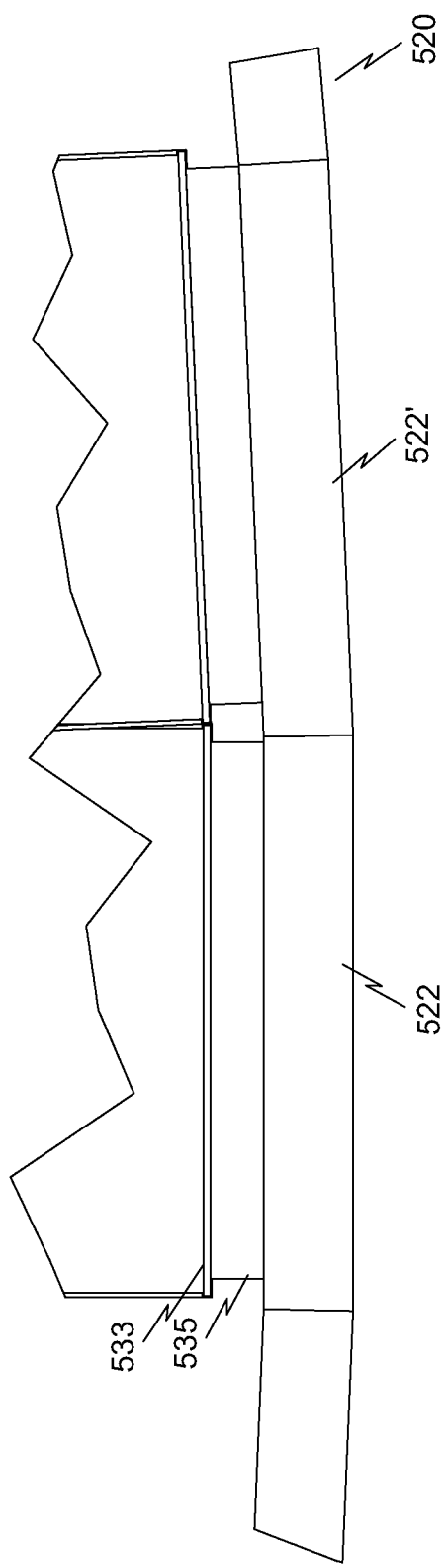
FIG. 5E is a depiction of a sleeved glass mirror with a narrowed sleeve base, and its intersection with rail segments of segmented rails in a parabolic mirror frame.

One challenge presented by segmented rails 520 is that because each rail segment 522 is at a different slant, mirror segments on adjacent rail segments will not be truly parallel (as discussed briefly under the stacks-of-boards designs), but will curve across parallel rail segments 522 from rail to rail, leaving mirror segments 530 further from the center of the mirror frame, and thus further out along the rail segments 522, in the middles of the mirror segments 530. While each rail segment 522 could be made enough longer than the width of mirror segments 530 to accommodate this, that would reduce the mirror-segment packing efficiency significantly. As shown in FIG. 5E, in preferred embodiments the mirror sleeves 535 can be made tall enough for the mirror 533 to ride over the next segment 522' of a rail 520, and where such a mirror sleeve 535 rests on the rails 520 it can be enough narrower than the width of mirror 533 mirror to allow the mirror width 533 to be nearly equal to the length of rail segments 522. This allows mirrors 533 to be more closely packed, increasing the concentration and reducing the tracker cost per mirror area. While a similar result could be accomplished for un-sleeved mirrors by notching each mirror segment where it would intersect the next rail segment, as was shown in FIG. 5B, this would add manufacturing complexity even with sheet-metal mirrors and would be prohibitively expensive with the currently more-reflective glass mirrors.

Figure 5F:
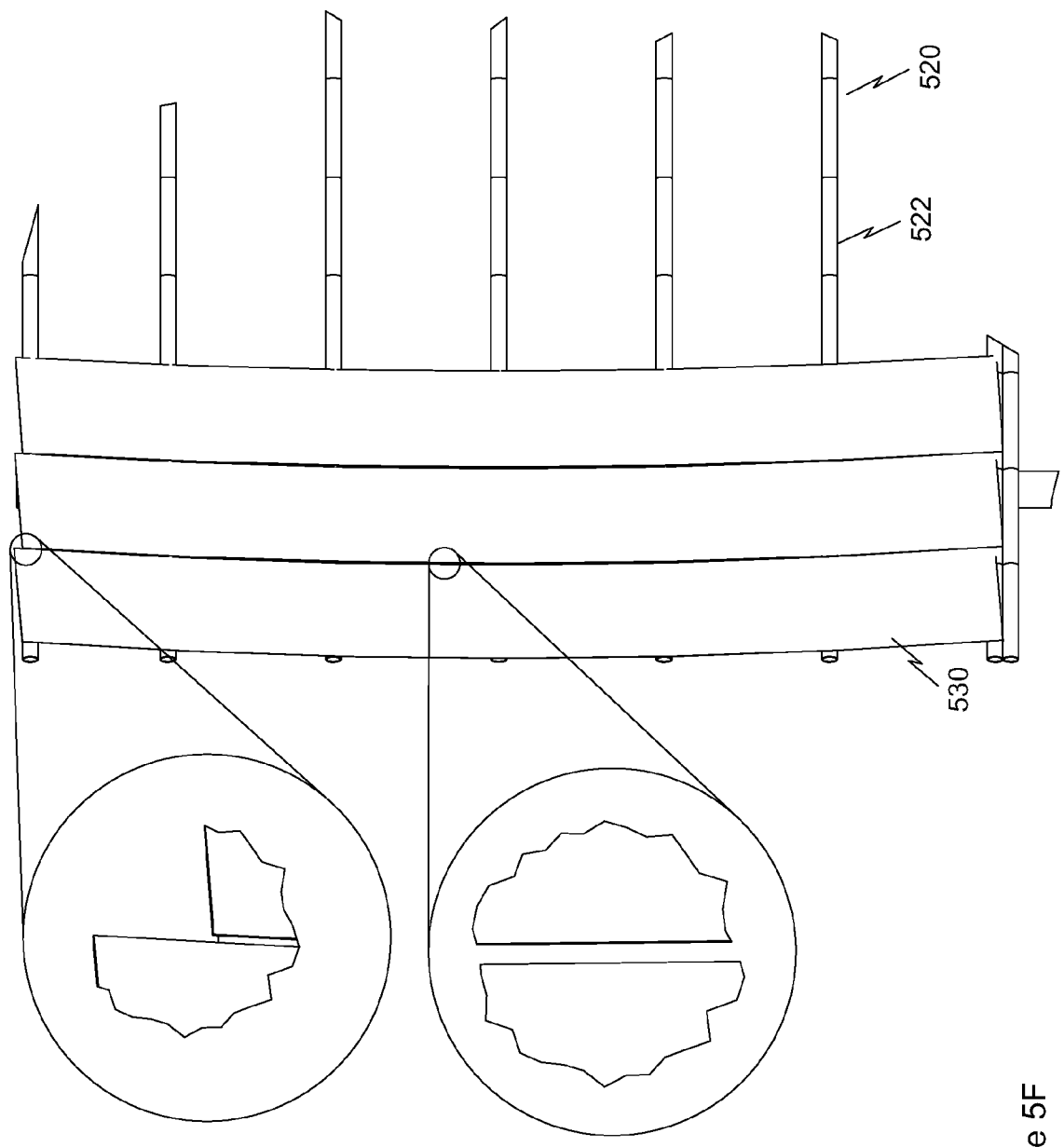
FIG. 5F is a depiction of a the gap between adjacent sleeved glass mirror with narrowed sleeve bases on segmented rails in a parabolic mirror frame.

The curve of the mirror segments 530 across the rail segments 522 is not constant, but grows with increased distance (in the direction of the segment width) of the segment 530 from the center of the mirror frame. Even with mirror sleeves 535 that allow a mirror segment 530 to ride over a neighboring rail segment 522', the difference in curvature still leaves a small gap between the middles of adjacent mirror segments 530, as shown in FIG. 5F, with the percentage of loss of mirror area on a given mirror frame largely determined by the length of the mirror segments 530, and scaling approximately with the square of the length of the mirror segments 530.

A second, more serious issue for a mirror that focuses much more in one direction than in the other direction is that the curve of the mirror segments across the rails twists the direction of curvature by an amount that is equal to the inverse sine of the product the sines of the angles of the mirror in the X and Y directions. The twisting of the alignment of the corners of square or rectangular flat mirrors has been noted by Girard in U.S. Pat. No. 4,395,581, and Girard teaches rotating the orientation of the mirrors to counteract this. There are several drawbacks to Girard's work, since it requires a complex formula to be calculated for each mirror segment, and it also reduces the packing density of the mirrors to such an extent that with square, flat mirror segments Girard would actually achieve a higher focus on the area of his receiver were he to simply more tightly pack un-rotated square mirrors. For significantly rectangular mirror segments creating a mirror of sufficiently high rim angle, Girard's rotation would indeed keep the length of the long side of the mirror segment rectangle from adding to the width needed for focus to handle the width of the rectangular mirror segments, but still at the price of the complexity of Girard's formula and of the significant loss of packing density of the rectangular mirror segments.

In this family of preferred embodiments of the present invention, the curved rectangular mirrors face a somewhat related issue, and one of much higher potential impact on the concentration. Rather than the rotation of the reflection of the mirrors segments causing the long side of the rectangular mirror segments to add to the width of the receiver needed parallel to the width of the mirror segments, in the present embodiments it is the width of the mirror segments that gets added to the width of the receiver needed in a direction parallel to the length of the mirror segments. While this can be reduced with low rim angles, those are sub-optimal from a focusing viewpoint unless a very accurate tracker is used; and while this can also be reduced with narrow mirrors, such mirror segments are more expensive, harder to handle, and are more numerous.

However, unlike with Girard's flat mirrors, the effectiveness of rotating the curved mirrors of the present invention depends on the mirror length. With the mirrors 533 pre-shaped by sleeves 535 there are no significant additional losses for shorter segments 530, and up to a certain point, shorter segments 530 are easier to manufacture and easier to install, even though there are more of them. With today's materials the best segment lengths for shipping and installation are between roughly 1.2 meters (four feet) and 2.4 meters (8 feet); the approximately 1.8-meter (6-foot) length limit for some solar glass mirror manufacturers falls conveniently in the middle of this range, making the currently preferred length for mirror segments 530 between 1.2 meters (4 feet) and 1.8 meters (6 feet). If each mirror sleeve 535 is symmetric about its long axis, then an overall mirror 53 (referring back to FIG. 5A) of up almost two mirror segment lengths (due to the curvature of the surface, the aperture will be a few percent less than the total length of the mirror segments 530) can be made from a single type of mirror segment 530. Thus using two mirror segment lengths to match the aperture enables easier manufacturing, shipping and assembly, and also reduces the mirror packing gap percentage due to differential mirror-to-rail-segment curvature by a factor of four (to a relatively insignificant roughly 1% for mirror 53 and segments 530 as used in the examples above).

One way to eliminate even this 1% loss would be to adapt the mirror sleeve to have one side shorter than the other to provide a sufficient height difference for a mirror segment to clear its neighboring mirror segment, allowing the differential curvature gap to be eliminated at only a tiny cost in increased total mirror segment area. But since this would slant the mirrors relative to the rail segments, the angles of the rail segments would then have to be adjusted by the same angle to keep the overall mirror surface in the desired shape, complicating the bends in the rails. Also since the curvature of a sleeved mirror changes over its length, such slanted sleeved mirror segments would no longer be symmetrical, and thus for any aperture wider than a single mirror segment length, two different kinds of mirror segments would be needed.

Figure 5G:
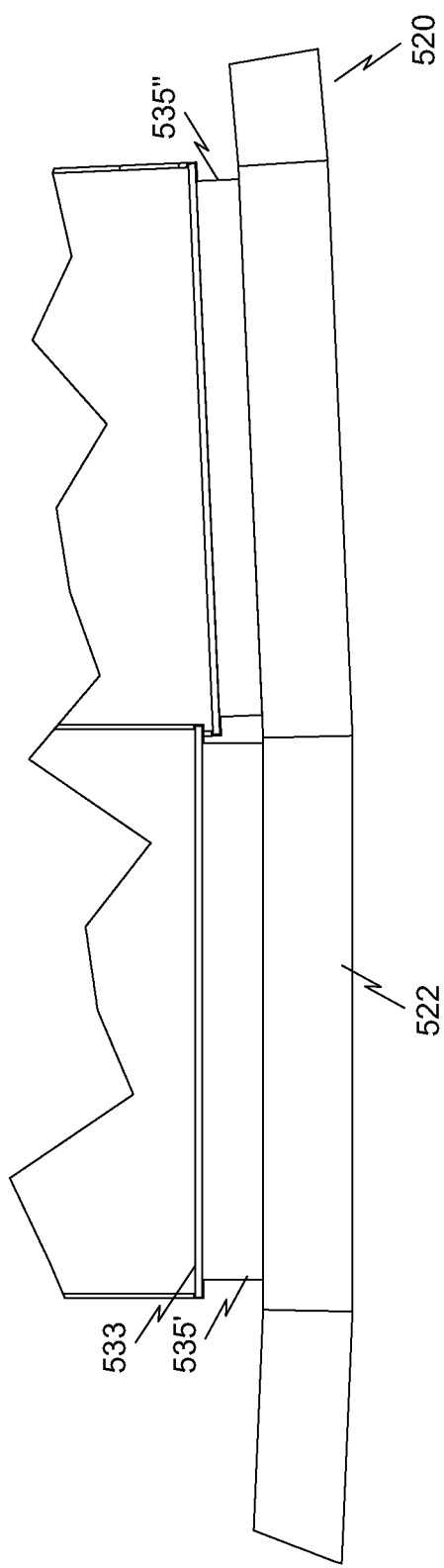
FIG. 5G is a depiction of using sleeves of different depths to eliminate the gap between adjacent sleeved glass mirrors with narrowed sleeve bases on segmented-rails in a parabolic mirror frame.

If two different kinds of mirror segments 530 are to be used, then there are answers that do not involve adding complexity to the rails. One such solution is to use two types of sleeves 535; deep sleeves 535' and shallow sleeves 535". As shown in FIG. 5G, the difference in sleeve depth would be such that a deep sleeve 535' on any rail segment 522 would clear a shallow sleeve 535" on either neighboring rail segment 522. Since glass solar mirrors 533 use very thin glass to decrease absorption and increase reflectivity, the difference in sleeve depth could be as small as a few millimeters, which would have only a minor effect on the maximum concentration available even if the sleeves 535' and 535" were otherwise identical. Even this could be eliminated through constructing the deep sleeves 535' to have a focal length a few millimeters shorter than the shallow sleeves 535".

But while the above solution is a general one, at the size of apertures optimal with today's materials and today's trackers (both those of the prior art and those taught in the present application), it takes more than two preferred-length mirror segments 530 end to end to match an aperture anyway. Since a parabola has significantly different curvature at different distances from the center, this means that the 'central' mirror segments will have to be different from the 'end' mirrors segments in any case. And it is simpler to assemble all of one kind of segment first and all of another kind of segment second than to have to use an alternating pattern. While not eliminating the gap entirely, using three mirror segments lengthwise per aperture cuts it to roughly ½% for the above examples of preferred embodiments, and using four mirror segments lengthwise cuts to roughly ¼% for the above examples of preferred embodiments; further reductions are possible but clearly this reaches the point of diminishing returns. Thus exceptionally preferred embodiments use either three or four mirror segments 530 lengthwise per aperture, with this choice based on convenient mirror segment lengths rather than on further minimizing this now-insignificant mirror packing gap.

Because each mirror segment 530 can be adjusted so that at its middle its width is perpendicular to the direction of the rails, the rotation of its width due to wrapping around the axis of symmetry of the paraboloid can be minimized. This mirror width direction rotation also rotates the long axis of the mirror's focal spot, which spreads out the focal spot in the narrow direction, and thus decreases the maximum concentration in the high-concentration direction. For an aperture-length mirror segment and a 22.5-degree rim angle, this would amount to roughly $\sin^{-1}(\sin(22.5)^2)$ or 8.4 degrees. Even with ultra-narrow 250 mm (10-inch-wide) mirrors, as taught by Wood, this would widen the focus by 250 mm*sin(8.4)=36 millimeters, which would cut the maximum concentration roughly in half on Wood's 12-foot (3.6-meter) dish and by a third on a 24-foot (7.2 meter) dish. And with 500 mm (20") wide mirrors, which are the minimum cost-effective mirror width from solar mirror manufacturers such Naugatuck, this rotation of a single aperture-width mirror segment would widen the focus by 72 mm and cut the maximum concentration roughly in half even on a 24-foot (7.2 meter) dish.

Using two or more mirror segment lengths to match the aperture lets each segment be independently rotated to align its direction of curvature, and thus its focal line. To be sure, a cylindrically curved mirror whose middle is aligned will be slightly misaligned at each end of the mirror, but the misalignment is greatly reduced over the minimum obtainable with a single aperture-length segment. The reduction in increase in the focus width is approximately linear, so two mirror segments lengthwise cuts the increase in half, and four mirror segments lengthwise to span the aperture cuts the increase by a factor of four, which only cuts the maximum concentration by roughly 20%. While losses of light of such magnitudes would be very significant, this is just a loss of concentration of light, and the mirrors of the present embodiments have sufficient concentration budget (although this extra budget is useful for optimizing receiver shape). Even so, for reaching 1000 suns concentration with a 22.5 degree rim angle this remains the second largest contributor to focal width, exceeded only by the sun's diameter.

Shorter mirrors are easier to manufacture, ship and install without breakage than longer mirrors, and also have better packing efficiency than longer mirrors. With pre-shaped mirrors eliminating the penalties of short in-situ-bent flat glass mirrors, four mirror segment lengths to match the aperture is therefore exemplary because it still only requires two types of mirrors. But for a given width, shorter mirrors create more pieces to assemble, and so if four mirror lengths are used, then both maximizing the aperture size (up to where the mirrors again become too long) and maximizing the mirror width (up until the overall mirror can no longer achieve sufficient concentration) become important for minimizing the number of mirror segments per mirror area. Fortunately, increasing the aperture also increases the allowable mirror width linearly because it is the number of mirrors wide that the aperture is that limits the concentration in the low-concentration direction.

A strong local optimum for aperture size is therefore driven by the most common standard length for the steel that forms the frame: If the aperture is approximately 2% less than 20 feet, this achieves the largest-size aperture that can be built with full-length ribs and rails from standard lengths of round-tubing (and as a slight additional savings, the standard 20-foot lengths of steel then do not even have to be cut to length to be used for the ribs and the rails). 2% less than 20 feet is within ½% of a convenient 6 meters, so this will hereafter be referred to as a 6-meter aperture.

One quarter of the 20-foot rib length is 5 feet (1.525 meters) so this makes 5-foot-long mirror segments ideal for a 6-meter aperture dish mirror. As will be detailed in the discussion on receivers in a subsequent family of embodiments, approximately 100× concentration along the mirror lengths is the maximum practical concentration with inexpensive means, and maximum optical path efficiency with inexpensive means is approximately 92%, so to achieve target concentration of 1000 suns on the receiver surface the minimum number of mirror segments wide that the aperture can be is approximately 1000/(100*0.92)=11 mirror segments wide. Since the minimum standard width for manufacturing solar glass as supplied to Naugatuck for mirroring is 20 inches (approximately ½ meter), unless the glass is split as an extra step (which adds to cost), the maximum number of mirror segment widths for this aperture is 20 feet divided by 20 inches, or 12 segments. For deciding whether 11 segments or 12 segments is more preferred, it will be seen later that the receiver supports in many designs shade a thin stripe over at least part of the middle of the aperture area, and an even number of segments wide gives the flexibility to avoid segments in this strip. The sleeves for the 1.525-meter (5-foot) sleeve-bent mirrors can be easily made deep enough that these mirrors are stiff enough to need only three supporting rail segments under each mirror segment.

Therefore in an exemplary embodiment of the sleeve-bent mirrors the aperture is nominally a 6-meter aperture and it is sized so that the ribs and the rails are segment-bent from uncut 20-foot standard steel stock, and the mirror surface is composed of four rows of mirror segments with 12 mirror segments 530 in each row, with all mirror segments 530 being made from substantially identical flat sheets of mirror glass 533 that are approximately five feet (1.525 meters) long and twenty inches (0.5 meters) wide, with all mirrors 533 bent by sheet-steel sleeves 535 so that they are substantially perfect parabolas on their long axes and substantially un-bent on their short axes, with the sleeves for the mirrors in the two central rows being substantially identical to each other and the sleeves for the mirrors in the two outer rows being substantially identical to each other, with the sleeves on all mirrors being enough narrower, where the sleeves 535 contact the rails 520, than the mirror segment width so the mirror segments 530 can be packed edge-to-edge width-wise with a mirror sleeve's contact with any given rail 520 limited to one flat rail segment 522.

As will be seen later, using 20-inch widths for mirror glass 533 is practicable if a high accuracy mirror is used and the frame and mirror segments are well made and carefully assembled. If it becomes desirable to have more error tolerance, a second weaker local optimum is to use a 12-meter aperture rather than a 6-meter aperture. However, the 20-foot aperture preferred for round steel tubing is not the only local optimum aperture size. Square tubing comes in 24-foot lengths, allowing for fourteen 20-inch mirror widths plus a few inches for the rails needing to be a bit longer since they are on a curve outside of the glass mirror's curve, and fourteen segments instead of twelve provides more margin for assembly and tracking errors in achieving 1000 suns concentration. An aperture a few percent less than 24 feet, with 24-foot rib and rails of segment-bent square tubing, also forms an exemplary example, with four just-less-than-six-foot mirror segments spanning the rails and 14 segments in each rail. This allows as little as 70× concentration in the high-concentration direction for a 1000-suns focus when using 20-inch (½ meter) mirror segment widths, which greatly increases the error budget for materials, manufacturing, assembly and tracking.

The use of half-rails and half-ribs allows an aperture twice as big to be made from any given size of steel stock. A larger aperture for a given size of mirrors gives either a larger error budget, or can be used to achieve higher concentration at the same mirror segment width; a 12-meter aperture would allow up to 2000 suns concentration which could be useful with cells 761 such as the latest cells from Azur, which reach their maximum efficiency at 1700 suns or higher.

With the straight-lattice parabolic-support sub-rails for ribs as rails as taught earlier in this application, the maximum aperture size is greatly increased because standard lattice trusses come in lengths of many tens of feet (tens of meters), and an aperture is ideally two such lengths on a side. However to be able to not deform in the face of wind loading, the total mass of the trusses increases faster than the aperture area, and so truly large apertures are more costly per area. With today's costs of steel, glass and labor, the preferred size is still approximately 24 feet across for a focus of up to 1000 suns, with four times the maximum cost-effective glass length determining the exemplary aperture size.

Figure 5H:
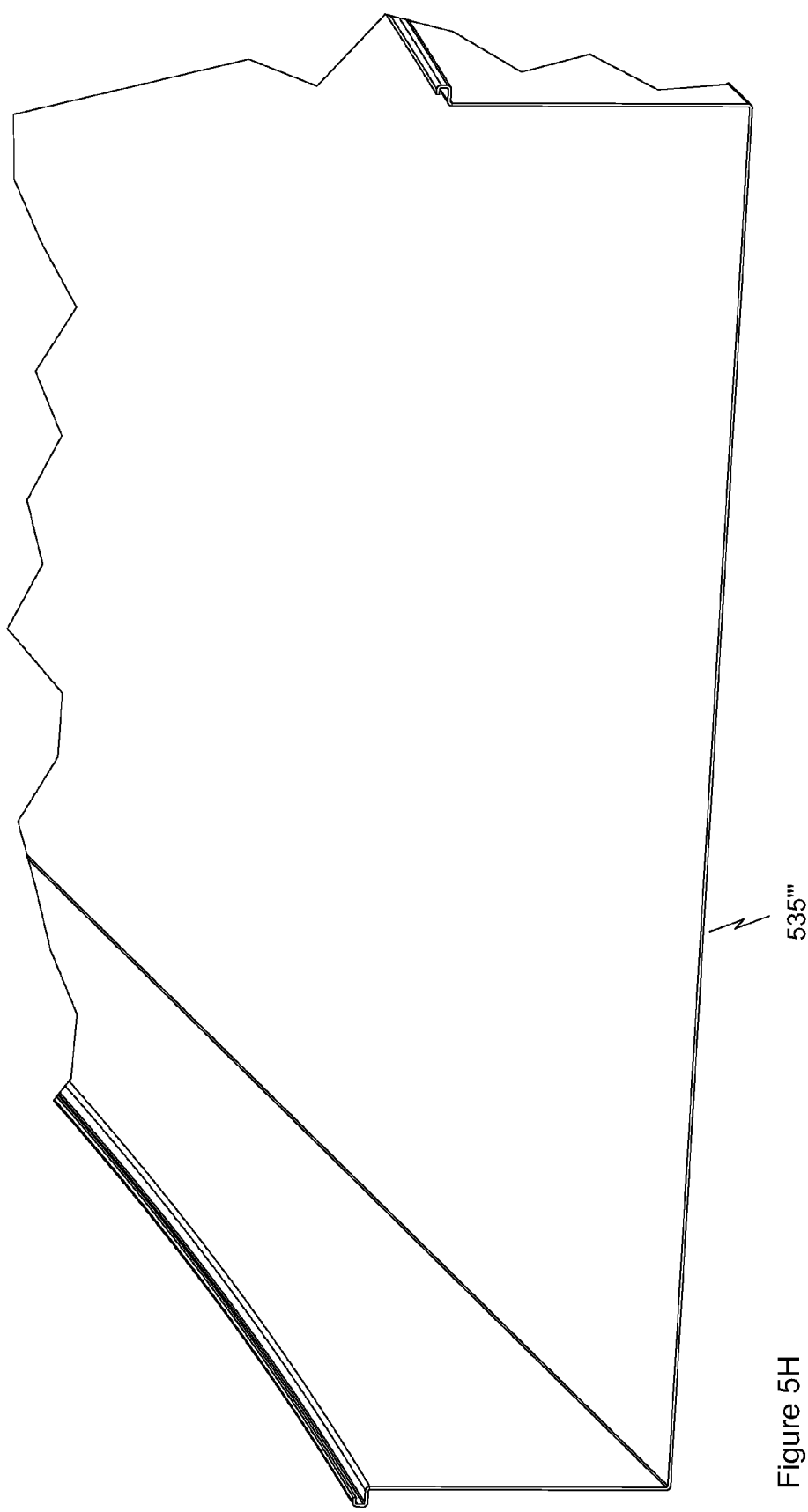
FIG. 5H is a depiction of a more straight-sided mirror sleeve for shaping a mirror and supporting it on two rails.

Once four mirror segments lengthwise are used to span an aperture, the depth of curvature of a mirror segment, even for a 24-foot (7.2-meter) aperture, is small enough (less than 2" or 5 cm) that a simple un-segmented mirror sleeve can be used without requiring excessive material. Even with steel less than a millimeter thick, such a sleeve can be rigid enough to require support by only two rails for a 6-foot sleeved-mirror length. Because the rail segments are parallel, a flat-bottomed mirror can be aligned with two rail segments, as shown in FIG. 5H, without needing to ride over those segments, and with no other segments involved to require riding over, a simpler vertical-walled mirror sleeve 535''' can be used.

To prevent the previously-discussed rotation of the direction of the curvature of the mirror segments at high rim angles from unduly broadening the overall focus in the high-focus direction, the mirror segments can be rotated by an amount substantially equal to the inverse sine of the product of the sine of the angle, relative to the plane of the aperture, in the direction of the length of the mirror segment and the sine of the angle of the mirror segment in the direction of the width of the mirror segment. Because any given mirror segment can only be rotated by one amount, it is optimal to rotate each segment so that the direction of curvature is aligned at the middle of the mirror, and thus the angle in the direction of the length of the mirror segment is measured at the middle of the mirror segment.

Figure 5I:
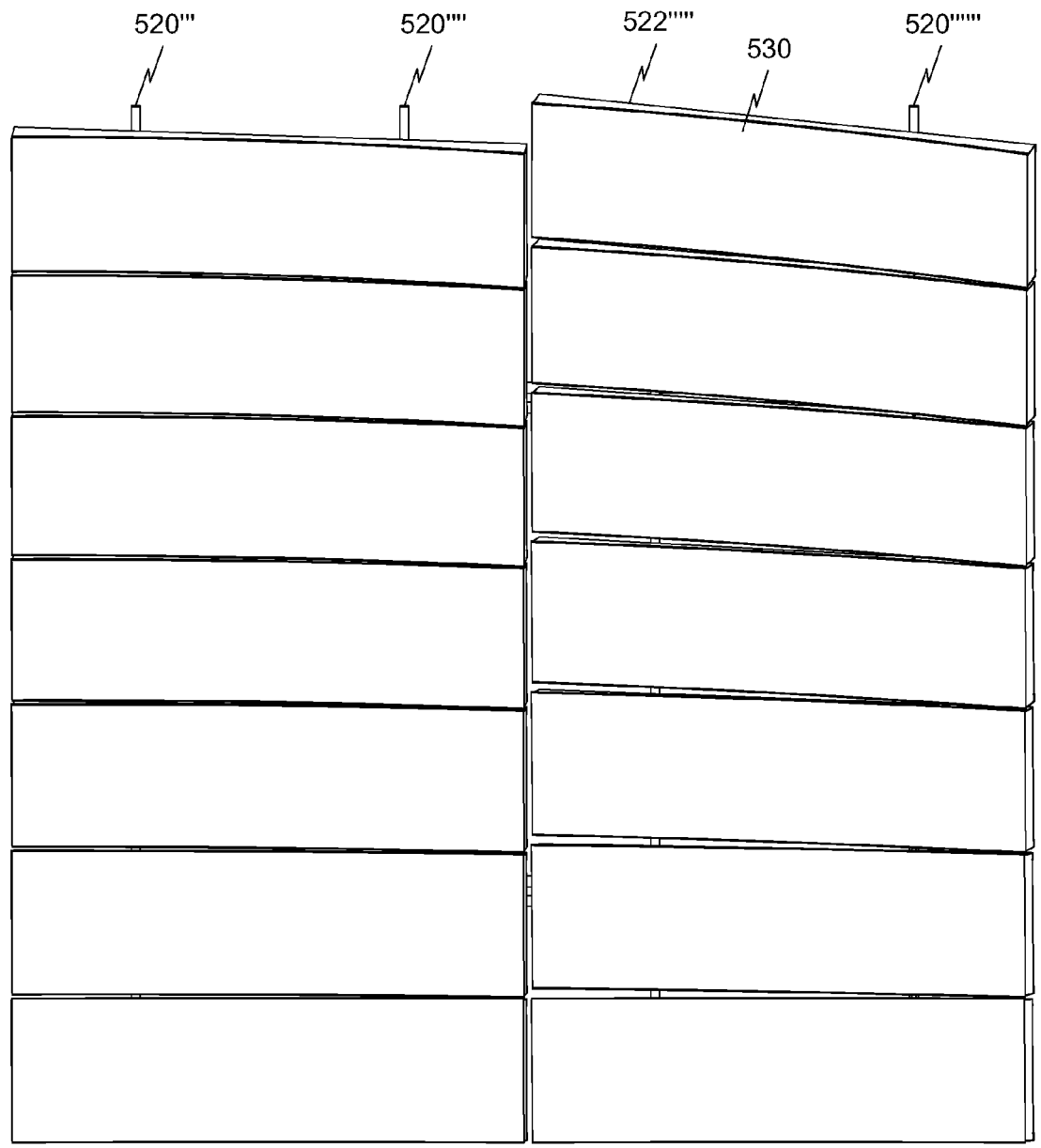
FIG. 5I is an illustration of the way paraboloid-of-translation mirrors on a paraboloid of rotation can be rotated to align their axes of curvature, thus aligning their focal planes.

Short mirror segments reduce the difference between the middle of the mirror and the ends of the mirror, allowing much more tightening of the focus. With mirror segments that each span ¼ of a 45-degree arc, the twist caused be curved rails is small enough (a few millimeters on a 7.2 meter dish mirror) that identical curved rails can be used. Thus with four or more mirror segments lengthwise spanning a dish with a 22.5 degree rim angle, as shown in FIG. 5I, curved rails and rotated mirror segments are exemplary. Because the splay of the mirrors does not widen the tracker at the corners, this does not impact the packing factor that trackers can achieve without contacting each other.

Because sines are nearly linearly proportional to angles for the angles of interest in the present family of embodiments, the angle at which to rotate the final mirror of a row of segments can simply be divided evenly across the gaps between the mirror segments of that row for a sufficiently accurate rotation of each mirror segment. Even simpler, and still sufficiently accurate, is to multiply the length of a mirror segment by the product of the sines discussed above, and then to divide this distance evenly among the gaps between the mirror segments 530 at their ends nearest to the axis of symmetry. This allows using a shim of this width between each mirror segment being installed and the previous mirror segment, sliding the end of the mirror being installed until it touches the shim, and then tightening the mirror segment securely in place before repeating the process with the next mirror segment.

Just as a differently curved mirror segment is used for each row of mirror segments on the side of a parabolic dish mirror, so to each row of mirrors has its own shim width. In especially preferred embodiments, each mirror segment can have a "half-shim" on each side of the appropriate end of the mirror so that the shimming becomes automatic. The width of this half-shim should be substantially equal to half the sine of the angle subtended by the width of the mirror segment as seen from the focus of the segment times the sine of the angle, measured relative to the plane of the aperture and in the direction of the length of the mirror segment, of the middle of the mirror segments when installed in its row of mirror segments. A single full shim per mirror segment could also be used, with a guide where the first mirror in a row will be installed to ensure that the first shim is aligned right.

Since using shims does reduce the packing factor by a few percent when rectangular glass sheets are used, in sufficient volume trapezoidal mirror segments wider on one end by the width of the two half-shims can be used so that the mirror glass of the segments itself provides the shimming. In smaller volumes, sleeves that allow overlap (such as those shown in FIG. 5G) could regain the packing density, although at the cost of a small amount of extra mirror glass and the complexity of having more types of sleeves to manage.

With at least four segments lengthwise spanning an aperture of up to a 22.5 degree rim angle, and pre-shaped mirror segments where each mirror segment is supported by only two rails, the problems with continuously-curved rails are reduced to where these become comparable in efficiency to segment-bent rails. One minor new consideration arises with the mirror segments being rotated so that their focal planes align with the long axis of the receiver: at the four points where a mirror segment crosses the rails, the corresponding points on the mirror sleeves are coplanar, while those on the rails are not coplanar.

The maximum amount of twisting effects is related to the square of the rim angle, so when designing for a tracker of sufficient accuracy, a rim angle of 16 degrees can be used to cut these effects in half, or a rim angle of 11 degrees can be used to cut these effects by a factor of four. However even for 20-inch (50 mm) mirror segment width and a 22.5-degree rim angle, the maximum deviation from coplanar points amount to only 3 mm for one point, or 1.5 mm for each of two points. This is small enough that the mirror segment can simply twist to accommodate the curved segments, and even for the corner mirror segments this only broadens the focus by about 3 mm*4300 mm/500 mm, or around 26 mm, on a receiver that has an acceptance length of 750 mm. Thus with four or more mirror segment lengths spanning a 22.5 degree rim-angle paraboloid, continuously-curved rails become preferred to segment-bent rails for a 1000 suns focus due to the insignificant broadening of the focus in the less-sensitive direction.

Figure 5J:
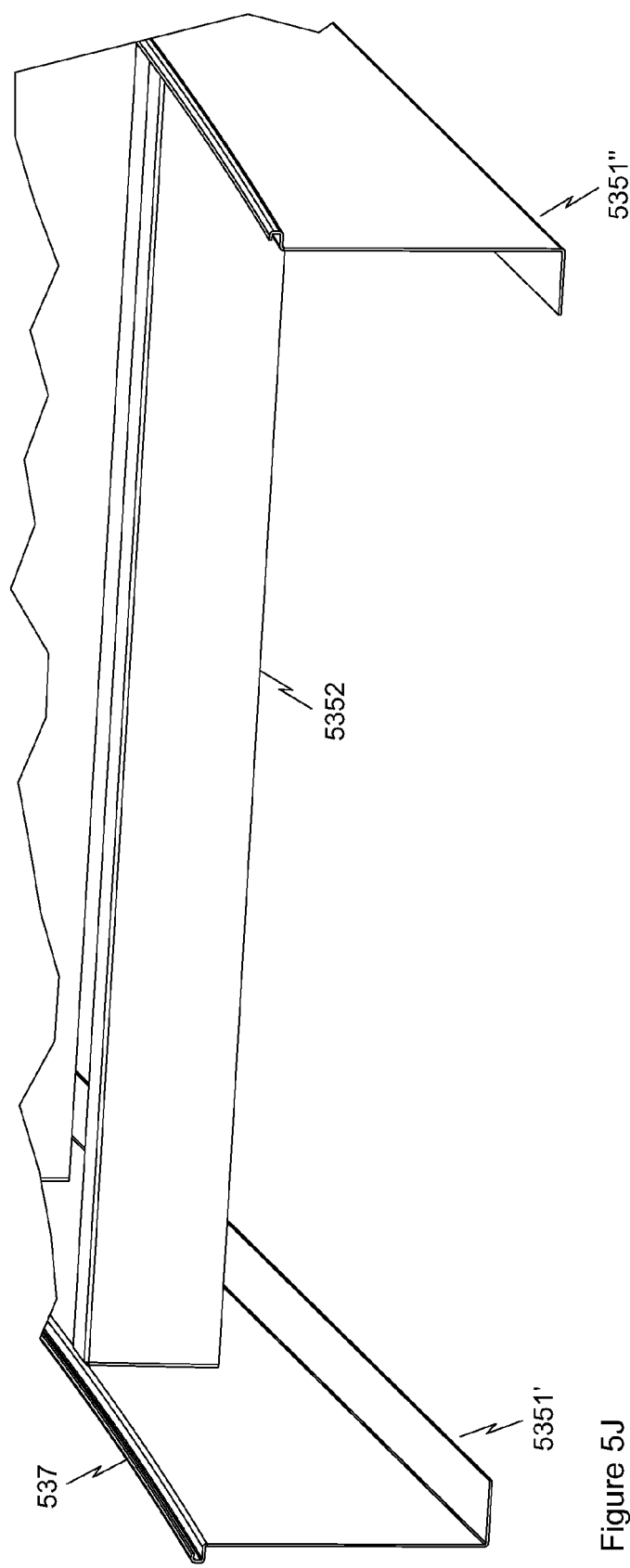
FIG. 5J is a depiction of easily-attachable side-sleeves for shaping a mirror and supporting it on two rails.

If current weatherproof solar mirrors are to be used anyway, a waterproof sleeve is not needed. Except right at the sides where the edge of the sleeve is supported by the rails, the bottom of the sleeve does not provide significant support anyway and can thus be eliminated, reducing the weight of steel needed. Commercial angle iron deep enough for a sleeve is much heavier than needed, but an angle can be folded in simple sheet steel roughly a millimeter thick to produce L-shape of appropriate thickness and thus strength. A parabolic arc can be trimmed into the top using a parabolic jig and a standard cutting head, and the same jig can be used to feed the steel 'L' into a bead-roller machine for roll-pressing in the groove 537 just as with a full sleeve. As shown in FIG. 5J, a simple straight-line fold then produces a "side-sleeve" 5351', with its mirror image 5351" used on the other side of the mirror segment. If the number of mirror segment lengths spanning the aperture is large enough or the rim angle of the aperture is small enough, then sleeves with a groove on a circular arc could be used, as a small enough section of a parabola closely approaches a section of a circle. A circular groove is symmetric, allowing the two side-sleeves to be identical rather than mirror images of each other.

Depending on the rail style the side-sleeves are to be attached to, a hole in either the bottom or the side of the L allows easy attachment with a bolt, cotter pin, or similar simple and sturdy fastener. Since all of the force of the wind on the mirror is transferred to the rail at the four attachment points, in more preferred embodiments the area around the attachment point is reinforced by reinforcing means such as sandwiching it between short pieces of angle iron (and even a flat washer will provide some reinforcement by transferring the stress to a larger area). Reinforcement is especially important with straight-lattice parabolic-support rails because these only support mirror sleeves at their edges rather than across the bottom.

Although such mirror segments will be sturdy after installation, impact to a side-sleeve during transport and handling would transfer stress efficiently to the glass. To reduce the risk of breakage, the two side sleeves for a segment can be braced to each other with cross-braces 5352. If two of cross braces are used, these can be placed where the side-sleeves will contact the rails; if additional cross braces are desired, these can be place at the ends and at the middle of the length of the side sleeves, providing equally spaced supports. If the mirror glass is thin enough that the width of a segment is too wide to withstand hail, more cross braces 5352 can be added. A gap-filling compound between the cross-braces 5352 and the glass 533 eliminates the need for sub-millimeter accuracy in the height of the cross-braces.

Figure 5K:
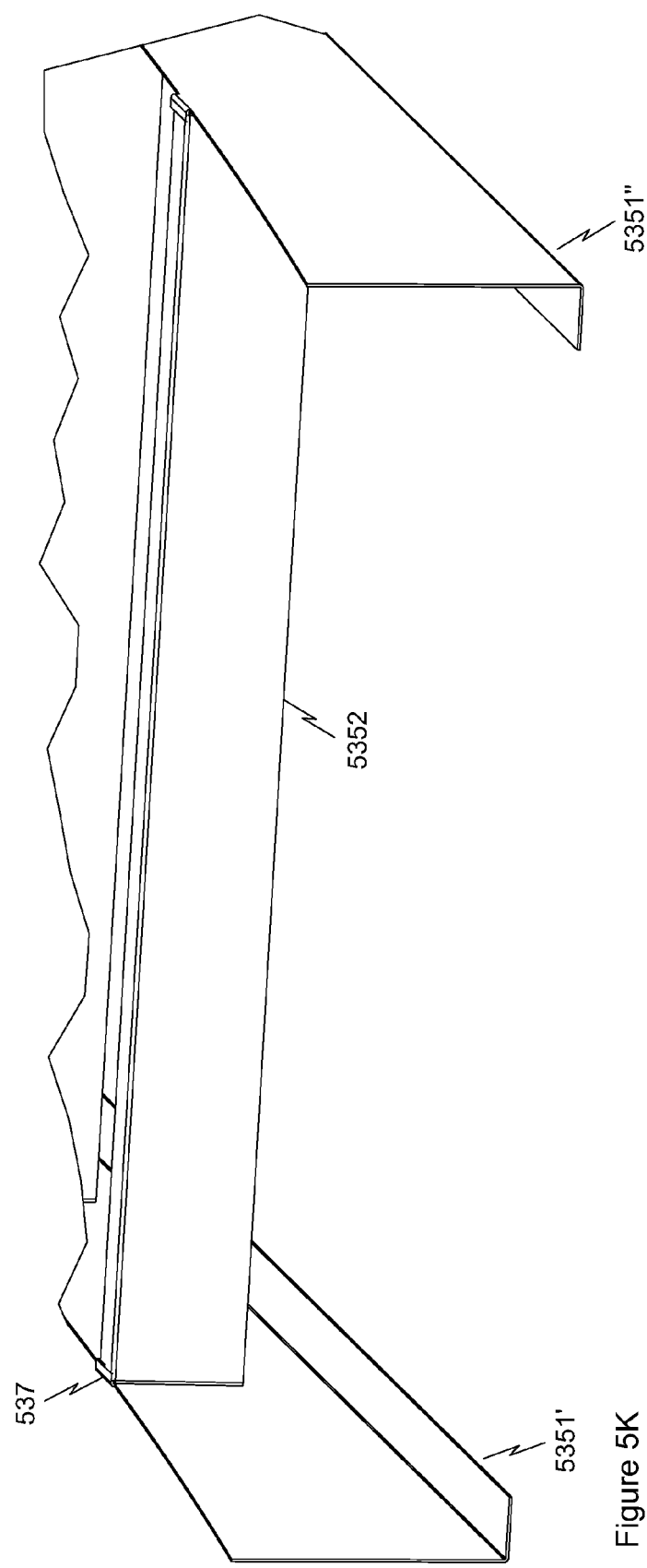
FIG. 5K is a depiction of easily-attachable side-sleeves for shaping a mirror and supporting it on two rails, but using cross braces and folded tabs instead of grooves to shape the mirrors.

Rather than a groove, tabs can also be used to hold the mirror segment in the sleeves. Alternating tabs at two levels, one set under the mirror glass and one set over the mirror glass, could hold the mirror glass securely in place, and a gap filling compound would prevent the need for sub-millimeter accuracy in the folding of the tabs. However the use of cross-braces simplifies the use of tabs because the cross braces, especially along with the use of a gap-filling compound, keep the glass from bending too far, and hence the tabs only need to prevent the glass from un-bending. As shown in FIG. 5K, a small tab 537' of metal can be folded over above where each cross-brace 5352 will go so that when the sleeves 5351' and 5351" and the cross-braces 5352 are installed on a sheet of mirror glass that is bent over a parabolic mandrel, the glass will be sandwiched between the cross-braces and the tabs. It is possible to have the tabs formed as a part of the cross-braces, but installation then involves sliding the cross-braces onto the glass, which is awkward. The tabs can also be separate piece that are attached to the sleeves, but that requires extra labor.

In preferred embodiments the tabs 537 are produced as a part of the sleeves 5351' and 5351". Because of the parabolic arc, there will generally be extra material that would need to be trimmed from the sleeve material anyway, and some of this can be retained and folded to form the tabs. There would be no such material at the ends of the sleeves, but tabs are not needed there anyway as the only force needed there will be supplied by the cross-braces. Although where there are cross-braces the tabs preferentially are aligned with the cross braces, extra tabs near the ends prevent loss due to hyperbolic curvature and provide substantially continuous support for curving the mirror. If allowing sufficient extra material for these tabs would significantly reduce the packing of the sleeves in the material that the sleeves are cut from, then separate tabs for near the ends can be riveted on. A continuous fold-over can also be used, but is harder to produce in small runs than discrete tabs, and tabs also block less light. A continuous fold-over, however provides better protection from hail, and which is more preferred depends on external factors such as the cost of thicker solar glass and the frequency of large hail-stones.

Figure 5L:
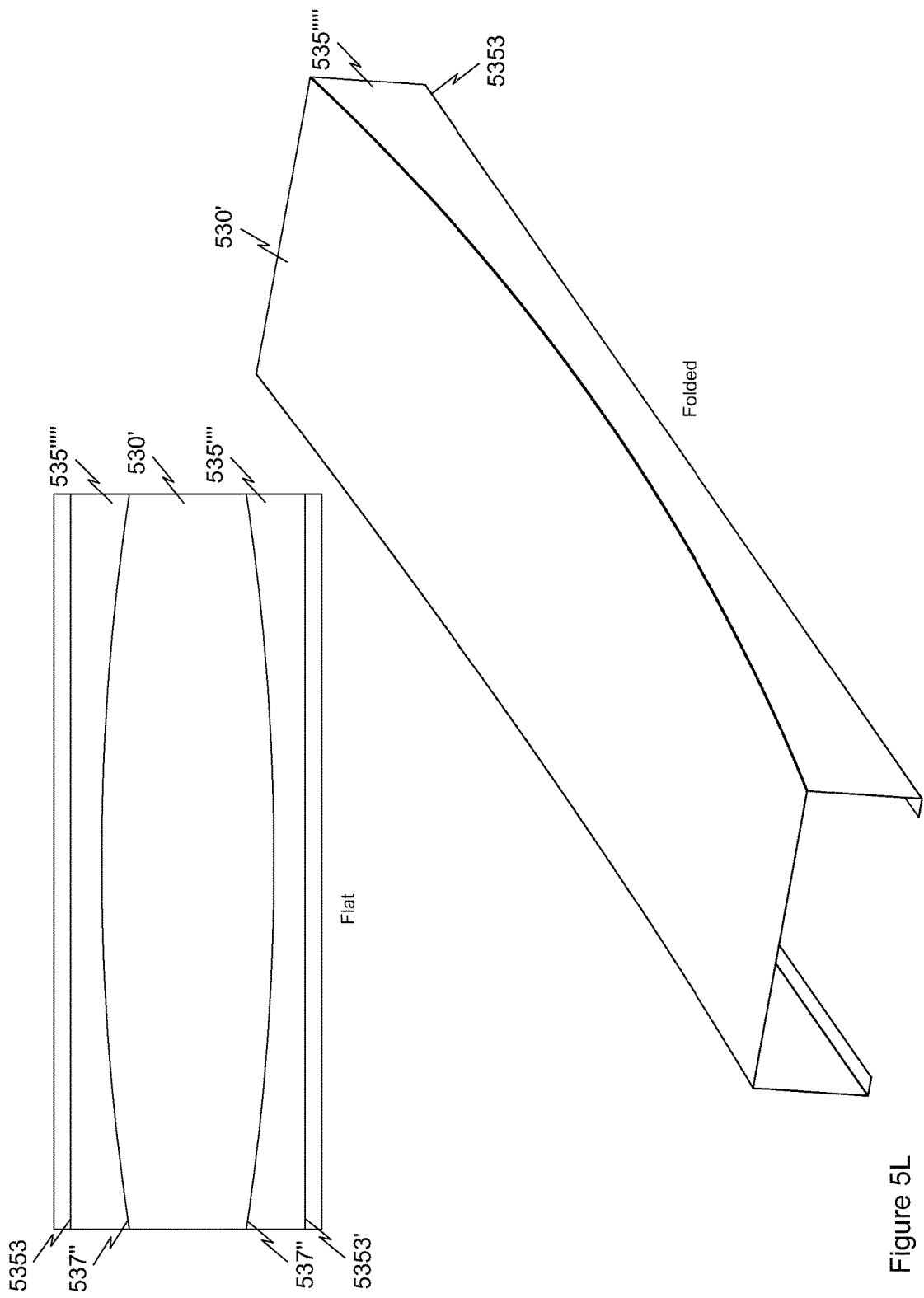
FIG. 5L is a depiction of a metal or plastic mirror shaped by folding on parabolic arcs.

As shown in FIG. 5L, another way to shape initially-flat mirror segments is to create a fold 537" on each side of a flat mirror segment where said fold follows the desired arc of the mirror segment when it is curved. Because mirror materials such as semi-rigid plastic sheet, glass or metal will bend only in one direction at any given point, folding along an arc on each side of a sheet forces the middle of the sheet 530' to adopt a curve that follows the arc of the fold. Effectively the 'sleeves' 535"" and 535""" are produced by the folding.

The 'sleeves' must bend with the same curvature that the mirror bends, but the 'sleeves' 535"" and 535""" will typically be significantly narrower than the body of the mirror sheet 530 and so some stiffening, such as provided by straight folds 5353, may be required. However this stiffening should not be sufficient to prevent these 'sleeves' from bending as much as the body of the mirror bends.

For metal or plastic mirror segments, punching or drilling a dotted line of closely-spaced small holes along an arc will weaken the material along the arc enough that the material will fold quite readily along the arc. For plastic, a solution that weakens the material less is to heat up a thin metal band that is curved in the shape of the desired arc, and to press the hot metal into the plastic to thin the plastic along the arc. The plastic is then allowed to cool before folding so that it does not stretch significantly during folding. Because the stiffness of a material scales with the cube of its thickness, even a modest thinning will create an arc of significantly lower stiffness, and a fold will naturally follow that arc.

Such mirrors can stack flat for shipping, or can even be rolled for convenient transport. With a roughly ⅓ to ½ millimeter (15 to 20 mil) thickness of a tough mirrorized plastic such a polycarbonate, for example, a 500 mm×2 meter mirror could be rolled into light-weight tube under 10 centimeters (4 inches) in diameter and only 600 mm long, and could then be un-rolled and folded in seconds into a short parabolic trough capable of achieving at least 50× concentration, useful for boiling water or cooking foods, or providing 200 watts for charging batteries from a small row of silicon solar cells on the outside of a pipe filled with water. One could even use a number of such mirror segments in parallel, with their widths following a parabolic arc again created from folding a flat sheet, to achieve several kilowatts of energy at the very high concentration needed to make high-efficiency solar cells cost effective, from a set of mirrors that could be rolled into a cylinder that one could tuck under one's arm.

One oddity of this technique is that the width of the resulting mirror segment is not constant because each side bulges out by an amount equal to the depth of the curve of the segment. With four mirror segment lengths spanning an aperture, the depth is only around 50 millimeters (2 inches) even for a 7.2 meter (24 foot) aperture with a 22.5-degree rim angle, so the loss in packing density is only about 7% for 500-millimeter-wide (20-inch-wide) mirrors. Either doubling the number of mirror segment lengths to span the aperture, or cutting the rim angle in half, would reduce this loss of packing density by a factor of four.

Figure 5M:
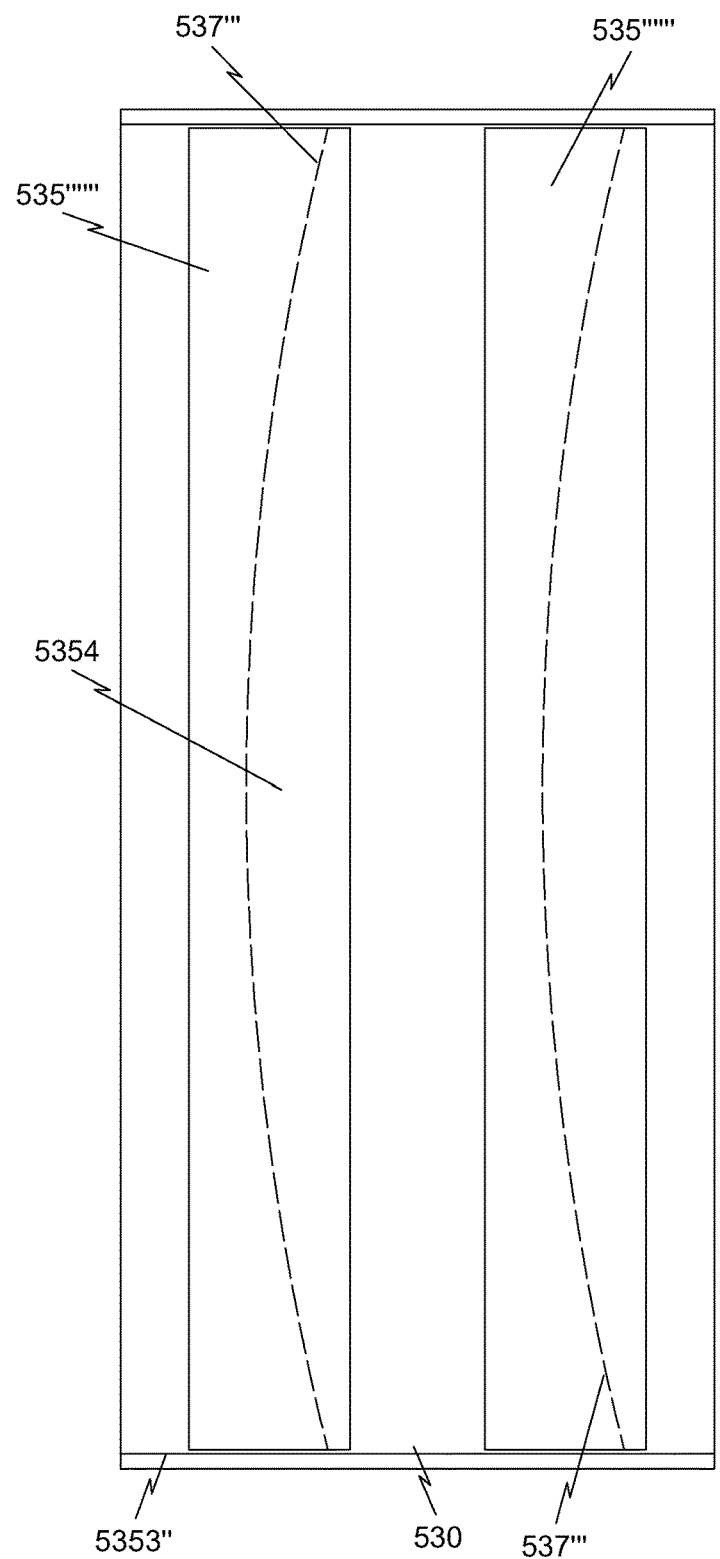
FIG. 5M is a depiction of a glass mirror shaped by folding on parabolic arcs.

As shown in FIG. 5M, glass mirror segments 530 can also be shaped by the same technique, but with the folds 537''' being in a material that has sections 5354 attached to the glass as well 'sleeve' sections 535""" that get folded relative to the glass. While for shallow curves one such fold 537''' along the middle of the glass would shape the mirror segment reasonably well, two or more such folds provide much more accuracy, and when using attached materials, the folds 537''' can all be identical rather than requiring mirror-image curves on the two sides of the mirror segments.

Optional stiffening means 5353" become preferred for long troughs to reduce the number of parabolic-fold members needed (in non-brittle mirrors these can be folds in the mirror material, otherwise such means can be attached to the mirrors). These attached-folding-material embodiments also support trapezoidal mirrors, and thus allow higher packing density when rotated mirror segments are used.

All of these mirrors that are bent in on direction at once are also easy to clean with a flat squeegee, which is a pronounced advantage over compound-curved molded mirrors, whether in a dusty desert or a smoggy city. In sleeved mirror designs, the sleeves can even act as guides for a squeegee, easing the use of a multi-squeegee arm to clean multiple mirror segments at once.

For the rim angles and number of segments lengthwise preferred for the parabolic dish embodiments of the present invention, the folded-parabolic-arc mirrors just discussed deviate from being rectangular by less than 5% of their area. For the rim angles and number of segments lengthwise preferred for the parabolic dish embodiments of the present invention, the trapezoidal mirrors discussed earlier (to have the mirrors automatically 'shim' themselves to rotate their planes of curvature for tightest focusing), also deviate from rectangular by less than 5% of their area. Thus although not quite truly rectangular, such mirrors are considered 'substantially rectangular', and are included in further discussions of 'rectangular mirrors' unless otherwise specified.

Figure 5N:
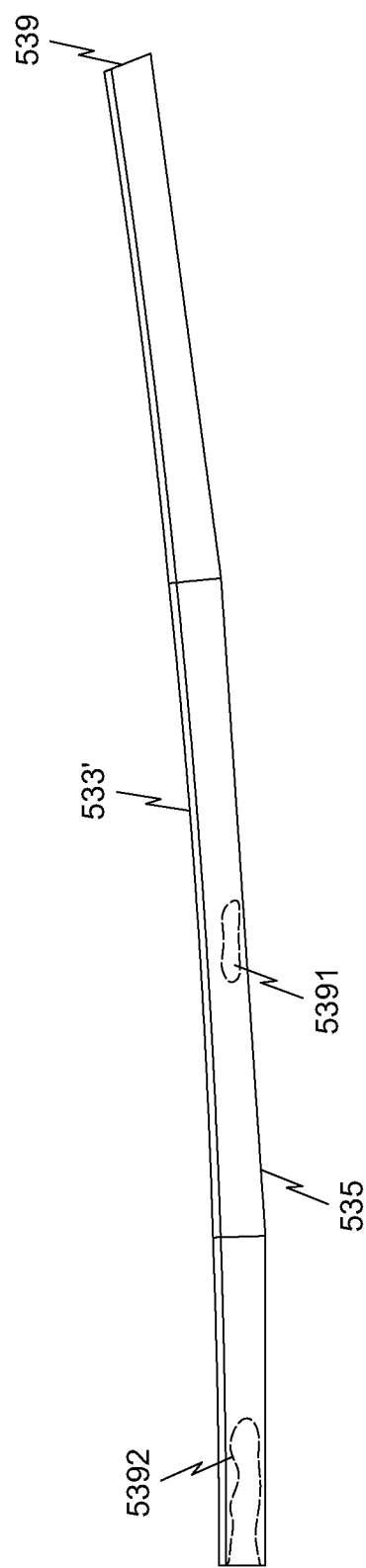
FIG. 5N is a depiction of a weatherproofed sleeved glass mirror.

An improvement unrelated to the curvature of the mirror can be made, as shown in FIG. 5N. Weatherproof glass mirrors 533 are more expensive than glass mirrors 533' without a weatherproof back-coating, and such coatings also typically contain significant amounts of lead, which is undesirable in an environment-friendly clean-energy product. In designs such as shown in FIG. 5C or 5H, however, the ends of the sleeve 535 can be sealed by seals 539 to keep out moisture, allowing the less-expensive, more environmentally friendly, lead-free mirrors 533' to be used. To ensure that any moisture making it past imperfect seals 539 does not attack the mirror coating, an inexpensive moisture absorption means such as silica gel, as may typically be found in packages for moisture-sensitive items (and typically in a packet 5391 labeled "Silica Gel, Do Not eat"), may be placed inside the mirror sleeve 535 before the sleeve is sealed. Because changes in atmospheric pressure would then put considerable stress on the glass 533 and the sleeve 535, a flexible 'pressure bladder' 5392 can be used on one end to allow the internal pressure to freely match the atmospheric pressure while maintaining a water-tight seal. Whether this is more preferred than half-sleeves or other preferred embodiments that use less sheet steel depends strongly on the relative costs of sheet steel and weather-proof solar mirrors, as well as on the value of having lead-free mirrors.

Fourth Family of Preferred Embodiments:
Improvements in Receiver Supports for
Large-Tracker Solar Energy Systems with One or a
Few Foci Per Tracker, Using Modern Materials and
Manufacturing The mirror and frame arrangements of the preferred embodiments above are suitable for many different kinds of receivers, including solar thermal (e.g. Stirling engine), solar chemical (e.g., Sandia Labs' 5R process for splitting carbon dioxide into fuels), photovoltaic (e.g., high-efficiency multi-junction cells, and combined heat and power (e.g., photovoltaic with waste heat captured for supplying hot water). In all of these cases the receiver must be held at the focus, and plumbing and/or wiring must be connected to the receiver, and this should be protected from the intense heat of the concentrated sunlight if the tracker is for any reason misaligned. The receivers are also generally complex and may need to be accessed for maintenance or cleaning, and while the tracker could be heeled over to allow ladder-access to the receiver without standing on the mirrors, ideally the receiver would be readily accessible for maintenance at as low a height as possible. Also, imperfections in construction may shift a focus slightly from its intended position, and while with one compound mirror on a tracker the tracking itself will take care of this, in embodiments with more than one compound mirror per tracker it is useful to be able to adjust the receiver positions slightly so that when the tracking keeps one focus on one receiver, all foci will be on their respective receivers. There is therefore a need for a simple receiver support system for the above embodiments that supports a receiver at a focus and allows fine adjustments in the receiver position if the focus is off slightly from its intended position, and which supports plumbing and/or wiring that are protected if the tracker is misaligned.

Figure 6:
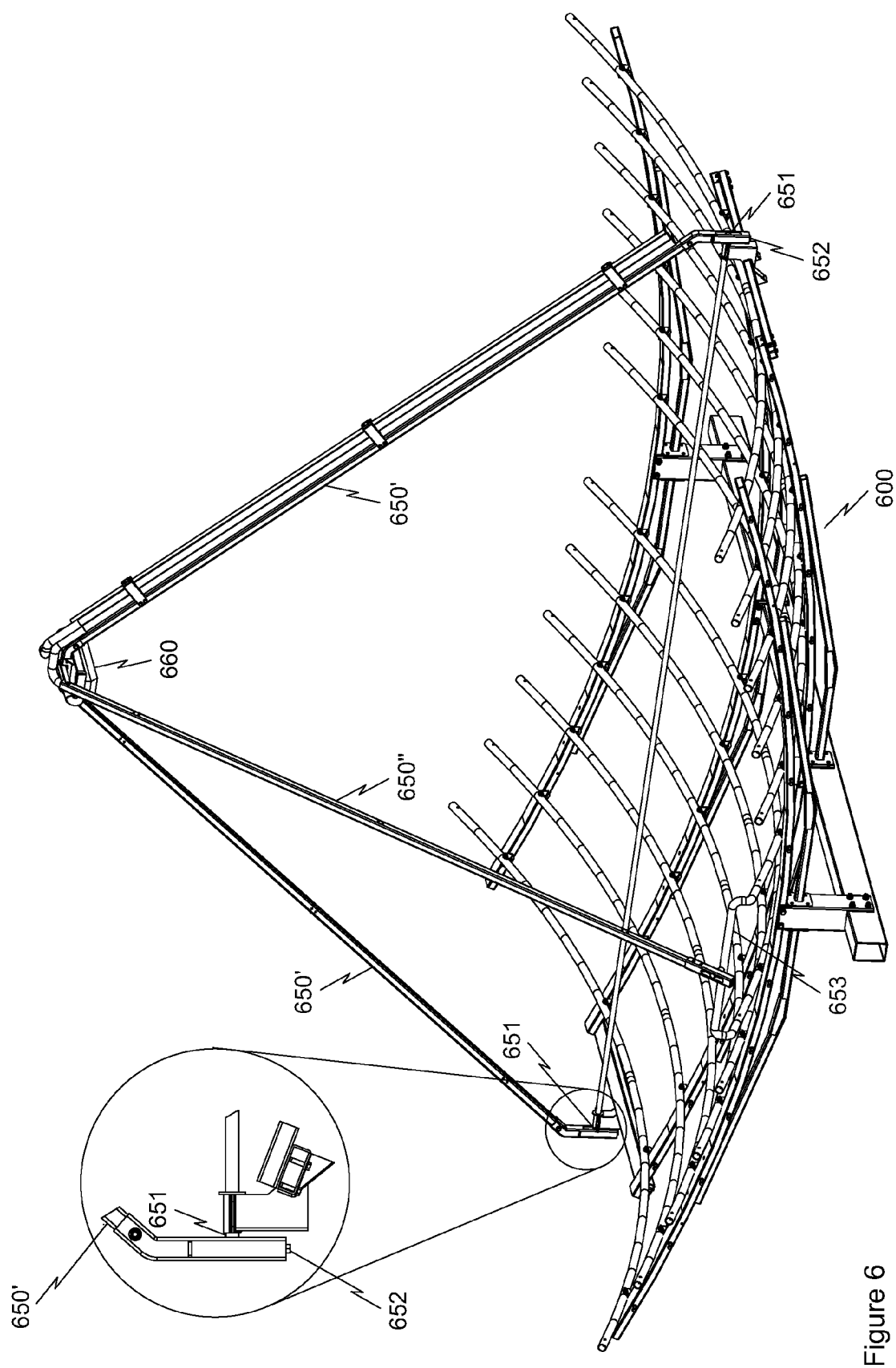
FIG. 6 is a depiction of a three-legged receiver support for a large-aperture parabolic mirror that allows easy access to the receiver for maintenance and allows easy fine adjustments to the receiver position (could rotate 90 degrees)

While a two-legged receiver support could be made stiff enough, the thickness of material required would cast a larger shadow on the receiver than a three-legged receiver with thinner legs, and a fourth leg adds proportionately more shadow than strength, making a three-legged receiver support preferred. Another embodiment with minimal shadow is two legs with two guy wires; but the guy-wire tension increases the leg strength needed, and thus the shadow, more than replacing a leg with two guy wires saves. While most three-legged receiver supports, such as that shown in Brantley et al. in U.S. Pat. No. 4,011,854, use substantially-equally-spaced legs, using two legs 650' that are opposite one another with pivots 651 at their bases, as shown in FIG. 6, allows the third leg 650" of the three-legged receiver support to be used to raise and lower the receiver 660 for installation and maintenance. Receiver support rest 653 will prevent a lowered receiver from resting on the glass of the mirrors.

By equipping the receiver legs with extension adjustment means 652 at their bases, these readily accessible means can be used for fine positioning of the receiver 660, which is useful if assembly misalignments cause the best focus to be slightly out of its expected position. Having all three legs so equipped is especially preferred because it allows adjustment in all three dimensions: lengthening the left leg while shortening the right leg will shift the receiver to the right while reversing this will shift the receiver to the left, shortening the center leg will shift the receiver forward while lengthening it will shift the receiver back, lengthening all three legs by an equal amount will raise the receiver while shortening the legs will shift the receiver higher while shortening them will shift the receiver lower, and these orthogonal motions can be combined as needed for fine positioning of the receiver relative to the mirror frame. This adjustability relative to the mirror frame is especially important when there is more than one mirror and mirror frame 600 per tracker (as shown in later embodiments), as it allows the receivers 660 to be adjusted relative to one another so that they are all at their respective foci at the same tracker orientation. In an especially preferred embodiment, all extension adjustment means 652 are identical for manufacturing efficiency and ease of assembly.

It is also preferred to reduce costs slightly by minimizing the amount of mirror in the permanent shadow of the receiver support apparatus, as is well known in the art, to the extent that it is convenient. In some embodiments where a rib brace is needed, this can be used to support the receiver support pivots 651. As is well known in the art, plumbing connections for coolant fluid for a receiver, and electrical connections for the power produced by a receiver, can be run up one or more of the receiver supports so as to not cast additional shadow on the mirrors.

The adjustability relative to the mirror frame can be extended to allow alternate receivers to be supported on the same receiver support. If the adjusting is automated, it will be able to switch receivers on command. Even a screw-type mechanism could make such an adjustment in a few minutes, and with two pre-set position a screw adjustment could switch receivers in less than one minute. With hydraulics the switching time could be brought below 10 seconds, which matches or exceeds the dispatchability even of hydroelectric power.

A switch to an alternate receiver could also be made by re-pointer the whole mirror dish. This eliminates the need for a separate adjustment mechanism, but it requires an extra sensor and the moving of a large structure. This would also introduce off-axis aberration to at least one of the receivers, significantly reducing the concentration. For a high-efficiency photovoltaic receiver, the photovoltaic receiver would be kept at the highest concentration focus to keep its cost down, while for a silicon photovoltaic receiver the photovoltaic receive cost is so low that it would be better at the lower concentration focus to raise its efficiency slightly.

While the cost of a high-efficiency photovoltaic receiver and the cost of a full-capacity turbine and generator for solar thermal are high enough that combining them wouldn't currently make economic sense, there are combinations that will be very effective. In a preferred embodiment, solar thermal with storage is used for base-load power generation, reducing the size of the turbine and generator needed (typically by over 50%) because the power is generated over a longer period of time.

When peak power is needed and the sun is shining (which usually coincide in high-sun areas due to air-conditioning demands), the adjustment means 652 of the center leg can be shortened by enough to pull in a photovoltaic receiver. Not only can the photovoltaic receiver immediately start producing power, but the solar thermal system can continue producing power from the stored heat, too. With high-efficiency cells generally being roughly as efficient as a high-temperature (2-axis focusing) thermal plant, a plant with base-load thermal plant with 50% of full-capacity thermal can during peak times produce 50% more power than its photovoltaic receivers alone could, and three times its base-load power rating.

On the other hand, even at 1000 suns high-efficiency cells are currently too expensive to be optimal for use during only part of the day. However, moderate efficiency crystalline silicon solar cells cost a minute fraction of what high-efficiency cells do, and hence supplementing a solar thermal receiver for base-load thermal with a crystalline-silicon receiver for peaking power is an exemplary embodiment. A silicon-solar-cell receiver would also be inexpensive enough to have as a backup for a high-efficiency receiver (sharing cooling and the inverter), although given the reliability of solid-state electronics this should not be necessary in installations with multiple dishes.

Even with its separate cooling system, a silicon photovoltaic receiver would add less than 20% to the cost of a solar-thermal-with-storage system, and transforming solar power from non-dispatchable to being dispatchable when needed most would greatly increase its value. With the best current silicon cells, a plant could produce base-load power and then more than double its output when peaking power was needed.

The bulk of this less-than-20% adder is the cost of an inverter for this photovoltaic power output. Today's inverters are optimized for extremely high efficiency because they are designed used continuously while the sun is shining, and they are designed to be used with expensive photovoltaic systems. The improvements to photovoltaic systems as taught herein greatly reduce the cost of the input power to the inverter, and thus already shift the optimum inverter toward one that costs significantly less even at the expense of lower efficiency. Furthermore an inverter for peaking power is used only a small portion of the time, which shifts the optimum inverter toward even lower cost even at an additional expense in efficiency. This will significantly reduce the cost of a photovoltaic peaking receiver on a solar thermal base-load system.

With separate cooling, the second largest cost adder of a photovoltaic peaking system with silicon cells would be the cooling for the photovoltaic cells. However once a heat rejection system for cooling the photovoltaic cells is added, this system can be used for cooling the re-condenser for the solar thermal system, thus avoiding evaporative cooling and the significant water use that evaporative cooling entails. This will be discussed at greater length in the family of preferred embodiments of the present invention that deals with heliostats embodiments, but it is also applicable here.

Figure 7A:
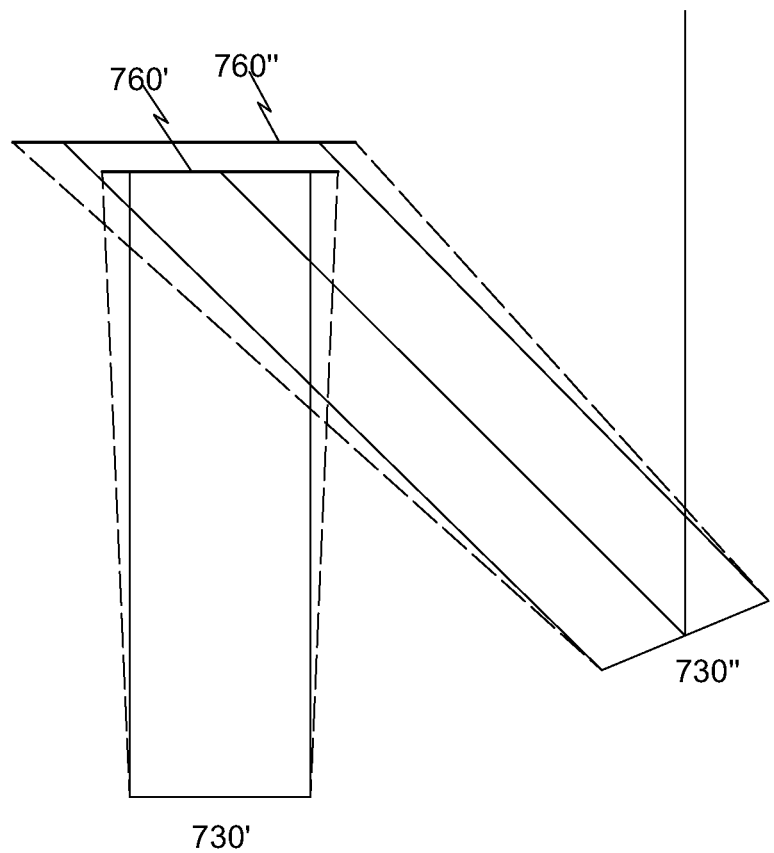
FIG. 7A is an illustration of the way light from the edge and central mirror segments of a large parabolic mirror impinges on a receiver at the mirror's focus.
Figure 7B:
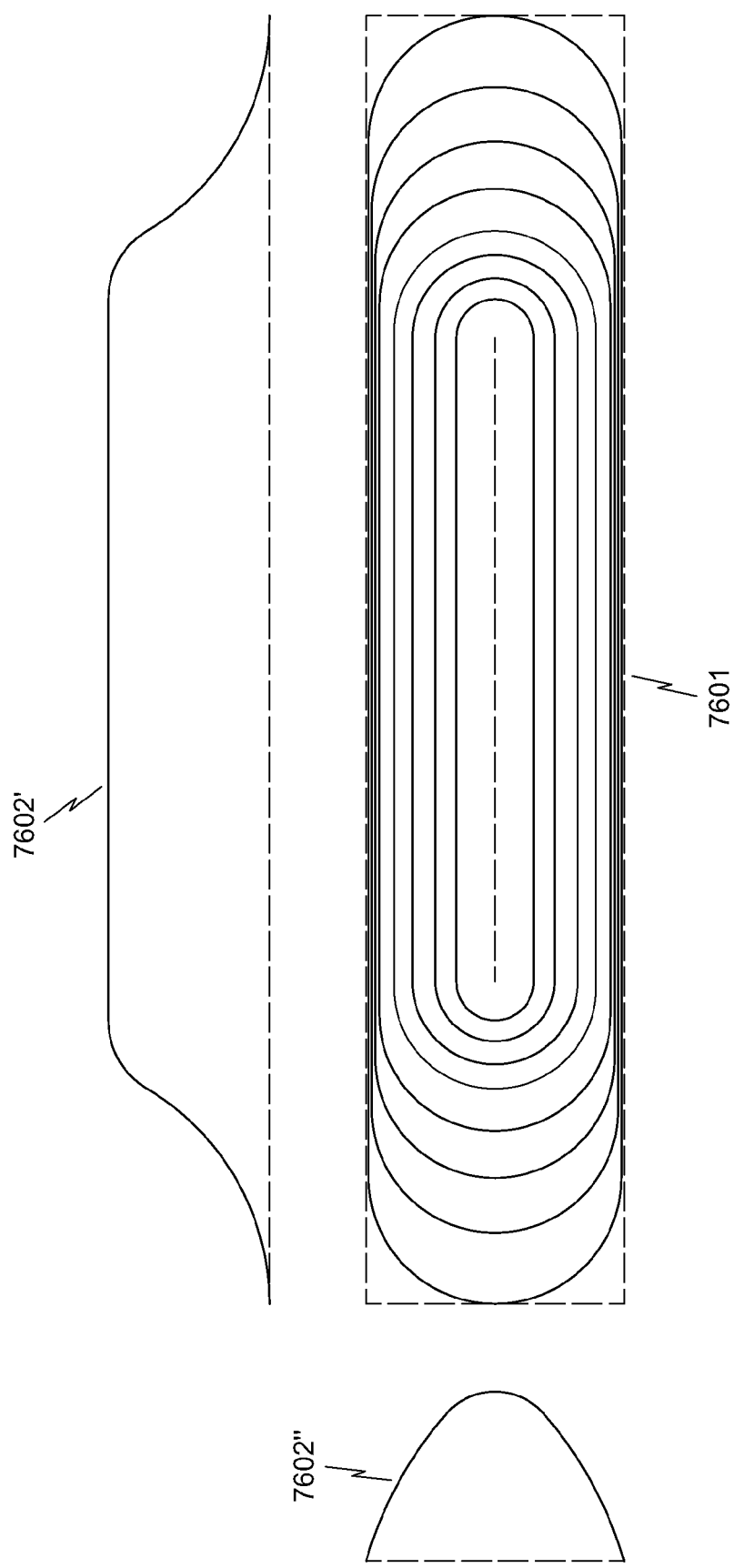
FIG. 7B is an illustration of the expected contour plot of the intensity at the focus of a large-aperture parabolic mirror made with sleeve-bent mirror segments.

Fifth Family of Preferred Embodiments: Improvements in Receivers for Large-Tracker Solar Energy Systems with One or a Few Foci Per Tracker, Using Modern Materials and Manufacturing With all of the mirror segments in a compound mirror reflecting onto the same focus, shadows on one mirror segment will not significantly affect some parts of the receiver more than others. None the less, the intensity of light at the focus will not be completely even, as shown in FIG. 7A. In particular the light from mirror segment 730' near the center of the overall mirror spreads the least and strikes a smaller receiver area 760' near the center of the receiver, while the light reflected by mirror segment 730" near the edges of the overall mirror has more distance to spread due to the sun's diameter, and also strikes the receiver obliquely, spreading over a larger area 760". Even if all mirror segments (730', 730", etc.) could be perfectly aligned, the foci from the various segments would overlap as shown in FIG. 7B as a simplified 'contour plot' 7601 of intensity. For clarity a cross section along the long axis of contour plot 7601 is shown as 7602' and a cross section along the short axis of contour plot 7601 is shown as 7602". Slight misalignments increase this area, but any misalignment of less than half the width of the sun's image still covers the central area of the receiver, so slight misalignments have the effect of enlarging the focus by spreading the light from the edges of the focal spot rather than by diminishing the light at the center.

For solar thermal receivers this uneven focus is easy to handle by having the heat transfer fluid travel through a pipe that spirals from the edge of the focus toward the middle, so that the hottest part of the focus is passed through last. But while this mitigates the effect, the width of the focus should still be minimized to reduce the overall receiver area, and thus the heat loss from the receiver.

For photovoltaic systems, an uneven focus is more problematic because a receiver with one big photovoltaic cell, or numerous smaller cells wired in parallel, would produce very low voltage at tremendously high current, which would require massive (and thus prohibitively expensive) electrical cabling. For example, a 6-meter square mirror with an array of today's high efficiency cells in parallel would produce roughly 5000 amperes at approximately 2.5 volts. However, if cells are in series, current flowing from one cell must pass through the next cell, and if the cells have unequal illumination their photo-currents will not match. The cells will try to adjust themselves, trading voltage for current or current for voltage to equalize their currents; this costs only a little efficiency when the illumination differs by only a few percent, but rapidly decreases the efficiency of the whole series of cells if one cell is significantly under-illuminated. When cell illumination is likely to be uneven, bypass diodes are thus used to electrically remove a cell from a series of cells if its photocurrent is low enough that it would reduce the efficiency of the whole string to where the strings power output would be higher without the under-illuminated cell. It should be noted that excess illumination on a cell simply wastes most of the excess illumination rather than affecting the efficiency of all the cells in a whole series of cells.

Figure 7C:
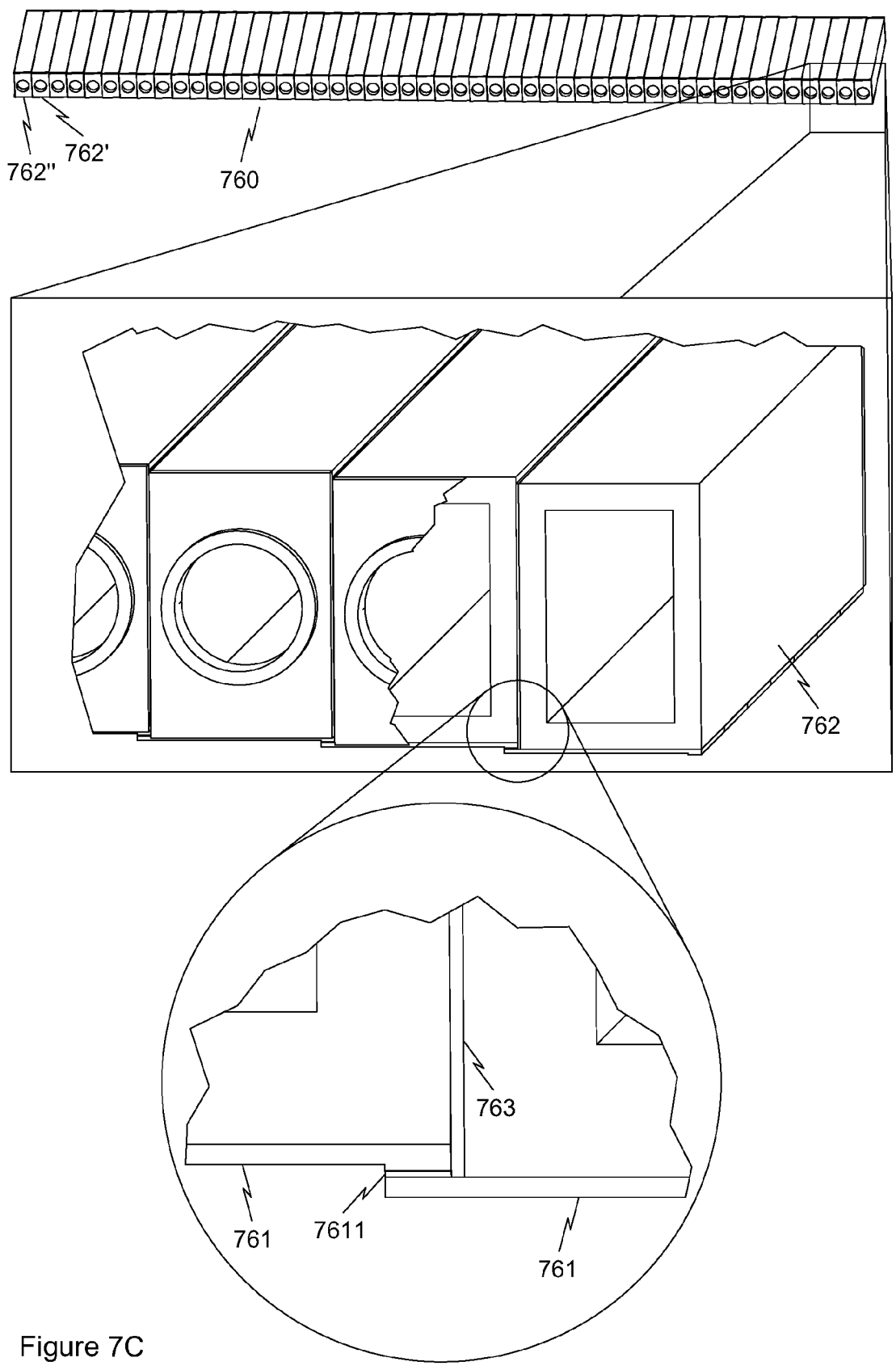
FIG. 7C is a depiction of a photovoltaic or co-generation receiver for a large-aperture parabolic mirror made with sleeve-bent mirror segments.

While the overall focus from the above segmented mirror is not even, and the total illumination on a cross-section 7602" parallel to the length of the individual mirror segments (the short axis of the contour plot) is not even, the total illumination on a cross-section parallel to the width of the individual mirror segments is very even for a distance that is equal to the width of the mirror segments (minus any error from misalignment of the segments). As shown in FIG. 7C, for cells 761 that have one polarity of contact on the front edges and the other contact on the back face (as the leading high-efficiency cells do today), an optimal receiver 760 for such a focal intensity contour pattern 7601 is to use a series of short cooling tubes 762 with one or more cells 761 in parallel on each tube 762, with cooling tubes 762 aligned substantially parallel to the lengths of the mirror segments, with the tubes 762 of cells 761 connected in series along the receiver axis parallel to the widths of the mirror segments (e.g. 730' and 730" from FIG. 7A). In an especially preferred embodiment, the tubes 762 are substantially rectangular in cross-section to allow maximum coolant flow at minimum pressure, allowing the tubes 762 to be packed side by side. If the rectangular tubes 762 are rotated very slightly out of the plane of the face of the receiver 760, this allows the cells 761 on one tube 762 to be shingled on to the cells 761 of a neighboring tube 762 so that if the cells 762 have a top bus-bar on one side, the top bus bar of one tube of cells can be soldered directly to bottom contacts of the next tube of cells, such as with solder 7611. Ideally the cells 761 just have a bus-bar on one side of their tops, as this arrangement makes no use of a bus-bar on the other side of the cells' top surfaces and it would needlessly reflect light.

While the absolute best solid thermal conductors known are diamond and carbon nanotubes, the best strong yet easily machinable high thermal conductivity materials to which the silver back-contacts of today's high-efficiency cells 761 can easily be soldered (solder forms a thin metallic attachment layer with extremely low thermal resistance) are silver and copper, and copper is considerably more cost-effective than silver. If coolant runs through a sufficiently effective radiator to keep the cells 761 relatively cool, the thermal expansion mismatch between the copper tube 762, with a TCE of around 15 PPM/° C., and the cell with a TCE of around 6 PPM/° C., will not cause enough stress to crack a cell; if necessary, however, cells 761 could be solidly attached only at their center and a liquid metal interface material could be used ("*Extending Photovoltaic Operation Beyond* 2000 *Suns Using Liquid Metal Thermal Interface with Passive Cooling*", 33 PVSC).

Thus with today's cells and materials, preferred coolant tubes are rectangular copper tubes that provide an extremely low thermal resistance from the intensely illuminated cell to the coolant inside the tube. To allow close tube packing to avoid leaving significantly less-cooled areas of the cells, more preferred tubes 762 can be insulated on their sides with a thin layer of electrical insulation 763 to prevent direct electrical contact between neighboring tubes 762. When practical, this electrical insulation may be of a high thermal conductivity electrical insulator such as aluminum nitride (and thin-film diamond would be even better should it become affordable); however as long as this electrically insulating layer is thin relative to the tube wall thickness, its thermal conductivity is not critical.

By using an electrically conductive attachment to the metallic tube, the tube 762' on one end of the series of tubes 762 also serves as a sturdy low-resistance common contact for those cells. For convenience an additional dummy tube on the other end of the series can have a copper 'set of cells' soldered to it, allowing it to serve as a low-resistance common contact for that end of the series of tubes. As is well known in the art of making radiators, the tubes 762 can terminate on each side in a larger pipe, or manifold (not shown), with the input to one larger pipe near one end of the series of tubes and the output from the other large pipe near the other end of the series of tubes, thus ensuring comparable fluid paths through the tubes 762 and thus even coolant flow and even cooling of the cells 761.

However there are several challenges that arise in connecting the densely packed cooling tubes to the intake and output manifolds. First, the tubes are so densely packed that if they simply terminated in a manifold, the tubes would occupy an entire side of the manifold and thus seriously weaken the manifold. Second, with copper tubes side by side, soldering the tubes to the manifolds would short the tubes together, and if the insulation surrounds each tube at its end, solder does not stick well to most electrical insulators and any solder touching the tube beyond the insulation would also short the tubes. Although it would be possible to epoxy the copper tubes to a plastic manifold, most plastics are hard to epoxy to, so this would leave a fragile connection for the critical cooling fluid.

If the tubes are wide enough that a slight restriction would not overly impede coolant flow, the cooling tubes could be narrowed rather than bent, allow them to be attached (e.g., with epoxy or another non-conductive adhesive) to a non-conductive manifold on each end. Narrower tube would allow enough manifold material between the pipes to hold the assembly together. This is simple enough to be preferred for cells wider that roughly 0.5 millimeters.

Figure 7D:
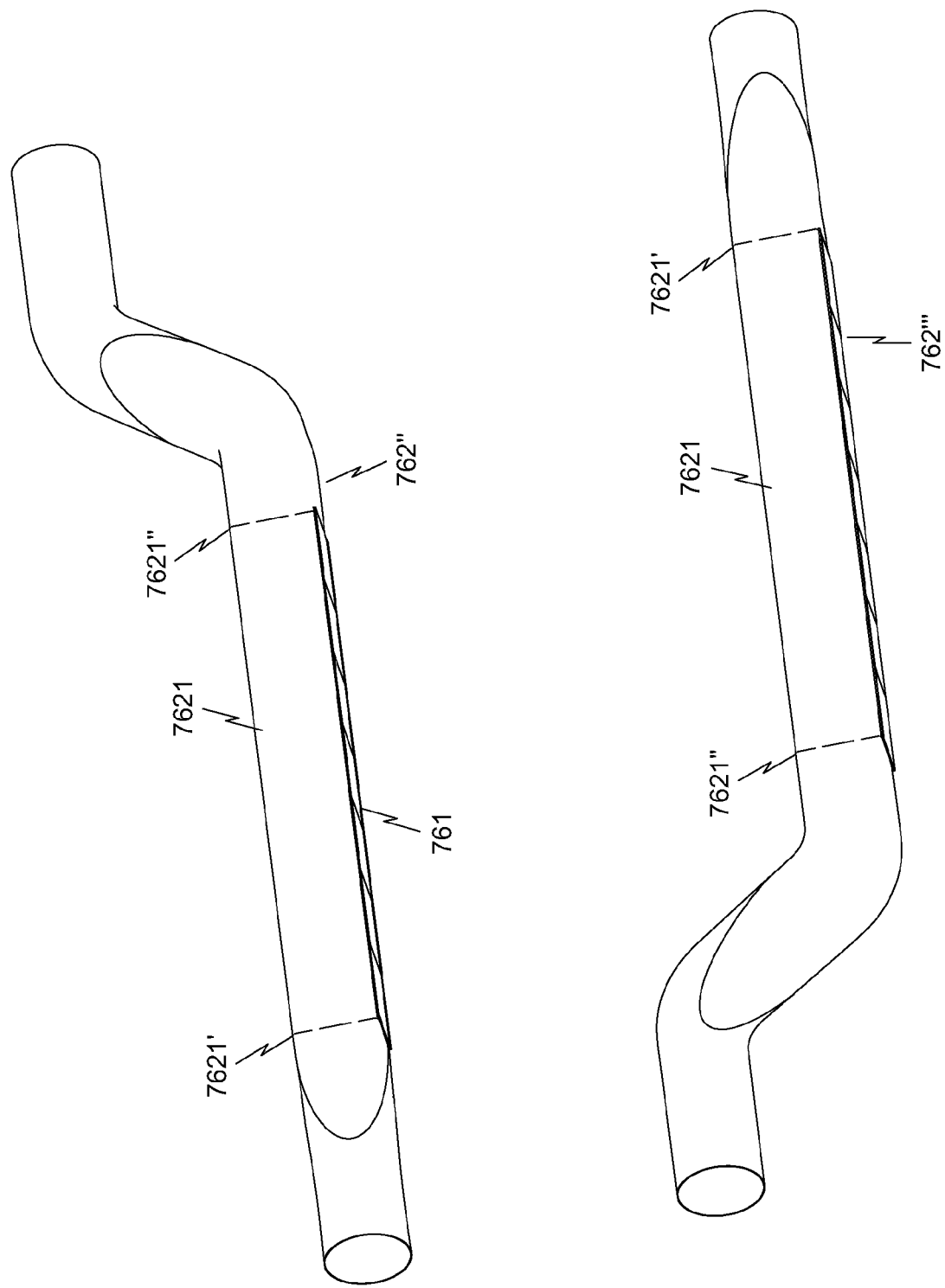
FIG. 7D is an illustration of a conductive cooling tube that allows identical tightly packed cooling tubes to be connected to intake and output manifolds through insulated sections with minimal restriction of the coolant flow through the tubes.

For very narrow tubes, however, this would restrict coolant flow. But if each cooling tube were to be bent upward (away from the cells) on one side beyond a flat face covered by one or more cells, then, as shown in FIG. 7D, tubes 762" that bend up to the right and tubes 762''' that bend up to the left can be alternated when assembling the side-by-side cooling tubes for the receiver. If the cells 761 are put onto the tubes before the tubes are assembled side-by-side, then half of the tubes need to be assembled with the cells' bus bar on one side and half on the other side, but with on the order of one hundred cooling tubes needed for a 24-foot (7.2 meter) dish, this is likely to be an automated process anyway. And if the cells are soldered to the tubes after the tubes are assembled side by side, the alternating tubes introduce no complexity beyond simply placing every tube in the alternate direction from the preceding tube.

Once the cells are assembled on the tubes and are soldered shingled from tube to tube, any movement of the tubes relative to each other would break the thin and relatively fragile cells. To prevent the cells from breaking at the slightest force on the tubes, the tubes can be assembled first with a tiny amount of a high temperature adhesive between the tubes so that the adhesive will hold the tubes together even after the cells are soldered to the tubes and soldered shingled to each other. Addition cooling tube array reinforcement can be added to the back-side of the cooling tubes.

If the cells are soldered to the tubes first, a higher temperature solder can be used for this. During assembly a tiny amount of high-temperature adhesive can be placed between the tubes. After the adhesive sets, a lower temperature solder can be used to establish the electrical connection between the protruding bottom of the cells on one cooling tube and the top of the cells they are shingled to on the adjacent cooling tube. This prevents the fragile cells from ever having to be the only things holding the tubes together.

Once the array of cooling tubes has been assembled, it can also be further reinforced on its backside if needed. This produces a fairly sturdy array of side-by-side copper tubes with a thin layer of insulation between them, with cells soldered directly to the tubes and with the cells shingled in series from tube to tube along the long axis of the receiver. The alternating upward bends beyond the cells reduce the density of the tubes beyond the cells, leaving space between the tubes. This space can be used to allow an insulating section such as a plastic tube to fit around the cooling tube, thus allowing it to be connected through insulating means to the manifold on each side. The manifold itself can have a face tall enough to accommodate the two rows of cooling tube ends, allowing the manifold to retain structural integrity. With insulating sections between the copper cooling tubes and the manifold, the manifold can be of any material. And the attachment for the insulating plastic tubing sections can even be formed en masse, for example, by molding them into the manifold face or by pressing through a copper sheet that is against a die, and then soldering that sheet to the face of the manifold.

Another way of protecting the cells from mechanical stress during assembly is to first solder a thin (e.g. 0.5 millimeter thick) flat piece of copper sheet to each tube, extending it as far as the cells will overhang, and then soldering the cell to the copper plate. This, however, introduces a slightly additional thermal resistance to cooling the cells, and also only reduces the fragility of the assembly moderately as the copper plate will ideally only overlap the adjacent cells by a small amount (e.g., a few tenths of a millimeter) due to the cost of the cell area covered.

However, the above means for reinforcing the receiver do not take the difference in thermal coefficients of expansion between copper and silicon or germanium-based multi-junction cells into account. A preferred way to prevent thermal and mechanical stress from breaking the cells is to place the cooling tubes in a jig and to attach their backs securely to a block of a rigid non-electrically-conductive material whose temperature coefficient of expansion (TCE) matches that of the cells. For today's germanium-based triple junction cells, some glasses have excellent TCE matches, and for silicon cells, a slab of metallurgical-grade silicon could be used. If needed for additional strength, additional blocks of the TCE-matched material can be bonded across the fronts of the cooling tubes just beyond where the cells will be attached.

Cells can then be screened with solder paste and placed on this assembly in the desired (in this case shingled) pattern, and the whole receiver run through a soldering oven such as is used in assembling printed circuit boards. Since operating temperatures will be cooler than the soldering temperature, the copper tubes will contract relative to the cells and the TCE-matched substrate, no force will accumulate from cooling tube to cooling tube and any local forces will be compressive and unlikely to fracture the fragile cells.

The cooling tubes can be made from round copper pipe that is pressed into a rectangular cross-section in the region 7621 where the cells will be attached, between start-of-rectangular-cross-section 7621' and end-of-rectangular-cross-section 7621". Sharper corners on at least the side of the tube where the cells will be affixed can be achieved by slightly scoring the tubes lengthwise in this region to provide a starting line for the copper to bend more sharply on. This minimizes the distance of the farthest point on a cell from the highly conductive copper and the cooling fluid in the tube (the sharpness of the other corners is not important as they do not influence the cooling of the cell significantly). Pressing only the central sections of the rectangular tubes makes attachment of insulating sections between the tubes and the manifolds easier.

Having a set of cells 761 soldered to a copper tube 762 ensures high electrical conductivity between the cells on the tube, which ensures that only their total photocurrent (rather than their individual photocurrents) is important in matching photocurrents with other tubes of cells. Referring back to FIG. 7B, this makes the less even illumination profile 7602" parallel to the length of the mirror segments unimportant for balancing the photocurrents. For the longer 'series direction', only at the ends of the series is the total illumination (as shown in profile 7601') significantly different from tube to tube, and so bypass diodes are needed only for the sets of cells on the tubes on the ends. With each tube serving as a contact for a set of cells, the bypass diodes can also be on a tube-by-tube basis rather than a cell-by-cell basis. Even so, the very ends of the focal spots would be too weakly illuminated to contribute much power per cell so this would require too many cells and bypass diodes to be cost-effective. There is thus a need to reduce the size of these diffuse tails of the focal spot.

The art of solar concentrator contains numerous examples of homogenizers of sophisticated design that even out the illumination on a focal spot. While many of these could be adapted to the present invention, these are more complex than optimal, creating the need for a better solution. With well-aligned primary mirrors, the main contributor to the size of these under-illuminated tails is the cosine factor from the mirror area at the edges of the aperture; with a rim angle of 22.5 degrees, the length of the image from the outermost mirror segments is cos(22.5)/cos(2*22.5) or 1.33 times wider than the length of the image from the innermost mirror segments. One very effective solution would be to use narrower and narrower mirror segments, with a segment at an angle A having a width of cos(2A)/cos(A) times the width of the central segments. But having custom-width mirror segments would complicate manufacturing and assembly, even if only a few 'steps' of mirror widths were used.

Figure 7E:
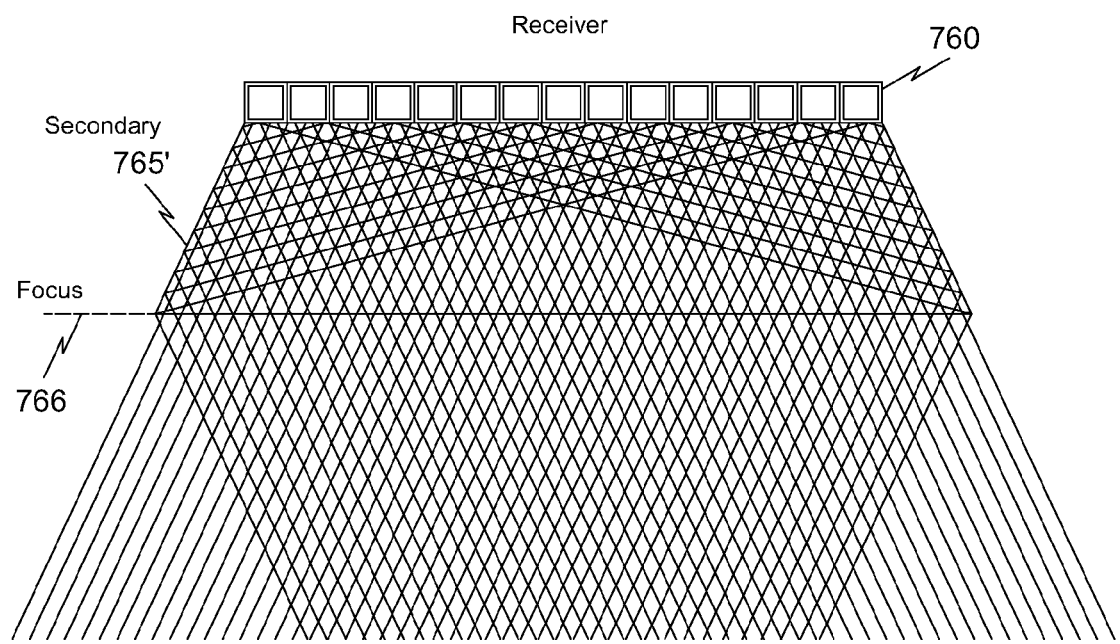
FIG. 7E is a depiction of a flat secondary concentrator for increasing and evening out the concentration of the focus for a photovoltaic or co-generation receiver for a large-aperture parabolic mirror made with sleeve-bent mirror segments.

As shown in FIG. 7E, a properly placed and angled simple flat secondary mirror 765' on each end of the receiver 760 can be used to reflect the diffuse 'tails' onto the main focal spot. For a main mirror of 22.5 degree rim angle, a flat secondary mirror at an angle of approximately 11 degrees will reflect these tails across the receiver 760, with the most light added where any misalignment would have made the primary illumination weakest. The 'mouth' formed by secondary mirrors 765' should be at the narrowest part of the incoming light, and thus at the focus 766; this pushes the receiver 760 beyond the focus 766, as shown in FIG. 7E.

Figure 7F:
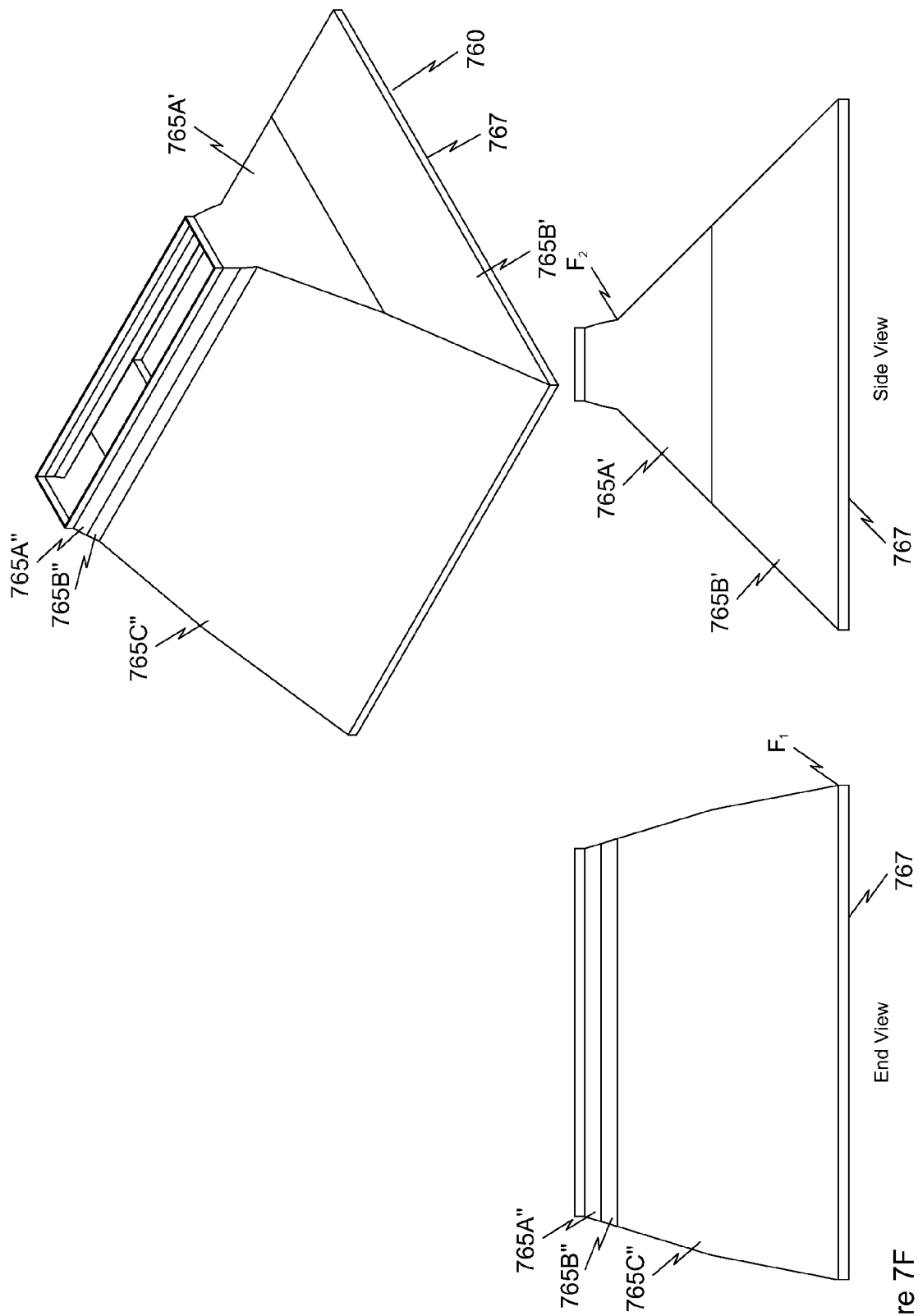
FIG. 7F is a depiction of using unequal focal lengths in the sleeve-bent and the segmented directions of a large-aperture parabolic mirror, to allow flat-mirror secondary concentrators in both directions to achieve maximum concentration at the same distance from the center of the mirror.

While a curved secondary mirror (such as is well known in the art of secondary concentrators) could concentrate the light by a further 1.4× (for the rim angle of the primary mirror as discussed above), the light from the innermost edge of the secondary concentrator would strike the receiver at a grazing angle at which much of the light would be reflected. Since this would be the most intensely lit part of the secondary concentrator, a mathematically perfect secondary concentrator shape both adds complexity and cuts optical efficiency. A preferred compromise is to use a few flat mirror facets to tighten the focus. For example, as shown in FIG. 7F, two secondary concentrator facets on each end, $765_A'$ at 17 degrees and $765_B'$ at 11 degrees, will tighten the focus by 1.22-to-1, and without grazing angles or molded glass mirrors.

Smaller secondary mirrors 765" (shown as $765_A"$ and $765_B"$) along the sides of the receiver could likewise tighten the focal spot in the high-concentration direction but because the optimal focus in this direction is much narrower (being focused by a continuous parabolic curve rather than by an approximate parabola made with wide segments), the secondary mirrors 765" in this direction would be much shorter and the receiver being the height of secondary mirrors 765' beyond the focus 766 will allow the light to spread out again in this high-concentration direction, greatly reducing the concentration and increasing the size of receiver needed. While a curved secondary mirror on each end could somewhat reduce this mismatch in secondary mirror heights, unless the mirror segments are very narrow these heights of 765' and 765" still will not match. The same factors would also apply using refractive secondary optics as well as with the reflective secondary optics discussed above.

However by designing the primary mirror to have a shorter focal length on the axis parallel to the widths of the mirror segments, the ideal positions of the receiver 760 can be made to match even with flat secondary mirrors 765' and 765". Since the difference in the two secondary reflector heights is (W/2)*(cos(2A)/cos(A))/sin(S), where W is the mirror segment width, A is the aperture rim angle and S is the angle of the flat secondary mirrors to a line normal to the receiver surface (or the weighted average of the sines if multiple facets are used), an exemplary embodiment of the present invention therefore uses ribs that are curved to a focal length shorter by this amount than the focal length that the rails are curved to so that the tightest focus in each direction occurs at the mouth of the secondary mirrors in each direction. Although the critical parts of the end secondary mirrors 765' and the side secondary mirrors 765" are not the same depth, the shorter secondary mirrors 765" may extended with inactive parts $765_C"$ (which may be of clear glass to minimize blockage of light bound for the primary mirrors) at angles of at least twice the aperture's rim angle (to not block any of the concentrated light converging toward the focus) until they are the same height as the longer secondary mirrors 765'. This produces a convenient mouth for mounting a cover-glass 767, a thin sheet of very transparent glass that forms a weather-tight seal to keep dirt and moisture from the receiver cells. Alternatively the extensions can be eliminated and the cover glass can be at the mouth formed at the height of the shorter side secondary concentrator.

If the mirror segments were perfectly aligned, the illumination from this arrangement of curved primary mirror segments and flat secondary mirrors 765' and 765" would be sufficiently even that bypass diodes could be avoided. In most cases, though, it is preferred to include bypass diodes on a few cell/cooling tubes 762 on each end of the receiver 760 to allow for slight misalignments in mirror segments, for tracker inaccuracies and/or for wind loading on the mirrors slightly altering the shape of the ribs and rails beyond the error budget. With the above embodiment and the very high aspect ratio of the focus, bypass diodes on fewer than 10% of the cooling tubes would allow reasonable tolerances for manufacturing and assembly.

The determination of the ideal aspect ratio of the receiver, and thus the width of the mirror segments, is another complex challenge with many factors, including the optimal concentration on the photovoltaic cells (which in turn depends on the efficiency of the cooling and the cost of the cells relative to tracker and mirror area), the cost of various cell widths (including cooling tube installation), the ideal input voltage for the inverter, the accuracy of the tracking in each direction, the alignment accuracy achievable during assembly, the amount of time that there will be significant wind loading, the increase in labor costs of smaller segments relative to other costs, the cost of mirrors in various widths, and the strength of the mirror in various widths relative to the frequency of hail of various sizes. Hence instead of calculating an exact value for a single situation, it is more useful to calculate an approximate value and to teach how to adjust it to a given situation.

The voltage produced by a receiver 760 of the above design is largely proportional to the number of rows of cell/cooling tubes 762 that are in series in the receiver. In general a higher voltage is better because it reduces the current for a given amount of power, and thus lowers resistive losses and allows thinner wires. As a very general rule, the focus should thus be as tight as practical in the direction parallel to the length of the mirror segments, and the focus should then be relaxed parallel to the widths of mirror segments until the concentration is ideal for the cells and their cooling. A narrower focus in one direction allows a wider focus in the other direction, increasing the number of cells in series to better match the inverter input, and, when the best inverter match is achieved, allowing shorter and wider coolant tubes to be used to minimize resistance to coolant flow.

While with an imaging concentrator it is possible to focus approximately 105× in the direction of the length of the mirrors, years of experience with linear-focus parabolic troughs has yielded an empirical 'maximum practical' focus of 80 suns with a purely imaging concentrator. While it is possible with a physically ideal reflective non-imaging concentrator to focus to over 200 suns, the simple flat non-imaging secondary concentrator described above can only increase the primary imaging concentration by approximately 1.2 times (when used with a primary mirror with a 22.5 degree rim angle) to roughly 95×. With a daily/seasonal track, a slight additional increase will come from the tracker moving only slowly on this seasonal axis, and hence even an extremely high accuracy will not require continuous movement and the tracker misalignment losses will be smaller than with a linear focus tracker with its daily rotation; hence the limit of practical concentration will be slightly higher than this, or roughly 100× (still comfortably short of the 125× theoretical maximum for this arrangement). Using curved secondary concentrators could increase this further, but the 17-degree secondary concentrator already has some light reaching the cell surface at a fairly shallow angle of 45−2*17=11 degrees, and a curved secondary concentrator of significantly higher concentration would reduce this to where the reflection from the cell surface would grow rapidly.

Thus as a rule of thumb, 70× is easily achievable and 80× is still cost-effectively achievable using the prior art of orienting linear parabolic mirrors with imaging concentrators, and approximately 100× is cost-effectively achievable with a flat non-imaging secondary concentrator. While a concentration approaching 125× would be achievable with great care on an exceptionally accurate tracker using a 22.5 degree rim angle and a flat non-imaging secondary concentrator, pushing any limits usually increases costs and complexities dramatically, so a convenient practical limit of 100× will be used in further calculations.

The highest efficiency solar cells currently reach their peak efficiency at around 300 suns to 500 suns concentration, after which the efficiency drops even if the cells are cooled to a constant temperature. This is largely due to resistive losses that increase with the square of the photo-current, balanced against a junction efficiency that increases only with the logarithm of the illumination intensity. And even with perfect cooling of the back of a cell, the thermal resistance of the cell itself would cause the cell's temperature to rise with increasing illumination intensity, adding another loss factor to the efficiency balance. Although the efficiency thus decreases as the concentration rises, this decrease is modest until 1000 suns or 1200 suns concentration with today's leading cells, and hence the power obtained per cell continues to increase with increasing concentration, although not quite as fast as the concentration itself increases. Since high efficiency cells are relatively expensive, this pushes the optimum concentration to roughly 1000 suns with today's cells and mirror and tracker costs.

A practical maximum concentration of roughly 100× in one direction and a target concentration of 1000 suns overall means that the concentration in the other direction should be equivalent to at least 10 suns. Even the best current glass mirrors lose 4%, the cover-glass costs another 1%, the shade from the receiver supports and the receiver block 1.5% and losses from the edges of mirror segments (which have two sleeve thicknesses and sleeve overlap plus a tiny gap) cost another 1%. Thus to get approximately 1000 suns would require a geometric concentration on the other axis of at least 1000/(100*0.96*0.99*0.985*0.99)=10.8×, and hence the length of the receiver in that direction should be at most approximately $\frac{1}{11}$ the length of the mirror aperture. Since in the design above if the receiver is of width D in the direction of the length of the mirror segments it is roughly D+W in the direction of the width of the mirror segments, where W is the width of the mirror segments. Since D is approximately $\frac{1}{100}$ the width of the aperture (which for a square aperture is the same as the length), this makes the maximum width of the mirror segments roughly $\frac{1}{12}$ the length of the aperture. Thus for 1000 suns concentration, a 5-meter compound mirror of the above design with a 22.5 degree rim angle would use strips of mirror at most approximately 420 millimeters wide.

Narrower mirror segments can be used to increase the concentration in the mirror width direction, and thereby relaxing the tolerances in the other direction. Narrower mirrors are also stronger with respect to hail, but narrower mirrors increase assembly costs and increase mirror edge losses as well, decreasing efficiency. Wider mirrors could also be used, but only by accepting lower concentration, increasing the aperture width, or decreasing the rim angle (22.5 degrees is the ideal rim-angle without a non-imaging secondary concentrator). To choose among these, it is important to consider the cost and availability of solar glass mirrors in various widths; certain types of mirrors can be considerably less expensive in standard widths than in custom widths, and hence picking a segment width that matches a standard mirror width (or an integral fraction of a standard mirror width if multiple mirror segments are to be cut from a standard sheet), the cost of the mirrors may be reduced considerably. Since the minimum standard width of solar glass as delivered to the largest U.S. solar mirror company (Naugatuck) is 20 inches, or 508 millimeters, increasing the size of the aperture or increasing the concentration through taking better advantage of the non-imaging concentrator are both currently preferred to using mirrors narrower than 20 inches (508 mm). An aperture 6/5 as big, which is a 6-meter aperture, can utilize 20-inch-wide mirrors to achieve 1000 suns, and a 6-meter aperture is an excellent match to the 20-foot (6.1 meter) longest standard lengths for small-diameter structural steel tubing, so using a 6-meter aperture is even more preferred than a smaller rim angle and more concentration from the non-imaging secondary concentrators. If rectangular tubing is used for both the ribs and the rails, this also has a 24-foot (7.2 meter) standard length, and hence an aperture of almost exactly 50 square meters could be created; this would allow using 20-inch glass with more of a margin for tracker and assembly inaccuracies.

If mirrors with apertures smaller than 6 meters are needed, decreasing the rim angle can be used to increase the concentration. This trades the lower effectiveness of the primary imaging concentrator for the higher effectiveness of the non-imaging concentrator, until in the limit, with just a large reflective non-imaging concentrator, the maximum concentration is twice that of the original imaging concentrator. Thus one could approach 200× concentration, but the cost-effective limit would be more like 150×, which with 20-inch-wide mirror segments would support an aperture as small as four meters. Even a system that focused the sunlight 8× with an imaging concentrator could readily focus a further 14× with a non-imaging concentrator, supporting a 5-meter aperture with a much smaller secondary concentrator than the aperture. As mentioned earlier, for smaller apertures the glass mirrors can be split to half or a third of their standard width, although this would significantly increase their cost. In sufficient volume this cost differential would be reduced.

The next factors to consider in designing the receiver are the width of the cells and ideal inverter input voltage. Typical high-performance inverters today work best at an input voltage of roughly 350-400 volts, with a maximum input voltage of 600 volts. Since each triple-junction cell 761 today has an open-circuit voltage of approximately 3.15-3.2 volts at 1000 suns, the total number of cell tubes 762 in series feeding an inverter input should thus not exceed 600/3.21=186 cell tubes. For a six-meter mirror 73 using 20-inch mirror segments as described above to achieve 1000-suns concentration, the focal spot, and hence the active area of the receiver 760, would be 60 millimeters wide by 556 millimeters in length, so 186 cell tubes would imply a tube spacing of 3 millimeters. That would be expensive to assemble, would spend significant cell area on contact with other tubes, and, given the tube wall thickness needed, would significantly impede the flow of coolant.

Fortunately it is not necessary to have a single receiver 760 match the input voltage of the inverter; any integral number of receivers in series can also be matched to the desired voltage. The matching depends on several factors, such as how many receivers are on each tracker and how big the aperture is; with two 6-meter apertures per tracker, as in some of the above examples, a 6 millimeter tube spacing and thus 93 tubes per receiver would be a preferred match, as it would allow relatively unimpeded coolant flow, moderate assembly costs, and, with cells 761 just over half as wide as typical multi-junction cells but with a bus-bar only on one side, the cell's top contact structure would not even need to be re-optimized.

If a design had three apertures per tracker, a 9-millimeter cell tube spacing would be a good match, but by the time a tracker has four apertures, the 6-millimeter tube spacing is again preferred because it avoids having too long a distance from any spot on a cell to the nearest bus bar, and also reduces the current and the conductor sizes needed between receivers. Similarly some newer inverters require voltages 1.5 times higher, which would match four receivers with an 8-millimeter tube spacing. For any given design, the tube spacing scales with the aperture width, so with a 7-meter aperture, for another example, a roughly 7-millimeter tube spacing would be preferred, etc.

A similar balance can be done for mirror apertures of other sizes to pick the right receiver aspect ratio, and thus the width of the mirror segments needed. As a rule of thumb, the best aspect ratio will typically be between five to one and ten to one for high-efficiency triple-junction cells at today's costs and peak-efficiency illumination. While very large mirror apertures would tend to reduce this ratio, with today's materials trackers of twelve meters or larger would be likely to use multiple apertures rather than very large apertures due to the maximum standard lengths of various materials such as steel tubing and mirror glass. Cells that reach their peak efficiency at higher concentration will also tend to reduce the optimum aspect ratio, as it is easier to increase the concentration in the low-concentration direction by using narrower mirror segments than it is to increase the concentration in the high-concentration direction, where the concentration is already near its practical maximum and is it is a good percentage of its theoretical maximum. The trend is toward reaching peak efficiency at higher concentrations, as a recent high-efficiency cell from Azur demonstrates; while its maximum efficiency was not quite as high as record-setting cells from Emcore and Spectrolab, its efficiency was still increasing at 1700 suns, by which point previous cells have long since started decreasing substantially in efficiency.

If solar thermal and photochemistry receivers are used instead of photovoltaic receivers, a similar set of optimizations applies: First reach the maximum practical focus in the direction of the length of the mirror segments; then pick an aspect ratio that produces the desired concentration and calculate the maximum mirror width this allows. If this does not match a standard mirror size, then pick the next smaller standard mirror width, and then relax the focus in the tight direction (parallel to the length of the mirror segments) to account for the narrower segments.

More important than any given embodiment, however, is the understanding of the scaling of the embodiments discussed to this point. The key criteria are the concentration and the aperture size, as the preferred concentration will change with advances in cell technology and the preferred aperture will change with the relative prices of steel, glass, cells and labor.

If the ideal concentration becomes higher, the tracking errors with high-accuracy tracker are already small enough compared to the sun's diameter that little improvement is available there, and the construction taught above has little error budget devoted to manufacturing tolerances as the most critical part, the mirror focal length, is established under well-controlled factory conditions rather than in the field. Concentration can be increased (as discussed previously) through a larger aperture that allows more mirror widths, and with current glass pricing this is more cost-effective than decreasing the width of the mirror segments; however the currently preferred aperture sizes are convenient. Reducing the mirror length would reduce rotation of the focal line at the ends of each mirror segment, but this is already contributes less than ¼ of what the sun's diameter contributes to the focal spot size, so further improvements reach the point of diminishing returns. Curved non-imaging secondary concentrators could also tighten the focus by at least 10% in each direction, but these are more expensive, especially in small quantities, due to the use of curved mirrors.

One combination of improvements, however, can achieve a significant concentration gain at modest cost. If a very high accuracy tracker is used, and tight manufacturing tolerances are used to control angular source of error (especially in the tightly-focused direction), then the rim angle can be reduced and the focal length made longer (however, each time that the rim angle is cut in half, the sensitivity to angular errors (both tracking alignment and slope errors) is doubled, so this would be counter-productive with a lower-accuracy tracker). While 22.5 degrees is the ideal angle without a secondary concentrator and when the mirror size is small enough for rotation to be negligible, when a non-imaging secondary concentrator is used, reducing the rim angle puts more of the concentration burden onto the more efficient non-imaging concentrator. As a side benefit, the rotation error of the mirrors is proportional to the square of the rim angle, so this moderate error contribution can be made insignificant.

If the rim angle is cut in half, then the mouth of the secondary concentrator in the high-focus direction is increased by 20% in width. However the secondary concentrator then has more angular budget, which makes substantially higher concentration achievable with either a curved or a flat-faceted non-imaging secondary. If a flat-faceted non-imaging secondary is used, the increase from more facets is also worthwhile; for example, with the 11.5-degree rim angle, a four faceted secondary can tighten the focus by 1.8× instead of 1.2× for a two-faceted secondary at a higher rim angle. Since the focus will be 1.2× larger at the mouth of the secondary, this makes the final focus 1.8/(1.2*1.2) or 1.25× tighter. The increase in the lower-focusing direction is even more significant, since not only can a four-faceted secondary tighten the focus by 1.8× instead of 1.2×, but only the sun's contribution to the focal spot length is increased by 1.2×, while the mirror width's contribution is decreased from cos(22.5)/cos(45)=1.31 mirror widths to cos(11.25)/cos(22.5)=1.06 mirror widths. Thus the concentration in the low-focus direction can be increased by 1.31*1.8/(1.06*1.2)=1.85×. Together these can increase the concentration to roughly 2.3 times that achieved by the 22.5-degree rim angle, or well over 2000 suns even with a 24-foot (7.2 meter) aperture and 20-inch (500 mm) mirror widths. While this assumes that the tracking error is insignificant, a small tracking error allowance is provided by the four-fold reduction in the focal width increase from the mirror rotation, from 17 millimeters for a 7.2 meter (24-foot) aperture at a 22.5 degree rim angle to just over 4 millimeters for an 11.25-degree rim angle.

If the ideal concentration becomes lower, due either to a significant improvement in the efficiency at lower concentrations without a corresponding increase at higher concentrations, or to a dramatic drop in the cost of high-efficiency cells, then the extra concentration budget that this creates can be spent in several ways. The secondary concentrator could be eliminated, but this is a low-cost item anyway, so the savings would not be significant. The tracking error budget could be increased, but again the savings are not significant. A less rigid steel frame could be used, and this would save a modest amount; however the savings would still be limited because the strength needed to survive wind loading would limit the steel savings. Larger mirrors could be used, but 20"×72" (500 mm by 1830 mm) mirrors are a convenient size to handle, easily maneuverable by a single person, and while somewhat wider mirrors (up to perhaps 30" wide) could be so handled, the labor savings of fewer pieces would be modest. But once one has solved the issues with cost effectively reaching very high concentration, the savings from reducing the concentration are largely gone.

Either a lower concentration being optimal or a flatter rim angle with a more efficient secondary concentrator can also be spent on supporting smaller apertures with the same cost-effective mirror width. For example, if the outer rows of mirrors were left off from the above-detailed embodiments, and only half as many mirrors were used per row, the rim angle would be between 11 and 12 degrees. The focus in the mirror width direction would involve only half as many mirror segments, but this would be more than made up for by four-faceted secondary concentrators being able to tighten the focus 2.3× more. Thus over 1000 suns would be achievable, even using the same mirrors, on a 3.7-meter dish.

While in general the larger dish amortizes the tracking costs and some of the installation labor over more mirror area, and are thus generally more cost-effective for solar farms, a 7.2-meter dish with today's best cells as described in the present application would produce almost 17 kilowatts of power under full sun, which is far more that required for residential use. Even when grid-connected so that extra power does not go to waste, the net metering popular in many places only runs a meter back to zero and power beyond that is not rewarded. In such cases reaching the optimal efficiency at a smaller aperture will be preferred, and hence the lower rim angle will be preferred.

While the process of using a smaller rim angle and a more effective secondary concentrator quickly reaches a point of diminishing returns in the high-concentration direction, in the low concentration direction it can continue to make up for the reduction in the number of mirror segments. Theoretically this allows a segmented mirror to be reduced all the way to one segment, with the secondary concentrator making up for the reduction in the number of segments. However the secondary concentrator itself then does not decrease in cost with decreasing aperture area, and thus grows relatively more expensive (and starts blocking a larger percentage of the incoming light), so after a period of diminishing returns, both the cost efficiency and the optical efficiency drop. Still, this can allow one to go cost-effectively down to an aperture one mirror segment lengthwise by four mirror segments widthwise, even using the same mirror segments, or down to roughly a one kilowatt dish. Since this is below the most cost-effective size for tracking and cooling systems, and since it is also below the several-kilowatts typical of first-world residential solar installations, the above design principles can be scaled across the entire range from small household systems up to huge many-meter apertures for solar farms, limited in scale by cost-effective tracking, installation labor and cooling rather than by the design optics.

Smaller rim angles produce lower voltages, and the extent to which the shorter receiver length can be compensated for by using narrower cooling/cell tubes to put more in series is limited by the cost of assembling numerous small tubes and by the increased wall area starting to block coolant flow. Fortunately, however, smaller inverters are generally optimized to operate at much lower input voltages anyway, since they will output 110V or 220V rather than higher voltage for the power distribution grid.

Since smaller rim angles, including for smaller apertures, put more emphasis on a non-imaging secondary concentrator and are thus more demanding upon it, there is a need for improvements in cost-effective secondary concentrators. While a one-faceted or two-faceted secondary concentrator is easy to make, the complexity grows as more facets are added. But just as the primary mirror segments can be bent with sleeves into the appropriate curvature, the same principle can be applied to thinner glass to produce a good approximation of the ideal curvature for a secondary concentrator. Although the perfect shape would be rounded on the corners, an approximation made from four sleeve-bent glass mirrors, two identical long, narrow mirrors for the sides, and two identical short-in-length-but-tall mirrors for the ends. Because the radius of curvature is tight, particularly on the sides, ultra-thin solar mirrors will be required. These can be less than a millimeter thick, allowing sufficient curvature in a short distance. Since the secondary concentrators can be completely enclosed behind a cover-glass and thus protected from the elements, the ultra-thin glass is acceptable from a durability standpoint. This produces a secondary concentrator similar to that shown in FIG. 7F, but with facets $765_A'$ and $765_B'$ replaced by a continuous curve, and with facets $765_A''$ and $765_B''$ also replaced by a continuous curve.

As the aperture gets smaller, the glass must get thinner to allow it to bend to the curvature needed for the secondary concentrators. Sufficiently thin glass needs more support than just sleeves at its edges, but since the area becomes small, simply pressing the glass against a mandrel of the right curvature and gluing on a backing becomes sufficiently low in cost to be acceptable. The shape of the curve is not as sensitive as the primary mirrors, so dabbing on an adhesive and pressing on a backing comprising three ridges of the right height, one near the top edge, one in the middle, and one near the bottom edge, is sufficient.

For even smaller apertures, however, sufficiently thin glass would be too difficult to handle. Here a molded-glass secondary concentrator of an ideal shape, as is known in the prior art, would become preferred because the cost of molding decreases for small sizes while the difficulty of handling thin glass increases. Although there is no sharp dividing line, if one assumes that the cost of a mould will be amortized over a large number of concentrators then the division occurs at roughly a two meter aperture for the high-concentration direction and at less than one meter for the low-concentration direction.

Figure 7G:
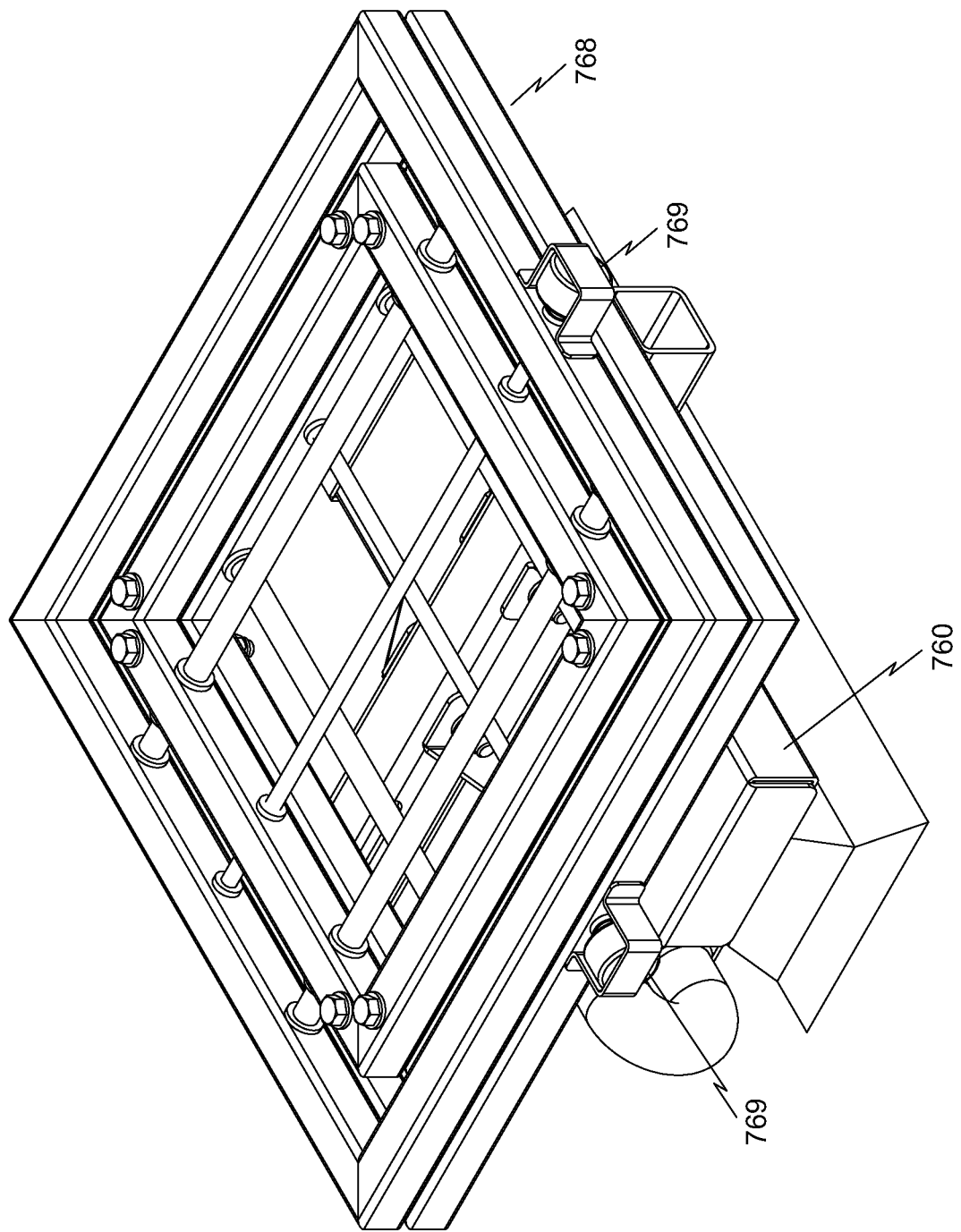
FIG. 7G is a depiction of a receiver support that dynamically adjust the position of the receiver to keep it at the maximum focus of a large-aperture mirror on a tracker of otherwise insufficient accuracy.

While most trackers have comparable accuracy in both directions, if a tracker is more accurate in one direction, that direction should be aligned with the more sensitive receiver direction of the length of the mirrors. Typically this would be the seasonal or altitude tracking, as this has slower movement than the daily or azimuth tracking. The alignment sensitivity can also be reduced in the direction of the length of the receiver simply by using narrower mirrors and bypass diodes on the end rows. If the most economical tracker available does not have sufficient accuracy for mirror segments of cost-effective width, a receiver mounting 768 with small stepper motors 769, as shown in FIG. 7G, can also dynamically adjust the position of receiver 760 to the highest concentration focus. With a 22.5 degree rim angle, this doubles the tolerance to tracker inaccuracy, and for smaller rim angles the factor by which the tolerance is increased is even greater. With the improvements in receiver supports taught earlier in the present application, stepper motors in the adjustable receiver supports could be used to the same effect.

Sufficiently accurate trackers are preferred in order to avoid the increased complexity of having stepper motors 769 in the receiver or receiver supports. However accurate tracking becomes harder for smaller trackers due to the same distance translating to a larger angle. Hence a receiver that can adjust laterally for fine focus tacking is most useful when it is most needed, on trackers sufficiently small that a low rim angle is needed and alignment sensitivity is high.

In the above embodiments cooling (for photovoltaic cells), heat transfer fluids (solar thermal) or feed-stocks (photochemistry or thermal chemistry) can all be supplied by piping that runs up the receiver supports. While cooling for photovoltaic systems could be done through a radiator and fan arrangement at the receiver itself, which would avoid this piping, the vibrations from moving parts are best kept away from the receiver so that the mechanical stress does not compound the thermal stress induced by the heat of the intense illumination. For a photovoltaic receiver, the coolant piping would typically terminate at a radiator/fan assembly below the main mirror surface, where it can be securely bolted to the frame. With a photovoltaic receiver, the wiring would then continue along the frame to the tracker support and typically into underground conduit; for the other receiver types the piping would also so continue. All of this is known in the art, as is the use of car radiators, fans and water pumps for the cost effective heat rejection from solar energy systems. Because car radiators are mass produced, their cost is low enough that the optimum cooling for solar cells is well below the temperature of coolant in a car engine. A car radiator is thus a good match for a main mirror with an aperture in the range described; a typical car engine produces very roughly ten times as much waste heat (when running hard) as a high-efficiency receiver 760 with a 6-meter aperture primary mirror, which lessens the temperature difference between the cooling fluid and the ambient air by roughly 10 fold, which keeps the cell temperature much lower than the coolant temperature in a car engine would be, and this maximizes the efficiency of and minimizes the stress on the cells 761. Automobile cooling systems are also designed for far harsher environments than the underside of a solar collector, and are designed to handle antifreeze mixtures appropriate for the temperature range that will be encountered in solar use.

Sixth Family of Preferred Embodiments:
Improvements in High-Efficiency Photovoltaic
Cells for High-Concentration Solar Energy
Receivers In some cases the waste heat from cooling photovoltaic systems can itself be useful. Since this energy is normally in the form of low-grade heat of a few tens of degrees above ambient temperatures, it can readily be used for heating greenhouses or other buildings or heating water for industrial use. While the temperature is also useful for heating or preheating domestic hot water, the amount of heat generated from even a single such system exceeds the domestic hot water needs of a typical family. If the heat from cooling a photovoltaic receiver is to be used, then the coolant piping is continued off the tracker as the heat-transfer fluid piping from a solar thermal receiver would be. If the heat only will be useful part of the year, industrial air-conditioning heat exchangers provide an economical heat rejection system capable of serving multiple trackers.

Improvements can be made to such a co-generation system that provides both electricity and heat. When heat at a higher temperature is needed, the coolant flow could be slowed down until its temperature reaches the desired level. In winter this would allow heat at temperatures useful for heating buildings to be produced with only a slight impact on electrical generation, as the cells would otherwise only gain a little extra efficiency at winter temperatures. While in the summer raising the coolant temperature would decrease the cell efficiency and thus the electricity produced more significantly, even today's most efficient cells convert more energy to waste heat than they convert to electricity. Thus if an increase in temperature makes this waste heat useful at only a moderate decrease in electricity production, there will be a large net gain in the overall usable energy gathered.

In particular, one of the arguments against carbon capture and sequestration when burning fossil fuels is that extracting the carbon dioxide from the exhaust stream is energy intensive. If a reusable amine solution is used to capture the carbon dioxide, roughly 80% of the carbon capture energy is used to release the carbon dioxide from the amine solution, and this energy can be in the form of heat at a temperature that can easily be provided by solar power, and even by the cooling of photovoltaic systems (although at 120 degrees Celsius is too high for today's a silicon-based cells, a multi-junction cell would have its performance only modestly reduced).

Although one could also use exhaust-gas heat from the fossil fuel power plant for amine regeneration at a comparable cost in electricity production foregone due to the higher temperatures, amine solutions can be stored more easily than electricity, and hence the intermittency of the solar power for amine separation is not an issue. Today solar electricity is more valuable than coal electricity because sunshine availability fairly well matches the electricity demand peak. But once this peak is satisfied, using solar energy rather than fossil fuel energy to separate out the carbon dioxide effectively allows intermittent solar energy to free up dispatchable gas-generated electricity or steady base-load coal-generated electricity.

The main effect of temperature on photovoltaic efficiency depends on the band-gap of the photovoltaic material. In a well-cooled system a maximally efficient multi-junction cell should have a very low band-gap material for its deepest junction, but this would be quite sensitive to higher temperatures, with its band-gap potentially pushed far into a region that has a lower photon flux as well as increasing losses from electron/hole recombination. At higher temperatures this would substantially decrease the photocurrent from that junction, and since all junctions must be current matched, this would substantially decrease the output of all the junctions, and thus substantially decrease the efficiency of the whole cell.

In today's highest efficiency cells the junctions are not perfectly matched; the deepest junction has almost twice the photocurrent of the shallower junctions. Shifting the junction band-gaps to lower energies thus consumes this fortuitous excess, which makes today's leading triple-junction cells much less sensitive to temperature than a single-junction silicon cell is. Even so, the cell efficiency drops too quickly to make generating electricity from the waste heat of a photovoltaic system practical; one loses almost as much electricity from decreased cell efficiency as one can generate from the waste heat (with the efficiency of this generation being strongly related to the heat-transfer-fluid temperature). This makes the added expense and complexity uneconomical, and it is preferred to simply use what would be the thermal engine's cold sink to keep the cells colder and thus more efficient.

But while photovoltaic cells that had no low-energy band-gap junctions would be less efficient at room temperature than those with such junctions, they would be much less sensitive to temperature because the increase in recombination losses would be minimal and because the shifting of band-gaps with temperature would not shift any band-gaps out of the photon-rich wavelengths. Thus such cells, if sufficiently optimized for higher-energy photons and thus less temperature sensitive, would be suitable for a hybrid photovoltaic receiver that operates at a high enough temperature for its cooling fluid to be useful in the generation of additional electricity.

Figure 8A:
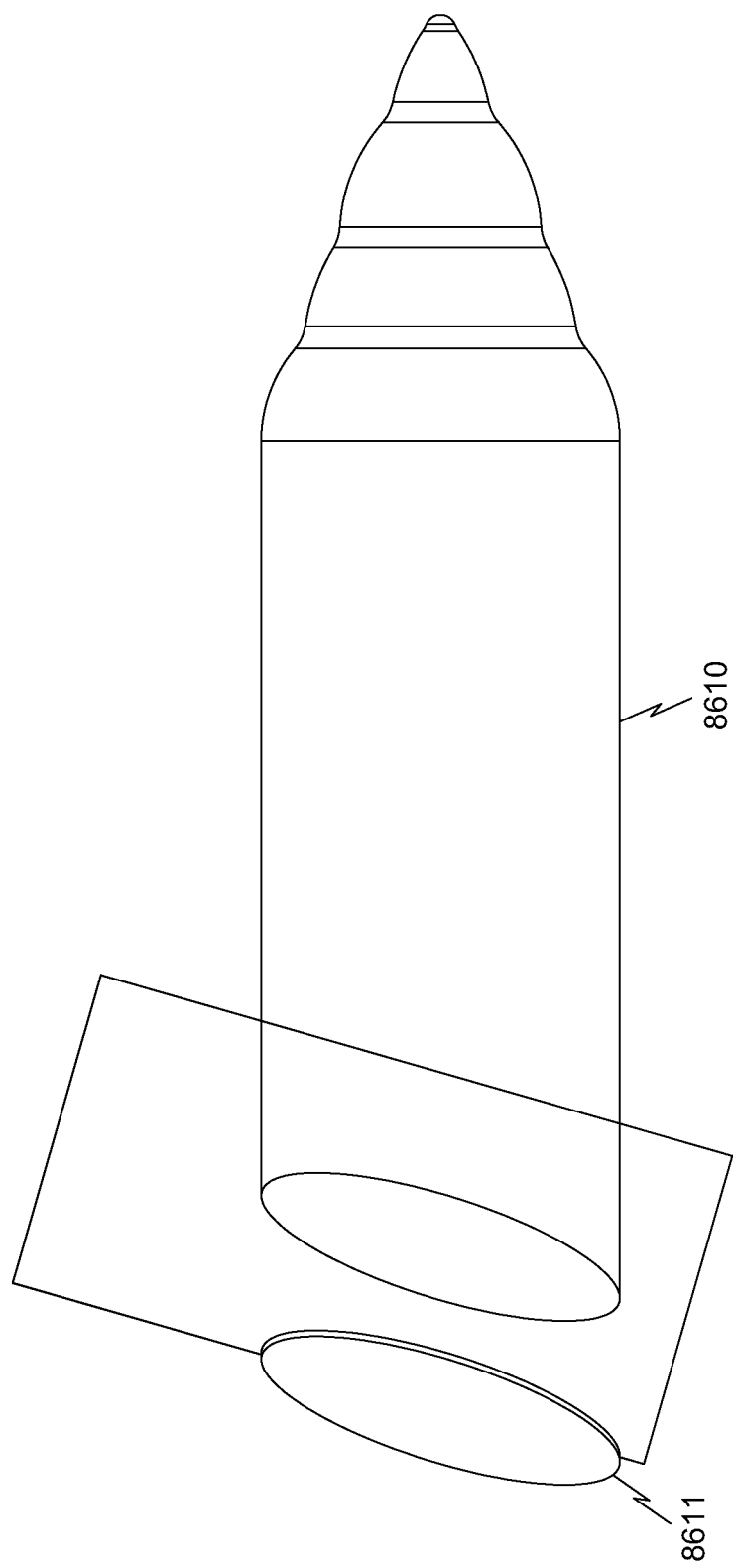
FIG. 8A is a depiction of a silicon ingot being sliced into an off-axis wafer lattice-matched to the materials in today's triple-junction cells.

Silicon has a higher band-gap than germanium and is less expensive, which should make it a better substrate for a high-temperature co-generation cell. But it is not lattice-matched to the other layers of a multi-junction cell the way germanium is, since its lattice constant (the spacing between atoms in a crystal) is about 4% too small. However, if, as shown in FIG. 8A, a silicon ingot 8610 were sliced into wafers 8611 using cuts at an angle whose cosine was about 4% less than unity, or about 16 degrees, the average spacing of the silicon atoms on the surface of the wafers would be as matched to the other junction materials as germanium is. Whether to include the silicon as a junction or merely to use it as a mechanical base depends on the temperature required for cogeneration; at the high temperatures typical of a two-axis solar thermal system (needed for maximally efficient generation of electricity from heat), the contribution of the silicon to photovoltaic generation would be marginal even if the cells were designed to withstand such temperatures, whereas at the lower temperatures typical of linear-focus parabolic trough systems, the contribution of the silicon would still be significant enough to be worthwhile.

Although other materials can have more appropriate band-gaps than silicon, or better lattice-constant matches than silicon, the mechanical properties of silicon and its ready availability in much larger wafer sizes and at much lower cost than germanium wafers, combined with the massive industrial experience in semiconductor manufacturing using silicon wafers, make silicon a good substrate for multi-junction cells for co-generation once the lattice constant mismatch has been eliminated by off-axis wafers.

Such a combined photovoltaic/solar-thermal system would have a peak efficiency higher than either a pure photovoltaic or a pure solar thermal generation system. The photovoltaic output could be fed directly to the grid to meet the daytime power demands, with the heat stored (as molten salt, hot rocks, etc. as is known in the art) for use on demand to generate dispatchable power, either to supplement the photovoltaic power to meet peak demand or to meet base-load needs when the sun is not shining. The coolant flow could even be tuned to optimize the balance between photovoltaic generation and storable heat for dispatchable generation.

Figure 8B:
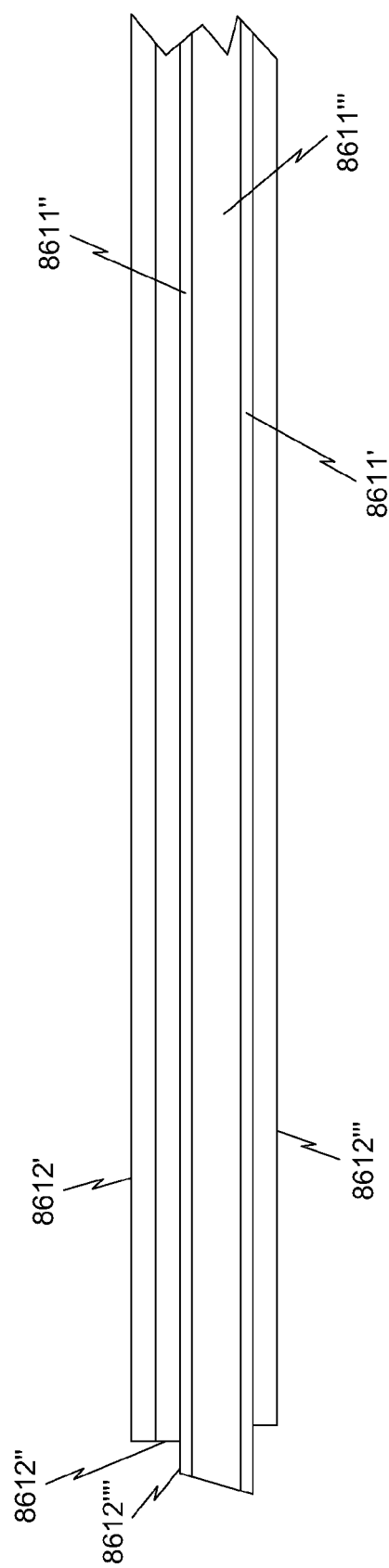
FIG. 8B is a depiction of a low-cost four-junction cell based on an off-axis silicon lattice-matched to the materials in today's triple-junction cells.

In addition to high-temperature cells, even today's multi-junction photovoltaic cells could be improved by the use of lattice-matched off-axis silicon wafers. By building the top two junctions 8612' and 8612" of today's leading triple-junction cells on top of such an off-axis silicon wafer, as shown in FIG. 8B, and building the third germanium junction 8612''' on the back of the wafer, and by building a fourth junction 8612"" in silicon, cells would be obtained that would have a number of advantages: four balanced junctions, instead of three, for increased efficiency; elimination of the cost of the germanium substrate; and production of cells on wafers of up to 300 millimeter (12") in diameter, as opposed to the standard 100 millimeter and upcoming 150 millimeter germanium wafers. The off-axis silicon wafer can comprise a single off axis wafer such as off-axis silicon wafer 8611 of FIG. 8A, or, as will be discussed shortly, it can comprise one or more off-axis silicon layers such as 8611' and 8611" bonded to a sturdy silicon handle wafer 8611''' as shown in FIG. 8B.

Because the band-gap of silicon would split the photocurrent that the germanium currently tries to produce approximately in half (at low temperatures), the added junction would already be reasonably well balanced with the other junctions, thus increasing the total cell efficiency. Band-gap engineering, as is known in the art, could adjust the band-gaps into even better balance. While the maximum efficiency of an off-axis silicon layer inserted into today's 3-junction stack would be a few percent lower than an ideal-efficiency four-junction stack, the economics of silicon manufacturing would trump the expense and complexity needed to squeeze out those few extra percent.

Off-axis wafers are significantly more fragile than on-axis wafer. To reduce breakage, cutting can be done with an electron-discharge machining wire rather than a traditional wire saw. Also, sliced wafers can be immediately be permanently bonded to a sturdy on-axis silicon handle wafer if there will be junctions only on one side of the off-axis wafer. If a low band-gap junction is also to be built on the back of the wafer, it can be built first, and a sturdy silicon handle wafer bonded on afterward. When even the process of building this low band-gap junction requires a sturdier wafer, a temporary handle wafer can be bonded on the front of the off-axis wafer first, the low band-gap junction grown next, then a permanent handle wafer can be bonded to the back, and finally the temporary handle wafer can be released, leaving a sturdy wafer with an off-axis silicon surface lattice-matched to the materials of the other junction. If both on-axis and off-axis silicon wafers are used and a silicon junction is desired, the silicon junction can be grown on the on-axis wafer.

Another way to reduce the fragility of an off-axis wafer with an on-axis handle wafer is to implant a stressor layer a few tens of microns under the surface of a millimeters-thick off-axis wafer. This surface of the off-axis wafer can then be bonded to an on-axis wafer, and the resulting wafer stack can be stress to cleave the off-axis-wafer along the stressor layer. Similar techniques are used with on-axis wafers in the semi-conductor industry in preparing silicon-on-insulator wafers and in transferring layers of silicon-based circuits to flexible or transparent substrates, and splitting off a layer from an on-axis germanium substrate is already being used with multi-junction solar cells to reduce the amount of germanium needs. In the present case, the grafted off-axis layer would be polished to be ready for the growth of junction materials, and the 'donor' off-axis wafer would also be polished to be ready to donate another layer to another wafer surface.

Off-axis wafers actually become better matches as the crystalline lattice mismatch becomes larger because it is only the average spacing between atoms that is lattice-matched. The surface at an atomic level comprises a series of tiny steps; on each step the atoms are still at the original crystalline lattice spacing, and at the next step the height of the next step makes the distance enough larger for the average spacing to catch up to the lattice-matched spacing. With a bigger mismatch, the steps are closer together, and thus stress has less chance to accumulate between steps. If the steps are too far apart, the off-axis material will force the junction material to adopt the off-axis material's crystalline plane, with resulting stress and dislocations that will reduce junction performance.

Off-axis layers are thus complementary to graded 'metamorphic' layers that also allow high crystal quality with lattice-mismatched material. In general where a small lattice mismatch is involved and suitable grading materials are available, metamorphic layers will be thin and thus not too expensive to grow. However, when the lattice mismatch is large or cost-effective grading materials are not available, bonded off-axis wafers will be preferred, and they will be especially preferred when the bonded material is itself suitable for a junction for the solar cell, is mechanically strong, and is produced, bonded and split as widely as silicon wafers are.

Because of silicon's high transparency to longer wavelengths of light than its own band gap, it is even possible to use materials with lattice constants for the band gaps higher than silicon that differ from the lattice constants for the materials with band-gaps lower than silicon. Referring again to FIG. 8B, an off-axis-with-stressor-layer silicon wafer lattice-matched to the lower band-gap materials can be bonded to one side of a sturdy on-axis silicon wafer 8611''', and then split off to leave a thin off-axis layer 8611' on which the lower band-gap material can be grown. An off-axis-with-stressor-layer silicon wafer lattice-matched to the higher band-gap materials can then be bonded to the other side of the sturdy silicon wafer 8611''', and then split off to leave another thin off-axis layer 8611" on which the appropriate higher band-gap materials can be grown. This allows the fragile off-axis wafer 8611 of FIG. 8A to be replaced with a sandwich of a solid silicon wafer 8611''' with off-axis layers 8611' and 8611''' (as shown in FIG. 8B) that can be lattice matched to two different lattice constants.

Figure 8C:
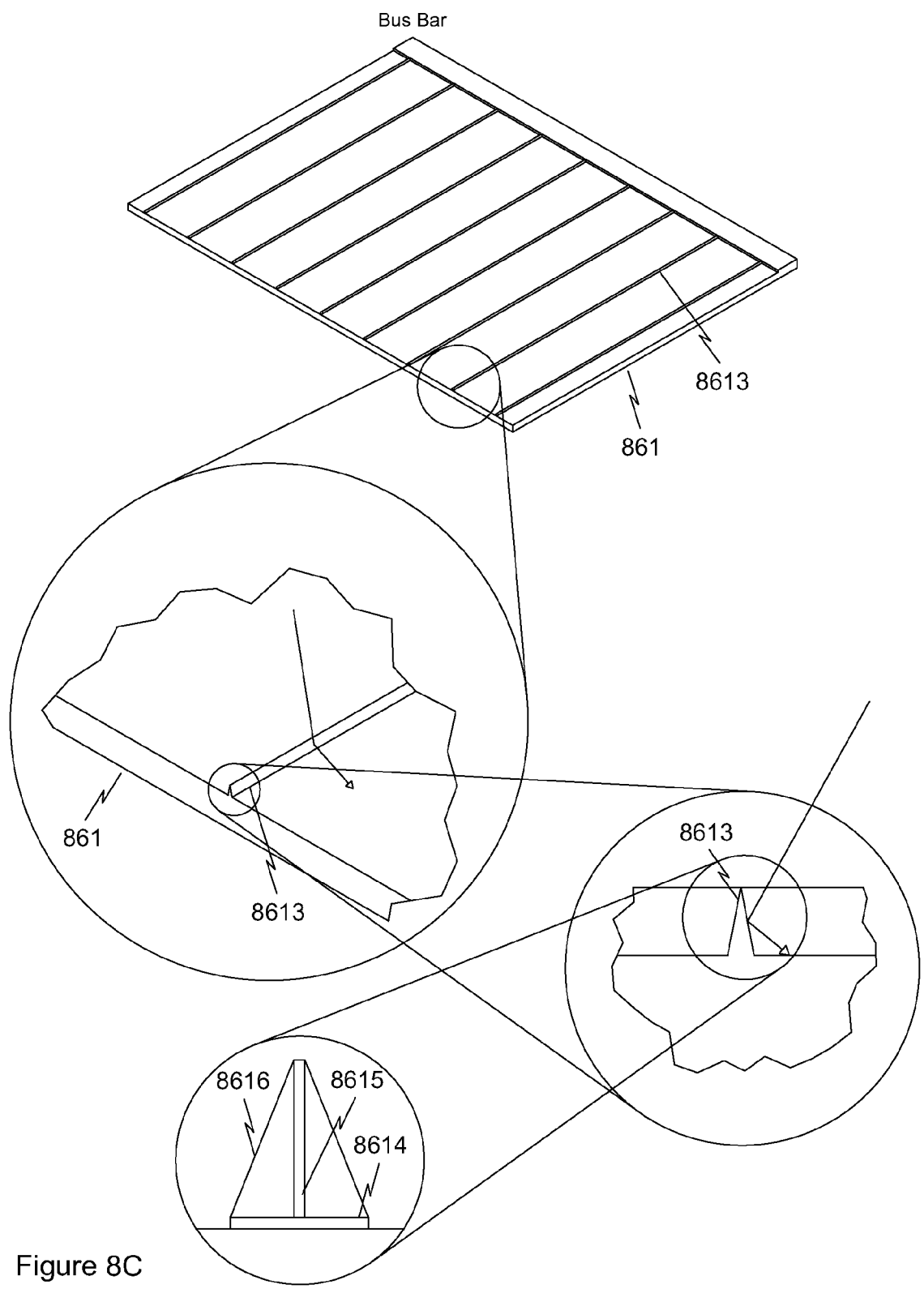
FIG. 8C is a depiction of an improved top contact for photovoltaic cells that redirects onto receptive cell areas light that a normal top contact would have blocked.

An improvement can also be made to the top-surface cell contacts, which traditionally shade a few percent of the cell. The shading is currently minimized by carefully picking the contact width; thinner contacts block less light but have higher resistance. As shown in FIG. 8C, if the top contacts 8613 are made triangular in cross section instead, with face angles comparable to that of the secondary reflector of the above families of embodiments, then light that would have been blocked by the top contacts of the prior art will instead be reflected onto receptive areas of the cell 861. While a substantial reduction in effective line width over physical line width has recently been observed (*Analysis of the Optical Properties Screen-Printed and Aerosol-Printed and Plated Fingers of Silicon Solar Cells*, Fraunhofer) using tall but rounded and rough contact lines, this can be greatly improved by engineering substantially smooth, triangular cross-sectioned contact lines.

One way to cost-effectively accomplish this is to provide a thin footer 8614 of a high melting-point material, and a tall, narrow core 8615 of a high-melting-point material, and then screen or print or otherwise apply around it a cladding of lower melting-point material 8616 that will wet both higher melting-point materials. The quantity of lower-melting-point material 8616 should be sufficient to form a substantially triangular cross-section upon being melted, with surface tension minimizing its surface area while maintaining contact with the core 8615 and the footer 8614. Footer 8614 and core 8615 may be of the same higher-melting-point material, cladding 8616 should be substantially reflective in the wavelengths usable by the solar cell, and at least the footer 8614 should be conductive (although it would be possible to insert a fourth conductive material). In more preferred embodiments, the core 8615 and the cladding 8616 are also electrically conductive to further reduce electrical resistance. Preferably cladding 8616 is solidified after melting for easier handling, although a reflective liquid metal could work just fine if handled properly. The cladding could also be applied as a liquid, and either remain liquid or be solidified once surface tension has pulled it into the right shape.

For a cell 861 on a receiver for mirror aperture with a 22.5-degree rim angle, while the angled top contact 8613 would reflect all light received directly from the primary mirror onto the cell, some light from the secondary concentrator would come in at a shallow enough angle that light from a secondary concentrator that hit an angled contact would be mostly reflected. However, since most light never reflects from the secondary concentrator and most of that would not hit a top contact, this is only a tiny loss. With even a fairly smooth, fairly reflective (e.g., ordinary solder), approximately triangular top contact of at most a 60 degree top angle, over ⅔ of the light would be reflected onto the receptive surface of the cell, and with a very smooth taller top contact of highly reflective material and a top angle of less than 40 degrees, at least 90% of the light would be reflected onto the receptive surface of the cell (of course in a concentrating system, a taller contact has more light impinging upon it so a point of diminishing returns is quickly reached).

The main gain is that the triangular top contacts allow more total metal in the top contacts, reducing their resistance, without blocking too much light. Reduced resistance is especially important at high concentrations, where resistive losses become significant and are a major contributor to the drop in efficiency after a certain peak-efficiency concentration, especially on the larger cells (typically roughly one centimeter wide) that are the most practical for low-cost assembly. This represents an especially preferred embodiment since it also works for mirrors of lesser rim angles, and larger rim angles are almost never used. It would also work even for flat panels in an un-concentrated system on low-accuracy one-axis trackers.

Exemplary Combinations of the Above Families of Embodiments of the Present Invention While some of the above improvements over the prior art depend on each other, most of the improvements taught in the above families of embodiments of the present invention are independently applicable. Numerous combinations thereof will therefore be apparent to those skilled in the art upon reading the above descriptions. Considerable additional advantage, either in efficiency or in cost, is gained through the co-optimization of these improvements as described above, and therefore several exemplary embodiments are described here. First, the combination of the inexpensive segmented parabolic mirror built from pre-shaped narrow strips of flat mirror glass of cost-effective width with a receiver with low-cost secondary mirrors, with different focal lengths in the mirror length and width directions to compensate for the different heights of the side and end secondary mirrors, forms an exemplary embodiment because it produces a low-cost mirror with a focus of an excellent shape and illumination constancy eminently suitable for high-concentration photovoltaic receivers.

Combining a substantially rectangular focus with a receiver that has cells in parallel on cooling tubes running the narrow direction of the rectangular focus, where tube cells on the tubes are then shingled in series on the long axis of the rectangular focus, with bypass diodes only on the tubes near the ends, also forms an exemplary embodiment. And the combining of the identical ribs and identical rails with a simple frame roughly 80% of the size in each dimension of the mirror aperture, and then using multiple apertures per tracker to allow the mirrors to balance on the tracker mountings also forms an exemplary embodiment. And the combination of less-expensive off-axis-silicon-based cells without a low-band-gap junction with a combined photovoltaic and solar-thermal electricity generation system also forms an exemplary embodiment. These exemplary embodiments can also be combined with each other and with the other improvements taught herein to produce additional exemplary embodiments.

Other useful embodiments can combine some of the teachings above with elements opposed to others of the teachings above; for example, while glass mirrors are preferred over polymer Fresnel lenses due to their higher efficiency, a curved-sheet Fresnel lens can produce higher focus at higher efficiency than a flat Fresnel lens. Polymer sheets are easy to curve in one dimension, and so a wide sheet of Fresnel lens material could be bent in one high-focus direction while focusing less intensely in the other direction. This would be compatible with the shared-support tracker mounting system described in a family of embodiments below, with trackers with different accuracy in the two tracking dimensions, and with the soldered cells on cooling pipes shingled in series. Also, while high-efficiency cells have generally been used in the examples, the low-cost tracker support and mirror structures are also compatible with lower cost but lower efficiency silicon cells. Numerous such combinations will also be apparent to those skilled in the art upon reading the above descriptions of the preferred embodiments of the present invention. While the embodiments described in detail are the preferred embodiments with today's materials, some of these other useful embodiments could become preferred should component materials change dramatically in price relative to one another.

Seventh Family of Preferred Embodiments: Improvements in Large-Tracker Heliostats While large trackers with large aperture parabolic mirrors with a receiver per aperture are very efficient at achieving very high concentration of sunlight onto a receiver, which is important for photovoltaic systems with expensive high-efficiency cells, the electricity such systems generate is hard to store. Even when storage is effectively free, such as when a hydroelectric dam can hold back water and slow its generation when the sun is shining, the expensive high-efficiency photovoltaic receiver must have sufficient capacity to immediately turn the full power of the incident sunlight into electricity.

In a solar thermal system, in contrast, the thermal receiver itself is relatively inexpensive, and the cost of turning the heat into electricity, typically using a steam turbine, is relatively high compared to the receiver cost. Since thermal energy is relatively easy to store, a system can capture and store the sun's energy as heat, and then turn that heat into base-load electricity over an extended period, reducing the size of the turbine, generator, and heat rejection system needed. Or, if these systems are not reduced in capacity, the stored energy becomes readily dispatchable, and dispatchable power is critical for managing both changing demands and intermittent sources. While solar photovoltaics are thus ideally suited to peak power generation because demand is typically highest when the sun is shining, solar thermal is preferred for base-load power because it lets a smaller generator operate relatively continuously rather than having to convert all the energy while the sun is shining, and/or it makes the solar power dispatchable. Since it is an object of the present invention to make solar-generated electricity inexpensive enough to displace fossil fuels for base-load power, systems that are primarily solar-thermal are addressed next.

While it is possible to distribute cold heat-transfer fluid to a field of trackers with individual thermal receivers, and to then gather the heated fluid and return it to centralized storage and generation facilities, this would require vast quantities of insulated piping, and for many of the best high-temperature heat storage fluids, such as molten salts, the pipes would have to be drained when the sun is not shining to prevent the fluid from solidifying in the piping. Thus when high-temperature heat storage is the primary energy form to be produced by solar collectors, it is more practical to use the mirrors to direct the light to a central receiver than to distribute and gather fluids such as molten salts.

A heliostat is a system where mirrors direct the sun's light to a fixed receiver. Because the sun's direction changes on a daily basis due to the earth's rotation and on a seasonal basis due to the slant of the earth's axis relative to its orbit around the sun, each heliostat mirror must keep adjusting its alignment to keep its reflection of the sun fixed on the receiver. Although technically this is due to the movement of the earth rather than the sun, for convenience and clarity it will be described from the heliostat system's point of view, which is that the sun moves, primarily East/West daily and North/South seasonally.

For a flat mirror, for the sun's reflection to be fixed on the receiver this means that a line normal (perpendicular) to the mirror surface always points half way between the direction of the receiver and the direction of the sun. While heliostat mirrors could theoretically change position, moving around the receiver as the sun moves, and while this would allow optimum effectiveness of the mirrors, for large multi-mirror heliostats on earth this is too expensive because it would involve moving large mirrors large distances. It is far more practical to fix the position of each mirror and adjust the mirror angle, rather than the mirror location, as the sun moves across the sky. This allows a fixed foundation to support each mirror, which is simpler, lower cost and more wind resistant. Only fixed-foundation mirrors for heliostats will be considered further in the present patent application.

Because the position of the receiver is fixed and the position of each mirror is fixed, the direction from any given mirror to the heliostat receiver is fixed. Thus only the direction of sun changes, and to keep the mirror's normal line halfway between direction of the tower and the direction of the sun requires adjusting the angle of each mirror by half as much as the angle of the sun's direction changes.

The effectiveness of any given mirror varies throughout the day as its angle to the sun changes. The maximal effectiveness for a given mirror is when the direction of the sun is nearly the same as the direction of the tower, so that the mirror's normal line points almost at the sun (if the sun and the tower are exactly in the same direction, the tower shades the mirror). Although reflectivity of the mirror surface depends slightly on the angle of the sun relative to the mirror surface, for flat mirrors by far the biggest effect in mirror effectiveness is the effective area of the mirror as seen from the sun's direction, which varies with the cosine of the angle of the mirror's normal line to the direction of the sun.

The cosine of an angle R can be approximated by $1-R^2/2$ for small angles, where R is measured in radians; it is nearly constant for small angles but drops rapidly toward zero as the angle approaches 90 degrees. If a receiver were at ground level, then at the worst times (near sunrise and sunset) every mirror would be essentially horizontal and have an effective area of zero, and even in the ideal case of the sun being straight overhead, every mirror would have a normal line at 45 degrees to the sun, and an effective area of only SQRT(2)/2, or 71% of its true area. In the other extreme, if the receiver were on a very tall tower, even at the worst time (again near sunrise and sunset) each mirror's normal line would have an angle 45 degrees to the sun, for an effective area of 71% of its true area, and in the ideal case of the sun being straight overhead, every mirror would have a normal line near zero degrees from the sun, and an effective area of very near 100% of its true area. Clearly for this factor taller towers are better!

But taller towers have their own issues. The sun is not a point but a disk, so its rays are not quite parallel, and the taller the tower, the farther the sun's rays travel to reach it and the farther they diverge. Since the sun's diameter is just less than 1% of a radian, this produces a minimum focal-spot diameter of just less than 1% of the distance from the farthest mirror to the receiver. For a heliostat with flat mirrors, this focal-spot diameter is added to the mirror dimensions to calculate the size that the focal-spot would be if mirror imperfections were ignored. The relative effect of this is thus proportional to the distance from the farthest mirror to the receiver to the size of the mirrors, and thus if one scales the tower height proportionately to the mirror size, while maintaining a constant number of mirrors, this effect is constant. To first order approximation, the maximum heliostat concentration achievable with flat mirrors is the number of mirrors times the reflectivity of the mirrors times the mirror size divided by the focal-spot size. If one is trying to achieve a given concentration, the effect of this is that more mirrors are needed due to the larger spot.

Mirrors are less effective if they block each other's light. Blocking can be due either to blocking the incoming sunlight from a mirror (shading), which depends on the direction and angle of the sun and is a major factor when the sun is low in the sky but diminishes to near zero at tropical noon, or due to one mirror blocking another mirror's 'view' of the receiver on the tower, which depends on the height of the tower relative to the distance of the mirror from the base of the tower. For mirrors near the base of the tower, the angle to the receiver is near the mirrors' normal line, so the mirrors do not block each other's view of the tower. Even at the distance of the height of the tower, the mirrors' normal line is at 45 degrees to the tower, which is higher than the sun's angle for a significant part of the day even in the tropics, and thus the sun's angle still dominates the blocking and the mirrors can be packed relatively close together. Far from the tower, however, the angle to the receiver dominates and the mirrors must be placed relatively far apart to avoid blocking each other's view of the tower.

Even in the case of the view of the tower dominating, the amount of blocking is variable because the effective size of a mirror depends on the angle of the sun, and hence a mirror has the highest propensity to block a neighbor when the sun (from the point of view of those mirrors) is directly behind the receiver at the top of the tower; for mirrors where the sun-angle dominate, the sun's movement makes the blocking even more variable. Since the blocking is variable, the optimal spacing of the mirrors depends somewhat on the cost of the mirrors relative to the rest of the system. If the mirrors are expensive, they should be placed farther apart to reduce blocking, whereas if they are inexpensive they should be packed closer together to capture more light at times when they do not block each other.

But while the exact spacing is a matter of cost optimization and depends on many factors, the optimal spacing of mirrors farther away from the tower is in general farther apart than that for mirrors close to the tower. If the mirrors and their installation and operation were nearly free, the packing would drop off as sine of the angle of the receiver above the horizon, as mirrors packed closer than this would add nothing due to blocking each other's view of the tower. Even at the equator, for mirrors of any significant cost the sun angle further reduces the optimal packing; as a rule of thumb, for low cost mirrors the mirrors near the tower are optimally packed when the mirror area to land area ratio is between 30% and 50% where the blocking/shading losses are dominated by the height of the sun. By four tower heights away from the base of the receiver tower, the blocking/shading losses are dominated by angular height of the tower and the optimal mirror area to land area ratio at a given distance from the tower is roughly equal to the sine of the angular height of the tower from that distance. This translates to a convenient rule of thumb for packing density of roughly ¼ at four tower heights away, ⅕ at five tower heights away, etc.

While the sparser packing of the mirrors away from the tower lets each mirror contribute roughly the same amount of light to the tower, a point of diminishing returns is still reached because the minimum diameter of the focal spot grows larger with the distance of the farthest mirror due to the sun not being a point source of light. This allows a larger field of mirrors to gather more light, but at a concentration that decreases for a given tower height once the sun's angular diameter dominates the focal spot size.

For illustration, consider the simplified case of a packed circle of mirrors around a tower, where the tower height is equal to the radius of the circle, at a time when the sun is straight overhead, using circular mirrors each ¹⁄₆₀ of the diameter of the circle of mirrors, and packed so the mirror area is 50% of the land area (optimal only with very low cost mirrors). All 60*60/2=1800 mirrors would try to reflect the sun onto the receiver, and to a good approximation, with the farthest mirror (60/2)*SQRT(2) or 42 times the mirror diameter away from the tower (due to the height of the tower as well as the distance to the base of the tower), the sun's rays would diverge to 42% of the mirror diameter. Added to this is the mirror's diameter itself, so the focal spot diameter from a given mirror would be 1.42 times the mirror size and the focal spot area would be $1.42^2$ or almost exactly twice the area of a mirror.

But the receiver itself has an effective area for receiving that depends on the angle of the incoming light. If the mirrors were all to one side of the tower, the receiver could be slanted toward that side, making the angle between the incoming light and the receiver's normal line relatively small; since this is a cosine factor, which for small angles is proportional to the square of the angle, the increase in receiver area needed to intercept the light would not be significant But in the circle of mirrors described above, the light comes from all around the tower and the receiver must be able to receive from all directions rather than being slanted towards any one direction. Since the sun in this example is overhead, a good receiver orientation is horizontal, which makes the angle of the incoming light from the farthest mirrors in each direction 45 degrees. The cosine of 45 degrees is SQRT(1/2), so the receiver diameter must be increased by the inverse of this, or SQRT(2), and the receiver area is thus increased by $SQRT(2)^2$, or 2. Thus the actual area needed for the receiver is doubled again to four times the area of a mirror.

The maximum concentration achieved at the heliostat tower, when the sun was directly overhead, would be high concentration but not the very high concentration range of roughly 1000 suns. Starting with 3600*50%, or 1800 mirrors, and dividing by four for receiver area relative to mirror size, the maximum concentration would be 450× even with perfect mirrors, or 425× with typical 95%-reflective mirrors. Additional more minor corrections can be made, such as the outer mirrors having normal lines at 67 degrees to both the sun and the receiver and hence only 92% effective area, and the average mirror having 96% effective area, and not placing mirrors too close to the tower, where the tower itself would block their view of the receiver. Together these would reduce the maximum concentration to around 400 suns when the sun is straight overhead, and a much lower concentration when the sun is at a lower angle.

While highly simplified, this example is a realistic enough starting point for discussing issues such as tower height. In this example, the height of the tower is 30 times the diameter of the mirror, and currently the most cost effective trackers, such as the DEGERtraker 7000NT, support a mirror area of at least 60 square meters, which is equivalent to a mirror diameter of just less than 9 meters. This equates to a tower height of roughly 270 meters (roughly 900 feet), which is almost as tall as a 100-story building. Most heliostat trackers are even larger, with 100 and 130 square meters being common, and with the most accurate commercial tracker of which the applicant is aware, the Titan Tracker 122-219 ATR, exceeding 200 square meters.

Putting a large power plant on top of a 270-meter tower is problematic, and even bringing energy down from such a tall tower in the form of a heated working fluid is more expensive than with a shorter tower. To reduce the cost of the tower, typically the tower height is lowered to around ⅓ of the distance to the farthest mirror. Because the farthest mirrors now have a much lower angle to the tower, they must be packed less densely to avoid blocking each other's view of the tower; this means that roughly half as many mirrors can be efficiently used, and that their average effective area is reduced by roughly 6%. The focal-spot size from the farthest mirror is a bit smaller as the distance to the receiver is reduced from 1.4 times the diameter to only 2% percent more than the diameter. The effective mirror area of the farthest mirror now reduces the mirror's contribution to the spot size to roughly 70% as well, by reducing the effective vertical dimension of the mirror. So if everything else from the above example is kept the same, the spot size from a given mirror is now roughly (1+30.6/100)*(0.7+30.6/100) or 1.31 times the size of a mirror.

However, the light from mirrors on opposite sides of the tower now comes in at even greater angles, so the best receiver shape is now almost spherical. For ease of production this can be approximated by a tapered cylinder that is narrower at the bottom than at the top. The height of the receiver can be equal to the spot height, which in this case is exactly the mirror diameter. But to keep the light from any mirror from impinging on the receiver at a grazing angle, where much of it would be reflected, the diameter needs to be bigger than the spot width; to keep the angle to better than 30 degrees requires a diameter 2/SQRT(3) times the spot width, and thus a circumference of 4*Pi/SQRT(3) times the spot width. This gives a receiver area of roughly 3.7 times the focal spot area, and thus roughly five times the mirror area of 60 square meters.

So with roughly half as many mirrors as the tall-tower example and averaging 10% less effective area, and a receiver area of five times the mirror area rather than four times the mirror area, the maximum concentration is roughly 150 suns instead of roughly 400 suns. While this is still higher than a comparable imaging linear-focused parabolic trough can achieve (roughly 80 suns in commercial systems), even when the sun is high in the sky it barely makes the low end of the high concentration range needed for high-efficiency electrical generation or high-temperature chemical transformations.

To increase the concentration with flat mirrors, smaller mirrors can be used in larger numbers, which reduces the mirrors' contribution to the spot size. For example, BrightSource Energy is using mirrors of only 2.25 meters by 3.25 meters, which would reduce the spot size in the above example from roughly 1.31*60M or 80M$^2$ to (2.25M+D*(1.02)/100)*(0.7*3.25M+D*1.02/100), where D is the radius of the circle of mirrors which is just less than 270 meters. Cancelling the "just less than" against the factor of 1.02, this reduces to (2.25M+270M/100)*(0.7*3.25M+270M/100), or 4.95*4.975M$^2$=24.6M$^2$, which increases the maximum concentration more than three-fold to roughly 500 suns. While not in the 1000 suns range, this is enough for considerably higher temperatures and thus more efficient generation of electricity.

Another way to increase the average concentration for most locations is to note that in the temperate zones the sun stays predominantly on the equatorial side of an east/west line, and so the mirrors on the polar side of a tower have a large effective area during the middle of the day, and so contribute higher concentration at lower cost than mirrors on the other side of a tower do. A higher concentration, and thus a higher temperature, can be obtained if a receiver only receives on one side of the tower and is insulated on the other sides. For thermal heliostats, higher temperatures mean higher efficiency, and for photovoltaic heliostats, smaller receiver areas lead to lower receiver cost. Thus having mirrors to one side of the tower and a receiver on that side of the tower produces a more cost-effective system than having mirrors surround the tower. In the northern hemisphere, the optimal location for trackers, especially with curved or multiple flat mirrors, is to the north or the receiver.

For commercial large-scale heliostats, the mirrors that focus on the receiver on a tower are thus typically all placed to one side of the tower ("*Luz II Solar Energy Development Center Solar Thermal Power Plant Image*", Luz II; Abengoa PS10 and PS20 in "*Solar Power for a Sustainable World*", Abengoa Solar). Having the mirrors to one side means that for a given number of mirrors on a given mirror spacing, the farthest mirror will have to be farther from the tower, increasing its minimum spot size and lowering the concentration achievable. A compromise is thus reached, where a lobe of mirrors subtends a larger angle near the tower, where the sun's diameter's smaller contribution to spot size offsets the larger angle.

Another way to increase the concentration is to use curved mirrors that focus the sun's light to a smaller spot than the mirror itself, or to approximate curved mirrors with multiple flat mirrors sharing common support. For example, with a 3×3 array of small flat mirrors on a single tracker, mounted so that the nine flat mirrors approximate a very shallow slice of a parabola (which for a shallow slice is essentially equivalent to a slice of a sphere), the mirror area on the tracker would be very nearly the same as that of the large flat mirrors used in the previous examples, while the mirrors' contribution to the focal spot size at a normal angle would be reduced to only ⅓ as much in each dimension. For a small number of mirrors, the increases in the cost of the supporting structure and the cost of attaching the mirrors are modest, as a large flat mirror needs supports in its middle anyway to remain flat under gravity and wind loading. The larger the number of mirrors, the more the shape approaches that of a true parabolic mirror, but the more expensive the support and the attachment become, and because the mirror's contribution to the spot size becomes less significant, a point of diminishing returns is quickly reached. Having a large number of flat mirrors fixed to a tracker approximates a single large curved mirror on that tracker, with the difference being that a flat mirror contributes its effective width and height to the focal spot size. A curved mirror can also be used for a heliostat mirror, and using a true parabolic curved mirror is optically very slightly better than numerous tiny flat mirrors in that it reduces the contribution from the mirror's size to the focal spot size all the way to zero at a normal angle.

However if the mirror has a fixed focal length, then even with a perfectly parabolic mirror the tracker size still degrades spot size for a heliostat mirror because rotating a tracker moves points on the surface of a mirror as well as rotating their normal lines. Thus although the angle at which the normal lines of mirrors on a tracker converge (toward the focal spot on the receiver) remains constant due to the constant rim angle, the effective distance apart from which the lines start depends on the cosine of the angle between the tracker's normal line and the direction of the receiver. And this applies even to perfectly curved parabolic mirrors as well as to multiple flat mirrors because the normal line from the mirror surface at one edge of the tracker and the normal line from the mirror surface at the opposite edge of the tracker also converge at a constant angle, while their effective distance apart depends on the same cosine of the angle of the tracker (or the mirror surface at the center of the tracker) to the direction of the receiver.

This sets a floor on minimizing a tracker's maximum contribution to spot size. In any given dimension, the change in the effective size of the tracker in that dimension is equal to the actual size in that dimension times the difference between the cosine of the minimum angle between the tracker's normal line and the direction of the receiver, and the cosine of the maximum angle between the tracker's normal line and the direction to the receiver, and the smallest maximum contribution to spot size in that dimension is when the mirror focuses most tightly on the receiver in that direction when the normal line is approximately at an angle whose cosine is the average of the cosines of the minimum and maximum angles (there a number of small corrections to this approximation that will be discuss in detail later in the description of this family of preferred embodiments).

For simplicity, consider a tracker due east of the receiver and far enough away from the base of the receiver's tower that the receiver is essentially on the horizon. At sunrise on the equinox the tracker will be essentially horizontal, so its normal line will be nearly a right angle to the direction of the receiver. The cosine of a right angle is zero, so the mirror has very little effective size in that dimension and any focusing will be over-focusing. At sunset, however, the mirror will be nearly vertical, and its effective size in the vertical dimension will be the full size of the mirror in that dimension. The smallest maximum spot size occurs when the mirror under-focuses by the same amount in this situation as it over-focused at sunrise, producing in each case a spot whose vertical size is the average of the tracker's minimum and maximum effective sizes in that dimension, which in this case is half the size of the tracker in that dimension.

But not all trackers are affected equally; the closer a tracker is to the base of the tower, the more tightly it could focus in the vertical dimension. For example, a tracker at the foot of the tower would have a normal line at 45 degrees to the tower at both sunrise and sunset, and at zero degrees to the direction of the receiver when the sun is straight overhead. The difference between the cosine of 45 degrees (SQRT(2)/2 or about 0.7) and the cosine of zero degrees (1.0) is only about 0.3, so such a tracker can contribute to the spot size as little as 0.3/2=0.15 times the size of the tracker in that dimension.

Since the minimum overall spot size is bounded by the largest tracker spot size and the farthest mirror already has a larger spot size from the diameter of the sun, the farthest mirror sets the minimum spot size. As described above, even in the absolute worst case of a change in cosine from near zero to one, a properly curved mirror can contribute half as much to the smallest maximum spot size (and hence to the receiver size) as a single flat mirror of the same size. With multiple small flat mirrors on a tracker, to a first order approximation the effective mirror size is simply added to the tracker's contribution; and this can be improved slightly by adding the effective mirror size in each orientation to the effective tracker size before averaging, which shortens the preferred focal length because over-focusing occurs when the mirror's contribution is smaller.

While for any given tracker this effect of curvature applies to both dimensions, when trackers surround a tower at a distance of several times the tower height, so that their foci would normally use a cylindrical receiver, a cylindrical receiving surface would not benefit from focusing in the horizontal direction. On the other hand, the receiver area has to be increased several fold to handle light coming from mirrors surrounding the tower, so having receivers to one side of the tower saves almost as much in receiver area as it costs in mirror area, and thus has a relatively minor impact on cost per watt and on maximum concentration. And except at the north and south poles, not all directions are equally effective places for trackers anyway, as discussed above, so trackers can be preferentially placed in the best directions relative to the receiver tower, regaining more than the minor loss in concentration.

Because at the equator the sun stays within 23.5 degrees of the equator, for a tracker due north or due south of the tower the maximum angle from a tracker's normal line to the tower is only (90+23.5)/2 degrees=57 degrees, and the cosine of 57 degrees is about 0.55; and this is for a June sunrise/sunset for a mirror very far away from the tower, where the smallest angle (on a December noon) is (90−23.5)/2, or 33 degrees. Since the difference between the cosines is 0.55−0.43=0.12, such a tracker that splits the difference can have a spot size contribution as small as roughly 1/16 of the tracker size, as compared to roughly 1/2 the tracker size in the case of an east or west mirror far from the tower.

While a tracker to the north of the tower but near the tower's base sees a bigger change in cosines, from cosine (45)=0.71 to cosine(0)=1, and thus has a smallest maximum tracker contribution of 0.15 times the tracker size, being closer to the tower the mirror has a much smaller spot size contribution from the sun's diameter, which can offset this. Half the difference of the cosines is roughly 0.15−0.06 or 0.09 times the size of the tracker, and the difference in the sun's diameter's contribution is roughly 1% of the difference in the distances to the receiver. Since as discussed above the farthest trackers are typically many tower heights (and thus many tens of tracker diameters) away from the tower, the sun's diameter clearly dominates and the farthest tracker still determines the focal spot size and thus the receiver area needed.

Since the tracker's effective area also goes with the cosine and the trackers to the north and south of the equator have higher average cosines of their normal angles, those trackers have larger effective areas as well as being able to focus more tightly. Thus even at the equator, a lobe of trackers toward the north of the receiver and/or a lobe of mirrors toward the south of the receiver is more effective than trackers to the east or west of the receiver. While this is most strongly true for curved mirrors and multiple flat mirrors per tracker due to the increased concentration, the effective area factor applies to flat mirrors as well. For curved mirrors, the previous example where a tracker-sized mirror produced a spot size of (1+30.6/100)*(0.7+30.6/100) or 1.31 times the size of a tracker, the spot size would be reduced to (0.06+30.6/100)*0.7*(0.06+30.6/100)=0.094 times the area of a tracker, or fourteen times smaller than with a single-flat-mirror tracker.

If all mirrors are within 45 degrees of north (or of south), the receiver's area must be $1/\cos(45)^2$, or twice the spot area from a given mirror. Thus the total receiver area is 0.19 times the tracker area, rather than roughly 5× the tracker area, or roughly 26 times smaller. Since this uses only ¼ of the circle of mirrors, the increase in concentration would be roughly 26*¼=6.5 times the 150 suns concentration of the original short-tower example. Thus properly curved mirrors, with a focal length of half the distance to the tower, can produce a concentration of roughly 6.5*150 suns, or almost 1000 suns, using towers of reasonable height and trackers of a cost-effective size. This can be further improved by noticing that not all of the farthest trackers require the same receiver area; those more directly north require less area than those to the northeast and the northwest due to a higher cosine factor on the receiver's effective area for the tracker more directly north, so one can extend the trackers to a greater distance near due north.

Also, trackers near the tower require less effective-receiver-area due to the smaller effect from the sun's diameter, so the trackers near the tower can be placed beyond 45 degrees from due north. Together these increase the number of trackers focusing on the same-sized spot, and thus the increase the maximum concentration, when a rounded polar lobe (a lobe to the north in the northern hemisphere or to the south in the southern hemisphere) is used, raising the maximum concentration to a bit beyond the 1000 suns target when the sun is high in the sky.

Rather than extending the lobe horizontally, since the trackers focusing on a tower now also fall within a 90-degree window in either dimension, the same sort of inexpensive flat non-imaging secondary concentrators discussed previously can be used, shrinking the maximum spot size by 1.2× in each direction, and thus increasing the maximum concentration to roughly 1400 suns. This is not needed for today's photovoltaic cells because the optimum concentration today is roughly 1000 suns, but it can be useful when extremely high temperatures are required, or when minimizing receiver area to minimize thermal losses is important.

While at the equator trackers to the north and trackers to the south are equivalent, between the equator and the poles one direction becomes dominant. For example, anywhere in the continental United States, the sun is always to the south of an east/west line for the whole day for half of the year, and even in the summer it is to south of an east/west line for the central part of the day, when the most sunlight is available to collect. Thus in the northern hemisphere a lobe to the north of a tower is the most effective, unless one is near earth's North Pole where all directions become equal. This 'optimal lobe toward the pole', or polar lobe, is most important for curved mirrors, and can be seen in the Abengoa site in Spain. It is of some but lesser importance with individually-tracked flat mirrors; for example BrightSource's next-generation heliostat design uses mirrors surrounding a tower, while their pilot project in Israel uses approximately a lobe of mirrors to the north of the receiver tower.

Another consideration with heliostat power towers is that multiple heliostat towers can be placed near each other. This can be done to maximize the use of a sunny area without an excessively tall tower, as can be seen at the Abengoa site, or so that multiple towers can share generating facilities or other infrastructure, such as in the planned BrightSource sites. In the Abengoa case, each tower uses a northern lobe of heliostat trackers, and these lobes are placed side by side. In the BrightSource case, their plans show a close packing of roughly circular fields of trackers, each surrounding a single tower.

There numerous drawbacks with this prior art of curved-mirror or multiple-flat-mirror heliostat trackers. Using curved mirrors per tracker to significantly increase the concentration as described above also significantly increases the complexity of making the trackers, and much of the increase in complexity applies as well with multiple flat mirrors per tracker for high concentration. One factor for curved mirrors is that to achieve a paraboloid of rotation, the mirror material must bend everywhere in two directions at once. Since a sheet of non-stretchy material will only bend in one direction at any given point, curved mirrors are generally made from molded glass, which is more expensive (and more fragile) than flat glass mirrors or than sheet-metal mirrors.

However, even for trackers where numerous small flat mirrors are affixed to approximate a parabola, the optimal curvature of the parabola depends on the distance to the tower. This means that to achieve very high concentration in heliostats with towers of practical height, different mirrors, or at least different mirror supports for flat mirrors, have been needed for trackers at different distances from the tower. This reduces the economy of scale that would be achievable with identical parts, and it also complicates on-site assembly by using non-interchangeable parts. The prior art of which the applicant is aware has not offered a solution other than either accepting this added complexity and cost, or of accepting a lower concentration and thus lower efficiency.

A second drawback is that even for optimally placed trackers, for much of the day their effective area is significantly less than their maximum effective area due to the sun lining up less well with the receiver atop the tower, and thus the average concentration is much less than the peak concentration. A third drawback for trackers that surround a tower is that except at tropical noon, trackers on one side of the tower provide the highest concentration but the receiver area is large enough to accept light from all sides of the tower, reducing the overall concentration.

The solar energy systems according to this seventh family of preferred embodiments of the present invention overcome these drawbacks of the prior art by providing a set of independently applicable but mutually supportive advances in the art of heliostat fields that allow increased total energy capture at increased concentration from the same-sized field of heliostat trackers, while simultaneously reducing the cost and complexity of those trackers and their mirrors and mirror supports.

This can be achieved first through minimizing the angle between the tracker's normal lines and the direction of the receiver, which increases the effective size of the tracker mirrors, and by minimizing the change in this angle, which decrease the change in the cosine of this angle, thus allowing tighter focusing and higher concentration, and by further balancing the change in the cosine of this angle with a change in the distance to the tower, thus minimizing the effects of the change in cosine and allowing still higher concentration (or allowing trading this higher concentration for allowing only one or a few tracker parabola curvatures to be used instead of many). These advances are then complemented by a co-optimized mirror structure that achieves higher concentration than multiple flat mirrors on a tracker, and with which it is easier to achieve sufficient accuracy than with even single flat mirrors of comparable stiffness, without increasing the cost or fragility of the mirrors.

Figure 9A:
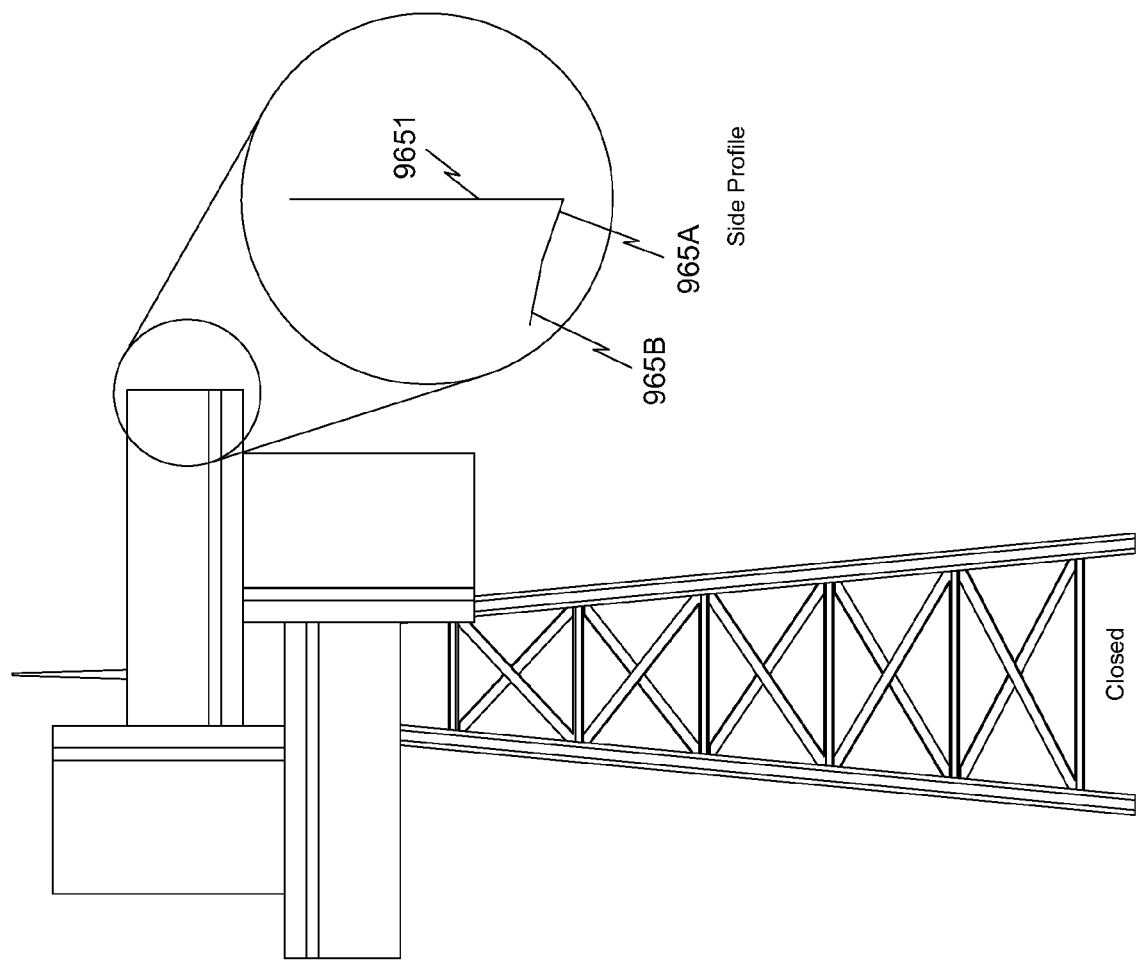
FIG. 9A is a depiction of a solar thermal heliostat receiver that uses movable insulation and movable secondary concentrators to reduce the receiver area, and thus the heat loss, at times of non-maximal focal spot size.
Figure 9A:
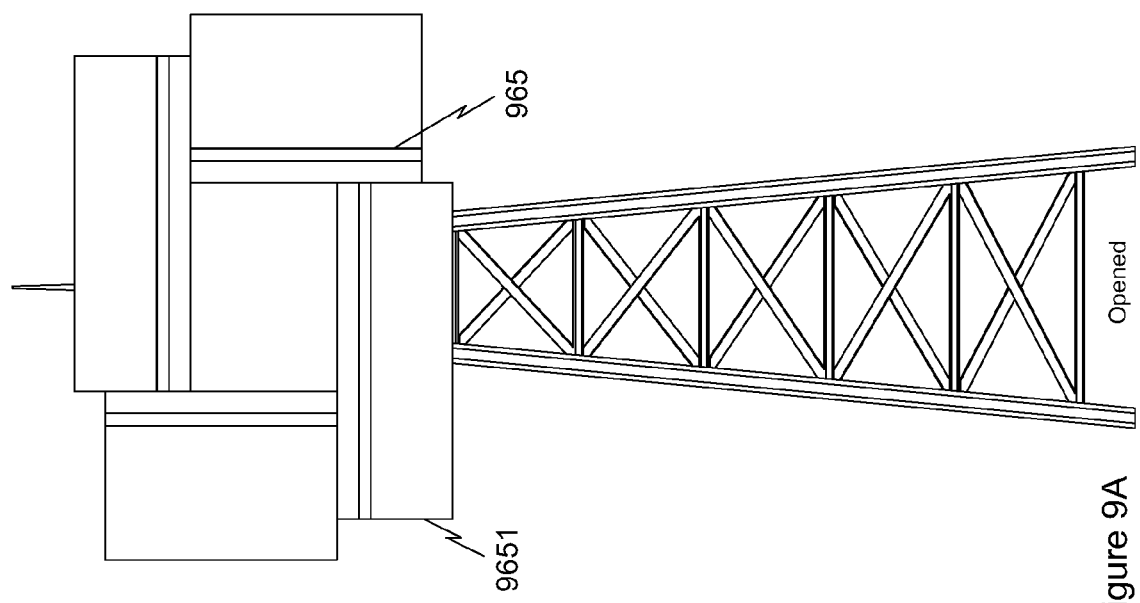

A first improvement is to note that the focal spot, and thus the receiver area needed, changes in size over the course of the day due to changes in the cosine factor of the worst-case mirror. As shown in FIG. 9A, a preferred embodiment of the present invention will thus use movable insulation 9651 to reduce the exposed receiver area, and thus minimize the heat loss, when the focal spot is smaller. For polar-lobe heliostat arrangements, and any other systems (such as will be discussed below) where the light incident on the receiver subtends a small enough angle to allow a secondary concentrator to cost-effectively increase the concentration, even further preferred embodiments use movable secondary reflectors 965 to even further increase the concentration when the primary focal spot is at less than its maximum size. These two embodiments are cooperative, and can be used to considerably reduce the heat losses when the sun is at intermediate angles, such as in the late afternoon when the electricity demand is typically at its peak.

Although a lobe to the north (or to the south in the southern hemisphere) is the best single location for mirrors when evaluated over the course of a day or a year, it usually is not the ideal direction at any given time. Even in the temperate zones, far from the equator or the poles, although the sun is toward the equator during the middle of the day, on summer mornings and evenings the sun rises and sets more toward the pole than toward the equator (e.g. to the northeast and northwest in North America). And even in the winter the sun rises well to the east of south and sets well to the west of south. Thus only around mid-day, when the sun is directly toward the equator, is a lobe centered on due north (or south in the southern hemisphere) the ideal lobe direction at that specific time.

Although the collocation of multiple towers to improve the optics of heliostat fields has been taught before (*Multi-tower Solar Array*, University of Sydney), with the mirror field of multiple towers overlapping, each mirror has still been associated with a given tower even when its neighbors on all sides are associated with different towers. This has been done to allow a high packing density of heliostat mirrors with reduced shading and blocking of mirrors by their neighbors. While well suited for a parking lot where shade is a valuable byproduct of high packing density, dense packing is of much less importance in desert spaces where land is plentiful and shade is not significantly valuable. The Multi-Tower Solar Array as taught by the University of Sidney also does not provide very consistent concentration throughout the day, and a low mean-to-peak power ratio leads to receivers, and except for solar thermal with storage, generators or inverters that are over-sized during most of the day.

Having a heliostat mirror focus on different targets at different times has been proposed by Practical Solar (http://www.practicalsolar.com/products.html, Practical Solar). Practical Solar does not teach the advantages of this, but Practical Solar's main business is redirecting sunlight through windows for illumination, and being able to switch the light from a heliostat to a different room as easily as flicking a light switch makes perfect sense. Practical solar does mention the well-known ability to have multiple heliostat mirrors focus on a central Concentrated Solar Thermal (CST) receiver on a heliostat tower, but Practical Solar does not discuss reducing cosine factors or subtended angles by switching between receivers for concentrated solar energy, or mention switching between receivers for concentrated solar energy, or even mention multiple heliostat towers at all. In fact as far as the applicant can find, Practical Solar does not advance the art of heliostat towers at all, but merely makes brief mention that its small heliostats could be used for a small-scale heliostat system, which is antithetical to the teachings of fields of large, high-concentration heliostat towers.

Rather than associating a heliostat mirror with a given heliostat tower as has been done in the prior art, multiple towers can be used, with at least one of the heliostat mirrors being operable to direct its light to one tower, maintaining tracking on that tower for some time, and then switch to direct its light to a second tower and track to keep its light on that second tower for a second period of time. In preferred embodiments most or even all heliostat mirrors are able to direct their light to different towers at different times. The tower for any given heliostat mirror at any given time can be chosen to maximize the effective area of the mirror, or to maintain a relatively constant focal length for a mirror by minimizing changes in the cosine of its normal angle, or to balance those two factors against the distance to a tower to achieve a smaller maximum spot size and thus a higher concentration on a tower than would be possible with the same field of mirrors and towers where each mirror is permanently associated with a given tower.

Consider, for example, the greatly simplified case of a line of flat 10-meter heliostat mirrors on the equator, where 100 meter towers are spaced 1000 meters apart, on an equinox. The sun rises at one degree for every four minutes, so by 23 minutes after sunrise the sun is 0.1 radians (5.7 degrees of the horizon, and mirrors spaced at ten times their diameter apart cannot shade each other, even if their normal lines were to point directly at the sun to maximize their effective areas. Also, with the mirror spacing ten times the mirror diameter, no mirror within ten tower heights of the tower will block another mirror's view of the tower, even if the sun is directly behind a tower.

Figure 9B:
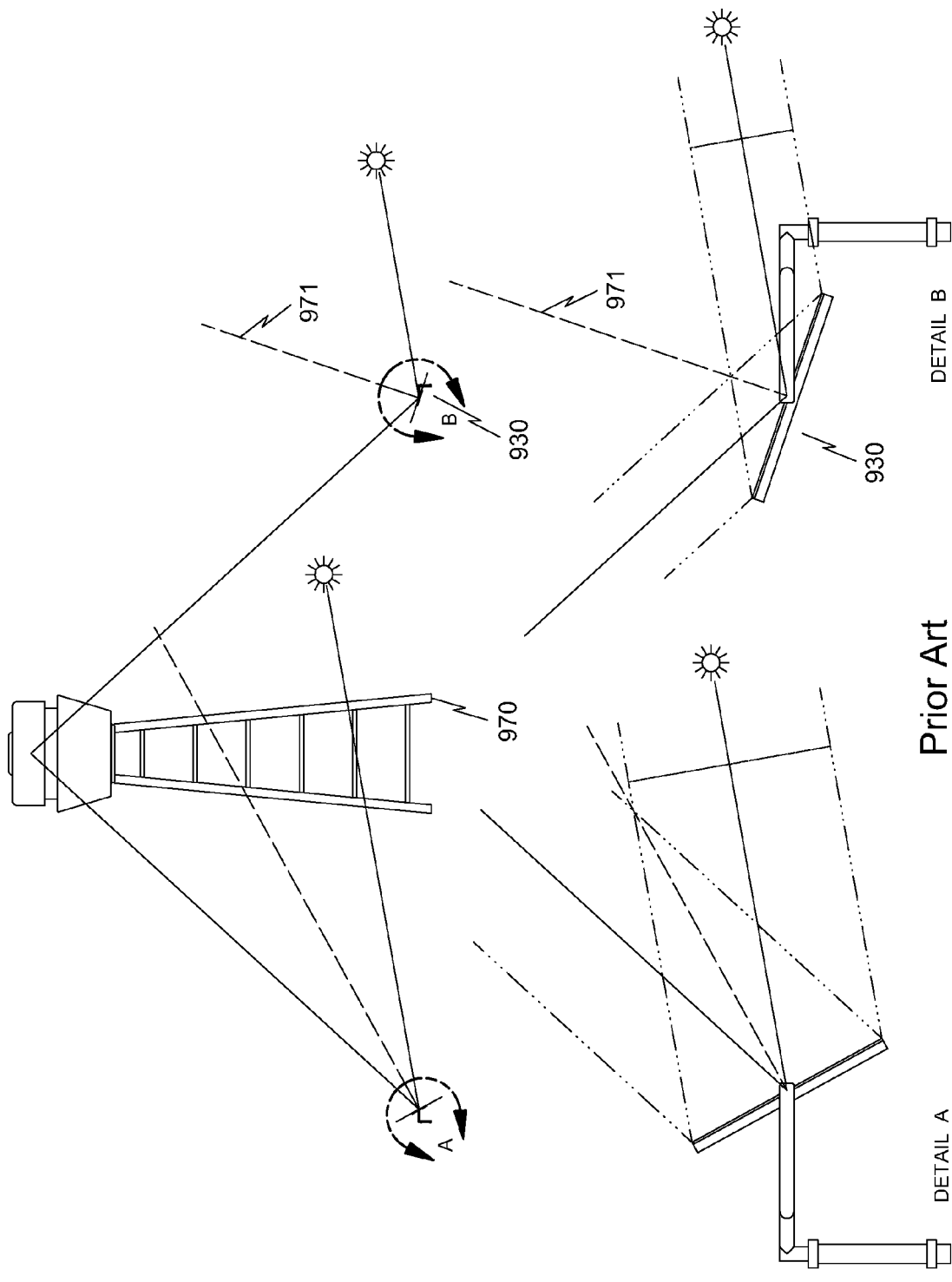
FIG. 9B is an illustration of drawbacks of the prior art of heliostat mirrors being associated with given heliostat receivers.

In the standard art of equatorial heliostats, as shown in FIG. 9B, each given mirror 930 would always direct its light onto the same tower 970, with that tower being the nearest tower. However, the mirrors farthest to the east of their tower contribute very little light to their tower because their normal lines 971 are at almost right angles to the directions of the sun and the tower, making their effective areas very small.

In a preferred embodiment of the present invention, a given mirror is not always associated with a given tower, but can be directed to track on different towers at different times. This allows mirrors to be used much more effectively; for example, if, as shown in FIG. 9C, all mirrors 930' direct their light toward the nearest tower 970 to the east near sunrise, and the nearest tower 970 to the west near sunset, the efficiency can be considerably improved because the effective area of the mirrors 930 is maximized. In addition to maximizing the mirrors' effective area, and thus the total amount of energy directed toward the towers, light arrives on a tower from only one direction at a time (the west in the morning and the east in the afternoon). It is thus possible to have movable insulation so that only the appropriate side of the tower has un-insulated receiver surface at any given time; this significantly reduces the receiver area, and thus its thermal loss for solar thermal systems.

Figure 9D:
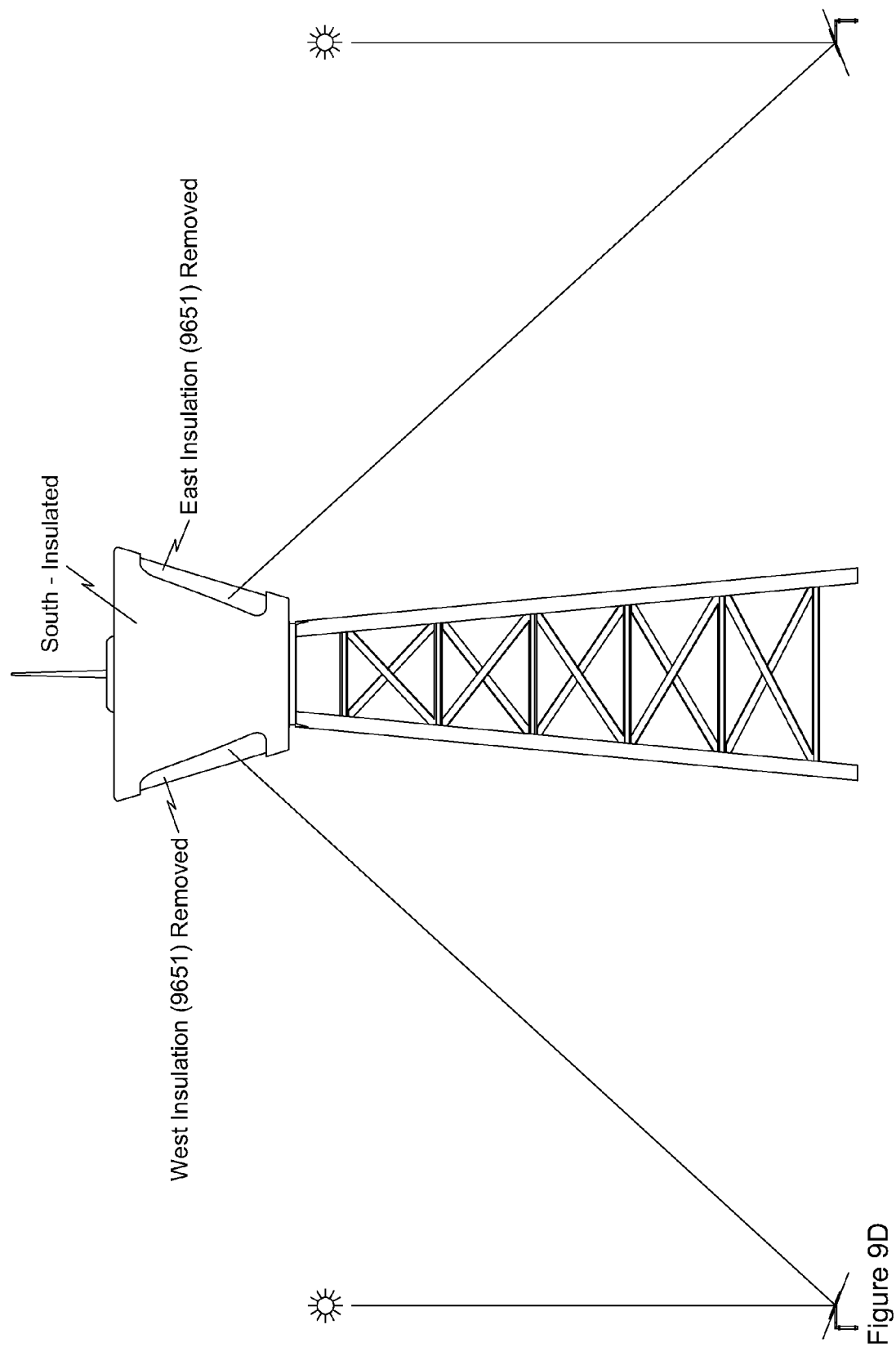
FIG. 9D is an illustration of a heliostat tower with multiple small receiver areas active at the same time.

Accommodating light coming from different directions at different times can be accomplished by pivoting the receiver assembly to face the correct direction, which is cost effective with expensive high-efficiency triple junction photovoltaic receivers. But with inexpensive silicon photovoltaic receivers it is cost-effective to simply duplicate the receiver area, and with the more massive receivers of solar thermal power plants, it will generally be more practical to have receiver area on multiple sides of the tower and to move lightweight insulating panels around to expose the receiver area needed at any given time, than it would be to pivot the receiver assembly. When the sun is near vertical, directing light to the nearest tower maximizes the mirrors' effective areas; as shown in FIG. 9D, if the receiver uses moveable insulation 9651, both the east and west insulation would be removed to expose both sides of the receiver.

Figure 9E:
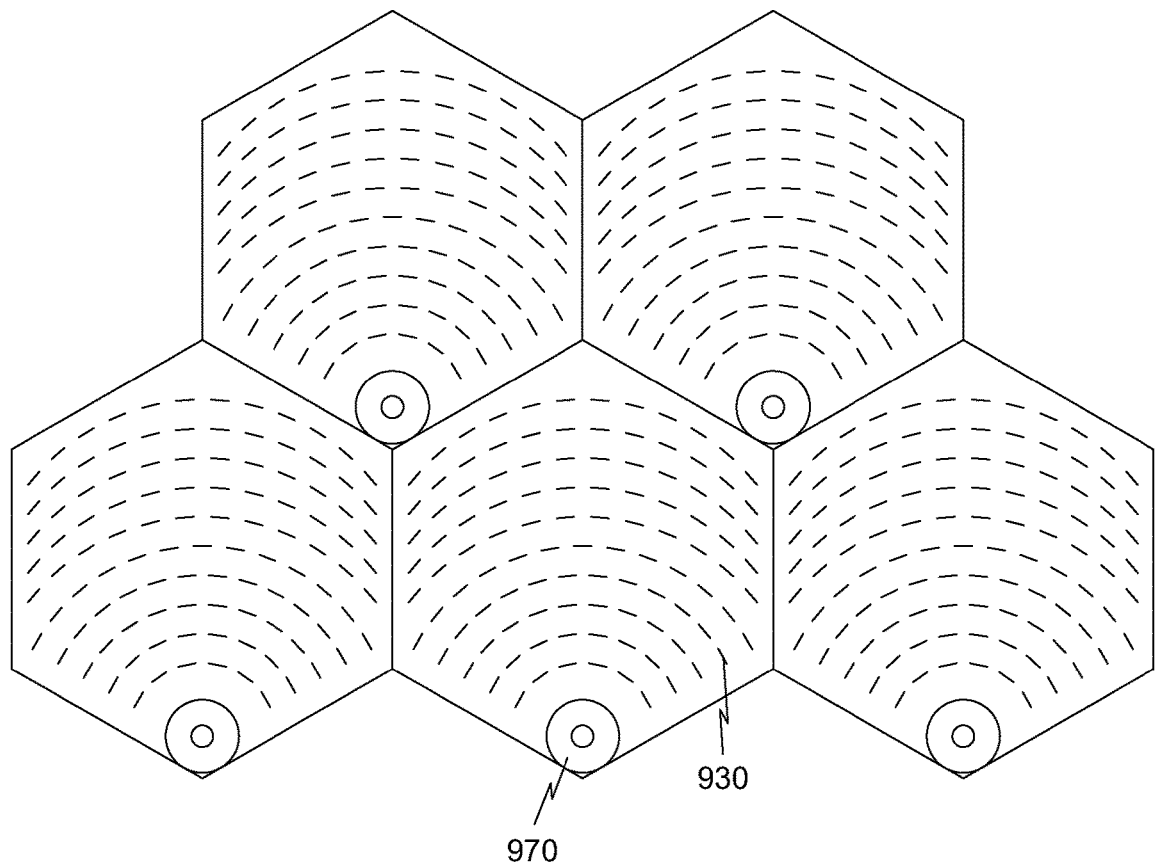
FIG. 9E is a two-dimensional illustration of the prior art of multiple polar-lobe heliostat towers in temperate regions.

Returning to the prior art, away from the equator, the prior art also includes polar lobes (i.e. lobes to the north in the northern hemisphere), and the prior art has also applied this to a field of heliostat towers, where each tower has a polar lobe for its mirror field, and these fields are packed together with the best field packing being hexagonal packing, as shown in FIG. 9E, with each tower being at the southern vertex of its hexagonal field of mirrors. However, as noted previously, although this is the best overall lobe arrangement when each given mirror is associated with a given heliostat tower, it is far from optimally efficient in the morning or the evening.

Figure 9F:
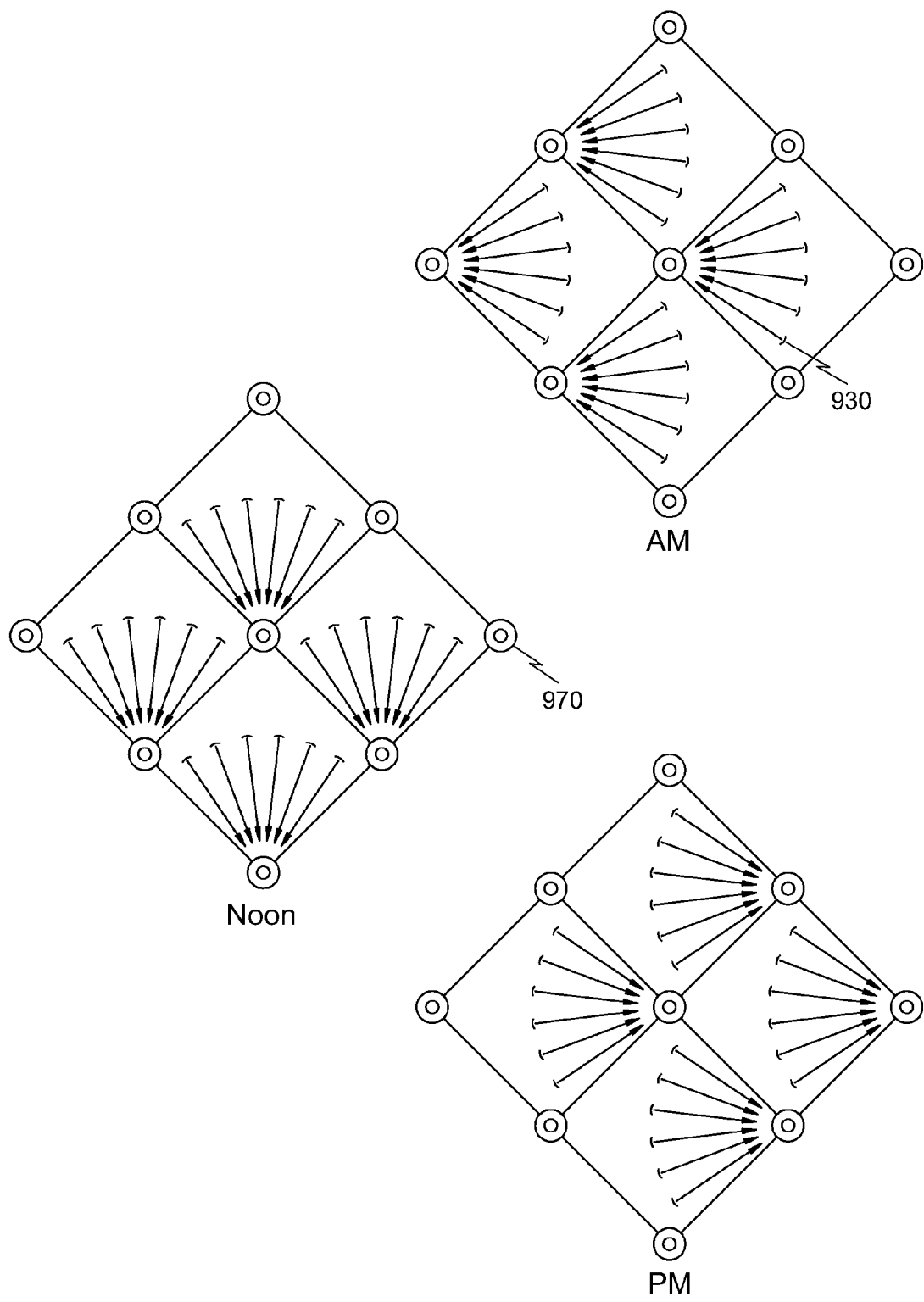
FIG. 9F is a two-dimensional illustration of an improvement to the art of multiple polar-lobe heliostat towers in temperate regions that allows heliostat mirrors to associate with different receivers at different times.

Again by directing each given mirror to track on different towers at different times, the mirrors can be used more effectively than in the prior art. If all mirrors direct their light toward the nearest tower to the east near sunrise, to the nearest tower toward the equator near noon, and the nearest tower to the west near sunset, as shown in FIG. 9F, the efficiency can be considerably improved because the effective area of the mirrors is maximized. With a polar lobe the tower would generally have had receiver area toward the pole; again where receiver area is expensive a tower's receiver can be pivoted to face the mirrors directing light to that tower at that time, and where un-insulated receiver area needs to be reduced to minimize thermal loss, insulating panels can be used on the receiver faces that are not receiving light at any given time.

Not only can having a given mirror track on different towers at different times increase the effective mirror area, but it can also allow curved mirrors to be used more effectively by reducing the change in the cosine of the angle of the mirror's normal line to the direction of the tower. Consider again the greatly simplified case of a line of flat 10-meter heliostat mirrors on the equator, where 100-meter towers are spaced 1000 meters apart, at 23 minutes after sunrise on the equinox. In the standard art of equatorial heliostats, where each given mirror always directs its light onto the nearest tower (as was shown in FIG. 9B), the mirrors farthest to the east of their tower have their normal lines 971 at almost right angles to the direction of the tower, making the cosine of this angle near zero. In the afternoon, however, these mirrors would have normal lines pointing near the tower, making the cosines of their angles very near unity. Thus if a mirror focuses tightly on the tower in the morning, it will barely focus at all in the evening, and if it focuses tightly in the evening, it will over-focus in the morning.

However, if these mirrors can track on different towers at different times, the change in the cosine of the angle of their normal lines to the direction of the tower is minimized for the same reason that their effective area is maximized, that they can pick a tower more nearly lined up with the sun. There is, however a wrinkle that adds complexity; if a mirror directs its light toward a different tower, that tower can be at a different distance, and hence if a curved mirror is used to focus the light, the ideal focal length will be different for different towers. So while for a mirror nearly equidistant between towers, one can tighten the focus by taking advantage of the reduced difference in the cosine of the normal angle, for a mirror much closer to one tower than another tower, if a mirror focuses tightly on the nearer tower it will over-focus on the farther tower.

Figure 9G:
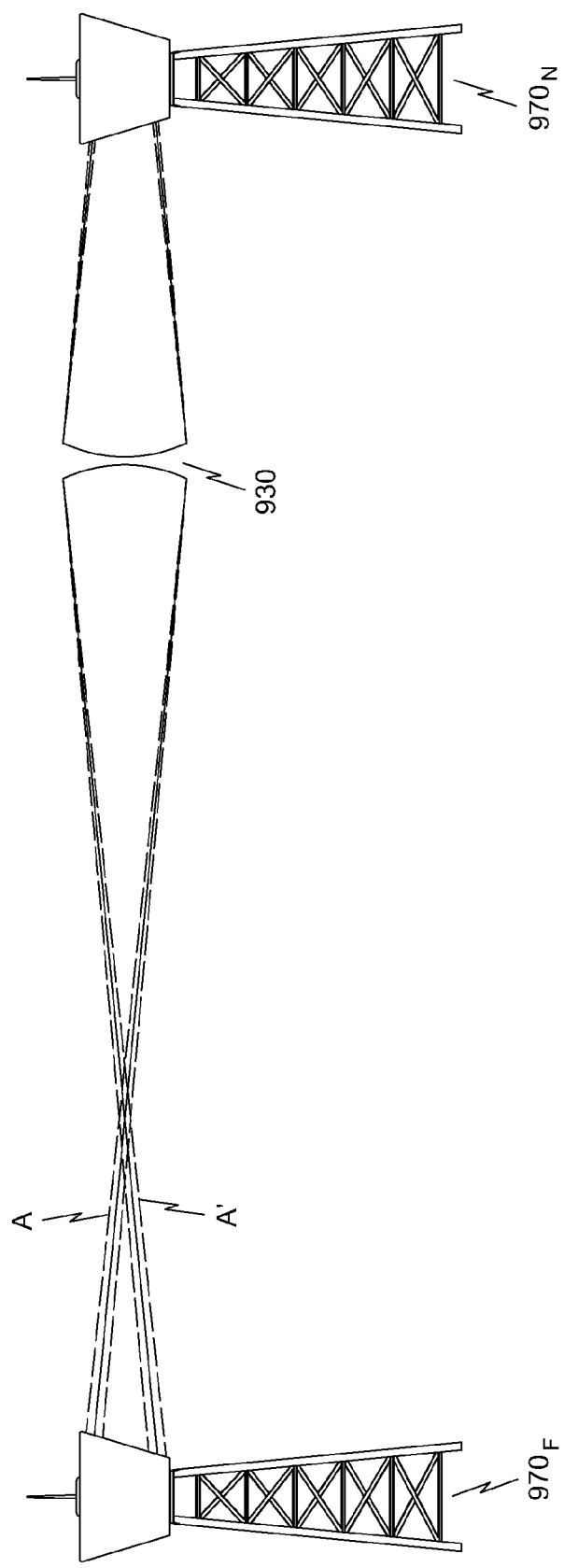
FIG. 9G is a diagram of calculating a focal length that minimizes the maximum focal spot size from a mirror that can focus toward towers at different distances.

As shown in FIG. 9G, without further changing which towers a mirror 930 can direct its light to, the optimal solution is to balance the curvature of the mirror to focus between the two distances, but enough closer to the distance of the farther tower that the contribution to focal spot size from the sun's optical diameter, which is less at the nearer $970_N$ tower, balances the focal length being better matched to the farther tower $970_F$. However for mirrors near the foot of a tower, this forces the focal spot size to be nearly equal to the mirror size, which greatly reduces the effectiveness of using curved mirrors.

A further preferred embodiment achieves a higher focus by keeping the mirrors that are much nearer to one tower associated with that tower; these are the mirrors most affected by the changing distance, and these are also the mirrors whose effective area is least improved by being focused on a different tower, since even in the worst case, when the sun is on the horizon opposite their tower, they 'look up' at the tower at enough of an angle to keep the cosine of their normal angle from approaching zero. And since the worst case cosine of the normal angle is larger, the change in the cosine from the best case (unity) is smaller.

Because these mirrors are close to the tower and thus 'look up' at their receiver, they can be packed much more densely without blocking each other's view of that receiver. This lets these close mirrors contribute significant additional power during the middle of the day when their density does not cause them to block each other's view of the sun. Because these mirrors being close to their tower makes the sun's diameter's contribution to the focal spot size smaller, and because the cosine of their normal angle changes less, maintaining a more constant focal length, each mirror can be curved (or composed of multiple smaller flat mirrors) to focus very tightly, packing their power into a very small focal spot.

Figure 9H:
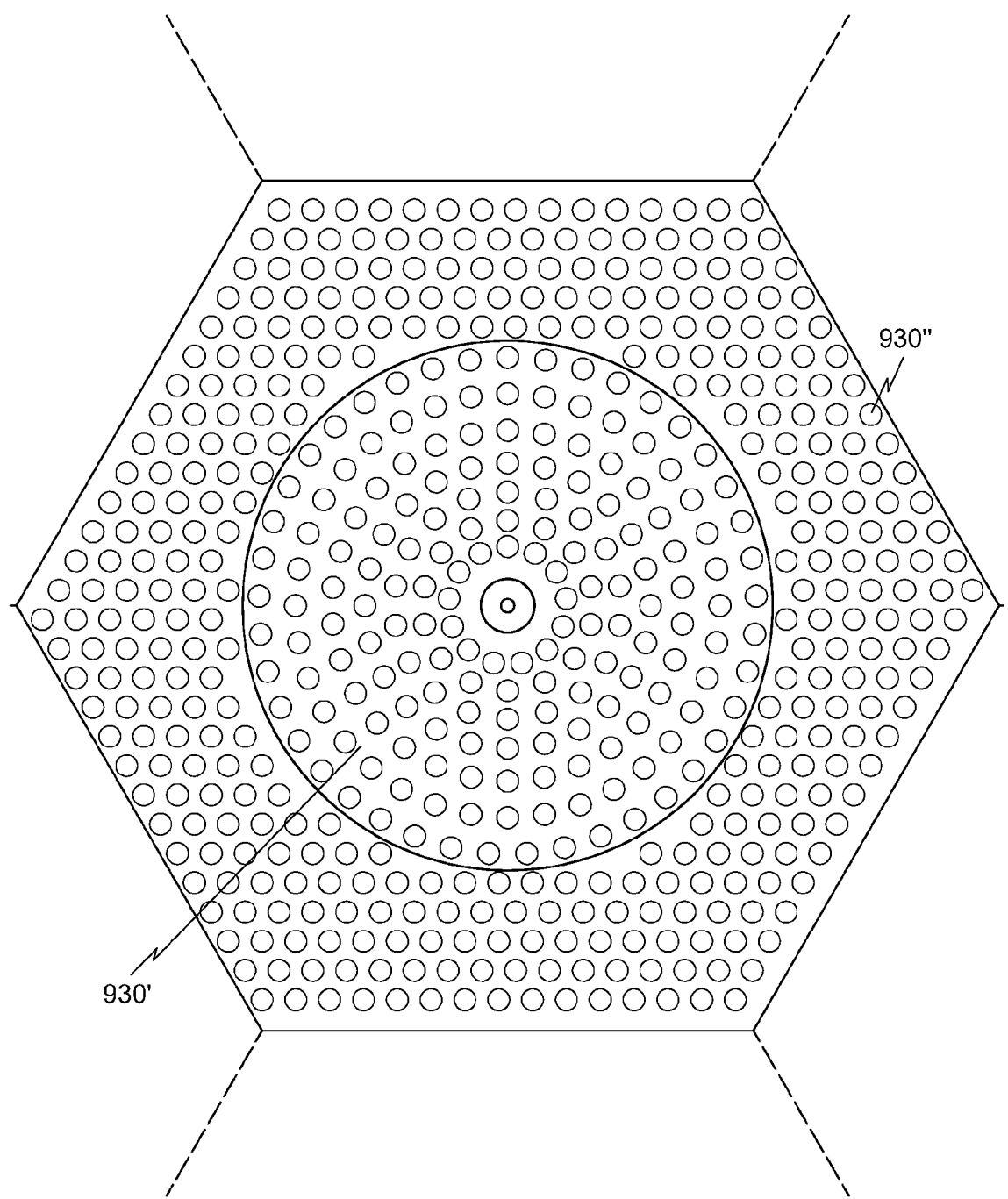
FIG. 9H is a depiction of using different receiver areas for the focusing of near mirrors associated with a tower and farther mirrors that focus on different towers at different times.

Thus in this optimum, as shown in FIG. 9H, the mirrors 930' that are much closer to one tower than to other towers are associated with that close tower, and focus on a one or more small first receiver areas. Meanwhile the mirrors 930" that are more nearly equidistant between towers are not associated with any given tower, but direct their light on a nearby tower that is near the direction of the sun (which maximizes their effective areas), while focusing onto a larger second receiver area on that tower. Since the mirrors close to a tower are always associated with that tower, they are preferably arranged in rings around that tower, while the unassociated mirrors are preferably arranged in a hexagonal packing pattern.

Figure 9I:
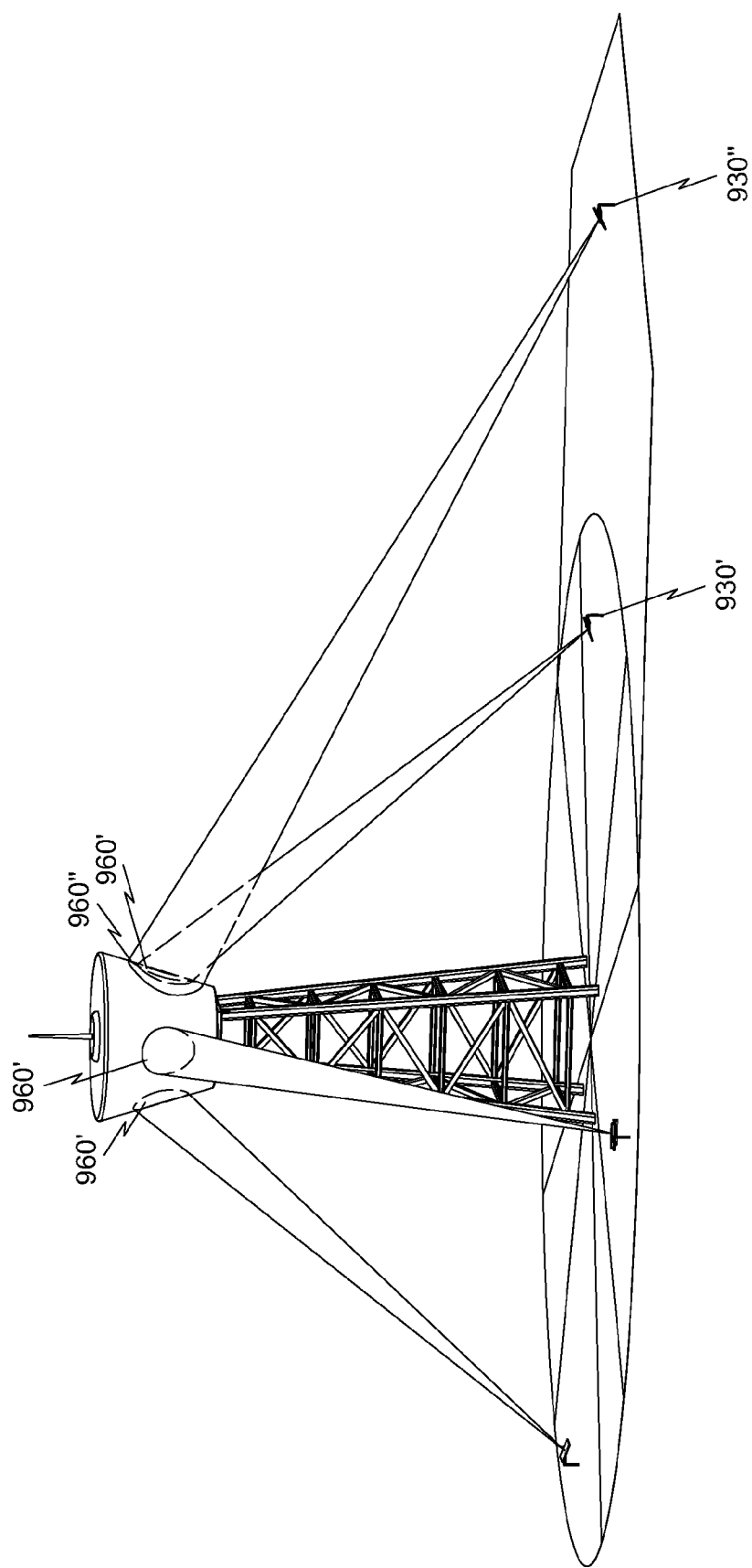
FIG. 9I is a depiction of using overlapping receiver areas for the focusing of near mirrors associated with a tower and farther mirrors that focus on different towers at different times.

As shown in FIG. 9I, a first focal spot 960' and the larger second focal spot 960" may overlap, and when several first focal spots are used per receiver (each corresponding to nearby mirrors on one of several sides of the tower) one of the smaller first focal 960' spots may even be entirely inside the larger second focal spot 960". The smaller first focal spots may be fixed insulation-free areas of the receiver, while the second receiver area may be moved from around the tower (either by rotating the receiver or more preferably by moving insulating panels) to remain nearly opposite the sun as the suns moves. With multiple smaller first focal spots, each with light coming in from one direction, non-imaging secondary concentrators can boost the concentration significantly.

Figure 9J:
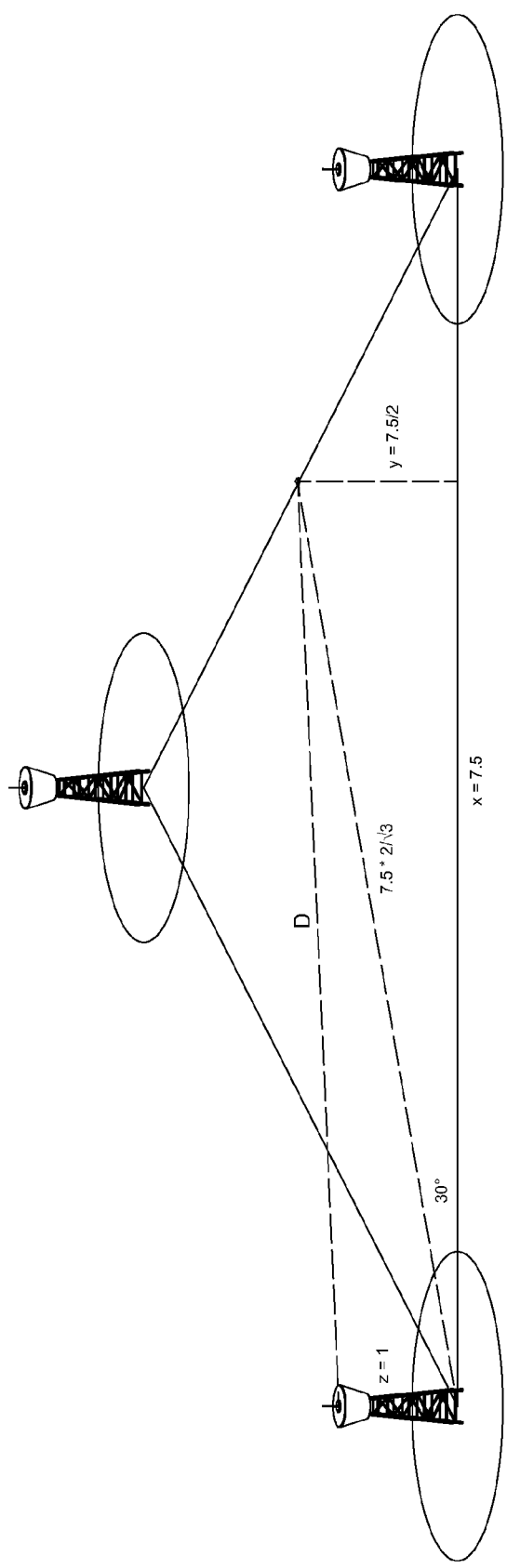
FIG. 9J is a depiction of the worst-case distance from a farther mirror to a tower that it focuses toward.

With flat mirrors, the smaller spots are essentially the size of a mirror because the close distance to the tower minimizes the spot size contribution from the sun's angular diameter. Even with the farthest mirrors being somewhat farther from some of their nearby towers than if mirrors were always assigned to the closest tower, the focal spot size is not enlarged excessively. In the example of towers 10 tower-heights apart, and using an optimal triangular packing, if one were to have all mirrors within three tower heights fixed to a given tower, as shown in FIG. 9J, then the farthest distance for a multi-tower mirror would be $SQRT((7.5*2/SQRT(3))^2+1)=8.7$ tower heights rather than $5*2/SQRT(3)=5.77$ tower heights. In the example of a mirror diameter 1/10 of the tower height, this would produce a spot of 18.7 meters in diameter rather than 15.77 meters in diameter, for a spot area increase of only 40%. This modest spot area increase is far more than offset by having to have this receiver area on only one side of the tower instead on each side of (or surrounding) the tower, and by most of the mirrors reflecting onto that receiver area having significantly larger effective areas as well, thus increasing the amount of light directed onto that receiver area.

While in this example only $9*Pi/(10*10*SQRT(3)/2)=32.6\%$ of the ground area is for close mirrors, in general more than 1/3 of the mirrors will be 'close mirrors' because these mirrors can be packed significantly more densely. While the exact packing depends on the latitude (which influences the amount of time that the sun is low to the horizon) and the relative costs of mirror area and receiver area, typically the ratio of mirror area to ground area will be roughly 50% near the base of the tower, and will fall to around 30% at three tower heights away. Rather than a continuous lowering of the mirror density with distance, when mirrors can change towers their distance is less well defined and so the packing density would drop discontinuously at the boundary of 'assigned' mirrors.

While very expensive mirrors would dictate a less dense packing so that the mirrors only shade each other for a short time in the morning and evening, for the low-cost mirrors, frames and tracker mounting systems and shared tracker mounting of the present application, the packing ratio should be approximately the same as the ratio of the tower height to the farthest a selected tower can be from a mirror. While the exact packing density this rule gives for any spot varies slightly, it is a pretty flat optimum and hence for construction simplicity a uniform density can be used for the unassigned mirrors without any significant loss of efficiency. It should also be noted that while mirrors assigned to a tower are generally placed in concentric rings or arcs around the closest tower, unassigned mirrors are better placed on a hexagonal closest packing to that they are least likely to block or shade each other whichever tower they are focused on (as was shown in FIG. 9H). In fact if they were arranged in arcs, arcs around the farthest of their towers would be more optimal than the nearest of their towers because they are more capable of blocking each other's view of a farther tower which appears to be at a low angle above the horizon; however, having assigned a tower for the mirrors that are much closer to one tower minimizes the effect of this to the point that planning and construction simplicity is more important at today's costs. In this example, just slightly over ½ of the mirrors are "close" mirrors; more generally between ⅓ and ⅔ of the mirrors are 'close' mirrors.

The analysis of having close mirrors assigned and farther mirrors unassigned is more complex for curved mirrors because the changing cosine factor also comes into play. However because the changing cosines of the mirror's normal line relative to the direction of the receiver affects assigned mirrors more than unassigned mirrors (which can be directed toward a receiver that minimizes this effect), in general the boundary between assigned mirrors and unassigned mirrors will be closer to the tower than with flat mirrors. For a mirror located one tower-height away from the base of a tower, the receiver is at a 45-degree elevation and the worst-case normal angle is (180−45)/2=67.5 degrees, and the cosine of 67.5 degrees is 0.38.

Even in the worst case when the sun is roughly behind the tower, the cosine cannot be bigger than 1, so the mirror can have a normal focal length of the distance to the receiver divided by the geometric average of the cosine of the most extreme normal angles, or 1/SQRT(1*0.38)=1.62 times the distance to the receiver in this case. Thus the mirror over-focuses (due to its smaller effective diameter) when the sun is low to the same spot size that it under-focuses to when the sun is roughly aligned with the receiver, producing the smallest maximum spot dimension of 1−0.62=0.38 times the mirror dimension plus 1/100 the mirror-to-receiver distance, which with a mirror whose diameter is 1/10 the tower height is SQRT(2)/10 or 0.14 times the mirror size for a mirror one tower height away from the base of the tower. Thus even a 1/10-tower-height mirror only one tower height away cannot focus to a maximum vertical dimension smaller than 0.14+0.38=0.52 times the mirror size. A similar mirror two tower heights away sees the receiver at 26.6 degrees above the horizon and has a worst-case cosine of cos(76.7)=0.23, so it has a smallest maximum focal contribution to spot size of 1−SQRT(0.23)=0.52 times the mirror dimension. With the receiver being SQRT(5) tower heights distant the mirror thus cannot focus vertically to smaller than SQRT(5)/10+0.52=0.74 times the mirror's vertical dimension.

But this considers only the vertical size of the spot. Most curved mirrors that focus in two dimensions have equal normal focal lengths in both dimensions, which precludes significant improvement in the horizontal case since the worst-case under-focusing for a mirror, when the sun is roughly aligned with the behind the tower, is the same in either dimension. But mirrors with different focal lengths in the vertical and horizontal dimensions can achieve a significantly tighter focus horizontally.

For the horizontal dimension, the angle to the sun is never worse than 90 degrees, so the angle of the normal line is never worse than 45 degrees, and the cosine of 45 degrees is SQRT(2)/2 or 0.71. Therefore even for a mirror where the sun can pass directly behind the receiver, the normal focal length can be 1/SQRT(1*0.71)=1.19 times the distance to the receiver. This makes the worst-case focal contribution to the spot size 0.16 times the mirror size, regardless of the distance to the tower. Of course the sun's diameter's contribution to the spot size is still dependent on the distance to the receiver, but even at two tower distances this produces a spot only 0.22+0.16=0.38 mirror diameters, or roughly twice as tight a focus as in the vertical dimension.

The receiver must be large enough to accommodate the larger second receiver area, for which the worst-case spot size comes from the farthest mirror, which in this case is 8 tower-heights from the base of the tower. Because even the most central such mirror sees neighboring towers only 120 degrees apart, it can always find a neighboring tower within 60 degrees of the sun's direction, and its horizontal normal angle will be at most 30 degrees to the receiver's direction. Since the cosine of 30 degrees is SQRT(3)/2 or 0.866, such a mirror's normal-cosine contribution to horizontal spot size can be held to 1−SQRT(1*0.866)=0.07 times the mirror size. However, while other mirrors are even better in this regard, the worst case mirrors have a pronounced difference in the actual distance to various neighboring towers.

Figure 9K:
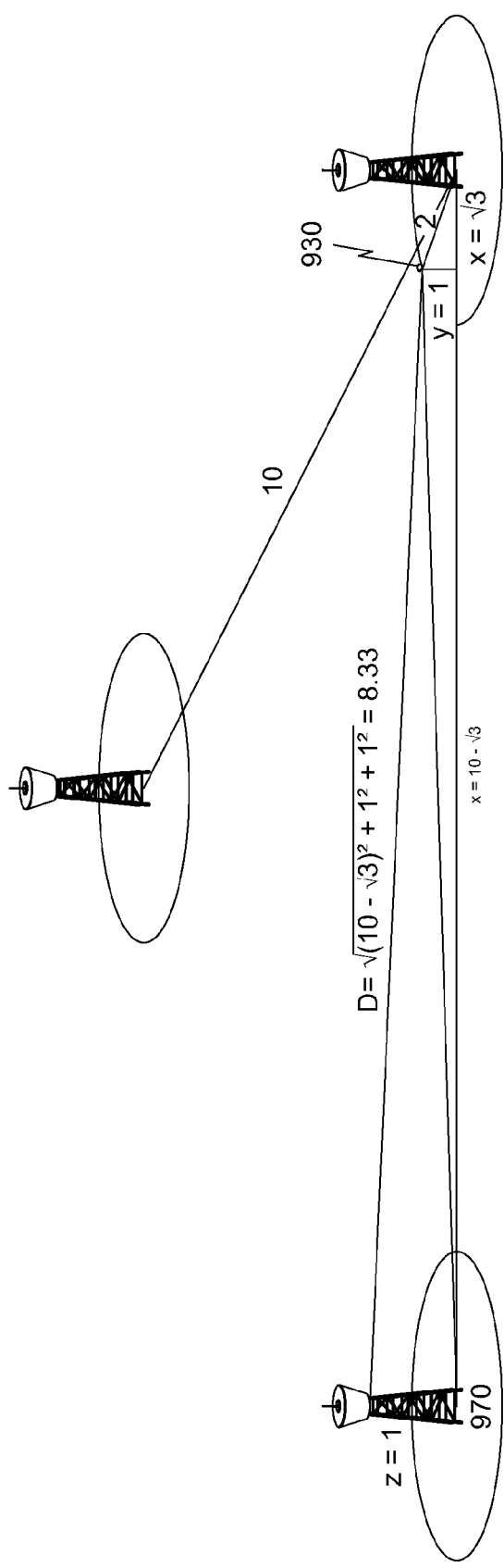
FIG. 9K is a depiction of the worst-case distance from a farther mirror to a tower that it focuses toward when the boundary between near and farther mirrors is optimized for curved mirrors.

Consider a mirror only two tower heights away from one tower, and thus a bit over eight tower heights away from its farthest neighbors, as shown in FIG. 9K. The worst-case cosine factor is even smaller (roughly 0.05 mirror diameters), but the physical distance to a receiver varies between SQRT(5)=2.24 and SQRT((10−SQRT(3))²+1+1)=8.4 tower heights. The geometric average of these is SQRT(2.24*8.4)=4.34 tower heights, which is 52% of the maximum. Thus the minimum distance contribution to the spot size for the larger second receiver area is 0.48 mirror diameters in each dimension. At a distance of 8.4 tower heights, the spot size contribution is 0.84 mirror diameters in each dimension. Thus the spot size from the two factors directly related to the receiver distance is 0.84+0.48=1.32 mirror diameters, and in each dimension.

To this is added the cosine effect, which is 0.05 mirror diameters in the horizontal dimension and 1−SQRT(SQRT(2)/2)=0.16 mirrors diameters in the vertical dimension, so the smallest larger second receiver area in this example is 1.37 mirror diameters horizontally by 1.48 diameters vertically. This is much larger than the smaller spots, and so the smaller spots are ideally multiple smaller spots on the sides of the tower; to prevent the cosine of the angle of the receiver area from significantly increasing the area needed (as described previously), at least three and preferably at least four such smaller first spots are used, disposed roughly equally spaced around the tower. On the other hand, because the closest mirrors that look up at the tower do not focus on this spot, the vertical angular spread of the mirrors is roughly 30 degrees, a cost-effective non-imaging secondary concentrator can reduce the vertical spot dimension by roughly 1.8× instead of 1.2×.

With only one larger second receiver area at any given time, it is generally advantageous to overlap that area with one of the smaller spots to reduce the total active receiver area and thus increase the overall concentration. In temperate regions the larger second spot will not occur on the equatorial side of the tower, so a removable insulating panel for a second receiver area is not needed in the direction of the earth's equator. Slight enhancements can be made, such as packing the smaller spots closer together in the polar direction.

While the larger second receiver area is (1.37*1.48)/(0.38*0.74)=7.2 times larger than a smaller first receiver area, only roughly ⅓ of the mirrors are within two tower-heights of a tower and these are divided into four or five spots. Thus the larger receiver area has roughly eight times as many mirrors to compensate for its 7.2 times larger area, and small and large receiver areas achieve roughly the same concentration. The larger receiver area does relatively well when the sun is low, due to its mirrors being farther apart and shading each other less and the advantage of picking a tower being paramount, and the smaller receiver areas do relatively well when the sun is high, and the lower angle of the receiver above the horizon affects the effective area of the farther mirrors more. Non-imaging secondary concentrators can also shrink the size of the large receiver area by roughly 1.2*1.8=2.16 times smaller, versus only 1.44 times smaller for the smaller receiver areas. Thus when it is acceptable to have significantly different concentrations, the large receiver area can be the highest concentration area when secondary concentrators are used.

The small receiver areas themselves achieve unequal concentration; the small first receiver area toward the larger second receiver area receives the most light from the close mirrors and thus achieves the highest concentration. This effect is most pronounced when the sun is low and least pronounced near solar noon, and the effect is boosted if the larger second receiver area overlaps that first receiver area.

For solar thermal systems, exceptionally preferred embodiments use this differential concentration to preheat the working fluid at the receiver areas of lowest concentration, and give the fluid its final heating in the area of highest concentration. In cases where changing the path of the fluid is too costly to justify dynamically adapting during the day, the working fluid preferably passes first through the first receiver area closest to the anti-polar direction and last through the first receiver area in the polar direction to take advantage of this having the highest average concentration.

Until now the two axes of a mirror have been treated as being the same, with only flat mirrors, true parabolic mirrors, and multiple flat mirrors on a tracker being evaluated. While flat mirrors are easier to make than mirrors that curve everywhere in two directions, true parabolic mirrors achieve the highest concentration possible for fixed-focal-length mirrors. However, with mirror shape contributing a somewhat higher proportion of the spot size horizontally in the above embodiments, a mirror curved differently in these two dimensions can be aligned to have its higher focus in the horizontal dimension, with its lower concentration dimension being in the vertical dimension where the mirror shape's contribution to the focal spot size will be relatively smaller.

While a flat mirror is easier to form than a mirror that curves in two dimensions at every point, a mirror that curves modestly in one dimension is also easy to form. A flat sheet needs stiffening anyway to avoid fluttering in the wind; although a millimeter or two of flutter may sound insignificant in a large mirror, it can noticeably change the angle at a given point, and even a small change in the angle will cause light reflected at that point to miss its distant target. A flat sheet can simply be pressed onto an appropriately curved mandrel and held there as a stiffening agent sets, locking in the appropriate curvature. Such techniques for large, long-focal-length, linear parabolas stiff enough to require minimal support have already been pioneered for linear-focus parabolic troughs, using both metal and glass mirrors ("*Further Analysis of Accelerated Exposure Testing of Thin-Glass Mirror*", National Renewable Energy Laboratory), and the longer focal length of a heliostat mirror requires even less curvature than a parabolic trough. The sleeved mirrors taught earlier in the present application are also applicable. Curving a sheet in one dimension is thus simple from a construction viewpoint, and having a mirror be parabolic in one dimension keeps the focus as tight as possible in that dimension without adding complexity. Since in the above embodiments the horizontal dimension has a tighter focus from other factors, in more preferred variations of the above embodiments a tracker's mirror is thus parabolically curved in the horizontal dimension.

Figure 10A:
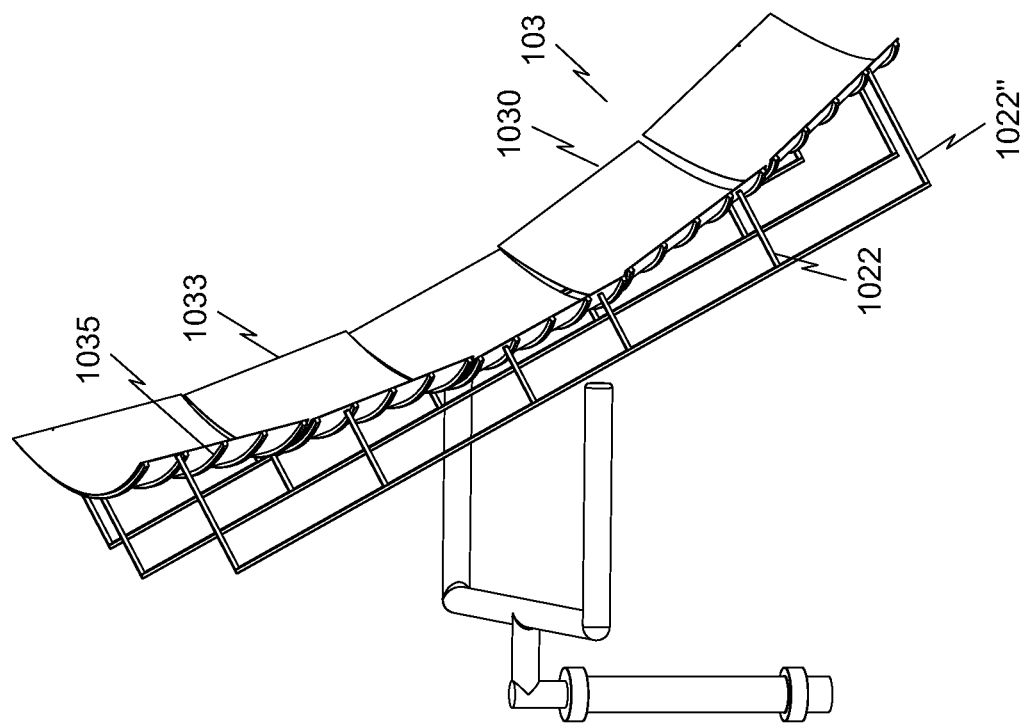
FIG. 10A is a depiction of an inexpensive multi-cylindric mirror that approximates a paraboloid for focusing on a heliostat tower.

Standard reflective sheets, such as Anomet's Alanod Miro-Sun or Naugatuck's solar glass mirrors, come in widths of a bit over a meter (approximately four feet) because sheets wider than that become significantly harder to handle. But the most cost-effective trackers are far wider than a meter in each dimension, so a single sheet of reflective material per tracker is impractical. However, by making a tracker's mirrored surface from multiple sheets of reflective material 1033, as shown in FIG. 10A, where the sheets are curved parabolically in one dimension by shaping means 1035, and where each sheet 1033, while forced flat in the other dimension, is aligned to form a flattened segment of a parabola in the vertical dimension, the manufacturing optimum of curvature in exactly one dimension at any point can be satisfied with only a minimal impact on the focal spot size. Such mirror segments 1030 can be held by mirror segment supports 1022' and 1022" in the shape of an approximate overall parabolic mirror 103 of the appropriate focal length.

With such an arrangement the focal spot size is not increased at all over a true paraboloid in the more critical tighter horizontal dimension, and is increased only by the effective width of a single sheet in the less critical vertical dimension. In the above example of 10-meter tracker diameters, a four-foot sheet width is only 0.12 mirror widths. So even without re-optimizing to balance the narrower effective width of a sheet when over-focused against slightly less under-focusing, the smaller first receiver areas in the example above are only increased from 0.38*0.74 times a tracker's area to 0.38*0.86 times the tracker area, an increase of only 16%, and the larger second receiver area is only increased from 1.37*1.48 to 1.37*1.6 times a tracker's area, or only 8%. This "aligned multiple-cylindric-paraboloid" mirror is far less expensive than a molded glass fully-parabolic mirror, and the increase in spot size (and thus the decrease in concentration) is far less than the increase that using a flat mirror would cause.

Figure 10B:
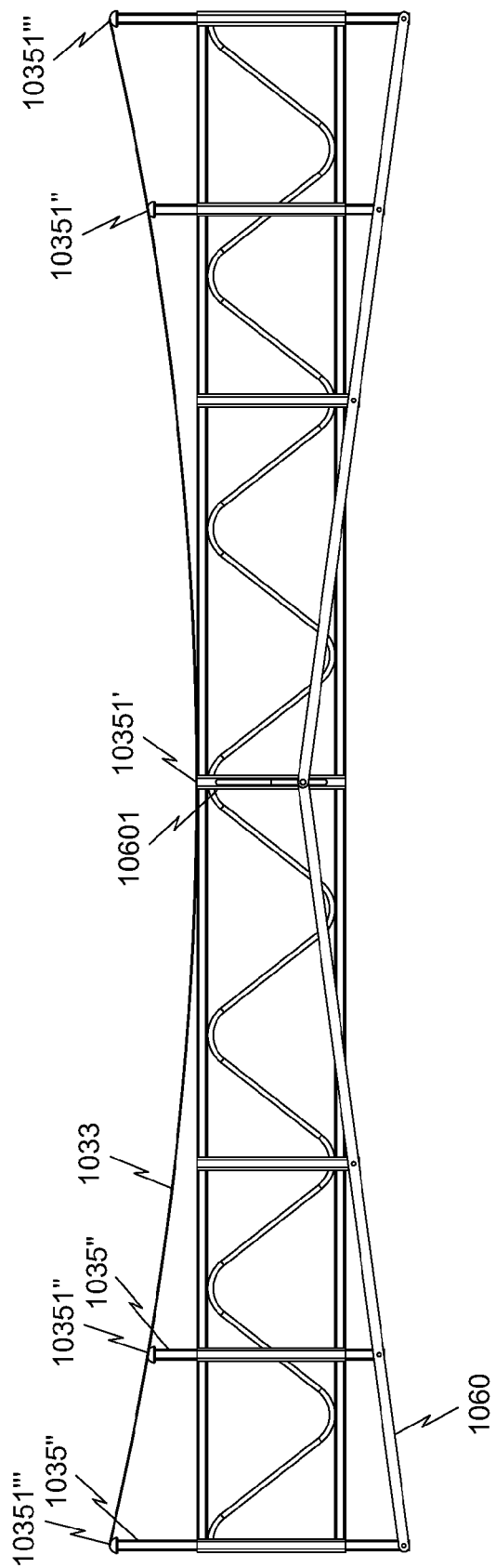
FIG. 10B is a depiction of a cylindrical mirror whose focal length can be easily adjusted.

Because the mirror surface on each tracker is curved in only one direction at any given point, the surface can be formed from mirrored sheets that are bent on the spot simply by affixing them to a properly shaped tracker frame. Tracker frames supporting mirrors of various focal lengths can be formed from identical straight beams by having a series of attachment points, such as holes for bolts, where different attachment points are used to produce frames with different focal lengths. As shown in FIG. 10B, a reflective sheet 1033 can be bent into a very good approximation of a parabola with a five-point spline with its outer points closely spaced to minimize hyperbolic effects, with one fixed spline point 10351' and four adjustable spline points 10351" and 10351'''.

A single lever 1060 can be used to adjust the height of all moveable spline points 10351" and 10351''' via sliders 1035" and 1035''', and the characteristics that that lever must have can be calculated. Assume, for example, that spline points 10351" are at 80% of the horizontal distance from fixed spline point 10351' as spline points 10351''' are. Then for any parabola spline points 10351" must move vertically by 0.8*0.8, or 0.64 times as far as spline points 10351''' do. This is accomplished picking the fulcrum point of lever 1060 such that slider 1035" is attached to lever 1060 at a point 0.64 times as far from the fulcrum as slider 1035''' is attached. Lever 1060 is continued beyond the fulcrum to the center of the tracker, where it meets a substantially identical lever from the sliders to the other spline points 10351" and 10351'''. Both levers are attached at this point by a pivot to a focus adjustment means 10601. A simple vertical movement of the focus adjustment mean 10601 thus always moves spline points 10351" and 10351''' relative to fixed spline point 10351' in a manner that maintains a five-point spline approximation of a parabola. To be sure, large movements of adjustment means 10601 would try to stretch lever 10601, but this is a cosine factor which is insignificant at the small angles needed for the very long focal lengths preferred for heliostat mirrors.

Figure 10C:
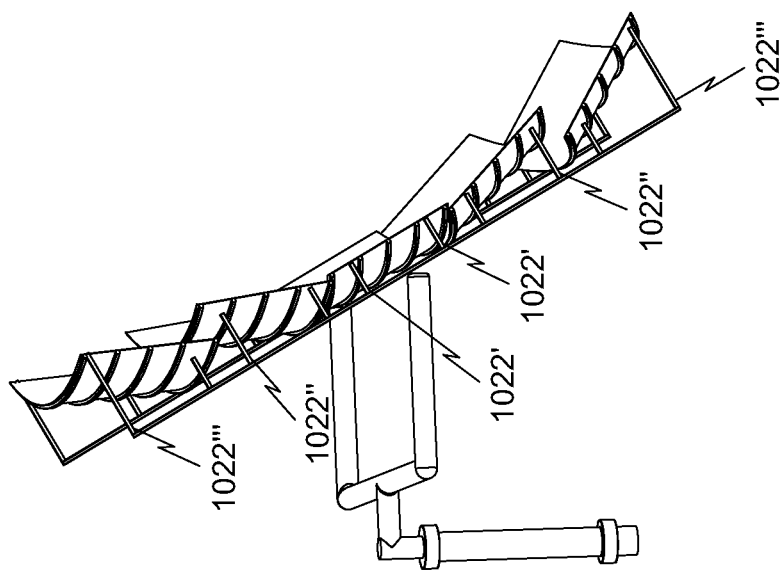
FIG. 10C is a depiction of a Fresnel mirror tracker frame supporting multiple identical mirror sections.

As shown in FIG. 10C, if a Fresnel mirror is using in the other direction, using a single set of parts while allowing adjusting the focal length of the overall mirror in that direction is even simpler. The ends of the mirror segments closest to the center of the tracker are all fixed to the tracker with short supports 1022', while the far ends of the segments are all supported by longer supports 1022" that can be adjusted to slant each segment appropriately, as was done in the Archimedes-inspired design shown in FIG. 2G. Together these let every heliostat tracker, including its mirrored surface, be formed from an identical set of parts, thus greatly simplifying logistics and increasing economies of scale on production. Focus adjustment means can have a series of holes for the various need focal lengths, or it can simply be slid according to a distance scale and then clamped in place.

While the prior art of Wood in U.S. Pat. No. 6,485,152 teaches bending narrow mirror strips against parabolically curved rails in situ to form curved mirrors, that art would not be practical here because the wide sheets that are most cost-effective (due to assembly costs) would have half their area become ineffective hyperbolic corners rather than effective parabolic curves, thus decreasing the mirror efficiency unacceptably. Thus straight rail segments for holding the mirrors in place are essential for a cost-effective system if the mirrors are shaped by being held directly against the rails. The pre-shaped one-dimensionally parabolically curved mirror segments taught earlier in the present application would also be applicable, although at the size of a full sheet and the slight curvature of such a long focal length, the strengthening from the pre-shaped curve would be less and a thicker glass would be preferred for strength. However, since some strengthening would still occur, the glass could still be thinner than for a mirror unsupported between rails. All such full-sheet segments could be identical, as the curvature of a paraboloid over such a small angle is essentially constant.

But by having two shapes of tracker frames, one for the close mirrors and one for the far mirrors, one can achieve a similar result from tracker frames that are easier to assemble in the field and are sturdier. For the larger second receiver area, the spot size remains the same because a mirror farther from the base of the nearest tower always falls within the distance range used for the mirror on the close-mirror/far-mirror boundary. For the close mirrors, however, the mirrors near the foot of the tower have a shorter distance to the tower than the minimum distance for the mirror used in the calculation.

In the above example with the farthest close mirror two tower heights from the base of the tower, the farthest distance from the receiver is SQRT(5) tower heights. The worst case over-focusing for such a mirror occurs at the maximum normal angle, where the cosine of the normal angle is $\cos(180-\sin^{-1}(1/SQRT(5))/2)=0.23$, producing a focal length just less than a quarter of the mirror's normal focal length. In the other extreme, a mirror near the base of the tower will have a minimum normal angle of near zero degrees, and a distance to the receiver of one tower height.

Since this is a more optimal embodiment, the next correcting factor will now be taken into account in the calculation (this has been mentioned but has been left out of the mirror focal length optimization before now for clarity). The sun's optical diameter at one tower-height distance will be only 1/100 of the tower height, which in this example is 0.1 tracker diameters, whereas at the farthest close mirror it is SQRT(5)/100 tower heights, or 0.22 tracker diameters. So to produce the smallest maximum focal spot for a close mirror, the focal length should be balanced so that the under-focusing at the foot of the tower contributes 0.22−0.1=0.12 tracker diameters more to the spot size than the over-focusing of the farthest close mirror at its worst normal angle.

Solving for the optimum focal length in the vertical dimension requires that that the worst case vertical spot size from the farthest close mirror, which is 0.22+((SQRT(5)−0.23*X)/X, is equal to the worst case spot under-focusing spot size from a closest close mirror, which is 0.1+(X−1)/X, where X is the focal length in tower heights. These are equal for a focal length of 3.73 tower heights, where both spot heights are equal to 0.83 tracker heights. This is only around 12% bigger than the focal spot's vertical dimension of 0.74 tracker heights achieved when each mirror had a custom focal length, so in general the economy of scale of having all close mirrors have the same focal length outweighs the slightly higher concentration achievable with a custom mirror for each distance from the tower.

With a tracker mirror being a multi-cylindric paraboloid this calculation can be adjusted further to take into account the mirror sheet width adding less when the mirror's normal angle cosine is small. A four-foot (1.2 meter) sheet width will add its full 0.12 tracker diameters (with a 10 meter tracker diameter in these examples) to the worst-case spot size of the closest mirror, but only 0.23*0.12=0.03 tracker heights to the worst-case spot size of the farthest of the close mirrors. This thus counteracts ¾ of the impact of the larger contribution of the sun's diameter, leading to a minimum focal spot vertical dimension of 0.66+0.22+0.03=0.91 tracker heights. Again this is only modestly bigger than the 0.74 tracker heights obtained with mirrors customized for each distance. To be sure, the more recent optimization included two more factors, the sun's diameter and the mirror sheet width, but since these almost cancel out this is a fair assessment of how the impact of a single focal length for all close mirrors can be ameliorated into relative insignificance.

There are location-dependent influences on the optimization, but they are small enough to be handled simply as a correction to the optimization. For example, if the heliostat field is situated at a latitude significantly higher than 23 degrees, where the sun will never be straight overhead, this has only a small effect; the worst case under-focusing will be for a mirror whose angle to the receiver splits the difference between the site's latitude and the 23 degree slant of the earth's spin axis. For example, for a heliostat field at 45 degrees north latitude, the worst under-focusing for a close mirror will be at solar noon on the summer solstice at a mirror that is (45−23)/2=11 degrees north of the tower when seen from the receiver's point of view. Since the cosine of 11 degrees is close to unity (0.98), the receiver is only 1/0.98=1.02 tower heights distant and the mirror's focal length is reduced only to 0.98 of its normal focal length. Together these increase the effective distance to the tower by less than 10%, which allows a slightly tighter focus of 0.88 instead of 0.91 tracker heights.

Although the cosine factor for the width of a tracker can be very small when the sun is on the horizon, outside of the polar regions the sun rises quickly and by the time that the sun is high enough for the mirrors not to shade each other, the height of the sun and the height of the receiver ensure that the horizontal component of the mirrors' normal angle is no more than half of a right angle, or 45 degrees. The worst-case horizontal over-focusing of a close mirror in the above example therefore occurs with a tracker two tower heights from the tower for a receiver distance of SQRT(5) tower heights, and a normal-angle cosine of cos(45)=SQRT(2)/2=0.71, a sun's diameter contribution of SQRT(5)/100 tower heights=0.22 tracker widths, and a mirror sheet width contribution of 0.71*0.12=0.085 tracker widths. The worst-case under-focusing occurs with a mirror near the base of the tower when the sun is nearly directly behind the receiver, for a receiver distance of one tower height, a cosine factor of cos(0)=1, a sun's diameter contribution of 1/100 tower heights=0.1 tracker widths and a mirror sheet width contribution of 1*0.12=0.12 tracker widths. Solving as before, this produces an optimal normal focal length in the horizontal dimension of 1.25 tower heights, so that the maximum focal spot size for the farthest close mirror is a 1−(1.25*SQRT(2)/2)+0.22+0.085=0.42 tracker widths, which is the same as for the worst case for the closest close mirror, which is 1−1/1.25+0.1+0.12=0.42 tracker widths. This is only 10% wider than the 0.38 tracker widths obtained with custom focal lengths for close mirrors at various distances from the tower, which will generally be an acceptable trade-off for the convenience and economy of scale provided by uniform mirrors.

Since the non-close mirrors that are closest to a tower provide both the worst case over-focusing and the worst-case under-focusing, the spot size previously obtained does not need modification for having all far mirrors identical. This optimization can also be improved by including the sun's diameter and the cosine-adjusted mirror sheet width in the optimization calculation.

Considering the worst-case mirror as identified before, a mirror only two tower heights away from one tower, and thus just over eight tower heights away from its farthest neighbors (refer again to FIG. 9K): the worst-case horizontal over-focusing cosine is cos((180−77.7)/2)=0.8, while the worst-case under-focusing cosine is 1. Therefore the smallest maximum horizontal focal spot size occurs when maximum under-focusing spot size of SQRT(5)/10+1−SQRT(5)/F is equal to the maximum over-focusing spot size of 8.4/10+1−0.8*F/8.4; this occurs when the focal length F is 9.1 tower heights and both maximum horizontal spot sizes are 0.97 tracker diameters.

For the vertical spot size, the worst case over-focusing cosine is cos(45)=SQRT(2)/2, and this will also affect the effective mirror sheet width in the over-focusing case, again shrinking it from 0.12 to 0.85 tracker diameters. Therefore the smallest maximum vertical focal spot size occurs when maximum under-focusing spot size of (SQRT5)/10+0.12+1−SQRT(5)/F is equal to the maximum over-focusing spot size of 8.4/10+0.085+1−0.71*F/8.4; this occurs when the focal length F is 10.75 tower heights and both maximum horizontal spot sizes are 1.02 tracker diameters.

With the sun's diameter and the focal length contributions to spot size comparable, co-optimization is very effective and has reduced the spot size for the larger second receiver area dramatically, from 1.48*1.59=2.35 tracker areas, to only 0.97*1.02=0.99 tracker areas, or a bit less than half as large. Since this is fully optimized for this local optimum, the receiver area calculation can be completed. Horizontally the mirrors contributing to this spot are spread over up to 120 degrees, and cos(120/2)=½ so this requires approximately twice (depending on receiver shape) the receiver width as the focal spot width, or 1.94 tracker diameters. The height, however, has a much smaller angular range from 90−sin$^{-1}$(1/SQRT(5)) degrees to 90 degrees, or only 29.5 degrees. Thus the second receiver area height needed is only 1/cos(29.5/2) times the 1.02 tracker diameter spot height, or 1.05 tracker diameters. Thus the second receiver area needed is approximately 1.94*1.05=2.04 tracker areas. With a 120-degree angle for incoming light, a horizontal non-imaging secondary reflector is not worthwhile. A practical vertical non-imaging secondary, on the other hand, can reduce the spot size by roughly 1.8×, which is well worthwhile whenever the higher concentration is useful.

Since the area of the mirror field focusing on a second receiver area is equal to 100*SQRT(3)/2−4*Pi=74 square tower heights=74*74*4/Pi=6880 tracker areas (again assuming round trackers of diameter 1/10 tower height), and the packing density where mirrors seldom block each other's view of towers averages about ⅛ for the far mirrors, roughly 860 mirrors will be focusing on each tower's second receiver area at any given time. Each tracker's effective mirror size will range from the full tracker size to 0.866*0.707 times the tracker's area, for an average about 80%. This is thus equivalent to around 690 times a tracker's area focused onto a spot 1.98 times a tracker's area, for a concentration of roughly 350×. The approximately 1.8× concentration increase from a vertical non-imaging secondary can raise this to roughly 630×, which, with 95% reflective mirrors and 1% blockage is roughly 600 suns, or into the very high concentration range suitable for high-efficiency cells or high-temperature steam generation or chemical reactions.

The smaller first receiver areas also need to be bigger than their spot areas of 0.42 trackers horizontal by 0.91 trackers vertical. Vertically the tracker field spans an angle of 90−29.5=60.5 degrees, and hence the receiver area's height needs to be 0.91/cos(60.5/2)=1.13 tracker heights. Horizontally the tracker field spans 90 degrees, and hence the width needed is 0.42/cos(45)=0.59 tracker widths. The smaller first receiver areas thus have areas of 0.67 tracker areas, or only three times smaller than the larger second receiver area. For solar thermal this still fits with the first receiver areas being used as pre-heating areas for the second receiver area, preferably with a first receiver area that falls within the second receiver area, and which thus has the highest concentration of all, being used for the final stage of heating the working fluid.

An especially-preferred embodiment of a heliostat system therefore uses multiple towers on a hexagonal closest packing in a field of heliostat trackers, where each heliostat tower has multiple first smaller receiver areas and one larger second receiver area that can be exposed in multiple directions, and each heliostat tracker has multiple cylindric-paraboloid mirrors aligned with the cylinder axis vertical, where a first set of trackers that are relatively close to the base of a heliostat tower have mirrors that always reflect the sun's light toward a receiver on that tower, and where a second set of trackers consisting of those that are relatively far from the base of the nearest tower reflect the sun's light toward different receivers on different towers at different times, and where the second set of trackers all have mirrors of comparable focal lengths to each other, and where the focal length of each set of mirrors is optimized to balance over-focusing and under-focusing against the sun's angular diameter and the effective mirror sheet width so that the largest focal spot area from over-focusing is approximately equal to the largest spot area from under-focusing to produce the smallest overall focal spot size.

Where mirror area is significantly more expensive than land area, a further simplification can be made. While having a separate set of close mirrors allows much higher packing of those mirrors, and hence more power per land area, in many high-sun areas land is very inexpensive compared to mirror area, and hence this close packing, which makes the mirror area less effective when the sun is lower to the horizon than the receiver is, is less cost-effective. Simply getting rid of the first receiver areas and letting the close mirrors go to a close tower would amplify the cosine effect on the second receiver area, and reduce the effectiveness of the vertical secondary, both of which would reduce the concentration of this larger area. However, if mirrors within one tower height of the base of one tower are allowed to focus on a receiver on a tower beyond that tower instead of on the closest tower, this effect is greatly reduced while only moderately increasing the maximum distance to a receiver.

Figure 10D:
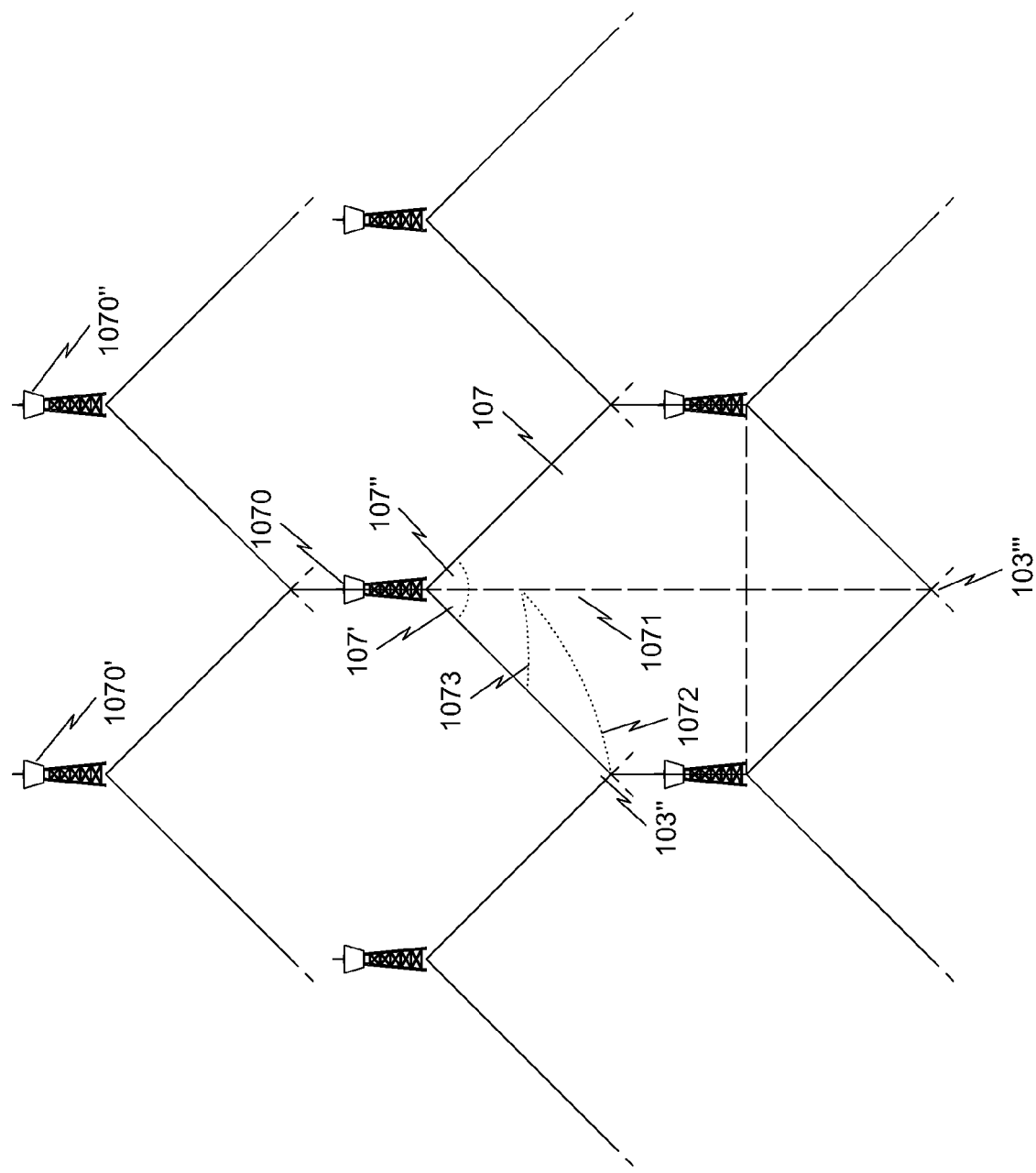
FIG. 10D is an illustration of a dynamic mirror-to-receiver mapping that uses only a single receiver area per tower and reduces the angle subtended by light impinging on that receiver area.

As shown in FIG. 10D, a similar extension of the distance of the receiver on tower 1070 that a tracker mirror is allowed to focus on for trackers that are between two towers can be used to significantly reduce the horizontal angle subtended by the lobe of trackers focusing on a receiver, from 120 degrees to 90 degrees. This produces a lobe of trackers whose mirrors focus on a tower, but unlike the static lobe of the prior art that focuses on the nearest tower in the equatorial direction of the lobe, the lobe of this embodiment of the present invention moves around the tower as the sun moves, remaining approximately opposite the sun from a receiver's perspective at all times.

When this lobe is at its longest, with the sun's direction from a tower being halfway between two nearest neighbors, it is at most ½+SQRT(3)/2=1.37 tower distances, which is 13.7 tower heights, from the worst-case mirror location 103' of a mirror focusing on the tower 1070. The lobe subtends 90 degrees of width when seen from a receiver it is focusing on.

To reduce the vertical angle subtended by the lobe of mirror, a tracker and its mirrors can even focus on tower farther tower than the nearer tower in given direction. This prevents mirrors close to the base of a tower from producing a vertical angle large enough to increase the receiver area needed, and to reduce the vertical concentration gain that can be achieved from a secondary concentrator. For example, the trackers in sub-lobe 107' can focus on tower 1070', and the towers in sub-lobe 107" can focus on tower 1070", even though they are closer to tower 1070 and within the angle subtended by lobe 107 for focusing on tower 1070.

If, for example, sub-lobes 107' and 107" extend one tower height away from the base of the tower 1070, this reduces the vertical angle that the sub-lobe subtends to $90-\sin^{-1}(1/$ 13.7)−45=40.35 degrees vertically. The farthest tracker sees the sun aligned horizontally with the tower, giving the tracker its full normal focal length for this farthest mirror. A normal focal length of 11.9 increases this spot size slightly over a normal focal length of 13.7, but decreases the maximum over-focusing receiver width to match. The spot size is thus 1.37+1−1.19/1.37=1.50 tracker widths, and since this spot is centered on the receiver area (by symmetry), the cosine of the receiver angle is 1 and the receiver width needed by this tracker is simply the same 1.50 tracker widths.

The worst-case cosine of the receiver angle dominates the other worst-case maximum spot sizes, and of the trackers at the maximum 45 degree angles to the sun's direction, those are SQRT(2)/2 tower spacings=5*SQRT(2) tower heights away in the worst case. The 45/2=22.5 degree normal angle gives a focal length of COS(22.5)*11.9=10.99 tower heights, so the under-focusing contribution to spot size is 1-5*SQRT(2)/10.99=0.36 tracker widths, and the sun's diameter's contribution is SQRT(2)/2 tracker widths, for a total of 1.07 tracker widths. But this is at angle of 45 degrees to the center of the receiver surface, and so the receiver area's width needs to be 1/cos(45)=SQRT(2) times wider, or 1.50 tracker widths to match the most under-focused tracker. Another potentially limiting tracker is 103", which is 10.5 tower-heights away at an angle of 30 degrees. The cosine of this angle is 0.87, so the focal length is 0.87*11.9 or 10.4 tower heights, so the mirror is almost perfectly focused and contributes only 0.05 tracker widths, and the spot size is 1.05+0.05=1.1 tracker widths, and the receiver area's width needed is only 1.1/0.87=1.3 tracker widths. This smaller receiver width requirement confirms that this tracker 103" is not a worst-case mirror and therefore does not need to be included in the above balancing.

For the receiver area's height, the cosine factor on the angle of the spot to the receiver is much less dominant due to having mirrors very close to a tower never focus on the receiver on that tower, limiting the angular range to 40.35 degrees. This makes the worst case the mirror 13.7 tower heights away, and with a vertical focus of 13.7 tower heights, the spot height can be held to 1.37 tracker heights plus the mirror strip width of 0.12 tracker heights, or 1.49 tracker heights in total. The worst under-focusing is for a mirror at the minimum of 1 tower height away, when the sun is near directly behind the receiver and thus yields the full normal focal length. The spot size is thus 0.1+1−SQRT(2)/ 13.7+0.12=1.12 tracker heights, and with the receiver area normal to the farthest tracker, this falls at a 40.35 degree angle making the receiver area's height needed 1.12/cos (40.35)=1.47 tracker heights. This is very close to the value from the farthest mirrors, confirming that the limit of one tracker height away from a tower for focusing on that tower's receiver is beneficial in this example. This optimum thus requires a receiver area 1.49 tracker heights high by 1.5 tracker widths wide, centered horizontally opposite the sun and at a slant of 4.65 degrees from vertical, before non-imaging secondary concentrators are included. (For generality in teaching these optimizations, if this had been somewhat bigger than the receiver height needed, slanting the receiver area a few degrees further from vertical makes essentially no difference to the farthest mirror, since the cosine of a small angle is essentially 1, and it would increase the cosine of the receiver angle of the closest mirror considerably, since cosines change significantly with angle by 40.35 degrees.)

The concentration achievable is limited by the tracker density due to most mirrors having a maximum distance to a tower of between 11 and 13.6 tower heights away, which only allows a low density before they block each other's view of some tower at some sun angles. To some extent the low density is good, because with the trackers always having at worst a roughly 45 degree normal angle to the sun, their effective area is always large, and the sparse trackers thus provide very constant illumination on the receivers and thus a high mean-to-peak ratio in power output. However, having a mirror density of 1/13.7 is excessively low, and at a density of tracker area even as high as 1/10 of the ground area only has a small percentage of the mirrors each blocking only a small percentage of another mirror's view of the tower, for an average blockage of roughly 1% in the above example. Unless trackers with mirrors are very expensive, this slight inefficiency in mirror area is more than offset by higher concentration and higher density of mirror area. Therefore a 10% tracker density is assumed, giving 866 trackers per tower. The average effective area is latitude dependent (the sun is never straight overhead in the temperate zones, reducing the worst-case normal angle), but even in the tropics it is at least 85% of the tracker area. Thus allowing for 1% blockage and 95% reflective mirrors, the concentration before using secondary concentrators is approximately 0.85*0.99*0.95*866/(1.49*1.5)=308 suns. This peak concentration is double that of a flat-mirror heliostat of comparable tower height, and this arrangement maintains concentration near that peak the whole time that the sun is more than 5.7 degrees above the horizon (one radian=57 degrees, times the 10% tracker density=5.7 degrees), instead of merely approaching that peak near noon. While this is most important farther away from the equator, even in the tropics it adds considerably to power produced during the late-afternoon demand peak.

Since the horizontal angle subtended by the trackers when seen from the receiver is the same as the angle subtended by the mirror aperture in the segmented mirrors of the large-aperture-per-focus family of embodiments discussed earlier, the same type of flat non-imaging secondary reflector can be used, reducing the horizontal size of the receiver spot by 1.2× and thus increasing the concentration by the same factor. In the vertical direction the angle subtended by the trackers as viewed from the receiver is even smaller, and hence the secondary can be even more effective at reducing the size of the focal spot; with the angle subtended being only 40.35 degrees, a low-cost vertical secondary can increase the concentration 2.3×. Together these can raise the concentration by approximately a factor of 2.75, to roughly 840 suns at maximum concentration. Again, while the mirror packing density is relatively low in the embodiment and thus the power per land area is relatively low, this arrangement is especially preferred because it provides very high concentration even with a low packing density, and it also has a very high effective area per mirror due to the mirrors directing light toward a toward in a direction near the direction of the sun, and thus it maintains a nearly constant very high concentration throughout much of the day.

Figure 10E:
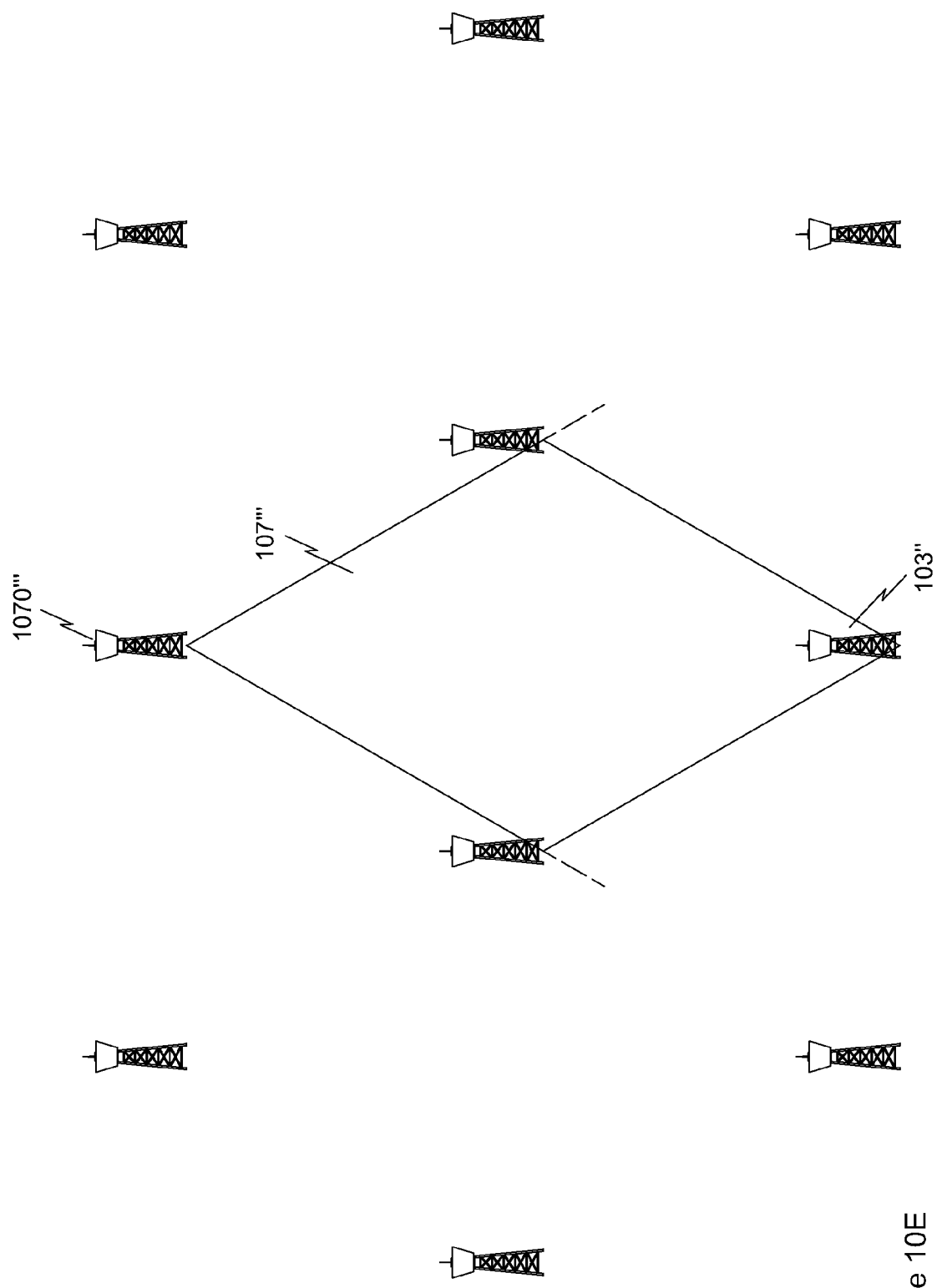
FIG. 10E is an illustration of a dynamic mirror-to-receiver mapping that uses only a single receiver area per tower and further reduces the angle subtended by light impinging on that receiver area.

As shown in FIG. 10E, the horizontal angle subtended by a lobe 107''' of mirrors focusing on a tower 1070''' can be further reduced to 60 degrees at the expense of having mirrors even farther from a given tower focus on that tower, with the farthest mirror being at mirror location 103'''. While this would allow a roughly 1.5 times higher gain from a secondary concentrator in the horizontal dimension, the embodiment shown in FIG. 10E is not preferred since it significantly increases mirrors blocking each others' views of the tower.

Instead, referring again to FIG. 10D, a greater gain in concentration can be realized by increasing the size of the sub-lobes 107' and 107''. The sub-lobes of FIG. 10D do yet not contain worst-case mirrors for other towers, and hence can be increased in size at no spot-size cost until they contain mirrors that match the spot size of the worst-case mirror for a given lobe angle, which in the case of FIG. 10D is at worst-case mirror location 103'.

The boundary of mirrors that will not increase the horizontal spot size of tower 1070' follows a curve from the farther mirror 103'' from the tower 1070' that sub-lobe 107' will focus on, arcing toward the dotted line directly away from the sun from the perspective of tower 1070. Rather than all points on the arc being equidistant from tower 1070', the distance from the arc to tower 1070' is reduced to adjust for the increase in receiver area that the a mirror's spot occupies increasing inversely proportionally to the angle to the tower being twice a great as the angle at which the mirror is slanted to direct its light to the tower. Since the angles are relatively small the cosine of the angle to the tower is thus very close to four times as large as the cosine of half of that angle. The boundary of mirrors that will not increase the vertical spot size on tower 1070 is bounded by an arc 1073 that starts where arc 1072 intersects the dotted line 1071 that runs directly away from the sun from the perspective of tower 1070, but the curve of arc 1073 is even more complex, being dependent on the latitude and the time of day as well.

There is, however, a simply algorithm that will determine a preferred ideal boundary of a sub-lobe such as 107' which even takes into account the efficiency cost from mirrors having a different effective areas for different towers as well as minimizing spot sizes. Starting with a mirror at 103'', one considers the mirror directly toward tower 1070. If it would increase the horizontal spot size on tower 1070', one considers the next mirror closer to tower 1070'. If, on the other hand, it does not increase the horizontal spot size on tower 1070', one considers the next mirror farther from tower 1070'. This is continued until the farther mirror in that direction from 1070' is found that does not increase the horizontal spot size on that tower, and this mirror then becomes part of the candidate boundary arc 1072 of sub-lobe 107'. Looking from this newly selected mirror toward tower 1070, the first mirror in this direction is checked next, repeating the above process until line 1071 is reached.

The vertical spot size on the receiver on tower 1070 is next calculated for a mirror at the intersection of arc 1072 and sun line 1071. Now the mirrors are checked from the candidate boundary arc toward tower 1070'. At each angle along the arc the next mirror toward tower 1070' is considered. If it would not increase the vertical spot size on the receiver on tower 1070 over that of a mirror at the intersection of arc 1072 and line 1071, AND its effective area on a receiver on tower 1070 would be greater than its effective area on tower 1071, then it becomes a part of lobe 107 rather than sub-lobe 107' and the next mirror toward tower 1070' is checked. If not, the next mirror toward mirror 103'', and this is continued until either candidate boundary arc 1072 is reach or the line between tower 1070 and mirror 103'' is reached, thus establishing the final boundary between sub-lobe 107' and lobe 107.

The use of control logic to determine the angle to track a heliostat mirror is well known in the art. Typically this control logic runs on a controller such as a microprocessor or embedded computer, and there may be one such controller for each heliostat or one controller may control many heliostats. Although the calculation for determining the angle at which to point a heliostat becomes more complex when it includes an algorithm to figure out which heliostat receiver that a heliostat mirror should focus on, single modern processor per field of heliostats can easily recalculate the boundary of a dynamic lobe as taught above every few minutes as the sun moves across the sky, and direct the heliostat mirrors to the correct angle. On the other hand, such controllers are inexpensive enough that alternatively each heliostat can have a controller that calculates which heliostat receiver it should direct its light to at any given time.

With the tower spacing to tower height ratio used in these examples, the vertical angle from tower 1070 between to the farthest mirror 103' will be close to 4 degrees and the closest intersection of arc 1072 and line 1071 to tower 1070 will be close to 14 degrees, for a vertical angle subtended of around 10 degrees. While this would allow a perfect non-imaging secondary concentrator to concentrate well over 5 to 1 without grazing final angles on the receiver surface, the 1600 suns concentration that this would reach exceed that needed for even high-efficiency solar cells to be cost effective. Thus unless extremely high concentration is needed for future solar cells or for very high temperature chemical reactions, a smaller secondary providing a roughly 3-to-1 increase in concentration forms an even more preferred embodiment. When evenness of the concentration is not critical, such as for a solar thermal receiver, the horizontal secondary with its 1.2× boost can even be eliminated, with a vertical secondary of around 3.5× increase in concentration being able to bring the total concentration to 1000 suns.

While a fixed polar lobe where every mirror is custom curved for its distance can reach an even higher peak concentration, it only reaches that concentration near noon and the concentration falls dramatically at lower sun angles. Since the receiver has to be sized for the maximum spot size and the maximum energy input, this increases the receiver cost over one that has a more constant high concentration and absorbs the same energy a more constant rate over a day (in addition to customizing the curvature of each mirror adding complexity). In contrast the dynamic (moving) lobe as taught above uses identical inexpensive mirrors and maintains its high concentration throughout the day due to its low packing density and its favorable and balanced cosine angles, especially when focusing to a tower even beyond the nearest tower is enabled. The maximum concentration is in the optimum range for high-efficiency photovoltaic cells even at today's costs, and due to the relatively flat mean-to-peak concentration of this moving lobe arrangement, the concentration will be within the optimum range throughout much of the day. This thus forms an exemplary embodiment of the present invention.

FIG. 10E1 is an illustration of the higher mean-to-peak concentration ratio, and thus optical flux, that a dynamic lobe of the present invention can deliver to a heliostat receiver. On an equinox, the graph of the concentration relative to peak concentration over a day for a typical polar lobe heliostat field of the prior art will be a curve like that shown as concentration-to-peak curve 10602 (the exact shape of the curve depends on the latitude, the type of mirrors and the density of trackers).

The concentration is lower away from solar noon because the amount of light reaching the receiver is lower, due to smaller effective mirrors areas and mirrors shading each other and blocking each other's view of the receiver. If the receiver is sized for the solar noon peak, it will be under-utilized during the rest of the day, and will produce significantly less power during the late-afternoon demand peak (between the dashed lines on FIG. 10E1) than at noon. Alternatively if the receiver is sized for a lesser amount of light, then some of the light near solar noon will not be usable. In either case, a low mean-to-peak ratio leads to a less cost-effective heliostat system.

Heliostats that use higher tracker density, whether to increase concentration, increase power per heliostat field, or increase shade density, have suffered even more. The increase mirrors shading each other or blocking each other's view of the tower narrow further reduces the amount of light that the heliostat receiver receives away from solar noon, as shown by concentration-to-peak curve 10602'. The University of Sydney's "Multi-tower Solar Array" (as referenced earlier) teaches how to use interleaved heliostat fields to achieve a higher tracker density while maintaining a concentration to peak curve like 10602 to much higher tracker densities.

In contrast the heliostat embodiments taught in the present family of preferred embodiments of the present invention teach reaching very high concentration with lower tracker densities. Without a dynamic lobe lowering the density quickly reaches a point of diminishing returns because it only affects shading and blocking, and does not address the decrease in effective mirror area when the sun is not at its optimal angle. However the dynamic lobe of heliostat mirror as taught above addresses this factor as well, allowing a concentration-to-peak curve such as 10602" to be achieved. Not only does this design make more cost-effective use of the mirrors and the receiver, but it will deliver significantly more power during the late-afternoon electricity demand peak (which falls between the dashed lines of FIG. 10E1). And the embodiments as taught above can deliver this while also achieving very high concentration from easy-to-manufacture mirrors that only bend in one direction at any given point and that all have identical focal lengths.

Similarly with solar thermal, being able to maintain a concentration of at least 1000 suns throughout much of the day allows a very efficient high-temperature generator to run at its optimum efficiency throughout much of the day without excess energy being wasted at mid-day, and maintains near full power output on into the afternoon and early evening when the power demand high. Maintaining power through the demand peak, and coming up to full power earlier in the morning, also reduces the amount of thermal storage needed to support base-load power.

If a higher concentration is needed, when no secondary concentrator is used the concentration can be increased at the expense of taller or closer towers and slightly lower efficiency when the sun is low to the horizon. For example, with towers half as far apart, the mirror packing density can be increased to ⅙ coverage so each tower has ¹⁰⁄₂₄ as many mirrors, which is 2.4 times fewer mirrors, and the receiver area can be optimized to 0.72*0.73 trackers which makes it 4.25 times smaller in area, almost doubling the concentration to almost 550 suns even without non-imaging secondary reflectors. For an expensive-per-area high-efficiency photovoltaic receiver, this would clearly be worthwhile if secondary concentrators were not used because it reduces the cost, and, if properly cooled, multi-junction cells reach their peak efficiency at roughly this concentration. In fact multi-junction cells are currently expensive enough per area, and light enough that towers supporting them can be relatively inexpensive, that further decreases in tower spacing can cost effectively boosting the concentration even further if desired.

Both closer towers and non-imaging secondary reflectors can therefore boost the concentration into the ideal range for today's multi-junction cells. Of these the non-imaging secondary concentrators are preferred because they provide a higher mean-to-peak ratio for power. Closer towers and simple secondary reflectors can also be combined, but it is generally more preferred to use more sophisticated secondary concentrators because taller towers increase the angle at which relatively close mirror look up at the tower more than they increase the angle at which farther mirrors look up, thereby increasing the range of angles that the secondary concentrator must handle and thus reducing how much it can boost the concentration. A point of diminishing returns is thus rapidly reached in combining close towers and secondary concentrators, and with the above-taught improvements to the art, father towers with non-imaging secondaries can achieve both sufficient concentration and high mean-to-peak power and concentration ratios.

Figure 10F:
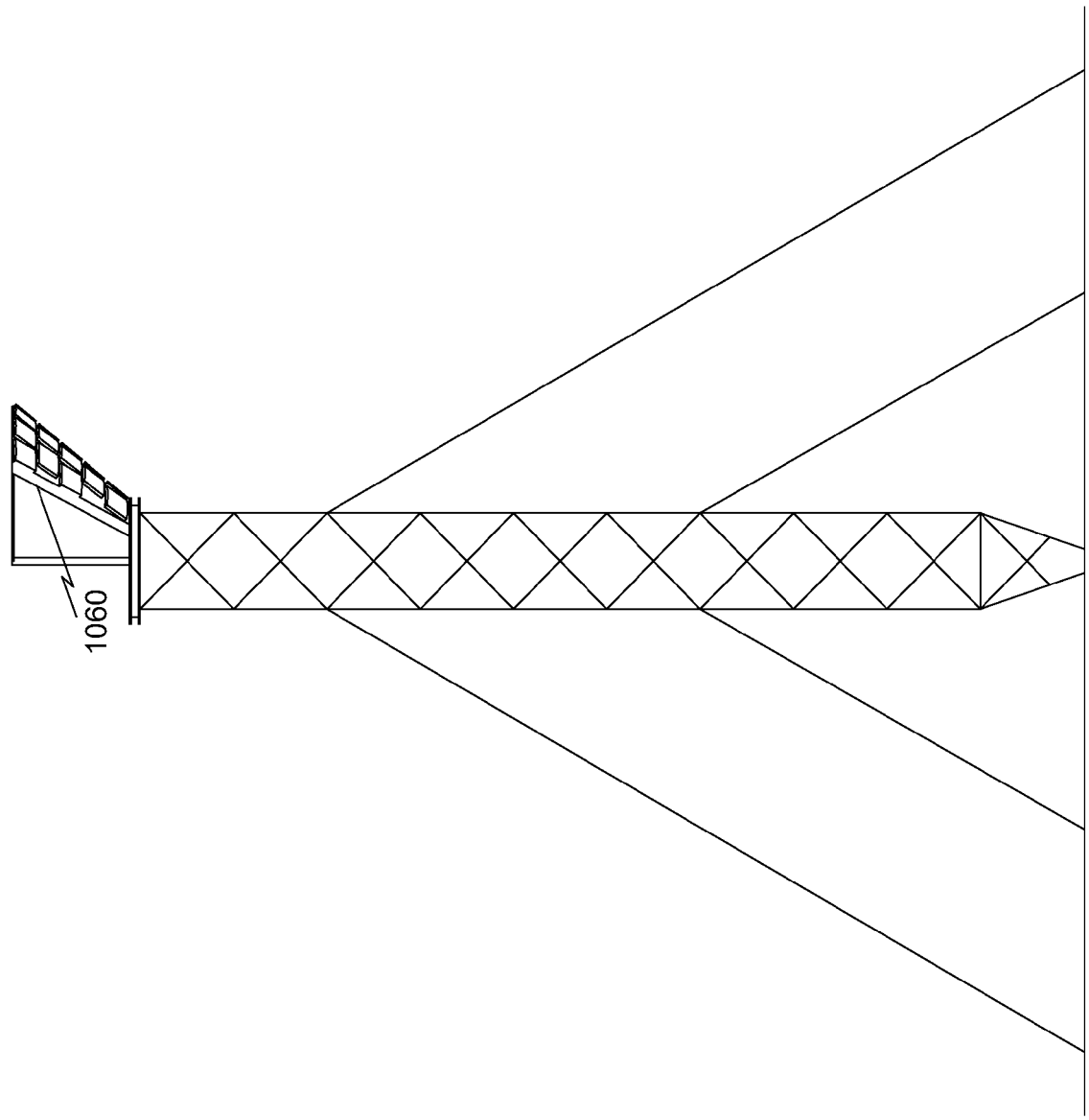
FIG. 10F is a depiction of a round receiver with high-efficiency cells rotatable around a receiver tower.

For an expensive-per-area high-efficiency photovoltaic receiver for a dynamic lobe heliostat field, rotating a receiver 1060 around the tower to oppose the sun is optimal, as shown in FIG. 10F. Rotating a receiver around a tower can also be applied to hybrid photovoltaic/solar-thermal systems. A primarily solar-thermal system could rotate an inexpensive silicon-cell-based photovoltaic receiver as a backup for the solar thermal receiver, or could partly rotate in the photovoltaic receiver when there is too much light for the solar thermal receiver or when heat storage for the solar thermal receiver is full.

The most important use in a hybrid receiver is for making the heliostat field's electrical output both reliable and dispatchable to meet both base-load and peak power needs. A solar thermal system can have its electrical generating capacity sized for round-the-clock generation using stored heat, providing reliable base-load power. Then, when peaking power is needed to meet short-term increases in demand, a photovoltaic receiver such as 1060 can be fully or partially into the focus to produce power through the photovoltaic means as well as the solar thermal means continuing to produce electricity from the stored heat. This type of hybrid base-load-plus-dispatchable-peaking-power system will be discussed in more detail later in the present application.

Figure 10G:
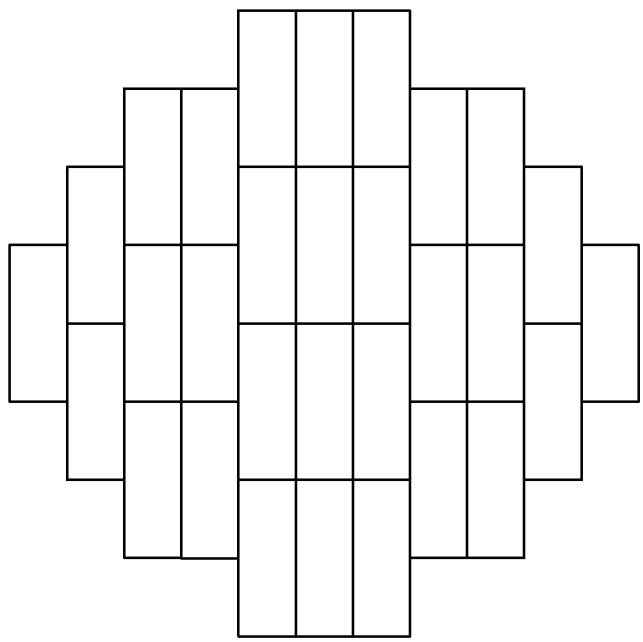
FIG. 10G is a depiction of other plausible track shapes between square and round.
Figure 10G:
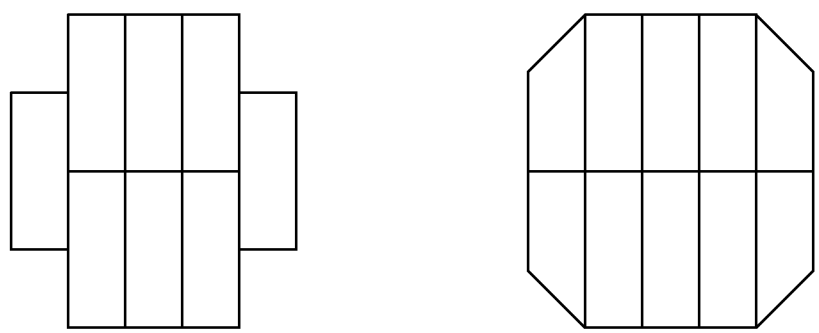

The above discussions have all used round trackers to simplify the calculations. However, some tracker and/or mirror fabrication methods (including tracker multi-cylindric parabolic mirrors) more naturally produce rectangular trackers and mirrors. It is also possible that other tracker and mirror technologies will produce other shapes, as shown in FIG. 10G, such as hexagonal or quasi-round, but these will generally fall between circles and rectangles in shape. Packing factors and tracker type can also influence tracker shape, as rounder trackers pack more closely when azimuth tracking is used while square trackers pack more closely when X/Y tracking is used, but with heliostats the optimal tracker density will typically low enough for packing factors not to be an issue. In any case, the principles for calculation receiver dimensions remain the same, but with the spot shape a hybrid of the tracker shape and the sun's round shape. For example, the spot from the farthest mirror above, where the sun's diameter contributes over 90 percent of the size, will be essentially round, while for the closest mirrors the sun's diameter contributes just less than 10% of the focal spot size and hence the focal spot shape will be essentially the mirror shape.

While round trackers simplify the calculations, some tracker and/or mirror fabrication methods (including tracker multi-cylindrical parabolic mirrors) more naturally produce rectangular trackers and mirrors. It is also possible that other tracker and mirror technologies will produce other shapes, as shown in FIG. 10G, such as hexagonal or quasi-round, but these will generally fall between circles and rectangles in shape. Packing factors and tracker type can also influence tracker shape, as rounder trackers pack more closely when azimuth tracking is used while square trackers pack more closely when X/Y tracking is used, but with heliostats the optimal tracker density will typically low enough for packing factors not to be an issue. In any case, the principles for calculation receiver dimensions remain the same, but with the spot shape a hybrid of the tracker shape and the sun's round shape. For example, the spot from the farthest mirror above, where the sun's diameter contributes over 90 percent of the size, will be essentially round, while for the closest mirrors the sun's diameter contributes just less than 10% of the focal spot size and hence the focal spot shape will be essentially the mirror shape.

In most cases the difference in area between a square and a circle or a rectangle and an ellipse is small enough that the tracker shape guides the receiver shape, but for high-efficiency photovoltaic cells the receiver area is a very dominant part of the cost and a 27% larger receiver would mean enough lower concentration to be sub-optimal at today's cell costs. If rectangular trackers and mirrors are used along with a rectangular receiver, filling in the much lower-concentration corners with moderate-efficiency silicon cells is a preferred option that keeps high concentration on the expensive cells. Secondary concentrators can also fold these corners onto other regions, as is discussed elsewhere in the present application.

Figure 10H:
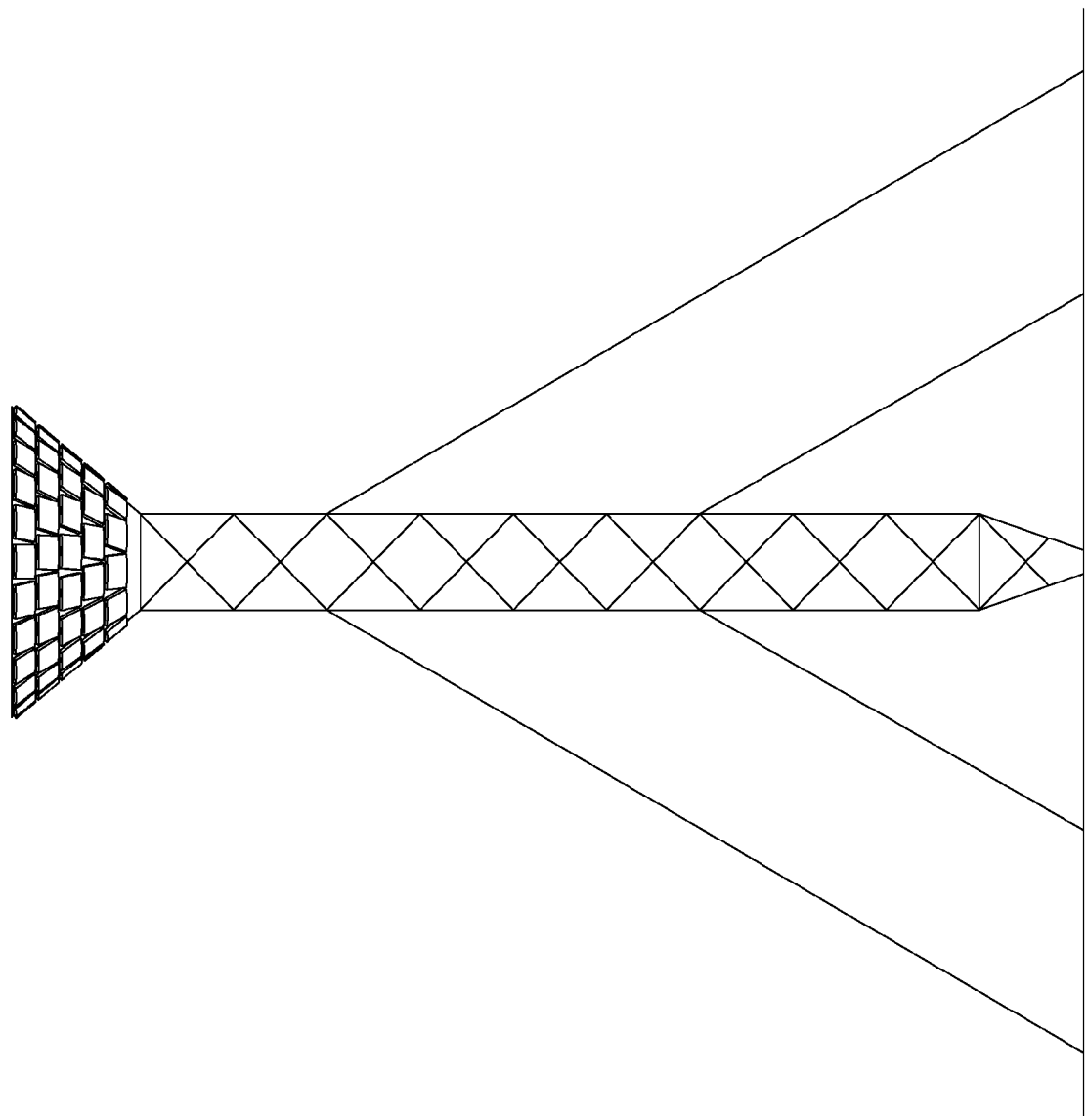
FIG. 10H is a depiction of inexpensive moderate-efficiency silicon cells surrounding a heliostat tower.

As shown in FIG. 10H, inexpensive moderate-efficiency photovoltaic cells (such as crystalline silicon) can also be used throughout, with the receiver surrounding the tower as a truncated cone (these cells are shown greatly exaggerated in size in FIG. 10H). At current cell, tracker and tower costs, the break-even concentration of high efficiency cells is roughly 600 suns, but high-efficiency cell costs are coming down while steel is generally increasing, so this break-even concentration is expected to shift downward.

Figure 10I:
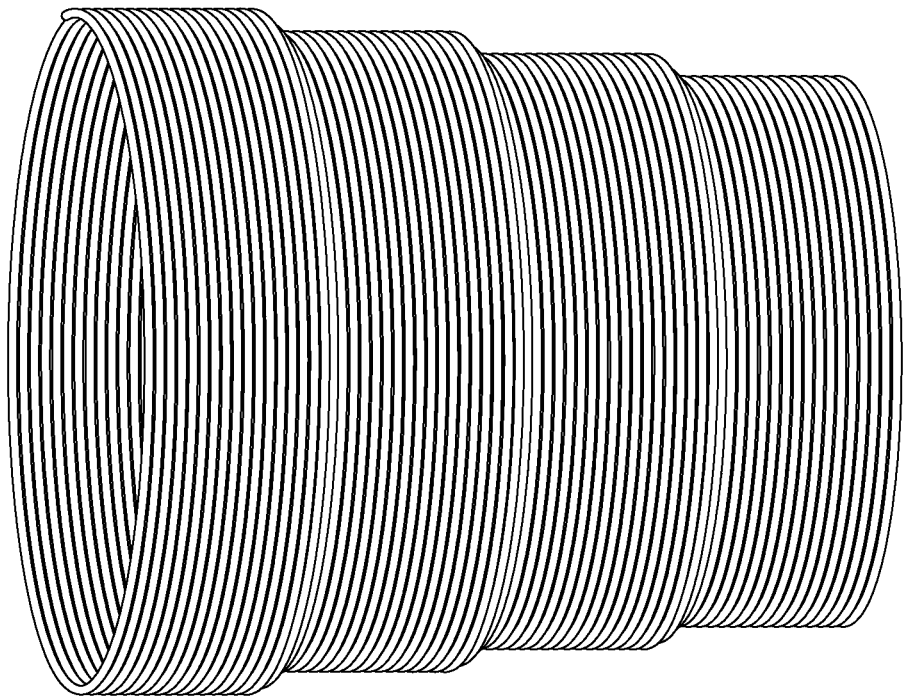
FIG. 10I is a depiction of a stepped thermal receiver that uses a small set of different tubing coil diameters.

For a more massive thermal receiver with couplings for fluid transport, and where area for heat loss is the main concern, a receiver can surround the tower, with insulation that can rotate around the receiver to insulate all but the receiver area needed for the focal spot. This uses a cylindrical receiver, which increases the receiver area by a factor of $2*Pi/4*SQRT(2)$, or 11%, and thus decreases the concentration by 11% as well. While for tower mechanics it would be simpler to have straight receiver sides that slant at the optimum 4.65 (in this example) degrees, this would introduce a 4% area penalty due to the circumference being larger at the top than needed. Furthermore, if the sun is to heat the receiver coils directly this requires coils of different diameters at different heights, complicating fabrication and reducing economies of scale. Thus a stepped receiver design, as shown in FIG. 10I is preferred for a thermal receiver.

Figure 10J:
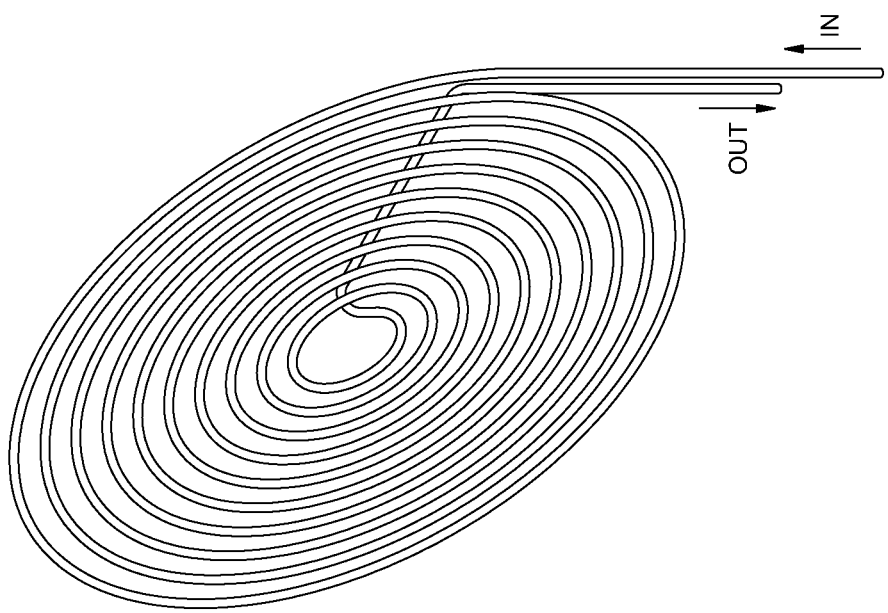
FIG. 10J is a depiction of a rotating thermal receiver whose fluid flow runs through a hotter middle section last.

While this stepped receiver design has a fairly constant concentration profile over the whole receiver area, the concentration is slightly higher toward the center of the receiver area. Where the whole receiver pivots, the thermal transfer fluid can therefore flow through pipes that spiral from the outer edge of the receiver toward the center to pass through the hottest section last. This is shown in FIG. 10J with a loose spiral for clarity of illustration; a preferred spiral would be tightly packed. When the receiver is fixed and insulation moves to expose receiver area, the thermal transfer fluid piping can spiral from both the top and the bottom to pass through the slightly hotter middle last.

Just as with the parabolic dish receiver supports previously discussed in the present application, a heliostat could also be fitted with an automatically switchable alternate receiver. Again, while any combination of receiver types could be used, a primarily solar-thermal-with-storage base-load power plant combined with a crystalline silicon cell peaking power receiver would be the most cost-effective with today's cell, turbine and steel prices. Even a with its separate cooling system, a silicon photovoltaic receiver would add less than 20% to the cost of solar-thermal-with-storage system, and transforming solar power from non-dispatchable to being dispatchable when needed most would greatly increase its value.

The heliostat tower would normally present a solar thermal receiver to the sun, typically pumping hot fluid such as molten salts into a storage tank, or using it to heat hot rocks, while continuously drawing some heat from the storage tank to produce base-load power. When peaking power is needed and the sun is shining (which usually coincide in high-sun areas due to air-conditioning demands), a photovoltaic receiver would be rotated into the focus. With multiple heliostat towers on a site, as many photovoltaic receivers would be rotated in as needed. For installations with only a few towers, the receivers could be designed to work when only rotated part-way into the focus, using light homogenizers, cells in series only perpendicular to the direction of rotation, bypass diodes, or a combination of these.

Most of the aforementioned almost 20% cost adder is the cost of the inverter. While today's inverters are optimize for very high efficiency because they are converting high-cost DC electricity throughout the day, both reducing the cost of the PV system and using an inverter only for peaking power shift the optimum to a significantly lower cost inverter even at the expense of significantly lower efficiency. Thus even with today's very expensive high-efficiency cells, high concentration at low cost shifts the inverter balance towards lower efficiency at lower cost. A photovoltaic peaking supplement to a solar thermal system shifts this balance even further, and such a photovoltaic peaking supplement with low-cost silicon cells shifts this balance still further toward lowering the cost of a 'peaking inverter' even at the expense of lower efficiency. Intermediate-efficiency cells that are intermediate in cost between silicon and today's multi-junction cells would be an excellent match for a photovoltaic peaking receiver, and would have an inverter cost-versus-efficiency optimum in between that of silicon and multi-junction cells.

Unless very high efficiency cells are used, the next biggest component of the cost adder of a photovoltaic peaking power receiver in a solar thermal system is the cooling system for the photovoltaic cells. Where water is plentiful, inexpensive evaporative cooling could be used, but in general good areas for concentrating solar systems tend to be short of water.

Although typically cooling for photovoltaic systems is localized and is done on a per-tracker basis (or even a per-cell basis), and typically cooling for the cold side of a solar thermal base-load plant is centralized, this does not need to be the case. Just as heat transfer fluid can bring heat from the solar thermal receivers to the hot side of the turbine, so to can a much cooler heat transfer fluid take heat away from the photovoltaic receivers and to a centralized cooler, or take from the cold side of the turbine (again at a much cooler temperature) to a radiator on or near each tracker. This allows the radiator to reject heat from the turbine when the peaking receivers are not in use, and to reject heat from both the turbine and the photovoltaic peaking receivers when the peaking receivers are being used (turbine in this use refers to any heat engine).

Although rejecting heat from two sources simultaneously does raise the temperature of both the cells and the cold side of the turbine, thus reducing the efficiency of each, this effect is not large. First, the thermal turbine will be rejecting heat at a considerably slower rate than the photovoltaic system, as it typically rejects its heat around the clock while the photovoltaic system must reject all of its heat while the sun is shining. And second, the efficiency of the heat rejection goes up as the temperature from which the heat is removed increases, limiting the temperature increase.

Since typically the solar thermal portion of the system will be rejecting ½ to ⅓ as much heat per unit time as the photovoltaic system will be when the solar thermal system is rejecting heat, the temperature of the cells will be only 3/2 or 4/3 higher over the ambient temperature as with just a photovoltaic system using the same heat rejection system. Since the optimal point with active cooling in a big receiver today is 10 to 20 degrees Celsius above ambient, this will add another 3.3 to 10 degrees Celsius to the cell temperature, which will cut the efficiency of a triple junction cell by around 0.6% to 1.75%, and the efficiency of an efficient crystalline silicon cell by 2.5% to 7.5%. While this is certainly noticeable, it is less than the gain in efficiency from going from passive cooling to active cooling.

The solar thermal system will likewise see a drop in efficiency when the photovoltaic peaking receiver is in use. At an ambient temperature of 300 degrees Kelvin (27 degrees Celsius), the cold side of the heat engine would be raised from between 303 and 310 degrees Kelvin to 313 to 330 degrees Kelvin, or an increase in temperature of 10 degrees to 20 degrees. The impact of this on efficiency depends on the temperature of the hot side, the standard steam turbine temperature of around 580 Celsius, or 750 Kelvin, is easily achievable by a very high-concentration system, and at this temperature there would only be a modest 2.5% to 5% reduction in efficiency.

When silicon cells are used, in actuality the radiators will be enough bigger than the optimal heat rejection system for a base-load solar thermal-only heat rejection system that it would be more proper to say that the efficiency of the thermal turbine will be increased modestly when the photovoltaic peaking receiver is not being used. In contrast, the lower temperature sensitivity of the multi-junction cells would shift the optimum toward a smaller radiator, since the cells would not be in use continually while the sun was shining.

Areas with a lot of direct normal sunlight tend to be very dry, and deserts cool dramatically at night. In addition to storing hot heat transfer fluid to allow generating electricity when the sun is not shining, cooling fluid can be circulated through radiators at night and stored in its cooled state for use during the day. Just as heat storage allows a smaller turbine and generator to be used by allowing them to operate around the clock, so, too, can coolant storage allow a combination of smaller radiators and fans, lower coolant temperatures and thus more efficient electricity generation, or a combination of these.

Coolant storage and around the clock cooling can be used to reduce the radiator size in a solar-thermal base-load system with photovoltaic peaking power to that need solely for a solar-thermal base-load system, since any extra heat from the photovoltaic receiver is roughly equal to the heat that it blocks from the solar thermal receiver. In fact since some of the cooling is done at night when the air temperature is lower and the heat rejection from the coolant is thus more efficient, a modest gain beyond this is possible in many desert locations. A variable-speed fan could even be run faster at night to take maximum advantage of the coolest air and the lower value at night of the electrical power that the fans consume.

Evaporative cooling in a desert can typically cool almost to night-time temperatures even in the day, so a stored-coolant system that performs some of its cooling during the day will run hotter than an evaporatively-cooled system. Plain water is an excellent stored coolant, and with 400 kg of water per square meter of tracker and the most cost-effective radiator size for around-the-clock operation, such a system will typically run with a coolant temperature roughly 20 degrees Celsius hotter than with evaporative cooling. This will cut the efficiency of the solar thermal base-load generation by around 5% for a high-concentration system, and cut photovoltaic efficiency by 3.5% for multi-junction cells or 15% for silicon cells.

While these are noticeable drops, and fairly significant for silicon, water use for evaporative cooling is a chief complaint against solar thermal systems in dry climates. Because the coolant is reused every day the total water use is very modest; an evaporative cooling system of the same collector area would use 400 kg of water every 18 days, or 600 times more water over a 30-year lifetime than the stored coolant system uses. Where water is scarce, embodiments with stored-coolant and around-the-clock operation of radiators will be a preferred, in spite of their lower efficiency, while where water is plentiful evaporative cooling will be preferred.

Solar thermal base-load generation with photovoltaic peaking power generation and coolant storage from night to day are discussed extensively here because heliostats with thermal storage represent exemplary embodiments for solar thermal base-load generation. However these principles can be applied to solar thermal trough systems as well (either those known in the prior art or those taught later in the present application) and can also be used with two-axis trackers (either those known in the prior art or those taught elsewhere in this application).

Eighth Family of Preferred Embodiments:
Large-Tracker Heliostats with Adjustable Focal
Lengths One of the limitations of the heliostat mirrors described above was their fixed focal length, which required compromising on an intermediate focal length so that the worst-case over-focusing and the worst-case under-focusing produced the same spot size. In U.S. Pat. No. 4,141,626, Treytl et al., try to overcome this through adjusting the curvature of a flexible mirror by pulling on the middle of the mirror to decrease its radius of curvature when the sun is near the tower and the mirror's angle is near normal, but their device is impractically complex and the change in curvature is a spline interpolation of three-points, which is only roughly parabolic due to the large hyperbolic end regions. The adjustable-focus five-point splines for cylindrical paraboloids taught earlier in the present application are an improvement. These could be used in a Fresnel arrangement, but this would still provide focus adjustment means in only one direction.

The adjustable-focal length mirrors discussed even early in the present application, such as the partial vacuum parabolic mirror that Archimedes could have built and that the present applicant built in the 1970s, or the inflatable equivalent that the present applicant built in the early 1980s by sandwiching a ring of black plastic pipe between a stretched Mylar sheet and a clear plastic sheet, are not robust enough to operate for many years in a desert climate without significant maintenance. However their capital costs are low enough to make such mirrors practical for some heliostat uses, and they would be inexpensive enough to be replaced every few years.

But just as such adjustable-focal-length mirrors would not have been useable by Archimedes because they would not have been robust enough to survive an onslaught of Roman arrows, even in the modern world there is a need for more durable adjustable-focal-length mirrors for heliostats. Since an adjustable focal length mirror capable of being built in Archimedes' day might inform the building of cost-effective adjustable-focus heliostat mirrors today, such a design is worth pursuing.

Although the Roman fleet would have been moving, it would not have been necessary to have an adjustable-focus mirror. In wartime it was common to partially block a harbor (often with scuttled ships) to leave a narrow passage that only allowed ships to pass in single file or a few abreast. Having had a section of such a passage oriented so that it would be at the right distance for a significant stretch, Archimedes could have simply had the soldiers keep their mirrors slanted away from the Roman fleet, looking like some kind of giant shields, until the ships were all in that passage section. If the soldiers were to then turn their mirrors to set the first few ships ablaze, and then back to set the last ships ablaze, panic would have ensued on those disabled ships and the remainder of the fleet would have been trapped at the proper range to be conveniently picked off.

Some harbors, however, are not suitable for this, and there is a hint that Archimedes may have had an adjustable-focal-length mirror: one of the most detailed descriptions from roughly a thousand years ago includes mirrors on hinges, which would have been unnecessary for a fixed-focal length mirror (although even there, hinges could have been used to produce a catenary 'near-parabolic' curve that would have then been fixed into shape by running guy ropes to a frame, and then afterward slanted appropriately to focus light onto a ship). And even a single large adjustable focus mirror to complement an array of fixed-focal-length mirrors would have added flexibility to Archimedes' arsenal, allowing the soldiers to pick off stragglers or to pursue escaping ships, or simply to avoid having to spend too much work on a trapping channel. Such a mirror also could have blinded and/or cooked key personnel like the navigator and the helmsman at several times a bowshot distance, adding enough confusion for a few ships from Syracuse to prevail even over Roman ships that had not been set ablaze.

Referring again to FIG. 5M, the focal length of mirror segments 530 whose curvature is established by folding on parabolic arcs can be adjustable. The focal length is inversely proportional to the sine of angle that the curved folds 537''' are folded to, and having all folded regions 535'''' on the same side of their attached regions 5354 prevents the folded regions of adjacent mirrors from colliding with each other as the curvature is reduced. This allows the angle of folding of all folds 537'' in a row of mirror segments 530 to be controlled by the same means.

Not having plastic or metal tough enough to repeatedly fold, Archimedes could have used hinges instead of folds. Archimedes could have applied such parabolic hinges to brass strips to bend them, producing a compound mirror with a focus adjustable in one dimension. Hinges can be sturdy enough to bend a wooden board, so Archimedes could even have mounted such hinged mirrors orthogonally on a set of two or more hinged boards, producing a parabolic dish mirror with its focus independently adjustable in two dimensions.

Alternatively Archimedes could have built a round mirror with a series on long, narrow, truncated wedge-shaped sheets of brass mirror, with a parabolic hinge on the back of each. If the wide end of each wedge were attached to a wooden hoop, and a length of rope were attached to the wedges together near their narrow ends, and a ring attached to the middle of the hinged region (corresponding to the folded region 535'''''), then rotating the ring relative to the outer hoop would adjust the angle of all hinged regions simultaneously, thereby adjusting the focal length of all of the regions.

The ropes would be pulled back (away from the mirrored surface and gathered together through a ring that would be slid along the rope slanting the parabolic wedges until their slant matched their parabolic curve. Targeting mirrors on opposite wedges could be used to determine when the focus was tightest on the target. The diameter of the focus would be approximately the sun's angular diameter time the focal length plus the width of the wedges at their wide end. For a 50 meter focal length, wedges ¼ meter (10 inches) wide would produce a focal spot roughly 0.75 meters in diameter. With a 20-meter mirror this would be roughly 700× concentration, which with brass mirrors would be around 450 suns concentration, or more than enough to rapidly ignite a wooden warship.

However, this still doesn't match the most detailed description from antiquity of Archimedes' mirror, so variations on another family of embodiments are considered next. While the flat-boards parabolic frame of the first family of embodiments decomposes a paraboloid into independent curves on the two axes, these curves have non-linear series of board heights. The curvature cannot be increased through simple linear motion adding to the board heights without changing the nature of the curve so that it would no longer focus properly. While it would be possible to slide the stacks of boards inward in linear proportion to their distance from the center, this would be complex and would reduce the mirror area supported by the stacks.

The Fresnel stepped mirror design has a linear progression of board heights, but even that does not start at the origin. However, if as shown in FIG. 11A an array of small mirrors 1133 is arranged so that each mirror is fixed at its corner closest to the center of the array by a ring hinge 1161 but is free to pivot upward (out of the plane of the array) around that point, then the motion needed to slant the mirrors into a Fresnel mirror paraboloid becomes linear in both directions. Each direction can then be driven by a set of arms 1160 offset by ½ mirror width from the center of the array. Each arm connects to one corner of each mirror (in a half of the overall mirror) through a push rod 1164 with a ring hinge 1163 at the mirror corner so that if the arm is moved, that corner of each mirror is moved by it. Consider just the central arm 1160 in one direction; if it is moved to push the far edge of the first mirror up by one unit, then the second mirror is pushed up by three units and the third mirror by five units, etc. reproducing exactly the ratios need for a Fresnel equivalent of a parabolic mirror in that direction. Repeating this in the other dimension produces mirrors 1133 that are held at one corner and are pushed up independently at two other corners 1162' and 1162'', while the fourth corner floats upward by the sum of the distance by which the two corners are pushed up. This produces an adjustable-focal-length Fresnel mirror in which the two focal lengths can be adjusted independently, which is useful in counteracting cosine factors from the angle between the sun and the ships.

While the additive properties of the distances a mirror is displaced are only approximate, and even the linear pushing is only approximate, each of these deviates from linearity by only a cosine factor, and for the long focal lengths involved a cosine factor is negligible. Even if the effective rim angle is doubled and thus the cosine factors are quadrupled, they are small enough that one can build one quadrant of an adjustable focus mirror that would be twice as big on a side, achieving comparable mirror area and comparable independent focal length adjustability with only half as many levers to move.

It can be seen that the arms 1160 in one direction cross the arms 1160 in the orthogonal direction. If one direction will always have a shorter focal length than the other (due, for example, to cosine factors from the relative oppositions of the sun, the mirrors and the target ships), then the arms 1160 for that direction are simply placed closer to the mirrors than the arms in the other direction, and the crossing has no further consequence. If, however, either axis could be required to have a shorter focal length, then the arms 1160 on one axis would use longer push rods 1164 so that those arms would be enough further from the mirrors that even when shortening the focal length, those arms wouldn't hit the arms in the other direction.

Figure 11B:
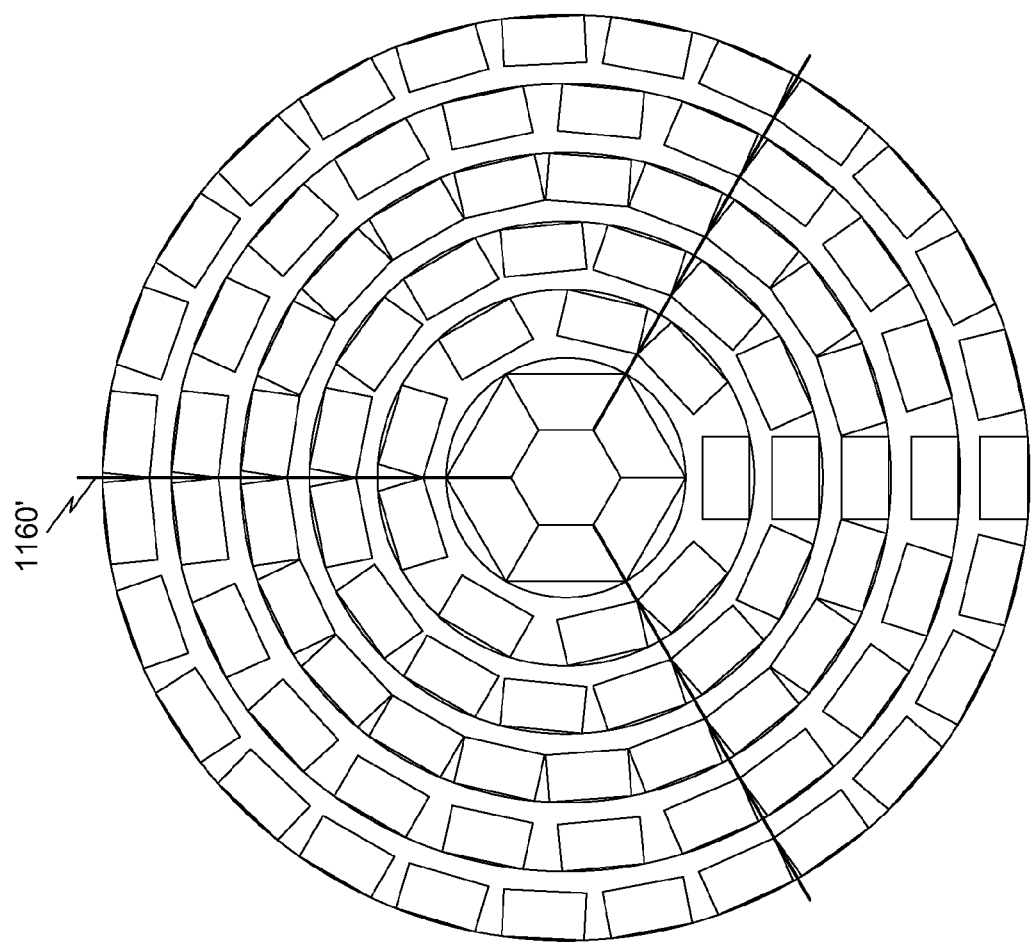
FIG. 11B is a depiction of a simpler adjustable-focal-length Fresnel focusing mirror with a single focal length, as could have been built using materials known to have been available in the time of Archimedes.
Figure 11B:
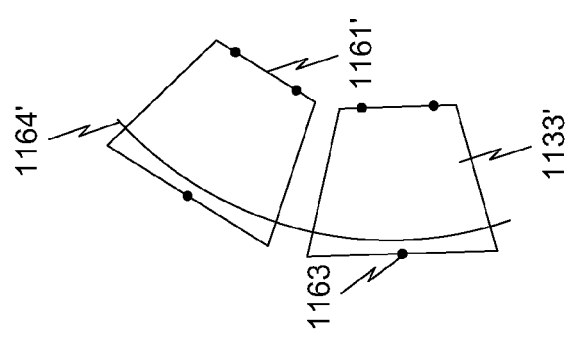

As shown in FIG. 11B, if it is solely the distance to a ship that is to be adjusted for (due to the changes in cosine factors being small because of the range of angles involved), a simpler arrangement uses rings of mirrors instead of an array of mirrors. This allows one edge of the mirror to be fixed with a hinge 1161' (which can be a standard hinge or two rings), while the opposite edge is moved by being linked to ring 1163, which in turn is moved by push-ring 1164' which is moved by arms 1160'.

While the rings could be centered on a square mirror, a hexagonal mirror provides slightly better packing at the center. Clearly this arrangement could have been built in Archimedes' day, and it bears a striking resemblance to the most detailed roughly 1000-year-old description:

"The old man [Archimedes] constructed a kind of hexagonal mirror, and at an interval proportionate to the size of the mirror he set similar small mirrors with four edges, moved by links and by a form of hinge, and made it the centre of the sun's beams—its noon-tide beam, whether in summer or in mid-winter. Afterwards, when the beams were reflected in the mirror, a fearful kindling of fire was raised in the ships, and at the distance of a bowshot he turned them into ashes. In this way did the old man prevail over Marcellus with his weapons." (From a description by John Tzetzes, as translated in "GREEK MATHEMATICAL WORKS" by Ivor Thomas, 1941).

Did Archimedes really build such a device? It seems unlikely to be coincidence that a 1000-year-old description is such a good match for this Archimedes-inspired design, so it is likely that this indeed has recovered a design that had not been seen or understood for almost 1000 years and has not been built for over 2000 years. And was this design built in addition to, or instead of, the previously described Archimedes-inspired embodiments that more closely match other 1000-year-old descriptions of Archimedes use of the soldier's shields as mirrors? Perhaps Archimedes described several variations in his writings, but only built one or the other; I would build only the "shields" design if I were Archimedes and had to choose one, as it is easier for an army to build multiple simpler mirrors in parallel than to build one massive and more complex apparatus. Perhaps further discoveries of writings closer to the age of Archimedes will be discovered, perhaps under another palimpsest from 1000 years ago. Or perhaps the mystery will remain unresolved due to the loss of so much of the knowledge of antiquity over the ages.

Figure 11C:
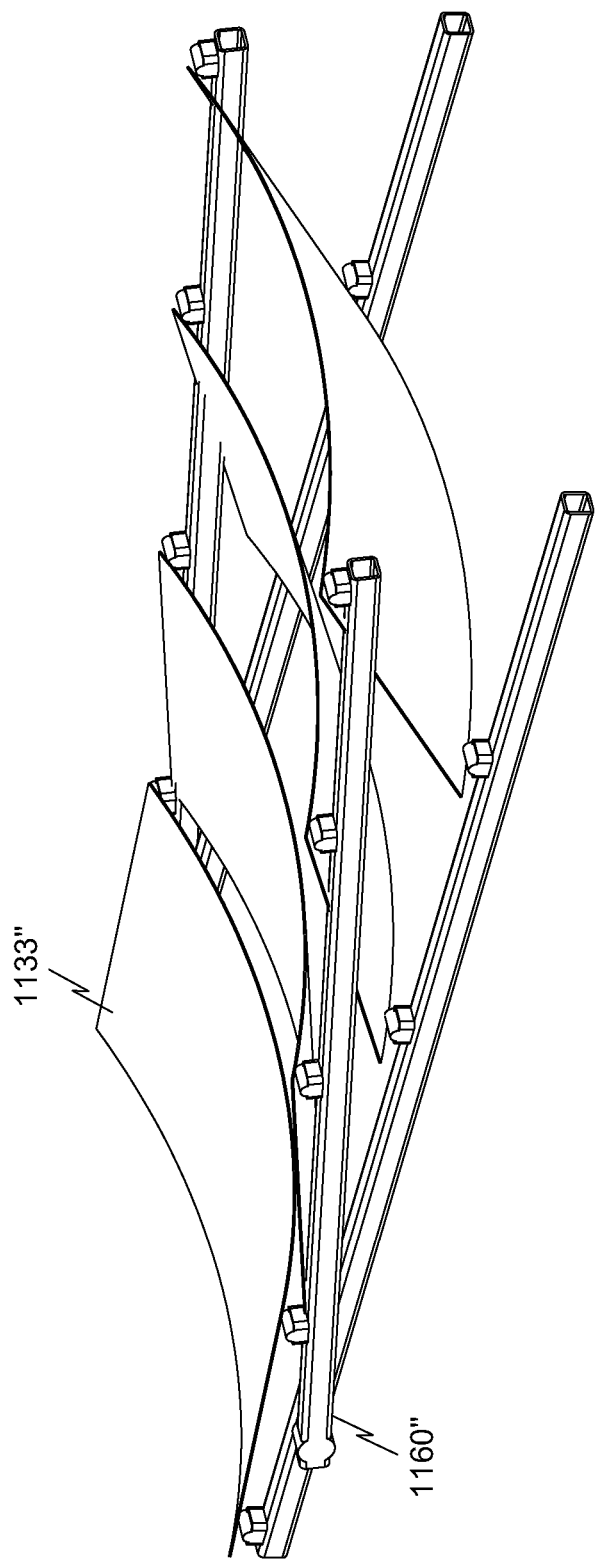
FIG. 11C is a depiction of an adjustable-focus semi-Fresnel parabolic mirror suitable for modern heliostats.

The question next arises as to whether this Archimedes-inspired adjustable-focus design can inform the building of modern heliostat fields by teaching a practical way to eliminate the cosine factors that reduce the maximum concentration achievable with large (and thus cost effective) trackers. Because the receiver tower is at a fixed distance and in the exemplary moving lobe embodiments the change in the vertical cosine factor is only a few percent, an adjustable focus would only have to adjust in the horizontal direction to be effective. This can readily be accomplished by a design such as shown in FIG. 11C, where a single arm 1160" adjusts the slant of multiple mirrors 1133" by adjusting the height of their outer edge.

But while these adjustable focal means are simple, they do add a third tracking parameter and thus a third motor, plus the hinges or the folding materials and increased support structure to hold the adjustable focal length at the right distance. Thus where the moving lobe with non-imaging secondary mirrors supplies a high enough concentration, such as the roughly 1000 suns optimal for high-efficiency cells, that is preferred. However, where even higher concentration is needed, such as for extremely high temperature chemical reactions, the added complexity of the Archimedes-inspired adjustable-focus would be worthwhile, as it would allow extremely high concentration to be maintained over much of a day. It is to be understood that while FIG. 11C shows adjusting the focus in one direction, this could be converted to an adjustable focus in two directions by either replacing each mirror 1133" with a column of five-point spline adjustable-focus mirrors as shown in FIG. 10B, or adjustable-focus mirrors as shown in FIG. 5M, or by using one or more additional arms in an orthogonal direction to adjustably slant a whole series rows such as that shown in FIG. 11C.

Ninth Family of Preferred Embodiments: Large Trackers with Arrays of Small Mirrors or Lenses with Individual Foci While the above embodiments cover large two-axis trackers with large-aperture mirrors, numerous small-aperture lenses or mirrors can also be placed on a tracker. For example, a plastic or glass sheet can be molded into an array of paraboloids and given a mirror surface, or a sheet of plastic can be embossed with a prism pattern to produce an array of Fresnel lenses. The prior art is replete with examples, and many such systems are in commercial production.

While the mirror and mirror frame construction dominates the complexity for large-aperture high-concentration systems, efficiently and economically cooling the cells becomes the dominant challenge with small-aperture mirrors and lenses. If mechanical cooling is used, either many pumps or fans are needed, leading to a complex and failure-prone system; or the coolant must travel a long path to reach the many receivers that are spread across the tracker surface, requiring plumbing connections between subsystems; and if mirrors are used, the coolant piping typically blocks a significant percentage of the available light. Passive cooling, on the other hand, generally leaves the cells hotter than mechanical cooling, especially on calm days. And while Fresnel lenses focus the light 'down' onto a cell so that cooling pipes behind the cell do not block light, Fresnel lenses, and especially inexpensive flat embossed plastic Fresnel lenses, have higher losses than mirrors even at low concentration, and have even higher loss still at high concentration. This generally limits the effective focus to below that economically viable for today's very expensive high-efficiency cells, although non-imaging secondary concentrators can raise the concentration to suitable levels.

But small-aperture systems do have an advantage in that they can be much thinner than large-aperture systems, and therefore can be shipped pre-assembled for easy installation. And with the focusing apparatus and the receiver preassembled into a compact unit, the same units can be used without modification on a wide variety of different tracker sizes. Therefore, even if they cannot be as efficient or cost-effective for large solar farms as large-aperture systems can be, there is a need for improving the art of such small-aperture systems for two-axis trackers.

Since for mechanical cooling with fluid-filled tubes the length of cooling tubes needed is equal to the area spanned by the cells (which is approximately equal to the total collector area) divided by the spacing between the cooling tubes, having the rows of cells, and thus the cooling tubes, as far as possible apart is advantageous (in many embodiments this also minimizes the wiring length needed to connect the cells as well). If a Fresnel lens is used for focusing, a flat Fresnel lens can reach only about 20× to 25× concentration before the losses start to climb rapidly. One way that the prior art has taught to improve this concentration is to use a curved Fresnel lens, either a low-cost embossed Fresnel lens in the form of a long sheet can be bent in one direction into a cylindrical section, allowing it to achieve higher concentration in that direction (up to about 30×-35×) before its losses increase unacceptably, or a more costly molded Fresnel lens curved in two directions into a dome, allowing it to achieve higher concentration in both directions. However the losses are still higher than for lower concentration, and only the costlier dome reaches the very high concentration optimal for today's highest-efficiency solar cells with reasonable efficiency.

The prior art also teaches using a low-cost flat plastic sheet embossed with square Fresnel lenses, with a circular secondary concentrator for each solar cell. While this can reach 1000 suns with lower losses than a domed Fresnel lens can, having a separate concentrator for each cell adds cost, and while having distributed foci is suitable for passive cooling, the foci have not been much more closely spaced in one direction as would be optimal for more efficient forced-fluid cooling.

The above prior art of small Fresnel lenses has the advantage of a short focal length, which both produces a relatively thin high-concentration solar collector suitable for mounting on tracker frames designed for the flat photovoltaic panels, and minimizes the sensitivity to tracking errors (and trackers for flat panels are generally not designed for high accuracy). However with newer trackers for other concentrating systems now delivering high-accuracy tracking, there is a need for a way of using inexpensive embossed flat-sheet Fresnel lenses with low-cost secondary concentrators that produce a focal point pattern conducive to efficient forced-fluid cooling.

While a high-concentration system using Fresnel lenses curved in one direction generally minimizes total losses through the lenses by having focal points about 1.5 times tighter in the high-concentration (curved) direction than in the low-concentration direction, this would yield only a modest reduction of the cooling used, and would require a more complex secondary concentrator for maximum concentration. However if a longer focal length is accepted, even a flat Fresnel lens has minimal losses, and a non-imaging secondary concentrator has more angular budget to use to tighten the focus. In general if the angle subtended by the lens when viewed from its focus is the same as the angle subtended by a mirror when viewed from its focus, then the lens can achieve the same geometric concentration as the mirror and a secondary concentrator of the same shape can tighten the focus by the same amount. To be sure, the concentration measured in suns will generally be lower because a good solar mirror is generally over 95% reflective while a good solar Fresnel lens, even with a long focal length, is generally just over 90% transmissive, but this difference typically only results in around a 5% lower concentration as long as the focal length of the lens is long (at least a few lens widths).

Thus with a focal length several times its width complemented by a non-imaging secondary concentrator that is either curved or has at least four flat facets, even a flat Fresnel lens can reach 150× concentration in one direction roughly with 90% optical efficiency (the slight losses of some light reflecting from the secondary at a glancing angle are offset by the lens being just over 90% transmissive). This is comfortably away from the theoretical maximum of a bit over 200 suns from relying entirely on a perfect non-imaging secondary, leaving sufficient concentration budget for a focal length of only five to ten lens widths and for minor tracking inaccuracy. Thus if the concentration in one direction is brought to a practical maximum of roughly 150× with 90% optical efficiency, the concentration needed in the other direction to reach the target very high concentration of 1000 suns is only 1000/(150*0.9), the concentration needed is only around 7.4× (or 7.5× for a rounder approximation).

Even without a secondary concentrator, 7.5× is well within the high-transmissivity range of a flat Fresnel lens. With a concentration in the high-concentration direction that is between four and five times higher than even a domed Fresnel lens at the edge of its high-loss regime, and between six and eight times higher than a flat lens at the edge of its high-loss regime, this allow forced-fluid cooling with a much lower total pipe length and series wiring with a much lower total wiring length. If electrically conductive coolant piping is used and the cells are affixed to it through conductive means such as solder, then the coolant pipe can have periodical insulating sections, allowing the conducting sections to be put into series. Having a secondary concentrator in only one dimension also allows using long, low-cost secondary concentrators, as discussed in a previous family of embodiments of the present invention.

Figure 12A:
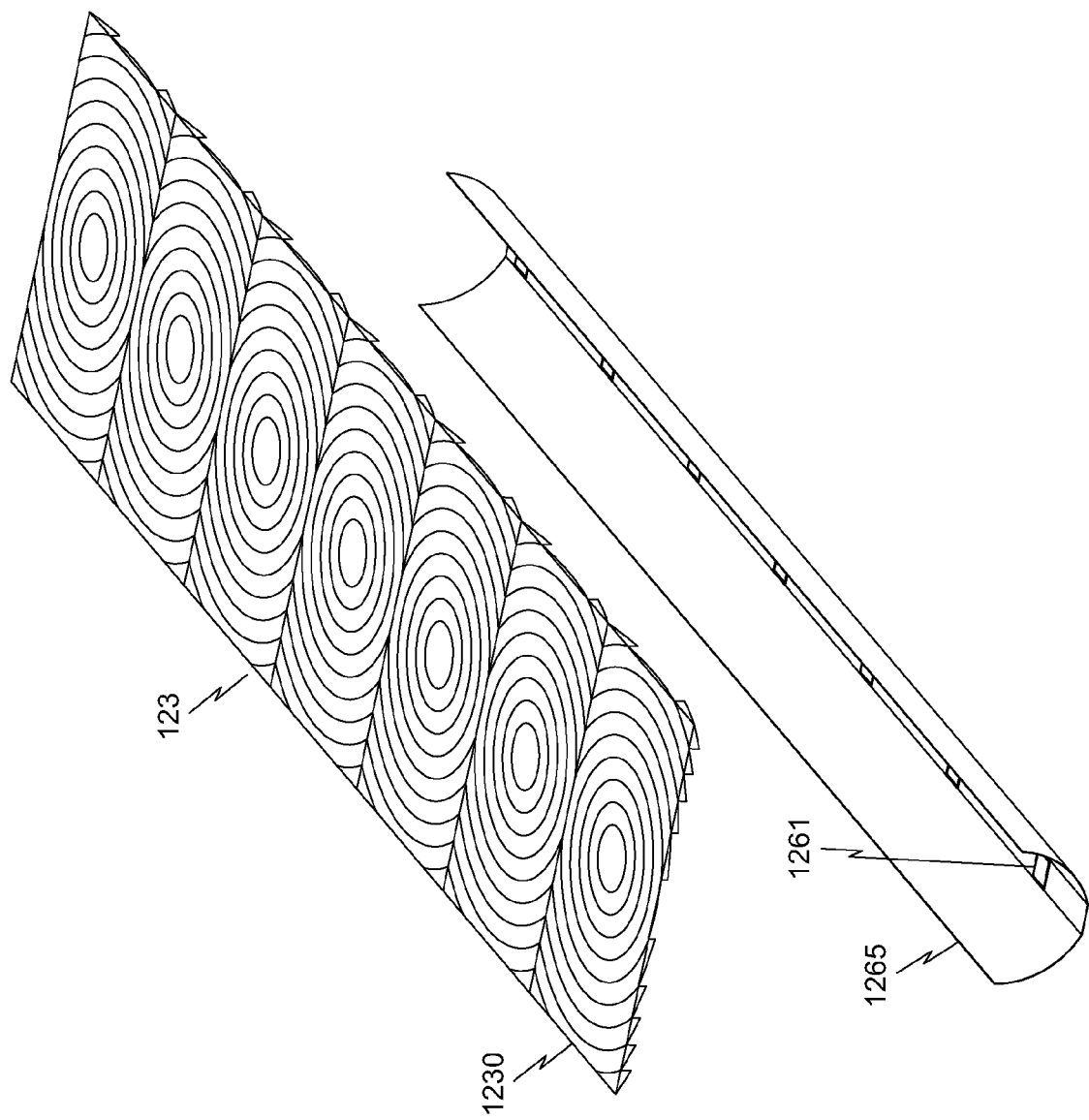
FIG. 12A is a depiction of a Fresnel lens and secondary mirror arrangement for using differential concentration to minimize cooling and wiring in an array of small apertures.

This preferred embodiment is shown in FIG. 12A, where a flat plastic sheet 123 is embossed with a pattern of Fresnel lenses 1230 that are much wider one direction than in the other direction, with linear secondary concentrators 1265 that tighten the wider direction of the lenses into a high-concentration direction, and where no secondary concentrators are used in the narrow direction of the lenses. In this example secondary concentrators 1265 are long enough to span several focal points and their cells 1261; although this is inefficient in its use of concentrator materials, this reduces assembly labor enough (at least at the cost of first-world labor) to more than offset the cost of the solar glass of the secondary concentrator. For clarity cooling means are not shown in 12A, but these could comprise a coolant pipe under the cells, or comprise passive means, both of which are known in the art.

Figure 12B:
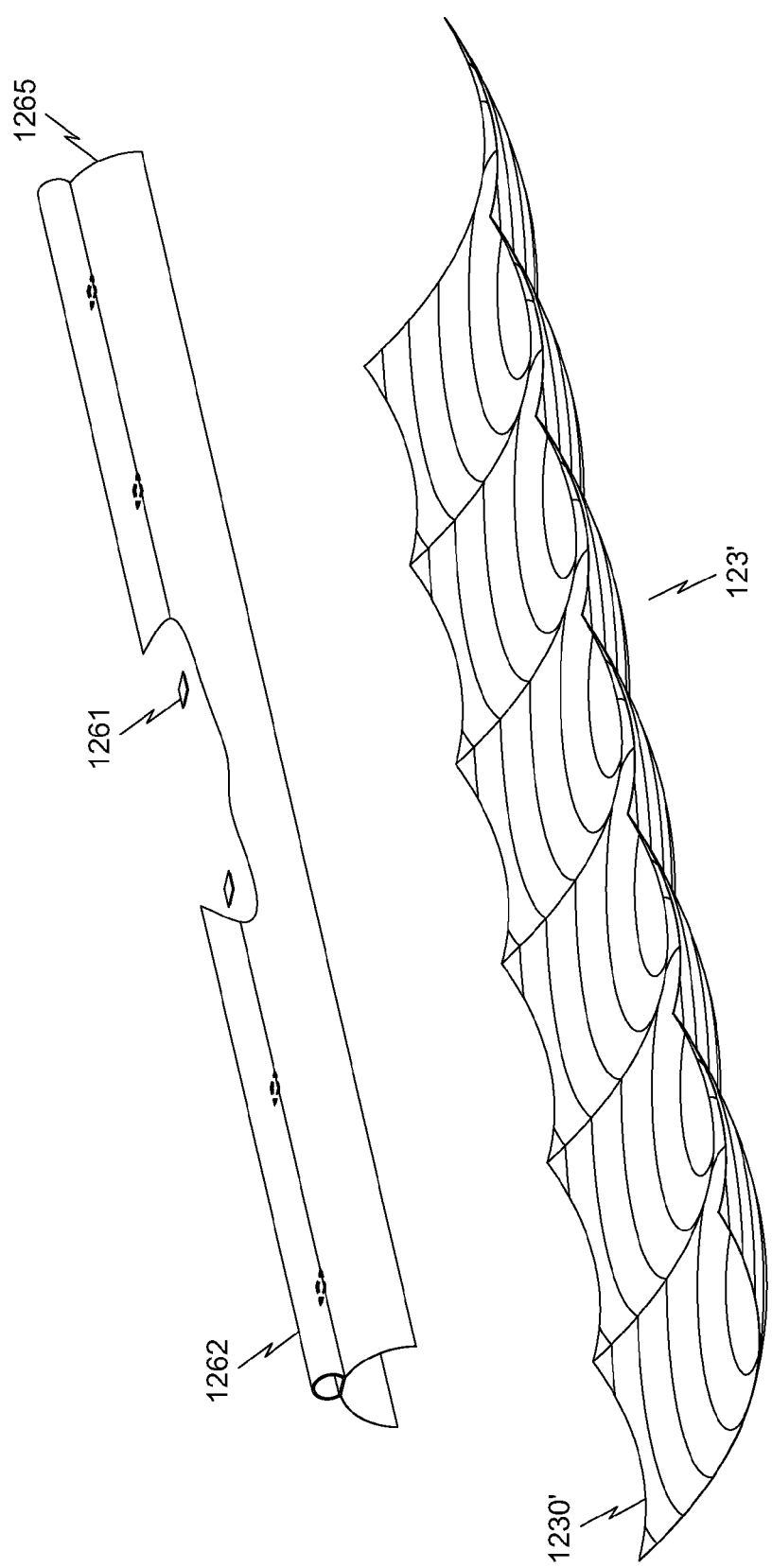
FIG. 12B is a depiction of a primary mirror arrangement for using differential concentration and high-aspect-ratio cells to minimize cooling and wiring in an array of small apertures.

As shown in FIG. 12B, if mirrors are used to focus the light on receivers that are between the mirrors and the sun, then minimizing cooling tube length is even more important because a tube 1262 that bring coolant to a receiver also blocks light, reducing the collector efficiency, and the secondary concentrator 1265 will generally block even more light than a cooling tube. While there is no difference in the concentration efficiently obtainable in the two directions, as since in previous families of embodiments mirrors 1230' can obtain up to 80× in one direction even without non-imaging secondary concentrators, and with today's cells that can be best balanced with as little as 13× concentration in the other direction. Another preferred embodiment of this family of preferred embodiments of the present invention therefore uses a molded row 123' of parabolic mirrors 1230' where each mirror of the row is wider in a high-concentration direction and narrower in a second orthogonal direction in which it achieves lower concentration at the focus, combined with photovoltaic cells 1261' cooled by coolant flow along the low-focus direction.

Non-square cells can be advantageous; when higher voltage per cooling tube is needed, shorter lenses or mirrors can be used in the low-concentration direction; as with the receivers of previous families of preferred embodiments, having smaller cells (or the equivalent of fewer cells in parallel) and more in series decreases the size of the wiring needed. This reverses the aspect ratio expected in differential concentration, where the cell dimension would be smaller in the higher-concentration direction due to the higher concentration. With shorter cells and mirrors or lenses, a secondary concentrator that spans multiple cells is even more of a labor savings.

In those cases where high current is advantageous (for example, for electrolysis near each focal point), then square lens apertures can be used, thus using a cell longer in the low-focus direction than in the high-focus direction. Another case where this can be advantageous in decreasing the depth of a system without increasing the number of cells beyond the point of practicability. With a concentration of 150× in the high-focus direction, a focal length of five times the lens width equates to a focal length is 750 times the cell width, which would be a focal length of 7.5 meters for a typical 1-centimeter cell. While there are cases where a focal length of 7.5 meters is acceptable, a 7.5 meter depth is far greater than the depth of a flat panel.

Thus the preferred cell shape for achieving a reasonable focal length is to push the length of the cell along the cooling pipe toward the limit where differential thermal expansion between the cells and the cooling tube jeopardizes the integrity of the cells, and to narrow the cell width accordingly to achieve the desired number of cells in series on each cooling tube. This maximum cell length is somewhat dependent on the degree of cooling supplied, but even modest forced-fluid cooling will limit the cell temperature over ambient temperature to a small fraction of the difference between a winter night and a summer day in most climates. While in the tropics this difference can be as low as a few tens of degrees Celsius, in temperate climates it can easily reach fifty to seventy degrees Celsius. It is also possible to put several cells lengthwise along a pipe to span a focus, allowing the focus to be as long as desired, although if these cells are electrically in parallel (as is easiest for cooling), and multi-foci linear secondary concentrators are used, then this offers no significant advantage over shorter lenses and distributing those cells.

Since for most attachment means that provide high thermal conductivity, such as soldering, the temperature is higher during installation than during operation, the forces on a cell are compressive (due to the high thermal expansion of copper than germanium or silicon cells) and the cells can typically be several centimeters long. Thus even a cell two millimeters wide can have a cell area of around ½ a square centimeter, for which relative cell assembly costs are not prohibitive. A cell this narrow reduces the lens focal length to 1.5 meters, which is much more reasonable than the 7.5 meters that a one-centimeter cell would use. With a 7.5× concentration in the low-concentration direction and cells several centimeters long, this corresponds to a cell spacing of 7.5 times several centimeters, or roughly 20 centimeters.

For adequate coolant flow, the cooling pipe can be wider than the cell width as the cell pipes will not be placed side-by-side (in the above example they will be 150*2 millimeters or 300 millimeters apart). When using mirrors instead of lenses the focal-length-to-cell-width can be a bit shorter, and the cooling tube blocks some of the incoming light, so at a given focal length it is preferred to use slightly wider cells and to avoid using a cooling tube much wider than the cells.

Figure 12C:
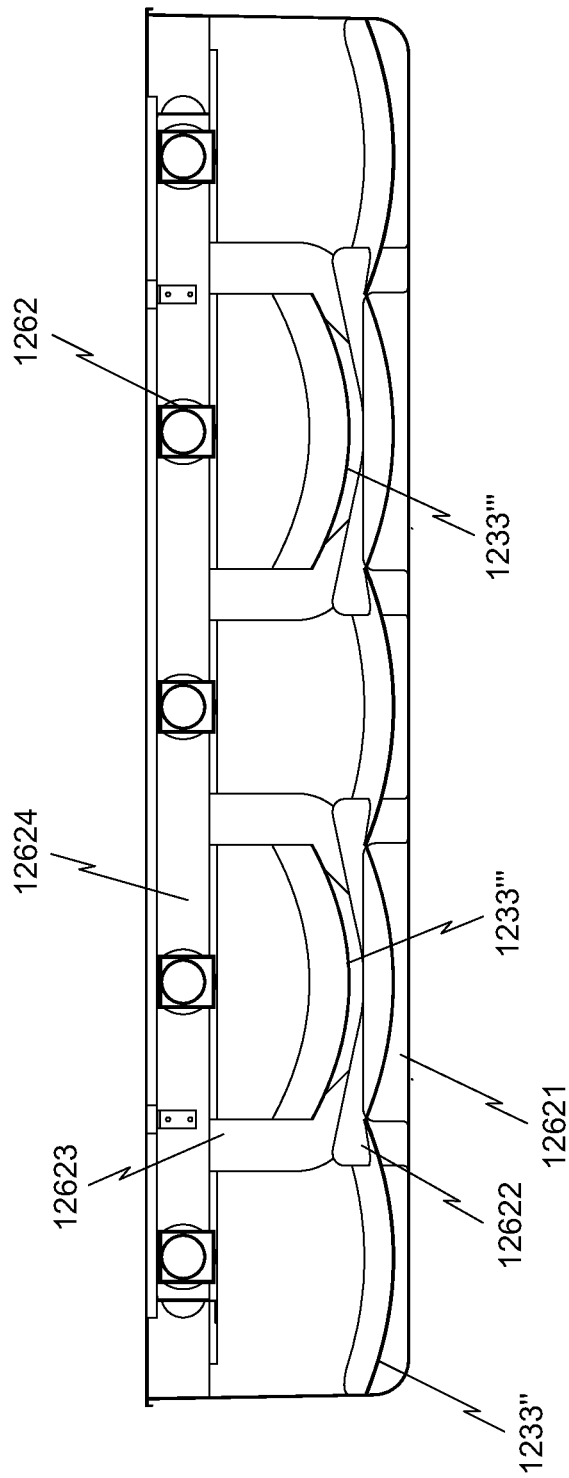
FIG. 12C is a depiction of a fan and cooling tube arrangement for minimizing light blockage and misdirection by a forced-air cooling system.

If the cooling fluid is air, which eliminates the need for a secondary heat rejection device such as a radiator, then the coolant tubes take up significant area. Even if clear round tubes and transparent cooling fluid were used to let light pass through, the diffraction through the curved surface would change the direction of the light too much for it to be focused to high concentration. However if transparent tubes with flat faces (such as square or rectangular tubes) are used, then light passing into and out of a tube wall may be offset from its original path but its angle will not be changed. If the tubes are rectangular and are oriented substantially so that their top and bottom faces are smaller and are perpendicular to the incoming sunlight, then their blockage of light through not being perfectly transparent is minimized as well. Forced-air as a coolant also needs fans to propel it, and since these are relatively large, they are best placed under the mirrors so that they do not block light. As shown in FIG. 12C, if a mirror 1233''' with a fan 12621 under it is raised somewhat relative to neighboring mirrors 1233", then a transparent slanted tube 12622 and a vertical tube 12623 can transport the cooling air to a manifold 12624 that distributes it to a number of cooling tubes 1262 that in turn carry the air to the receivers to cool the cells. In preferred embodiments manifold 12624 and tube 1262 are transparent to minimize light blockage, and are rectangular in cross-section to minimize diffractive losses.

Passive cooling is also an option for very small apertures and thus very small receivers; this is because as an aperture and receiver shrink in each of two dimensions by a factor of N, for a total of N-squared times less sunlight and thus N-squared times less heat to expel, the circumference of the receiver, and thus its ability to reject heat, shrinks by only a factor of N. Small enough cells (a few millimeters on a side) can be cooled even at 1000 suns simply by having good thermal contact to a heat spreader (such as a thick sheet of aluminum) approaching the size of the aperture. But small cells increase assembly costs and wiring costs, and hence the ability to passively cool larger cells is needed.

Figure 12D:
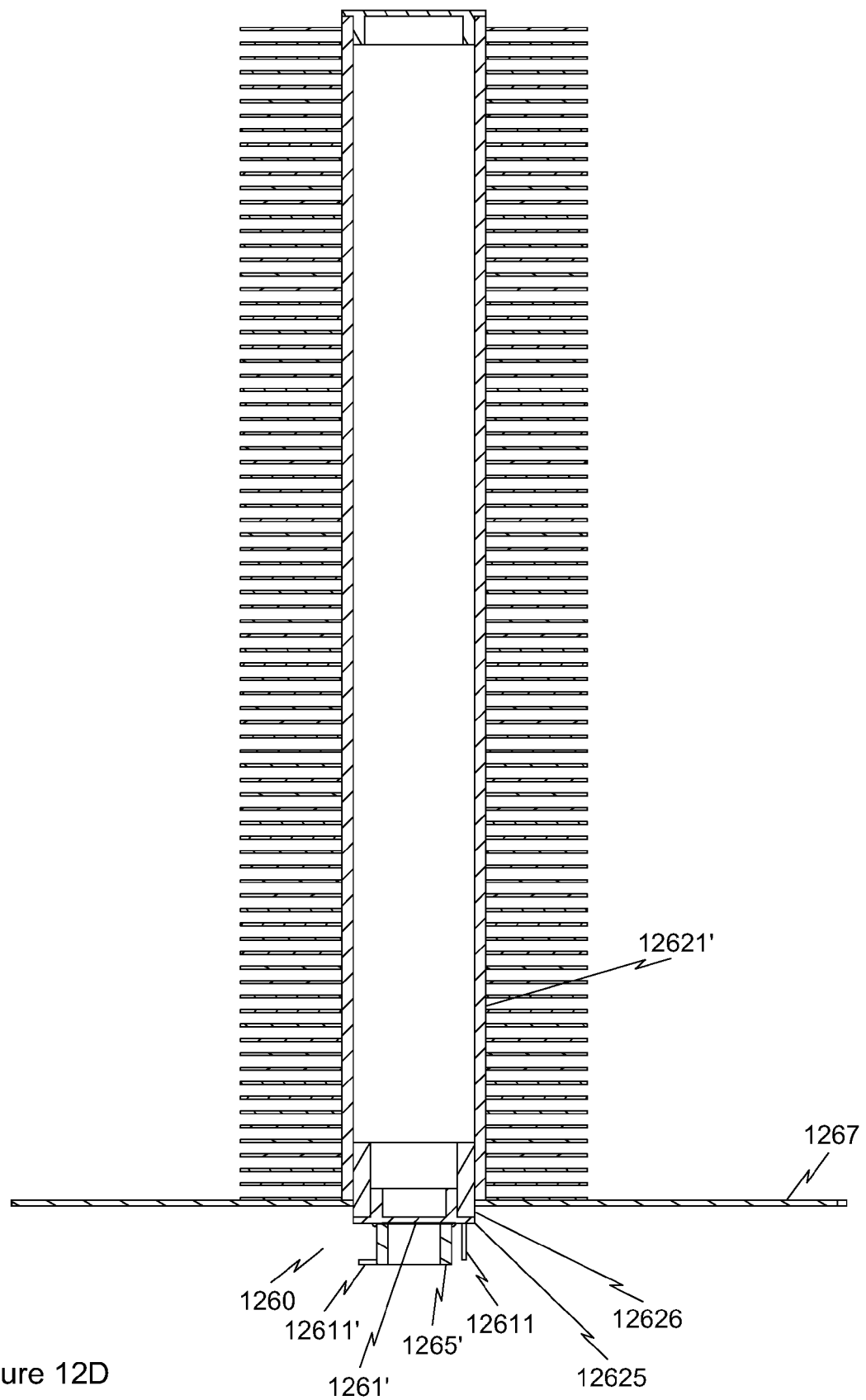
FIG. 12D is a depiction of a passively cooled receiver for use in an array of small mirrors protected by a transparent cover.

Heat pipes can transport huge amounts of heat, and so it is known in the art to use small receivers, each comprising a single photovoltaic cell attached to a heat pipe surrounded by fin tube, obtaining a very low thermal resistance path to a large heat rejection surface. However, such a low-thermal-resistance path is typically electrically conductive, and for the fin tube to be effective in passive cooling, it is typically exposed to the elements. If sufficient cells are in series to feed an efficient inverter, this exposes high-voltage conductors to where they may be touched, creating a safety hazard. However as shown in FIG. 12D, if a clear cover 1267 is used to protect the cells and to allow more reflective first-surface non-fragile plastic mirrors to be used, then a passively-cooled receiver 1260 can comprise a plastic bottom heat pipe section 12626 with a cell 1261' soldered to a copper plug 12625 for exceptionally low thermal resistance, with the plastic bottom heat-pipe section 12626 connecting to a top section of metallic fin tube 12621'. The copper plug also provides a very low resistance, mechanically robust electrical contact for the cell's back, and can have one or more attachments points 12611 for the convenient attachment of wire clips for wiring the cells in series.

Also included in FIG. 12D is a metallic secondary reflector 1265' (in this case of polished aluminum). Using a metallic mirror secondary concentrator or homogenizer 1265' allows this secondary reflector to also be used as a low-resistance front contact for the cell, and the secondary reflector can have one or more attachments points 12611' for the convenient attachment of wire clips. Having several such attachments 12611 and 12611' ensures that one of each will be near the desired orientation to minimize wire length regardless of the rotational orientation of the receiver 1260. With such a low-resistance contact all around a cell, the cell could also be optimized to use slightly narrower top contacts, thus blocking a bit less light. If round mirrors or lenses are used, then a round secondary can be easily turned and polished on a lathe. Even if rectangular mirrors or lenses are used, if these are molded or embossed and are not at their limit of concentration, then some of the concentrating power can be traded for a rounder focal spot, producing a better match to a round secondary. With round focal spots, hexagonal cells are also a much more efficient shape than square cells; although these cannot be as simply scribed and snapped as rectangular cells are, they can be cut with a water jet or a laser as is known in the art of dicing silicon chips.

The entire receiver can be made so that the secondary concentrator 1265' and the plug 12625 are narrower than the insulating plastic section 12626, which is in turn is narrower than the fins of the fin tube 12621', so that a round hole the size of the insulating plastic section 12626 can be drilled in cover 1267 and the receiver 1260 inserted, with a tight-fitting sleeve providing accurate lateral alignment, the bottom fin providing accurate vertical alignment, and a bead of sealant on the lowest fin providing a weather-tight seal to the cover 1267.

Relying on passive cooling leaves part of the cooling in the care of nature, and nature can be capricious. In particular, unless an extremely long fin tube is used, the cell temperature may rise unacceptably when there is essentially no wind. While such calm days are rare, if the cell overheats to the point that it is damaged (roughly 120 degrees Celsius for an extended period for today's triple-junction cells), even one rare occurrence would damage a cell. Rather than use an absurdly long fin tube, the surface of a cell intended for use in a passively cooled system can have a very thin thermochromic film, such as vanadium dioxide, added. Such a film changes from transparent to fairly highly reflective at temperatures well below the damage point of a cell, which would reflect enough light to prevent further heating. This provides a passive way of protecting a passively cooled cell from infrequent no-wind or very-low-wind conditions.

Both mechanical cooling and tracking can be run on DC power such as is generated by photovoltaic cells. But the voltages needed for inverters are much higher than those used by typical DC motors and fans. Especially in air-cooled systems, several percent of the total tracker area is taken up by the cooling system, primarily by fin tubes. If moderate-efficiency crystalline silicon cells are placed on top of these cooling elements, then they can generate power for the cooling and/or tracking systems without blocking any additional sunlight. Even for non-mechanical cooling, electric power can be used for active cooling to enhance the cooling per fin area by using a corona discharge to create an electron-driven wind, entirely without moving mechanical parts. Thus in preferred embodiments, tracker areas that shade mirrors (or shade spaces where mirrors could otherwise be if the areas were not shaded) are equipped with low-cost solar cells to provide power for the cooling and/or the tracking, and in especially preferred embodiments some of this electricity is used to provide enhanced cooling on calm days through a corona discharge creating an electron-driven wind.

A small-aperture high-focus photovoltaic system has a physical form factor that resembles flat-panel systems and hence may be used on trackers designed for flat panels. Since flat panels have only cosine factors rather than sine factors to worry about regarding tracking accuracy, trackers designed for flat panels often do not have the accuracy needed for high-concentration systems. While supplemental solar probes could determine the orientation needed and send signals to the tracker to correct its orientation, some trackers are not capable of such frequent fine adjustments. In particular 'passive trackers', where the sun's heat moves water which changes the tracker's balance which adjusts the tracker's position, are only accurate to a degree or two, and some active trackers may have an insufficiently small tracking step size or a motor that burns out if pulsed too frequently.

While coarse tracking is best accomplished by rotating a whole tracker to face the sun, fine tracking can be accomplished by shifting the cells laterally relative to the mirrors. If the misalignment is too great, 'coma' aberration (in which the focus is smeared out into a coma shape) and astigmatism reduce the concentration possible. For a mirror with a 22.5 degree rim angle as used in many of the above embodiments, a lateral shift just doubles the misalignment that can be tolerated at a given concentration. For the smaller angle of the incoming rays of the low-focus direction of the immediately-above examples, a lateral shift greatly expands the misalignment that can be handled (at a small-enough angle a parabola is essentially spherical, eliminating such off-axis aberration). Many trackers, and daily/seasonal trackers in particular, are more accurate in one direction than the other. Preferred embodiment for such trackers therefore orient a low-concentration direction with the inaccurate tracking axis and use lateral-shift fine tracking as supplemental tracking in that direction.

While the prior art teaches many simple sensors for rotational alignment, these do not work for lateral-shift alignment because they depend on the angle of the incoming light, which does not change during a lateral shift. There is therefore the need for an adaptor for such a sensor that converts it into a sensor suitable for shift fine-tracking alignment. Preferred embodiments for systems that use lateral shifts of receivers relative to mirrors for fine tracking therefore use an adaptor such as that shown in FIG. 12E. Sensor 1280 is fixed to a sensor arm 1281 that is connected at its top to the receiver by top pivot 1282, and is connected to a mirror arm 1283 at a hinge 1284. The mirror arm is connected to the receiver by middle pivot 1285, and to the mirror at bottom pivot 1286. The distance of middle pivot 1285 from the bottom pivot 1286 is equal to the focal length, and the distance from the middle pivot 1285 to the hinge 1284 equal to the distance from the hinge 1284 to the top pivot 1282.

If the main mirror is misaligned by a small angle A (shown exaggerated for clarity by the sun shifting by an angle A), the receiver will optimally compensate for this misalignment if it is laterally shifted by sine(A) in the direction of misalignment. As can be seen by the dotted line showing the position of the sensor 1280 and the sensor arm 1281, the sensor will be pointing straight at the sun when the receiver, and thus middle pivot 1285 with the receiver, are shifted laterally from the mirror's focus the focal length times the sine of angle A. For clarity the positions of the mirror arm 1283, the hinge 1284, the middle pivot 1285 and the bottom pivot 1286 are identified in the shifted position by 1283', 1284', 1285', and 1286' respectively. Thus the sensor itself needs no modification, and merely signals the receiver to move until the sensor is pointing at the sun just as it would with angular tracking.

Figure 12E:
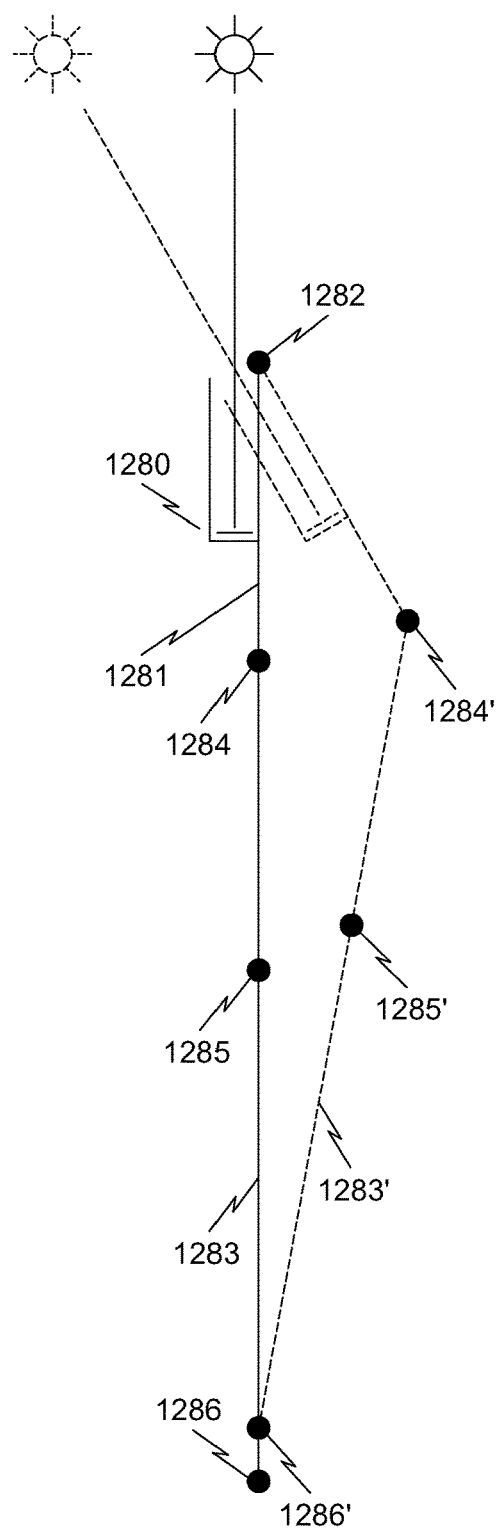
FIG. 12E is a depiction of a mechanism for adapting a normal rotational sun-tracking sensor to serve as a lateral-shift fine-tracking sensor.

The angles involved are generally so small that the cosine-factor stretching of the distance between the pivots is insignificant (in FIG. 12E this is shown greatly exaggerated due to the exaggerated shift used for clarity of illustration). For compensating for even coarser alignment of a tracker, the pivots 1282, 1285 and 1286 could be mounted on spring mountings that would allow for slight motion of the pivot points to compensate for this cosine factor. Even at a full degree of tracking error, the springiness needed would only introduce a 1% error in the fine adjustment.

If it is inconvenient to have the distance between the bottom pivot 1286 and the middle pivot 1285 equal to the focal length, then another length can be used and the ratio of the distances of the middle and top pivots to the hinge can be adjusted accordingly. For example, if the distance between bottom pivot 1286 and middle pivot 1285 is half the focal length, then any shift will rotate mirror arm 1283 by twice the angle. To compensate, the distance between the top pivot 1282 and the hinge 1284 can be made twice the distance between the hinge and middle pivot 1285, so that the sensor arm 1281 moves by half the angle of mirror arm 1283, and thus moves by the correct angle for sensor 1280 to work as normal.

Tenth Family of Preferred Embodiments: Improvements to Large Two-Axis Trackers and Tracker Supports While altitude/azimuth tracks are the most commonly used two-axis trackers today, they require complex motion with daily movement on both axes because neither axis is aligned with the earth's poles of rotation. If one of the tracker's axes of rotation is aligned with earth's poles, then a simple clockwork drive rotating the tracker around that polar axis once every 24 hours will perfectly match the daily tracking needed, and if the earth's pole were perpendicular to the earth's orbit around the sun, that would be the only tracking needed. However, the earth's axis is misaligned by 23 degrees from its orbit, which not only gives temperate climates their seasons due to the sun being up for more hours and arcing higher across the sky, but also requires seasonal motion from the tracker to compensate for the sun's higher summer arc and lower winter arc. An ingenious 2-axis tracking axle as taught by Brantley et al. in U.S. Pat. No. 4,011,854 cleverly accomplishes this with daily rotation of the axle and seasonal rotation of the tracker around a second section of his axle, which is angled at 23 degrees to the first section. A balancing mirror frame as taught in previous families of embodiment of the present application would be very well suited to mounting on an axle such as the Brantley axle because its natural balance would minimize the forces on the bearings and drive mechanisms.

While the motion needed for both rotations with the Brantley axle can be supplied by clockwork, a clockwork drive would keep turning the tracker until it was upside-down at midnight. This would put the delicate and expensive receiver close to the ground, where it could more easily be damaged or stolen. Care would also have to be taken to ensure sufficient clearance that at no season would the rotation of the tracker cause the receiver to contact any of the supporting structure. Brantley's axle also requires two motors, each with sufficient strength to rotate the entire tracker about the axle.

Figure 13A:
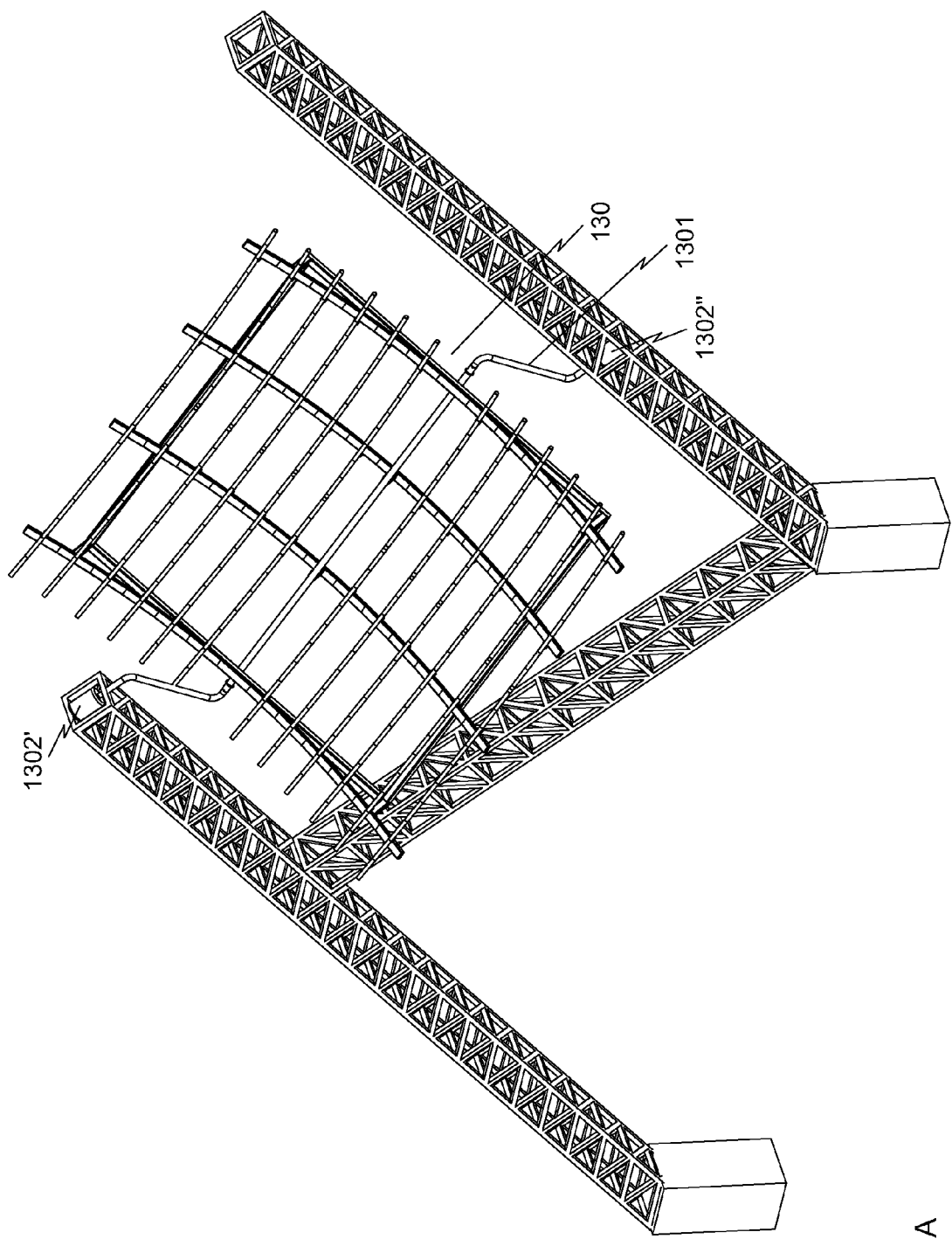
FIG. 13A is a depiction of a tracker that uses two motors to share the load of driving a tracker on two axes.

An alternative approach, as shown in FIG. 13A, is to use two motors 1302' and 1302" to cooperatively turn the tracker on two axes, placing the two motors on opposite ends of a tracker, aligned on a polar axis, with each motor connected to the tracker by an arm where the length of the two arms 1301 together is the length of the tracker 130 times the sine of 23 degrees. A line between the two motors would be a north/south line with an at-latitude slant to the ground (in other words, it would point substantially at the North Star in the Northern hemisphere and at the Southern Cross in the Southern Hemisphere). Both cooperative motors would rotate essentially at the same rate; one would rotate exactly once daily, while the other would rotate 1/365.25 less. Thus over the course of the year, the difference between the two motors would accumulate, providing the seasonal motion required, until after a year they differed by exactly one revolution. However, while this allows two cooperative motors to share the load, the arms put more torque onto the motors than the Brantley axle would except in extremely unbalanced gusts. Thus in most situations, the Brantley axle would be preferred. One exception to this is when a driving arm rather than a chain or gear is used to turn the tracker axle; by making the arms of equal length the excess torque will be no greater than the torque already present from the driving arm. In either case, to keep the tracker from rotating upside-down during the night, reversible motors could be used instead of clock-work (continuous forward motion) motors, as is well known in the art, and a solar probe could then be used for the fine tuning of the tracker (for cases where the axes are imperfectly aligned).

With either the cooperative motors as described above or the Brantley axle, the polar axis of the tracker must be very accurately aligned, especially in its altitude. Because the sun's maximum altitude changes very slowly around the solstices, even a small misalignment would cause a significant loss of tracking. For example, if the polar axis were at an altitude merely one degree too low, approximately three weeks of noon-time tracking around the summer solstice would be lost because the seasonal tracking would have already reached its maximum altitude. To increase the tolerance to altitude alignment of the polar axis, the angular range of the seasonal drive means can be made more than ±23 degrees (i.e., the arm lengths of the cooperative motors or the offset and slant of the seasonal axle sections of the Brantley axle can be increased), and the seasonal tracking rate can be made correspondingly less than 1/365 of a revolution per day. The benefit of this is that even if the tracker's polar axis is imperfectly aligned, the tracking can compensate, up to a misalignment equal to the increase in the seasonal tracking angle. This overcomes the biggest drawback of both the Brantley axle and the cooperative motor for installations with a single small tracker, such as an individual's back yard, where achieving polar alignment accuracy of better than one degree would be problematic.

An additional shortcoming of the Brantley axle as taught by Brantley is the multi-pole system for supporting its ends. While in places where the ground does not freeze three poles require less concrete than the anchor for a single large pole, setting frames for three separate concrete pads (or placing other kinds of anchors) requires more on-site labor, and this is especially true where such pads would need foundations below the winter frost line. There is thus a need for a tracker support arrangement that is cable of supporting the Brantley axle or the paired motors above, which provides more stability per amount of concrete than a single pole for mounting a tracker, and which minimizes the number of concrete pads or other anchor points per tracker.

Figure 13B:
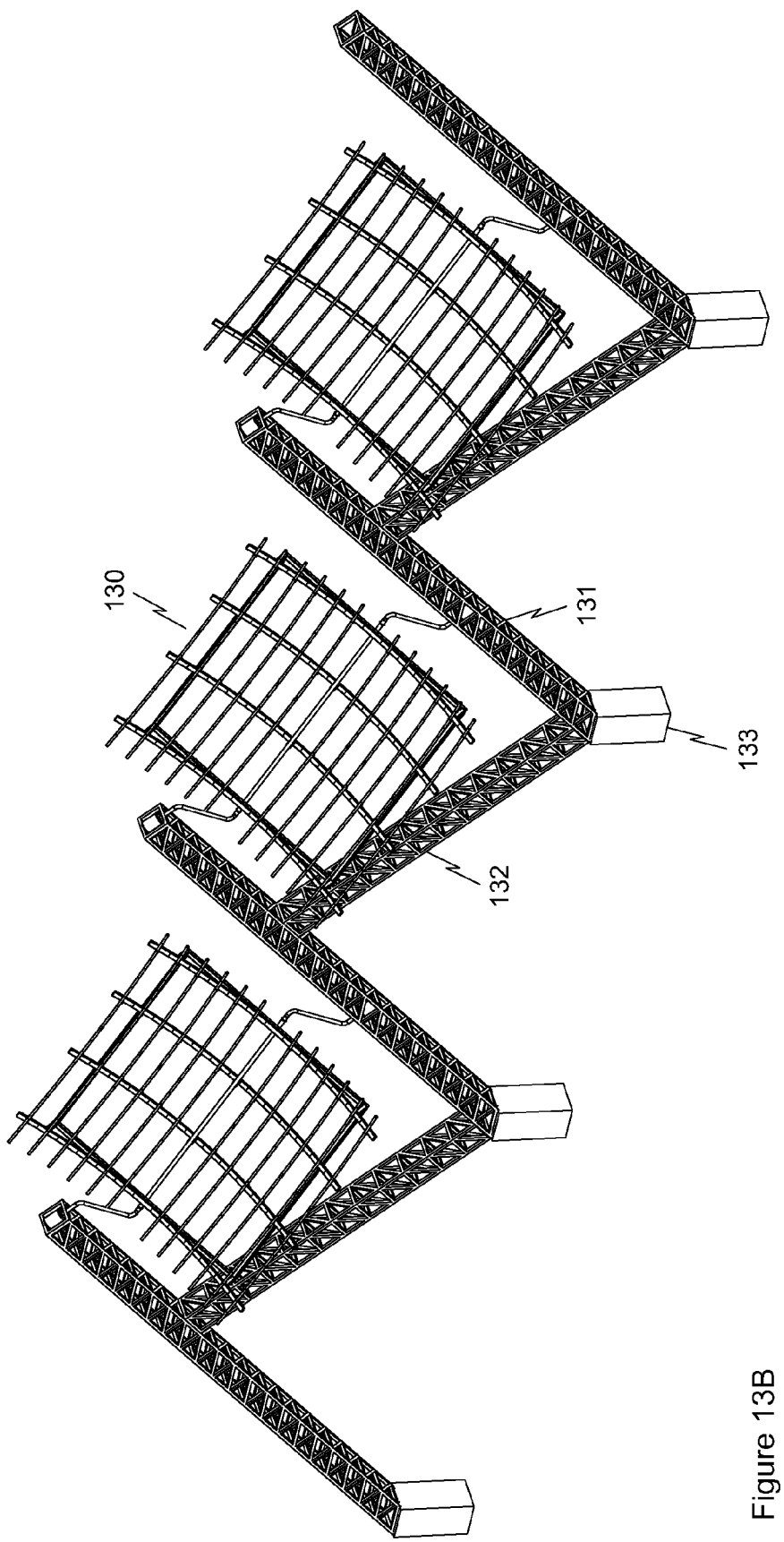
FIG. 13B is a depiction of a multi-tracker arrangement using shared tracker supports.

Although many solar advocates claim that the decentralized nature of solar is an advantage, most people do not really want to run their own utility, and thus most solar electricity will be generated by large solar farms. For two-axis trackers this means that a large number of trackers will be co-located in a field. While the single-pole and the three-pole tracker supports are optimal configurations for isolated trackers, they are not necessarily optimal for densely packed co-located trackers. A scalable multi-tracker support preferred embodiment has therefore been devised that minimizes the amount of concrete per tracker supported while maximizing structural strength. As can be seen in FIG. 13B, a row of N trackers 130 requires only N+1 concrete pads 133 (or other anchors). While this requires one more pad than using post-mounted trackers, each of these pads can be much smaller because instead of the leverage of bending a single narrow post, any forces (such as wind loading) along the row are resisted by the lever of the entire distance between pads, which will be between one and two orders of magnitude longer than the diameter of a practical post. The 'legs' 131 and 132 in this arrangement can be either solid beams, such as steel girders, or can be lattice beams, which require less material but are more labor intensive. Reinforcing diagonals can be used between the legs hear where they meet; these are optional, and the balancing of material and labor costs for such decisions are well known in the art of steel structures.

Figure 13C:
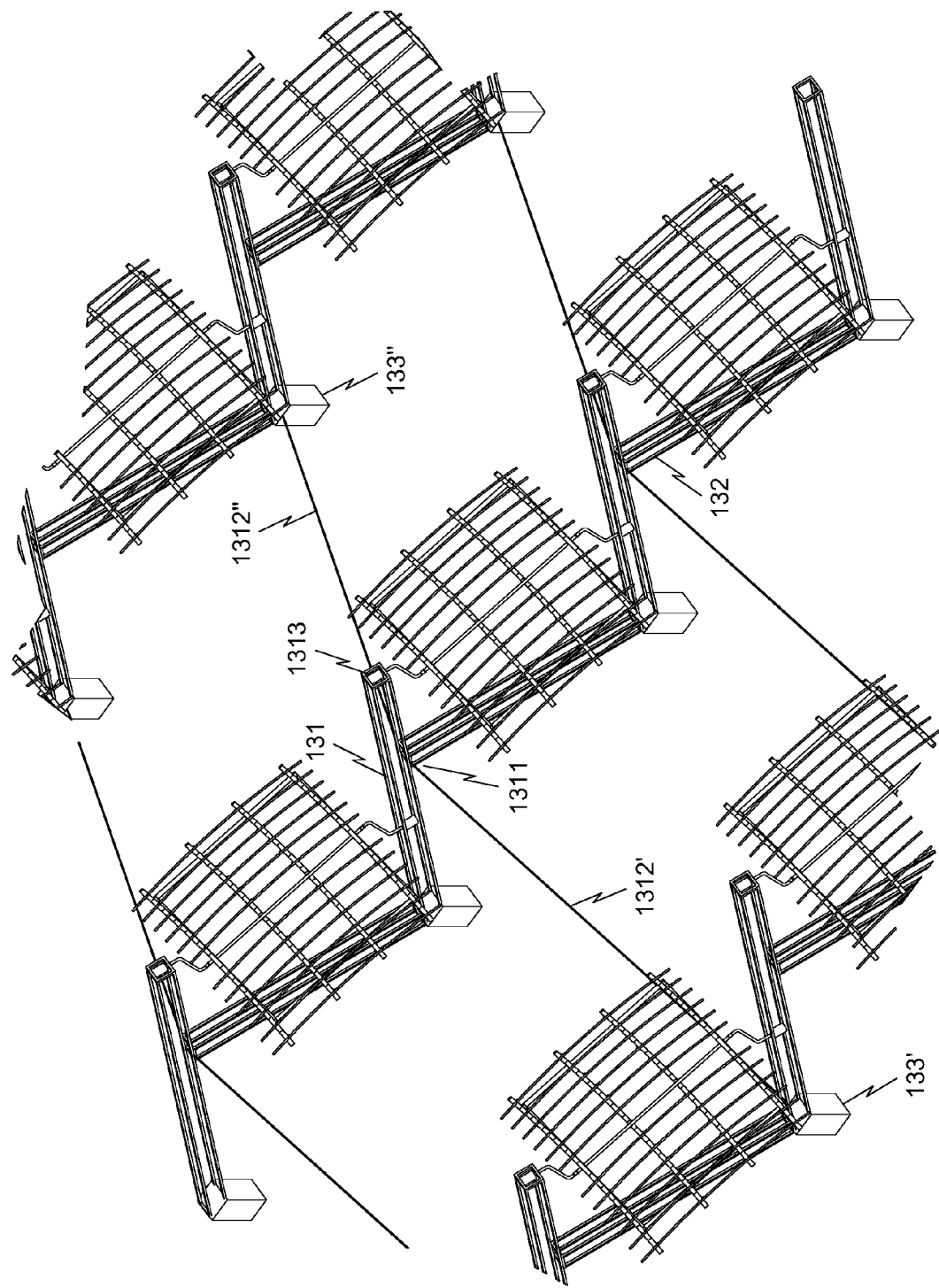
FIG. 13C is a depiction of a multi-tracker arrangement using shared tracker supports, with off-set rows for convenient anchoring of guy wires.

As shown in FIG. 13C, while a third lateral leg perpendicular to the row would provide lateral support, if adjacent rows are offset by roughly one half a pad-to-pad distance (exactly half for a solar farm at 45 degrees latitude), then in an array of trackers the pads of adjacent rows will be ideally placed for anchoring guy wires for a given row. From each intersection 1311 between legs 131 and legs 132, a guy wire 1312' would be run to the nearest concrete pad 133' in the westward row, and guy wire 1312" would be run to the nearest concrete pad 133" in the eastward row. This would work well throughout the temperate zones (where most significant energy consumers are), and even would work acceptably well into the tropics. Near the equator legs 132 will be almost flat and hence a guy wire at intersection 1311 would have little leverage; however near the equator leg 131 will be nearly vertical and so east and west guy wires from a point 1313 at the top of leg 131 will not interfere with the movement of the mirror, and thus guy wires should be attached to point 1313 instead of point 1311. Where the land between the trackers is to be used for other activities, such as grazing, the guys can be attached well above ground level to ease the passage of equipment or animals under the guy wires. The guy wires will prevent one row from leaning relative to the other rows, and as long as the two ends of each guy wire are at significantly different heights, the wires as a whole will provide support against all rows leaning in the same direction.

A more preferred embodiment uses an arrangement of the guy wires that does not require rows offset relative to each other (although it can work even with slight offsets), with the guy wires running from the intersection point 1311 on one row to the top point 1313 on each of the adjacent rows; this arrangement is the same at all latitudes and except near the equator it keeps the guy wires high above the ground where they do not interfere with other uses for the land between the trackers. This takes only R+2 rows of concrete pads or other anchors, where R is the number of rows of trackers, with N+1 pads or anchors in each row, where N is the number of trackers per row.

Figure 13D:
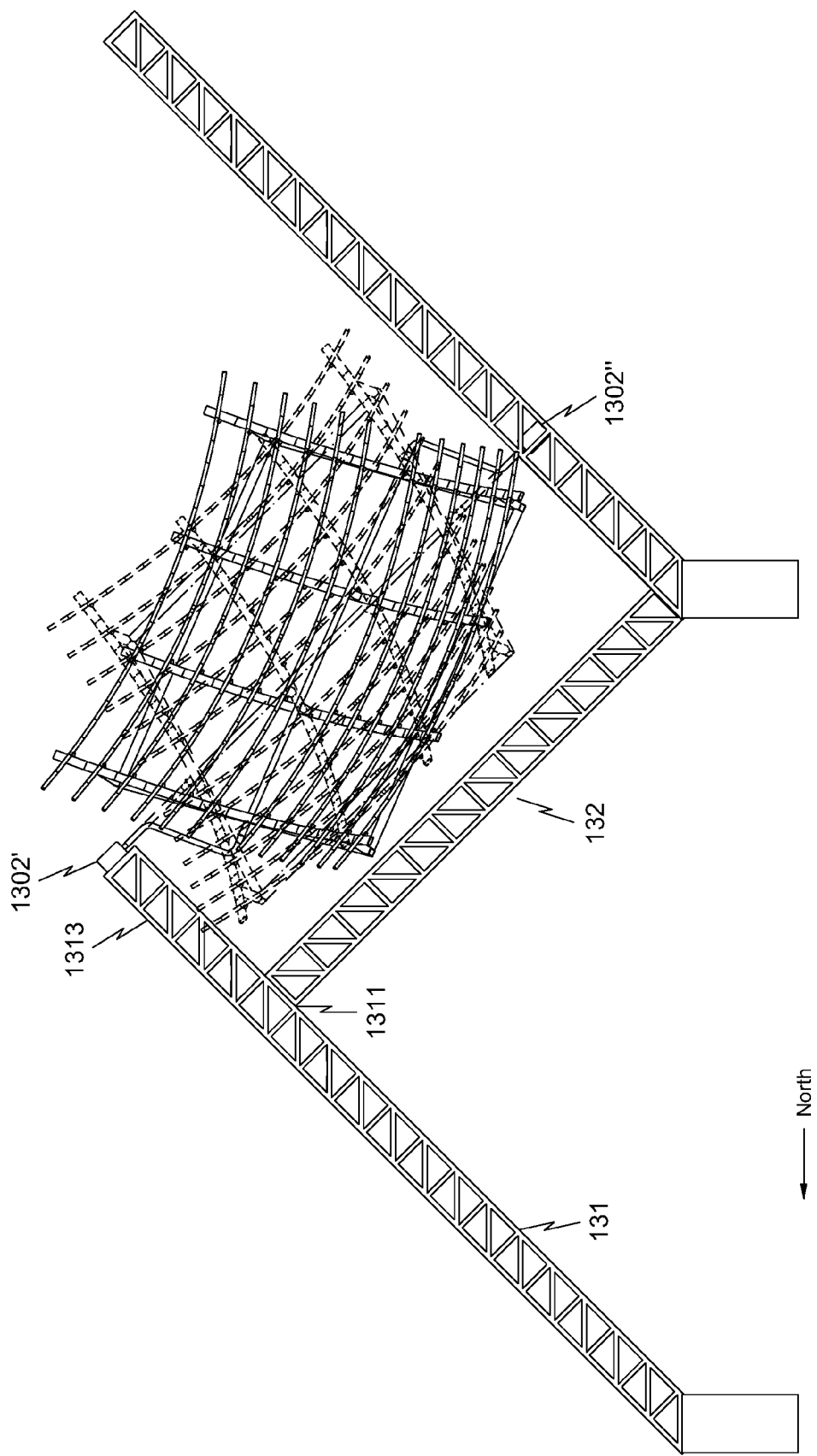
FIG. 13D is a depiction of the support tower spacing needed for a multi-tracker arrangement using shared tracker supports and a single-axle, two-axis tracker.

As shown in FIG. 13D, with both the cooperative motors and the Brantley axle the mirror frame twists back and forth with the seasons in addition to rotating about a daily axis. This twist causes the corners of the tracker to sweep sideways on each side of the tracker by the sine of 23 degrees times half the tracker's length, with the effective width of the tracker shortened to the cosine of 23 degrees times the tracker width. Unless the daily motion of the tracker is restricted, the tracker pivots must be mounted at least this far from the supporting leg 132 to clear it even when the tracker is maximally swept toward it. The corners of the tracker also sweep forward and back seasonally, so unless the daily motion of the tracker is restricted the tracker support legs 131 must be spaced apart by at least the sine of 23 degrees times the tracker's width plus the cosine of 23 degrees times the tracker's length for the trackers corners to clear the support towers when maximally swept forward or back.

Restricting the tower's daily motion would restrict the system's tracking ability to the central 12 hours of the day (the corners bend toward the sun and thus away from the tracker supports, so it is the width of the tracker support itself that drives the loss or movement, and even with a lattice tower the tracking capability will be only on the order of ½-hour short of the central 12 hours). Near the equator this limited tracking capability has very little impact because the days are always roughly 12 hours long, and the sun will be very low for any lost collecting time and thus the mirrors would largely shade each other anyway. The ideal packing density for mirrors, and thus trackers, is higher near the equator and thus near the equator it is preferred to restrict the tracker's daily motion to allow the tracker supports to be more closely spaced. By the time a solar farm is as far from the equator as San Diego, the added length of the day during the summer becomes noticeable; an additional roughly an hour on each end of the day would be lost at the summer solstice in June. Still the sun is low within an hour of sunrise or sunset, and this period also lies outside the peak demand period of the afternoon. In San Diego the ideal tracker spacing is a bit farther apart, so a preferred compromise for trackers with a balancing mirror frame at 80% of the aperture diameter is for the towers to be enough further apart for the mirror's frame to clear the tower, allowing the 12 hours of daily tracking. Even further north the ideal tracker spacing is farther apart and both the number of hours lost and the height of the sun for those hours grow to the point that the full daily tracking becomes optimal, with the latitude at which this occurs depending on the balance of light-gathering costs, inverter costs, energy storage costs and electricity prices.

While wind loading can put considerable force on the pivot at the top of the leg 131, this force does not have leverage near this point. Thus the main bending stresses on the first leg are where it contacts the second leg 132 at point 1311, and where it supports the lower end of the tracker's daily axle (at the point of motor 1302" in FIG. 13A). The lattice towers can be reinforced at these points, using space that the sweep of the tracker as it twists does not intrude upon.

A way to maximize the tracker area for a given shared tracker support tower spacing is with a tracker mounting that allows seasonal tracking without twisting the aperture relative to the tracker supports. The twisting is a by-product of using the same axle or axles for the changing slant relative to the earth's polar axis needed for seasonal tracking as for the rotation about the earth's polar axis as needed for daily tracking. By using a slanting mechanism that is separate from the daily rotation, this can be eliminated; if the daily tracking is rotation about a fixed polar axis (parallel to the earth's polar axis), then any means that can slant the aperture so that it tracks from minus 23 degrees relative to the axle (at the winter solstice) to plus 23 degrees at the summer solstice can be used.

Figure 13E:
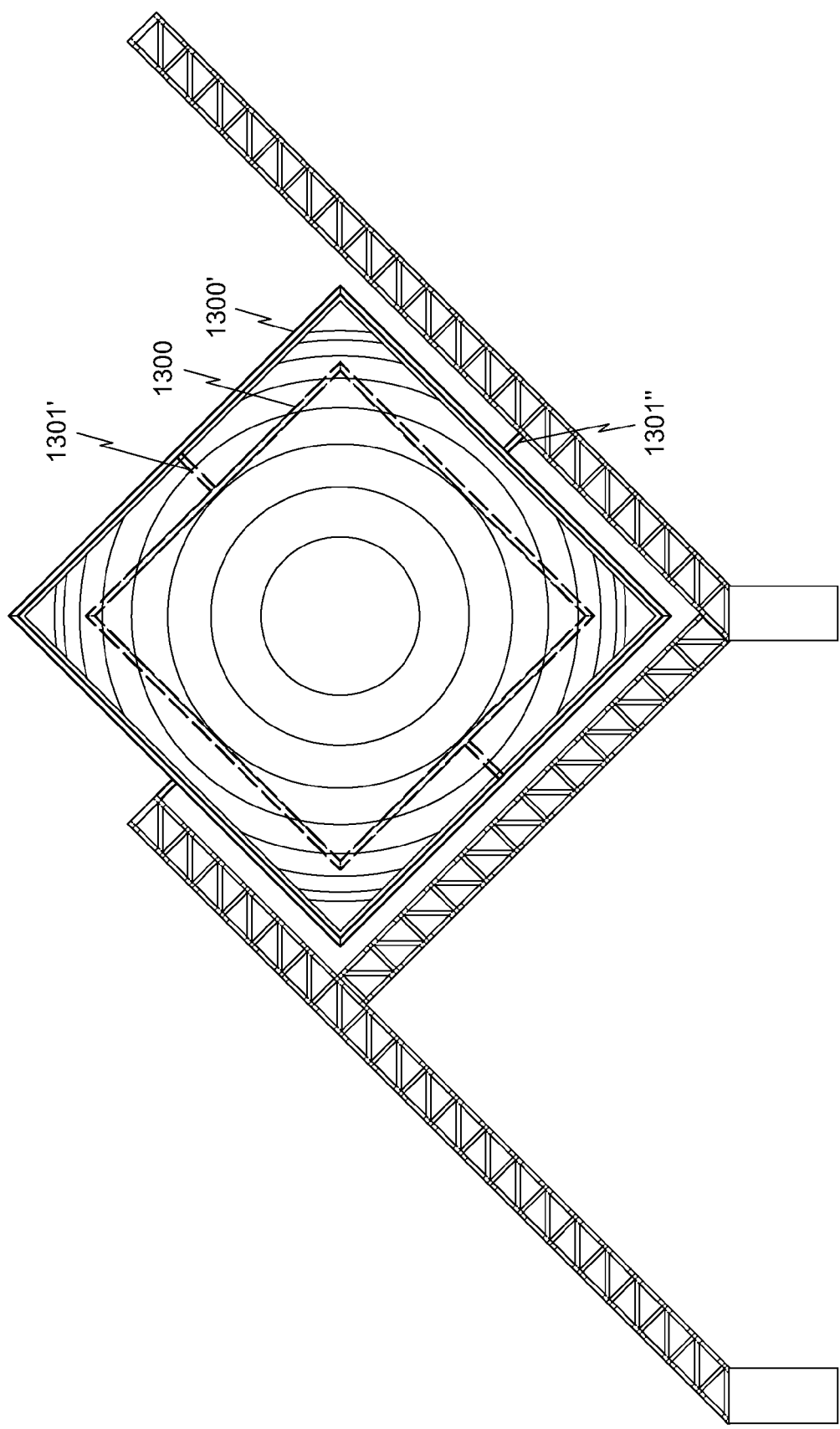
FIG. 13E is a depiction of a tracker that minimizes support tower spacing needed for a multi-tracker arrangement using shared tracker supports.

As shown in FIG. 13E, for a mirror with a balancing frame 1300, a seasonal axle 1301' at the height of the frame will allow such pivoting with a minimal force that is merely sufficient to overcome the friction of the pivot and any un-balanced wind loading. And since the motion needed about this axle is always less than one half a degree per day, even a small motor can be geared down sufficiently to provide the necessary force. This does, however, require a larger outer frame 1300' around the balancing mirror frame to hold the seasonal axle 1301', with the outer frame 1300' itself rotating around a polar axle 1301" for daily tracking. Because the bending forces on the outer frame occur in the middle of each side, frames 1300 and 1300' can be heavy steel or lattice-truss frames to provide sufficient stiffness. As shown back in FIG. 4G, the seasonal axle 1301' can also be combined with the receiver support pivots and can anchor the inner rib supports for greater strength at lower cost. Even with these optimizations, however, the single balancing frame combined with the Brantley axle will generally be preferred except where increased maximal aperture packing density is strongly desired, or significant ground clearance is needed.

Since this design is only preferred where a major benefit of the solar energy collection is to provide shade, it can be optimized for such cases. A prime example of such a case would be a parking lot in a sunny climate, where, for example, shade for a parking area encourages one to shop in near-by stores, and where the trackers must, even at dawn and dusk, have enough ground clearance not to be hit by a car or even a small truck. As plug-in electric vehicles become more common, a preferred business model will be to shading a parking lot with solar panels and offering a free charge for your car while you shop, with your car conveniently shaded so that it is not sun-baked when you finish shopping. Any electricity so used will avoid conversions between AC and DC on each end of a transmission line as well as the transmission-line losses, and once the demand peak has been met by solar, this will provide an ideal way to absorb the excess power produced by photovoltaic systems when the sun is strong.

Instead of simply providing electricity to cars parked in a parking lot near a store, the means for delivering electricity to charge a car could be controlled from within the store. For example, someone entering the store to shop could inform the store of which parking space they were occupying, and the charging could be made to happen only while that customer remained in the store. Or a credit card could be used as a deposit, and a voucher validated by any participating store would cancel the payment for the electricity.

Information could also be gathered for the store. If an store-branded card were swiped through a reader to start the charging, the system could provide the store the information that the store would need to correlate the use of the charging system with how long the customer shopped (how long between parking and going through the store's checkout line), or how much the customer purchased. The charging could even be run by a third party who could use such information to demonstrate how much the charging system was increasing business, or use it to charge the store a fee for increasing their sales volume.

Figure 13F:
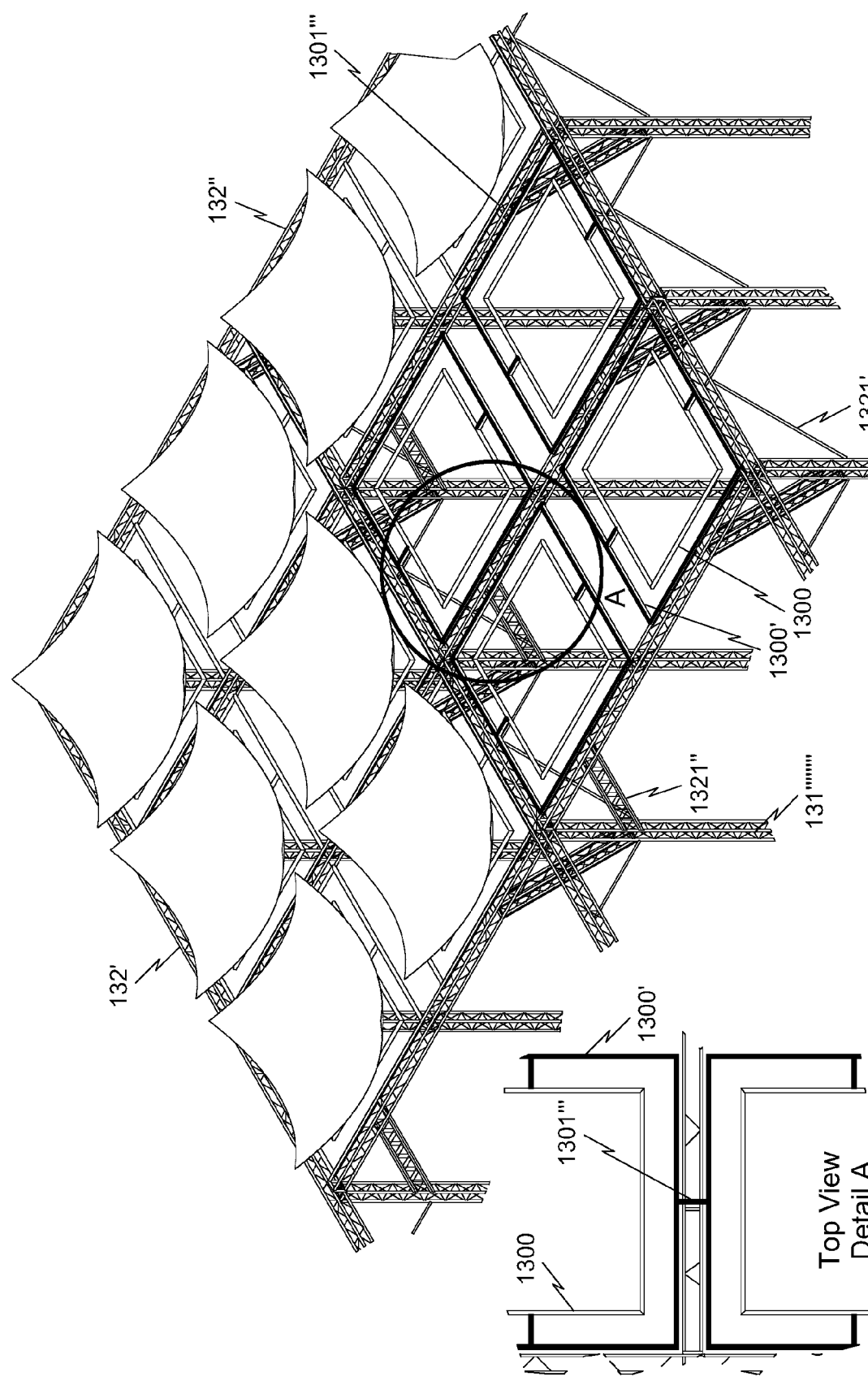
FIG. 13F is a depiction mutually-supporting lattice towers for dense installations on tall towers for maximizing the usability of shaded space below the trackers.

In these cases the packing density of the trackers will be significantly higher than the most cost-effective density for power generation alone. This decreases the distances to be bridged by cooperative tracker supports. The increased clearance also increases the stress on the pole or tower for non-cooperative tracker supports, and the need to be able to drive relatively freely underneath makes large concrete tower bases less desirable. Thus the optimal solution is to have dense arrays of trackers supported by tall towers whose relatively small bases are spaced comparably to the bases for the parking lot lights already used in parking lots. FIG. 13F show mutually supporting lattice towers (or poles) 131''''' that meet these criteria. Each tower 131''''' is connected to neighboring towers by connecting lattice truss sections 132' and 132". Each connecting truss section 132" preferably supports two outer frames 1300' on each side through axles 1301'''. The axles 1301''' are similar to axles 1301' of FIG. 13E, except that they can be longer to support a mirror on each side of lattice section 132" (this can be most clearly seen in Detail A). The outer frames 1300' and the additional frames, axles and mirrors within it can be identical to those in FIG. 13E, which can be referred to for their descriptions. Note that some mirrors have been removed in 13F to allow the supporting structures to be more clearly seen.

Diagonal brace 1321' between the lattice tower (or pole) 131''''' and connecting section 132', and diagonal brace 1321" between the tower and connecting section 132", provide strength and rigidity against lateral movement of the entire array, so the towers 131''''' can be relatively narrow and lighter weight than in non-mutually-supporting embodiments. Diagonal brace 1321" can also help support the weight and wind load on the mirror near where the axle 1301''' intersects connecting member 132", allowing those connecting members to be of lighter construction as well. While the axles for different outer frames would not necessarily have to run in the same direction, having them all in the same direction is preferred because it allows the connecting trusses parallel to the axles 1301''' to be of lighter construction, and allows each axle 1301''' to be shared by two trackers as described above. Having two outer frames 1300' between each pair of towers in the direction of the trusses that support the axles 1301''' is also preferred because it allows twice the distance between supporting poles or towers in that direction without unduly increasing the strength needed for the trusses in that direction.

Because the lack of leveraged lateral forces on the towers and concrete pads allows taller towers without requiring excessively heavy-duty tower construction or large concrete pads, this embodiment is exemplary for parking lots or other spaces where the value of dense shading of the ground throughout the day counteracts the cost of mirrors densely packed enough to shade each other significantly when the sun is at moderate altitudes.

The mirrors can also be sized to match the size of standard parking spaces or of particular types of cars. For example, in the United States cars are typically between 4.5 meters and 6 meters long and roughly between 2 an 2.5 meters wide. The 6-meter dishes as described earlier in the present application would thus be a good match for a parking lot in the United States, with the frame and trusses providing enough extra space for two 6-meter-long vehicles to be parked nose-to-nose under a pair of dishes on opposite sides of a truss. The supporting posts would thus go between the two rows of cars, and two cars would also fit side-by-side between posts with room to open their doors. Different countries have different typical car sizes and parking space sizes. It is also likely that plug-in electric vehicles will be smaller than their internal-combustion-engine counterparts, and hence if only a region of a parking lot were covered, it could use smaller parking spaces and would thus have a different optimum mirror size. The mirror apertures also do not have to be square, and the mirrors may also shade the aisles through which the cars drive to reach the parking spaces.

To reduce the cost of orienting multiple trackers, a single tracking system can orient multiple trackers on independent (but parallel) axes of rotation. Since at any time all of the mirrors and thus their trackers must be rotated by the same angle (the angle that the sun has moved for embodiments where receiver move with the mirrors, or half the angle that the sun has moved for heliostat embodiments), a simple drive chain can pivot a 'string' of mirrors on one axis. Sharing sensors and a drive unit for one axis is well known in the art of one-axis trackers.

But with two-axis trackers the trackers must track in a second direction, and sharing sensors and a drive unit in a second direction is more challenging. A second drive chain is needed, and this gets twisted as the mirror frames are moved in the first direction. The Brantley axle minimizes this because the two axes of rotation used are only 23 degrees apart, and the cooperative motor embodiment described above eliminates this issue completely because the axes of rotation of the two motors are aligned. Thus the cooperative motor embodiment is strongly preferred if multiple mirror frames are to be oriented by the same driving mechanism.

Preferably each drive chain (or drive cable) would go through a gearing mechanism for each mirror frame which would reduce the force needed to orient that frame by the gear ratio, and would also make the orientation comparably less sensitive to thermal expansion of the cable or other changes in cable length. For the cooperative motors, this could be a simple lever arm opposite the arm by which the frame is driven. However, this would reduce the range of motion to slightly less than 180 degrees, even before taking the accumulated difference between the motors into account. Also, as mirror size is scaled up the mirrors are placed farther and farther apart, and the cost of linkages between mirrors grows to exceed the cost of independent alignment means. While the balance depends on factors beyond external factors, such as changes in the cost of motors of various sizes, the cost of sensors and more but smaller motors is currently low enough that for mirror apertures of the sizes used in the above examples, the cost savings from sharing motors today are insufficient to justify the added complexity of field assembly and adjustment. Therefore embodiments where a single tracking mechanism and a single drive mechanism rotate multiple mirrors on independent parallel axes of rotation are currently not preferred for large two-axis trackers for high-concentration systems.

A significant drawback of all the shared-support tracker supports described above is that they require supporting both the high end and the low end of the tracker, which takes much more steel than a pole-top tracker that just supports a tracker at one point. While for sufficiently dense trackers or when high ground clearance is needed the above designs are preferred, for large solar farms in desert regions obtaining low cost per power output is the overriding factor, and pole-top or tower-top trackers can be made more efficient in this regard. Again the tracker is best supported at its center of balance to minimize stress on the tracking mechanisms. But the balancing frame of the present application would not balance at such a height on pole-top tracker, as this point would be inside the mirror. The prior art for mounting a mirror on a pole top at its balance height has dealt with this by having a notch in the mirror frame and mirror big enough for the entire tracker support to pass through, but this weakens the mirror frame and reduces the mirror area. Thus a better solution is needed for mounting parabolic dish mirrors on pole tops at their balance heights.

Figure 13G:
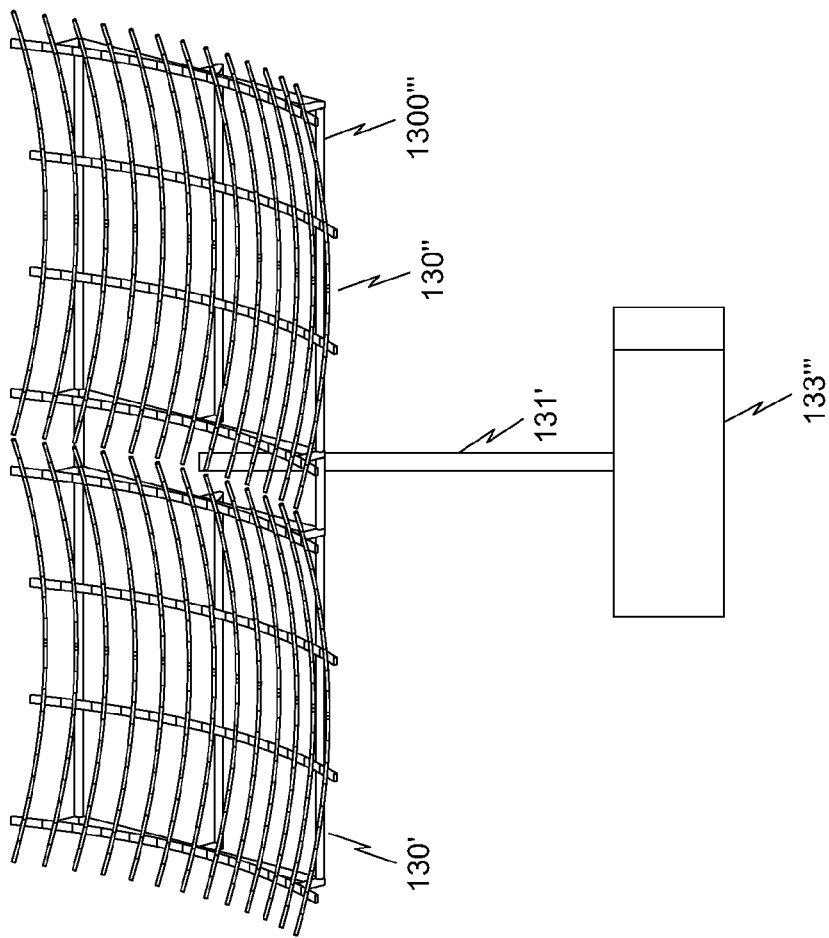
FIG. 13G is a depiction of a balancing tracker frame with dual apertures mounted as an altitude/azimuth pole-top tracker.
Figure 13G:
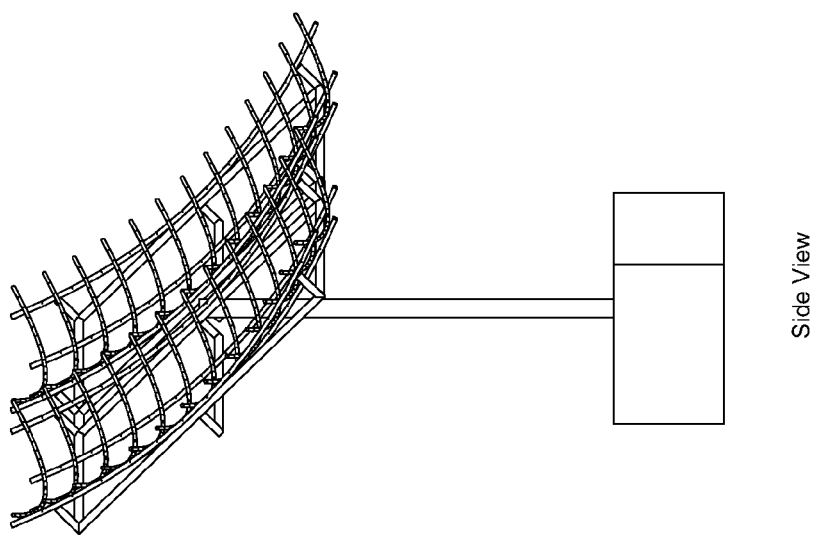

While a single parabolic mirror's balance height is inside the mirror's curve, this is only true of rows of an odd number of mirrors. In contrast, a row of an even number of parabolic dish mirrors in an elongated frame 1300''', in this case 130' and 130'' as shown in FIG. 13G, would balance on the top of a pole 131' mounted on a concrete pad 133'''. Because the balance height is at 80% of the mirror width, the pole 131' could be as wide as 20% of a mirror width while still clearing the mirrors 130' and 130'' at their balance heights.

Figure 13H:
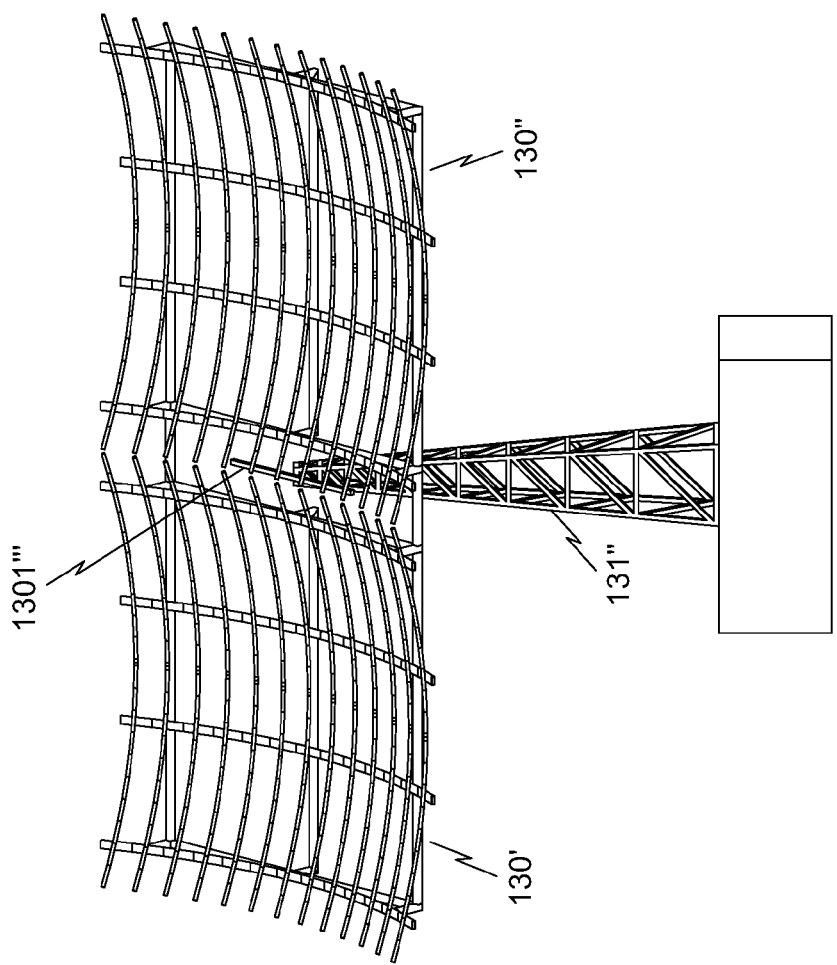
FIG. 13H is a depiction of a balancing tracker frame with dual apertures showing the loss of tracking when it is mounted as a daily/seasonal lattice-tower-top tracker.
Figure 13H:
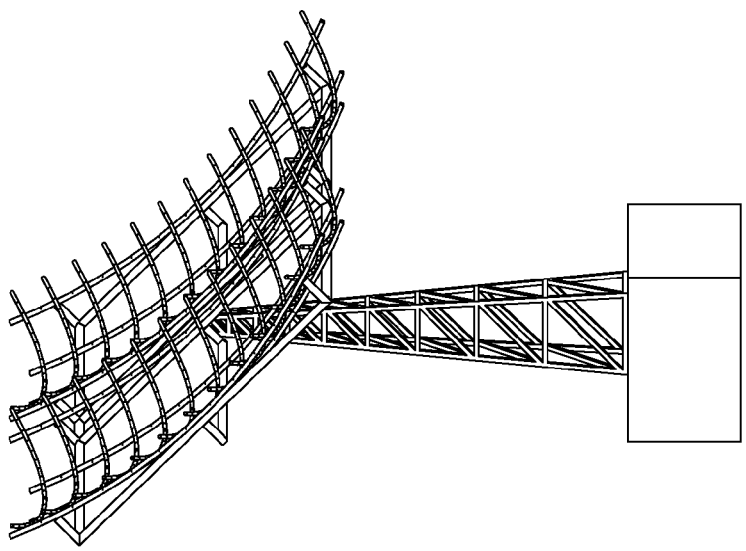

As shown in FIG. 13H, a tracker based on a polar axle 1301''' could also be mounted on a lattice tower 131'', by using a frame 130'' with an even number of parabolic-dish mirrors. But the bottom of the mirror (or mirror supports below it) projecting down below the frame 130'' in the middles of the parabolic dishes would limit the daily tracking range to avoid them hitting the tower. This loss of tracking range is at least 12 degrees on each side of a 12-hour the daily swing, plus the angle of the lattice tower 131'' itself. This can be reduced somewhat by using a two-dimensional array of large-aperture mirrors that has an even number of parabolic-dish mirrors in each dimension, so that the balance point falls between four parabolic-dish mirrors, but the morning and evening losses are still significant, especially as in the summer a daily/seasonal tracker needs more than 180 degrees of daily rotation.

Figure 13I:
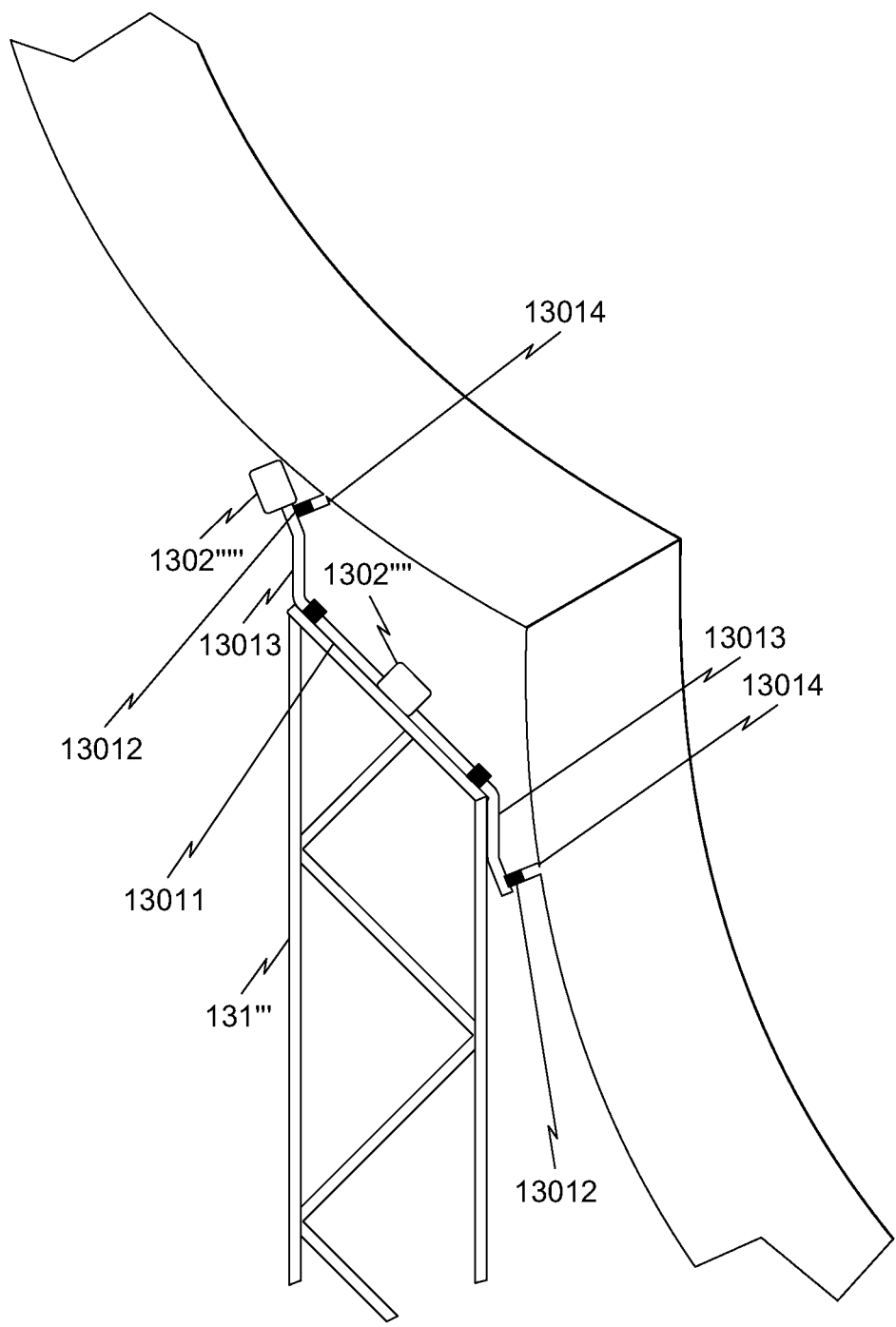
FIG. 13I is a depiction of an improved axle for a single-axle, two-axis tracker being used to mount such a tracker on a pole top.

Unfortunately this simple pole-top support is incompatible with the single axle tracking as taught by Brantley, which uses seasonal rotation around a central section and daily rotation around two end sections. However if the use of the Brantley axle is reversed to have daily rotation around the single central section 13011 aligned with the earth's polar axis at its center as shown in FIG. 13I (as opposed to the Brantley axle's having two such polar-aligned sections for daily rotation at its ends), and has seasonal rotation around a section 13012 at each end that is slanted at 23 degrees relative to the central section (as opposed to Brantley's axle having seasonal rotation around one such section at its center), then the fixed central section can be mounted atop a pole or a lattice tower 131''' to form a pole-top tracker. Daily rotation about polar-aligned central section 13011 is driven by means 1302'''' and seasonal rotation around end sections 13012 can be is driven by means 1302''''', such means being well known in the art of trackers for solar systems.

When mounting on a lattice tower, having a wider tower minimizes the stress on the bearings from un-balanced wind loading. However as the width of the tower approaches the width between the dishes at their balance heights, the mirrors' balance height must be raised above the axle's bearing to prevent a mirror from hitting the tower when its side of the axle is in the 'down' position. To minimize this, and thus allow as wide a tower top as possible without having to raise the mirrors, or to allow an even wider tower with raising the mirrors a minimal amount, the axle's connecting sections 13013 are preferably not perpendicular to the central section 13011 as they were with Brantley's axle, but are at an angle to the central section that is approximately equal to the latitude at which the system will be installed, thus allowing them to just clear the sides of the tower. If a wide enough tower is used to require raising the mirrors, then the mirrors can be raised with stand-offs 13014. This forms an exemplary embodiment for solar farms in the tropics or in the sub-tropical regions of the temperate zones, where the summer days are not too much longer than 12 hours and the relatively flat angle of the tracker in the summer will reduce the lost early morning and late evening tracking time because the pole will be between the mirrors rather than hitting a mirror near its axis of symmetry.

Figure 13J:
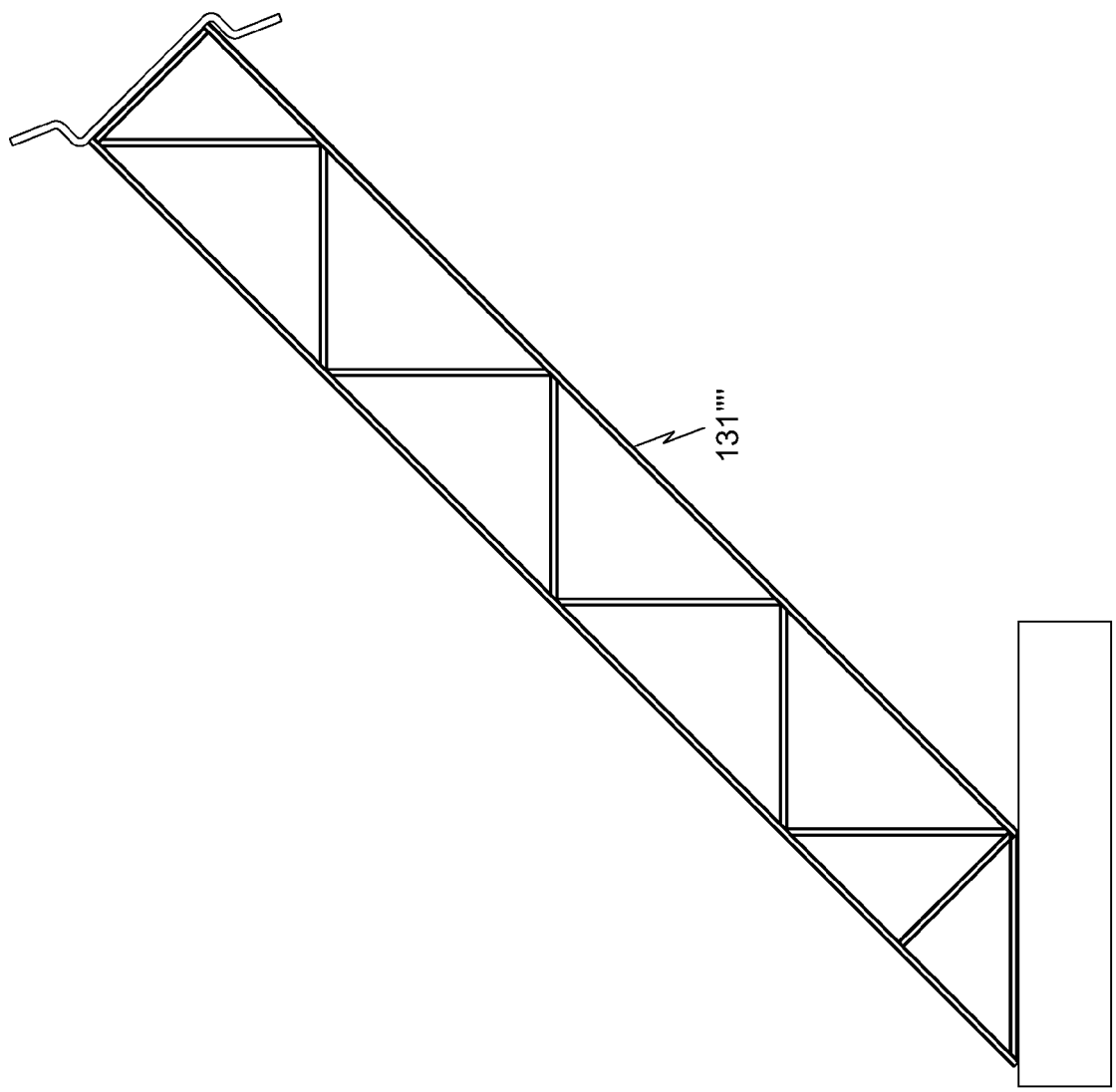
FIG. 13J is a depiction of a such an axle being mount on a slanted tower.

Farther into the temperate zones, where the days are longer and the tracker would be more slanted, the pole or tower 131'''' itself could be slanted, as shown in FIG. 13J (which would not significantly increase stress on the pole since wind loading rather than gravity that produces the worst-case stress); the slant from vertical would be less than the latitude to have the tracker roughly aligned with the gap between the mirrors for most of the summer, greatly reducing the loss of tracking time. The stand-offs could even be extended to allow greater than 180-degree daily rotation, although this would put greater stress on the bearings. At even higher latitudes, the preferred tracker type would revert to the pole-top or tower-top altitude/azimuth tracker to maximize light gathering time during the very long summer days.

Another style of tracker is that taught by Carter in U.S. Pat. No. 811,274, in which the entire tracker sits on a wheeled base at approximately ground level, with the wheeled base rotating for azimuthal tracking. While this produces a very sturdy system with a long lever arm for accurate tracking, it does not support a balancing frame and requires lifting the entire weight of the tracker, plus any wind loading, for altitude tracking. Also in climates where the ground freezes to an appreciable depth, a circular foundation the circumference of the whole tracker needs to be extended to below the frost line to prevent frost heaves from disabling the tracker's track. The entire ground below the tracker is also then unusable for purposes such as grazing live stock, and the tracker is vulnerable to weed growth interfering with the track.

Figure 13K:
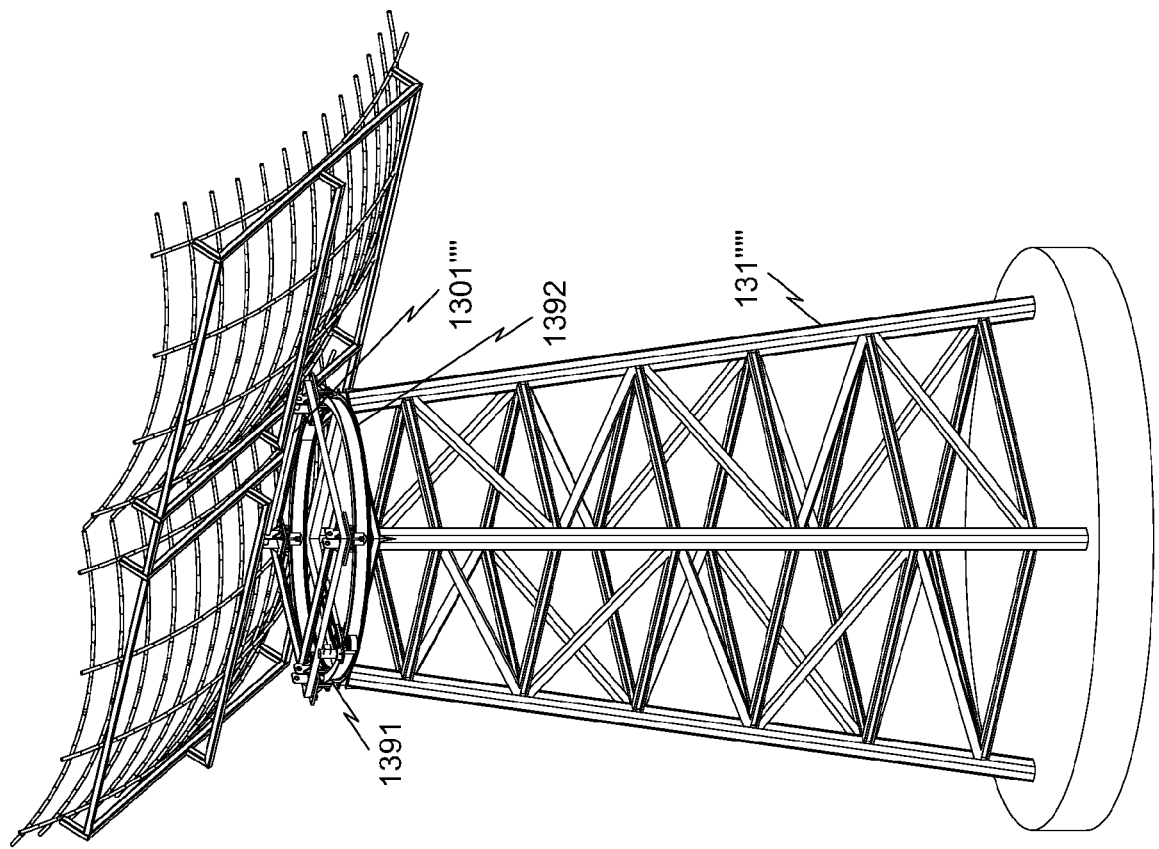
FIG. 13K is a depiction of a lattice tower-top tracker with optimized tracker azimuthal rotation around the top of the lattice tower.

As shown in FIG. 13K, tracker supports that combine most of the advantages of a pole-top tracker with most of the advantages of a wheeled-tracker like Carter's can be built by using a lattice tower 131''''' whose height is at least half the width of the tracker in the altitude direction. A tracker 139 with multiple sets of wheels 1391 on a track 1392 at this height for azimuthal tracking allows a balancing frame to be used (to better illustrate the tower and its track, the balancing frame is shown greatly reduced in size in FIG. 13K). Such a lattice tower can be supported on a solid concrete base, as the pole of a pole-top tracker would be, or on three or more concrete foundation posts extending below the frost line, and either of these can leave the most of the land under the tracker free for other uses such as grazing.

In preferred embodiments the balancing frame would rotate around an axle 1301'''' at the edge of the lattice tower to minimize loss of morning and evening tracking. Although having the altitude axle at the edge of the tower looks odd, it is just as good as a centered axle at supporting wind loading, and the maximum force from wind loading is so much greater than the weight of tracker and its contents that the extra altitude tracking range outweighs any minor improvement in supporting the tracker's weight.

Figure 13L:
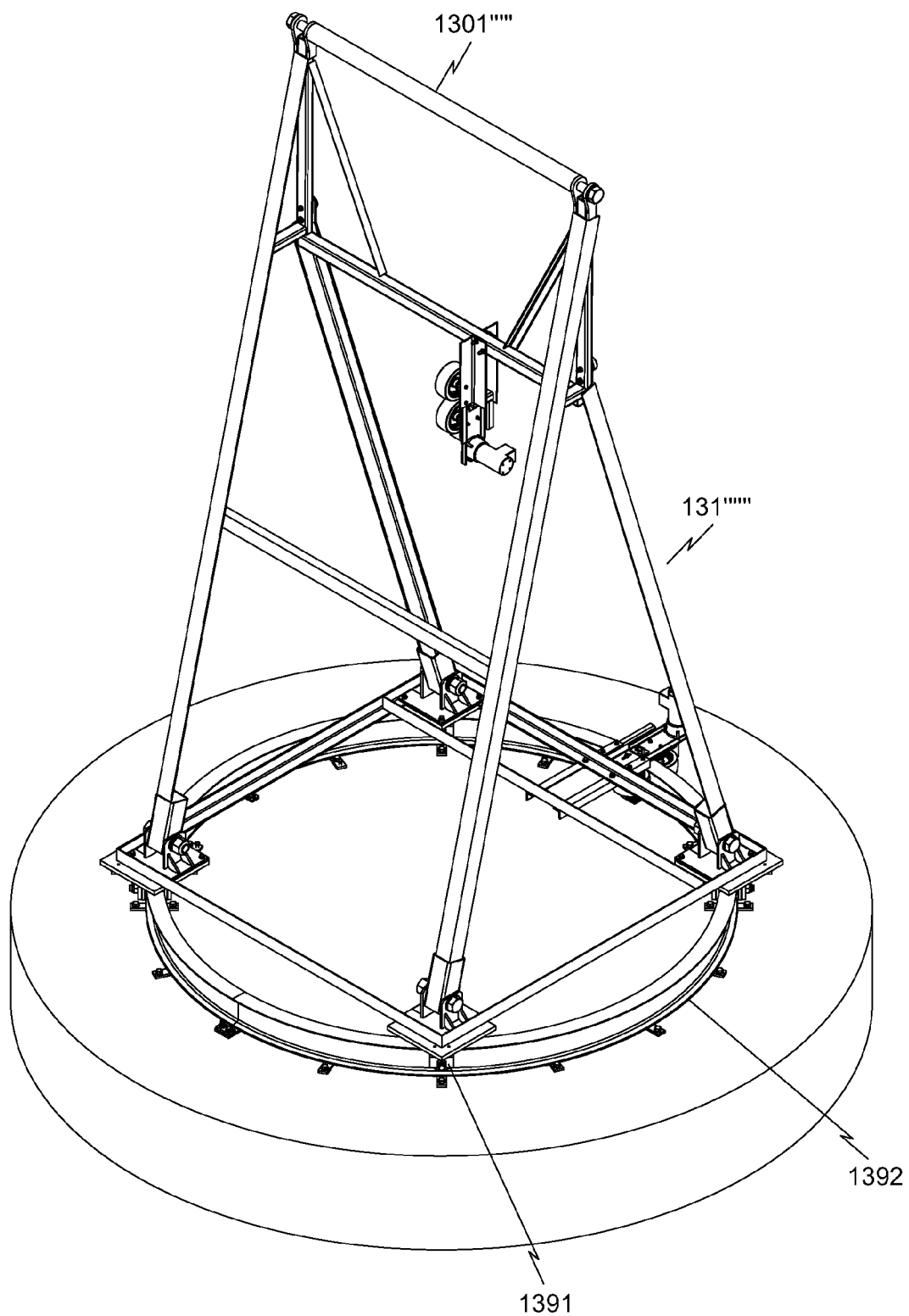
FIG. 13L is a depiction of a lattice-tower-top tracker in which the entire tower rotates for azimuth tracking.

Because the wind loading force can be so great, and a wheeled tracker with a cost-effective number of wheels concentrates the force at a few points whose position changes with the time of day, a track supporting the wheels needs a lot of support. An even better design that provides the same advantages is shown in FIG. 13L. This design uses a solid concrete base supporting a lattice tower, but puts the track 1392' for the azimuthal tracking on the concrete base and the azimuthal tracking wheels 1391 on the base of the lattice tower. In preferred embodiments the width of the lattice tower 131''''' is equal to (or tapers from the tower base to) approximately the length of the axle 1301''''' in one direction, and tapers down to approximately the width of the bearings for that axle 1301''''' in the other direction. To allow a continuous center-line truss, in especially preferred embodiments the back of the tower is vertical for a distance equal to the depth of the centerline truss below the bearings, allowing the dishes to track to the sun being straight overhead. Depending on the frame chosen for the mirrors, the mirrors may have to be raised slightly with stand-offs to avoid the ribs, rails, or other mirror supports from hitting the tower, in the morning or the evening, as it tapers out toward the track 1392. Because of the shallow slant of the mirrors at this point, even a slight raising of the mirrors allows significantly greater width (with the amount depending on the rim angle used).

Figure 13M:
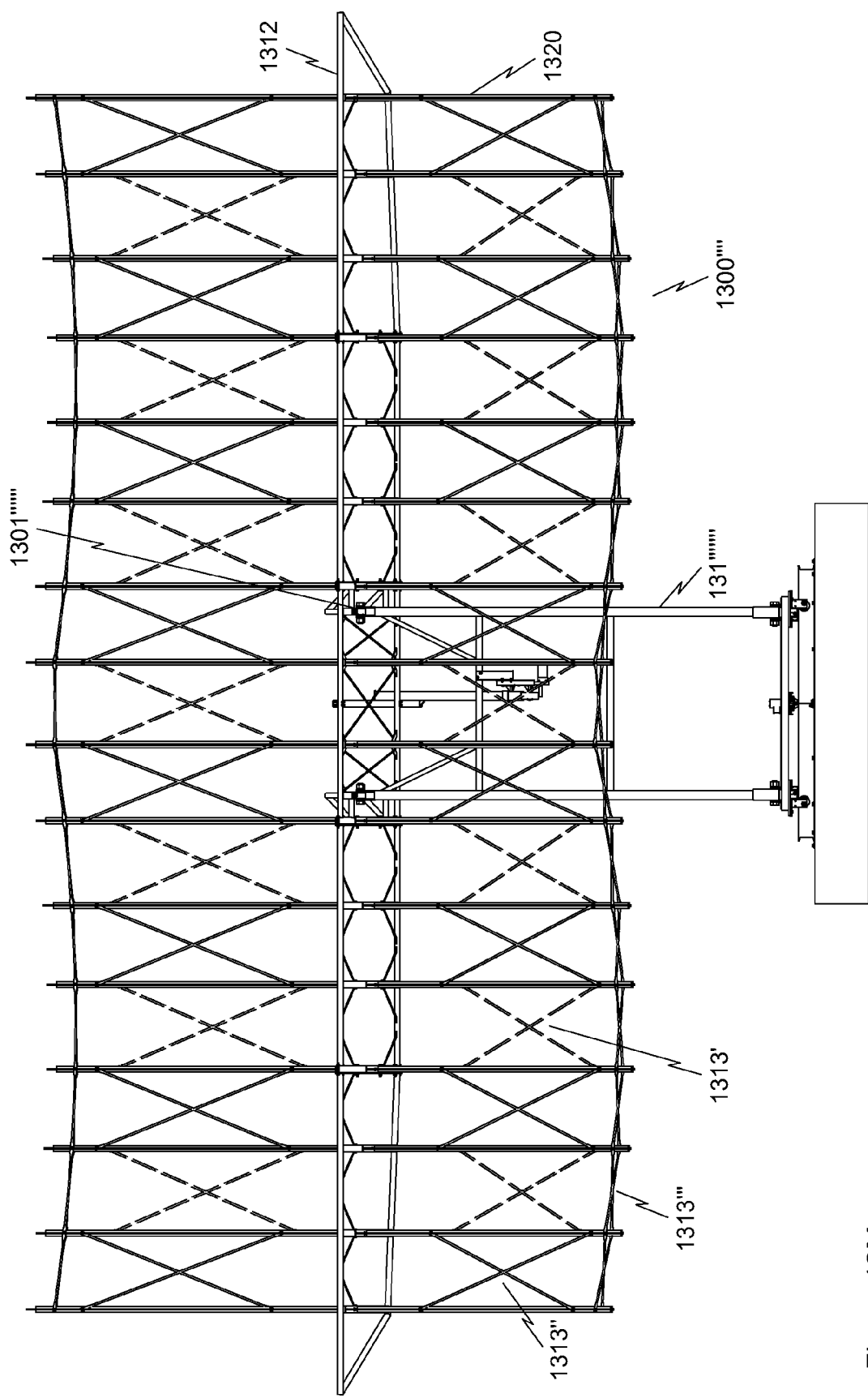
FIG. 13M is an depiction of a lattice tower for supporting a pair of paraboloidal mirrors where optimized tower bracing and rail cross-bracing allows the central rails to pass through the top of the lattice tower without colliding, allowing tracking down to close to zero degrees of altitude.

In exemplary embodiments, hybrid rails 1320 are used to support sleeved mirror segments, and, as shown in FIG. 13M, the hybrid 1320 rails themselves are cross-braced to prevent the centerline truss 1312 from bending or twisting out of its plane (the centerline truss 1312 is itself deep enough to provide the needed resistance to bending within its plane). The straight members closest to the mirrors of pairs of hybrid rails 1320 are cross-braced by cross braces 1313', and the straight members farthest from the mirrors of the hybrid rails 1320 are cross-braced in alternate pairs by cross-braces 1313'', as shown in a back view of the tracker frame 1300''''. Cross-bracing between all neighboring hybrid rails in the plane of the centerline truss by cross-braces 1313''' is placed toward the outer ends of the hybrid rails 1320, where it has substantial leverage in resisting bending of the centerline truss but still has enough depth to have leverage in resisting twisting of the centerline truss. The result is that the whole set of centerline truss, hybrid rails and cross-bracing becomes tied together in a manner that has great leverage at resisting bending or twisting in any direction, while using a minimum of materials and not relying upon any curved members for strength.

The alternation of the cross-bracing 1313' and 1313'' between pairs of hybrid rails is started with cross bracing 1313'' between the central hybrid rails on the side of the mirrors that is down when tracking to low altitude, so that this cross-bracing 1313'' does not hit the sides (shown edge-on) of the tower 131'''''' that are perpendicular to the axle. The cross-bracing 1313''' that is parallel to the centerline truss, and between all adjacent hybrid rails 1320, is placed toward the outer ends of the hybrid rails 1320, and at low altitudes the 'X' shape of this cross bracing 1313''' also is farthest from the sides of the tower in the middle of the 'X', which occurs at close to the distance between the sides of the tower. Together these ensure that this bracing 1313''' does not hit the tower at low altitudes, either.

Because the spacing of the hybrid rails will be closer (three feet or 0.9 meters in the example of the preferred 6-foot or 1.8 meter mirrors) than the ideal width of the top of the tower (roughly the distance between the dishes at their balance heights, or roughly 1.4 meters or 5 feet), at least one of the hybrid rails would hit the lattice tower when tracking to low altitudes if the tower were solid. With symmetrical 7.2 meter (24-foot) dishes the central such hybrid rails would be 0.9 meters (three feet) apart, with a 0.9 meter (three-foot) gap on each side of that before the next hybrid rail. By using angled braces to the top points of the tower that support the bearings for the altitude tracking axle, these central hybrid rails can pass through the top of the tower without collision, allowing tracking down to altitudes well below the 20 to 30 degrees typical of pole-top trackers, and even below the 10 degrees altitude typical of carousel trackers.

Placing the bearings farther apart allows a stronger angle to be used for the braces, and raising the dishes even a few inches above the balance point allows a significant widening of the top of the tower. For maximum tracking accuracy and minimum force on the wheels from wind loading, ideally the wheeled base of the tower is roughly the size of the diameter of the solid concrete base, the sizing of which is the same as for the base of a pole-top tracker of equal area and tower height.

However for moderate volume production, the use of a standard track conveyor system is preferred as more cost effective, so the largest-diameter standard track that is smaller than the concrete pad can be used until productions volumes are sufficient to make a custom track cost-effective. With standard 10-foot-diameter (about a 3-meter diameter) conveyor track used for the bottom track for the lattice tower, and with four equally-spaced sets of wheels, increasing the distance between the bearings to seven feet (about 2.2 meters) allows vertical sides to be used for the lattice tower, simplifying in-field assembly. This requires raising the dishes around 3.5 inches (9 centimeters) above their balance point, which is worth it for the simplification. In general the optimum minimum tracking altitude at today's relative material costs is roughly 7 to 10 degrees in the tropics, 4 to 8 degrees in temperate zones, and less than 5 degrees in polar regions; but even at a given latitude factors such as weather and electricity demand versus time of day influence the optimum minimum altitude.

In solar trackers where the mass of a large concrete block is used to anchor a tower, a water tank can be used for that mass instead. Where water is plentiful this allows pumping water instead of transporting concrete for the mass. Even in locations where water is scarce, concrete contains a lot of water so the difference in water needed is not as large as it seems. In solar trackers supporting systems with water-based cooling, the anchor mass can also hold coolant that is chilled during the night, allowing either a smaller radiator to be used around the clock, cooler cells that run more efficiently, or a combination of both.

A short (roughly 600 mm) cylindrical mass anchor for a 100-square-meter tracker requires roughly 20 tons of concrete, but an optimal-sized base for a track (taking minimal land area from uses such as grazing) would smaller in diameter and need roughly 40 metric tons of mass. With today's high-efficiency cells the receivers on such a tracker would reject almost 60 kilowatts of heat for roughly 12 hours of the day at a typical solar-farm latitude of roughly 30 degrees, leaving 12 hours to accumulate cooling. Thus 60 kW*12 hours or 720 kWHr of cooling would need to be accumulated, and a kWHr is 860 Kilo calories or enough energy to heat 1 metric ton of water by 0.86 degrees. Thus 720 kWHr is enough energy to heat 40 metric tons of water by 18*0.86=15.5 degrees Celsius.

15.5 degrees Celsius over ambient is right in the range typically optimal for high-efficiency cells with active cooling in the preferred embodiments for a few foci on two axis trackers as discussed earlier in the present application, and so using a coolant storage tank sized to anchor the tracker in high winds allows the cooling system size to be cut in half (due to running around the clock instead of only during the day). Furthermore in the desert the average night-time temperature can easily be 15 degrees Celsius cooler than the average daytime temperature, so the radiators run more efficiently at night, allowing either lower cell temperatures or a still smaller cooling system.

Because the cooling system will run continuously, there will be no danger of the coolant freezing in the pipes and thus ordinary water could be used instead of a water/antifreeze mix (the fans could be shut off while the coolant was kept circulating if the coolant temperature neared the freezing point, and the coolant could be drained into the tank by gravity if the circulating pump were to stop). Ordinary water is thus more preferred since it is less expensive and more environmentally friendly than anti-freeze. A two-part tank with a flexible divider would allow warmer coolant to be pumped through the radiator(s) and accumulated in the chilled section at night, and cooled fluid to be pumped through the receivers (for a photovoltaic system) or to the cold side of the turbine (for a solar thermal system) and accumulated in the warm section at night. (If all of the fluid ended up in one section, it could simply be re-circulated back into that section until dawn or dusk.)

Although 40 tons of water per tracker sounds like a lot, the water is reused on a daily basis so this actually takes much less water than the evaporative cooling typically used for solar thermal systems. Only half of the cooling has to be stored in the 15 degree Celsius worth of cooling storage (not counting the highly-location-dependant benefit of cooler night). With the heat of evaporation of water being the equivalent of 540 degrees Celsius, evaporative cooling would use as much water every 540/(15*2)=18 days as the water stored in the anchor tank. Over a 30-year system lifetime, such a system would thus reduce the water needed by 99.8% relative to evaporative cooling, while allowing a radiator and fan system ½ the size (or typically ⅓ the size in a desert where average night temperatures are 15 degrees Celsius cooler than average daytime temperature) than would be required for cooling to the same temperature without cooling storage. Some of the energy used to run the cooling means is also used at night, when demand is lowest and thus electricity is least valuable, rather than in the day when electricity is worth more.

When the decrease in land area covered by the tracker pad, eliminating the concrete mass, and reducing the size of the cooling together more than balance the cost of the tank, using stored coolant as an anchor mass to anchor the tracker against wind loading, and a smaller heat rejection system operated around the clock, forms a preferred embodiment of the present invention.

Eleventh Family of Preferred Embodiments: Improvements to Small Two-Axis-Tracker Heliostats The above families of embodiments have been directed to large two-axis trackers, but there are situations, such as residential roof-tops, where these are not practical. Using numerous small two-axis trackers controlled by a common tracking means has been taught for rooftop systems by Findell in his ingenious U.S. Pat. No. 4,317,031. However the small flat mirrors that Findell teaches are too numerous to be practical at today's labor costs, and the focus achieved is not intense enough to be cost effective with today's ultra-high-efficiency multi-junction solar cells. There is therefore a need to improve the art of small-tracker heliostats.

As Findell teaches, arrays of small trackers are best kept behind a sheet of clear glass, with the focal point on the outside of the glass. This makes the large sleeved mirrors taught in the present application less practical, and makes their ruggedness unnecessary. However smaller, lighter-duty mirrors curved in one direction similar to those taught above can be applied to small-tracker heliostats, with the parabolic-arc-fold mirrors (as shown in FIGS. 5L and 5M) preferred for their simplicity.

In more preferred embodiments, these mirrors are curved on their long axes and are aligned with their long axes substantially in a north-south direction. If the mirrors are mounted at an approximately at-latitude slant, this reduces the out-of-plane movement of their ends to sine(23) times their length. In even more preferred embodiments, the length of such mirrors is approximately equal to their width divided by sine(23), or about 0.4, so that the contribution to the clearance needed for the clear glass sheet are equal. To be sure, the mirrors will not need to rotate to quite vertical in the E/W direction to maintain their focus on a heliostat receiver, but even with an infinite focal length they would have to rotate 45 degrees, and the sine of 45 degrees is already 0.71 and rapidly approaching unity. For any reasonable focal length, the E/W rotation of the mirrors therefore contributes almost the whole of the mirror width to the clearance requirements.

Figure 14A:
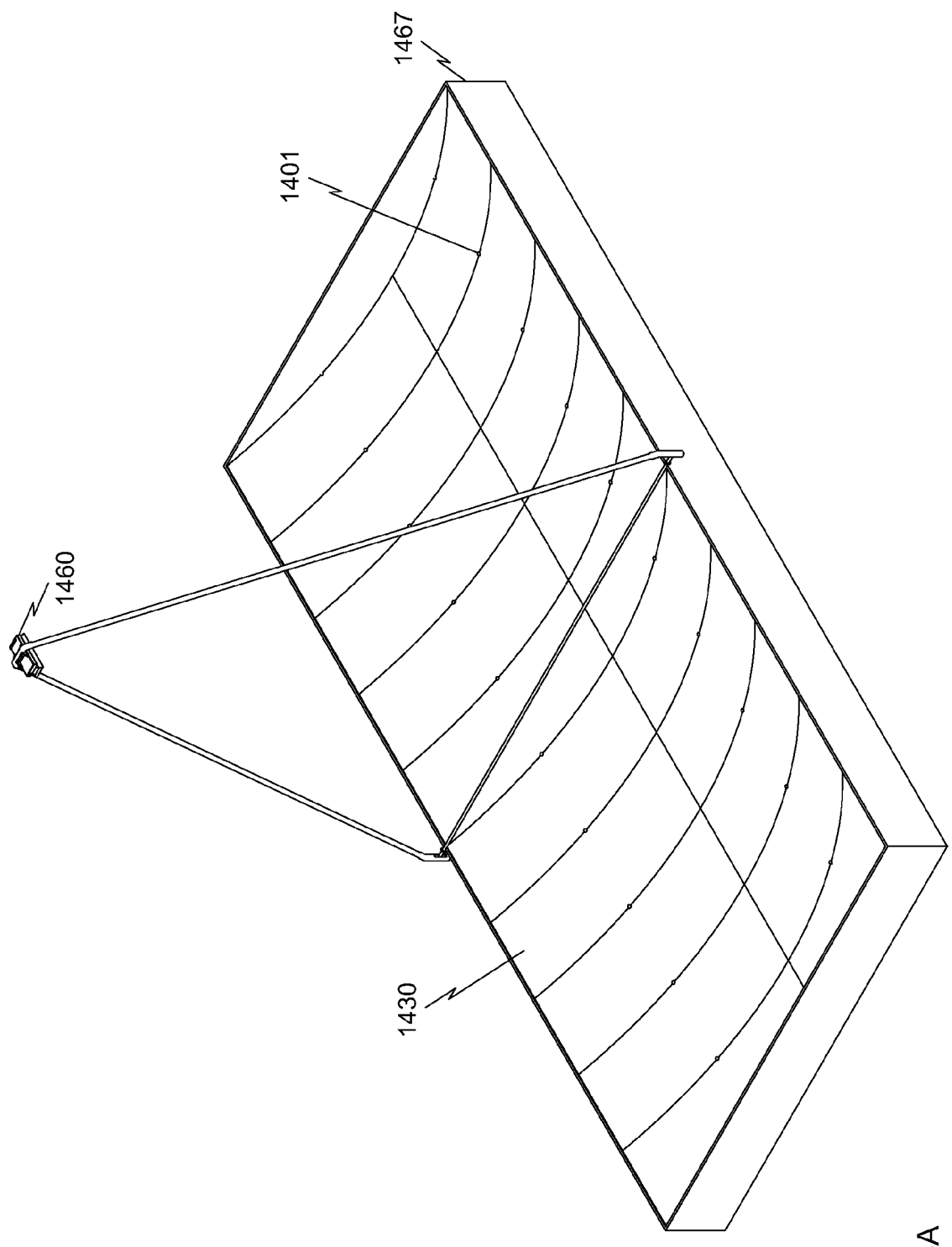
FIG. 14A is a depiction of a roof-top receiver using an array of cylindric paraboloids to focus sunlight onto a stationary receiver.

The corners of the mirrors require the most clearance because the width and length contributions to the clearance requirement add at the corners. The parabolic-arc-fold mirrors discussed earlier in the present application are thus especially preferred both for their simplicity and because they are naturally narrower at their ends, reducing their clearance requirements. The maximum practical size for a pre-assembled unit for a residential roof is the size of a sheet of plywood, which is just over 1200 mm by 2400 mm (four feet by eight feet). As shown in FIG. 14A, with two identical mirrors 600 mm (two-foot) long mirrors 1430 spanning the width of a plywood sheet, the optimal width of each mirror 1430 is around 0.4*600 mm or 240 millimeters, or around 9.6 inches, so ten such mirror widths matching the length of a plywood sheet is preferred. Each mirror rotates +/−23 degrees around its two pivots 1401 for seasonal tracking, and its pivots 1401 also rotate relative to each other in the E/W direction for daily tracking.

Without a non-imaging secondary concentrator this would limit the practical concentration with a 22.5-degree "rim" angle to around 70*10/1.33 or 525x, or around 450 suns after the losses from two passes through the protective clear glass 1467 are added to the mirror losses and shading losses from the receiver 1460 and its supports. The longer focal length reduces rotation of the direction of highest concentration from the mirrors, but to achieve the highest total concentration the direction of curvature of each mirror is rotated relative to its neighbors as taught earlier in the present supplication.

While 450 suns concentration is far more than enough for silicon solar cells, it is still shy of the roughly 1000 suns optimal for high-efficiency multi-junction cells. However if the focal length is at least the length of the plywood sheet, and thus the rim angle is lower, the length of the focal spot will be reduced and a non-imaging secondary concentrator can further double the concentration, allowing 1000 suns to be achieved. Because roughly a 70× focus in the direction of curvature from 1200 mm mirror produces a focal width roughly twice the width of a cell, the non-imaging secondary should focus to one cell width in the high-focus direction and provide any additional concentration in the low-focus direction.

However with a 250 millimeter length of the focal spot, a single non-imaging secondary in the low-concentration direction would need to be very deep even for a modest increase in concentration. It would also thus be very wide, and would thus be excessively fragile and block a noticeable amount of light. Thus multiple smaller non-imaging secondary concentrators are preferred per primary focus. Using two such non-imaging secondaries cuts the size of each secondary by a factor of four, and cuts the total size and total light blockage in half, using three such secondaries cuts the total size to ⅓, etc. A point of diminishing returns is quickly reached, but if multiple non-imaging secondaries are molded as a single unit, no practical limit is reached until the length of the secondary focus from each non-imaging secondary is the length of a single solar cell.

Figure 14B:
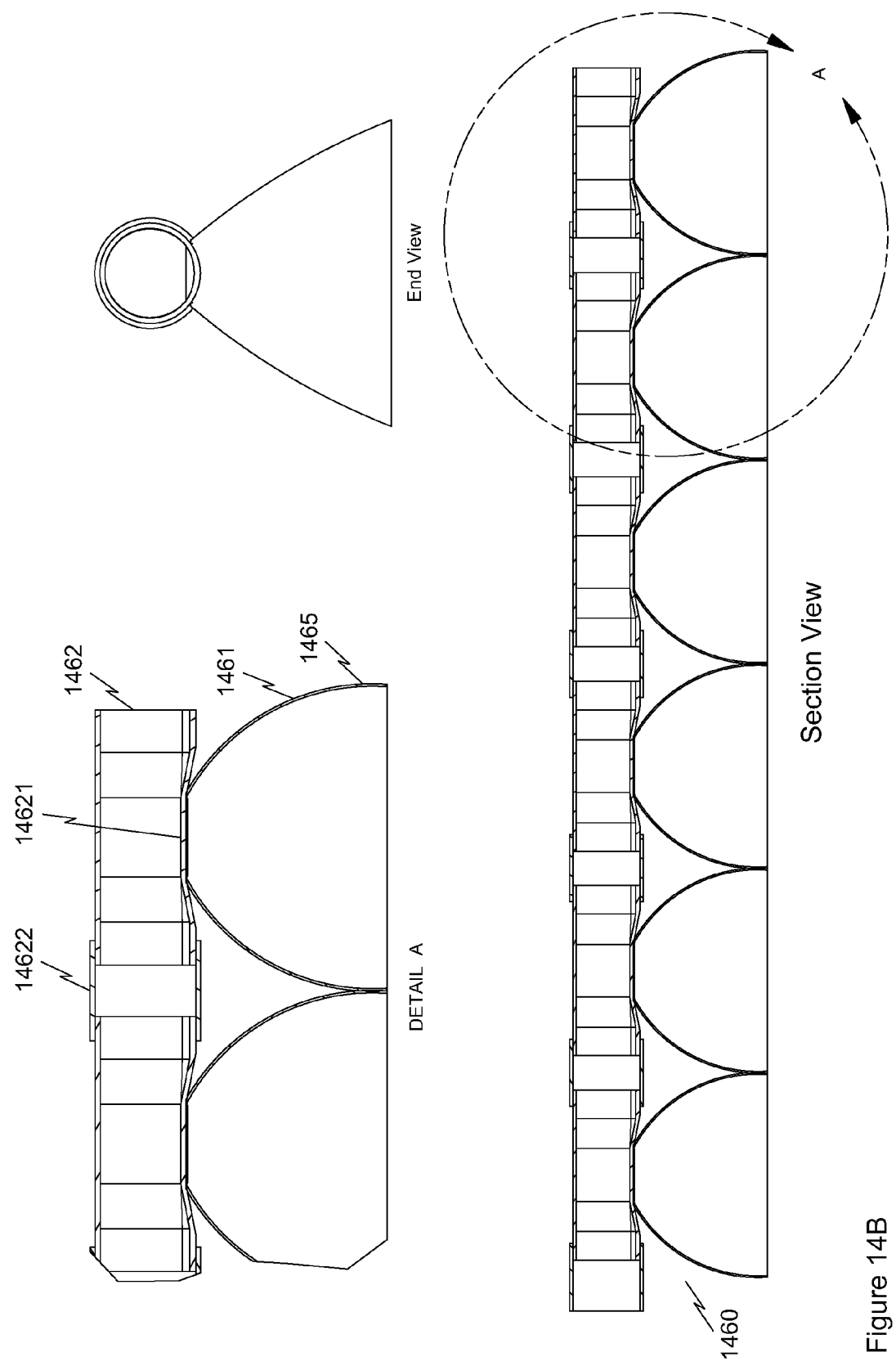
FIG. 14B is a depiction of a roof-top receiver with multiple secondary concentrators.

Even for a small increase in concentration from the non-imaging secondary concentrator in the low-concentration direction, where the depth of the secondary would not be excessive, multiple non-imaging secondaries are preferred when using cells affixed to an electrically conductive cooling pipe. As shown in FIG. 14B, to maximize the number of cells 1461 in series, and thus keep the current low and the wire sizes reasonable, having each secondary concentrator 1465 concentrate onto one cell 1461 allows each cell 1461 to be soldered to its own short section of copper pipe 1462, and these sections of copper pipe can be linked together by short sections of insulating pipe 14622. Each short section of copper pipe 1462 can have a flattened area 14621 to allow easy soldering of its cell 1461.

Note that in 14B and subsequent depictions, the secondary concentrators are rough illustrations and not engineering drawings. The details of calculating ideal shapes for a given non-imaging secondary concentrator are well known in the art, and compound parabolic curves provide sufficient concentration for these uses of reflective secondary concentrators.

If the cells are attached to a cooling pipe made from a thermally-conductive but electrically-insulating material (such as aluminum nitride), then the cells can be shingled in series on the pipe. In such cases it is preferred to use a long, curved, non-imaging secondary concentrator in the high-concentration direction to achieve a concentration of roughly 150× in this direction, elimination the need for a secondary concentrator in the low-concentration direction or allowing a simple flat non-imaging concentrator to be used in that direction to minimize the need for bypass diodes (as taught earlier in the present application).

With a sheet of plywood having an area of roughly 3 square meters and a concentration of 1000 suns and 85% optical efficiency, 25 cells will thus be in series for each sheet of plywood for a maximum power-point voltage of roughly 65 volts. A number of such sheets of plywood can be placed in series to achieve higher voltages for more efficient conversion to AC power. The current generation of multi-junction cells should allow achieving around 900 watts per sheet-of-plywood-sized unit, and with the next generation of cells, output should approach a kilowatt.

Since this family of embodiments is targeted for residential installation, the heat from cooling the cells can be used for heating domestic hot water. The cooling systems of several such sheet-of-plywood-sized units can also be linked in series to reach a single cooling means that does not shade the mirrors, or to be used for residential heating in a cold climate, or for any other purpose for which low-grade heat is useful.

Twelfth Family of Preferred Embodiments:
Achieving High Concentration of Solar Energy with One-Axis Trackers Tracking multiple mirrors in two axes adds a great deal of complexity and considerable cost to solar energy systems. A twelfth family of preferred embodiment of the present invention therefore capitalizes on the seasonal movement of the sun being restricted to a narrow angular range to remove the tracking of the primary mirrors or lenses in the North/South direction.

The tracking in one dimension can be traded for lower concentration in that dimension, but if the receiver is allowed to move in that dimension, significant concentration can still be achieved. Instead of moving the receiver for fine adjustment of the tracking, as taught earlier in the present application, the lateral movement becomes the only tracking in that dimension. With the seasonal slant variation of ±23 degrees, 5× concentration is achievable with lateral movement of the receiver alone, and while using mirrors that do not curve in this direction decreases this to around 3× in a practical system, a non-imaging secondary concentrator can increase this to 10× or even higher.

Figure 15A:
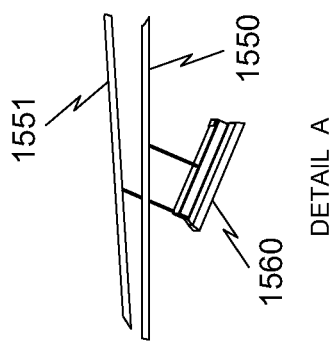
FIG. 15A is a depiction of a multi-trough two-axis concentrating system for solar energy that uses rotation of a primary concentrator for tracking on one axis and translation of receiver for tracking on the other axis.
Figure 15A:
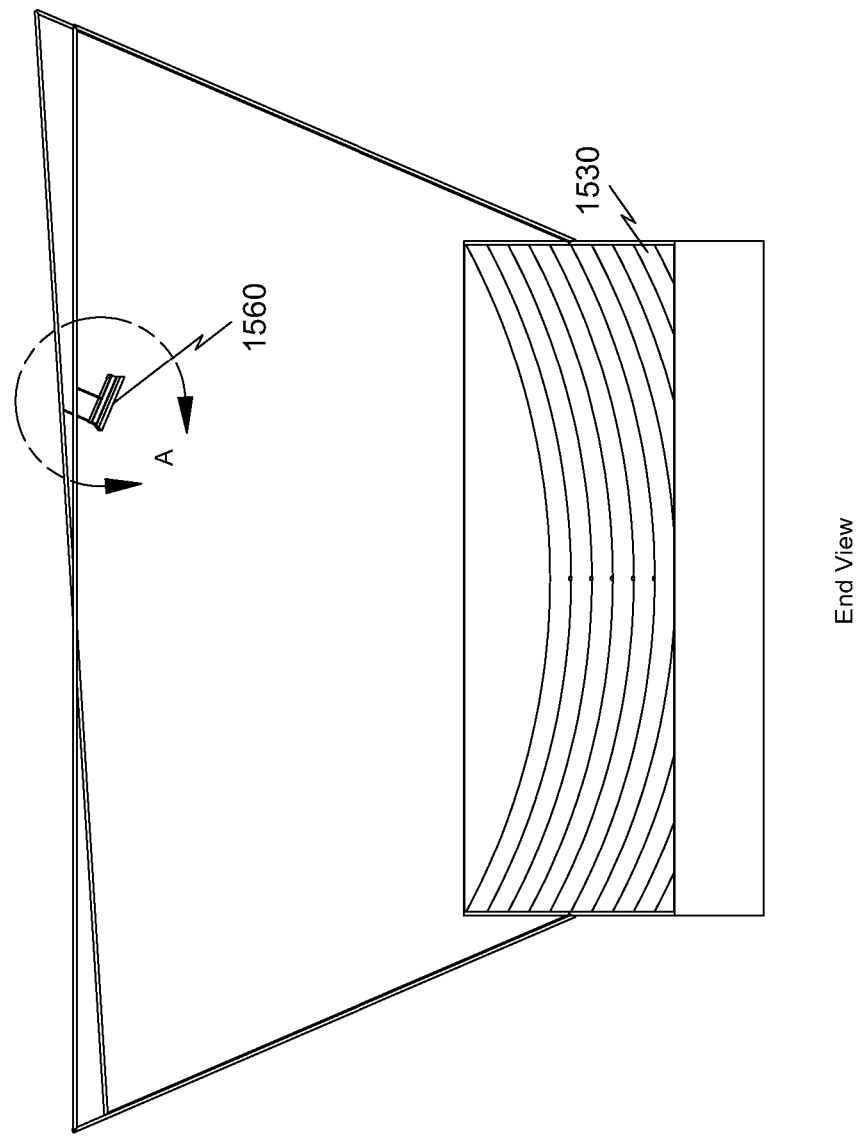

As shown in FIG. 15A, when applied to the small-tracker heliostat system of the previous family of preferred embodiments of the present invention, this significantly simplifies the mechanics of tracking the mirrors 1530 because they only have to rotate in one dimension, and moving one receiver 1560 in the other direction is much simpler than rotating many mirrors 1530. Some additional complexity is needed in the receiver, however. In order for the non-imaging secondary concentrator to significantly boost the concentration in the low-focus direction (which is now the North/South direction), the secondary itself must rotate, preferably by a full +/−23 degrees seasonally. This can be accomplished by rotating the whole receiver 1560 by attaching the middle of the receiver to a straight support 1550, and the south end to support 1551 that curves downward to the south and upward to the north, so that as the receiver slides to track the sun, it is automatically rotated to the correct angle.

But rotating the whole receiver 1560 would move some of the cells farther away from the mirrors and some of the cells closer, which would greatly degrade the concentration in what is supposed to be the high-concentration direction, so this embodiment is not preferred with the translational tracking in the high-concentration direction. Simply using a Fresnel mirror in the translational tracking direction and a fixed-focal-length curved mirror in the rotational tracking direction does not achieve high enough concentration to be worth-while either, due to the large change in the cosine of the angle at which the light must be reflected while tracking. In fact a simple non-heliostat trough can achieve a higher concentration than these embodiments.

If the mirrors are curved in the rotational tracking direct using an adjustable focal length means such as the parabolic folds taught earlier in the present application, then concentration higher than a simple trough can be achieved. However the mirrors do not all get their focal lengths adjusted in a simple pattern, and while for large troughs each trough could economically be given its own focal-length adjustment control means, this would add too much complexity and cost to be optimal for small trough. There is thus a need for a means to adjust multiple heliostat trough focal lengths with a simple control.

Adjusting the focal length of a parabolic-fold trough is easy—one simply changes the angle at which all of the 'sleeves' that shape the trough are folded. Since all angles change by the same amount, a single control rod attach to a trough's sleeves can change the angle of each of them by the same amount. But each trough not only needs a different focal length from other troughs at any given time, but also needs that focal length adjusted at a different rate from other troughs as the troughs rotate to track the sun. The troughs do, however, rotate at the same rate to track the sun and can thus be controlled by a single rotation control mechanism (e.g. a shared drive chain).

If each trough has a stylus rigidly attached to one sleeve, that stylus will trace an arc as the trough rotates to track the sun. If the stylus is confined between a pair of guide rods that are substantially an arc curved in the direction of rotation, then the stylus will follow between the guide rods as the trough rotates. If the guide rods are also curved in the direction of the trough, the stylus will follow this curve as well, thus slanting the sleeve that it is attached to by an angle whose sine is equal to the distance that the guide rods have curved in this direction divided by the distance of the guide rods at that point to the closest point on the parabolic fold that the sleeve pivots around.

Since all of the sleeves on a trough will be connected to a shared control rod, the troughs rotation is thus converted into a change in the focal length of the trough. Although a different curve is needed for the guide rods for each trough of a heliostat, each curve is easy to calculate based on the focal length needed as a function of the rotational angle of a given trough. This is especially important for small-trough heliostats which share sensing and rotational mechanisms among multiple troughs, and thus forms an exemplary embodiment for reaching high or very high concentration in a small-trough heliostat system.

Figure 15B:
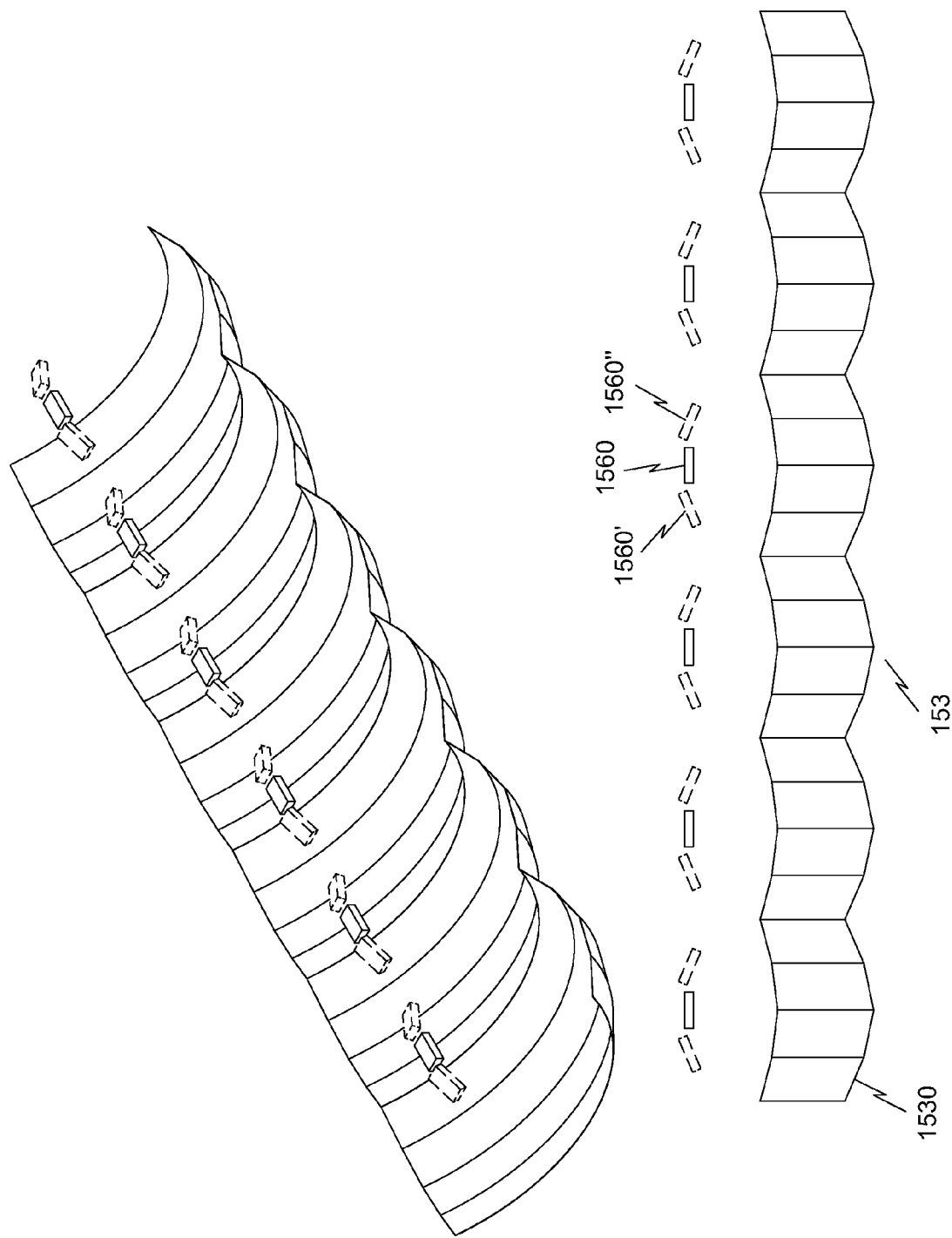
FIG. 15B is a depiction of a segmented-trough two-axis concentrating system for solar energy that uses rotation of a primary concentrator for tracking on one axis and translation of receiver for tracking on the other axis.
Figure 15C:
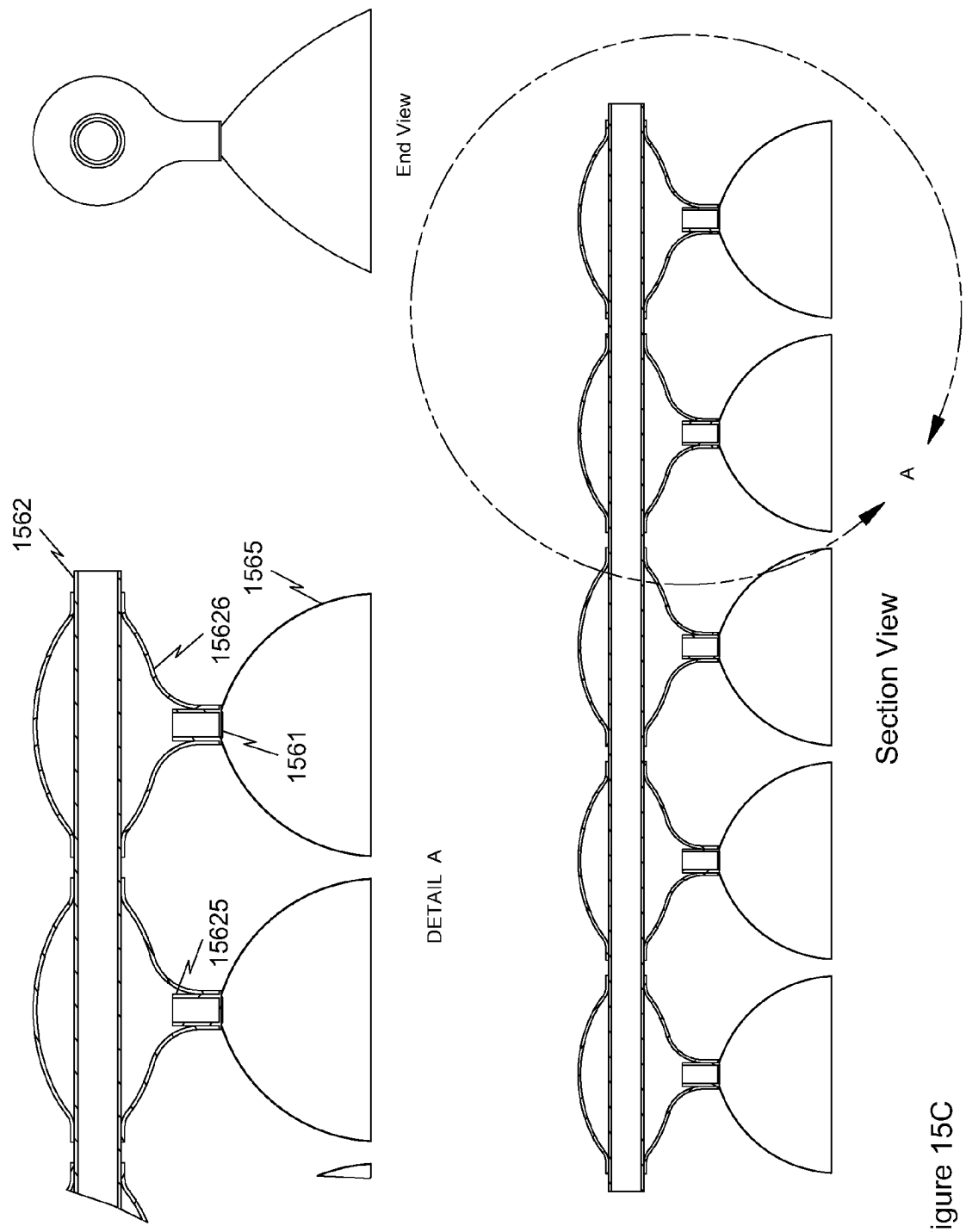
FIG. 15C is a depiction of a receiver for a two-axis concentrating system for solar energy that uses rotation of a primary concentrator for tracking on one axis and rotation of multiple secondary concentrators for tracking on the other axis.

As shown in FIG. 15B, some of the principle of receiver motion along the axis of a translation of a trough can also be applied to a segmented trough mirror 153 that tracks only through East/West rotation to focus on a set of receivers that moves with the trough. Multiple mirror segments 1530 focus just as the rows of mirrors did in the previous embodiments of this family, and lateral North/South shift of a receiver 1560 tracks a region of low N/S concentration. Receiver supports the induce rotation with lateral movement (such as those of FIG. 5A) could also be used. With a large, robust trough, no protective glass is needed and the optical efficiency can be higher and the cost lower. Furthermore the simpler-but-less-effective translational (sliding) tracking is now in the low-concentration direction, making this a more preferred embodiment.

Instead of rotating the whole receiver, as shown in 15C it is preferable to put each cell 1561 on a copper plug 15625 in a flexible heat pipe 15626, with each cell 1561 having its own secondary concentrator 1565. During translational tracking the secondary concentrator 1565 is rotated in the North/South direction, in this case along with the cell 1561 itself through flexing the heat pipe. The other end of the heat pipe 15626 surrounds a copper cooling tube 1562 that is common to all of the cells in a receiver. Because a heat pipe can be extremely effective in transferring heat, such an arrangement also work well for achieving high temperatures and high efficiency in solar thermal systems. Note that although all the heat pipes in a receiver can be formed as a single entity, the heat pipes should be sealed from one another so that heat transfer fluid cannot migrate between them, or some heat pipes might run dry which could irreparably damage the receiver. Rotating the individual secondary concentrators keeps the cells from being moved from the area of maximum concentration, and hence this embodiment is even more preferred.

For secondary concentrators 1565 that are taller than they are wide, a gap must be left between them because rotating them will pack them together. Even for a due north-south trough mirror 153 with an at-latitude slant, this gap must be at least 1−cos(23) times the distance between cells, or 8% of the cell-to-cell distance, and for troughs that are not at at-lattitude slants, the gap must be bigger due both to asymmetry and to cosines changing faster at larger angles.

As shown in 15D, however, asymmetric secondary concentrators 1561' can have a non-vertical gap that greatly reduces the loss of optical energy through the gap. As the sun's direction moves to the left and right of the figure seasonally, the secondary concentrators rotate so that the sun never shines through the gaps between them (and the asymmetric shape makes rotating all secondary concentrators 1565' by the same amount with control rod 1551' even simpler). As the rotation packs the secondary concentrators together, they nest, as can be seen in the bottom view. Note that for illustration the slant of the sides that allows the nesting is greatly exaggerated in this bottom view. With little or no energy lost to the gap, this embodiment is still more preferred.

Figure 15D:
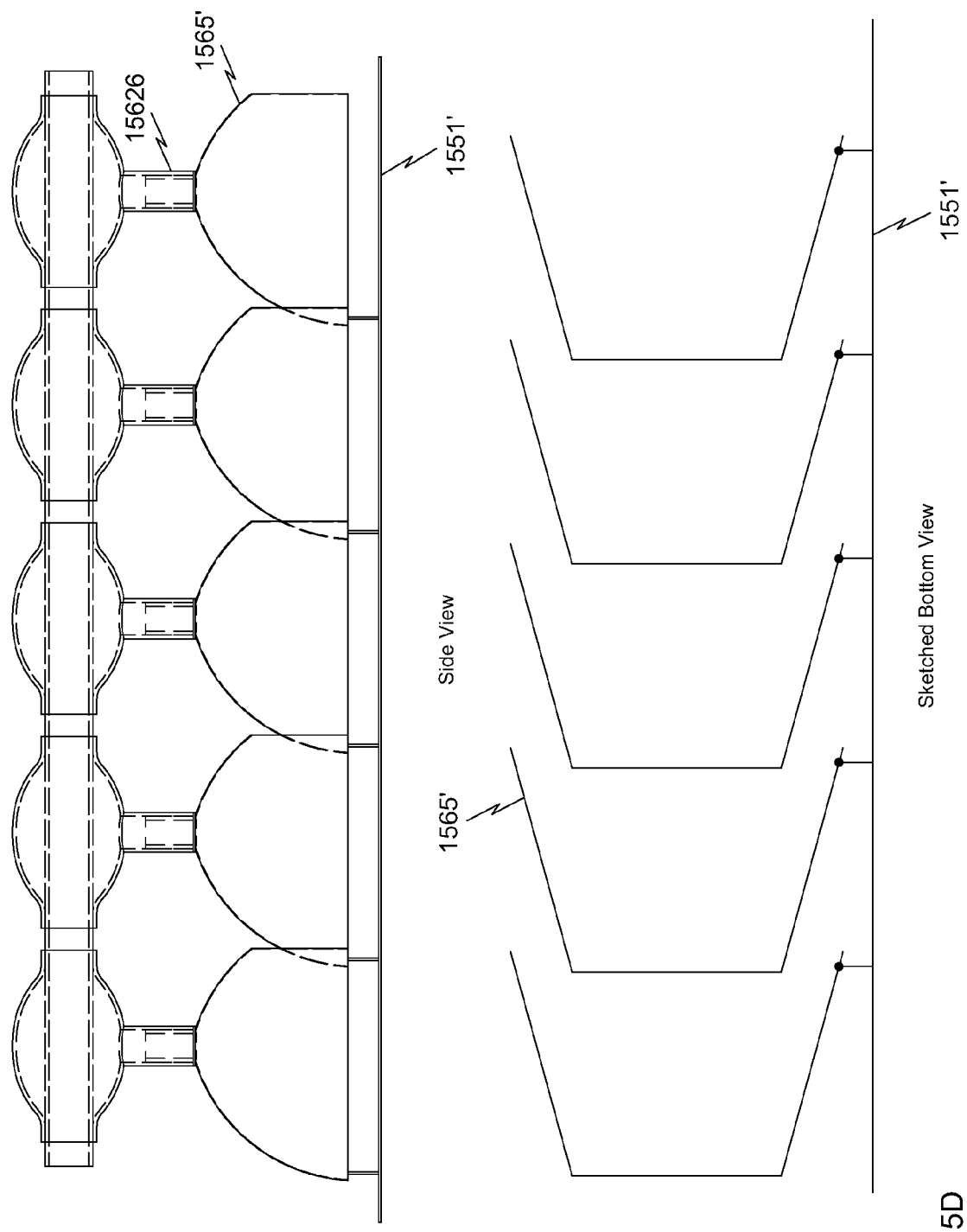
FIG. 15D is a depiction of an optimized asymmetric secondary concentrators for a two-axis concentrating system for solar energy that uses rotation of a primary concentrator for tracking on one axis and rotation of multiple secondary concentrators for tracking on the other axis.
Figure 15E:
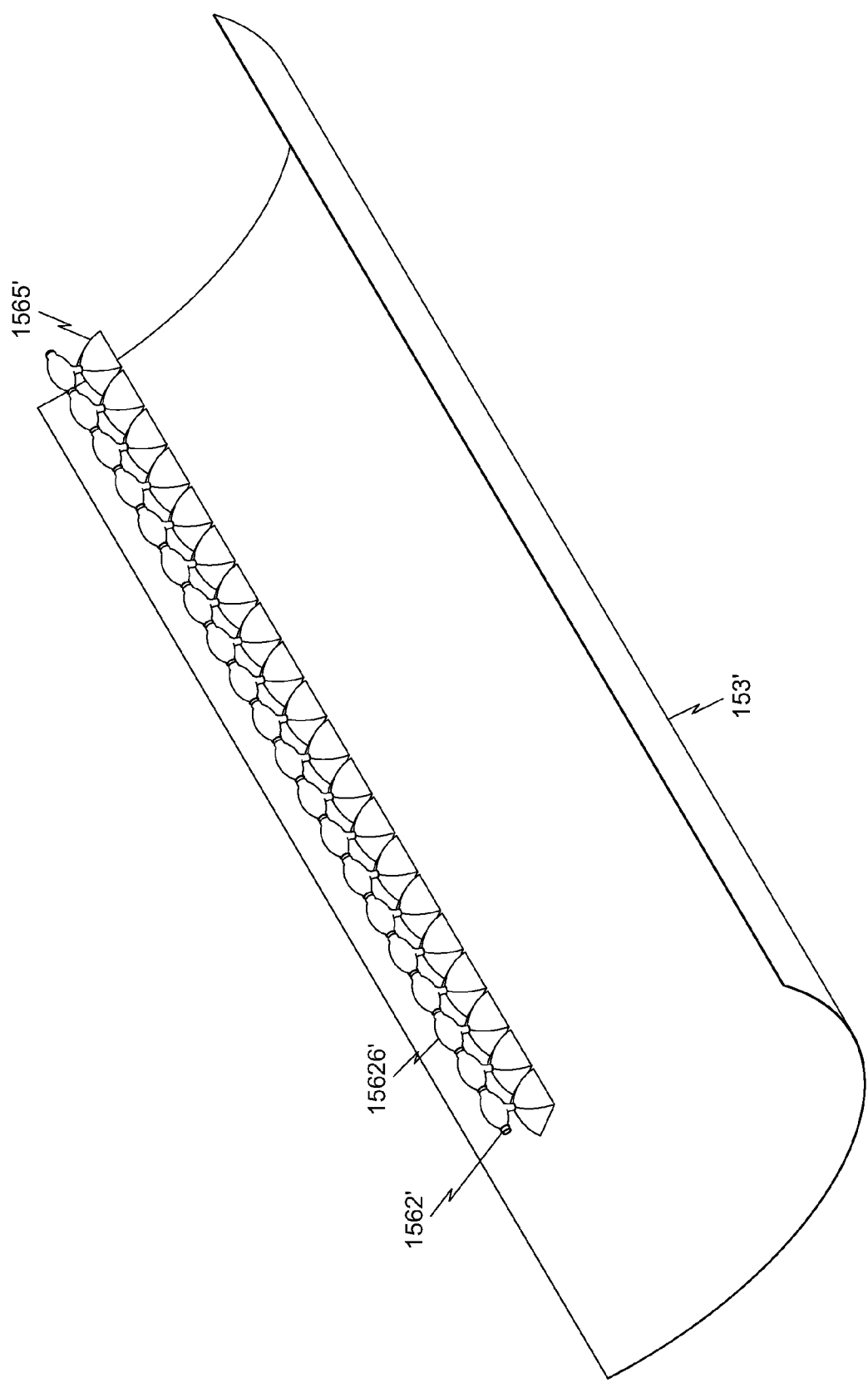
FIG. 15E is a depiction of an un-segmented-trough two-axis concentrating system for solar energy that uses rotation of a primary concentrator for tracking on one axis and rotation of multiple secondary concentrators for tracking on the other axis.

But rotating individual secondary concentrator allows simplifying the above trough design considerably. An unsegmented parabolic trough is less expensive than a segmented trough, and if a straight parabolic trough is tracked perpendicular to the length of the trough, it always focuses on to a continuous focal line that is the same height above the trough. As seen in FIG. 15E, rotating individual secondary concentrators 1565' that concentrate significantly along the length of a trough 153' can be placed to greatly concentrate the light in that direction.

Furthermore because focusing the light across the trough does not alter the sun's rays in the direction of the length of the trough, the sun still has an optical diameter of roughly ½ degree in that direction, and a non-imaging concentrator could theoretically achieve over 200× concentration in that direction. And the rotation of the cell by ±23 degrees only moves the ends of the cell by sin(23)/2 times the cell width, or 2 millimeters for a full-sized high-efficiency cell. This does reduce the focus across the trough, but even at a 22.5-degree rim angle for the trough the reducing is only by a factor of 1+SQRT(2)*Sin(23)/2, or 1.28×, so a trough and tracking system capable of the 70×-80× concentration typical of linear-focus solar troughs would still be capable of 55× concentration across the trough. Therefore this simple parabolic-trough collector that requires tracking the trough in only one direction and uses uniform rotation of small secondary concentrators in the other direction is capable of achieving extremely high concentration, and is an especially preferred embodiment.

Figure 15F:
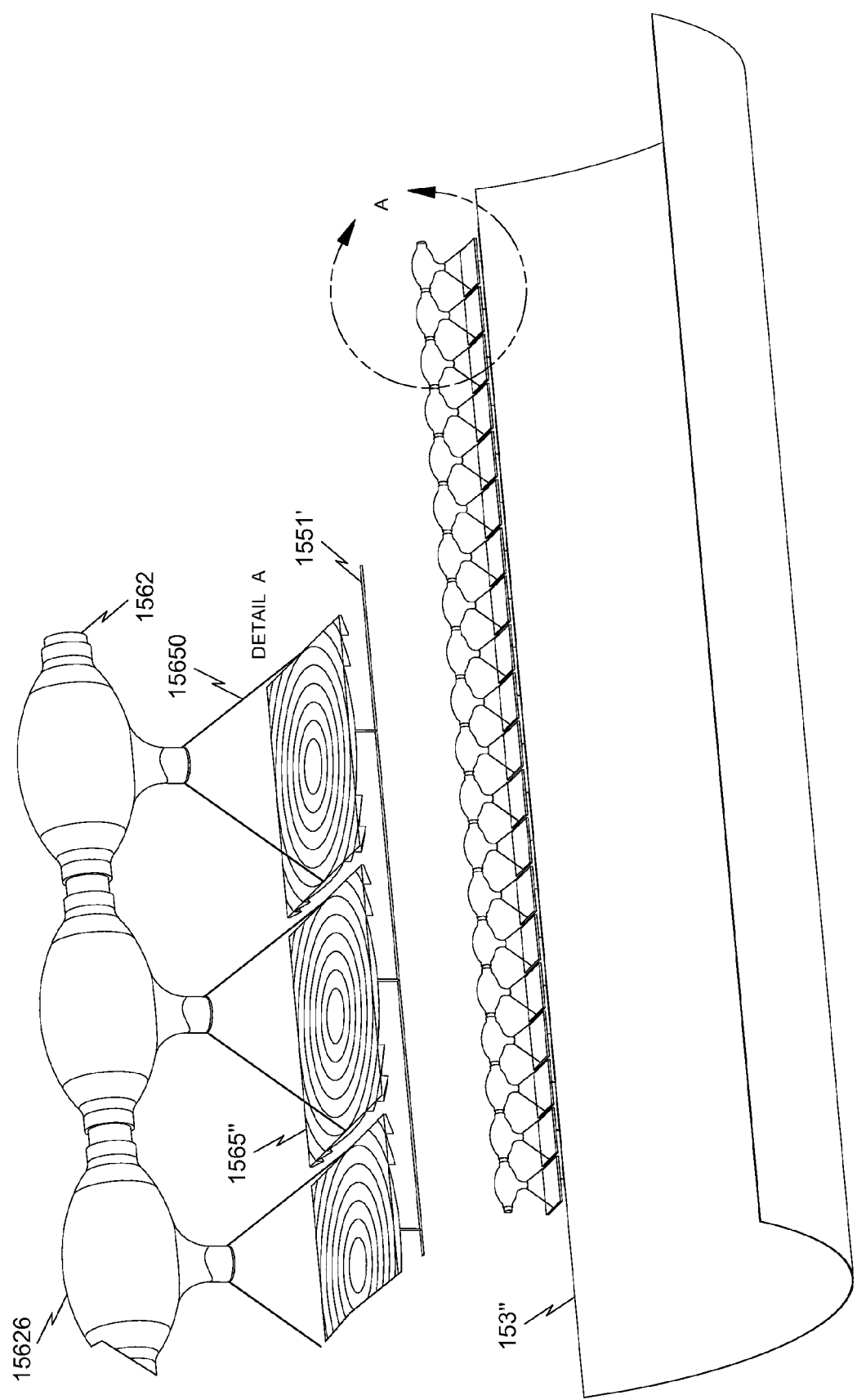
FIG. 15F is a depiction of an un-segmented-trough two-axis concentrating system for solar energy that uses rotation of a primary concentrator for tracking on one axis and rotation of Fresnel lens secondary concentrators for tracking on the other axis.

A reflective non-imaging secondary concentrator is quite deep compared to its concentration and the width of the cell it concentrates onto, so if the desired total concentration requires more than 5× concentration along the trough, either a very deep secondary concentrator or a very narrow cell would have to be used. But as shown in FIG. 15F, a flat Fresnel lens 1565" can concentrate sunlight 20×-25×, which is enough to reach roughly 1000 suns, before its losses rise unacceptably, and a curved Fresnel lens can reach a concentration of up to around 1500 suns. Fresnel lenses can have much shorter focal lengths than the depth that a reflective non-imaging concentrator would need.

The mechanics of this embodiment as shown in FIG. 15F are very similar to those of 15E, with the lenses 1565" replacing the reflective non-imaging secondary concentrators 1561' of FIG. 15E. The lenses 1565" are attached to the cell assemble by stays 15650, and if there are stay in the direction of the seasonal movement (along the length of the trough), pivoting the lenses also pivots the cells on the flexible heat pipe. Alternatively stays only perpendicular to the direction of movement will allow the lenses to pivot around the cells without the cells moving, allowing a rigid heat pipe to be used.

Since the lens 1565" itself will be exposed to some concentration from the trough, it should be made of either a heat-resistant plastic or preferably glass. The size of the lenses needed can be small enough that regular (as opposed to Fresnel) glass lenses could be used, and for small cells, and thus thin lenses, these would have lower losses than Fresnel lenses. Multi-junction cells can suffer from chromatic aberration, and while reflective optics do not produce chromatic aberration, imaging refractive optics such as lens do. Lens 1565" could be a non-imaging Fresnel lens, or the secondary lens could concentrate less and a non-imaging reflective tertiary concentrator could be used to boost the concentration. These both form exemplary embodiments.

Figure 15G:
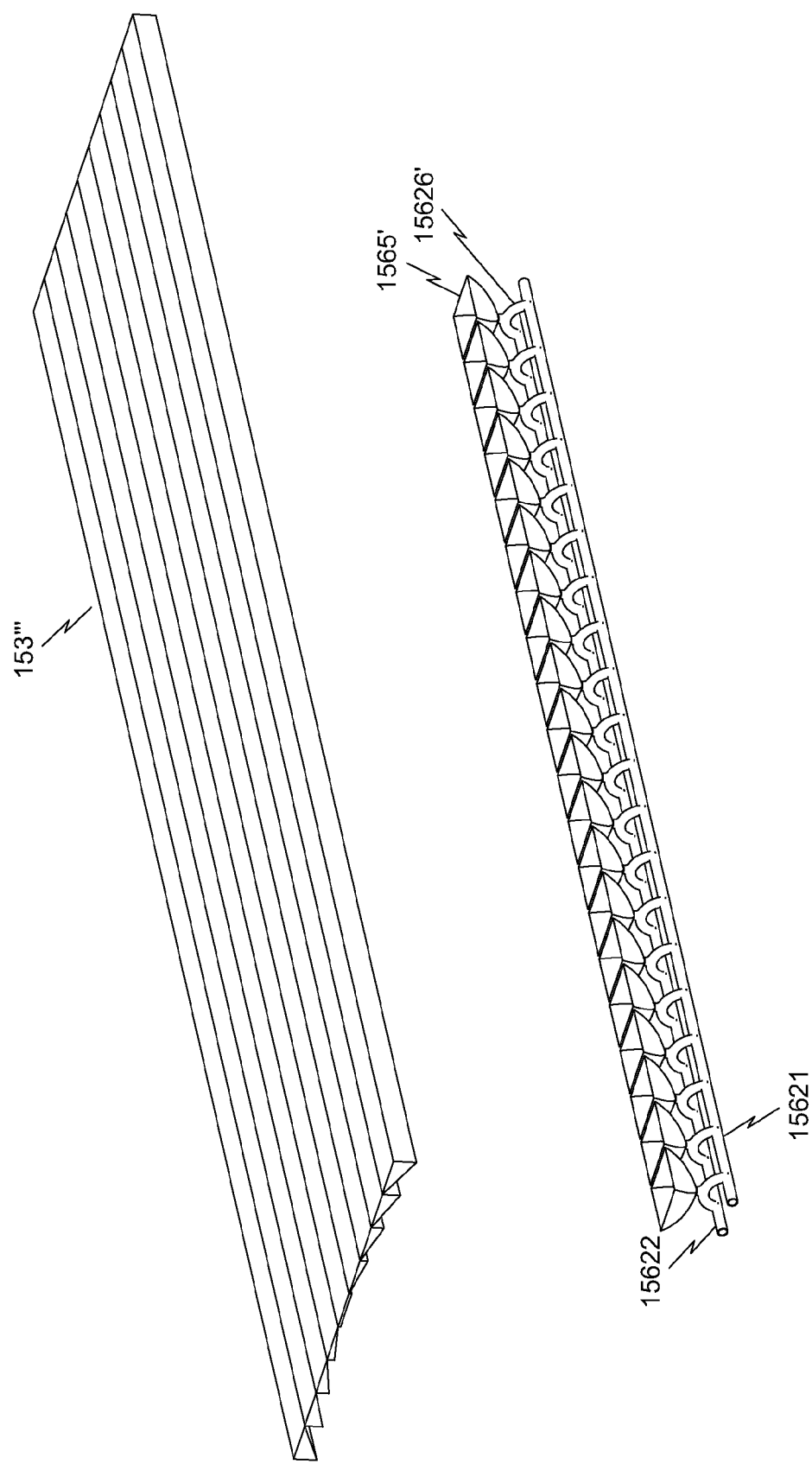
FIG. 15G is a depiction of a two-axis concentrating system for solar energy that uses rotation of a Fresnel lens primary concentrator for tracking on one axis and rotation of secondary concentrators for tracking on the other axis.

As seen in FIG. 15G, a low-cost linear Fresnel lens 153''' can even be used as a primary concentrator, with non-imaging secondary concentrators 1565' used for concentrating in the second direction. But normal heat pipes cannot be used to cool the cells because heat pipes rely on gravity for returning condensed cooling fluid to the heat source, and wick-based heat pipes are considerably more expensive. Since cooling pipes below the cells do not block light, circulating coolant is used instead. Fluid (typically a water/glycol mixture similar to automobile antifreeze) passes from an inlet pipe 15621 through a flexible 'U'-shaped pipe 15626' with a cell on a short copper pipe in the middle of the flexible pipe. The flexible pipe allows a control rod (not shown) to rotate the secondary concentrators as was shown in FIG. 15D.

Both the primary and secondary concentrators can also be Fresnel lenses at a small cost in optical efficiency. This is an especially preferred embodiment for smaller troughs in rooftop-mounted residential system because the Fresnel lens primary concentrator protects the electronics and the moving parts, reducing both shock hazards and maintenance. The heat from cooling the cells will also typically be useful for domestic hot water heating, and will often useful for residential heating in colder climates or driving absorption chillers in warmer climates.

Alternatively, the primary concentrator can be a linear Fresnel mirror, with flat mirror segments or fixed-focal-length curved mirror segments. Even a linear Fresnel mirror primary concentrator comprising adjustable-focal-length mirrors becomes a preferred embodiment when the mirrors are big enough to be worth having a separate control means for adjusting the focal length of each mirror segment individually.

Linear reflective Fresnel concentrators provide the most scalable mechanism for building a focusing trough, but the prior art has been limited to moderate focusing in one direction, which has in turn limited receiver temperature and thus thermodynamic efficiency for solar thermal systems and has precluded the use of expensive high-efficiency cells for photovoltaic systems. The adjustable focal length troughs as taught above for small-trough heliostats can also be applied to linear Fresnel reflectors to allow a relatively limited number of wide reflectors to obtain as high concentration as a sea of narrow troughs or flat mirrors could. This raises the practical limits of the primary focusing from around 20×-30× to around 50×-60×, and with fewer reflectors used.

For still higher focusing, the use of rotating secondary concentrators as describe above can then be applied to the linear focus from the primary concentrator. Because none of the geometric focusing ability along the trough will have been spent (imperfections in the trough can still reduce this focusing ability) the secondaries can theoretically still concentrate by up to 200× if non-imaging concentrators are used, or even higher if refractive non-imaging concentrators are used.

Although it might appear as if the extra concentration in the primary direction were thus superfluous, not only does the higher primary concentration bring the concentration needed in the second direction to reach 1000 suns to within the range of efficient concentration with Fresnel lenses, but it also simplifies non-imaging reflective secondary concentrators. The depth of a compound parabolic curve scales approximately with the square of the amount that it concentrates, and so even a doubling of primary concentration allows a four times shorter compound parabolic curve secondary concentrator to be used for the same total concentration and cell size.

Large linear Fresnel concentrators are also typically built with the trough axes parallel to the ground rather than at at-latitude slant, and this make tall secondary concentrators more problematic because a receiver's slant relative to the primary focus ranges seasonally from latitude-slant-23 degrees and latitude-slant-23 degrees. For at-latitude troughs, the cosine of the slant ranges from 1 to 0.92, for an 8% decrease in the cosine factor, while a receiver 23 degrees off of at-latitude, the cosine of the slant ranges from 0 to 0.69 for a 31% decrease in the cosine factor, and for a receiver 45 degrees off from at-latitude, the cosine of the slant ranges from 0.93 to 0.37, for a 2.5 times change in the cosine. Although the asymmetric secondary concentrators as taught above to eliminate light loss through gaps between secondary concentrators can be pushed to cover such dramatic changes in cosines, it gets increasingly awkward to do so, especially for very tall concentrators.

Thus a linear reflective Fresnel primary concentrator with rotating secondary concentrators forms an exemplary embodiment when high concentration is needed, and a linear reflective Fresnel primary concentrator comprising adjustable-focal-length troughs, with rotating secondary concentrators, forms an exemplary preferred embodiment when very high concentration is needed, and having those rotating secondary concentrators be Fresnel lenses (or, for sufficiently small narrow primary foci, solid lenses) is especially preferred for troughs whose axes of translation are installed significantly off from at-latitude slant.

It should be noted that the earlier-taught art of having different trackers focus on different concentrated solar energy receivers at different times can also be applied to linear Fresnel concentrators and Fresnel trough concentrators, with or without secondary concentrators.

Figure 15H:
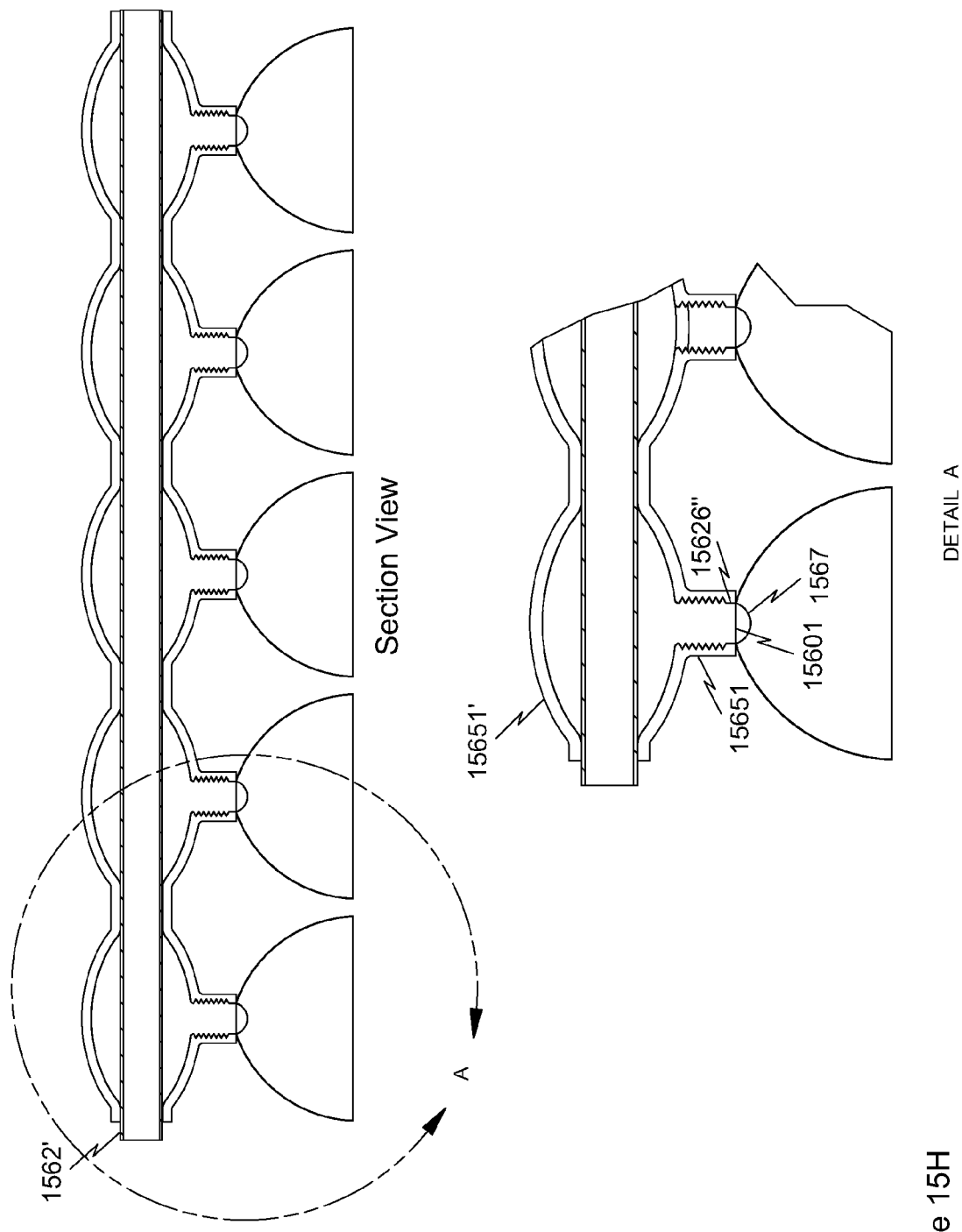
FIG. 15H is a depiction of receiver for a two-axis concentrating solar thermal system that uses rotation of a parabolic trough for tracking on one axis and rotation of secondary concentrators for tracking on the other axis, and that does not need a large, fragile vacuum-insulated glass receiver tube.

For solar thermal systems, the above embodiments can reach much higher concentration than a traditional trough collector, which reduces thermal losses to where a significantly higher temperature and thus more efficient conversion to electricity can be used. In addition, as shown in FIG. 15H, the long, fragile and expensive vacuum-insulated receiver glass tube can be eliminated as well. Because the heat pipe 15626" conducts the heat from a tiny heat absorbing area 15601, the heat pipe 15626" can be wrapped with flexible insulation 15651 and the common heat transfer pipe 1562' can be wrapped with insulation 15651' (which may be the same as 15651), with only the tiny absorber area at each focus poking through. If vacuum insulation of even these tiny absorber areas is desired, a glass vacuum dome 1567 over each heat-absorbing area receiver area is far less expensive and far less fragile than a several-meters-long glass vacuum tube of traditional solar thermal trough systems, as well as having less area to re-radiate heat. For the very high temperatures of such solar thermal systems, the flexible heat pipe 15626" can be pleated metal (similar to a flexible drinking straw). Nesting secondary concentrators are preferred, but for clarity are not shown.

The reduced absorber area and heat pipes not conducting heat downward very well will greatly reduce the heat loss at night as well, making a molten salt heat transfer fluid more practical than it usually would be for a solar thermal system. Even if the heat transfer fluid is circulated continuously to keep it from freezing in the piping, the lower heat loss would reduce the cost of this. The heat will also be low enough for a resistance heater in the piping, similar to that used for de-icing power lines or keeping water pipes from freezing, to allow the shut-down and restart of circulation if needed.

Unless thin insulation 15652 with a very high thermal resistivity per unit thickness (such as aerogel insulation) is used, sufficient insulation thickness to reduce heat loss to an acceptable level may block an un-acceptable amount of light. In such cases, an off-axis parabolic trough mirror can be used to keep the long insulated heat transfer pipe 1562' with its thick insulation 15651' from shading the primary mirror. Off-access concentrators are also preferred when secondary concentrators would block a significant amount of light from reaching the primary concentrator. For typical cells sizes, and for thermal receivers of comparable sizes as well, Fresnel or reflective secondary concentrators will be large enough to make off-axis primary concentrators more preferred embodiments (solid refractive elements can be optimized to be small enough to make on-axis primary concentration preferred, as on-axis concentration can reach almost twice as high a primary concentration and slightly higher concentration even with a non-imaging secondary concentrator).

When an off-axis primary concentrator is used to avoid a secondary concentrator or a receiver from shading its primary concentrator, at some sun angles that secondary concentrator or receiver my shade a primary concentrator other than its own primary concentrator. A less-dense primary concentrator packing may avoid this for troughs whose axis of translation runs substantially East/West, but due to the sun moving through a much larger angle daily than seasonally, most one-axis primary concentrators have theirs axes of translation running North/South. In such case, it is preferred to pick the side to which off-axis primary concentrator concentrates so that the shading occurs at a time of lesser demand. For example, when there is an afternoon energy demand peak, an off-axis primary concentrator should focus to the West of the trough. This is most effective for primary concentrators whose focal length is shorter than the East/West distance between primary concentrators, although a small gain can also be had for primary concentrators whose focal length would cause the secondary concentrator or receiver to go between two nearby troughs in the late afternoon.

In all of the examples of this family of embodiments where a non-imaging secondary concentrator is used, the secondary concentrator can also boost the concentration in the high-concentration direction, especially if the rim angle in that direction is relatively shallow. However with even an imaging Fresnel lens secondary concentrator being able to fairly efficiently provide 20× concentration parallel to the axis of the trough, secondary concentration in the direction of the primary concentrator is not necessary even to reach 1000 suns total concentration.

Figure 15I:
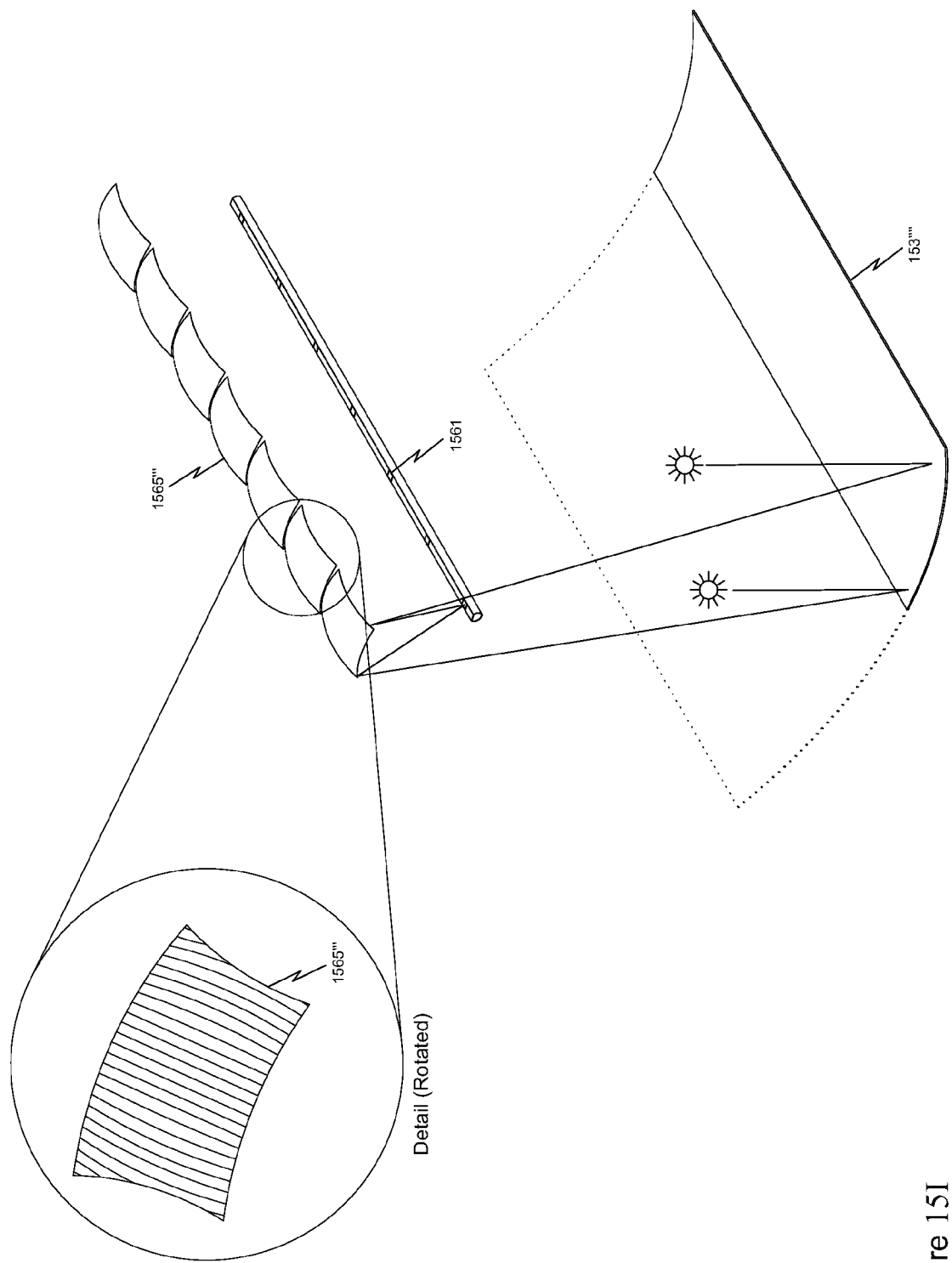
FIG. 15I is a depiction of receiver for a two-axis concentrating solar energy system that uses rotation of a parabolic trough for tracking on one axis and rotation of short-focal-length reflective secondary concentrators for tracking on the other axis.

A secondary concentrator may even lower the concentration in the primary concentration direction. Reflective optics (mirrors) generally have higher optical efficiency than refractive optics (lenses), but the reflective secondary concentrators discuss above have long focal lengths relative to their concentrating power, which makes them larger, more expensive and more fragile. A short focal length reflective secondary concentrator beyond the receiver can concentrate with a shorter focal length. Such a concentrator can be a non-imaging concentrator, or, as shown in FIG. 15I, can even be an imaging concentrator such as a modified paraboloid 1565'''. To prevent the secondary concentrators 1565''' from shading the primary concentrator trough 153"", the primary concentrator trough 153"" can optionally be made off-axis as is shown. From the perspective of the primary concentrator 153"", secondary concentrators 1565''' are beyond the cells 1561, but are closer to than the focus of the primary concentrator 153"". Thus the sun's rays are still slightly under-focused when they reach the secondary concentrators 1565''' and are reflected back toward the cells 1561. The underfocusing is calculated so that the light from the primary concentrator will be fully focused in the primary concentration direction when it reaches the cells 1561.

Each secondary concentrator 1565''' is approximately a tiny parabolic trough perpendicular to the primary concentrator trough, with a focal length equal to the distance to that secondary concentrator's cell. However this causes the ends of each secondary concentrator 1565''' to bend toward the primary concentrator 153"", which shortens the optical path length to the cell via those ends by the amount that they are bent toward the primary concentrator. To correct for this, as the ends of secondary concentrator bend up, they must also curve slightly on the opposite axis, with the amount of curvature such that this additional focusing in the direction of the primary focusing makes up for the slightly shorter path length. (For an even finer correction, this upward bend ever so slightly shortens the optical path for focusing in the second direction, which could be corrected by slightly increasing the curvature on the secondary concentrator's trough toward the sides of the secondary concentrator which in turn brings the corners imperceptible closer, etc., but a point of diminishing returns has already been reached).

However on earth the secondary concentrator will slant by seasonally to align with the sun (as taught in the above drawings of this family of preferred embodiments). Even for an at-latitude trough, this +/−23 degree slant moves the ends of the secondary concentrator closer or further to the sun by sine(23)/2 times the length of the secondary concentrator 1565''', which changes the optical path length by twice this or roughly 0.4 times the length of the secondary concentrator.

The effect of this change depends on the ratio of the width and focal length of the primary concentrator to the length of the secondary concentrator. For a primary concentrator width of one meter and a primary concentrator focal length of one meter, each centimeter of movement broadens the focus by one centimeter. Since such an off-axis trough would have a practical focus limit of about two centimeters, using a 5-centimeter wide secondary would broaden the focus in the summer and the winter to four centimeters, reducing the focus in the primary concentration direction by a factor of two to 25×. A very high concentration of 1000 suns can still easily be reached because a substantially parabolic secondary concentrator 1565''' can focus at least 50×, even if it itself is off-axis as shown in FIG. 15I, allowing more than 1000 suns even with the losses from the two reflections.

However a 50× focus from a 5-centimeter secondary would use a cell only 0.1 millimeters wide, and widening this cell would widen the secondary concentrator, which would further degrade the focus in the primary concentration direction unless a wide primary concentrator is used. For large ground-mounted troughs for solar farms, this is not a problem as a several-meter trough is optimal anyway, but for a roof-top system, for which short focal lengths are preferred, this would be problematic.

Thus even for an at-latitude trough, decreasing the sensitivity of the primary focus to the seasonal change in slant of the secondary concentrator is useful. Two or more adjustable-angle parabolic-arc folds can be used to change the curvature of the ends of the secondary as it rotates (as was taught earlier in the present application with changing the focal length of parabolic troughs as they rotate). Note that on the end of the secondary that moves farther away from the cells, the curvature is decreased as the curvature of the other end is increased. Using multiple parabolic-arc folds on each end can reduce the sensitivity of the concentration in the primary direction to any degree needed, allowing both higher primary concentration (and thus lower secondary concentration), and wider secondary concentrators, each of which allows wider cells.

Adjusting the focal length of a single contiguous mirror for each secondary concentrator in the direction of the primary focusing to compensate for the change in path length can thus achieve very high concentration for a trough at at-latitude slant with a rigid but somewhat flexible secondary concentrator mirror. However the change in path length grows for a trough slanted significantly off of at-latitude, reaching a maximum almost twice as large for a flat trough at 23 degrees latitude, and in some cases the secondary concentrator may not be flexible enough to compensate the changes needed.

Figure 15J:
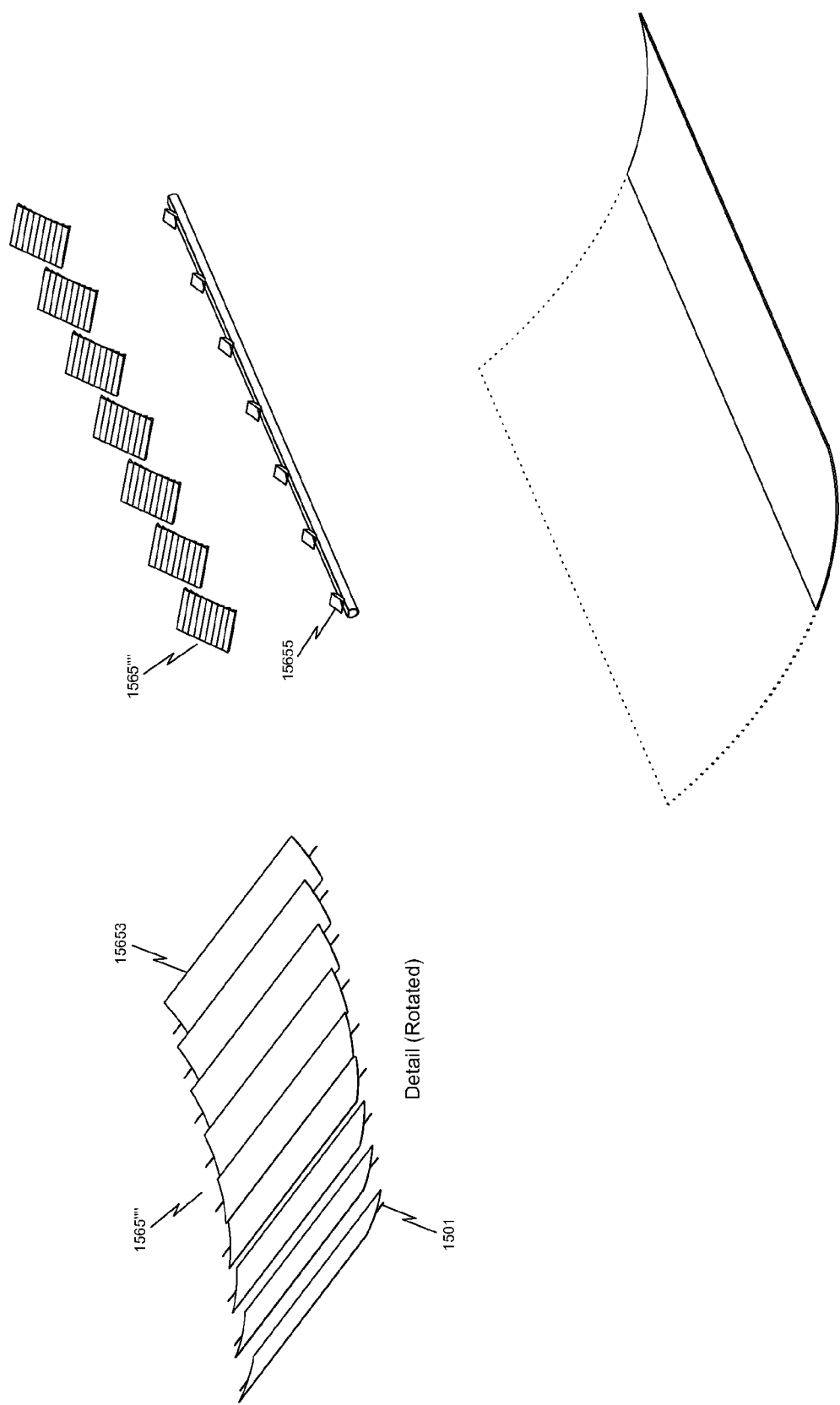
FIG. 15J is a depiction of receiver for a two-axis concentrating solar energy system that the length of a secondary concentrator can be divided a number of segments.

It is also possible to reduce the amount that the ends of the secondary concentrator move toward the primary concentrator during the secondary concentrator's seasonal rotation. As shown in FIG. 15J, instead of a secondary concentrator being a single contiguous mirror, the length of a secondary concentrator 1565'''' can be divided a number of segments 15653. With each segment pivoting around its own axle 1501, it is only the width of each segment 15653 that contributes toward changing the length of the optical path in the primary focus direction, rather than the length of the whole secondary concentrator 1565''''. This results in an especially preferred embodiment in which each secondary concentrator 1565'''' is a segmented linear Fresnel reflector (somewhat similar to that already described in primary concentrator embodiments, but much smaller).

With the focal lengths of the secondary concentrator segments 15653 optimized for near the equinoxes, the broadening of the focal length in the primary concentration direction is divided by the number of segments. Thus using even four secondary concentrator segments 15653 to span a secondary concentrator 1565'''' reduces the broadening of the focus by 75%, allowing a 40× concentration in the primary concentration direction even with an off-axis primary concentrator. More segments can bring the concentration even closer to its practical maximum of near 50 suns, and hence the segmentation of the secondary concentrator eliminates the need for focal-length adjustment of the secondary concentrator in the primary concentration direction.

In even more preferred embodiments, each secondary concentrator segment 15653 is a parabolic trough (this is shown in FIG. 15J). The broadening in the secondary concentration direction is further reduced to the segment width times the cosine of the half the angle of the sun from the equinox direction, or roughly 3% of the segment width. This is insignificant, and so the secondary concentrator troughs do not need to have adjustable focal lengths in the secondary concentration direction either.

The segmented secondary and the adjustable focal lengths could be used together, but since either alone is sufficient to achieve very high concentration, it in generally will not be preferred to combine them. As to which is more preferred, the adjustable focal lengths requires somewhat flexible mirrors curved in two dimensions, which would be affordable in quantity but would have high up-front costs, while the segmented secondary requires more parts but would not require molded or flexible mirrors.

An optional tiny non-imaging tertiary reflector 15655 can also be used, either simply to homogenize the concentration across a cell, or to also increase the concentration if extremely high concentration is needed. This would be similar to the secondary concentrators taught earlier in the present application when the primary concentrator concentrated on two axes, but would preferably pivot to match the angle of light incident into it, as was taught in earlier embodiments of this family of preferred embodiments of the present invention.

Normally a parabolic trough or linear Fresnel lens is placed with its axis of translation running North/South and is rotated from East to West, thus maximizing the solar energy receiver over a day. However for a hand-tracked system using one of the above embodiments of this family of preferred embodiments, the primary concentrator may preferentially be placed with its axis of translation running East/West. Because the sun's seasonal movement is very slow, the system will thus not need tracking over the course of a day even at very high concentration, and can simply be oriented well initially and then manually tracked every few days (or every few weeks near the solstices). Since this is the high-concentration direction, the other direction is less sensitive to tracking, which can be done by manually sliding a control rod to rotate the secondary concentrators every few minutes.

Non-imaging concentrators can have wider acceptance angles than imaging concentrators, and so a non-imaging secondary or tertiary concentrator is preferred. At 25× concentration in the secondary direction, a non-imaging concentrator can have an acceptance angle of over two degrees and only need a tiny adjustment roughly every five minutes. Even with manual tracking in this direction, this is practical for both third-world countries and for recharging batteries on camping trips, thus allowing very high concentration onto high-efficiency cells. When combined with a rollable parabolic-fold primary concentrator such as that taught earlier in the present application, such a system will be extremely portably, very lost cost, and quite efficient. For a photovoltaic receiver, cooling can be provided by simple evaporation of water from a reservoir in communication with the receiver, or the heat can be used for water purification, cooking, etc. If heat is the desired output, then a solar thermal receiver can be used instead.

While many of these embodiments in this family do not require translation movement of the receivers to achieve maximum concentration, a parabolic trough tracked around its axis of translation does lose some energy off its ends due to the seasonal movement of the sun. For a trough at at-latitude slant, the maximum percentage is lost near the summer and winter solstices and is equal to sin(23) times the focal length of the trough divided by the trough's length on its axis of translational. For long troughs this factor is small enough to ignore, but it can be regained quite simply through translational movement of the entire receiver structure along the axis of translation of the trough. For all but the segmented trough, this is entirely separate from all of the motions discussed and may be omitted of added as circumstances dictate. When used, this shift does not need to be particularly accurate, as it does not affect the concentrator except at the ends of the trough.

Thirteenth Family of Preferred Embodiments:
Space-Based Two-Axis Concentration Systems for
Solar Energy While sunlight on earth is intermittent, on a system in orbit above the earth's atmosphere the sunlight is only blocked by the earth's shadow (i.e. night). But here the slant of the earth's polar axis relative to the sun is an advantage, because the earth's shadow is confined to near the plane of the earth's orbit around the sun. This improvement grows with distance from the earth, and a system in geosynchronous orbit is in sunlight roughly 99% of the time (and with even a small number of such systems spaced in such an orbit, the total power available will be nearly constant). Systems in space also have the advantages of no wind, and of gravity being cancelled out by orbital motion, leaving almost no net force on a system.

However space does bring disadvantages: there is no air for cooling; the distance to earth where the power is needed is very large, so systems must be very large for efficient microwave transmission, and the cost of launching mass into space is currently very high. There is thus a need for extremely light weight systems that can be built on extremely large scales and operate reliably in the absence of air for cooling.

High-efficiency cells are used in space due to producing a lot of power per kilogram. However with even with six times as much sunlight in space as in the best locations on earth, space-based systems will need to concentrate at least ⅙ as much as earth-based system to be cost-effective, even assuming system launch costs fall dramatically to become equal to the tracking and foundation costs of earth-based systems. Thus two-axis concentration of at least several hundred fold is required, along with mass-efficient cooling of the cells. Fortunately Fresnel lenses can be made very thin, and mirrors can be made of gossamer-thin materials, making the weight of these concentrating means manageable. Under high concentration the cells themselves are small and light, so it is the shaping means and the cooling that need improvement.

Shaping a flat Fresnel lens is easy because the centrifugal force produced by even a slight spin will stretch the lens flat. Although a spinning lens is effectively a gyroscope, the axis of spin only needs to be reoriented by 360 degrees over the course of an entire year, and with only a slight spin needed this can be accomplished through means such as running current through tethers at appropriate times to use the earth's magnetic field to pivot the lens.

Figure 16A:
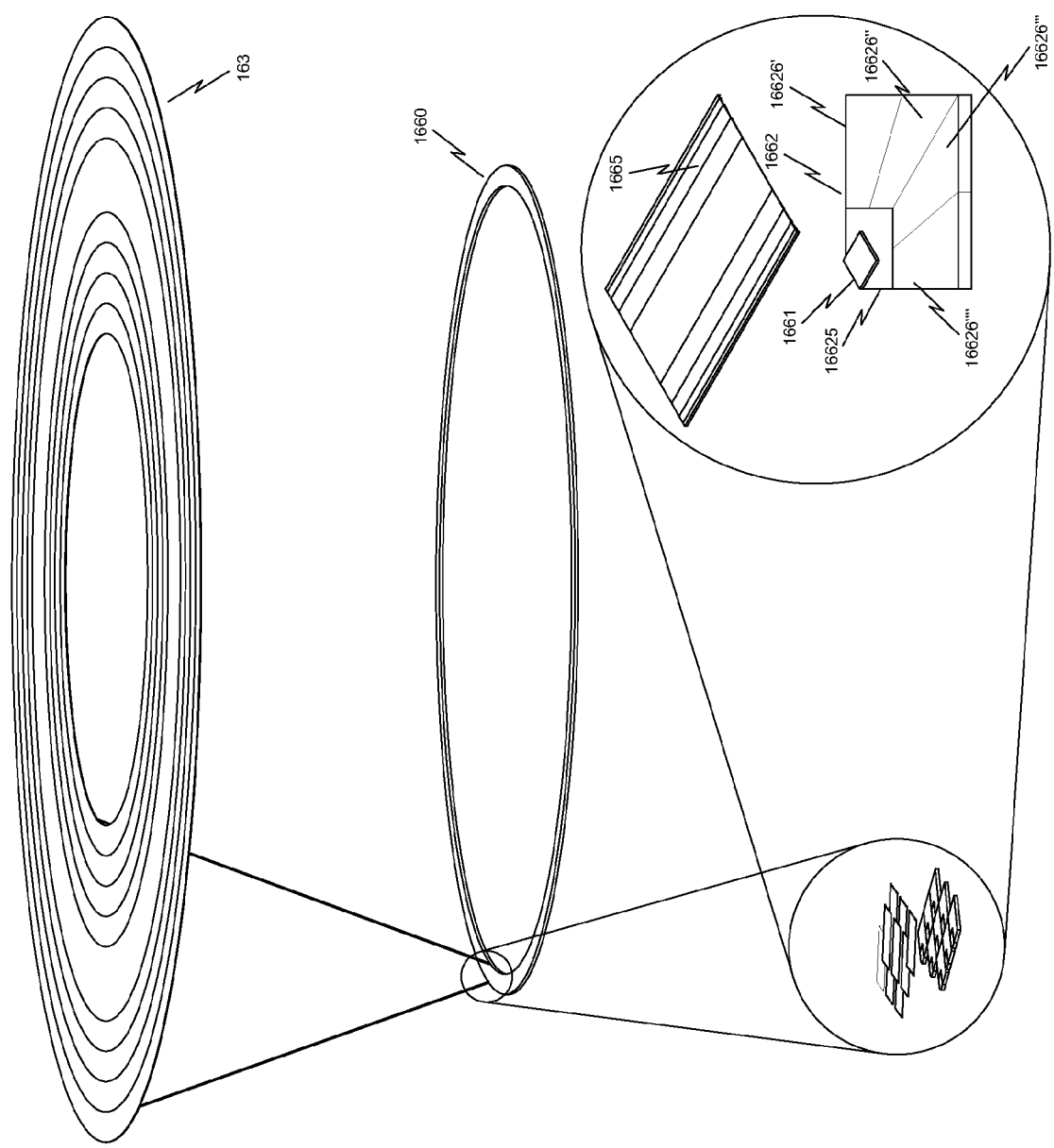
FIG. 16A is a depiction of space-based system two-axis concentration of solar energy onto a receiver that uses a centrifugal-return heat pipe for cooling.

If an annular (ring-shaped) lens 163 focuses at least 20× onto an annular receiver 1660 as shown in FIG. 16A, then multiple secondary concentrators 1665 on the receiver 1660 can concentrate onto individual cells (or sets of cells) 1661 to achieve concentration even over 1000 suns. Heat pipes normally require gravity for the return of condensed fluid, and while wick-based fluid return has been pioneered for space, a wick and sufficient fluid to saturate it would, over the heat rejection area required, add too much mass in total to be practical to launch.

However if each cell (or set of cells) 1661 is at the outer corner of a pouch-shaped heat 'pipe', and the whole receiver is also spun, then when coolant vapor condenses on the inside wall of the pouch, centrifugal force will pull it to the outer corner where the cell 1661 is. Shown in FIG. 16A is an especially preferred embodiment, where to prevent a cell being disabled by a single micro-meteorite punching a single hole in pouch 1662, the pouch can be made of a number separately-sealed of sub-pouches 16626', 16626", etc. A heat spreader 16625 comprising a thin-metal pouch (that presents a much smaller target) and that also use centrifugal force fluid return can distribute the heat to the sub-pouches. Note that because the annular focusing means is only focuses perpendicular to the ring, the secondary concentrators and cells do not have to be aligned at any given orientation around the ring. Because of this, the rotation of the focusing means for stability and the rotation of the receiver ring for heat-pipe condensate return do not have to be at the same rate, but can each be optimized for its own purpose.

A number of concentric annular lenses could be used, each with its own annular receiver. Also, different types of secondary concentrators could be used, with the short-focal-length reflective secondary concentrator shown in FIG. 15I being the lowest mass (and with no seasonal slant, no seasonal adjustment of its shape would be needed).

Figure 16B:
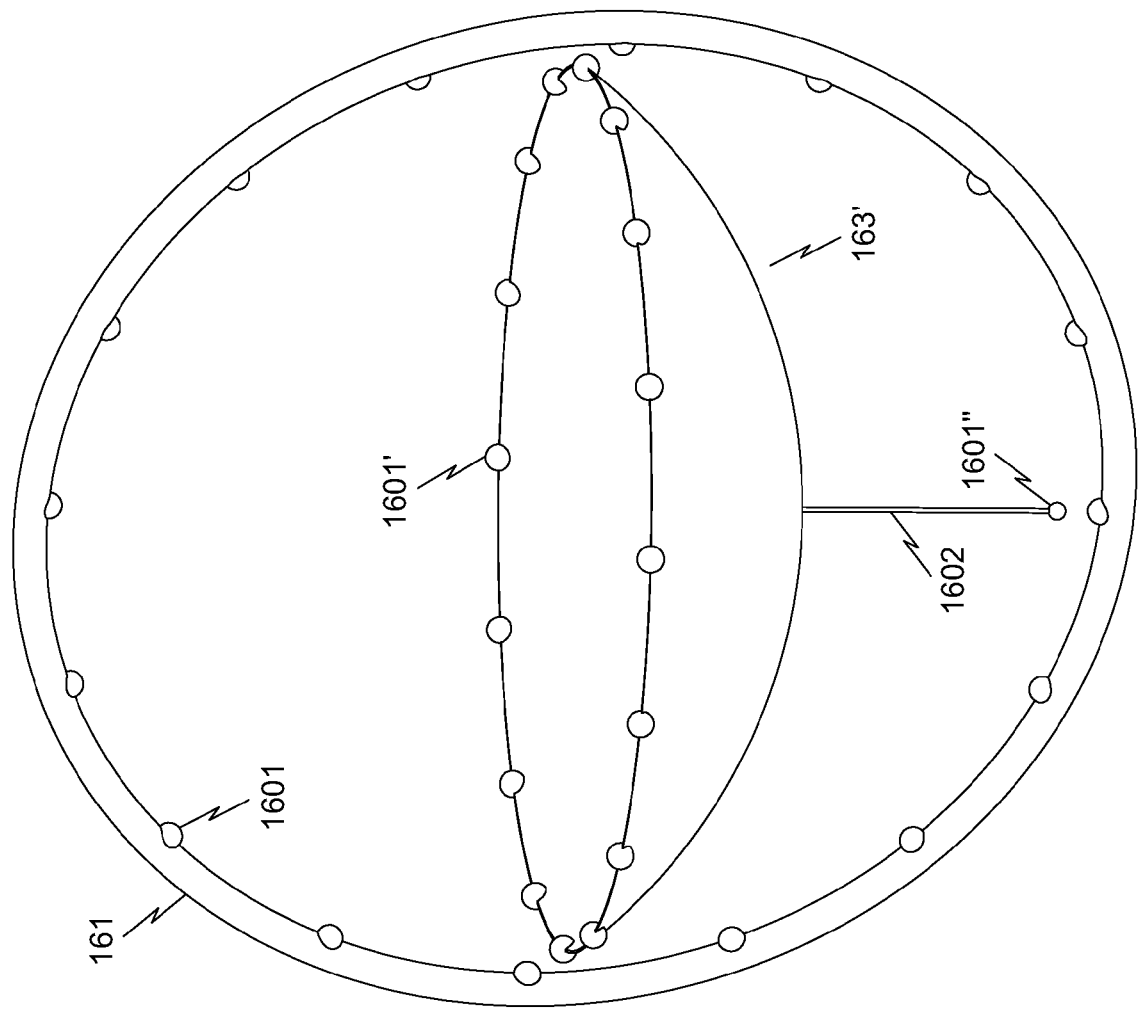
FIG. 16B is a depiction of space-based system that uses rotational forces to stabilize a gossamer parabolic mirror in three dimensions.

Mirrors can also be used, such as the dish mirror 163' shown in FIG. 16B. However, any dish or mirror that is not planar will present an additional issue, in that while spinning the primary focusing means can keep it stretched in the plane of spin, it will tend to flatten that focusing means along the axis of spin. While struts can maintain the shape of a small object, struts do not scale well to the dimensions needed for a space-based solar power system for sending power to earth.

As also shown in FIG. 16B, the present invention thus provides rotational means for stabilizing an object along its axis of spin. Stabilizing ring 161 is aligned with the axis of spin of mirror 163', and rotates in a plane orthogonal to the plane of spin of mirror 163'. Attractive means 1601 disposed around the stabilizing ring pull on attractive means 1601' disposed around the rim of mirror 163'. This attraction is activated when an attractive means 1601 is just above (from the perspective of the drawing) attractive means 1601'. Either the attractive means 1601 or the attractive means 1601' must be switched off when attractive means 1601 passes attractive means 1601' to prevent the pull from being reversed. Since plentiful electrical power is available from solar energy, said attractive means are preferably either electromagnetic or electrostatic.

To prevent torque on mirror 163', this process is duplicated on the opposite side of rings 161 and mirror 163'. To complete the applying of tension along the axis of spin of mirror 163', a further attractive means 1601" is provided at the apex of mirror 163'. Mirror 163' will typically be flat enough that a cable 1602 will be used to bring attractive means 1601" close to stabilizing ring 161. Stabilizing ring 161 is itself stabilized by centrifugal force due to its own spin, and it will typically spin faster than the focusing means to minimize the mass that it needs.

While a parabolic dish mirror 163' is ideal for solar thermal systems such as for melting an asteroid, an annular primary concentrator mirror is preferred for photovoltaic systems to match to an annular receiver such as that shown in FIG. 16A. Referring again to FIG. 16B, rather than an attractive means 1601" on one cable 1602, multiple cables 1602 would fan out to points on the mirror placed around the middle of the ring.

Large parabolic mirrors in space have additional uses beyond gathering solar energy. Radio signals may also be gathered by an antenna made with such as those taught above, although this in general will require greater concentration and thus more accurate fabrication and more closely space attractive means.

Figure 16C:
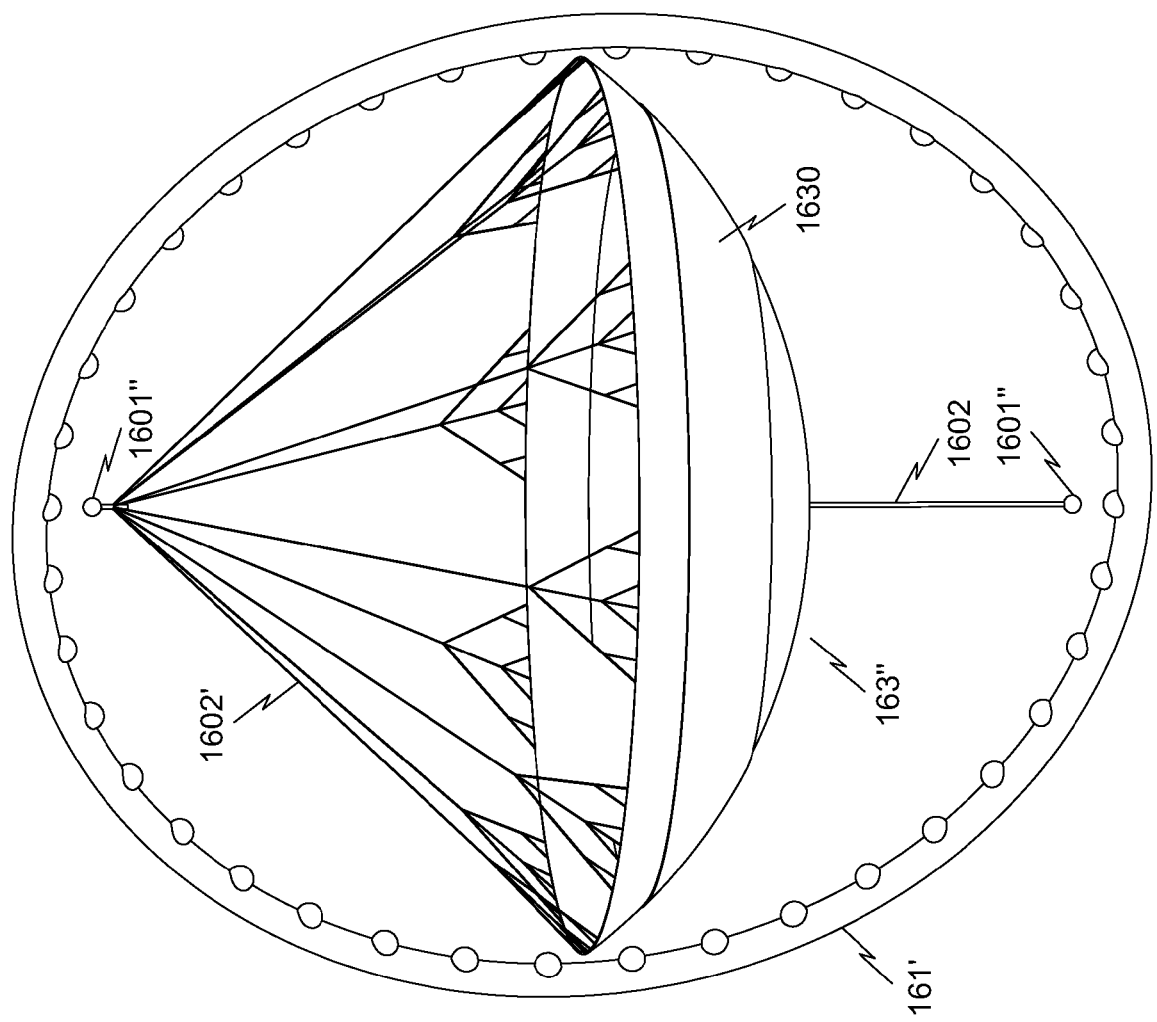
FIG. 16C is a depiction of space-based system that uses rotational forces to stabilize a gossamer parabolic mirror in three dimensions, while maintaining rotational symmetry and shape stability accurately enough to serve as a primary mirror for a telescope.

As shown in FIG. 16C, for very high accuracy the rim of mirror 163" can be attached at many points to a single attractive means 1601" by branched cables 1602' (for clarity only a representative section of the branching is shown, and the branch terminations would ideally be closely and equally spaced around the rim of mirror 163"). Attractive means 1601''' on stabilizing ring 161' should be closely-spaced and their power not only be switched on and off, but should have controlled to provide near constant force on attractive means 1601" on each end of the dish 163". For even greater stability in the reflective surface, only a wide annular band 1630 around the middle of primary mirror 163" can be reflective, so that the shape of that band 1630 can be stable enough to serve as a telescope mirror.

While it would be possible to pre-distort the shape of mirror 163" (or at least the band 1630) so that at the right spin speed the reflective surface would be a near-perfect parabola of rotation, this would not be necessary. As long as the rotational symmetry of the mirrored section 1630 is accurate, the parabolic curve need only be approximate, and a corrective lens or an adaptive secondary mirror near the focus could correct for deviations in the parabolic curve. For example, such a telescope mirror could be oriented so that the Hubble Space Telescope was substantially at its focus, thereby increasing the light-gathering power of the Hubble Space Telescope immensely. And the Hubble space telescope has already been fitted with a corrective lens once, so it could be fitted with a lens customized to correct for the actual shape mirrored section 1630 when it is spinning.

If the rotational symmetry were insufficient, either the Hubble itself would have to be spun at a matching (very slow) rate, or else a telescope with adaptive optics (such as many of the larger new telescopes here on earth use) could be used instead. But after spending billions of dollars on the Hubble Space Telescope, how much nobler to boost it to a higher orbit and then fit it with a huge primary concentrator perhaps 100 meters across than to nudge it to burn up in the earth's atmosphere. At an average thickness of a few tens of microns, a 100-meter gossamer telescope mirror would have a mass of less than one ton, or less than 10% of mass of the Hubble Space Telescope itself. And even if the full clarity of a diamond-turned glass mirror were not achieved, the roughly 1000-fold increase in light gathering power would give this wonderful instrument a new lease on life, rendering it perfect for measuring stellar and galactic spectra, for example.

It should be noted that for a telescope the annular reflective section is a section of a parabolic dish that focuses parallel rays substantially to a point, while an annular mirror used for a photovoltaic system would preferably be an annular parabolic trough that concentrates to an annulus (ring) rather than to a point.

It should also be noted that this stabilizing ring architecture can be used in space to bring effectively permanent tensile forces to large objects other than mirrors, although that is its use in the present context. When the object to be stabilized cannot itself rotate, three such stabilizing rings can be used to apply tension on all axes.

Although solar concentrator with very high concentration needs a fairly accurate lens or mirror, a telescope requires a much higher accuracy mirror even when an adaptive-optics secondary or tertiary mirror is used. There is thus the need for a means for accurately producing and/or accurately shaping parabolically curve sheets of reflective material.

To produce a very accurate gossamer parabolic reflector, a sheet of reflective plastic can be stretch across a heated parabolically-curved mandrel. However except for very large radii of curvature, this stretching would introduce significant variations in the thickness of the material that could throw its balance off if centrifugally tensioned. It is thus better to produce the gossamer material in a parabolic shape.

It has been noted that under constant spin the surface of a liquid in a bowl will assume a parabolic shape. While it is not yet possible on earth to spin a sufficiently large bowl of liquid to produce mirrors of the size that would be optimal in space, it would be possible to spin a mould for a section of a parabolic mirror around a very large arc by suspending it from a pivot and using a counter-balance. For a truly large mirror the pivot could be suspended from a cable across a canyon, and wind could be blocked from interfering with the steady spin by an inflated plastic shell such as is commonly used for "indoor" tennis courts, but scaled up to be larger than the size of the mirror.

With an approximately parabolic mould spinning on an arc where a liquid would match the mould's curvature, only a thin (and thus light-weight) layer of liquid would be needed to form a near-perfect parabolic surface. If the liquid were water, a monomer with hydrophilic heads and hydrophobic tails would form a monomolecular layer on top of the water thin layer. After polymerizing this layer with ultraviolet light, a thin layer of aluminum or silver, as is used for telescope mirrors, could be added. A thicker (few microns) layer of a transparent monomer can be added next to add strength and flexibility, with a tendency to return wrinkle-free to its original parabolic shape if no folds are creased in. This thicker layer would also preferably be UV-cured because UV-curing is faster and more controllable than processes such as air-drying.

While multiple parabolic 'gores' could be cast and later assembled into a rotation-stabilized mirror, the mould could also be large enough that all layers were built up in a continuous process. The original monomer would be added at one side of the mould, the UV curing done farther toward middle of the mould, the reflective layer added next, followed by the thicker monomer for strength its UV curing. This layered film would be continuously pulled off of the far side of the mold, sliding freely on the parabolic water layer as it was built up. As long as the rollers or other pulling means pulled at a rate proportional to the circumference of the mould's arc, this would produce a continuous sheet of near-perfect parabolic curvature.

In preferred embodiments such a sheet would be relatively narrow and be made for an arc of a very large radius. For a given width, a larger radius not only increases the light-gathering power of the mirror, but also increases its resolving power (which is not needed for gathering solar energy, but is useful for telescopes). A narrow sheet (up to perhaps 10 meters in width) is practical to stay with very low mass stays similar to the aluminum tube used for tent poles for expedition mountaineering, but of even lighter weight construction, and themselves parabolically curved to match the width of the mirror. With centrifugal force from slightly spinning the mirror keeping it stabilized in two dimensions, the stays will keep the mirror stabilized in the third dimension without the need for a perpendicular rotating ring.

Alternatively one could take gores of the parabolic gossamer material and affix each to a very light frame (made of similar tubing, but surrounding each gore separately). These frames could then be strung together on both their inner and outer edges, and spun in space to produce a stable focusing mirror. Each gore could easily have an area as big as the primary mirror of the Hubble space telescope, and a hundred such gores in a kilometer-wide circle would produce a primary mirror with 100 times the light gathering power of the Hubble and with over 100 times the resolving power as well. While this mirror would have to be re-stabilized every time it was turned to a new direction, it would be ideal for deep space studies where all directions appear to be identical and focusing light from one direction for extended periods would be useful. Again, the Hubble space telescope itself would make a good secondary mirror for such a large primary mirror.

It is also possible to have the mirror somewhat self-shaping to allow a lower-accuracy molding process to be used. The molding process is similar to roll-to-roll processing except that the material would be very slightly curved, and roll-to-roll processing could also be done on molded gossamer material after it is removed from the mold. The mirror could have a piezoelectric layer added, and a patterned metallic layer added, with the patterned metallic layer dividing the surface into inductive regions and capacitive regions. Each capacitive region could be coupled to an inductive region and to metallic fingers across the piezoelectric layer interleaved with grounded fingers, and have a slightly leaky diode. Adjacent capacitive regions could have fingers running in opposite direction to produce an overall checkerboard-like pattern.

If the spinning mirror were to pass between two layers of a frame had a series of inductors on each layer, then by controlling the current through these inductors the capacitors could be charged to the level desired. With the fingers putting an electric field across the piezoelectric layer, that layer would contract (or expand, depending on the material) very slightly perpendicular to the fingers, pulling the mirror surface with it. Tiny amounts of charge could be added to each capacitor each time that the mirror's spin carried it through the inductive means, with the slightly leaky diode providing a discharge means (through stopping topping up a capacitor) should the charge need to be reduced.

By thus shrinking certain areas of the mirror by tiny amounts in the appropriate directions, the overall shape of the mirror could be tuned to be nearly perfectly parabolic. The amount of shrinking needed as a percentage of the mirror's dimensions decreases with increasing mirror size, so for any given piezoelectric material, maximum charge, and initial mirror accuracy, a range of mirror sizes for which that material can tune the mirror's shape can be calculated.

However even with the above teaching on making mirrors that are relatively stably and accurately shaped, it is expected that even for extremely large mirror sizes, adaptive optics and/or corrective lenses on a much smaller secondary mirror will be preferred. It is therefore generally more preferred to apply these teachings to the making of a large adaptive-optics secondary mirror, rather than a much larger tunable primary mirror.

Knowing how to make space-based mirrors that can focus sharply enough for a telescope also opens up the ability to use high concentration on space probes far outside of earth's orbit. Traditionally radioisotope thermal generators have been used to power missions such as the Cassini probe to Saturn because solar energy has been deemed too weak to be of use at that distance from the sun. However the sun's angular area is diminished by exactly as much as the intensity of sunlight is diminished, and so a perfect parabolic concentrator, where the only limit on concentration was the sun's angular diameter, could concentrate light to the same intensity at any distance from the sun, and only the size of that constant-intensity focal spot would change with distance from the sun.

While making a perfect mirror is well beyond the ability of humanity today, the telescope-grade parabolic mirrors taught above would be capable of achieving very high concentration as out as the outer planets, and high concentration at least out to the orbit of Pluto. While the mass of the receiver and cooling system would remain fixed, that mass of the primary mirror needed would scale with the square of the distance from the sun, and would be a limiting factor even with a gossamer mirror. Still, at ten microns thick a polymer mirror would have an area of 100 square meters per kilogram, so a 2-kilogram mirror could deliver almost 3 kilowatts of optical energy even at the orbit of Saturn, which would translate into around a kilowatt of electrical energy, which is more than the 34 kg of plutonium used to power Cassini generates (for comparison purposes the mass of solar cells and cooling has been assumed to be equal to the mass of the other components of the thermal generator). Since only the mirror mass would scale, a 34-kg mirror could deliver the same energy out at the orbit of Pluto. A gossamer mirror capable of high concentration (at least 100 earth-equivalent suns) out to the orbit of Saturn is thus a preferred embodiment that would eliminate the need to launch plutonium from earth, and one that can do the same out to the orbit of Pluto is especially preferred.

Some space probes will require their primary power at varying distances from the sun. With the above-described concentrators, the amount of power remains relatively constant because close to the sun the sun subtend a larger angle and thus the mirror can concentrate less, producing a focus of constant intensity over an immense range of distances from the sun. However this constancy requires focusing limited by the sun's diameter, or 10,000× at the earth's distance from the sun, and this is beyond the range of most solar cells today to withstand even if properly cooled. So while near-telescope-grade mirrors may be needed in the outer reaches of the solar system, they would focus too intensely for space-craft closer to earth and there is a need for a simple means to adjust the concentration lower.

Moving the receiver closer to or farther from the mirror than the focal length of the mirror will cause it to be a point of lower concentration, and the distance can be calculated, based on the distance from the sun, to produce whatever concentration is desired, up to the maximum at the focal length. This thus forms a preferred mechanism for tuning the concentration of a mirror that can achieve a relatively stable but too high concentration across a wide range of distances from the sun.

The above examples and embodiments used to illustrate the families of preferred embodiments of the present invention are meant to be illustrative rather than limiting, and many of the features taught under one family of preferred embodiments may be used advantageously under other families of embodiments. In general, when a combination of features taught herein complement each other in an unexpected way, the combination is discussed, but combinations that merely complement each other as would be expected from understanding the individual feature are generally not discussed unless they provide the foundation for understanding other improvements.

The physical form factors presented are also meant to be illustrative rather than limiting examples. For example, parabolic mirrors have been used in the examples because they are the best known and are easily decomposed into independent curves in orthogonal directions, but many of the teachings also apply to non-imaging hyperbolic primaries, which are known in the art to have better acceptance angles for a given concentration, thus relaxing the tracking accuracy needed. Also mirror apertures with a few moderately long, moderately narrow glass mirrors in one direction have been used, whereas much larger mirrors suitable for much larger trackers could be made with the same principles, and might even be preferred if material constraints change in the future.

The materials presented are also meant to be illustrative rather than limiting examples. For example, glass mirrors are currently more durable and more reflective than plastic, but the chemistry of plastics is advancing faster than that of glass. Also, galvanized steel framing has the best cost and good durability, while other materials such as aluminum, plastic, titanium or some material not yet known might be more cost-effective in the future, and even wood might become more cost effective if labor costs decrease (e.g., due to robotics) or if wood becomes a preferred way to store carbon. And while copper is currently the best coolant piping material for electrically conductive coolant pipes due to its high heat transfer, easy solderability and moderate cost, increases in the price of copper might make other alternatives preferred in the future.

The photovoltaic cells such as are used in many of the embodiments are also evolving rapidly in their efficiency, their cost per area, their ideal concentration, their most cost-effective concentration and their cooling needs. In particular, there is considerable work being done on cells that intermediate in efficiency between crystalline silicon cells and today's highest-efficiency multi-junction cells. While in space (for which multi-junction cells were initially designed) it is watts per weight that is key, on earth cells that were 80% as efficient but cost 20% as much as today's triple-junction cells would be preferred in many cases, especially the solar thermal base-load plus dispatchable photovoltaic peaking power preferred embodiments as taught herein.

The concentration of energy from our sun as used herein is also meant to be an example. Other sources of optical and infrared energy may by concentrated, as long as their incoming rays are substantially parallel, and a light at the focus can also be turned into a collimated beam of light. Other forms of radiant energy may also be concentrated or turned into a collimated beam, such as radio waves or acoustic energy.

Even these examples of examples are meant to be illustrative rather than limiting, and numerous minor variations, especially in trading generality for features for specific purposes, will suggest themselves to those familiar with the relevant art upon reading the above descriptions of the preferred embodiments.

We claim:

1. An elongated curved mirror for use in a two-axis solar concentrator, the mirror comprising a reflective flexible substrate, said flexible substrate having a length that is longer than its width and said reflective flexible substrate being shaped to be cylindrically curved in one direction about a widthwise axis of said elongated curved mirror, wherein said length is between four feet and eight feet, said width is between 10 inches and about 30 inches, and said reflective flexible substrate is retained in shape by continuous contact along said length of said reflective flexible substrate with a mechanical support, said mechanical support comprising a sleeve extending the length of the reflective flexible substrate and configured to provide continuous support to at least one of: side edges of the reflective flexible substrate; and a rear surface portion of the reflective flexible substrate.

2. The elongated curved mirror as defined in claim 1, wherein said substrate comprises a planar flexible sheet mirror element and said mechanical support comprises one or more sheets folded or pivoted on a hinge about at least one curved fold line or curved hinge line, said one or more sheets having sections attached to said sheet mirror.

3. The elongated curved mirror as defined in claim 1, wherein said reflective flexible substrate is supported by said mechanical support along an entire length of said reflective flexible substrate.

4. The elongated curved mirror as defined in claim 1, wherein said elongated curved mirror is a parabolic cylinder.

5. The elongated curved mirror as defined in claim 1, wherein said mechanical support is adapted to adjust a shape of said reflective flexible substrate for adjusting a focal distance and/or a focal spot shape of said elongated curved mirror after being attached to said reflective flexible substrate.

6. The elongated curved mirror as defined in claim 1, further comprising a mounting base for mounting said elongated curved mirror to a frame.

7. The elongated curved mirror as defined in claim 1, further comprising a mounting base for mounting said elongated curved mirror and at least one further elongated curved mirror to a frame with the directions of curvatures of said plurality of elongated curved mirrors rotated relative to one another so that the focal lines of the centers of said elongated curved mirrors overlap.

8. The elongated curved mirror as defined in claim 1, wherein said substrate comprises a planar glass sheet mirror element held and curved by said mechanical support to be cylindrically curved.

9. The elongated curved mirror as defined in claim 8, wherein said planar glass sheet mirror element is retained by a parabolic groove for receiving each lengthwise edge of said planar glass sheet mirror element.

10. The curved mirror as claimed in claim 8, wherein said width is 20 inches.

11. The elongated curved mirror as defined in claim 1, wherein said mechanical support comprises one or more sheets folded or pivoted on a hinge about at least one curved fold line or curved hinge line, and said reflective flexible substrate is not brittle and is integral with said sheets.

12. The elongated curved mirror as defined in claim 11, wherein said elongated curved mirror is made from a single sheet having folded sides and correspondingly curved lengthwise sides.

13. A two-axis solar concentrator that directs and concentrates sunlight directly and/or indirectly via a secondary concentrator onto a receiver with a concentration greater than 500 suns, the concentrator comprising:

a plurality of mirrors, each one of said mirrors having a reflective substrate shaped to be cylindrically curved in one direction about a widthwise axis, wherein said reflective substrate is supported by a mechanical support having a mounting base;

a frame supporting said mounting bases of said mirrors and angling those of said mirrors next to one another lengthwise to focus light onto said receiver with focal spots of said mirrors overlapping; and a two-axis mounting for supporting and orienting said frame with respect to the earth.

14. The two-axis solar concentrator as defined in claim 13, wherein said frame comprises:

a plurality of curved rails for supporting said plurality of mirrors;

a plurality of ribs for supporting said plurality rails; and a truss extending across said concentrator orthogonal to said ribs and adapted to support said plurality of ribs in a curved arrangement in a direction of said truss, said truss being supported by said two-axis mounting.

15. The two-axis solar concentrator as defined in claim 13, further comprising a receiver mounting, said receiver mounting comprising:

three legs attached to said frame to provide a tripod support for said receiver, wherein two of said three legs are pivotally mounted to said frame to rotate about an axis, and another of said three legs being detachable from said frame and/or said receiver to allow said two legs to pivot with said receiver toward said frame to facilitate access to said receiver for servicing.

16. The two-axis solar concentrator as defined in claim 13, wherein said concentration is at least 2000 suns, said plurality of mirrors having a paraboloid of translation shape with a width of at least 500 mm, and an aperture of said frame being at most 7.2 m on a side.

17. The two-axis solar concentrator as claimed in claim 13, wherein said frame is a parabolic dish.

18. The two-axis solar concentrator as claimed in claim 13, wherein the width and curvature of said reflective substrate are dimensioned to enable an overlap of the focal spots of said plurality of mirrors to achieve a concentration of at least 1000 suns.

* * * * *